(12) United States Patent
Bulucea et al.

(10) Patent No.: US 8,735,980 B2
(45) Date of Patent: *May 27, 2014

(54) CONFIGURATION AND FABRICATION OF SEMICONDUCTOR STRUCTURE USING EMPTY AND FILLED WELLS

(71) Applicant: National Semiconductor Corporation, Dallas, TX (US)

(72) Inventors: Constantin Bulucea, Sunnyvale, CA (US); Sandeep Bahl, Palo Alto, CA (US); William French, San Jose, CA (US); Jeng-Jiun Yang, Sunnyvale, CA (US); Donald Archer, Santa Clara, CA (US); David C. Parker, Topsham, ME (US); Prasad Chaparala, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/670,330

(22) Filed: Nov. 6, 2012

(65) Prior Publication Data

US 2013/0126970 A1 May 23, 2013

Related U.S. Application Data

(62) Division of application No. 12/382,973, filed on Mar. 27, 2009, now Pat. No. 8,304,835.

(51) Int. Cl.
*H01L 21/8232* (2006.01)

(52) U.S. Cl.
USPC .......... 257/335; 257/336; 257/345; 257/344; 257/E29.053; 257/368; 257/408

(58) Field of Classification Search
USPC .......... 257/335–345, 368, 402, 408, E21.618, 257/E21.619, E29.053, E29.055
See application file for complete search history.

(56) References Cited

U.S. PATENT DOCUMENTS 5,478,759 A 12/1995 Mametani et al.
(Continued)

FOREIGN PATENT DOCUMENTS

EP 0083447 7/1983

OTHER PUBLICATIONS

Brown et al., "Trends in Advance Process Technology—Submicrometer CMOS Device Design and Process Requirements", Procs. IEEE, Dec. 1986, pp. 1678-1702.

(Continued)

*Primary Examiner* — Matthew W Such
*Assistant Examiner* — Scott Stowe
(74) *Attorney, Agent, or Firm* — Warren L. Franz; Wade J. Brady, III; Frederick J. Telecky, Jr.

(57) ABSTRACT

A semiconductor structure, which serves as the core of a semiconductor fabrication platform, has a combination of empty-well regions and filled-well regions variously used by electronic elements, particularly insulated-gate field-effect transistors ("IGFETs"), to achieve desired electronic characteristics. A relatively small amount of semiconductor well dopant is near the top of an empty well. A considerable amount of semiconductor well dopant is near the top of a filled well. Some IGFETs (100, 102, 112, 114, 124, and 126) utilize empty wells (180, 182, 192, 194, 204, and 206) in achieving desired transistor characteristics. Other IGFETs (108, 110, 116, 118, 120, and 122) utilize filled wells (188, 190, 196, 198, 200, and 202) in achieving desired transistor characteristics. The combination of empty and filled wells enables the semiconductor fabrication platform to provide a wide variety of high-performance IGFETs from which circuit designers can select particular IGFETs for various analog and digital applications, including mixed-signal applications.

18 Claims, 99 Drawing Sheets

(56) References Cited

U.S. PATENT DOCUMENTS

| | | | |
|---|---|---|---|
| 5,482,878 | A | 1/1996 | Burger et al. |
| 5,543,647 | A | 8/1996 | Kobayashi et al. |
| 5,548,148 | A | 8/1996 | Bindal |
| 5,719,422 | A | 2/1998 | Burr et al. |
| 5,744,372 | A | 4/1998 | Bulucea |
| 5,780,912 | A | 7/1998 | Burr et al. |
| 5,793,090 | A | 8/1998 | Gardner et al. |
| 5,963,801 | A | 10/1999 | Aronowitz et al. |
| 6,078,082 | A | 6/2000 | Bulucea |
| 6,091,116 | A | 7/2000 | Kim et al. |
| 6,107,149 | A | 8/2000 | Wu et al. |
| 6,127,700 | A | 10/2000 | Bulucea |
| 6,281,062 | B1 | 8/2001 | Sanchez |
| 6,297,114 | B1 | 10/2001 | Iwata et al. |
| 6,342,719 | B1 | 1/2002 | Arai |
| 6,417,546 | B2 | 7/2002 | Trivedi et al. |
| 6,548,842 | B1 | 4/2003 | Bulucea et al. |
| 6,566,204 | B1 | 5/2003 | Wang et al. |
| 6,667,251 | B2 | 12/2003 | McFadden et al. |
| 6,759,302 | B1 | 7/2004 | Chen et al. |
| 6,797,576 | B1 | 9/2004 | Teng et al. |
| 7,042,051 | B2 | 5/2006 | Ootsuka et al. |
| 7,144,825 | B2 | 12/2006 | Adetutu et al. |
| 7,176,530 | B1 | 2/2007 | Bulucea et al. |
| 7,211,863 | B2 | 5/2007 | Williams et al. |
| 7,419,863 | B1 | 9/2008 | Bulucea |
| 7,642,574 | B2 | 1/2010 | Bulucea |
| 7,863,681 | B1 * | 1/2011 | Bulucea ........................ 257/336 |
| 7,972,918 | B1 * | 7/2011 | Bulucea ........................ 438/199 |
| 8,013,390 | B1 * | 9/2011 | Bulucea ........................ 257/336 |
| 8,309,420 | B1 * | 11/2012 | Bulucea ........................ 438/290 |
| 2002/0072177 | A1 | 6/2002 | Grider |
| 2008/0311717 | A1 | 12/2008 | Bulucea |

OTHER PUBLICATIONS

Buti et al., "Asymmetrical Halo Source GOLD drain (HS-GOLD) Deep Sub-half n-Micron MOSFET Design for Reliability and Performance", IEDM Tech. Dig., Dec. 3-6, 1989, pp. 26.2.1-26.2.4.

Chai et al., "A Cost-Effective 0.25 µm Leff BiCMOS Technology Featuring Graded-Channel CMOS (GCMOS) and a Quasi-Self Aligned (QSA) NPN for RF Wireless Applications", Procs. 2000 Bipolar/BiCMOS Circs. and Tech. Meeting, Sep. 24-26, 2000, pp. 110-113.

Chang et al., "A CMOS-Compatible, High RF Power, Asymmetric-LDD MOSFET with Excellent Linearity", IEDM Tech. Dig., Dec. 15-17, 2008, pp. 457-460.

Choi et al., "Design and analysis of a new self-aligned asymmetric structure for deep sub-micrometer MOSFET", Solid-State Electronics, vol. 45-, 2001, pp. 1673-1678.

Combs, "Scalable retrograde p-well CMOS technology", IEDM Tech. Dig., 1981, pp. 346-349.

Dolny et al., "Enhanced CMOS for Analog-Digital Power IC Applications", IEEE Trans. Elec. Devs. 1986, pp. 1985-1991.

Hiroki et al., "A High Performance 0.1 µm MOSFET with Asymmetric Channel Profile", IEDM Tech, Dig., Dec. 1995, pp. 17.7.1-17.7.4.

Hoentschel et al., "Implementation and Optimization of Asymmetric Transistors in Advanced SOI CMOS Technologies for High Performance Microprocessors", Elec., Devs. Meeting, Dec. 15-17, 2008, pp. 649-652.

Kimijima et al., "Improvement of 1/f noise by using VHP (Vertical High Pressure) oxynitride gate insulator for deep-submicron RF and analog CMOS", 1999 Symp. VLSI Tech., Dig. Tech. Papers, 1999, pp. 119 and 120.

Lamey et al., "Improving Manufacturability of an RF Graded Channel CMOS Process for Wireless Applications", SPIE Conf. Microelec. Dev. Tech. II, Sep. 1998, pp. 147-155.

Liu et al., "Multiple Gate Oxide Thickness for 2GHz System-on-A-Chip Technologies", IEDM Tech. Dig., Dec. 6-9, 1998, pp. 589-592.

Ma et al., "Graded-Channel MOSFET (GCMOSFET) for High Performance, Low Voltage DSP Applications", IEEE Trans. VLSI Systems Dig., Dec. 1997, pp. 352-358.

Martin et al., "Optimized Retrograde N-well for One Micron CMOS Technology", IEEE Custom Intg. Circs. Conf., 1985, pp. 199-202.

Mikoshiba et al., "Comparison of Drain Structures in n-Channel MOSFET's", IEEE Trans. Elec. Devs., Jan. 1986, pp. 140-144.

O et al., "Integration of Two Different Gate Oxide Thickness in a 0.6-µm Dual Voltage Mixed Signal CMOS Process", IEEE Trans. Elec. Devs., Jan. 1995 pp. 190-192.

Ogura et al., "A Half Micron MOSFET Using Double Implanted LDD", IEDM Tech. Dig., Dec. 1982, pp. 718-721.

Rung et al., "A Retrograde p-Well for Higher Density CMOS", IEEE Trans. Elec. Devs., Oct. 1981, pp. 1115-1119.

Sanchez et al., "Drain-Engineered Hot-Electron-Resistant Device Structures: A Review", IEEE Trans. Elec. Devs., Jun. 1989, pp. 1125-1132.

Shima et al., "High RF power transistor with laterally modulation-doped channel and self-aligned silicide in 45nm node CMOS technology", IEDM Tech. Dig., Dec. 15-17, 2008, pp. 453-456.

Shimizu et al., "High Drivability CMOSFETs with Asymmetrical Source-Drain (ASD) Structure for Low Supply Voltage ULSIs", Extended Abstracts of the 21st Conference on Solid State Device and Materials, 1989, pp. 125-128.

Su et al., "A High-Performance Scalable Submicron MOSFET for Mixed Analog/Digital Applications", IEDM Tech. Dig., Dec. 1991, pp. 367-370.

Taur et al., "A Self-Aligned 1-µm-Channel CMOS Technology with Retrograde n-Well and Thin Epitaxy", IEEE Trans. Elec. Devs, Feb. 1985, pp. 203-209.

Thompson et al., "MOS Scaling: Transistor Challenges for the 21st Century", Intel Technology J., Q398, 1998, pp. 1-19.

Tsui, et al., "A Versatile Half-Micron Complementary BiCMOS Technology for Microprocessor-Based Smart Power Applications", IEEE Trans. Elec. Devs., Mar. 1995, pp. 564-570.

* cited by examiner

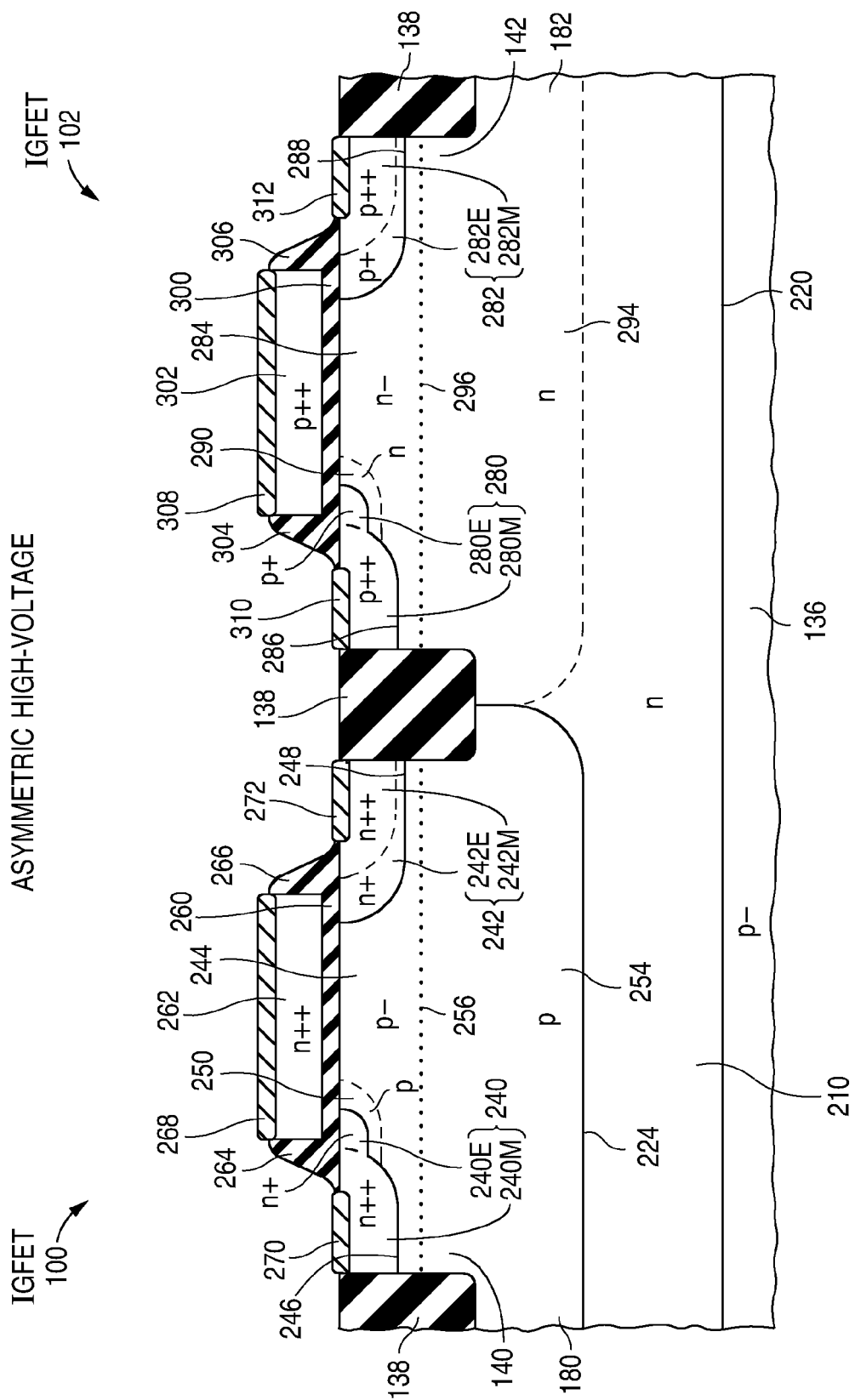
Fig. 11.1

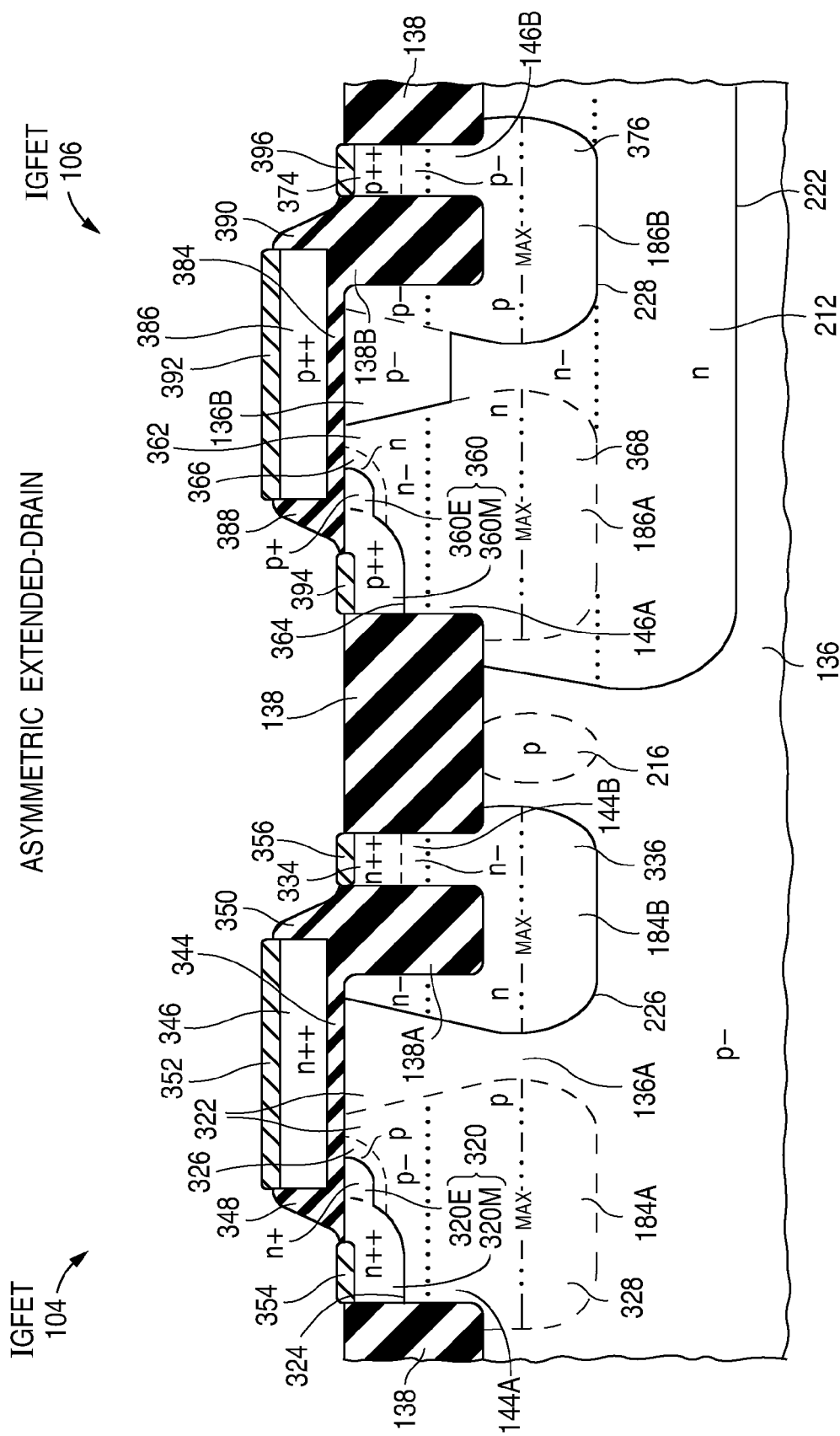
Fig. 11.2

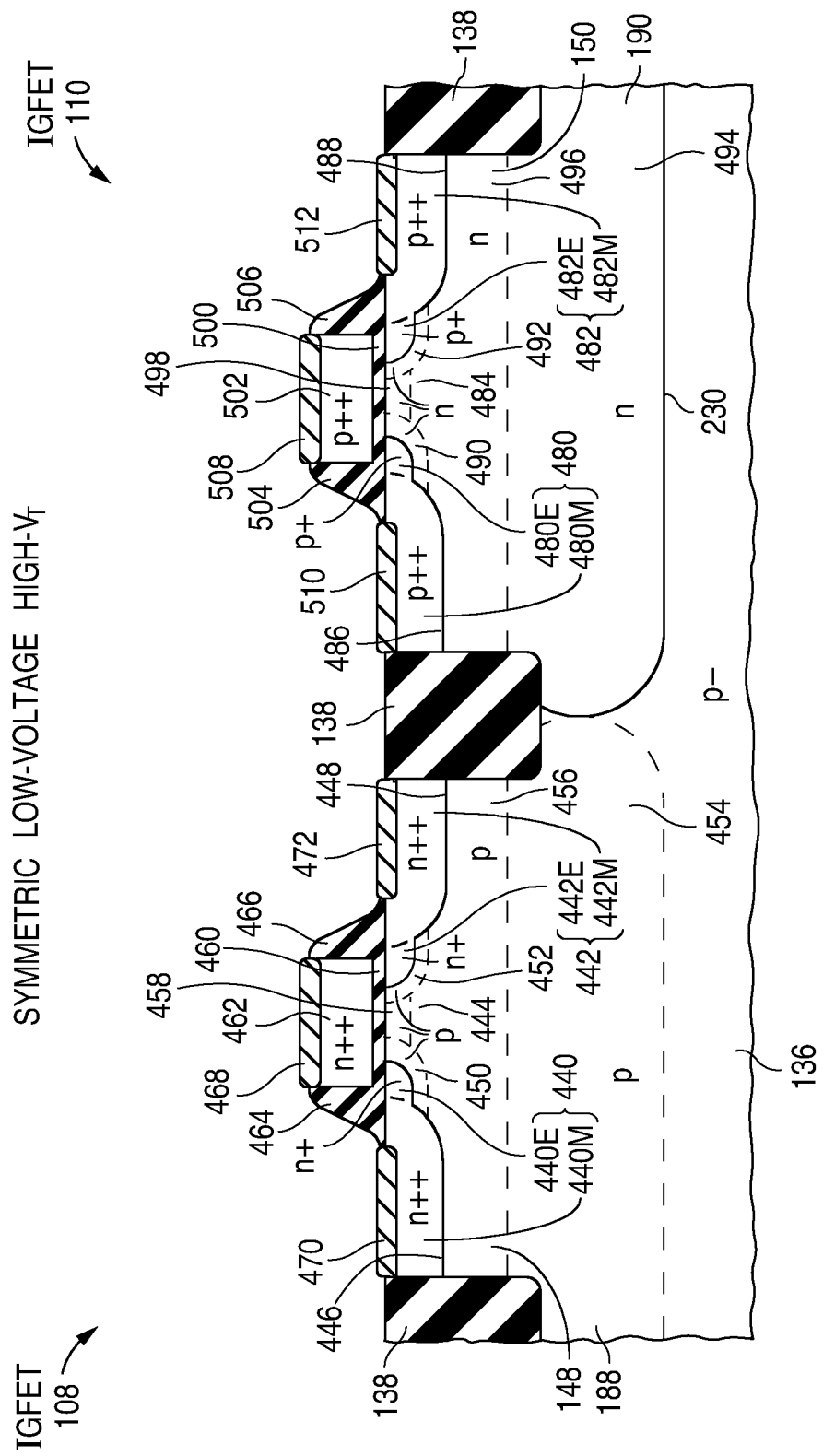
Fig. 11.3

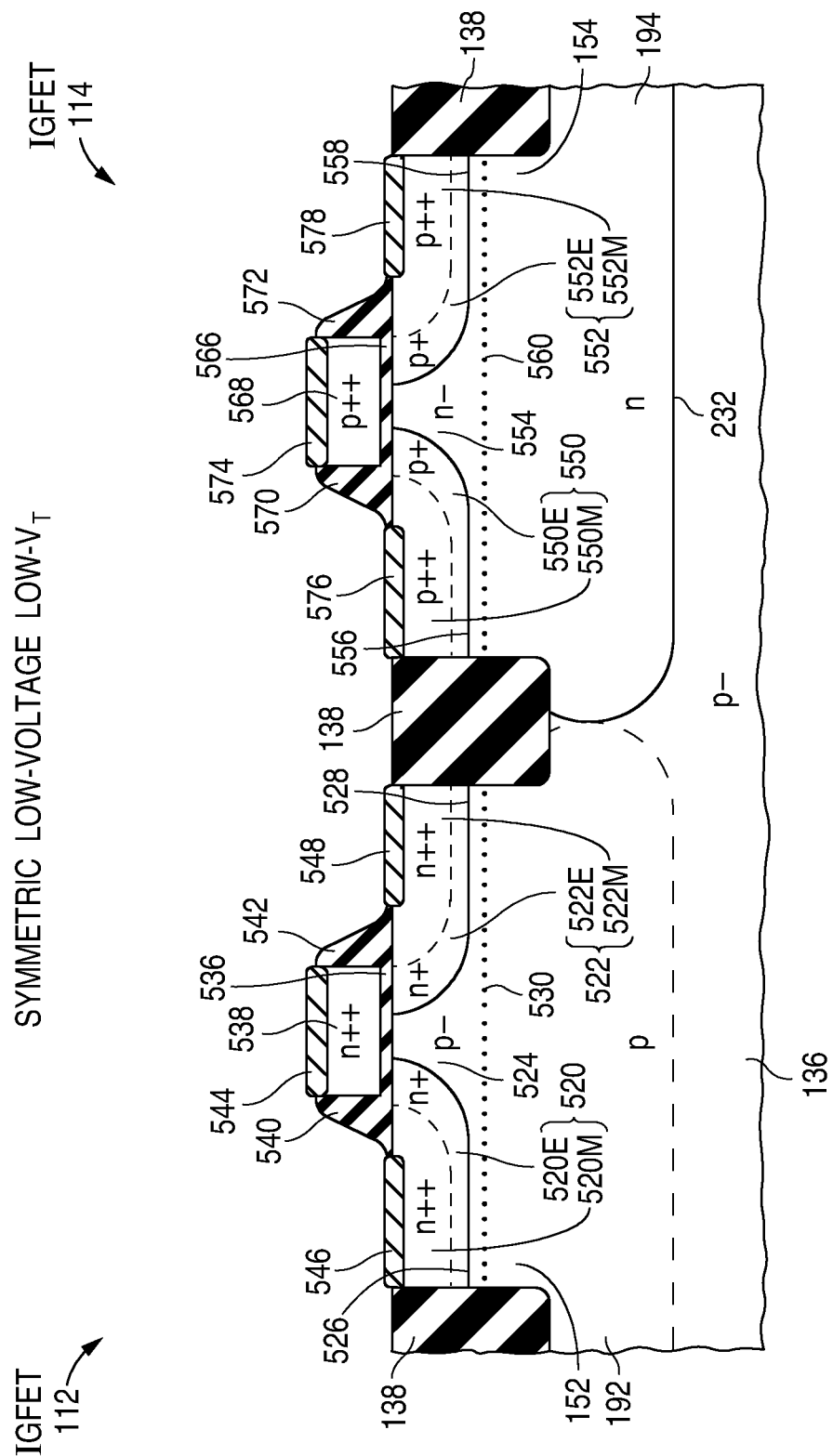
Fig. 11.4

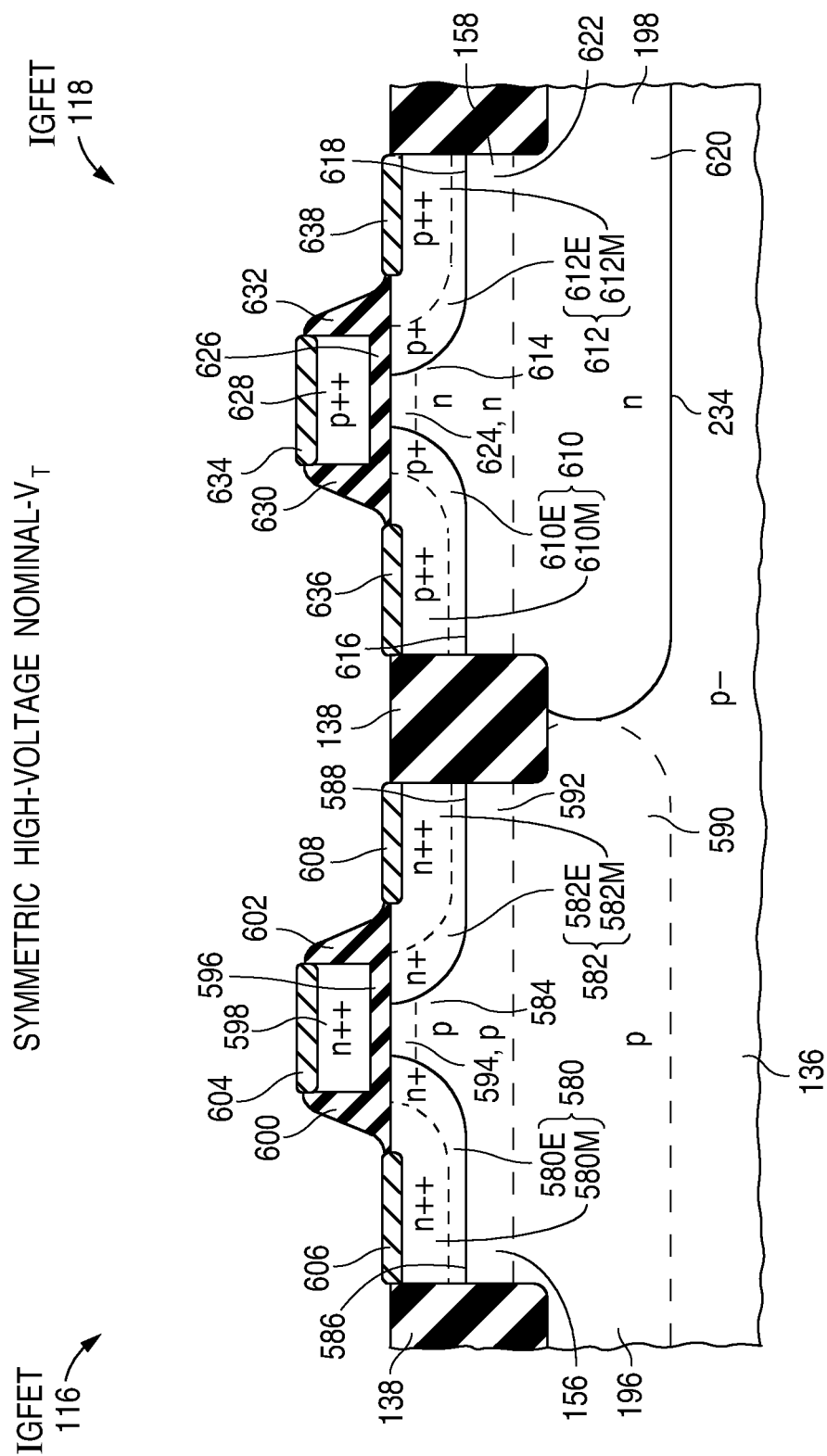
Fig. 11.5

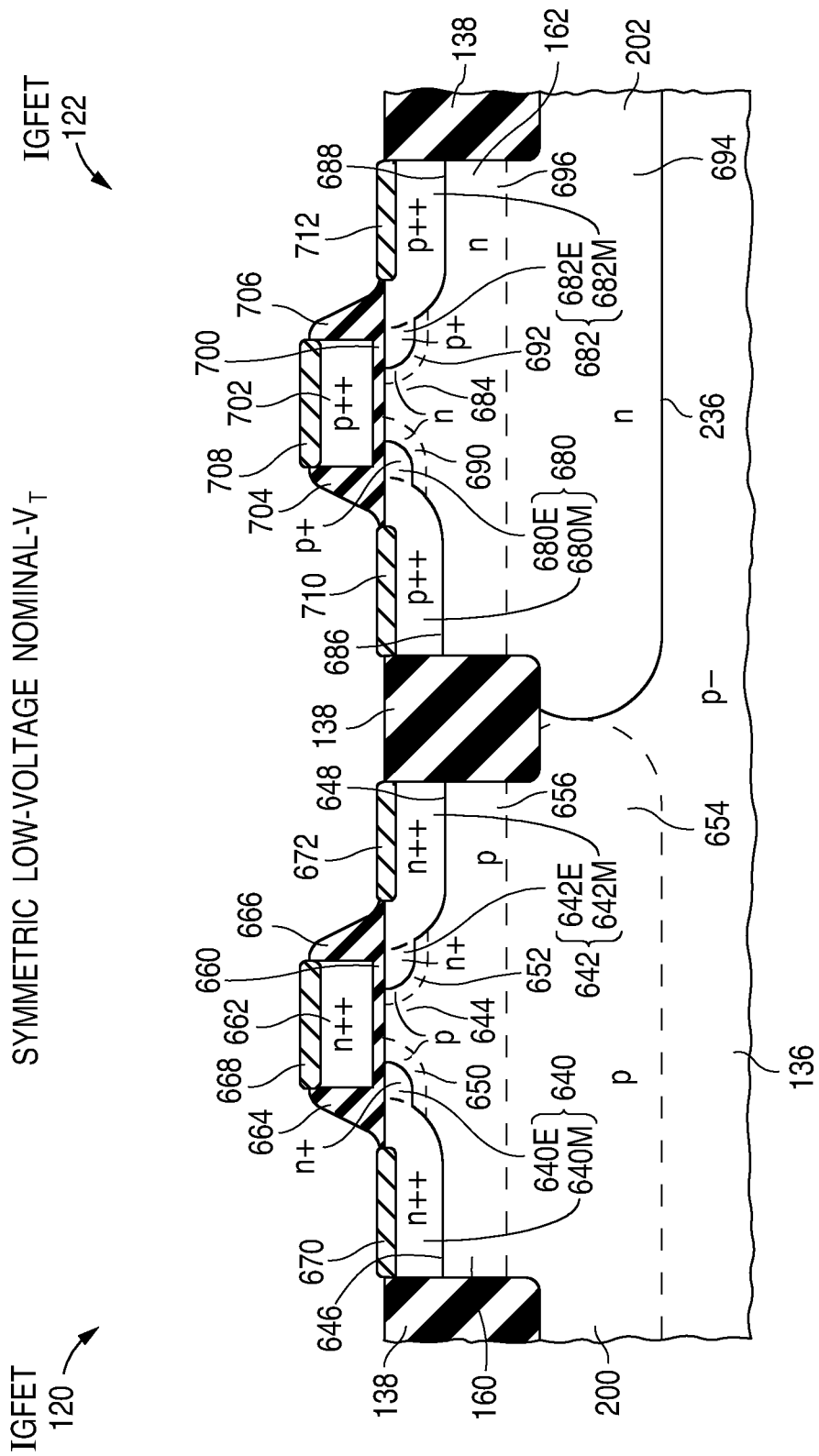
Fig. 11.6

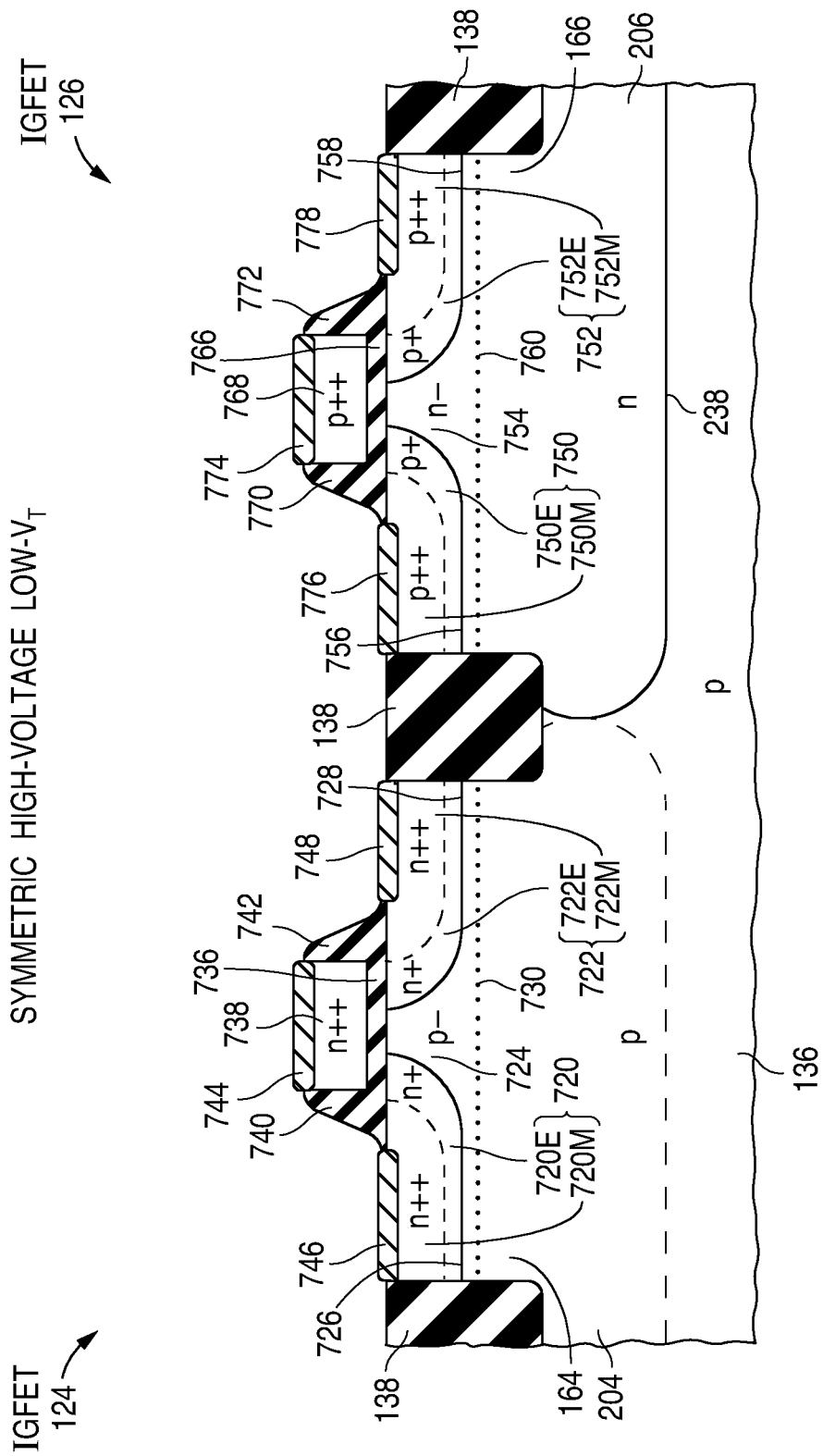
Fig. 11.7

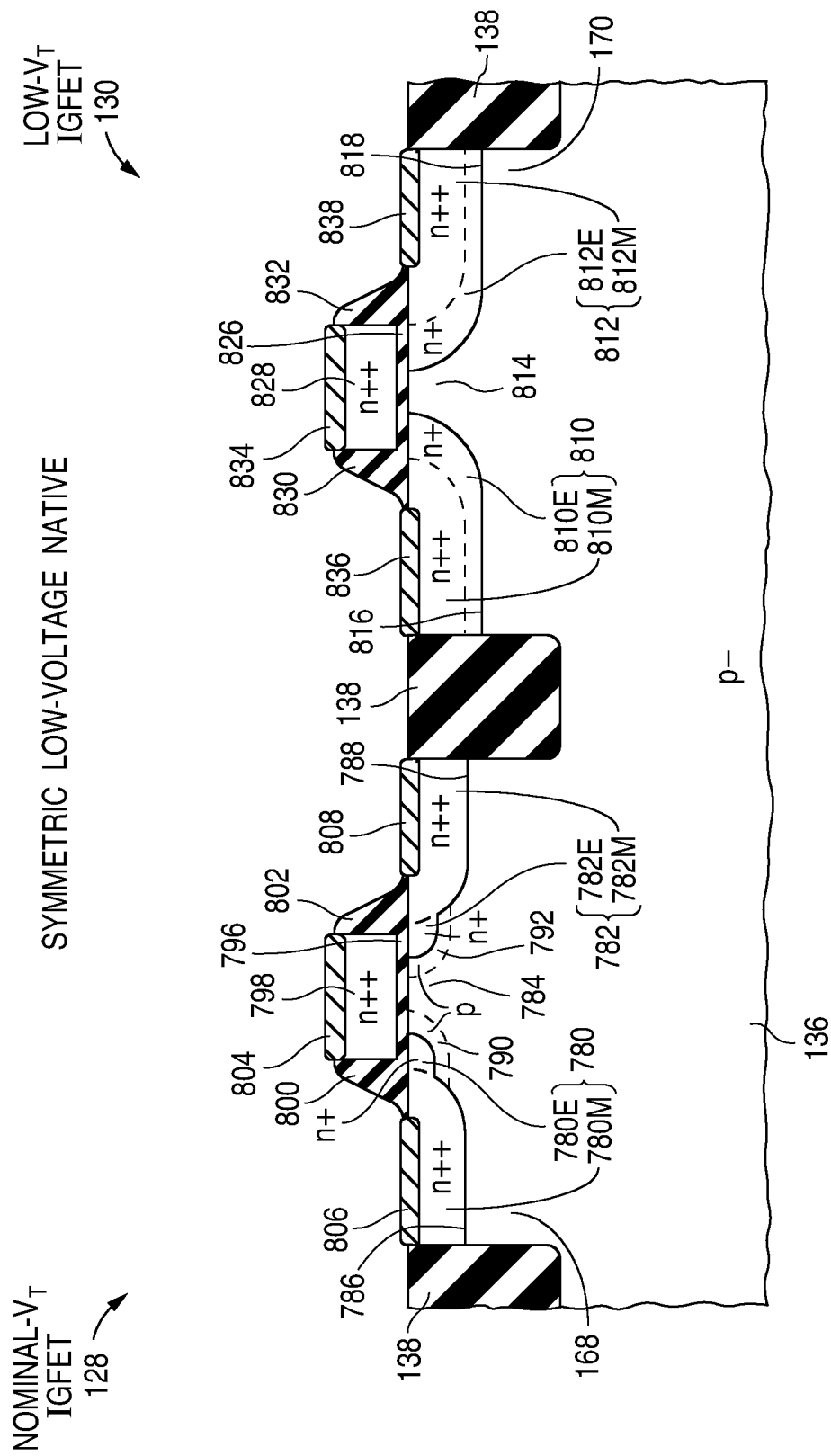
Fig. 11.8

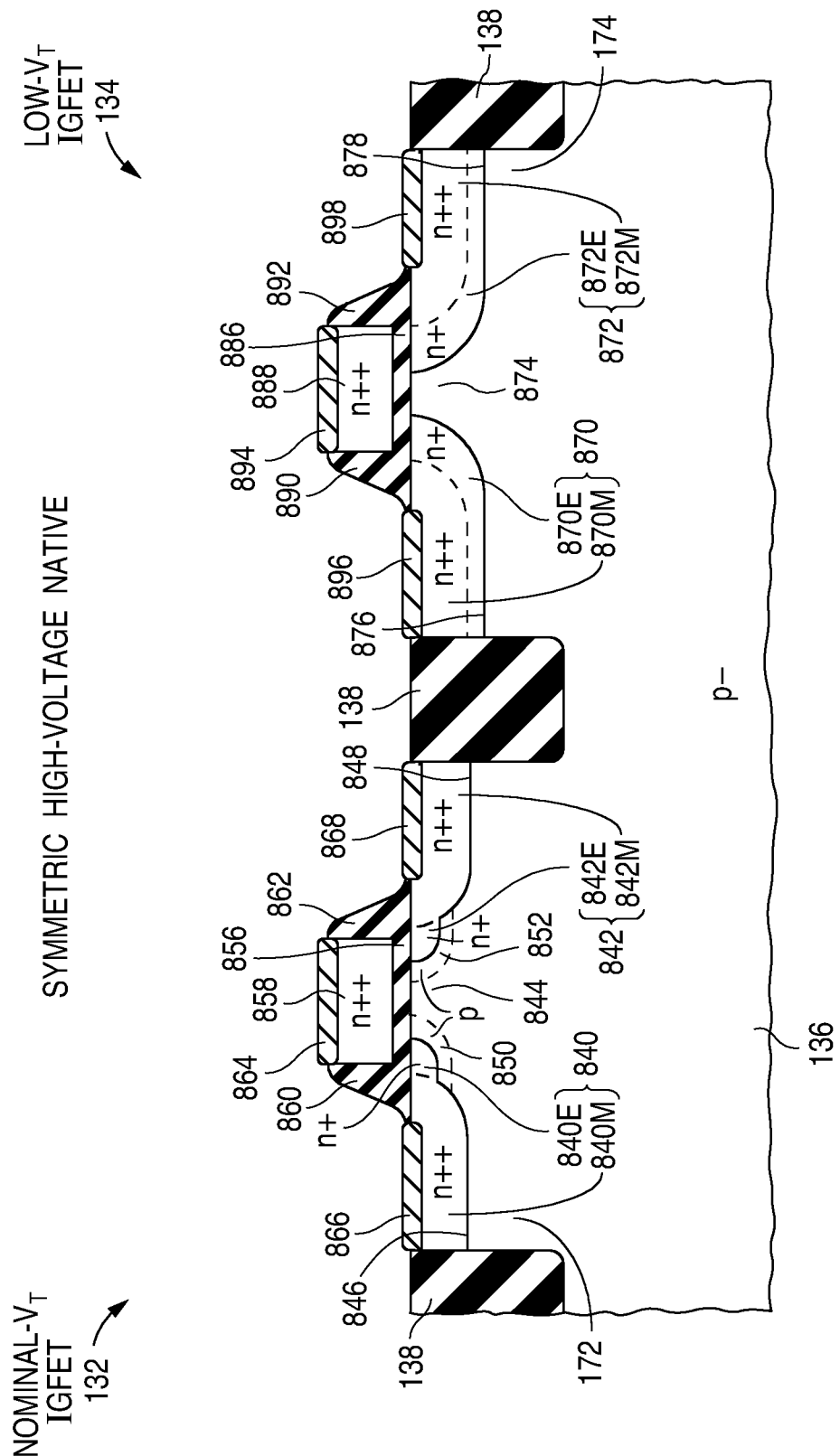
Fig. 11.9

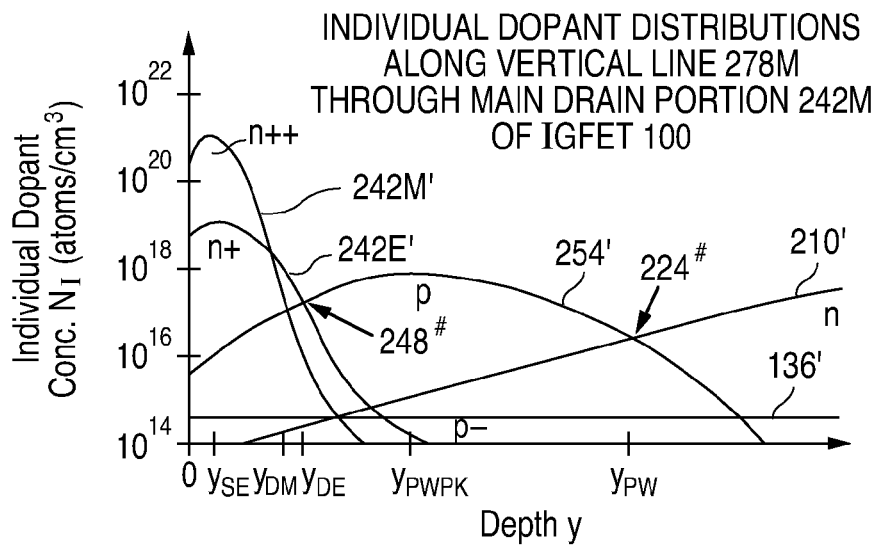
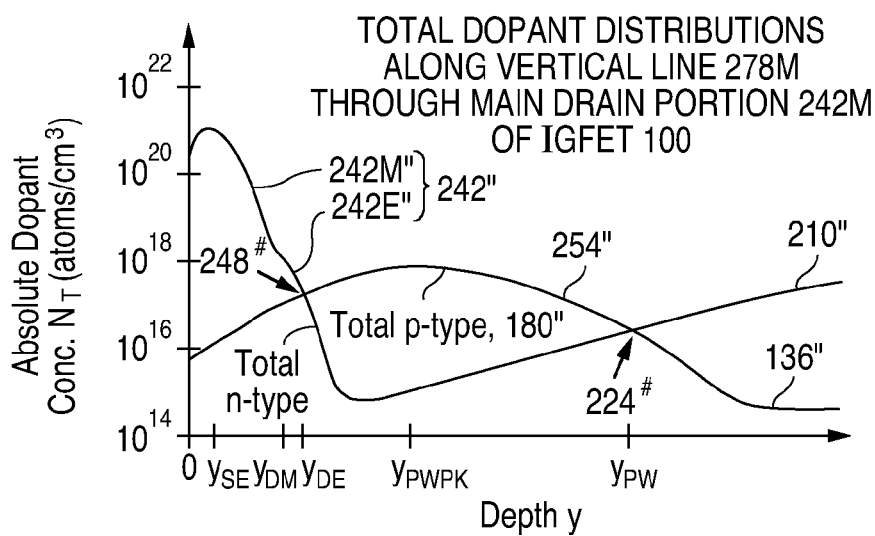
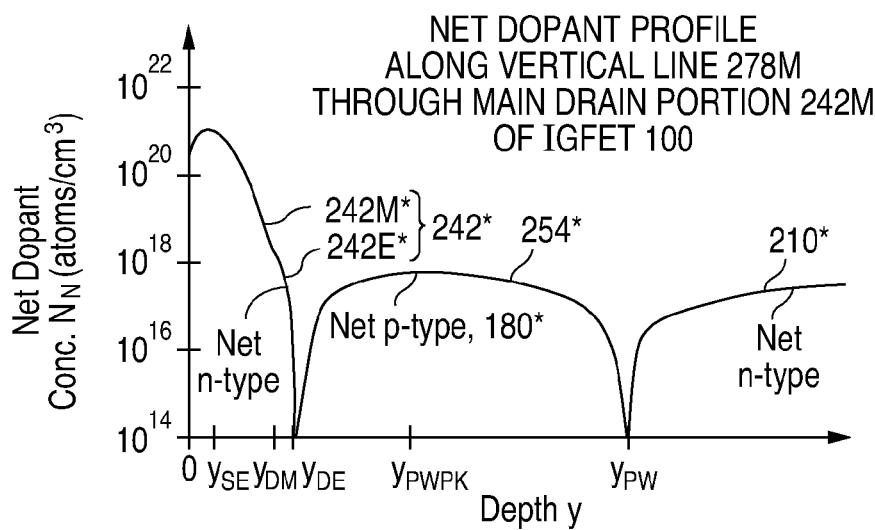

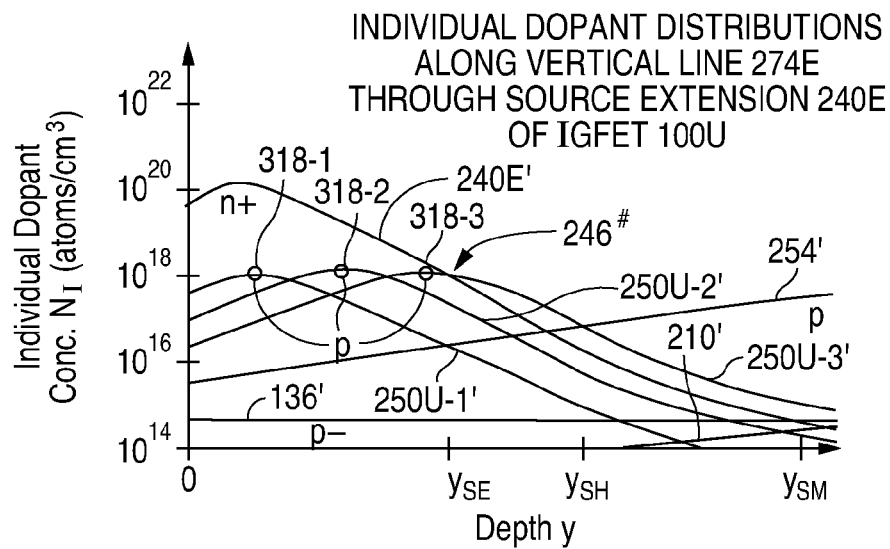
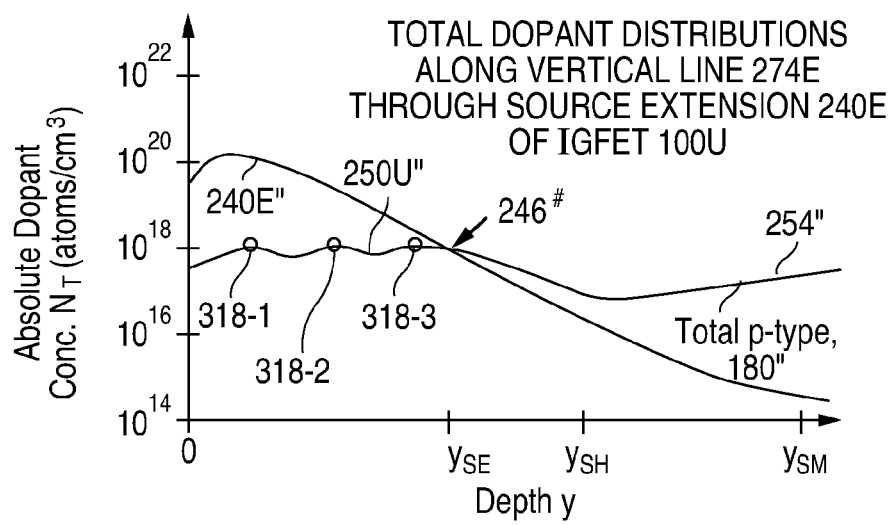
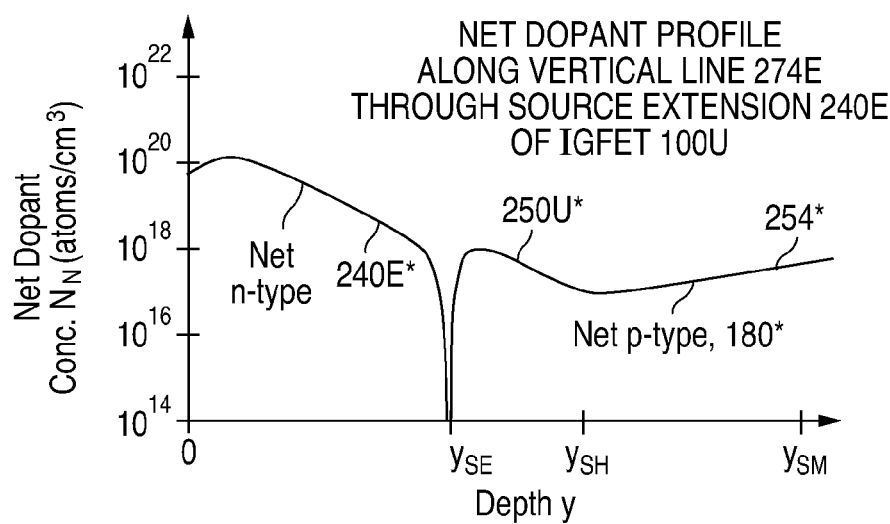

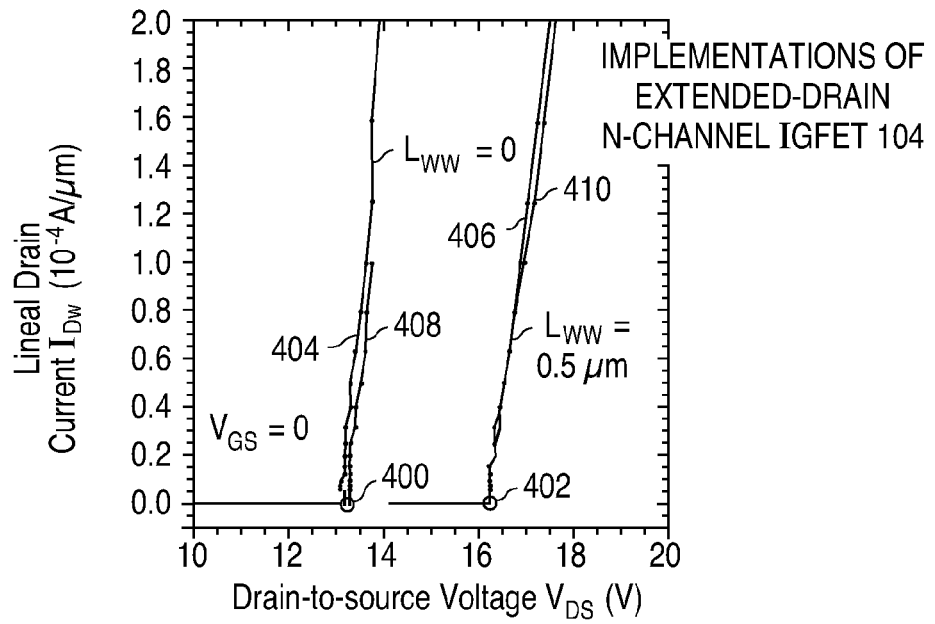
Fig. 27
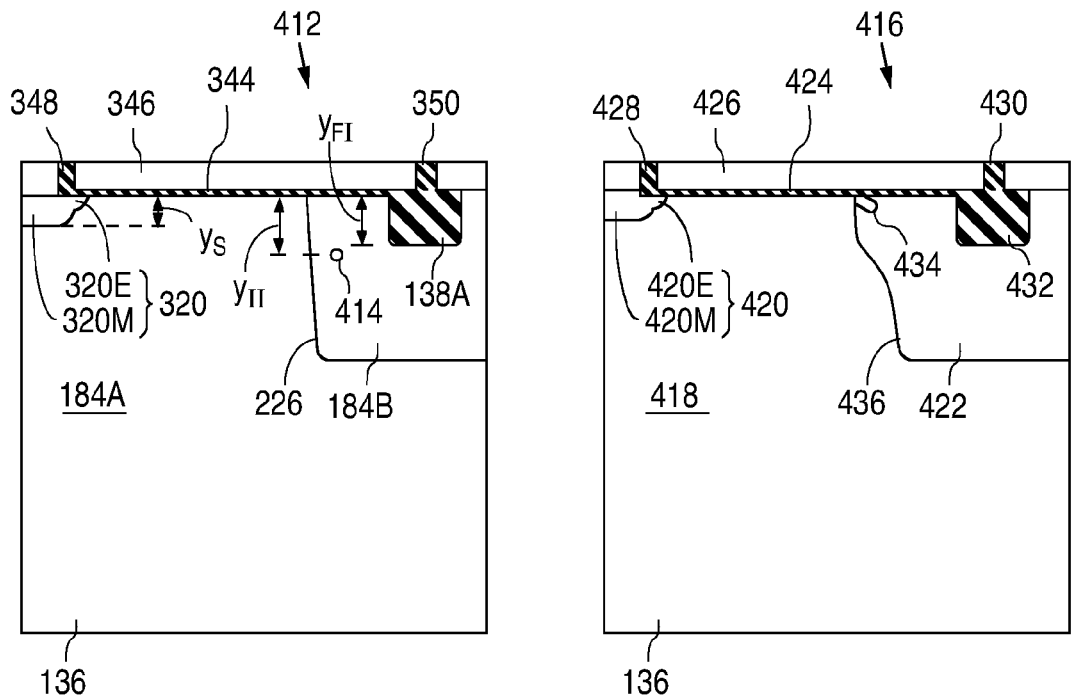
Fig. 28a  Fig. 28b

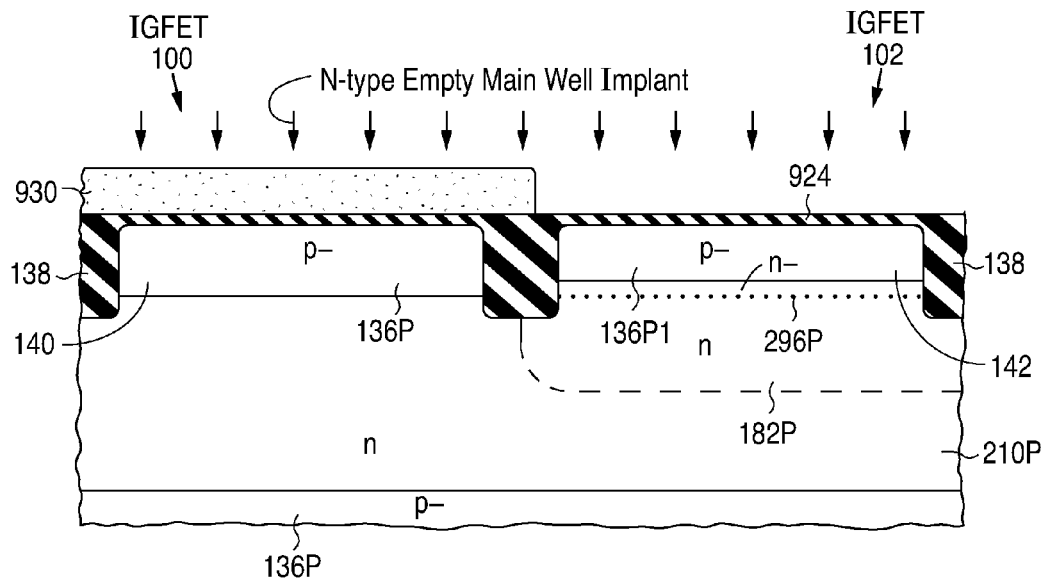
Fig. 33d.1
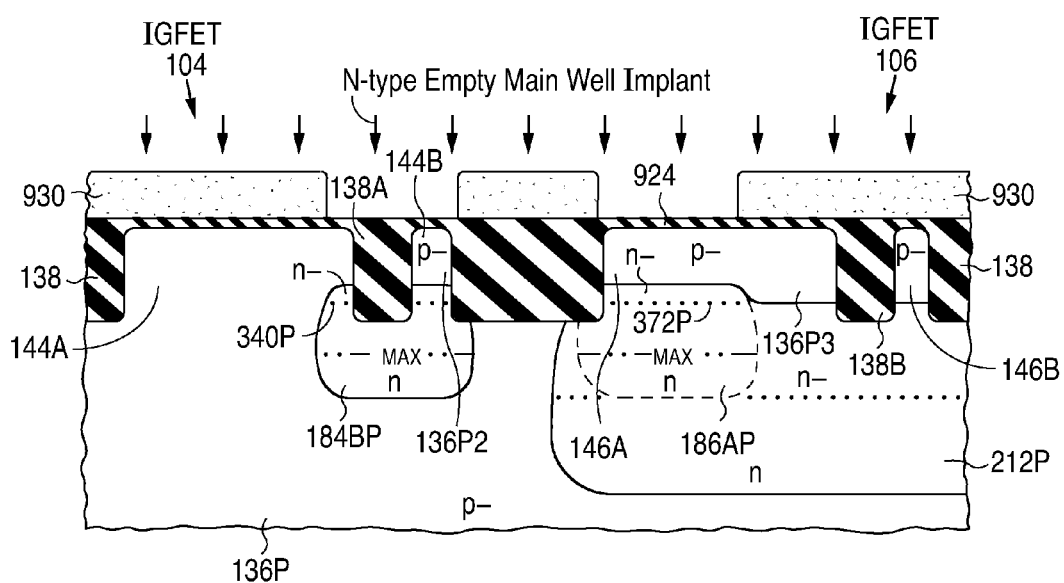
Fig. 33d.2

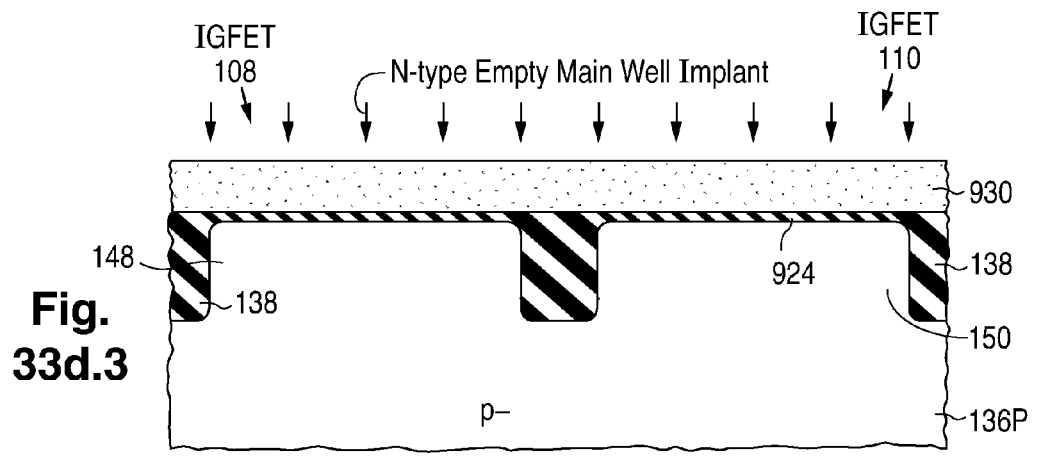
Fig. 33d.3
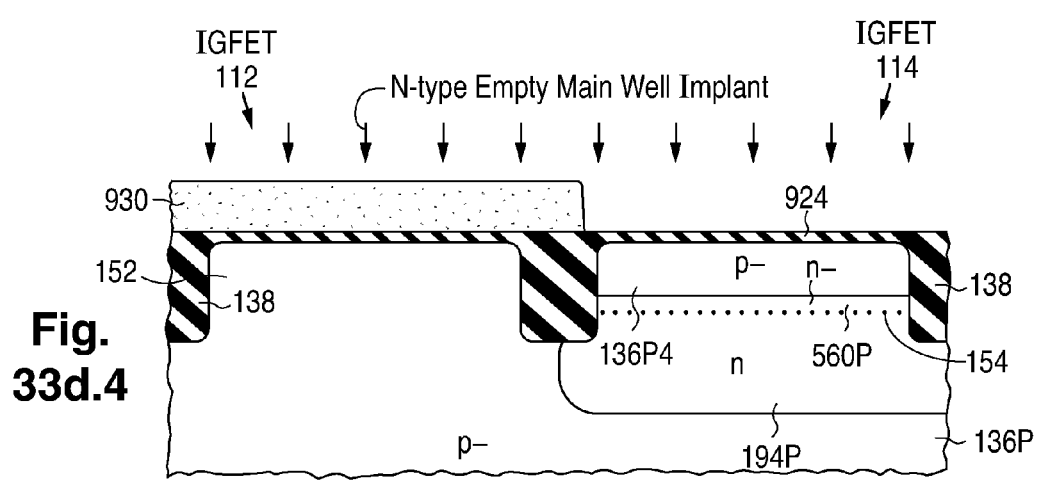
Fig. 33d.4
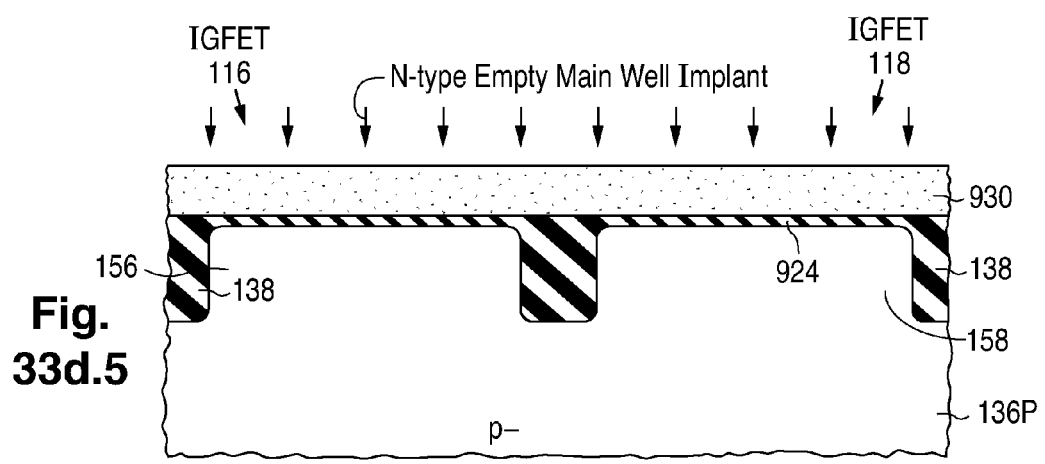
Fig. 33d.5

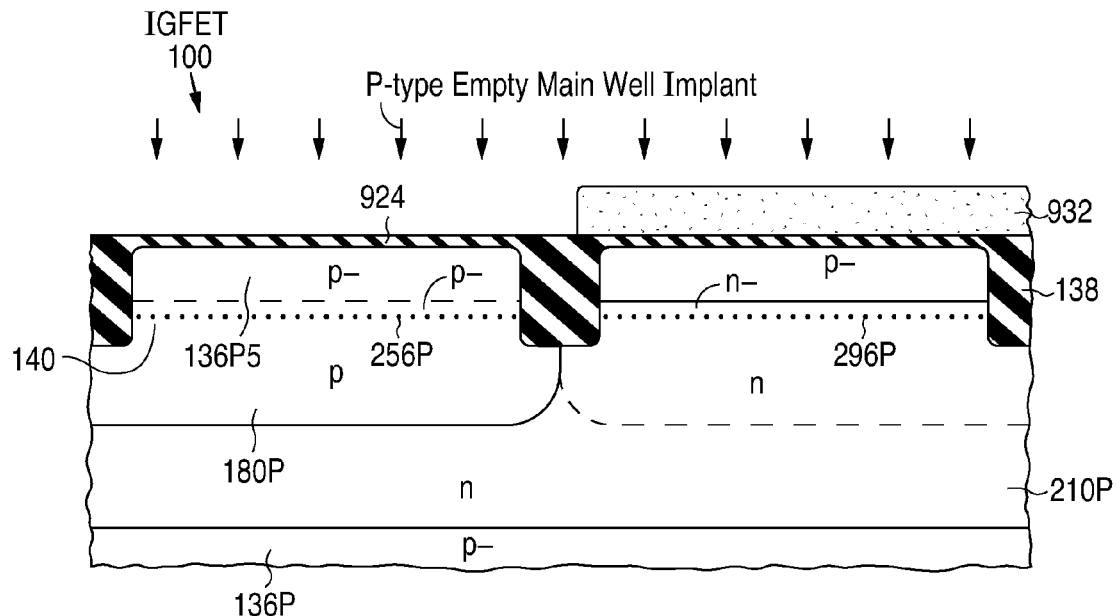
Fig. 33e.1
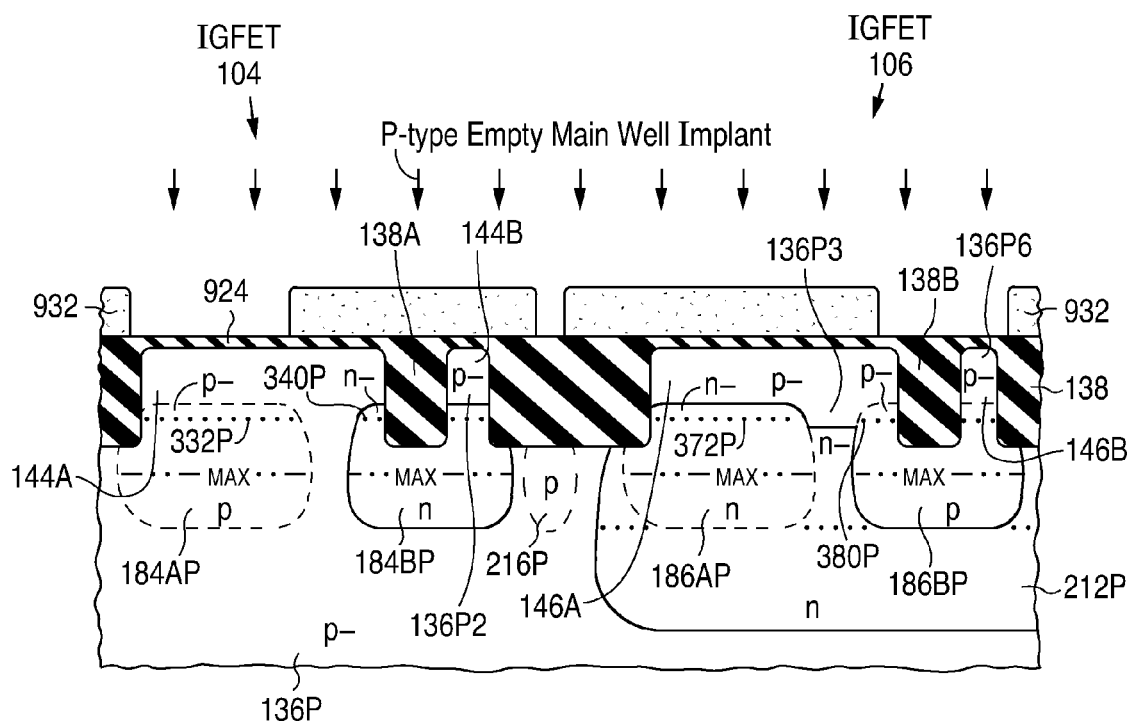
Fig. 33e.2

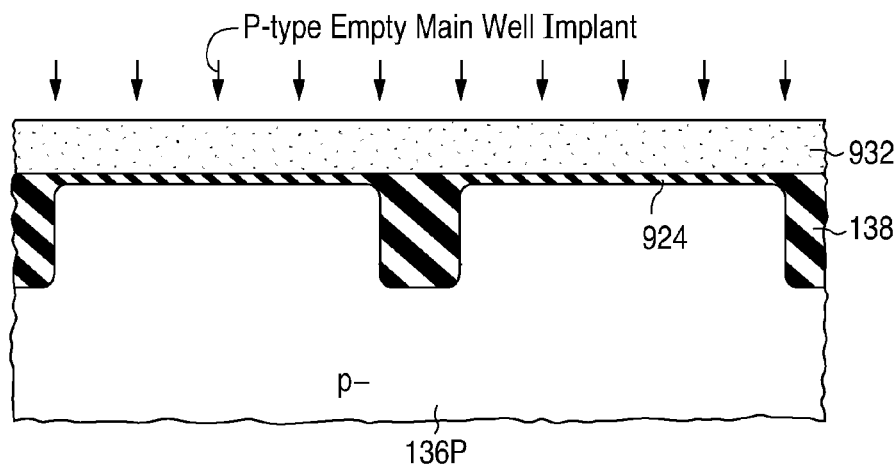
Fig. 33e.3
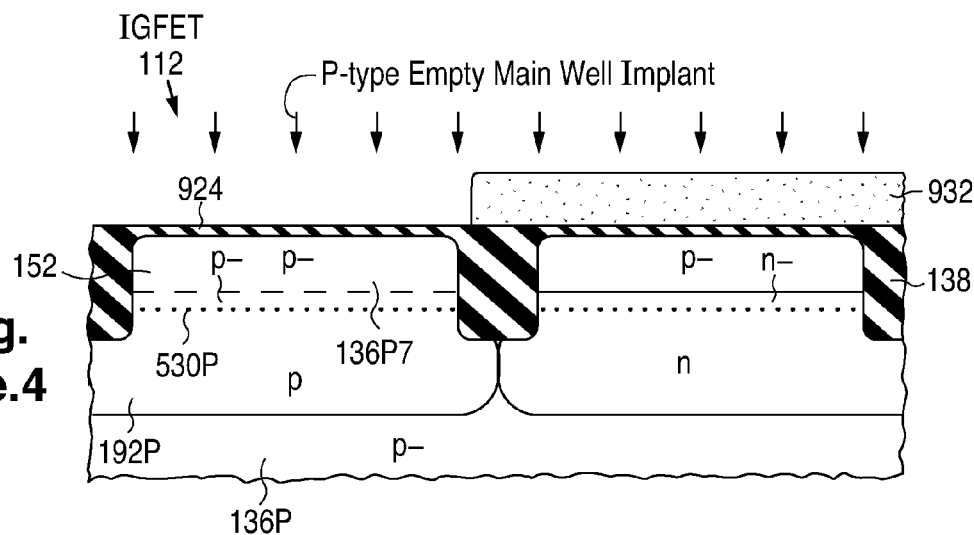
Fig. 33e.4
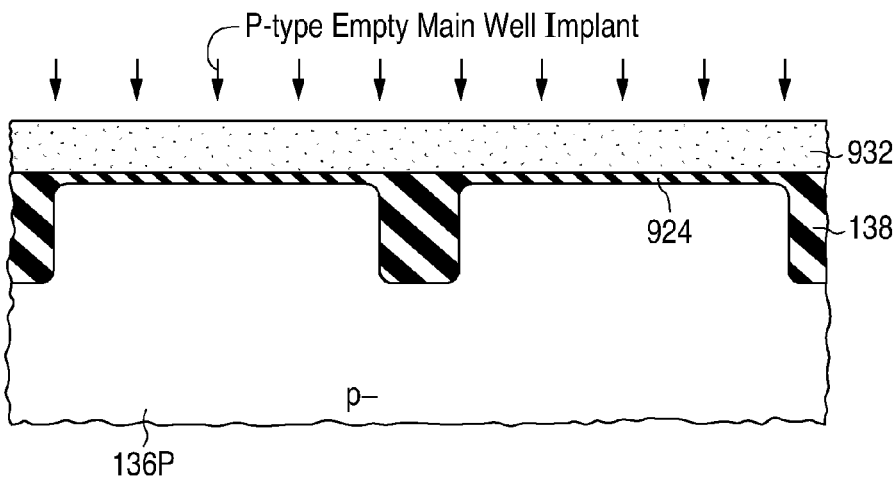
Fig. 33e.5

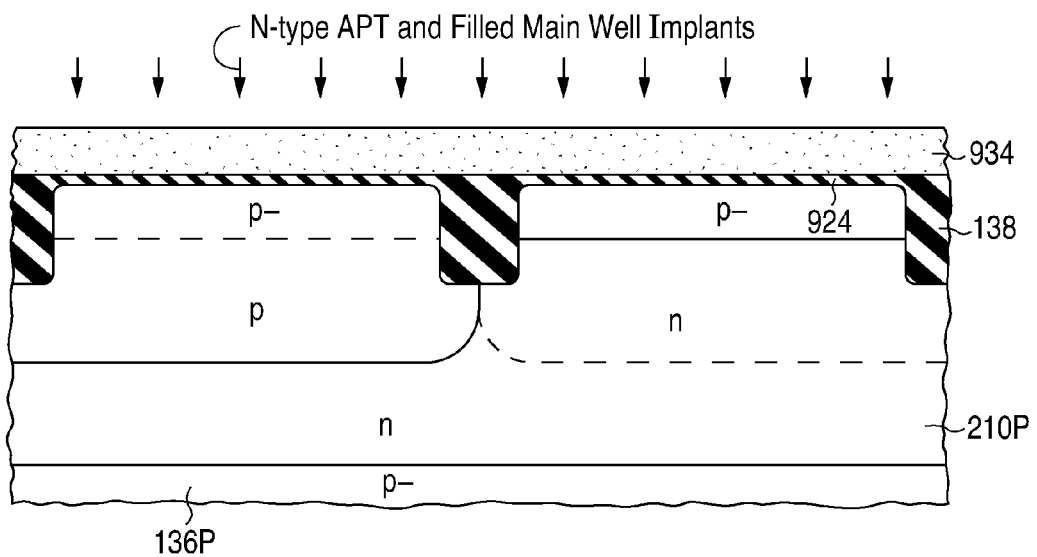
Fig. 33f.1
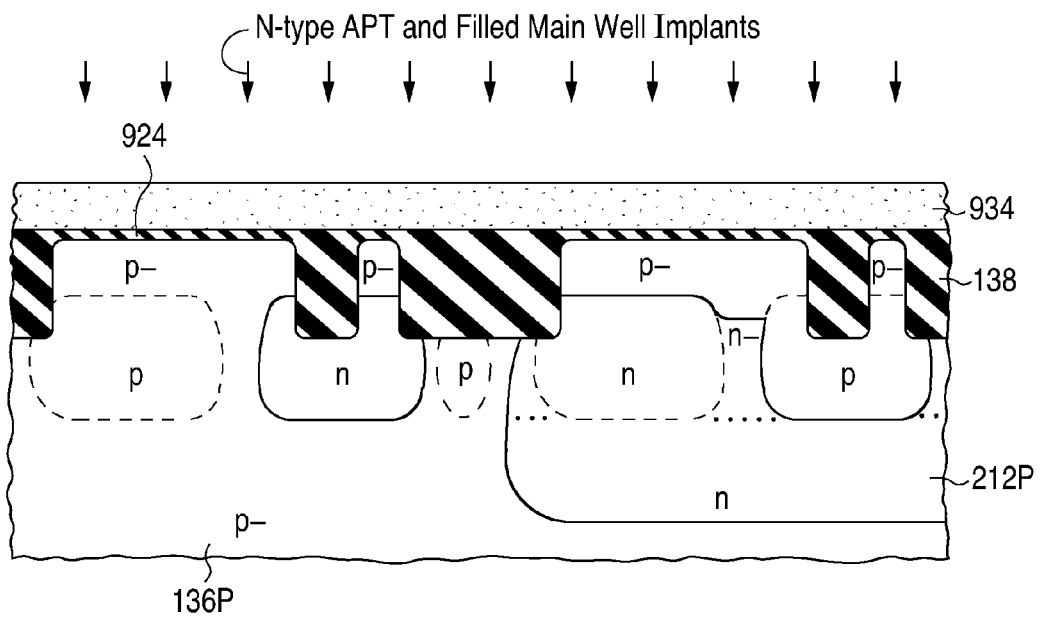
Fig. 33f.2

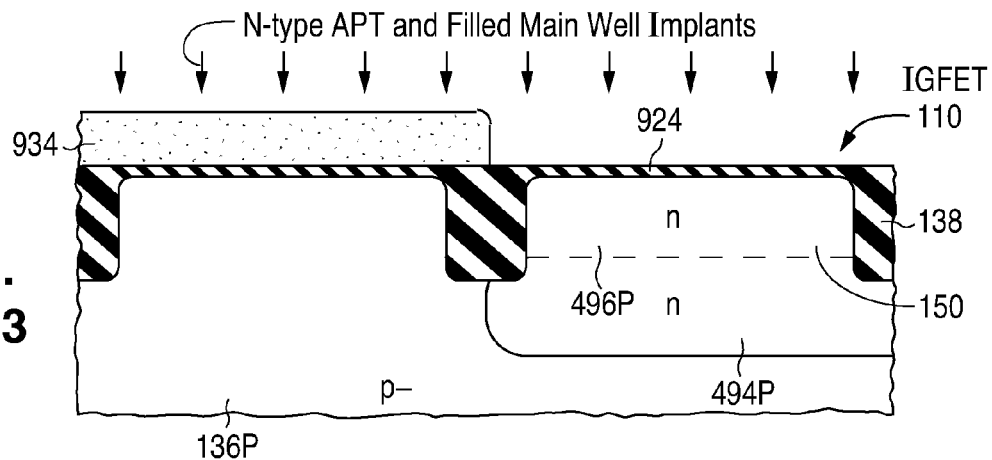
Fig. 33f.3
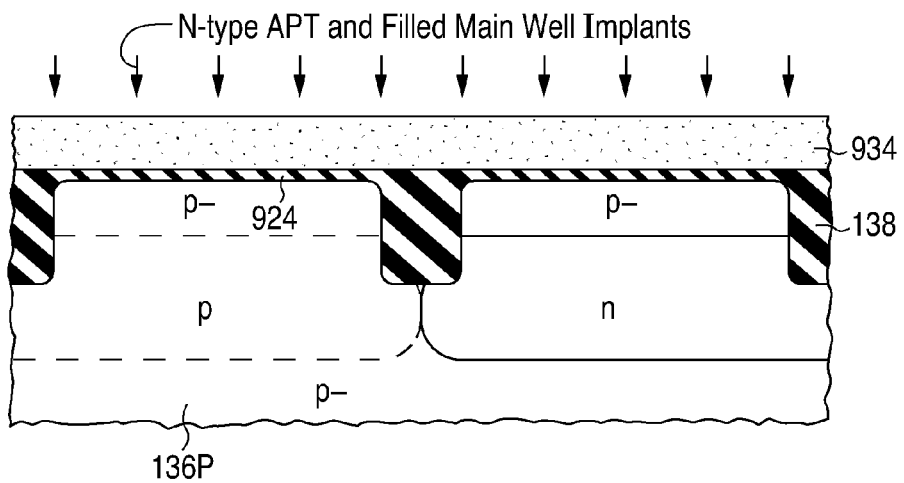
Fig. 33f.4
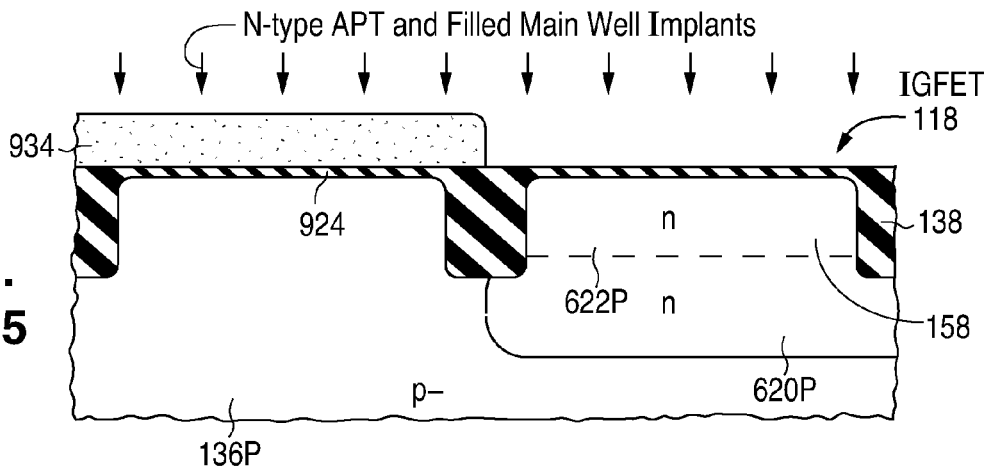
Fig. 33f.5

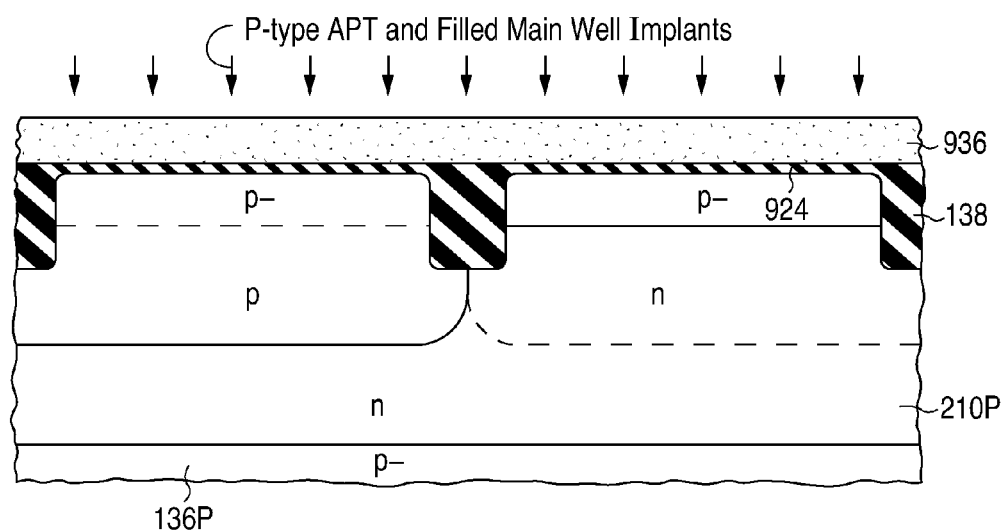
Fig. 33g.1
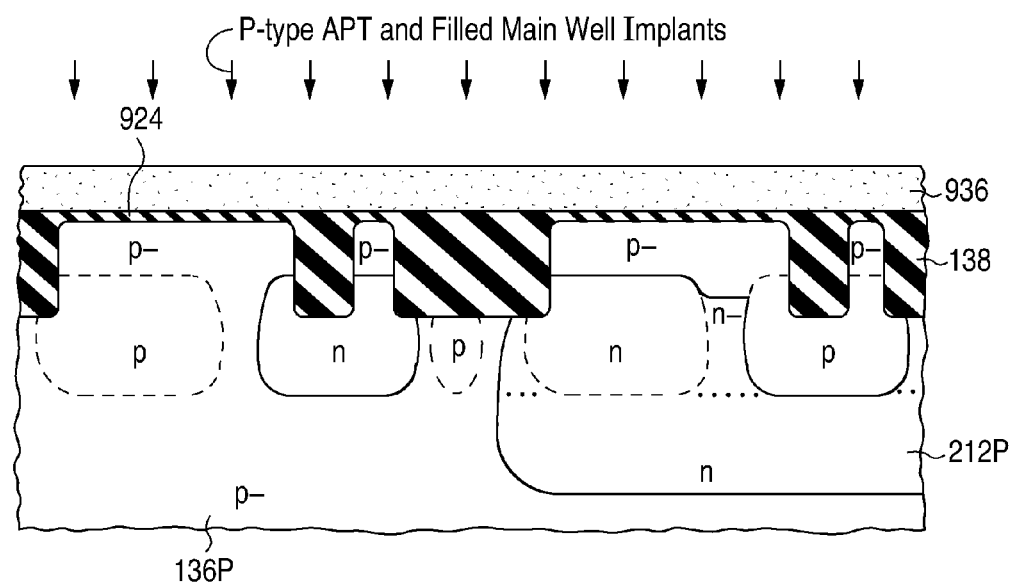
Fig. 33g.2

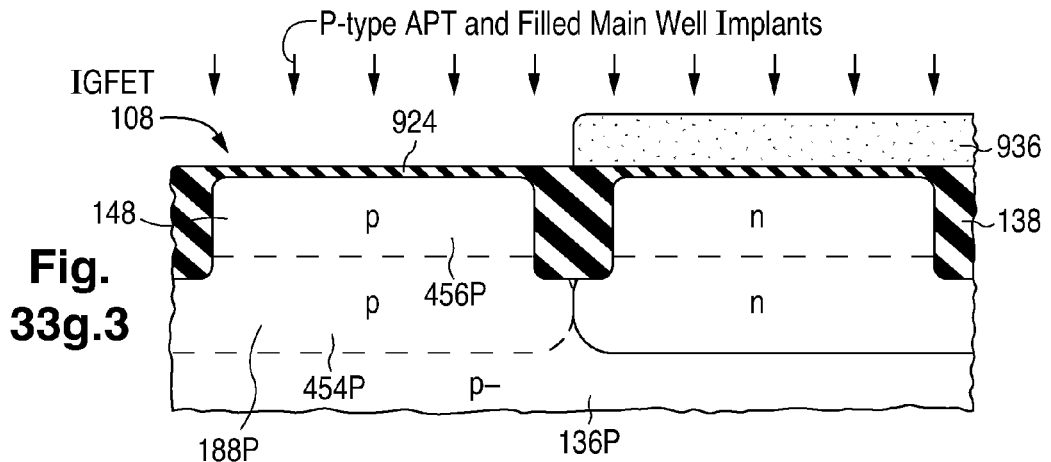
Fig. 33g.3
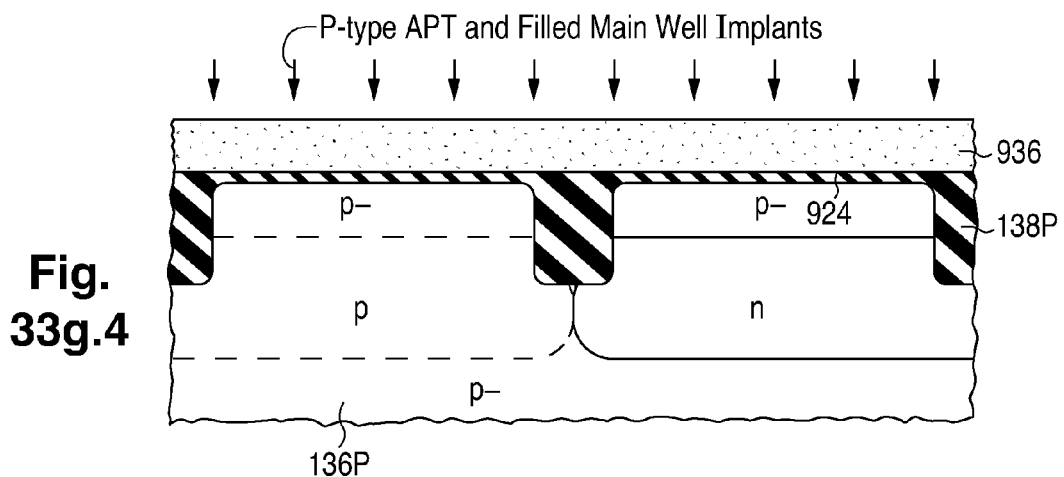
Fig. 33g.4
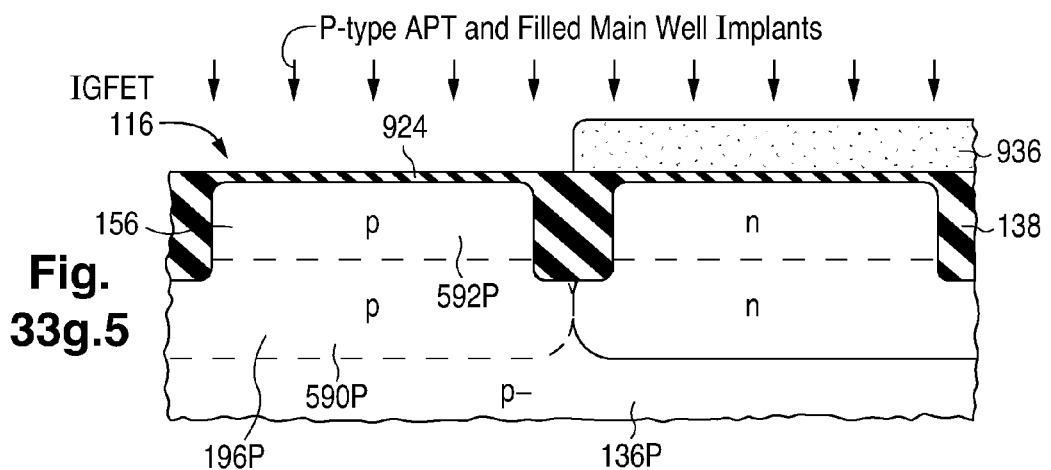
Fig. 33g.5

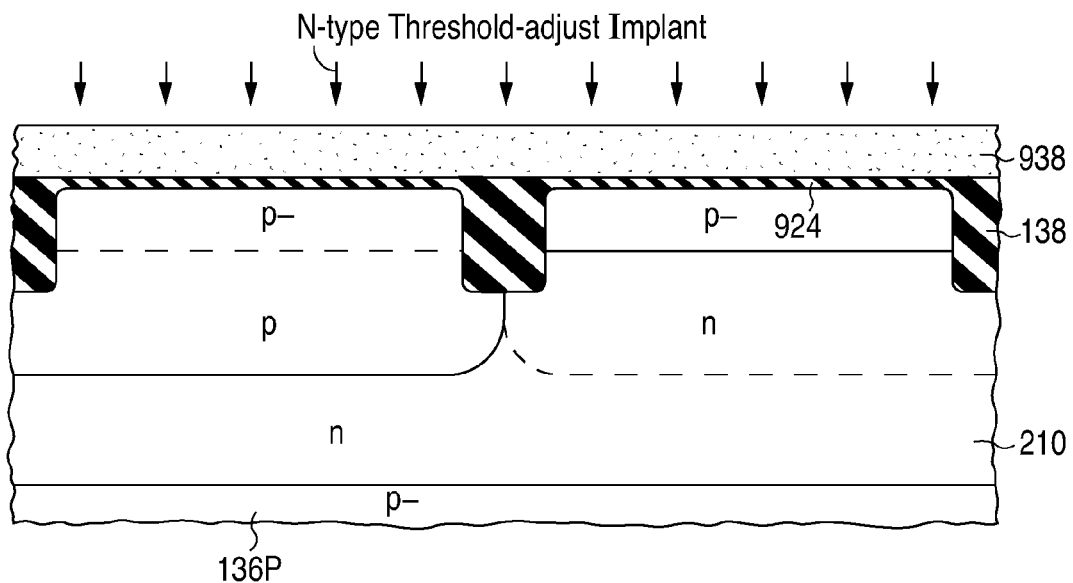
Fig. 33h.1
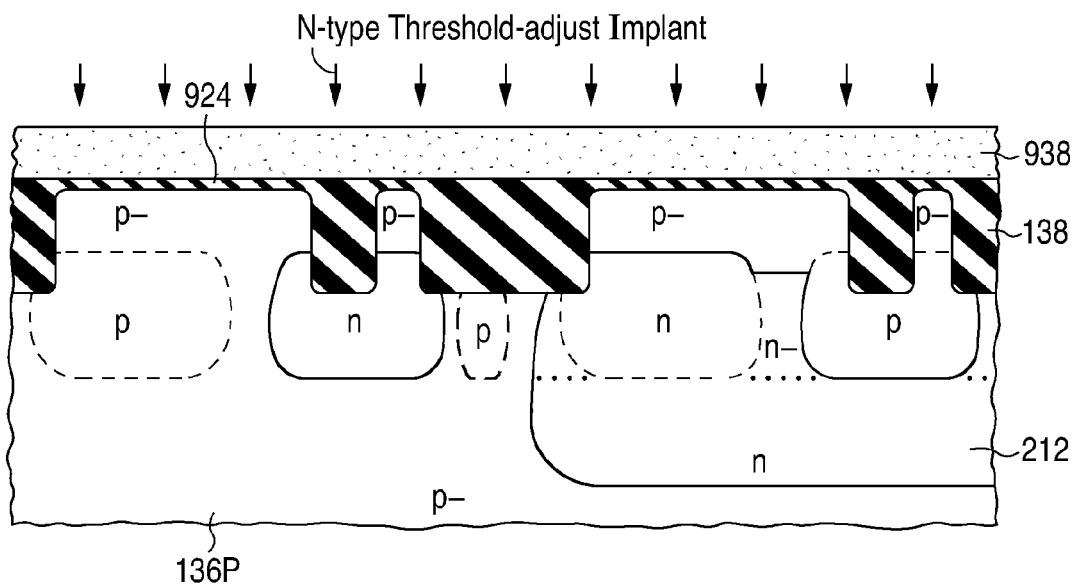
Fig. 33h.2

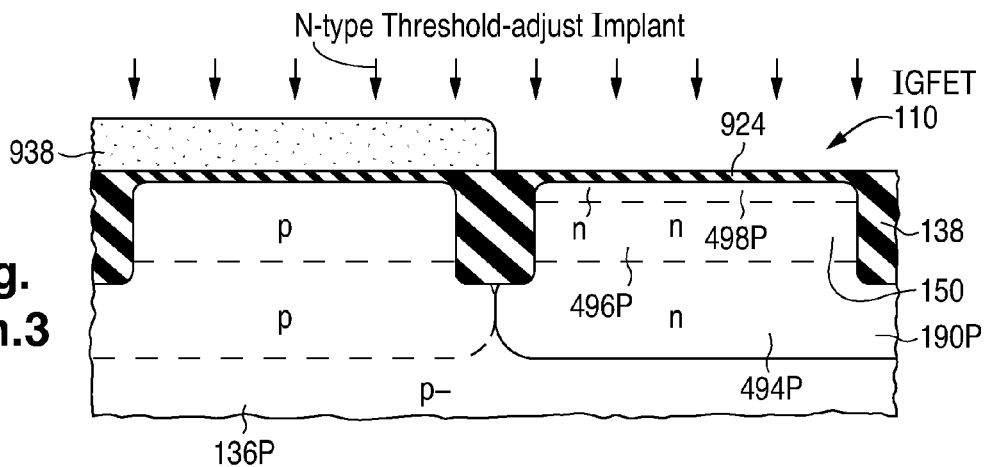
Fig. 33h.3
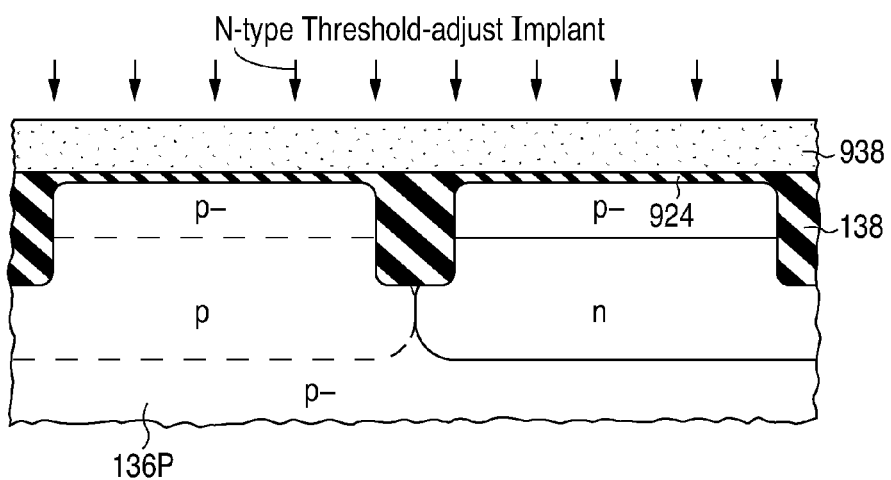
Fig. 33h.4
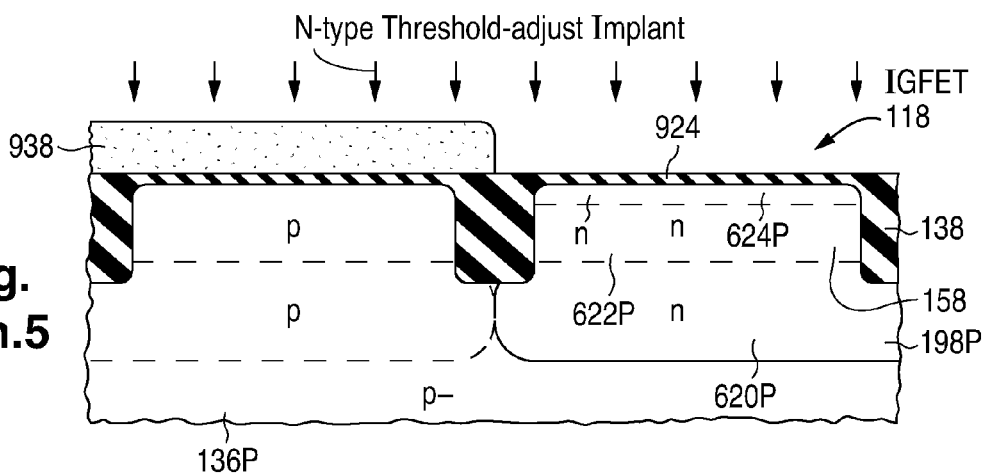
Fig. 33h.5

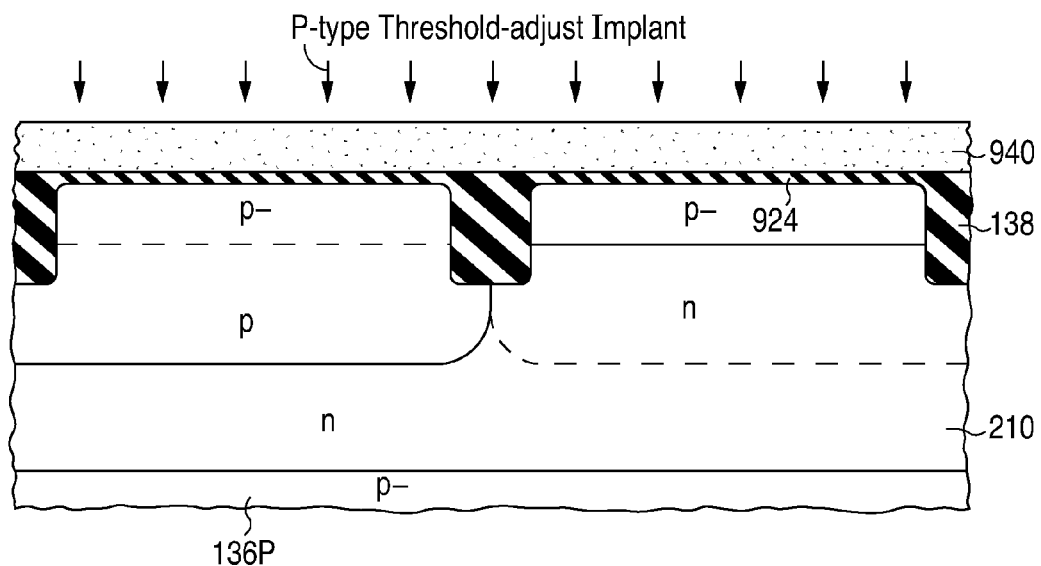
Fig. 33i.1
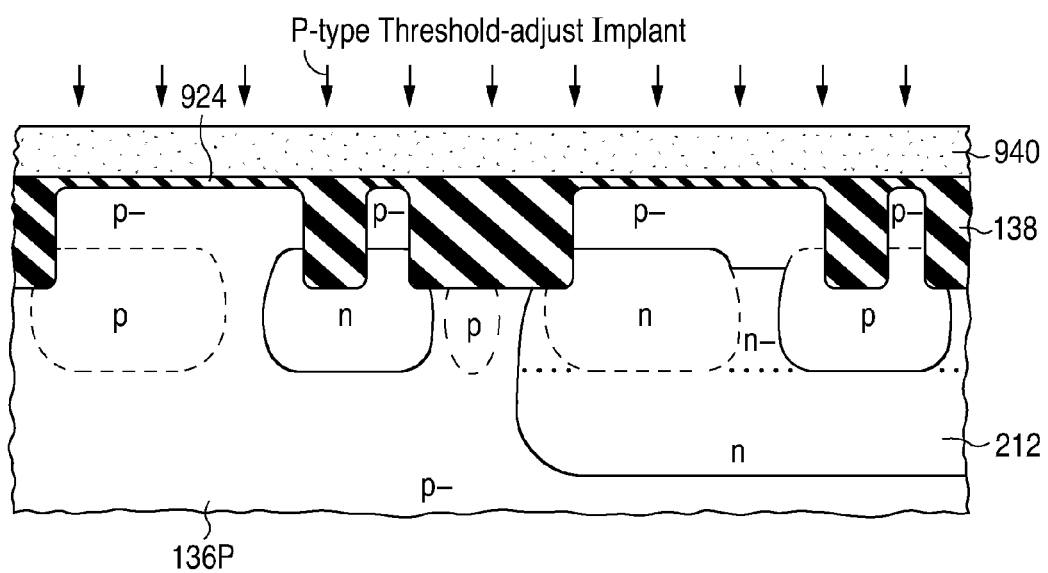
Fig. 33i.2

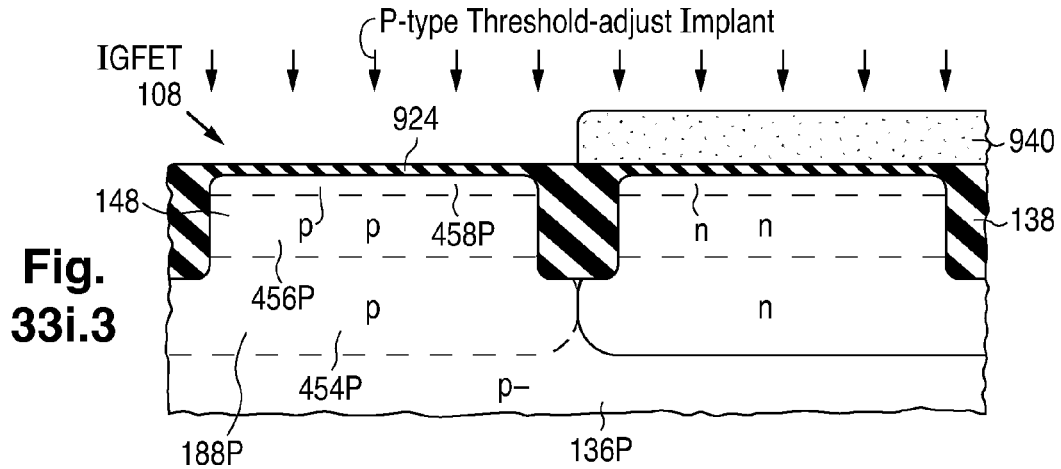
Fig. 33i.3
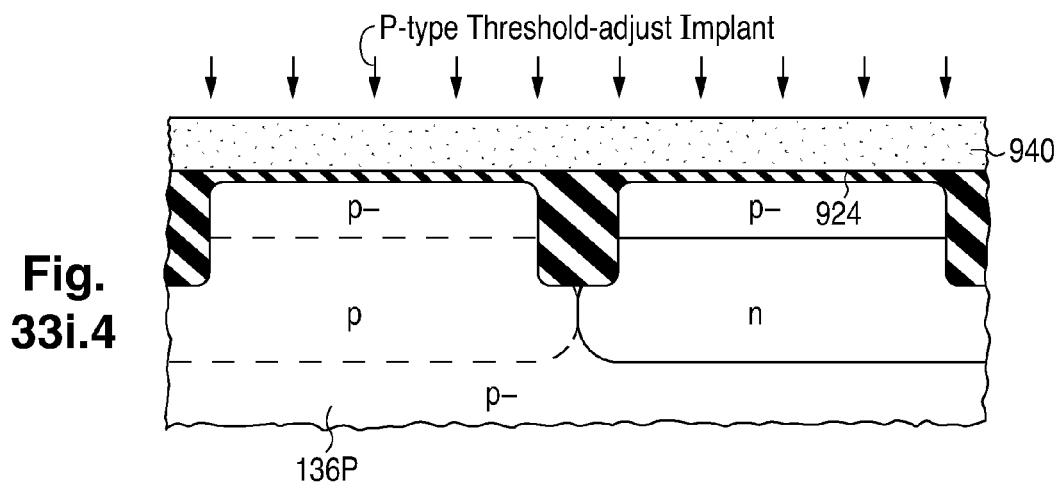
Fig. 33i.4
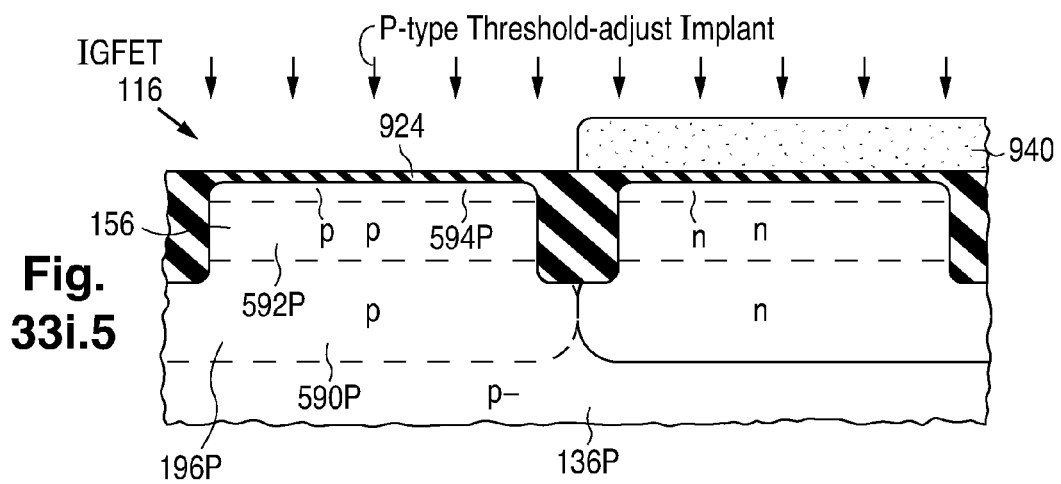
Fig. 33i.5

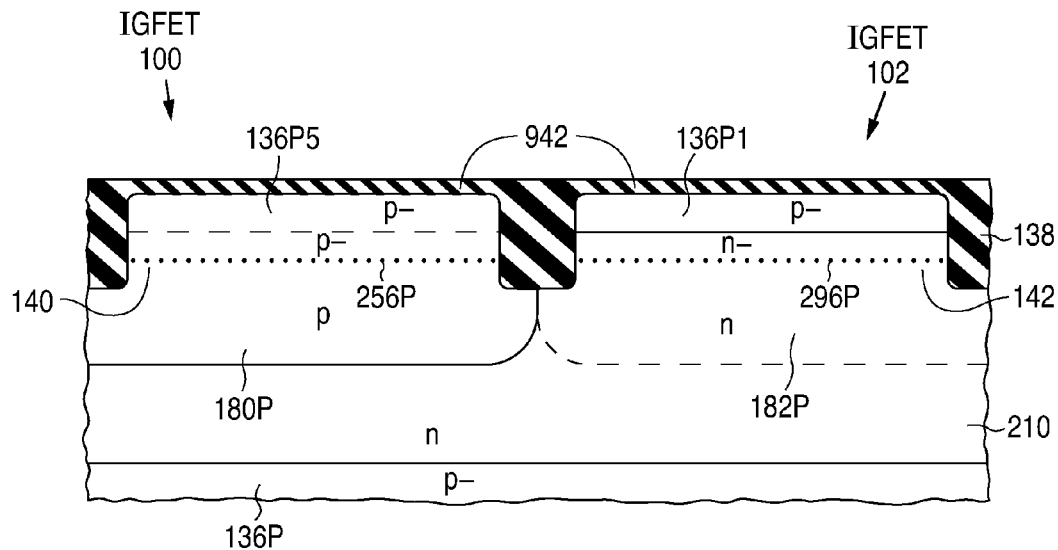
Fig. 33j.1
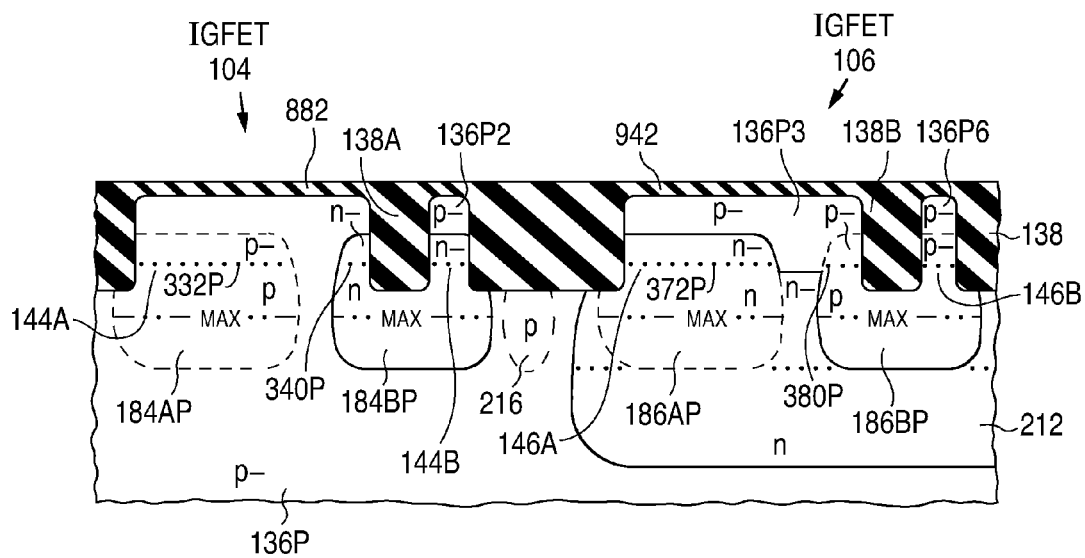
Fig. 33j.2

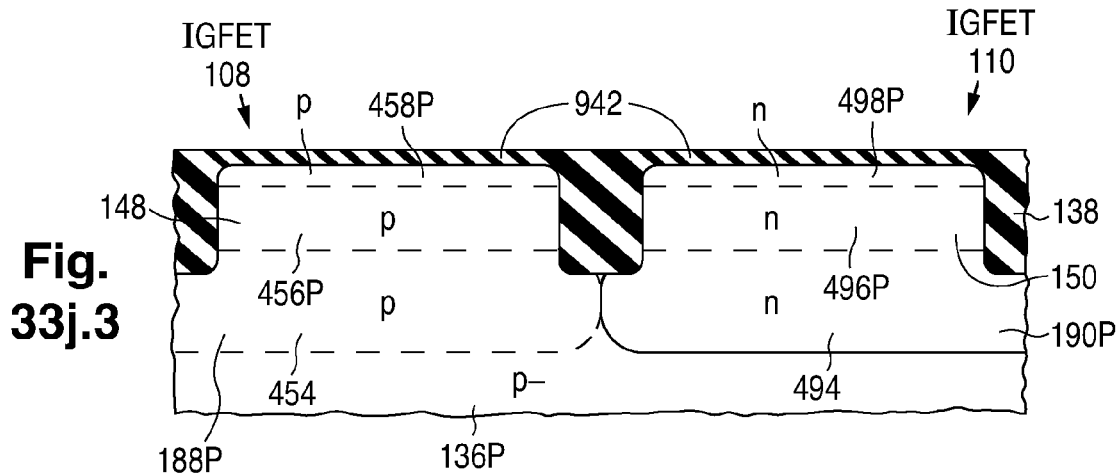
Fig. 33j.3
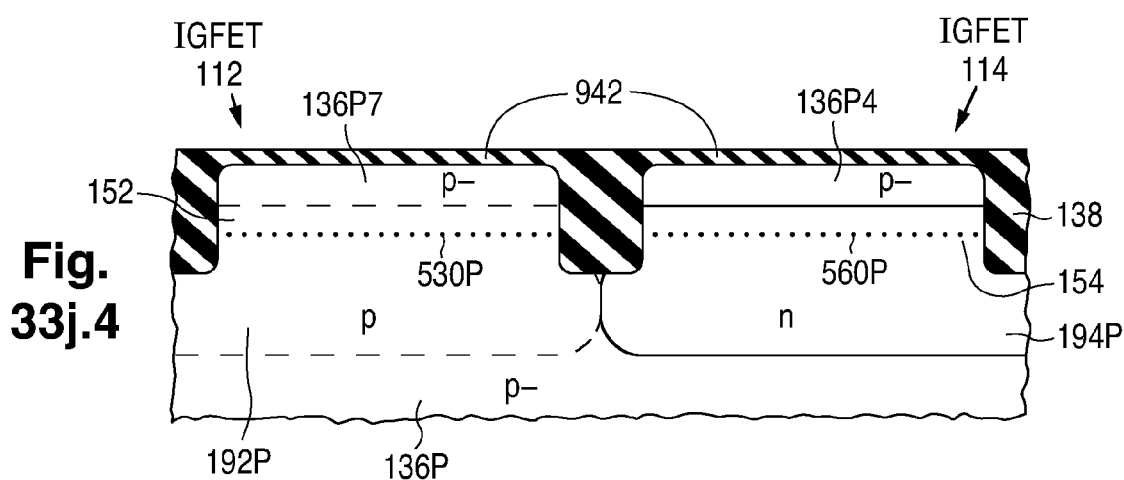
Fig. 33j.4
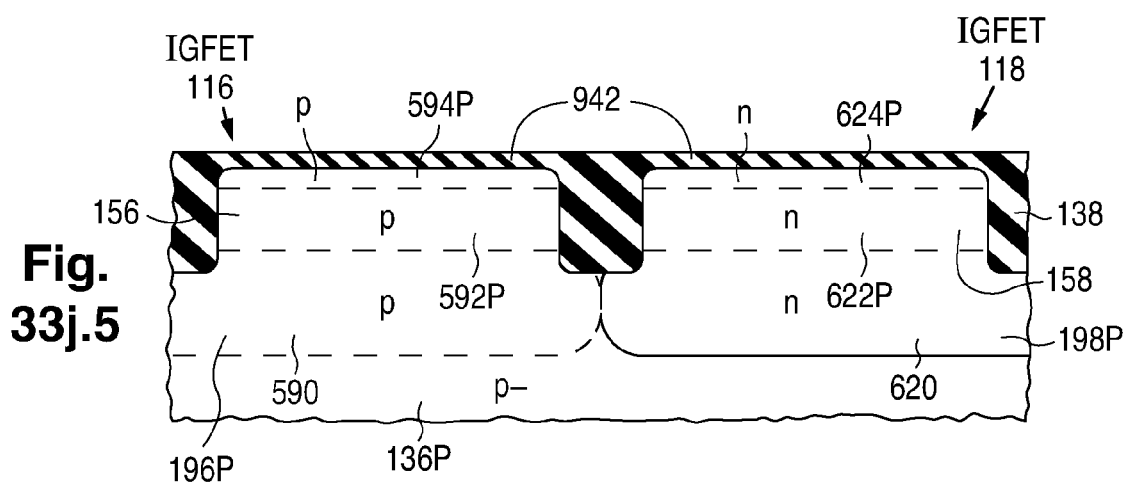
Fig. 33j.5

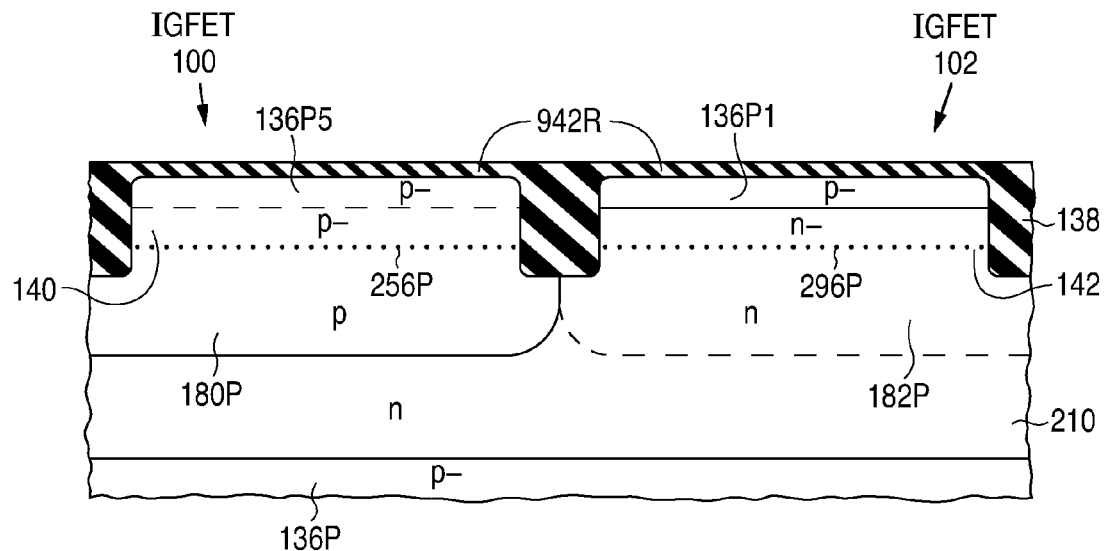
Fig. 33k.1
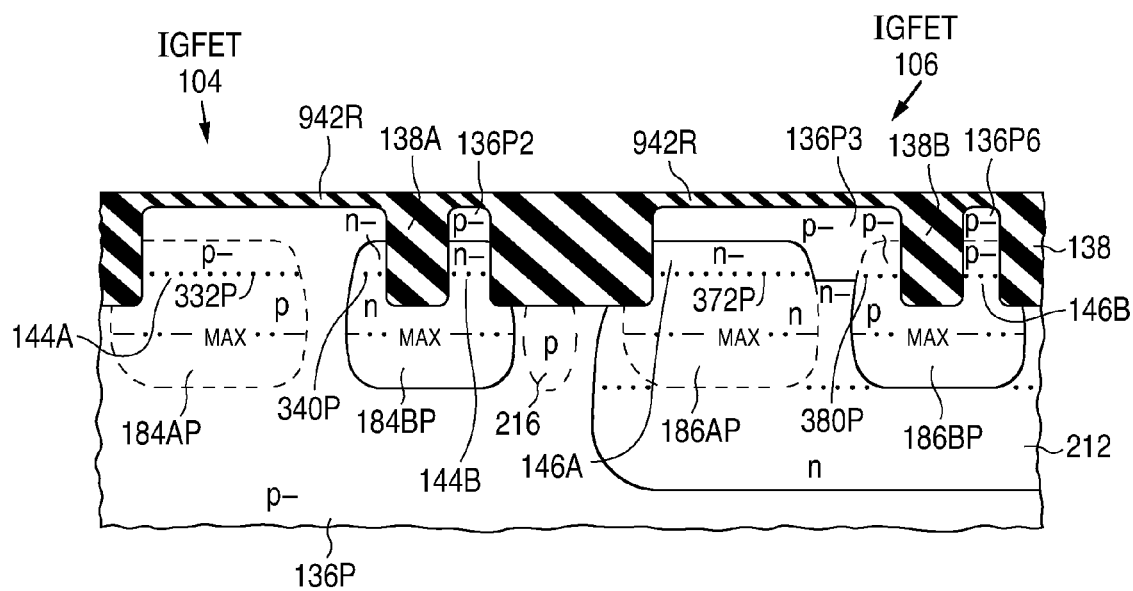
Fig. 33k.2

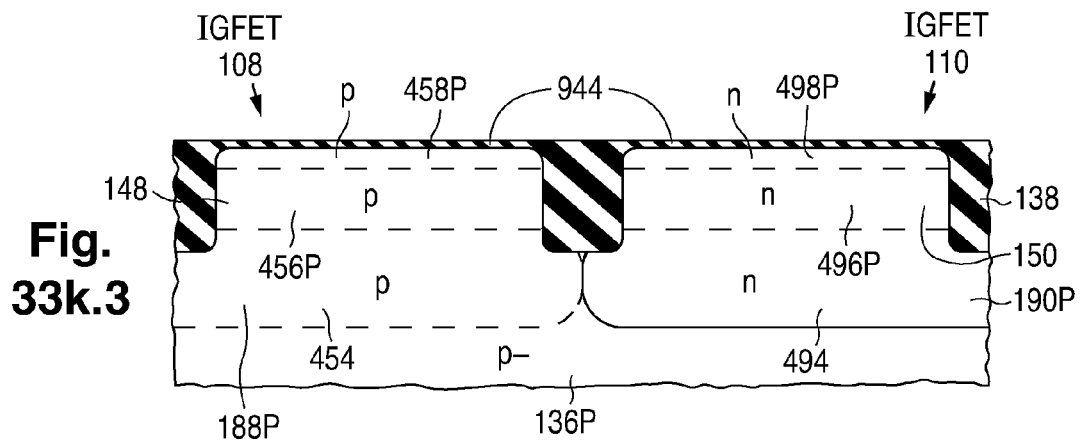
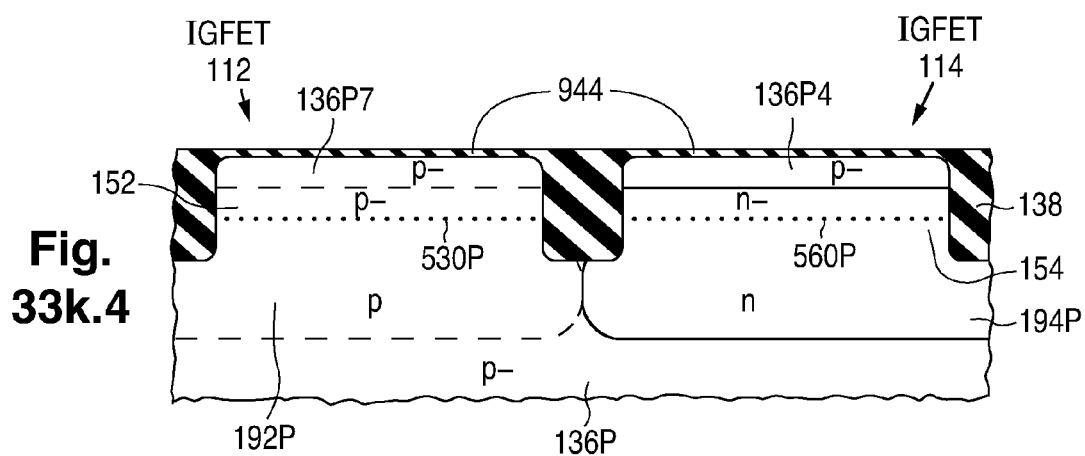
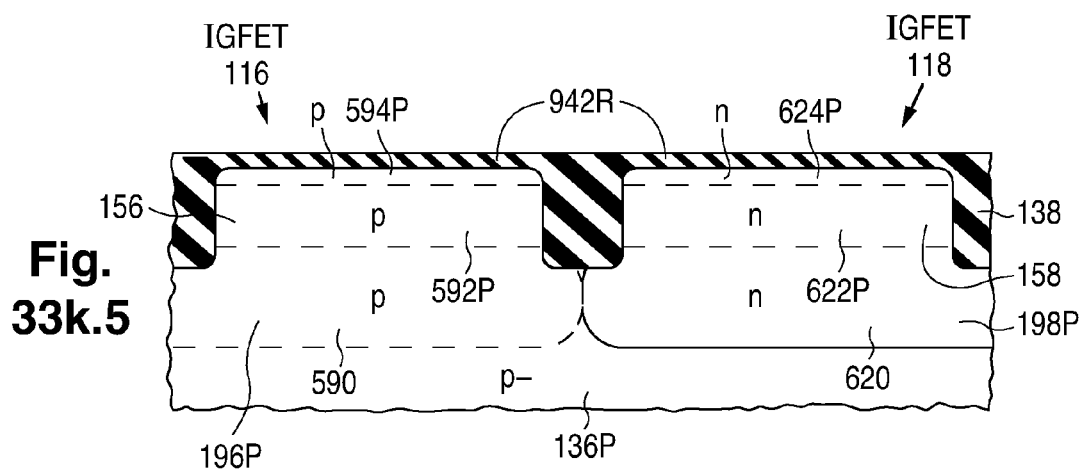

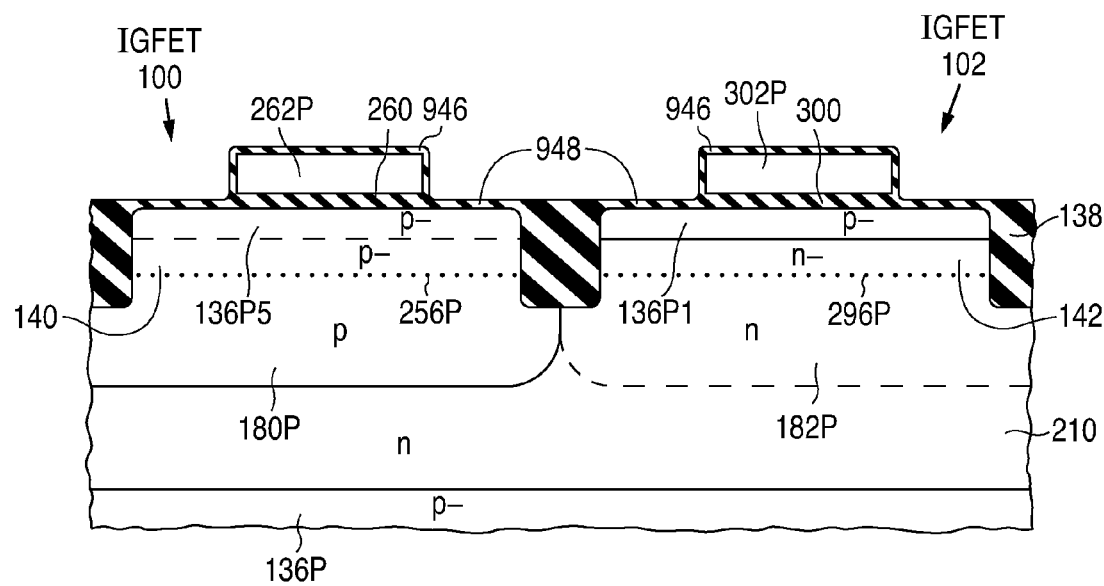
Fig. 33I.1
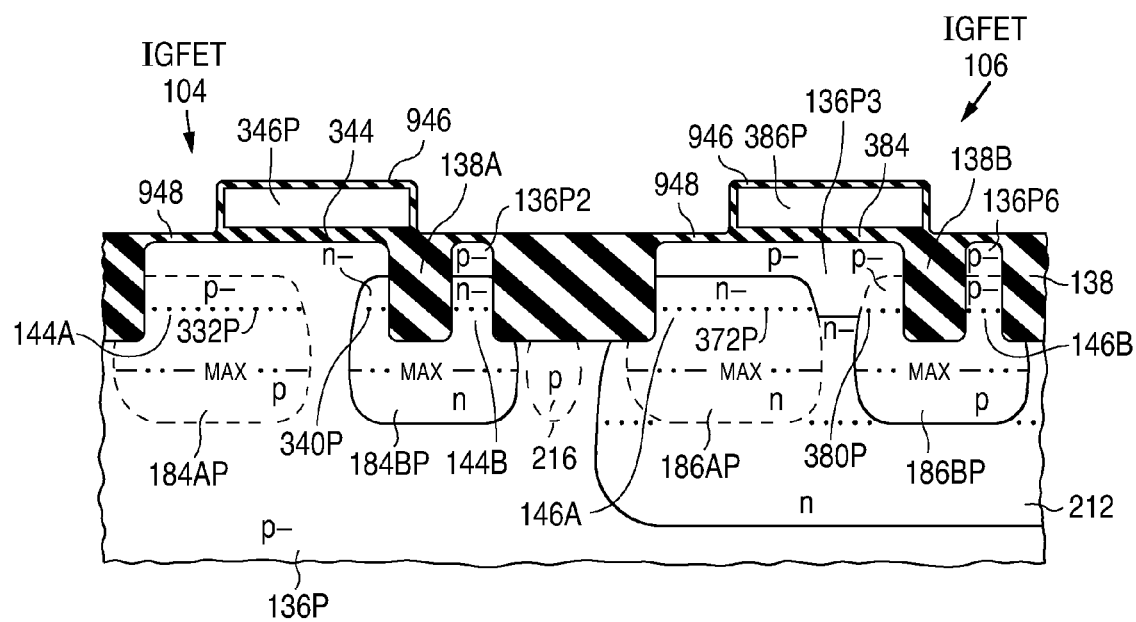
Fig. 33I.2

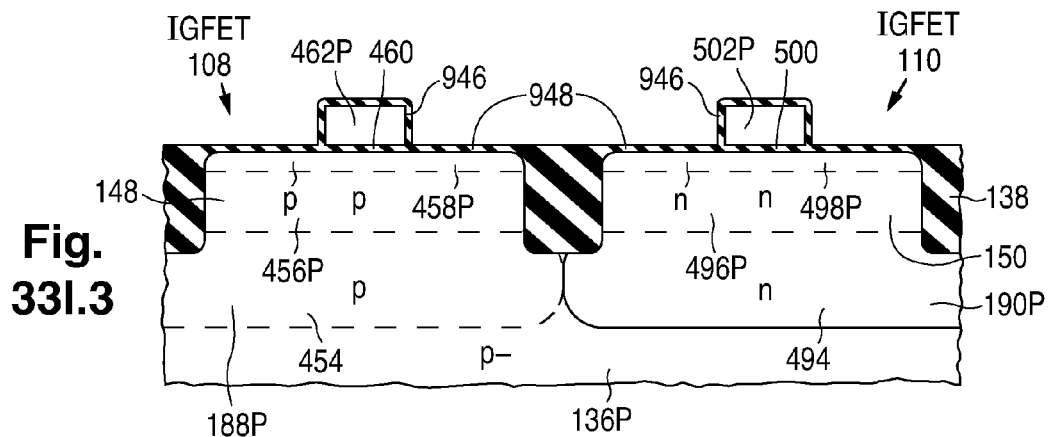
Fig. 33I.3
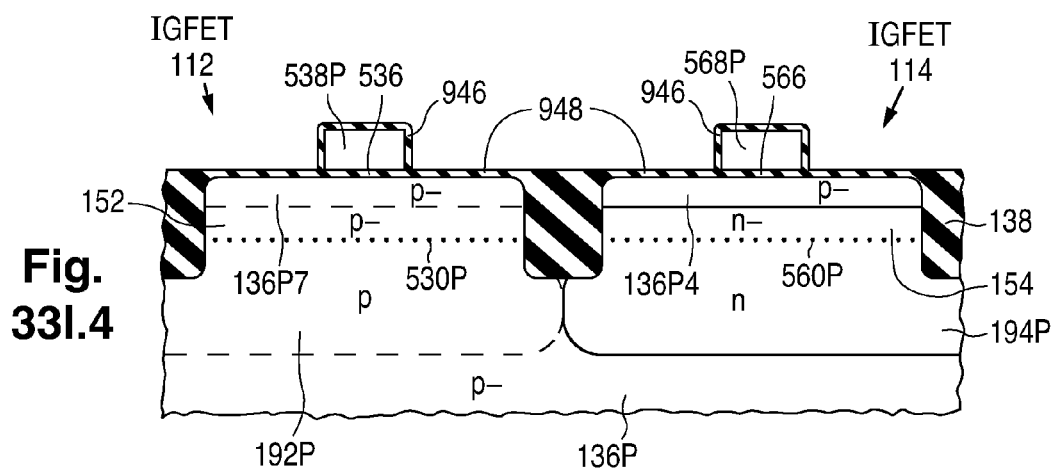
Fig. 33I.4
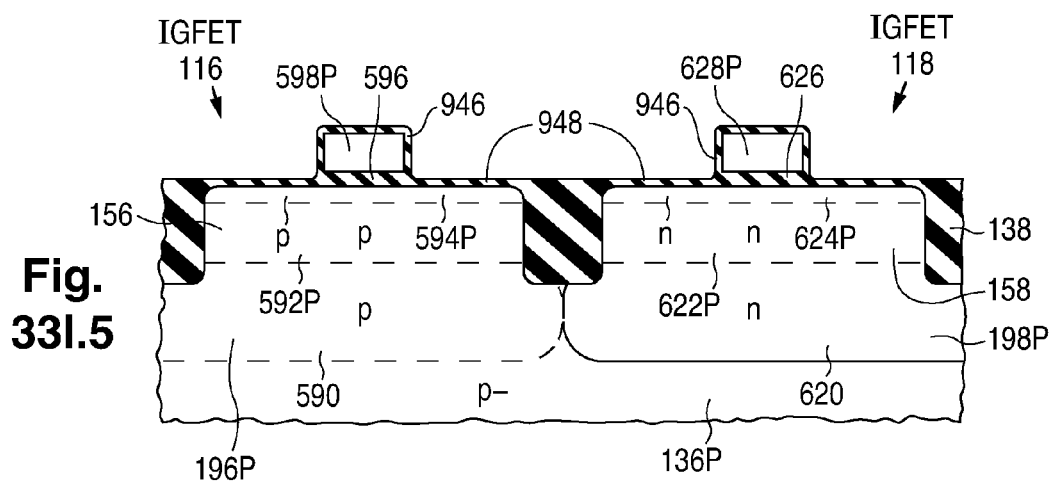
Fig. 33I.5

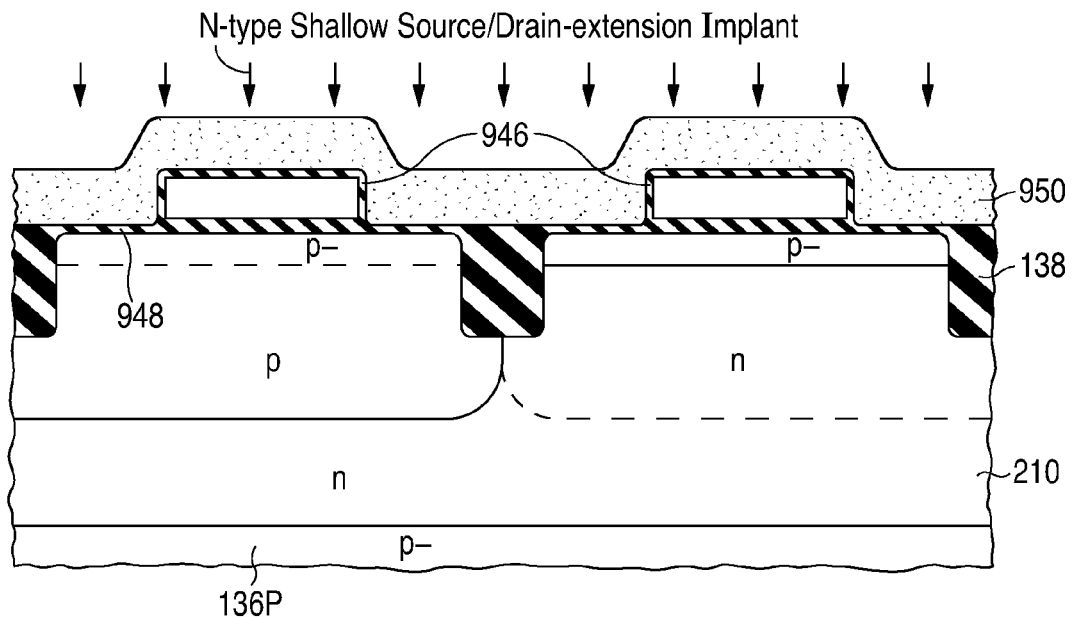
Fig. 33m.1
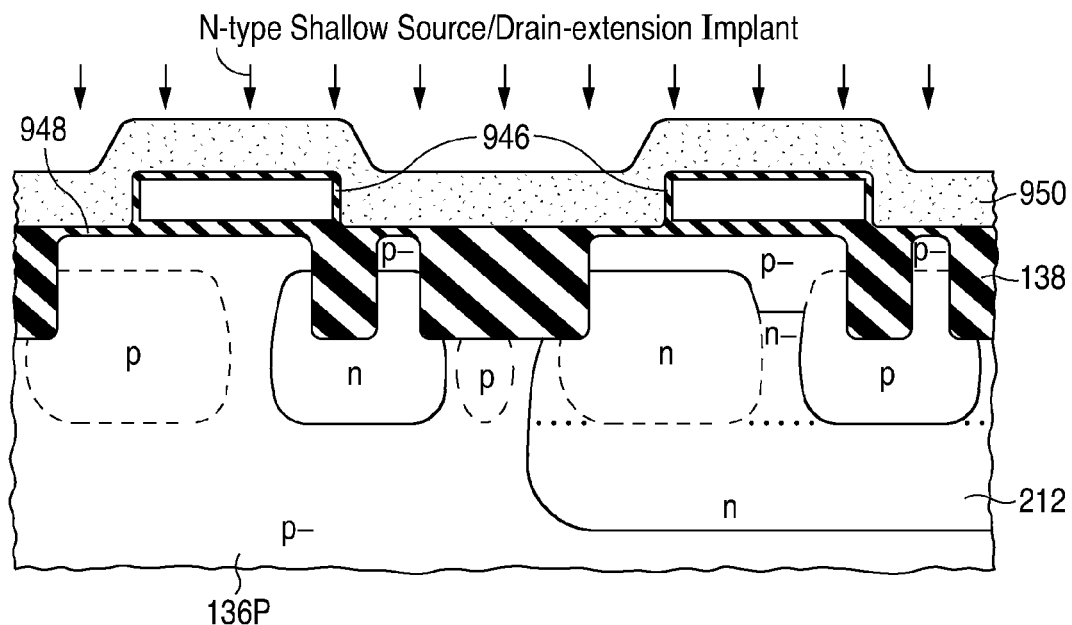
Fig. 33m.2

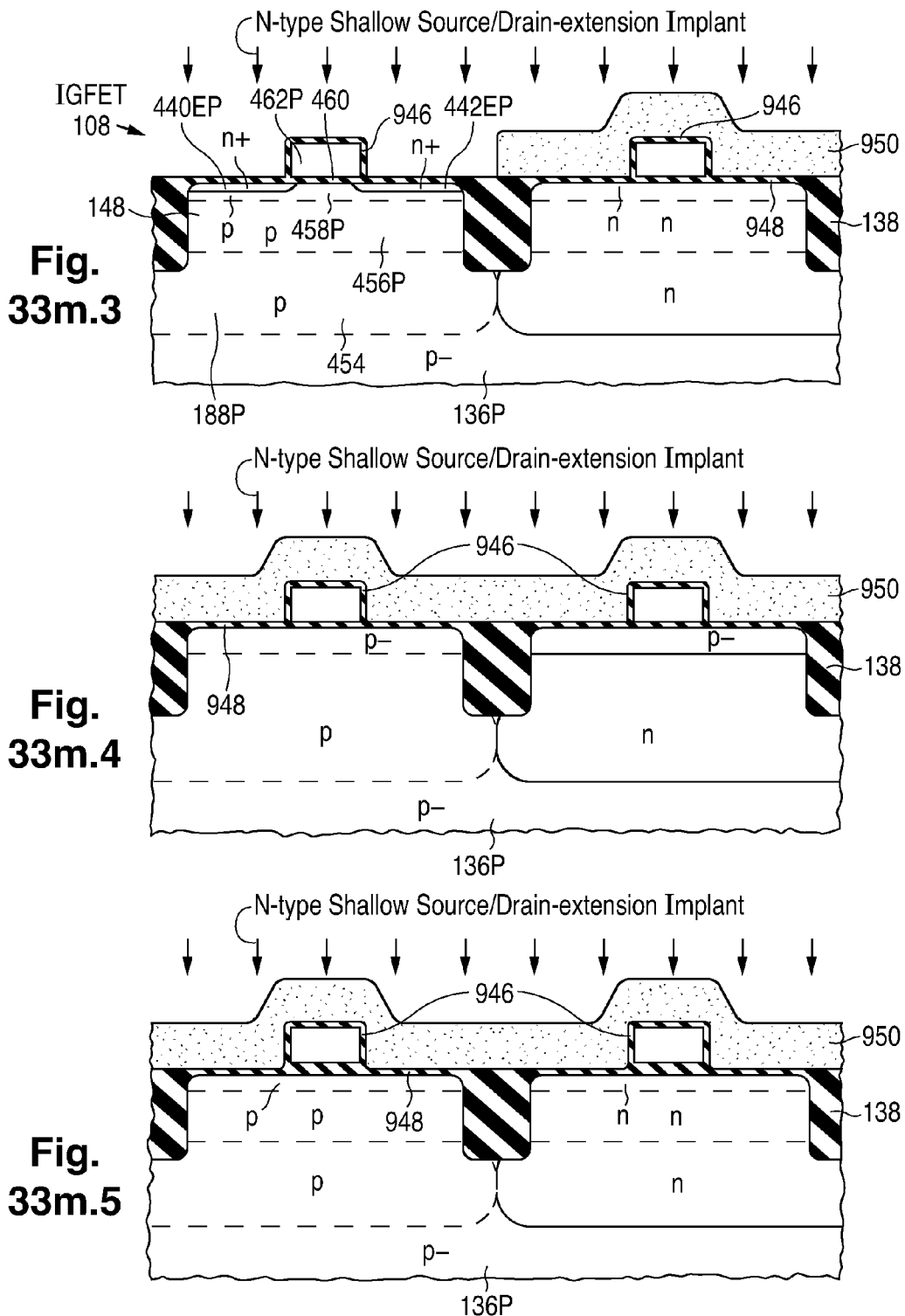

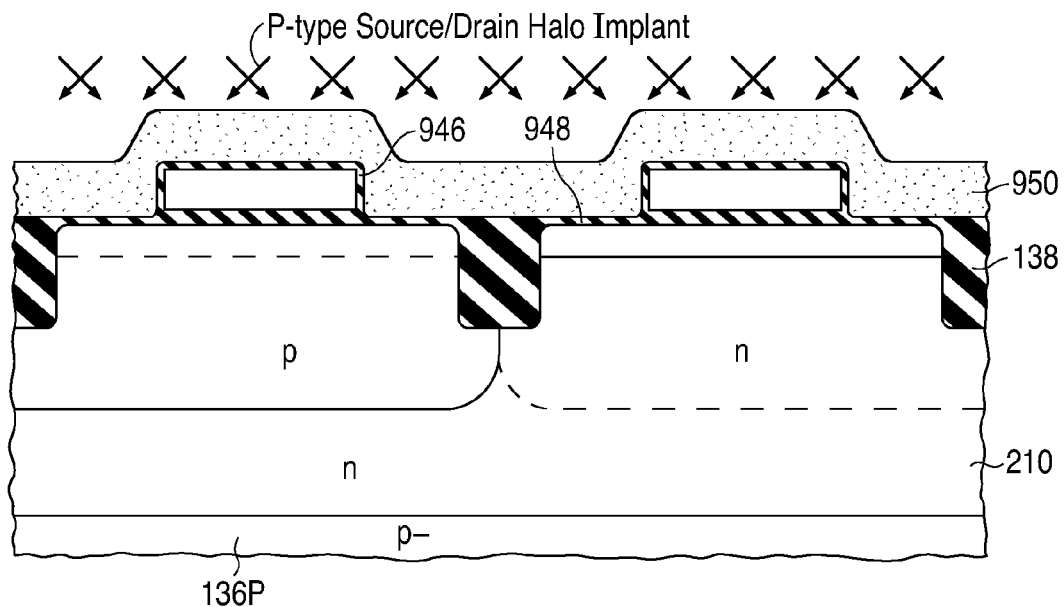
Fig. 33n.1
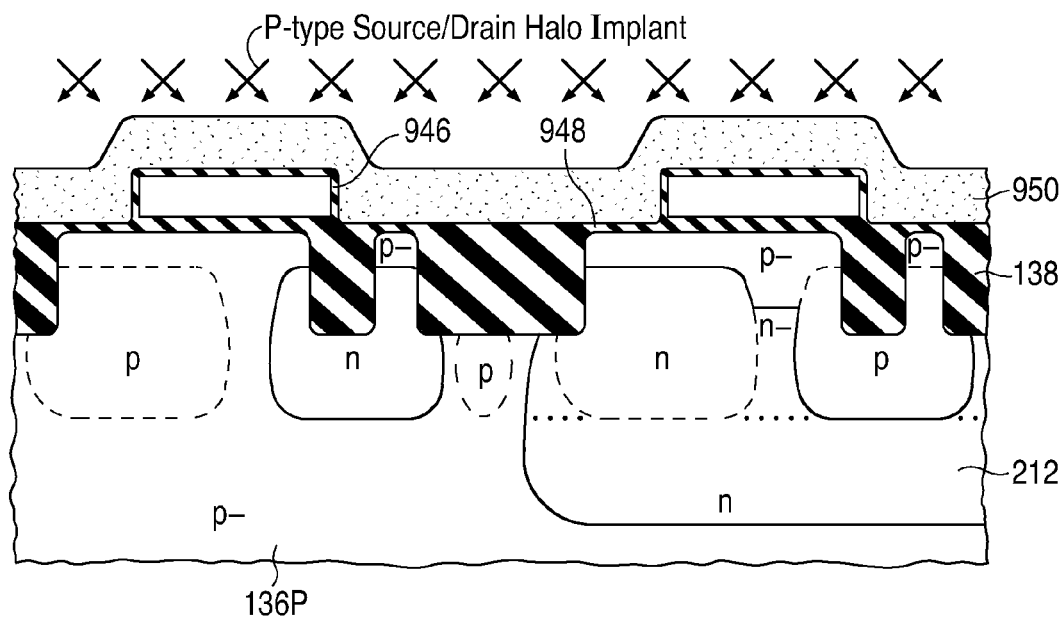
Fig. 33n.2

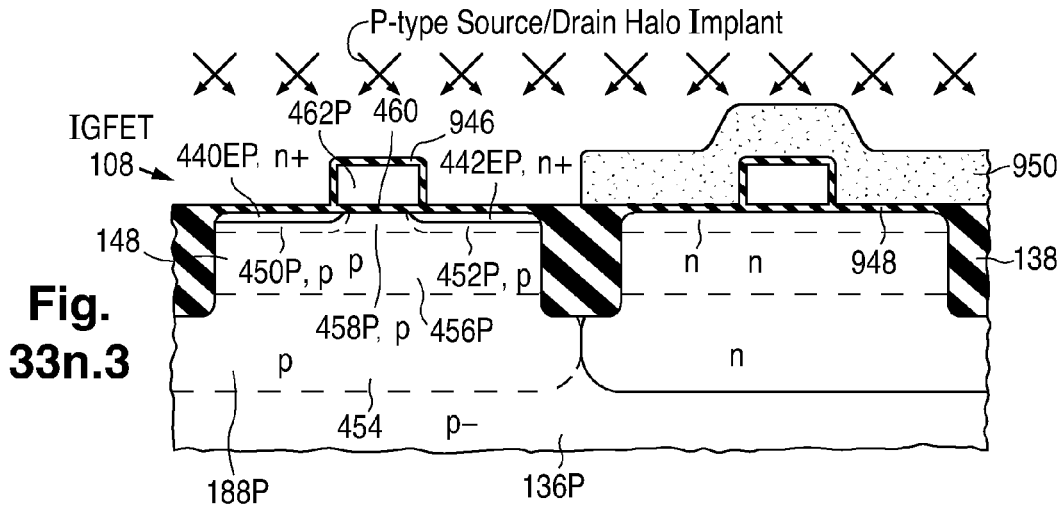
Fig. 33n.3
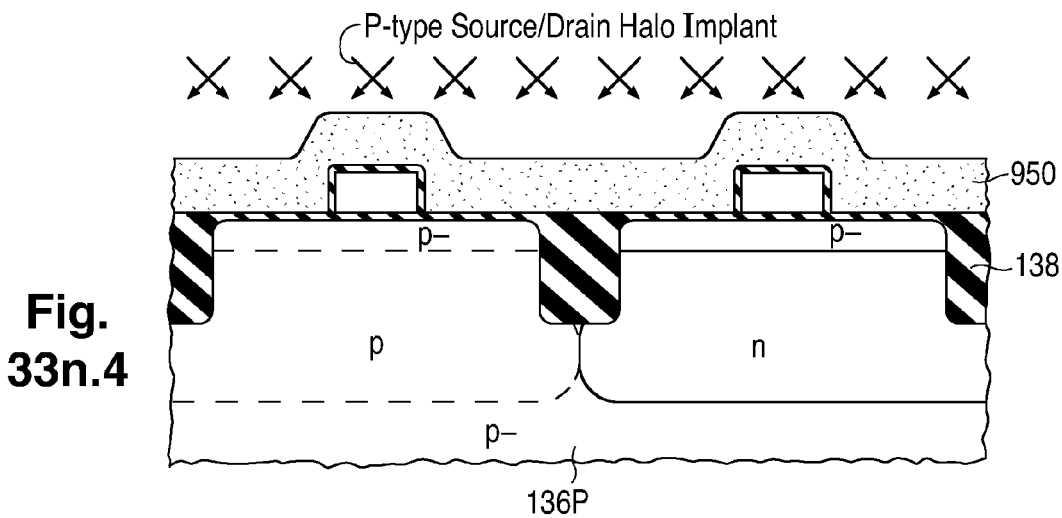
Fig. 33n.4
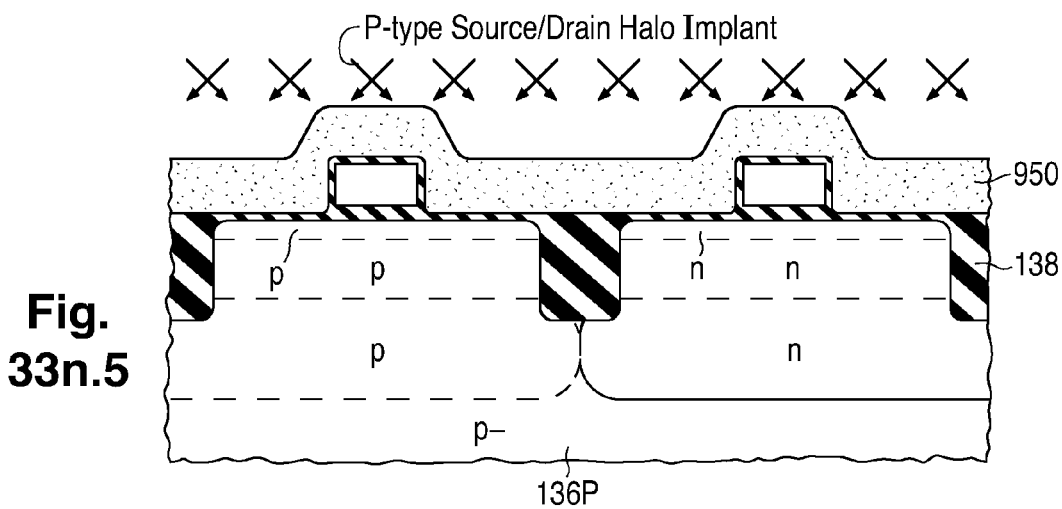
Fig. 33n.5

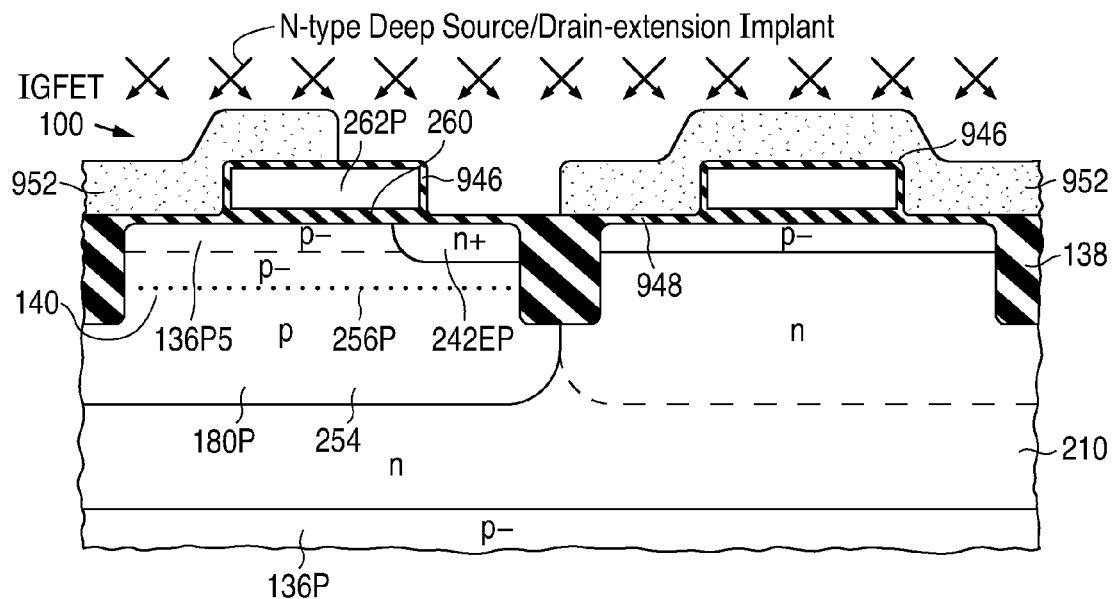
Fig. 33o.1
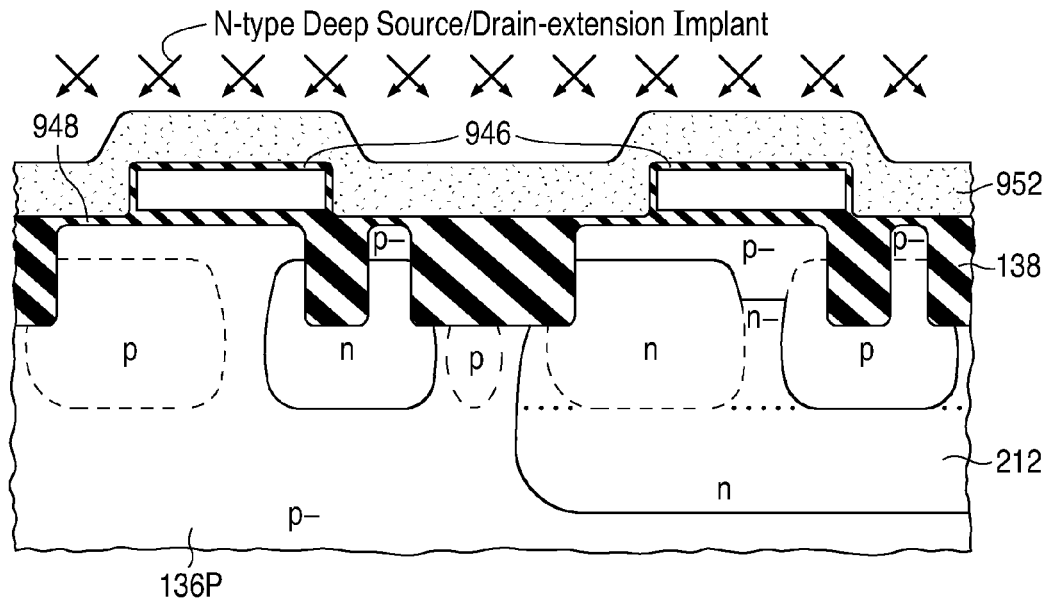
Fig. 33o.2

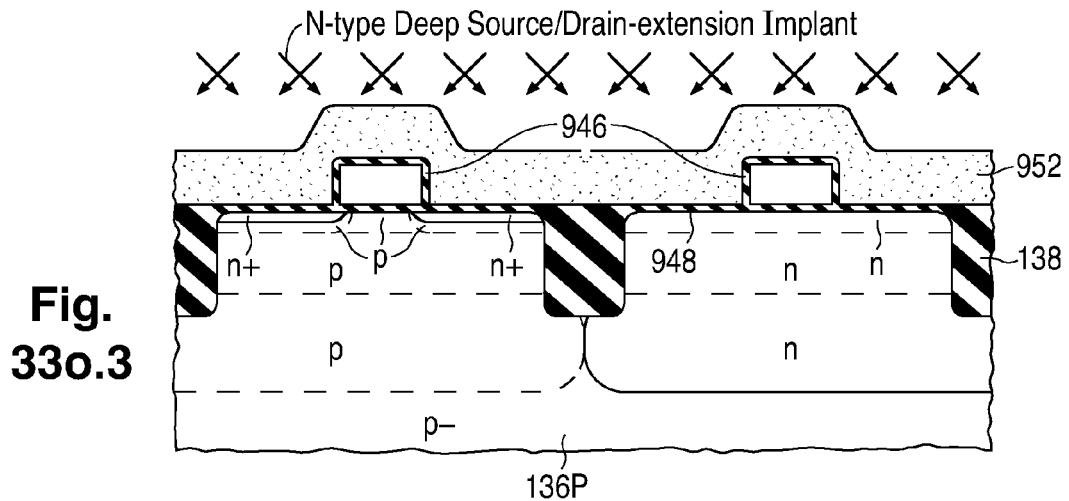
Fig. 33o.3
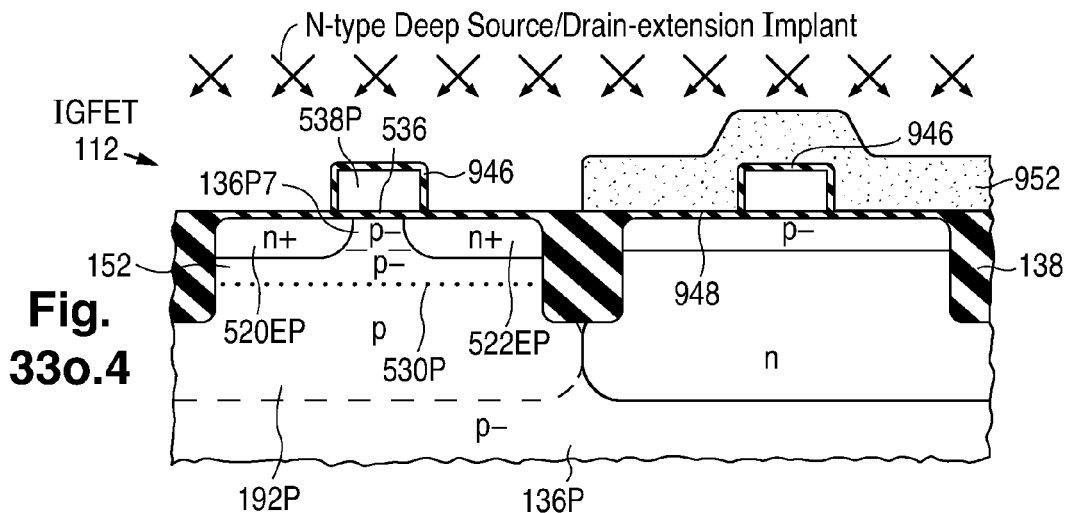
Fig. 33o.4
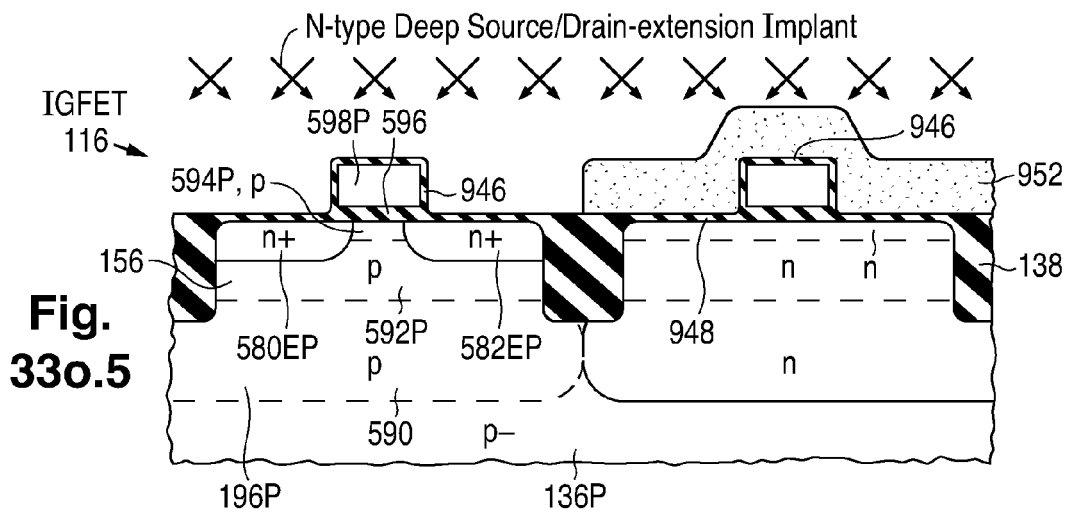
Fig. 33o.5

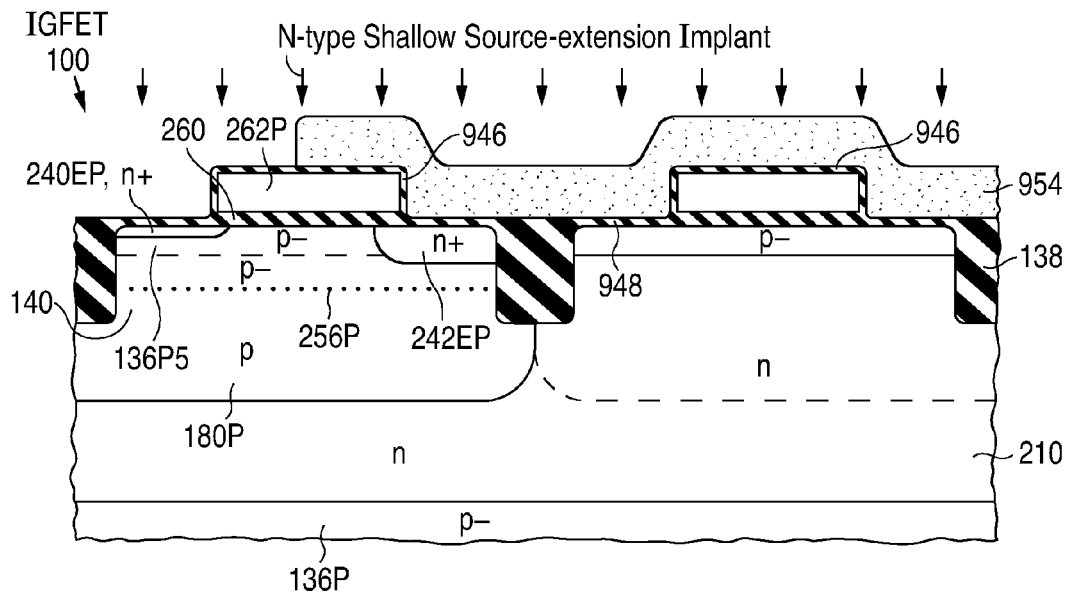
Fig. 33p.1
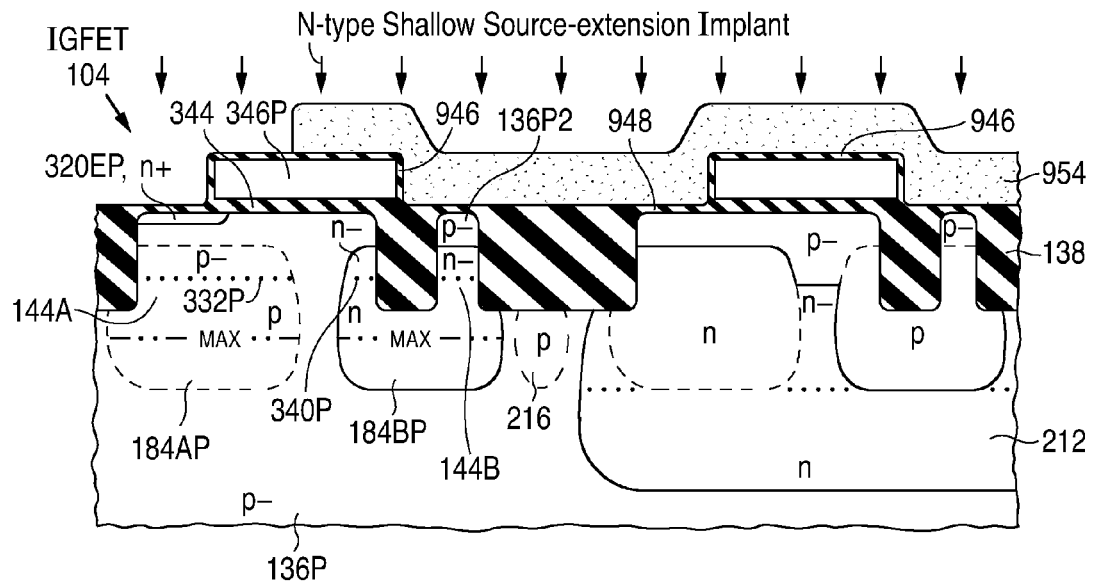
Fig. 33p.2

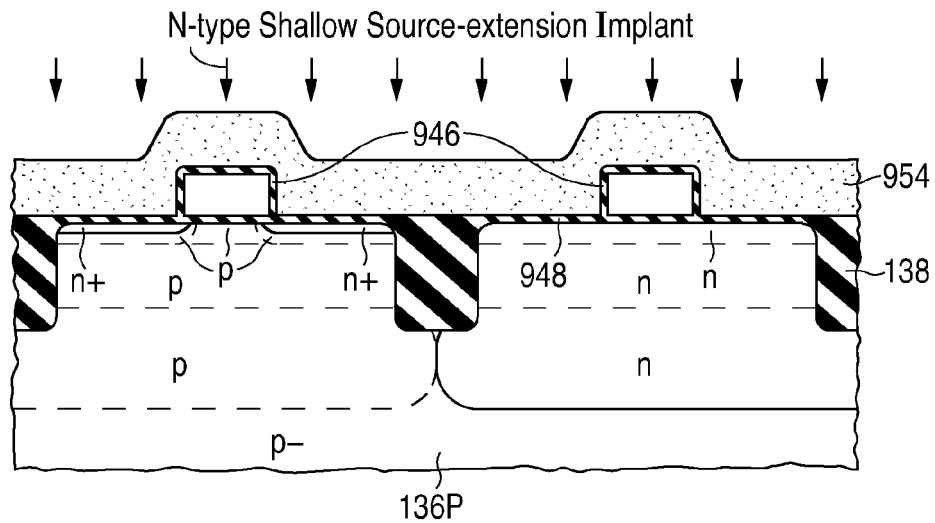
Fig. 33p.3
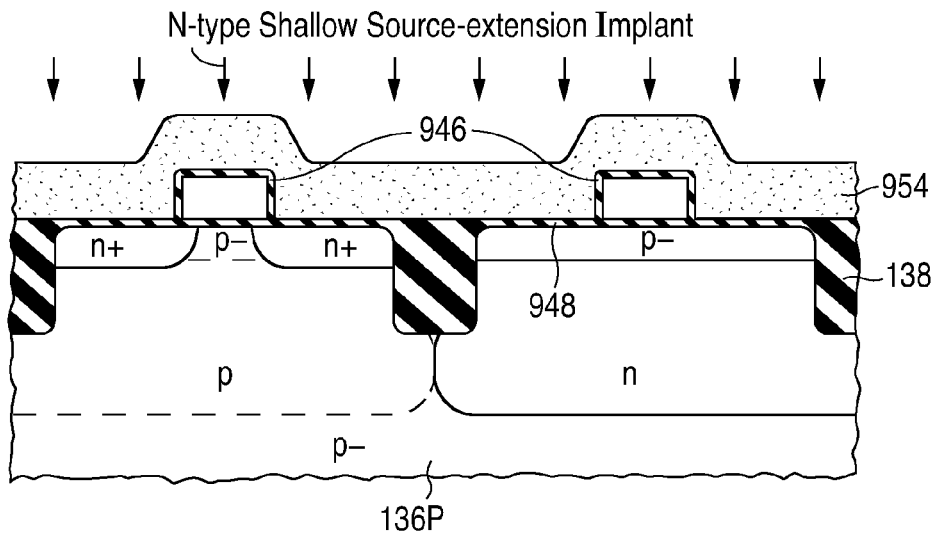
Fig. 33p.4
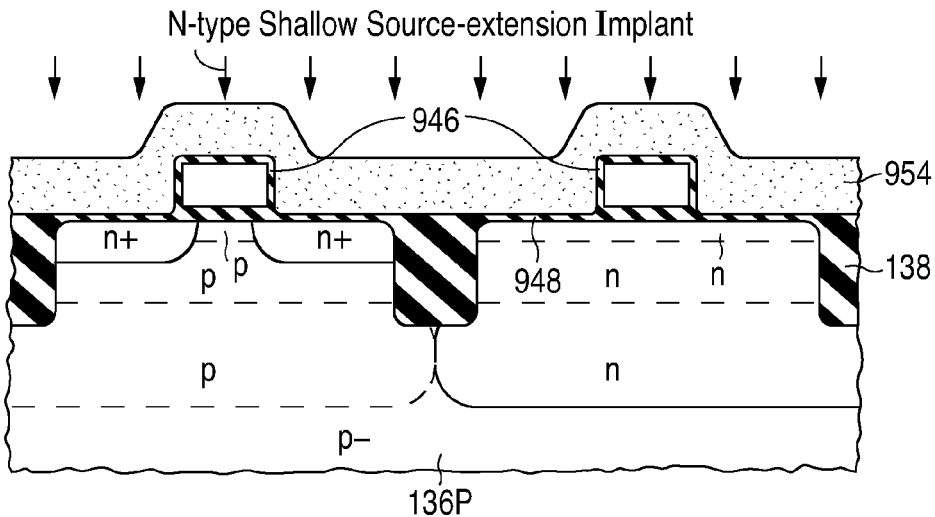
Fig. 33p.5

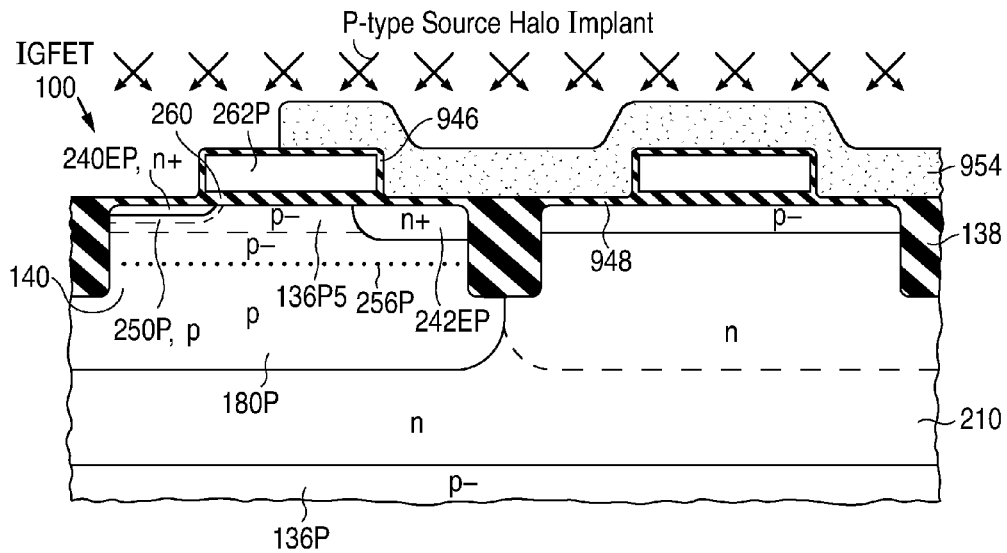
Fig. 33q.1
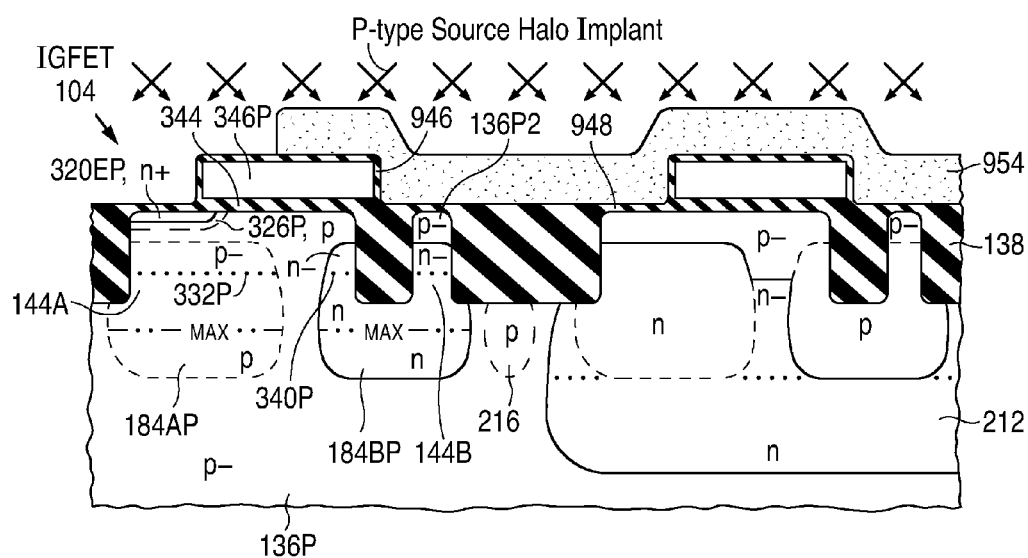
Fig. 33q.2

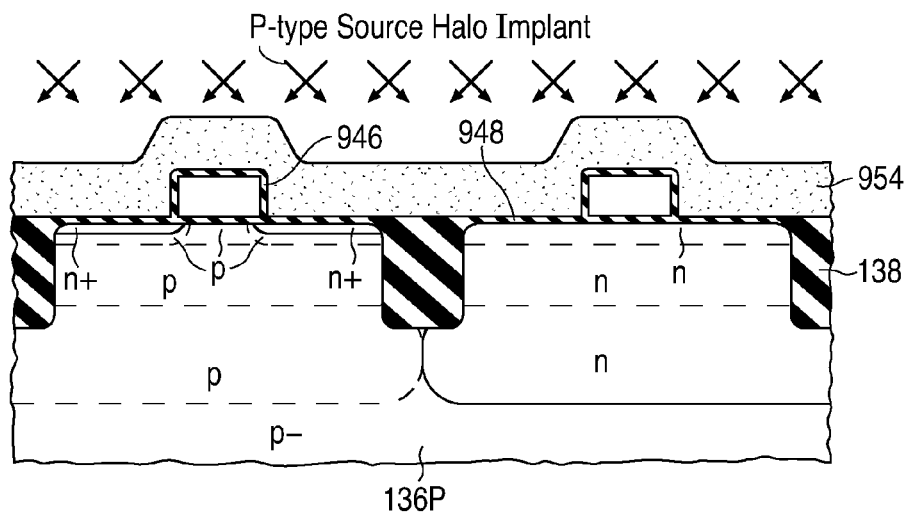
Fig. 33q.3
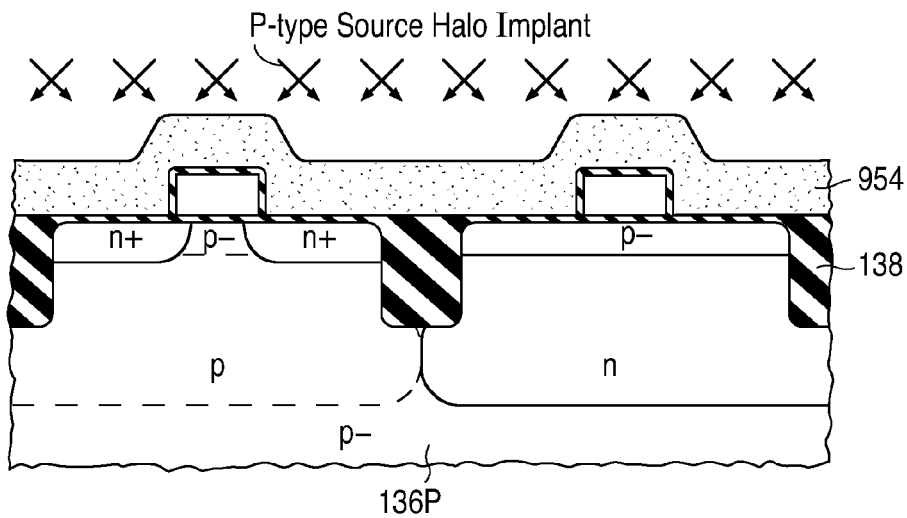
Fig. 33q.4
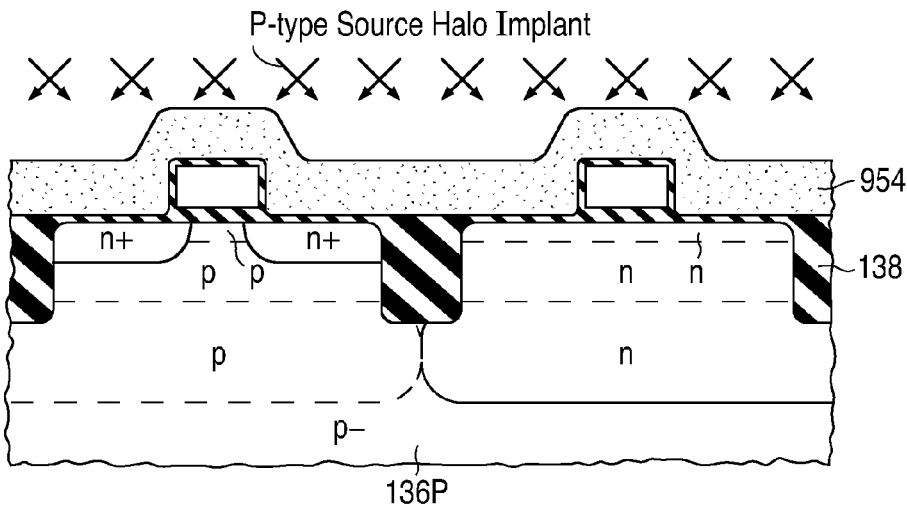
Fig. 33q.5

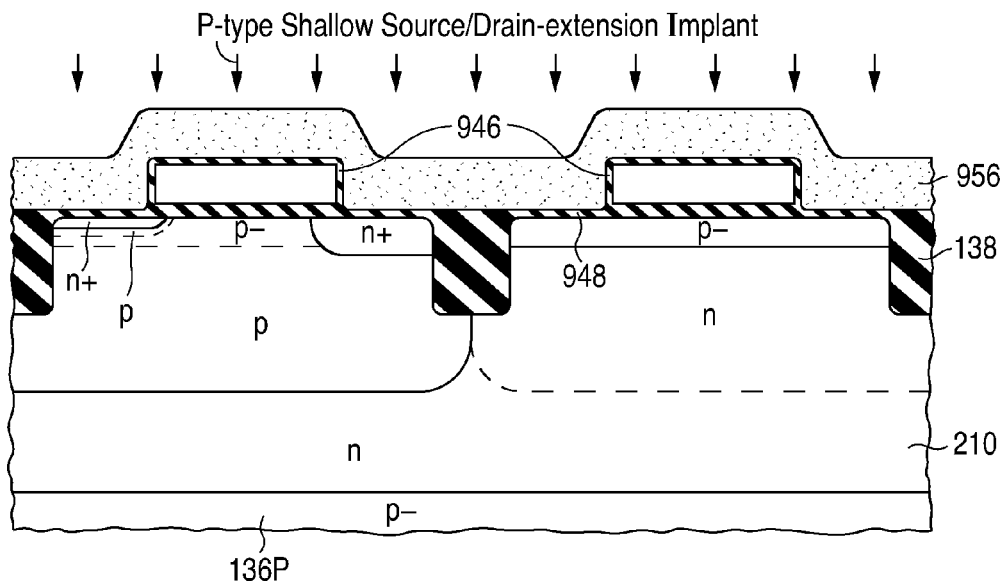
Fig. 33r.1
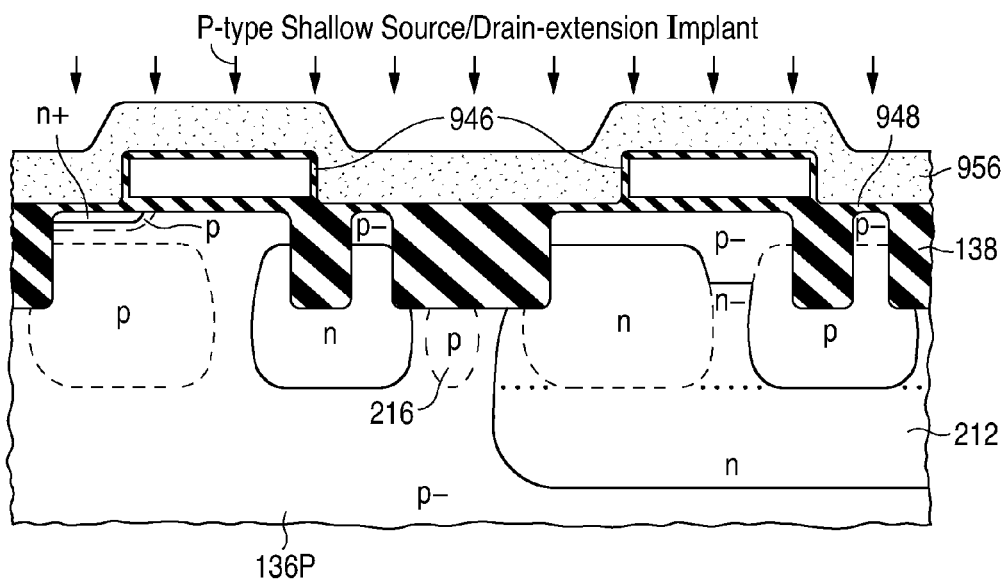
Fig. 33r.2

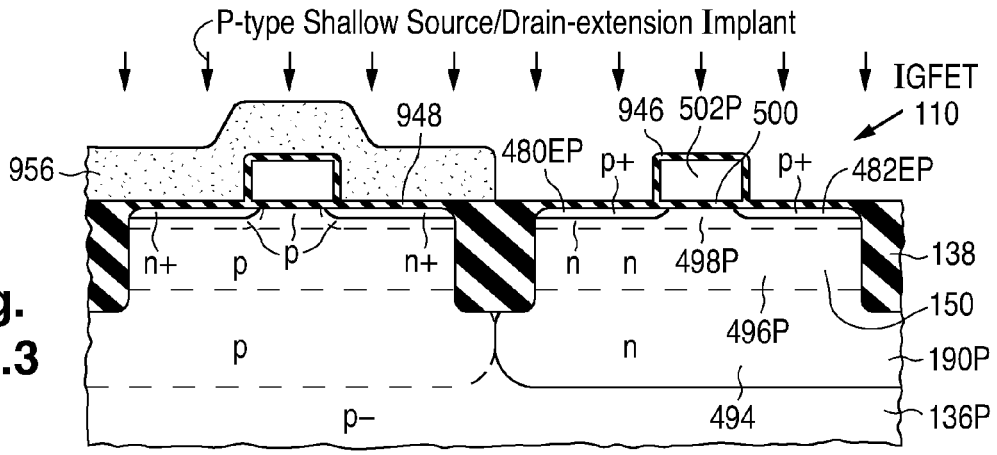
Fig. 33r.3
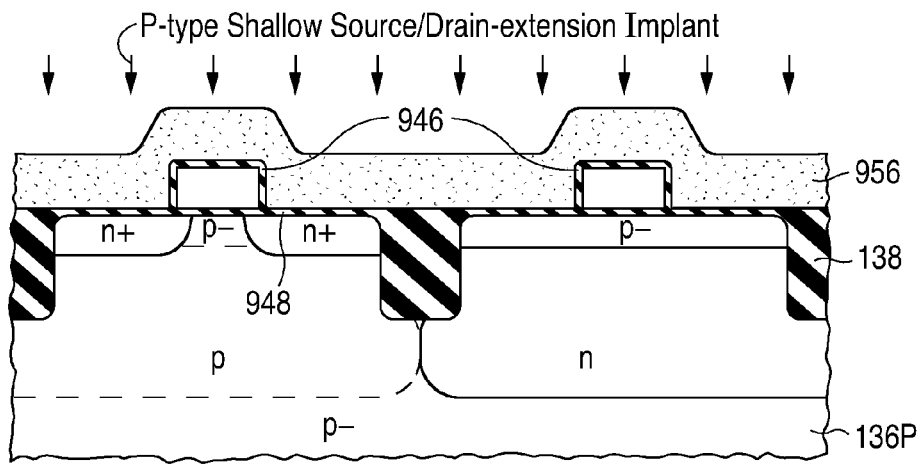
Fig. 33r.4
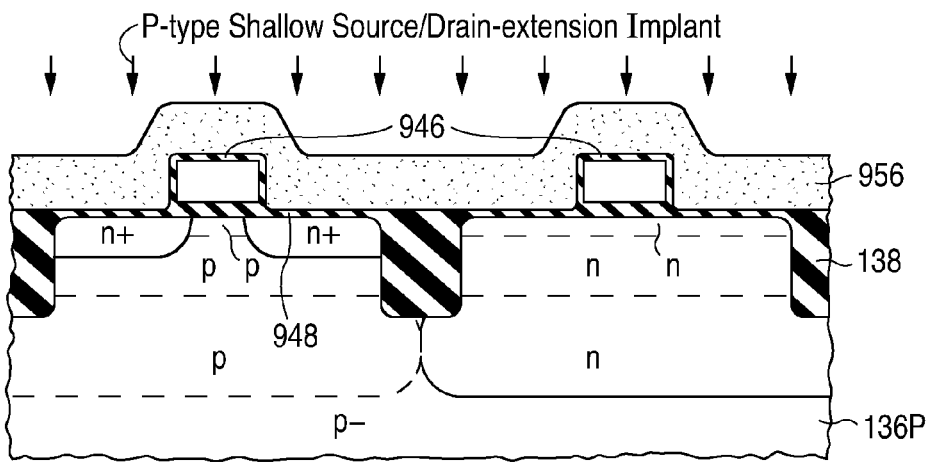
Fig. 33r.5

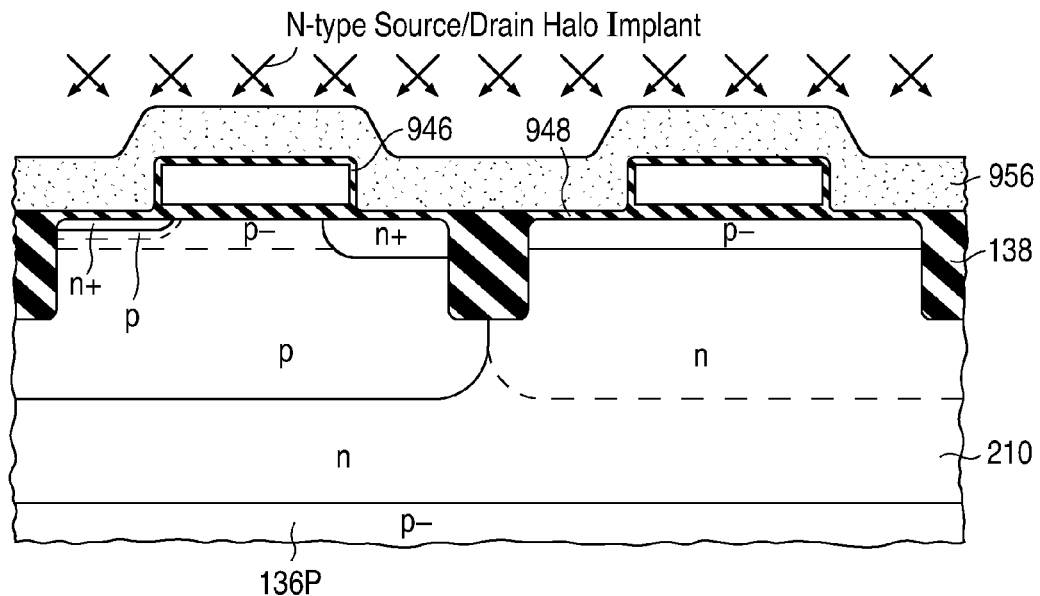
Fig. 33s.1
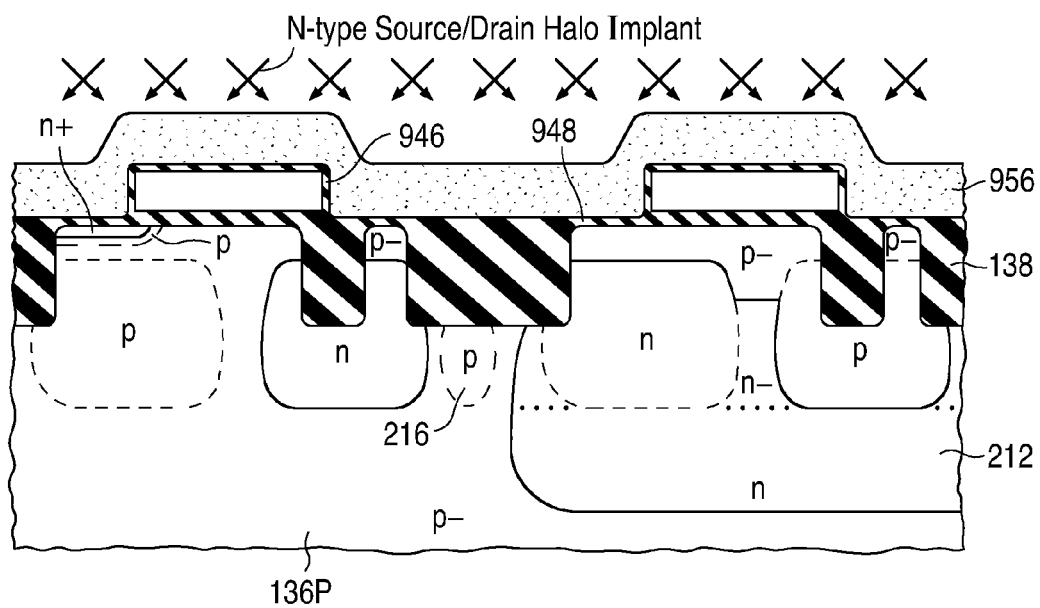
Fig. 33s.2

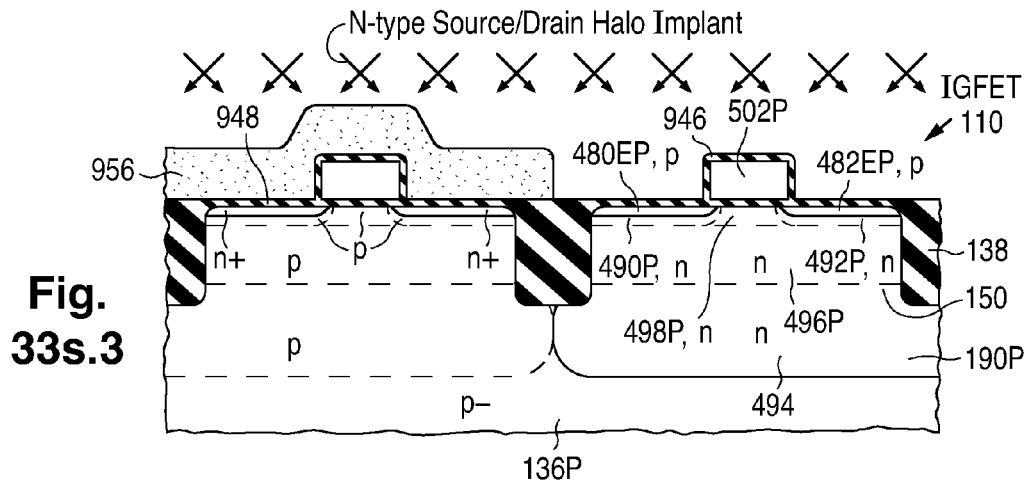
Fig. 33s.3
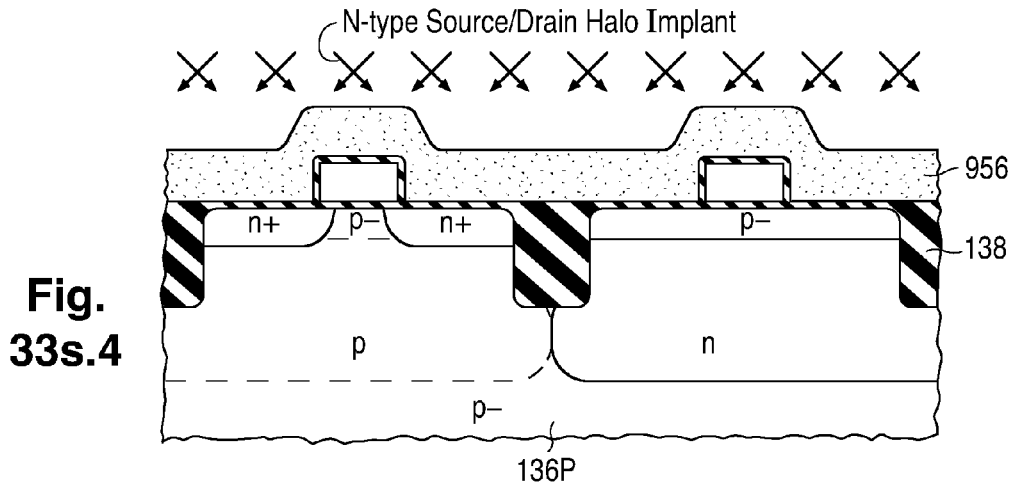
Fig. 33s.4
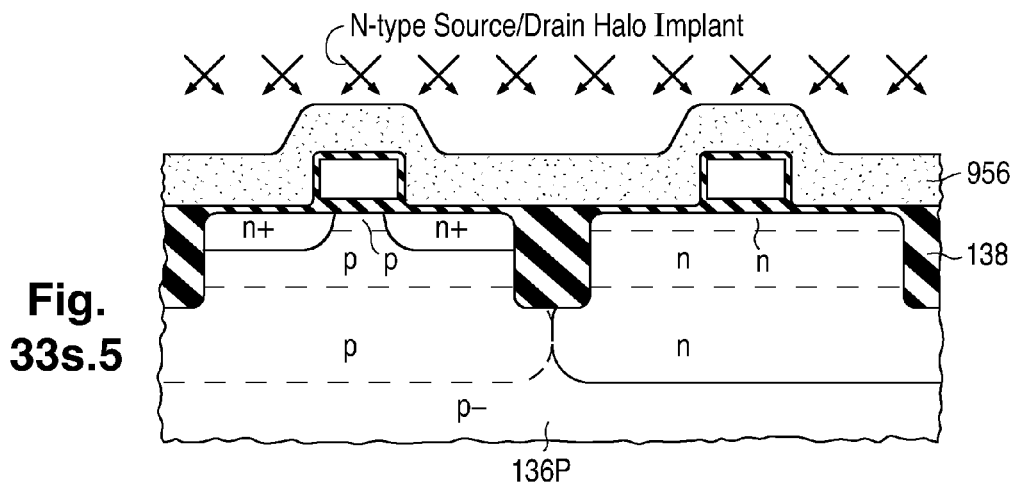
Fig. 33s.5

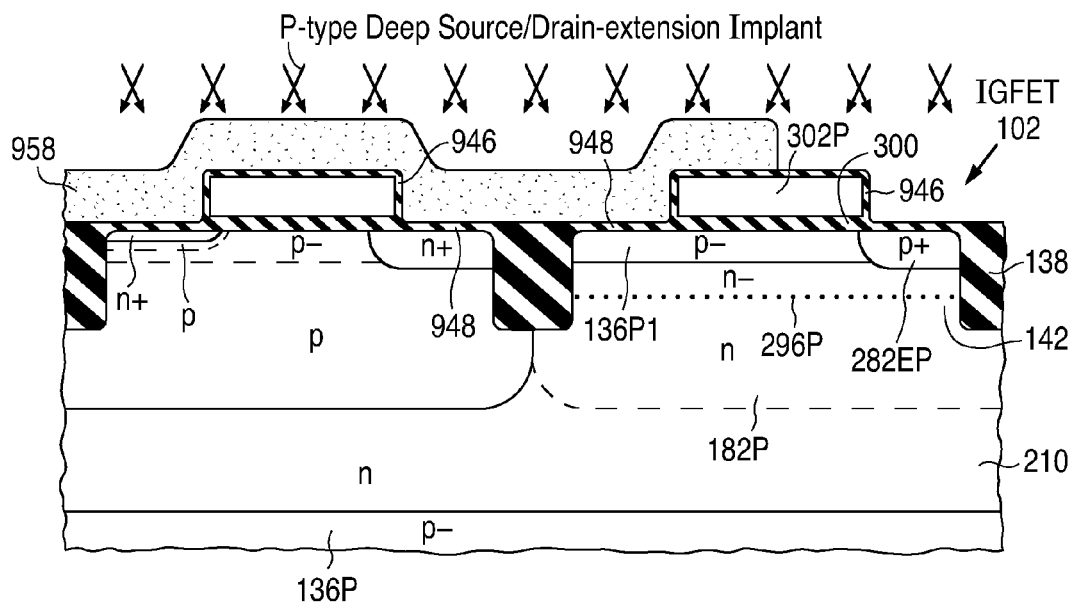
Fig. 33t.1
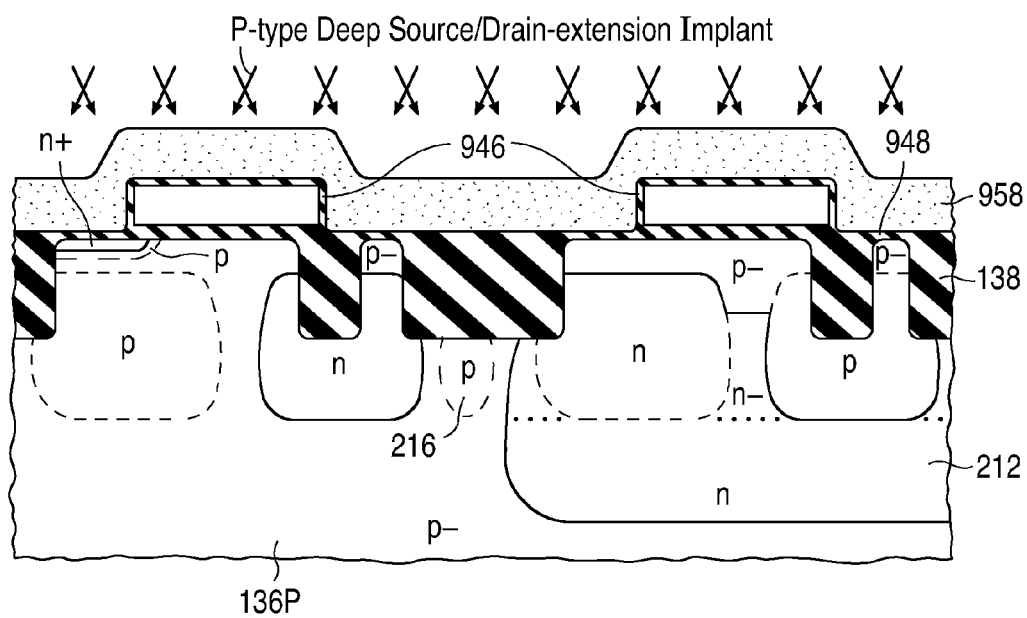
Fig. 33t.2

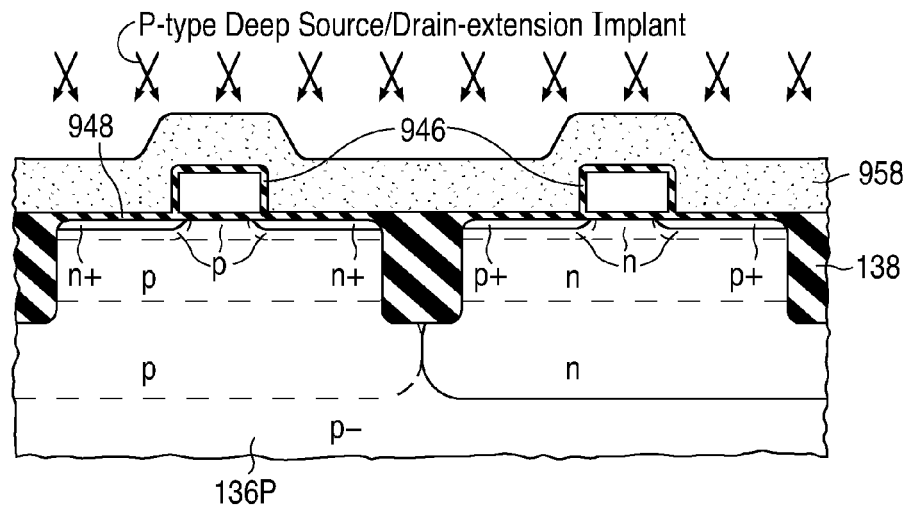
Fig. 33t.3
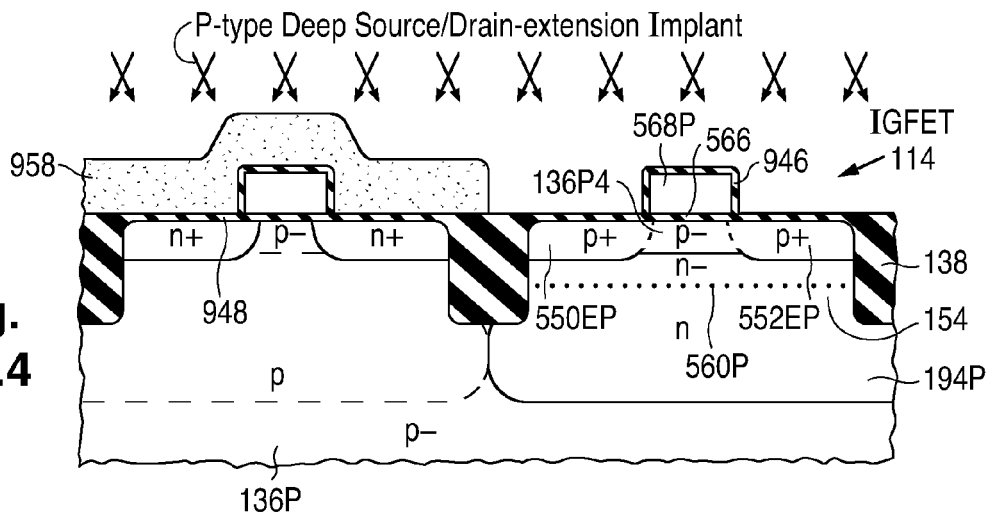
Fig. 33t.4
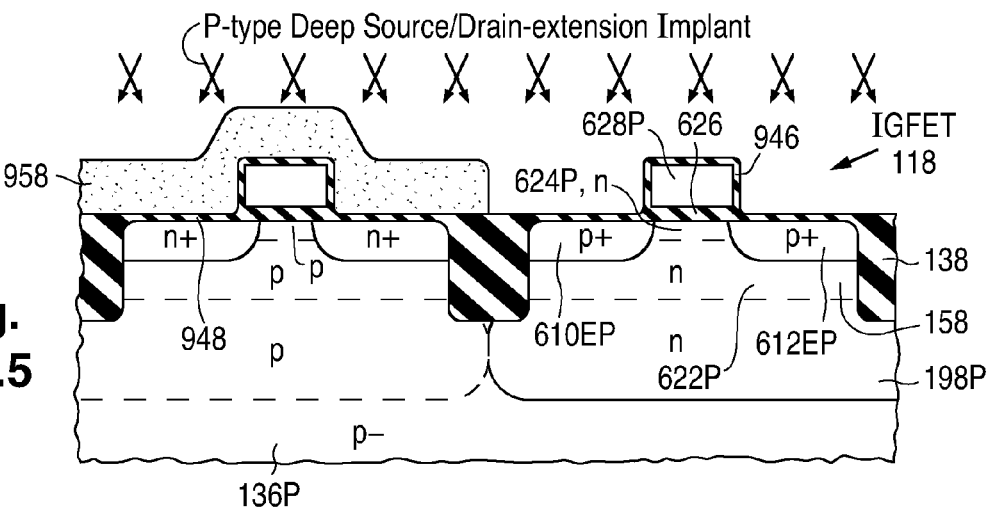
Fig. 33t.5

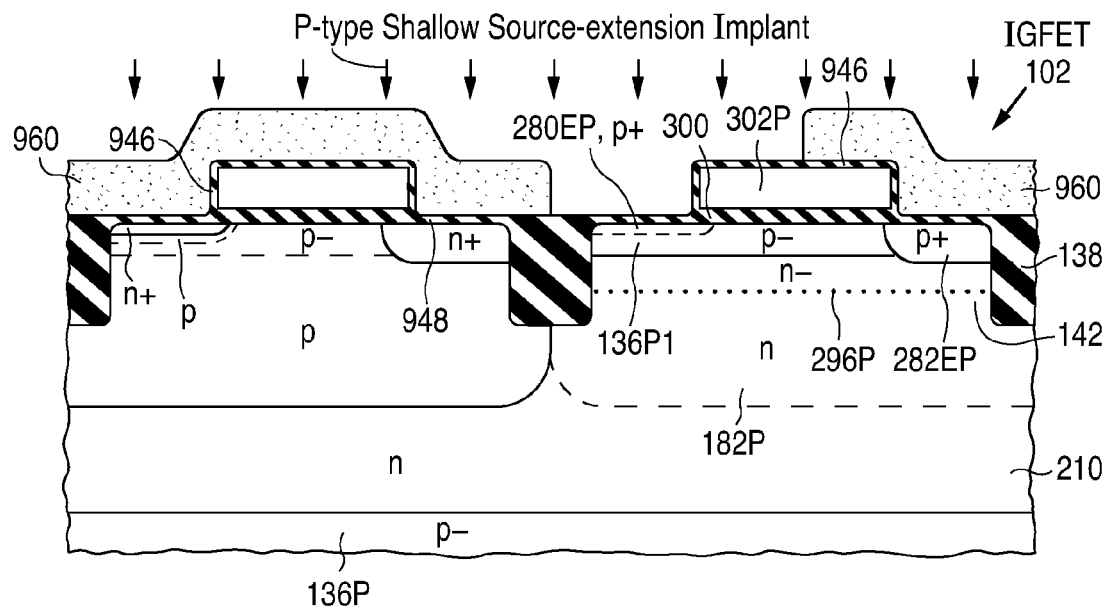
Fig. 33u.1
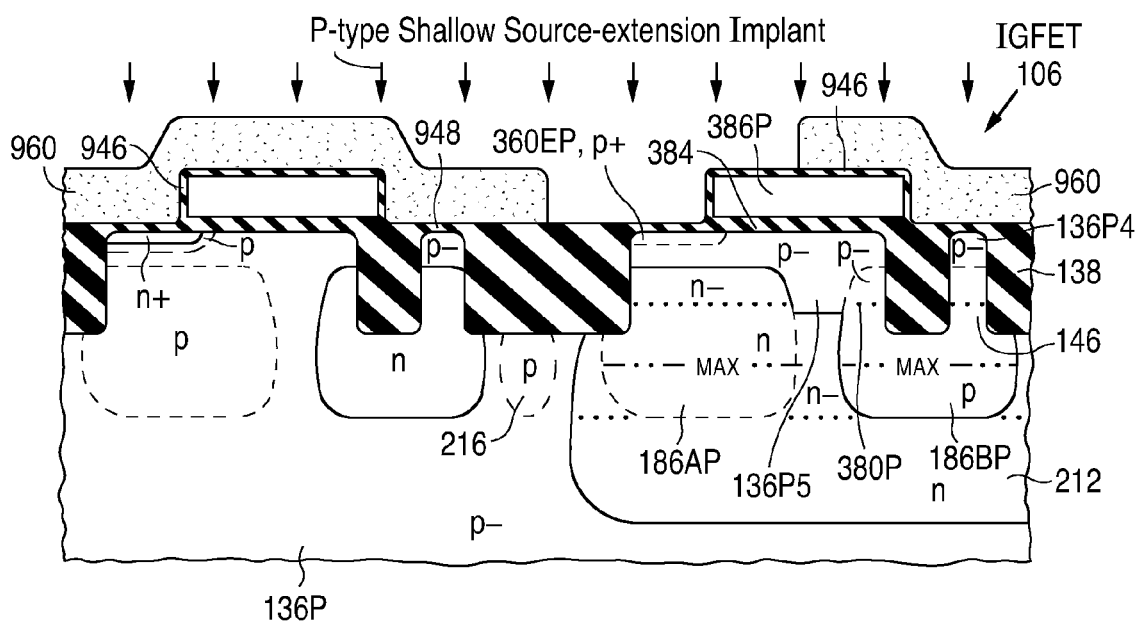
Fig. 33u.2

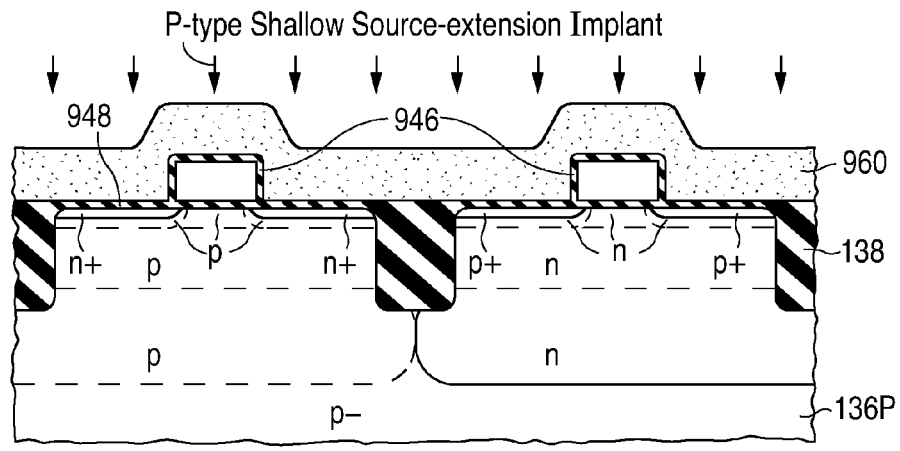
Fig. 33u.3
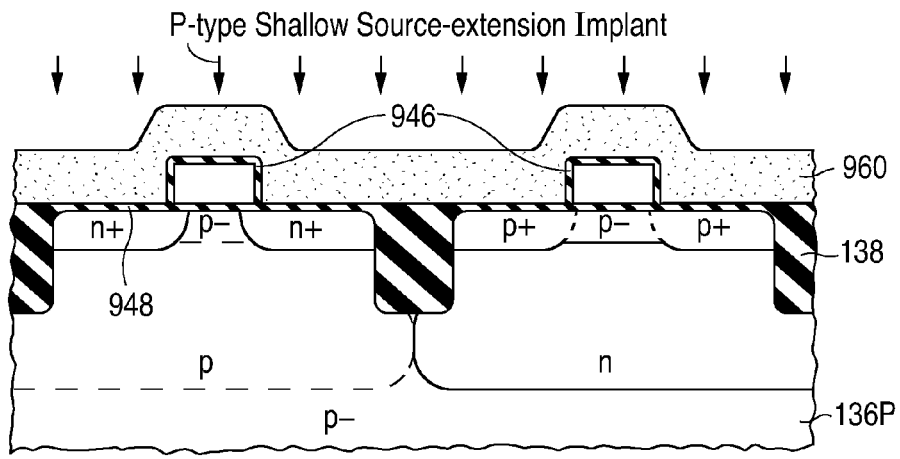
Fig. 33u.4
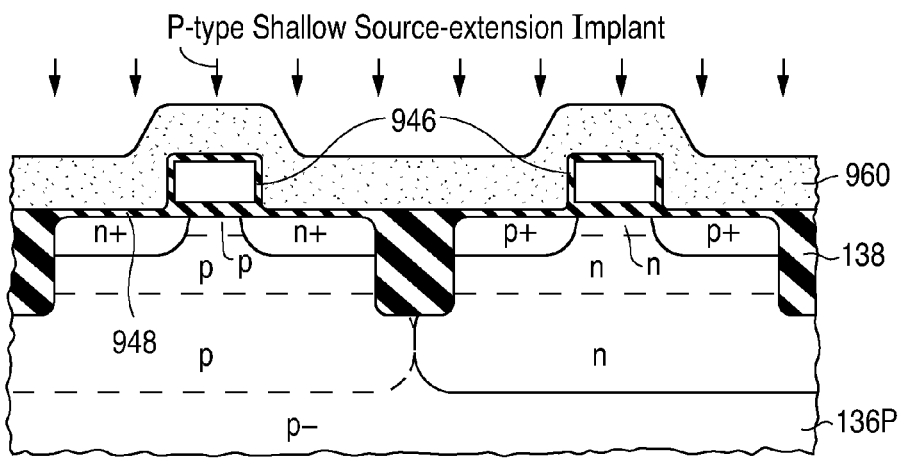
Fig. 33u.5

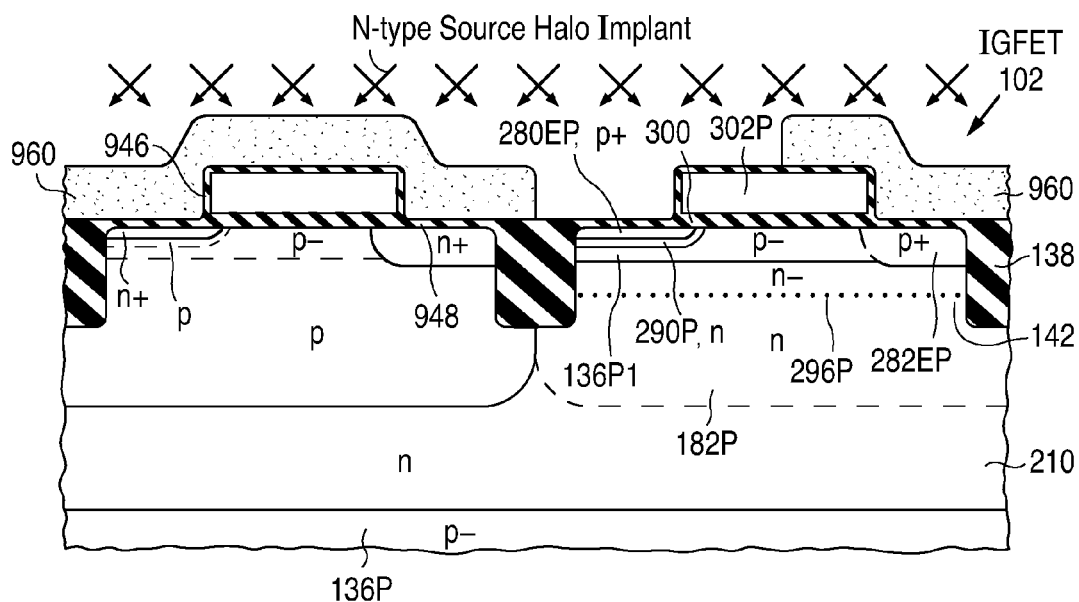
Fig. 33v.1
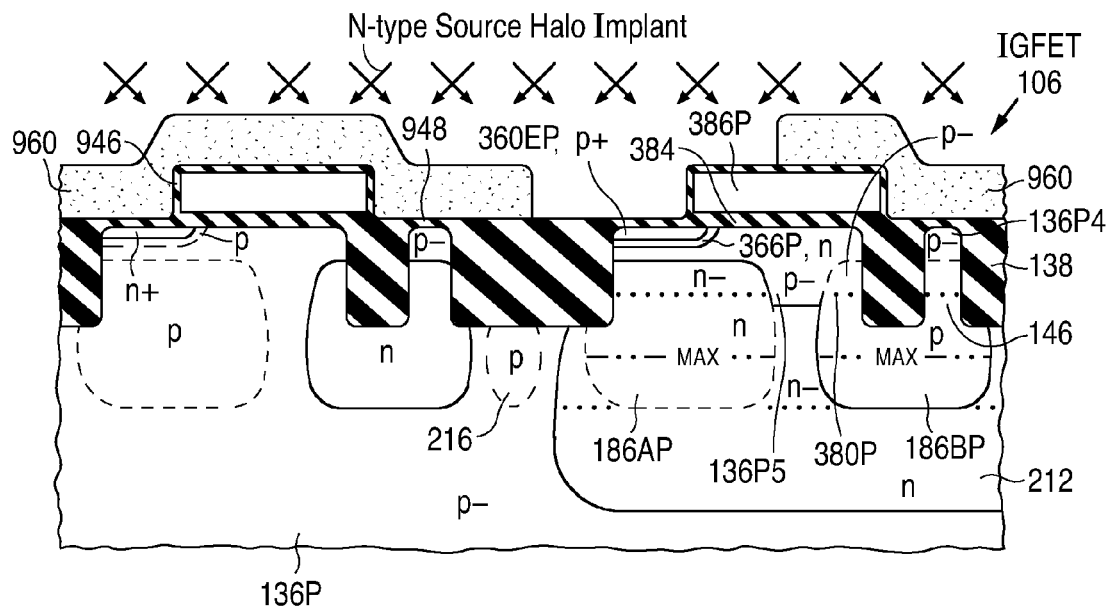
Fig. 33v.2

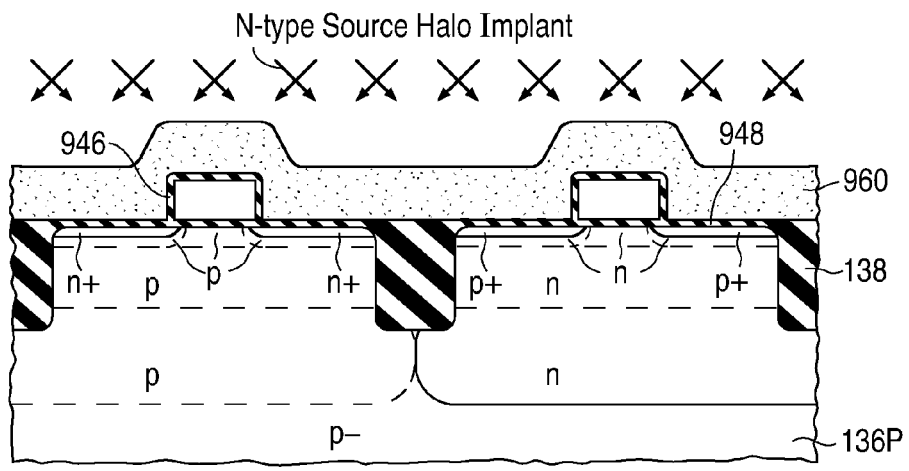
Fig. 33v.3
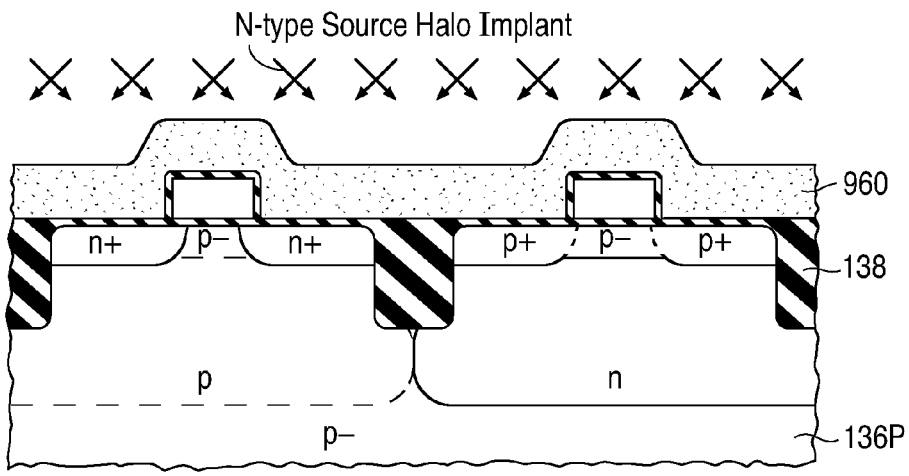
Fig. 33v.4
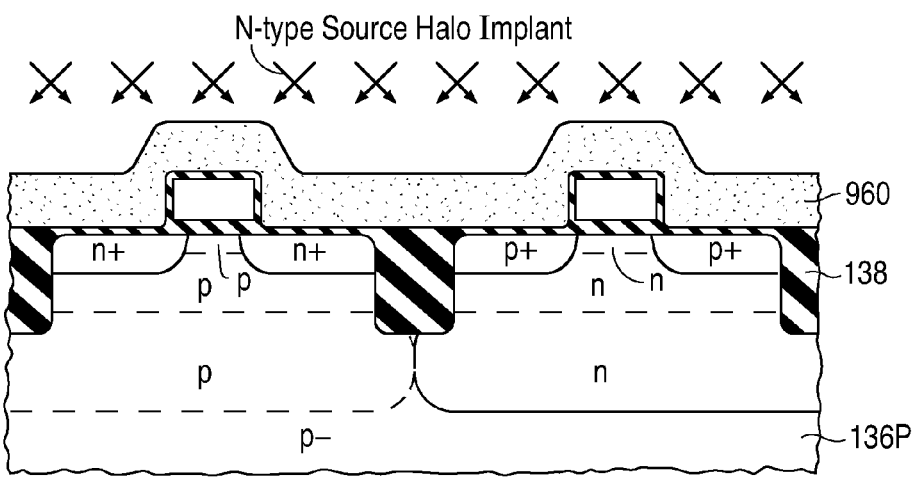
Fig. 33v.5

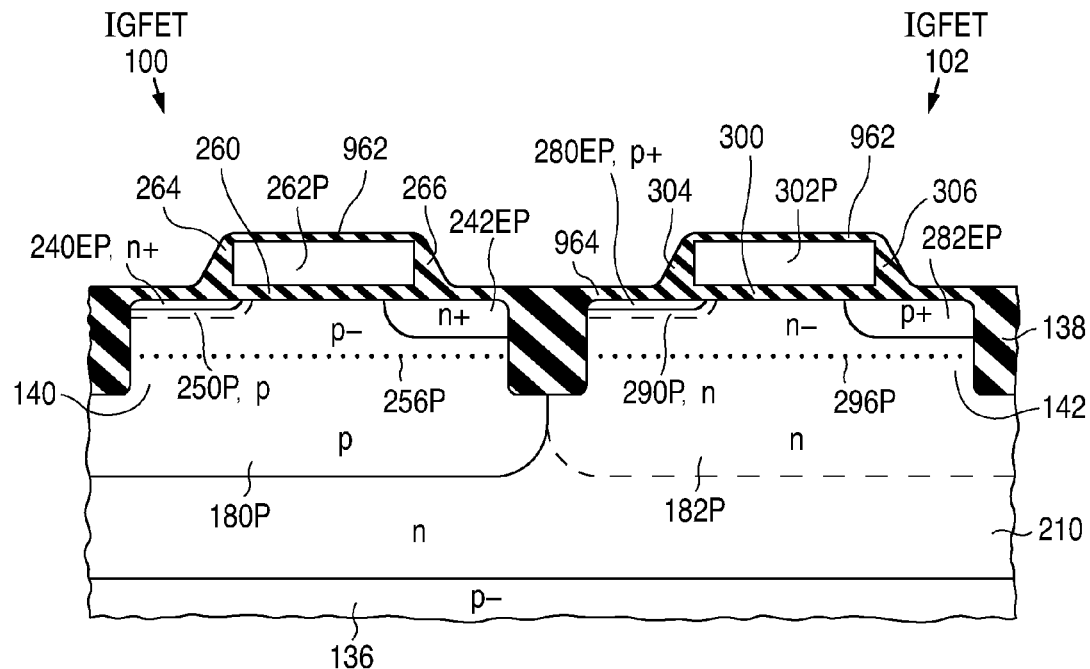
Fig. 33w.1
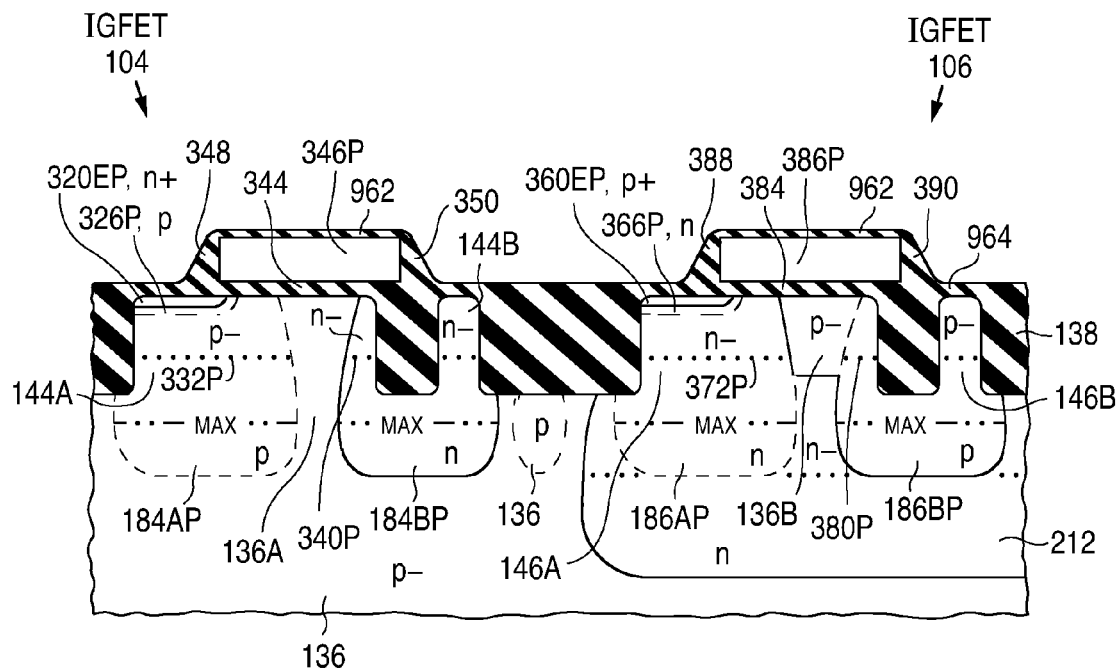
Fig. 33w.2

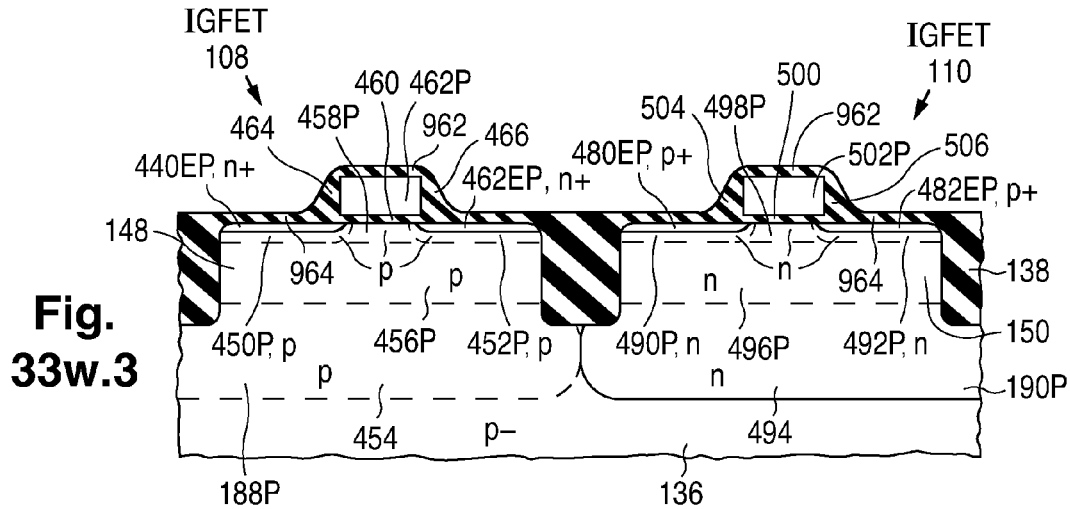
Fig. 33w.3
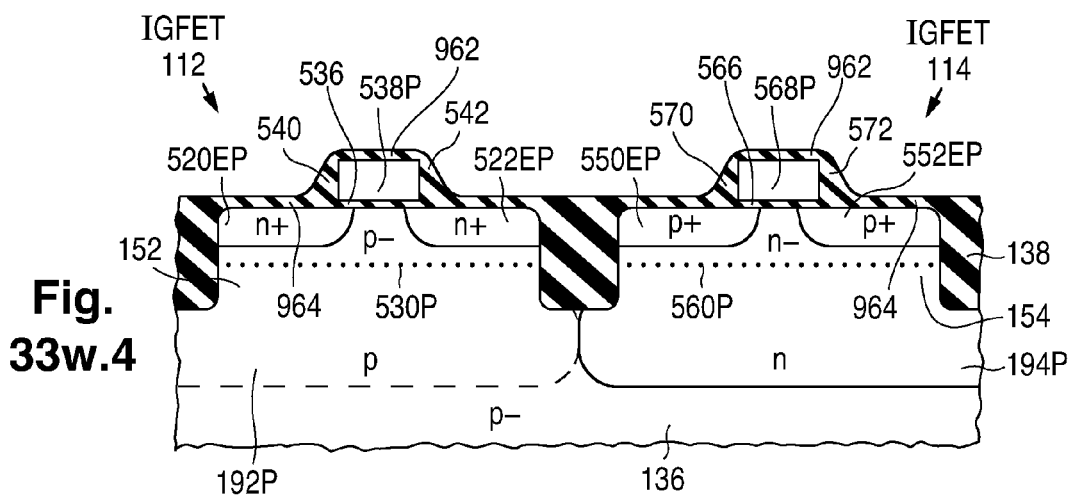
Fig. 33w.4
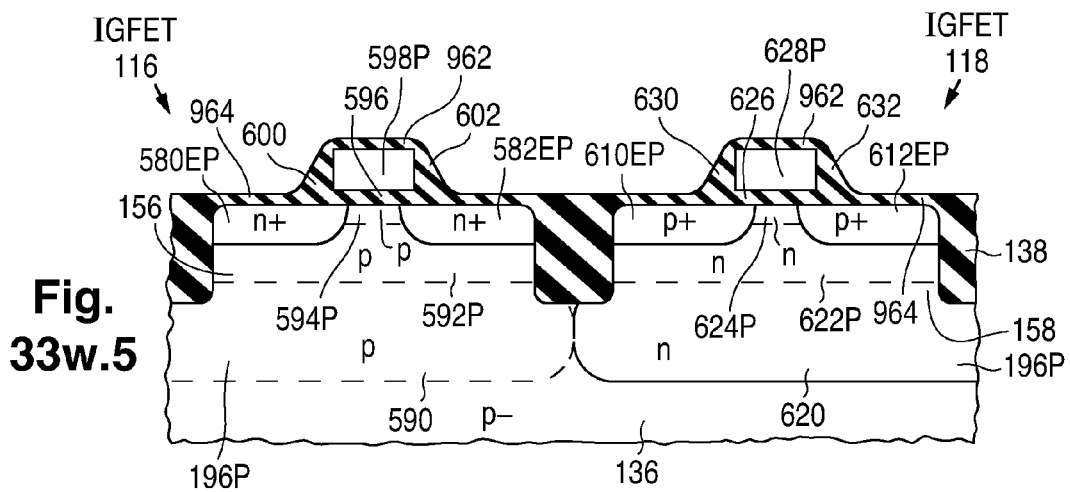
Fig. 33w.5

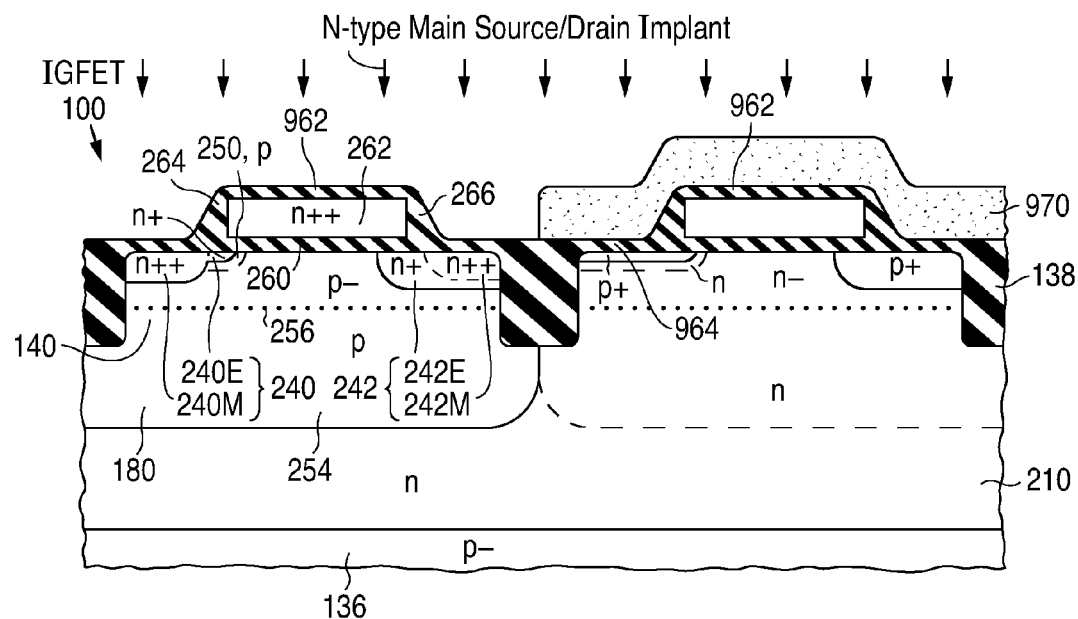
Fig. 33x.1
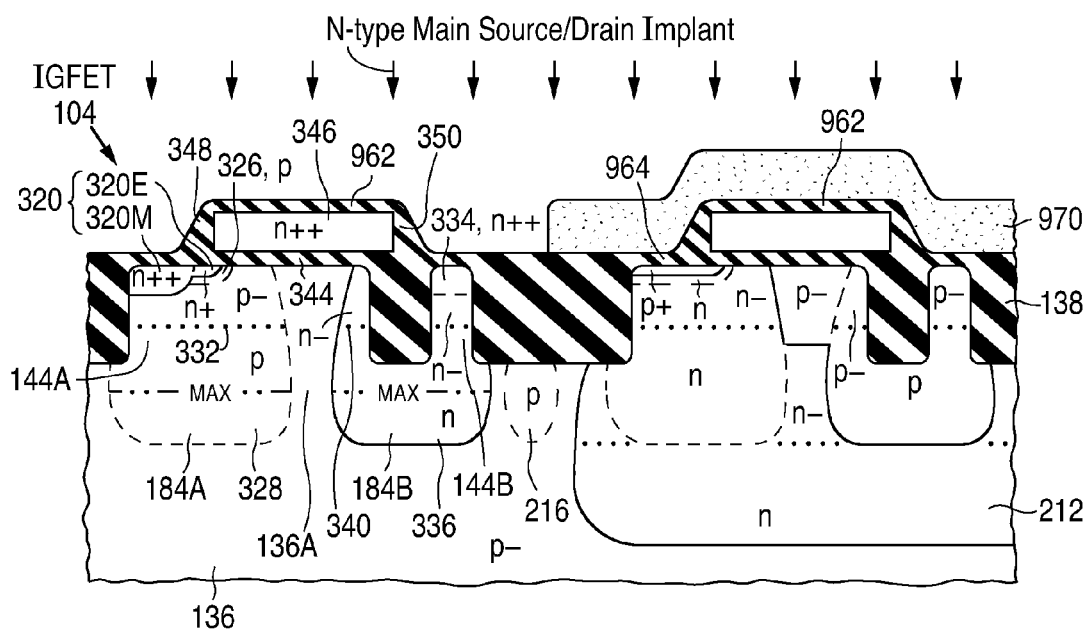
Fig. 33x.2

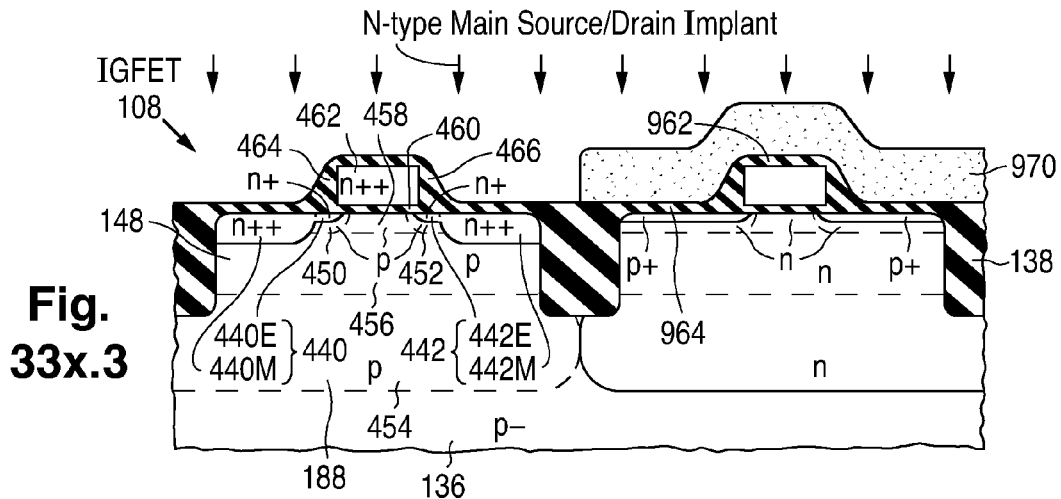
Fig. 33x.3
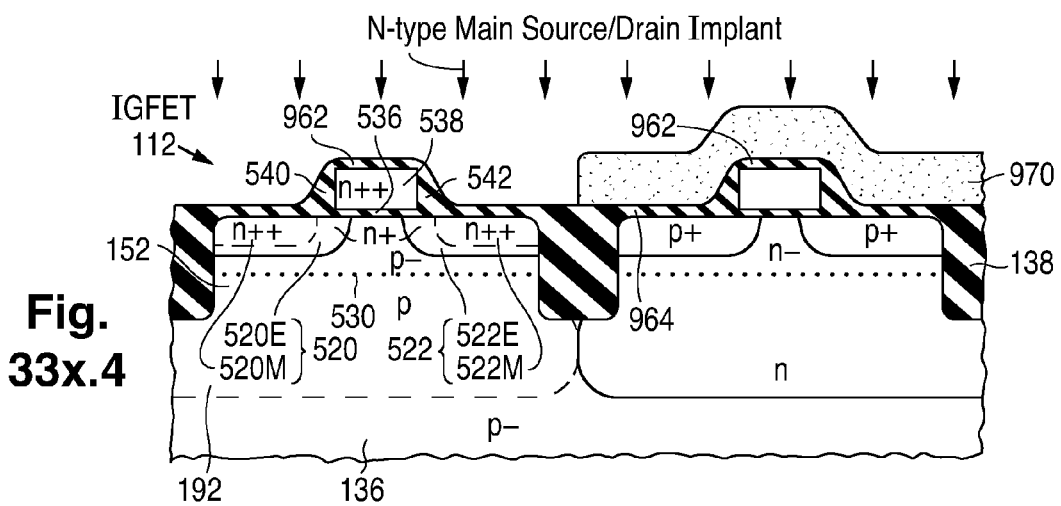
Fig. 33x.4
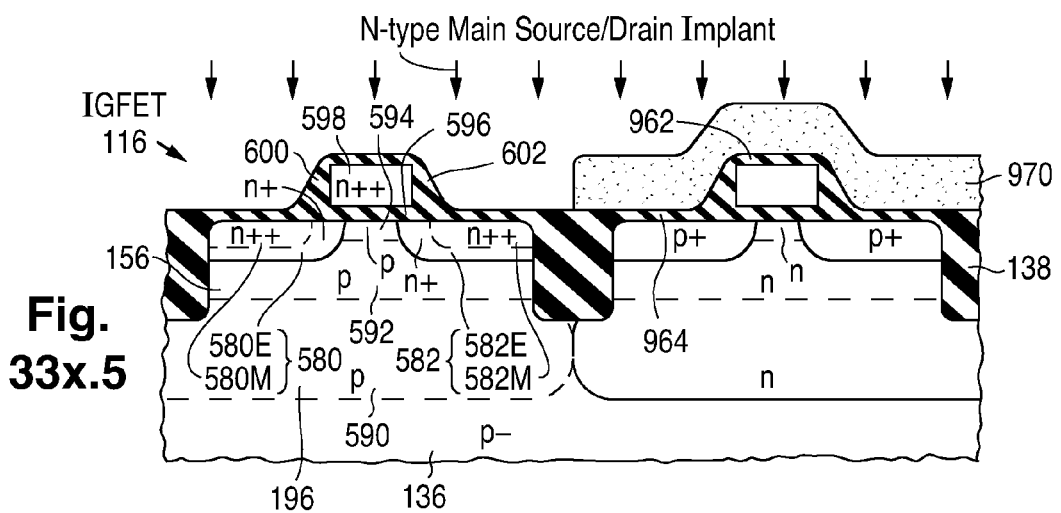
Fig. 33x.5

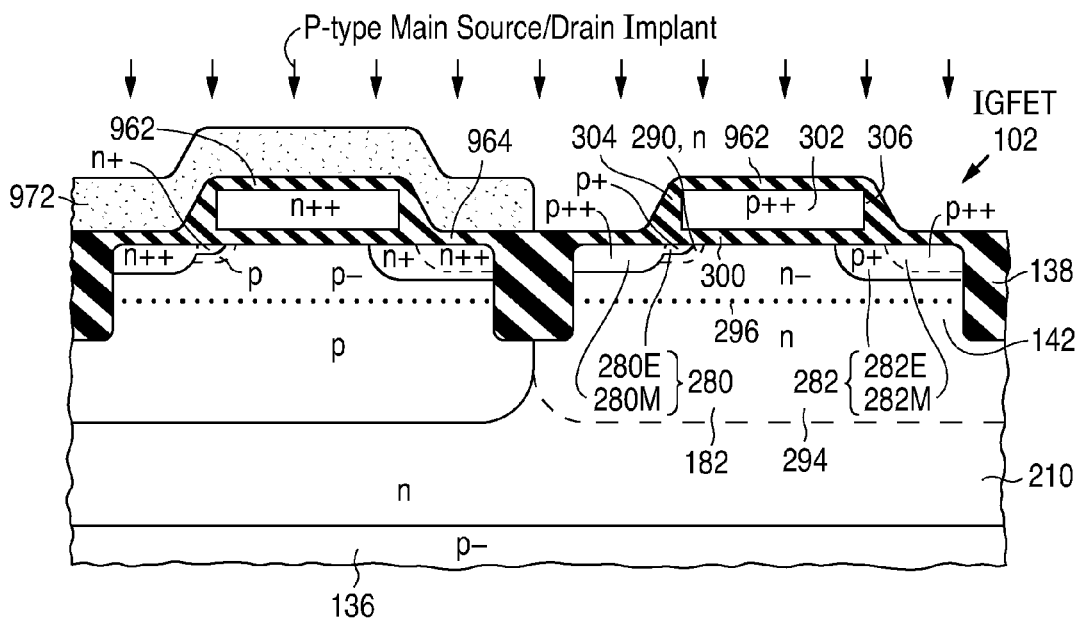
Fig. 33y.1
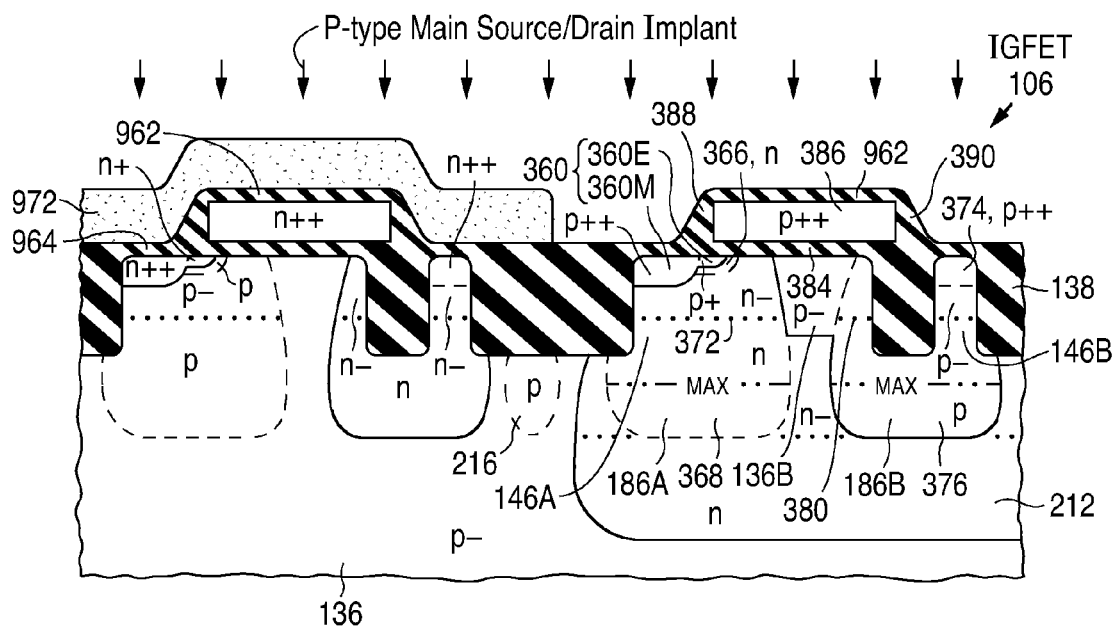
Fig. 33y.2

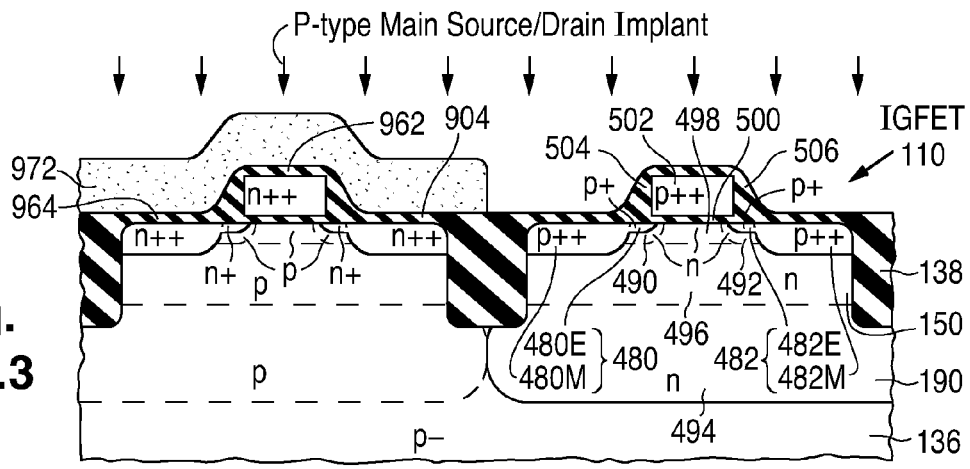
Fig. 33y.3
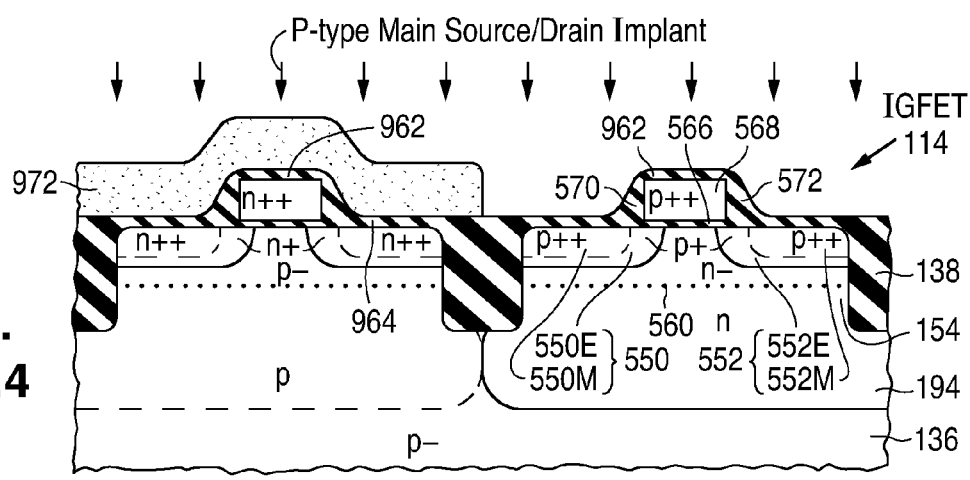
Fig. 33y.4
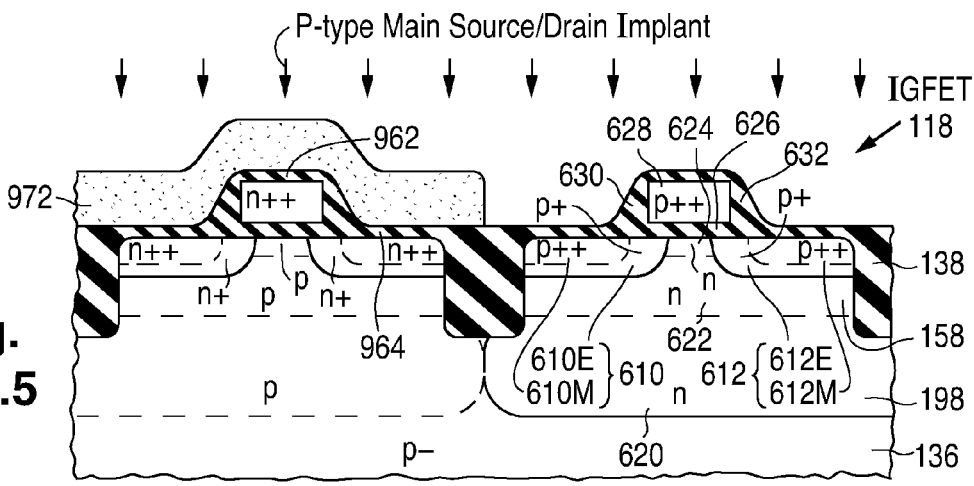
Fig. 33y.5

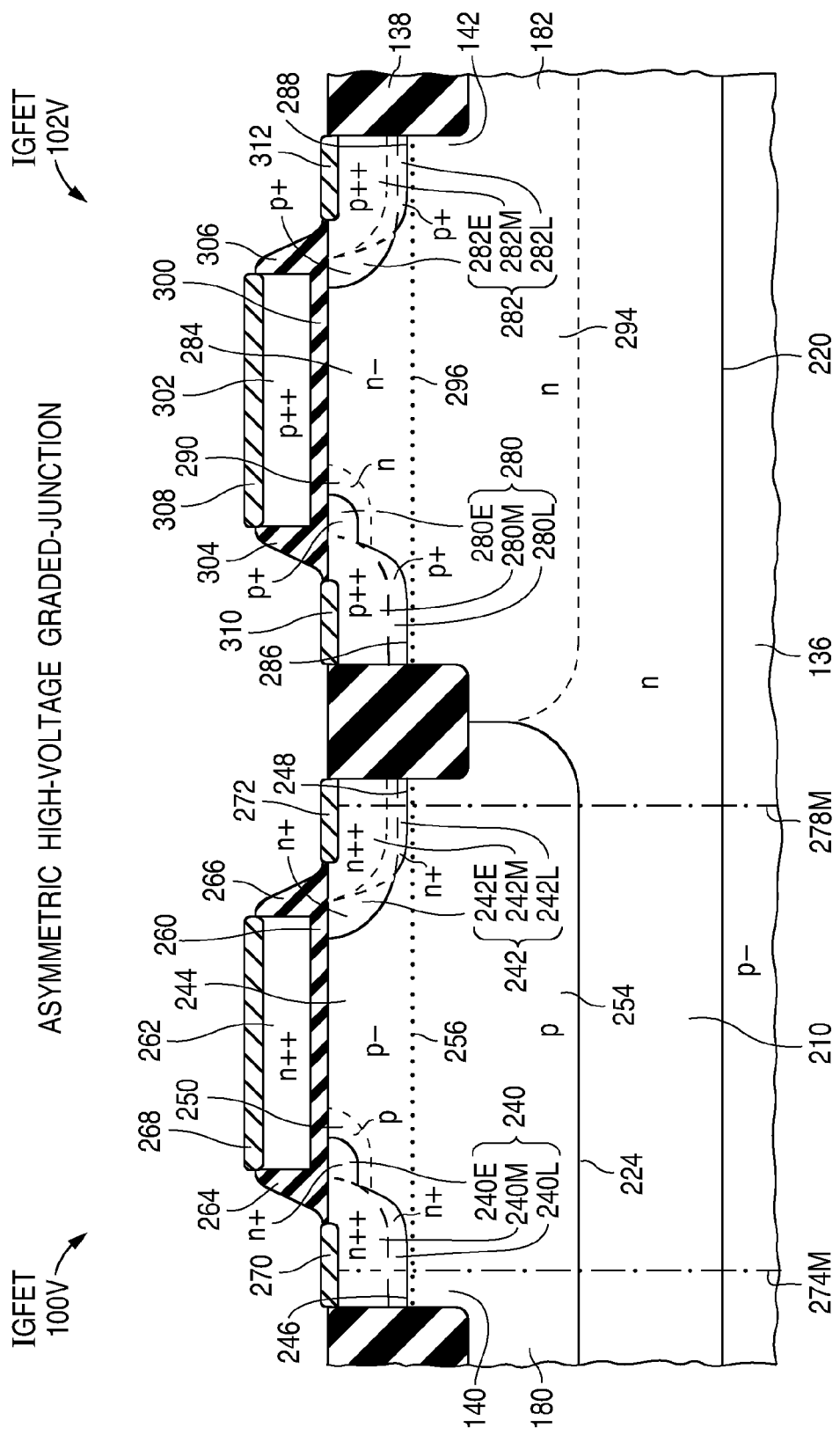
FIG. 34.1

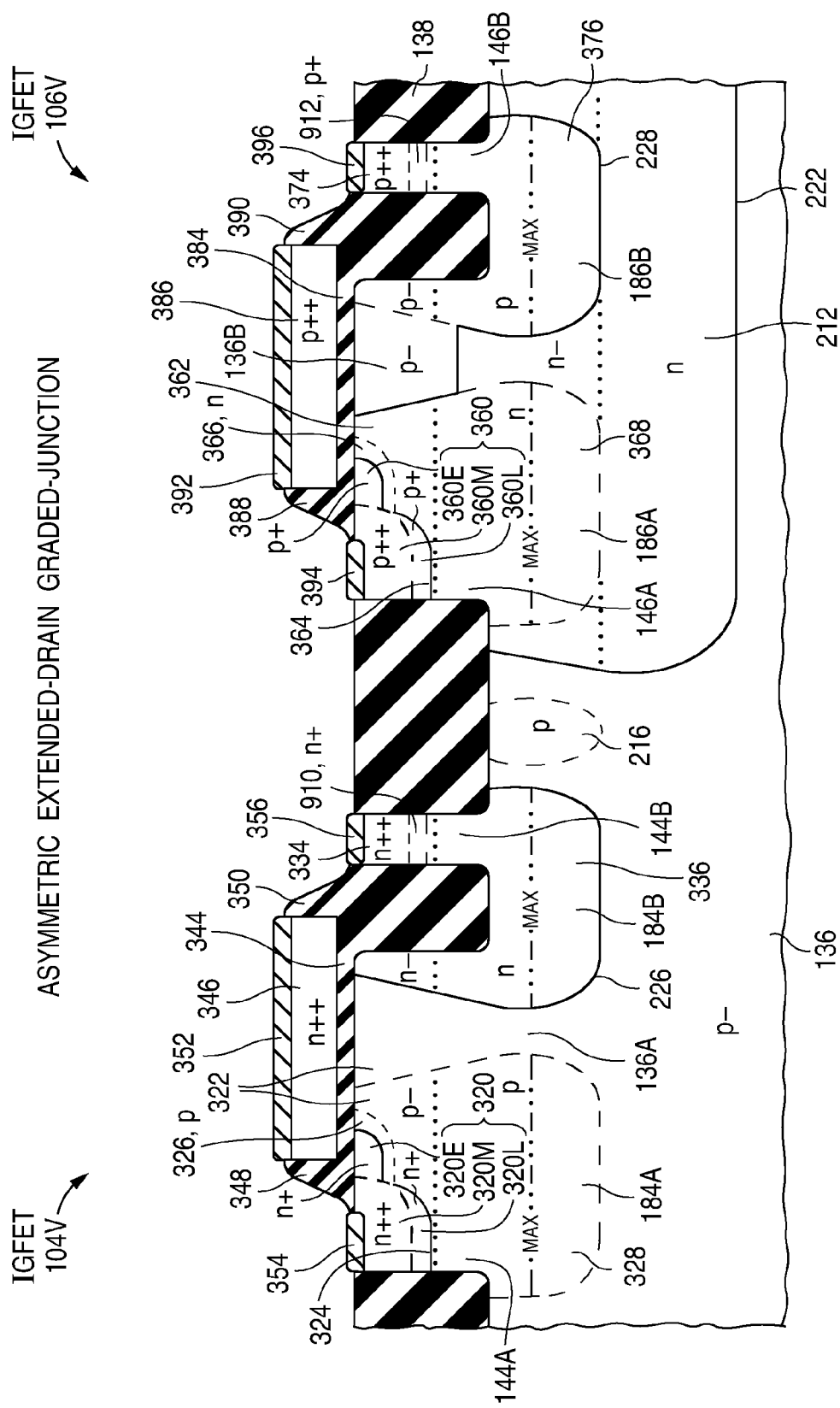
FIG. 34.2

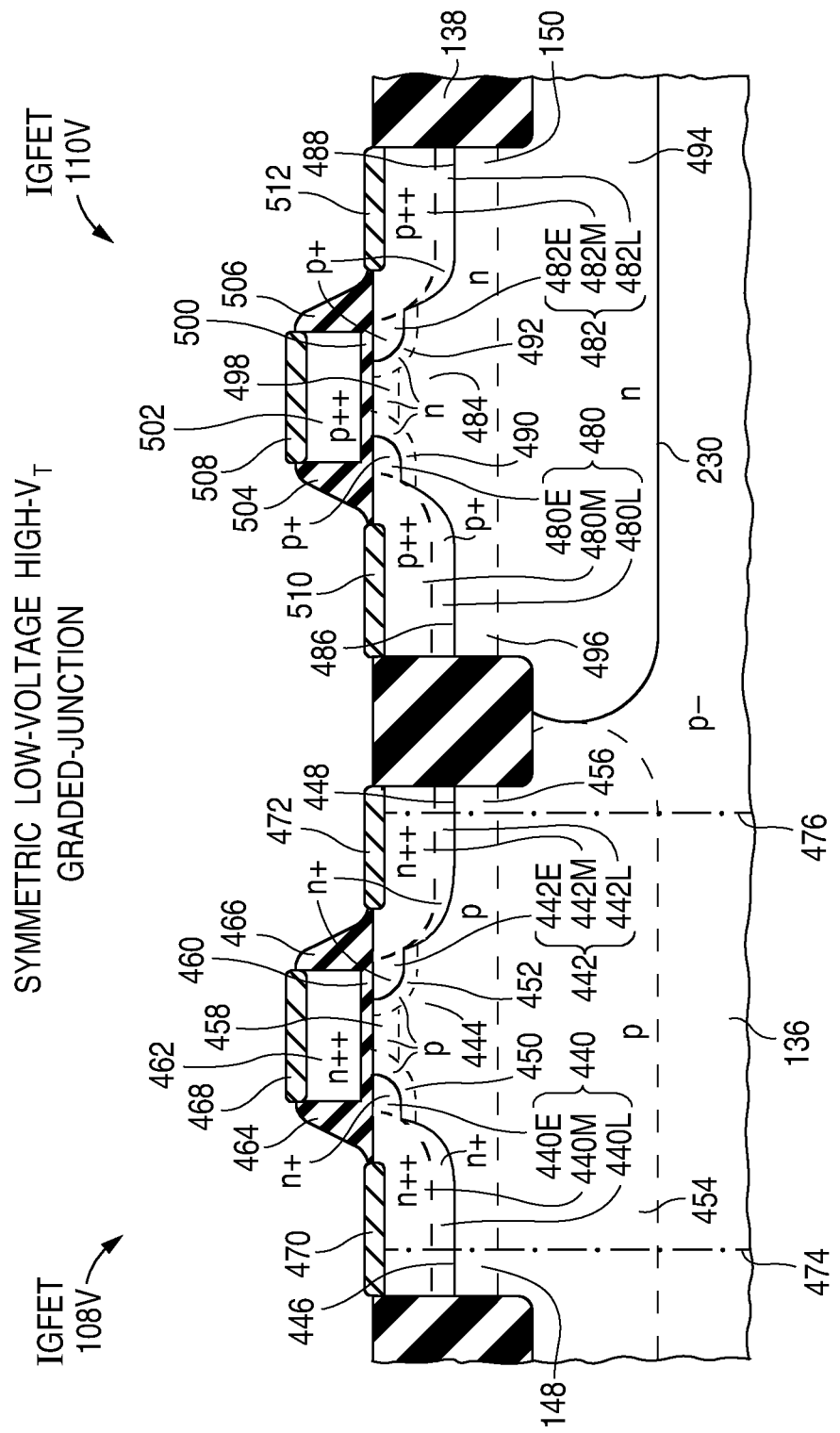
Fig. 34.3

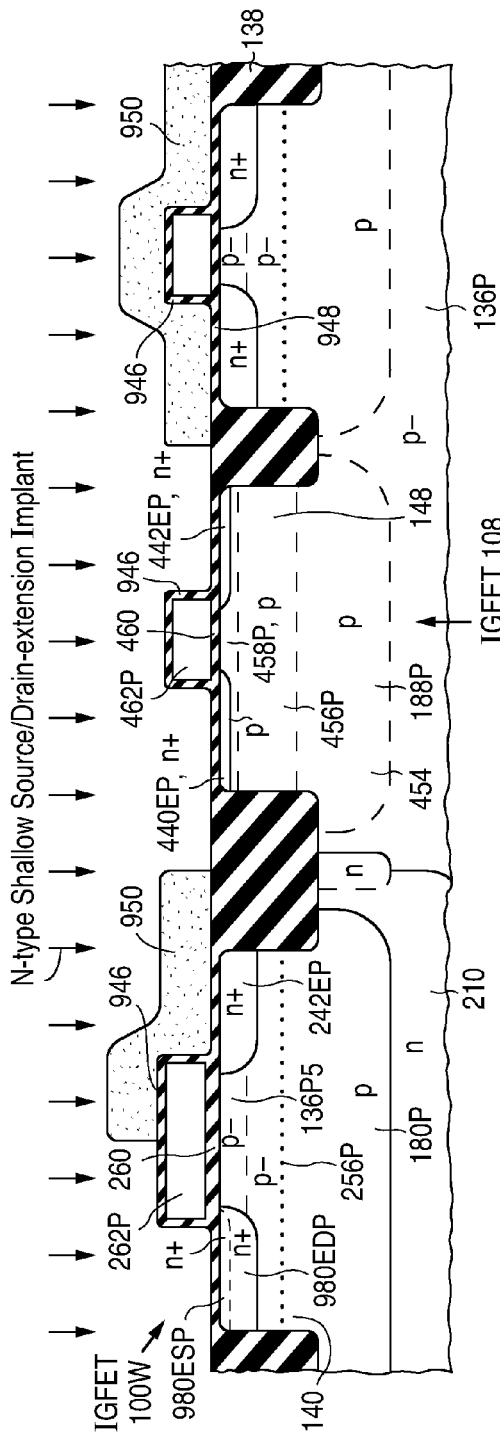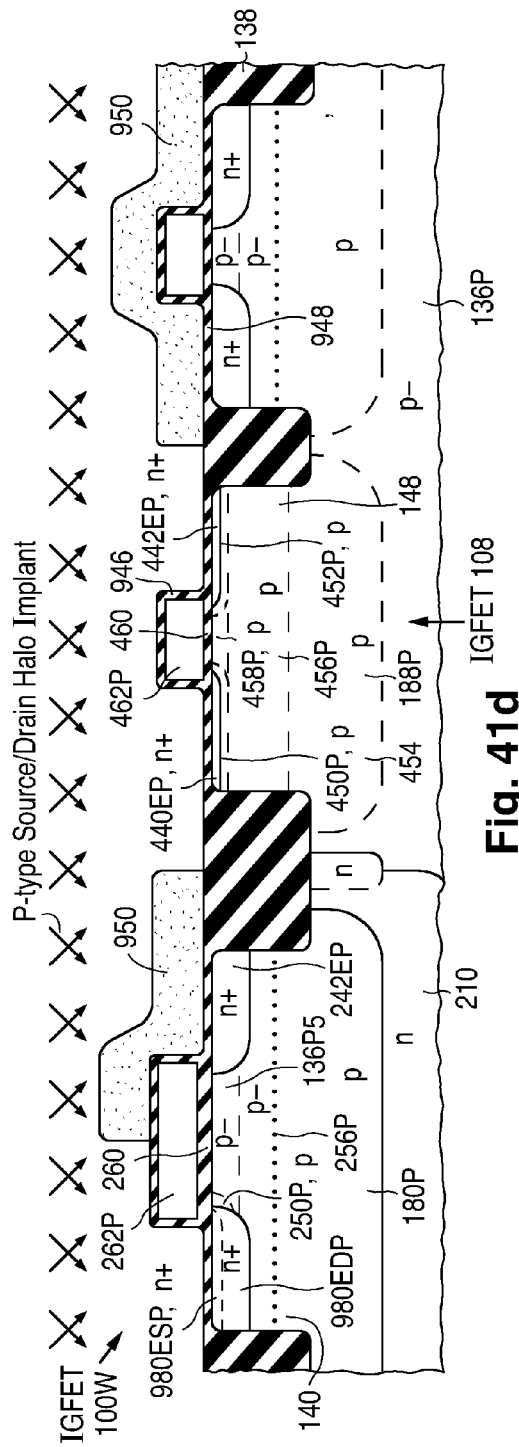

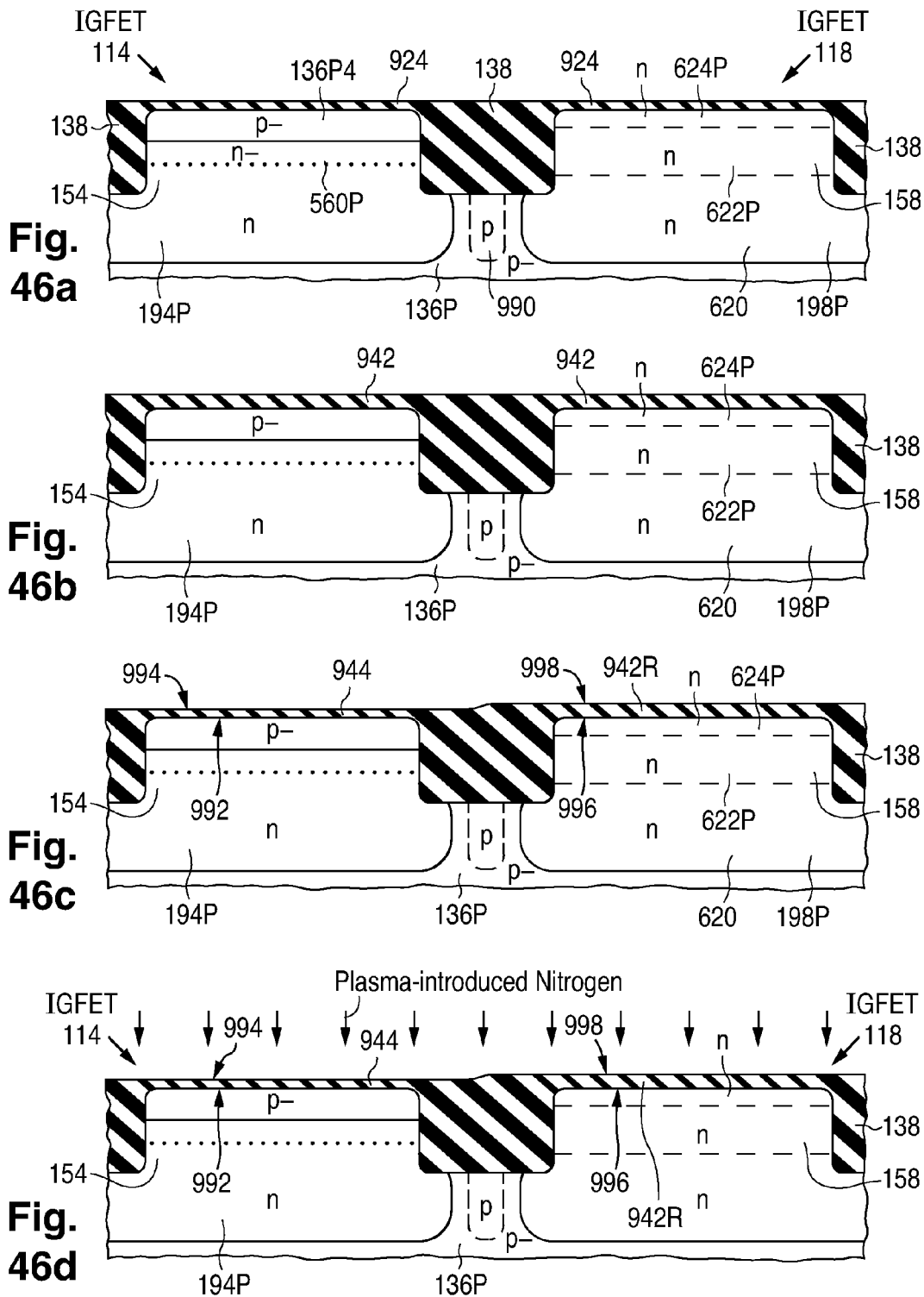

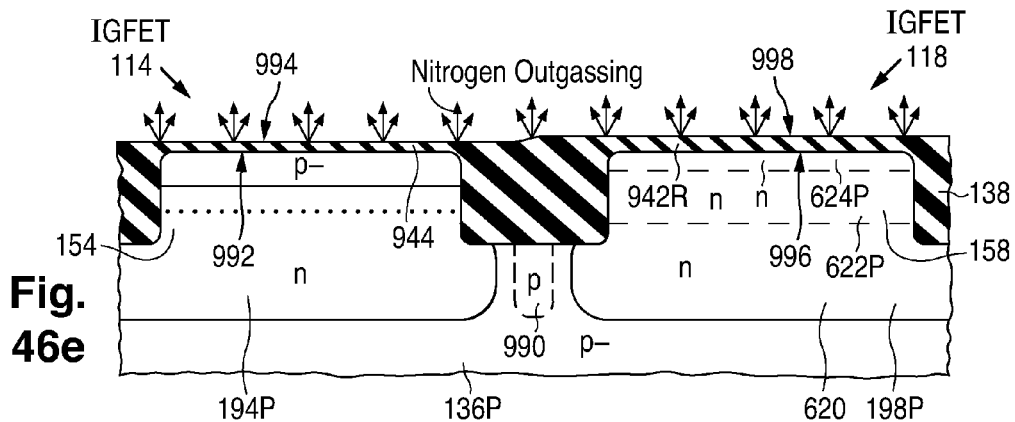
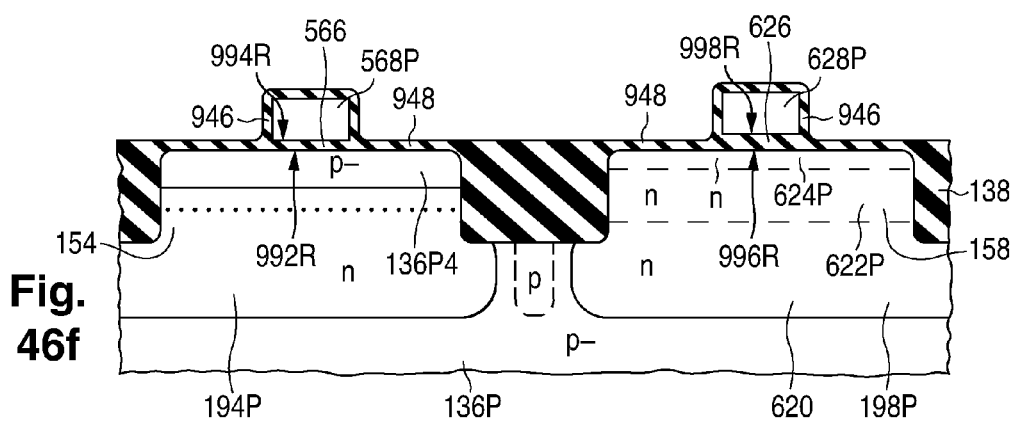
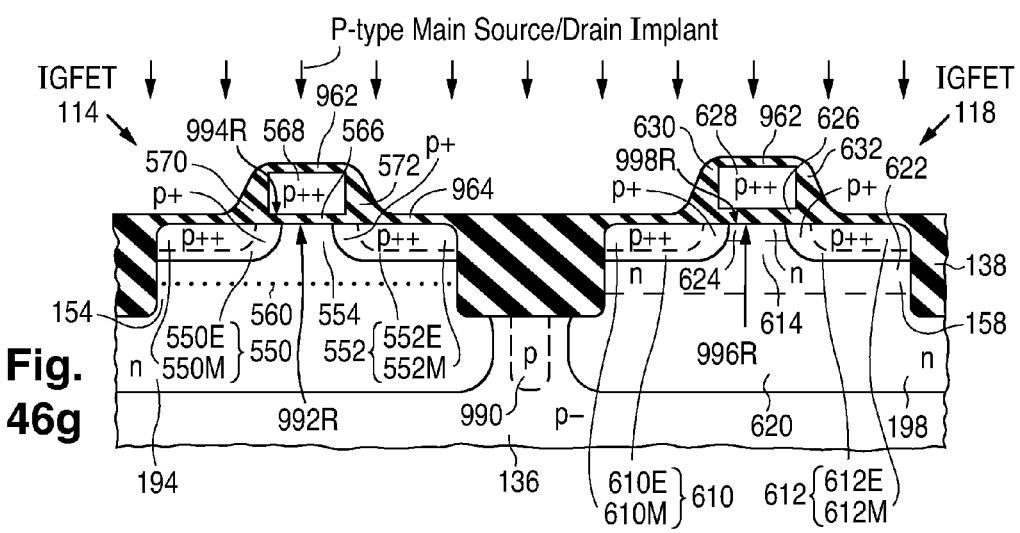

CONFIGURATION AND FABRICATION OF SEMICONDUCTOR STRUCTURE USING EMPTY AND FILLED WELLS

CROSS-REFERENCE TO RELATED APPLICATIONS

This application is related to the following U.S. patent applications all filed on the same date as this application: U.S. patent application Ser. No. 12/382,976 (Bulucea et al.), U.S. patent application Ser. No. 12/382,977 (Parker et al.), U.S. patent application Ser. No. 12/382,972 (Bahl et al.), U.S. patent application Ser. No. 12/382,966 (Yang et al.), U.S. patent application Ser. No. 12/382,967 (Yang et al.) U.S. patent application Ser. No. 12/382/968 (Bulucea et al.), U.S. patent application Ser. No. 12/382,969 (Bulucea et al.), U.S. patent application Ser. No. 12/382,974 (French et al.), U.S. patent application Ser. No. 12/382,971 (Bulucea et al.), and U.S. patent application Ser. No. 12/382,970 (Chaparala et al.), To the extent not repeated herein, the contents of these other applications are incorporated herein by reference herein.

FIELD OF USE

This invention relates to semiconductor technology and, in particular, to field-effect transistors ("FETs") of the insulated-gate type. All of the insulated-gate FETs ("IGFETs") described below are surface-channel enhancement-mode IGFETs except as otherwise indicated.

BACKGROUND

An IGFET is a semiconductor device in which a gate dielectric layer electrically insulates a gate electrode from a channel zone extending between a source zone and a drain zone. The channel zone in an enhancement-mode IGFET is part of a body region, often termed the substrate or substrate region, which forms respective pn junctions with the source and drain. In an enhancement-mode IGFET, the channel zone consists of all the semiconductor material between the source and drain. During IGFET operation, charge carriers move from the source to the drain through a channel induced in the channel zone along the upper semiconductor surface. The threshold voltage is the value of the gate-to-source voltage at which the IGFET starts to conduct current for a given definition of the threshold (minimum) conduction current. The channel length is the distance between the source and drain along the upper semiconductor surface.

IGFETs are employed in integrated circuits ("ICs") to perform various digital and analog functions. As IC operational capabilities have advanced over the years, IGFETs have become progressively smaller, leading to a progressive decrease in minimum channel length. An IGFET that operates in the way prescribed by the classical model for an IGFET is often characterized as a "long-channel" device. An IGFET is described as a "short-channel" device when the channel length is reduced to such an extent that the IGFET's behavior deviates significantly from the classical IGFET model. Although both short-channel and long-channel IGFETs are employed in ICs, the great majority of ICs utilized for digital functions in very large scale integration applications are laid out to have the smallest channel length reliably producible with available lithographic technology.

A depletion region extends along the junction between the source and the body region. Another depletion region extends along the junction between the drain and the body region. A high electric field is present in each depletion region. Under certain conditions, especially when the channel length is small, the drain depletion region can laterally extend to the source depletion region and merge with it along or below the upper semiconductor surface. The merging of the source and drain depletion regions along the upper semiconductor surface is termed surface punchthrough. The merging of the two depletion regions below the upper semiconductor surface is termed bulk punchthrough. When surface or bulk punchthrough occurs, the operation of the IGFET cannot be controlled with its gate electrode. Both types of punchthrough need to be avoided.

Various techniques have been employed to improve the performance of IGFETs, including those operating in the short-channel regime, as IGFET dimensions have decreased. One performance improvement technique involves providing an IGFET with a two-part drain for reducing the electric field at the drain so as to avoid hot carrier injection into the gate dielectric layer. The IGFET is also commonly provided with a similarly configured two-part source. Another conventional performance improvement technique is to increase the dopant concentration of the channel zone in a pocket portion along the source for inhibiting surface punchthrough as channel length is reduced and for shifting generally undesired roll-off of the threshold voltage to shorter channel length. Similar to how the IGFET is provided with a two-part source analogous to the two-part drain, the dopant concentration is also commonly increased in a pocket portion along the drain. The resulting IGFET is then typically a symmetric device.

FIG. 1 illustrates such a conventional long-channel symmetric n-channel IGFET 20 as described in U.S. Pat. No. 6,548,842 B1 (Bulucea et al.). IGFET 20 is created from a p-type monocrystalline silicon ("monosilicon") semiconductor body. The upper surface of IGFET 20 is provided with recessed electrically insulating field-insulating region 22 that laterally surrounds active semiconductor island 24 having n-type source/drain ("S/D") zones 26 and 28. Each S/D zone 26 or 28 consists of very heavily doped main portion 26M or 28M and more lightly doped, but still heavily doped, lateral extension 26E or 28E.

S/D zones 26 and 28 are separated from each other by channel zone 30 of p-type body material 32 consisting of lightly doped lower portion 34, heavily doped intermediate well portion 36, and upper portion 38. Although most of upper body-material portion 38 is moderately doped, portion 38 includes ion-implanted heavily doped halo pocket portions 40 and 42 that respectively extend along S/D zones 26 and 28. IGFET 20 further includes gate dielectric layer 44, overlying very heavily doped n-type polycrystalline silicon ("polysilicon") gate electrode 46, electrically insulating gate sidewall spacers 48 and 50, and metal silicide layers 52, 54, and 56.

S/D zones 26 and 28 are largely mirror images of each other. Halo pockets 40 and 42 are also largely mirror images of each other so that channel zone 30 is symmetrically longitudinally graded with respect to channel dopant concentration. Due to the symmetry, either S/D zone 26 or 28 can act as source during IGFET operation while the other S/D zone 28 or 26 acts as drain. This is especially suitable for some digital situations where S/D zones 26 and 28 respectively function as source and drain during certain time periods and respectively as drain and source during other time periods.

FIG. 2 illustrates how net dopant concentration $N_N$ varies as a function of longitudinal distance x for IGFET 20. Since IGFET 20 is a symmetric device, FIG. 2 presents only a half profile starting from the channel center. Curve segments 26M*, 26E*, 28M*, 28E*, 30*, 40*, and 42* in FIG. 2 respectively represent the net dopant concentrations of regions 26M, 26E, 28M, 28E, 30, 40, and 42. Dotted curve segment 40" or 42" indicates the total concentration of the p-type semiconductor dopant that forms halo pocket 40 or 42, including the p-type dopant introduced into the location for S/D zone 26 or 28 in the course of forming pocket 40 or 42.

The increased p-type dopant channel dopant concentration provided by each halo pocket 40 or 42 along S/D zone 26 or 28, specifically along lateral S/D extension 26E or 28E, causes surface punchthrough to be avoided. Upper body-material portion 38 is also provided with ion-implanted p-type anti-punchthrough ("APT") semiconductor dopant that reaches a maximum concentration in the vicinity of the depth of S/D zones 26 and 28. This causes bulk punchthrough to be avoided.

Based on the information presented in U.S. Pat. No. 6,548,842, FIG. 3a roughly depicts how concentrations $N_T$ of the total p-type and total n-type dopants vary as a function of depth y along an imaginary vertical line extending through main S/D portion 26M or 28M. Curve segment 26M" or 28M" in FIG. 3a represent the total concentration of the n-type dopant that defines main S/D portion 26M or 28M. Curve segments 34", 36", 38", 40", and 42" together represent the total concentration of the p-type dopant that defines respective regions 34, 36, 38, 40, and 42.

Well portion 36 is defined by ion implanting IGFET 20 with p-type main well semiconductor dopant that reaches a maximum concentration at a depth below that of the maximum concentration of the p-type APT dopant. Although, the maximum concentration of the p-type main well dopant is somewhat greater than the maximum concentration of the p-type APT dopant, the vertical profile of the total p-type dopant is relatively flat from the location of the maximum well-dopant concentration up to main S/D portion 26M or 28M. U.S. Pat. No. 6,548,842 discloses that the p-type dopant profile along the above-mentioned vertical line through main S/D portion 26M or 28M can be further flattened by implanting an additional p-type semiconductor dopant that reaches a maximum concentration at a depth between the depths of the maximum concentrations of APT and well dopants. This situation is illustrated in FIG. 3b where curve segment 58" indicates the variation caused by the further p-type dopant.

Body material 32 is alternatively referred to as a well because it is created by introducing p-type semiconductor dopant into lightly doped semiconductor material of a semiconductor body. The so-introduced total well dopant here consists of the p-type main well dopant, the APT dopant, and, in the IGFET variation of FIG. 3b, the additional p-type dopant.

Various types of wells have been employed in ICs, particularly ICs containing complementary IGFETs where wells must be used for either the n-channel or p-channel IGFETs depending on whether the lightly doped starting semiconductor material for the IGFET body material is of p-type or n-type conductivity. ICs containing complementary IGFETs commonly use both p-type and n-type wells in order to facilitate matching of n-channel and p-channel IGFET characteristics.

Early complementary-IGFET ("CIGFET") fabrication processes commonly termed "CMOS" fabrication often created wells, referred to here as "diffused" wells, by first introducing main semiconductor well dopant shallowly into lightly doped semiconductor material prior to formation of a recessed field-insulating region typically consisting largely of thermally grown silicon oxide. Because the field-oxide growth was invariably performed at high temperature over a multi-hour period, the well dopant diffused deeply into the semiconductor material. As a result, the maximum concentration of the diffused well dopant occurred at, or very close to, the upper semiconductor surface. Also, the vertical profile of the diffused well dopant was relatively flat near the upper semiconductor surface.

In more recent CIGFET fabrication processes, ion implantation at relatively high implantation energies has been utilized to create wells subsequent to formation of the field oxide. Since the well dopant is not subjected to the long high-temperature operation used to form the field oxide, the maximum concentration of the well dopant occurs at a significant depth into the semiconductor material. Such a well is referred to as a "retrograde" well because the concentration of the well dopant decreases in moving from the subsurface location of the maximum well-dopant concentration to the upper semiconductor surface. Retrograde wells are typically shallower than diffused wells. The advantages and disadvantages of retrograde wells are discussed in (a) Brown et al., "Trends in Advanced Process Technology—Submicrometer CMOS Device Design and Process Requirements", *Procs. IEEE*, December 1986, pp. 1678-1702, and (b) Thompson et al., "MOS Scaling: Transistor Challenges for the 21st Century", *Intel Technology J.*, Q398, 1998, pp. 1-19.

FIG. 4 illustrates symmetric n-channel IGFET 60 that employs a retrograde well as generally described in Rung et al. ("Rung"), "A Retrograde p-Well for Higher Density CMOS", *IEEE Trans Elec. Devs.*, October 1981, pp. 1115-1119. Regions in FIG. 4 corresponding to regions in FIG. 1 are, for simplicity, identified with the same reference symbols. With this in mind, IGFET 60 is created from lightly doped n-type substrate 62. Recessed field-insulating region 22 is formed along the upper semiconductor surface according to the local-oxidation-of-silicon process. P-type retrograde well 64 is subsequently formed by selectively implanting p-type semiconductor dopant into part of substrate 62. The remaining IGFET regions are then formed to produce IGFET 60 as shown in FIG. 4.

The p-type dopant concentration of retrograde well 64 is at moderate level, indicated by the symbol "p", in the vicinity of the peak well dopant concentration. The well dopant concentration drops to a low level, indicated by the symbol "p−" at the upper semiconductor surface. The dotted line in FIG. 4 indicates generally where the well dopant concentrations transitions from the p level to the p− level in moving from the p portion of well 64 to the upper semiconductor surface.

FIG. 5 indicates the general nature of the dopant profile along an imaginary vertical line through the longitudinal center of IGFET 60 in terms of net dopant concentration $N_N$. Curve segments 62" and 64" respectively represent the net dopant concentrations of n-type substrate 62 and p-type retrograde well 64. Arrow 66 indicates the location of the maximum subsurface p-type dopant concentration in well 64. For comparison, curve segment 68" represents the vertical dopant profile of a typical deeper p-type diffused well.

A specific example of the dopant profile along an imaginary vertical line through the longitudinal center of retrograde well 64 as simulated by Rung is depicted in FIG. 6 in terms of net dopant concentration $N_N$. Curve segment 26" or 28" indicates the net dopant concentration along an imaginary vertical line through S/D zone 26 or 28 of Rung's simulation of IGFET 60. As FIG. 6 indicates, the concentration of the p-type well dopant decreases by more than a factor of 10 in moving from location 66 of the maximum p-type dopant concentration in well 64 to the upper semiconductor surface. FIG. 6 also indicates that the depth of location 66 is approximately twice as deep as S/D zone 26 or 28 in IGFET 60.

A retrograde IGFET well, such as well 64, whose maximum well dopant concentration (i) is at least a factor of 10 greater than the well dopant concentration at the upper semiconductor surface and (ii) occurs relatively deep compared to, e.g., deeper than, the maximum depth of the S/D zones can be viewed as an "empty" well since there is a relatively small amount of well dopant near the top of the well where the IGFET's channel forms. In contrast, a diffused well is a "filled" well. The well for symmetric IGFET 20 in FIG. 1 can likewise be viewed as a filled well since the APT dopant "fills" the retrograde well that would otherwise occur if the main well dopant were the only well dopant.

A symmetric IGFET structure is generally not needed in situations where current flows in only one direction through an IGFET during device operation. As further discussed in U.S. Pat. No. 6,548,842, drain-side halo pocket portion 42 of symmetric IGFET 20 can be deleted to produce long n-channel IGFET 70 as shown in FIG. 7a. IGFET 70 is an asymmetric device because channel zone 30 is asymmetrically longitudinally dopant graded. S/D zones 26 and 28 in IGFET 70 respectively function as source and drain. FIG. 7b illustrates asymmetric short n-channel IGFET 72 corresponding to long-channel IGFET 70. In IGFET 72, source-side halo pocket 40 closely approaches drain 28. Net dopant concentration $N_N$ as a function of longitudinal distance x along the upper semiconductor surface is shown in FIGS. 8a and 8b respectively for IGFETs 70 and 72.

Asymmetric IGFETs 70 and 72 receive the same APT and well implants as symmetric IGFET 60. Along vertical lines extending through source 26 and drain 28, IGFETs 70 and 72 thus have the dopant distributions shown in FIG. 3a except that dashed-line curve segment 74 represents the vertical dopant distribution through drain 28 due to the absence of halo pocket 42. When the IGFET structure is provided with the additional well implant to further flatten the vertical dopant profile, FIG. 3b presents the consequent vertical dopant distributions again subject to curve segment 74" representing the dopant distribution through drain 28.

U.S. Pat. Nos. 6,078,082 and 6,127,700 (both Bulucea) describe IGFETs having asymmetric channel zones but different vertical dopant characteristics than those employed in the inventive IGFETs of U.S. Pat. No. 6,548,842. IGFETs having asymmetric channel zones are also examined in other prior art documents such as (a) Buti et al., "Asymmetrical Halo Source GOLD drain (HS-GOLD) Deep Sub-half n-Micron MOSFET Design for Reliability and Performance", *IEDM Tech. Dig.*, 3-6 Dec. 1989, pp. 26.2.1-26.2.4, (b) Chai et al., "A Cost-Effective 0.25 μm $L_{eff}$ BiCMOS Technology Featuring Graded-Channel CMOS (GCMOS) and a Quasi-Self Aligned (QSA) NPN for RF Wireless Applications", *Procs. 2000 Bipolar/BiCMOS Circs. and Tech. Meeting*, 24-26 Sep. 2000, pp. 110-113, (c) Ma et al., "Graded-Channel MOSFET (GCMOSFET) for High Performance, Low Voltage DSP Applications", *IEEE Trans. VLSI Systs. Dig.*, December 1997, pp. 352-358, (d) Su et al., "A High-Performance Scalable Submicron MOSFET for Mixed Analog/Digital Applications", *IEDM Tech. Dig.*, December 1991, pp. 367-370, and (e) Tsui et al., "A Volatile Half-Micron Complementary BiCMOS Technology for Microprocessor-Based Smart Power Applications", *IEEE Trans. Elec. Devs.*, March 1995, pp. 564-570.

Choi et al. ("Choi"), "Design and analysis of a new self-aligned asymmetric structure for deep sub-micrometer MOSFET", *Solid-State Electronics*, Vol. 45, 2001, pp. 1673-1678, describes an asymmetric n-channel IGFET configured similarly to IGFET 70 or 72 except that the source extension is more heavily doped than the drain extension. Choi's IGFET also lacks a well region corresponding to intermediate well portion 36. FIG. 9 illustrates Choi's IGFET 80 using the same reference symbols as used for IGFET 70 or 72 to identify corresponding regions. Although source extension 26E and drain extension 28E are both labeled "n+" in FIG. 9, the doping in source extension 26E of IGFET 80 is somewhat more than a factor of 10 greater than the doping in drain extension 28E. Choi indicates that the heavier source-extension doping should reduce the increased source-associated parasitic capacitance that otherwise results from the presence of halo pocket 40 along source 26.

FIGS. 10a-10d (collectively "FIG. 10") represent steps in Choi's process for fabricating IGFET 80. Referring to FIG. 10a, precursors 44P and 46P respectively to gate dielectric layer 44 and polysilicon gate electrode 46P are successively formed along p-type monosilicon wafer 34P that constitutes a precursor to body-material portion 34. A layer of pad oxide is deposited on precursor gate-electrode layer 46P and patterned to produce pad oxide layer 82. A layer of silicon nitride is deposited on top of the structure and partially removed to produce nitride region 84 that laterally abuts pad oxide 82 and leaves part of gate-electrode layer 46P exposed.

After removing the exposed part of gate-electrode layer 46P, singly ionized arsenic is ion implanted through the exposed part of dielectric layer 44P and into wafer 34P at an energy of 10 kiloelectron volts ("keV") and a high dosage of $1\times10^{15}$ ions/cm$^2$ to define heavily doped n-type precursor 26EP to source extension 26E. See FIG. 10b. Singly ionized boron difluoride is also ion implanted through the exposed part of dielectric layer 44P and into wafer 34P to define heavily doped p-type precursor 40P to source-side halo pocket 40. The halo implantation is done at an energy of 65 keV and a high dosage of $2\times10^{13}$ ions/cm$^2$.

Nitride region 84 is converted into silicon nitride region 86 that laterally abuts pad oxide 82 and covers the previously exposed part of dielectric layer 44P. See FIG. 10c. After removing pad oxide 82, the exposed part of gate-electrode layer 46P is removed to leave the remainder of layer 46P in the shape of gate electrode 46 as shown in FIG. 10d. Another part of dielectric layer 44P is thereby exposed. Singly ionized arsenic is ion implanted through the newly exposed part of dielectric layer 44P and into wafer 34P to define heavily doped n-type precursor 28EP to drain extension 28E. The drain-extension implant is done at the same energy, 10 keV, as the source extension implant, but at a considerably lower dosage, $5\times10^{13}$ ions/cm$^2$. As a result, the drain-extension and source-extension implants reach maximum concentrations at essentially the same depth into wafer 34P. In later steps (not shown), nitride 86 is removed, gate sidewall spacers 48 and 50 are formed, arsenic is ion implanted to define n++ main S/D portions 26M and 28M, and a rapid thermal anneal is performed to produce IGFET 80 as shown in FIG. 9.

Choi's decoupling of the source-extension and drain-extension implants and then forming source extension 26E at a considerably higher doping than drain extension 28E in order to alleviate the increased source-associated parasitic capacitance resulting from source-side halo pocket 40 is clearly advantageous. However, Choi's coupling of the formation of gate electrode 46 with the formation of source/drain extensions 26E and 28E in the process of FIG. 10 is laborious and could make it difficult to incorporate Choi's process into a larger semiconductor process that provides other types of IGFETs. It would be desirable to have a simpler technique for making such an asymmetric IGFET. In particular, it would be desirable to decouple the gate-electrode formation from the formation of differently doped source/drain extensions.

The term "mixed signal" refers to ICs containing both digital and analog circuitry blocks. The digital circuitry typically employs the most aggressively scaled n-channel and p-channel IGFETs for obtaining the maximum potential digital speed at given current leakage specifications. The analog circuitry utilizes IGFETs and/or bipolar transistors subjected to different performance requirements than the digital IGFETs. Requirements for the analog IGFETs commonly include high linear voltage gain, good small-signal and large-signal frequency response at high frequency, good parameter matching, low input noise, well controlled electrical parameters for active and passive components, and reduced parasitics, especially reduced parasitic capacitances. Although it would be economically attractive to utilize the same transistors for the analog and digital blocks, doing so would typically lead to weakened analog performance. Many requirements imposed on analog IGFET performance conflict with the results of digital scaling.

More particularly, the electrical parameters of analog IGFETs are subjected to more rigorous specifications than the IGFETs in digital blocks. In an analog IGFET used as an amplifier, the output resistance of the IGFET needs to be maximized in order to maximize its intrinsic gain. The output resistance is also important in setting the high-frequency performance of an analog IGFET. In contrast, the output resistance is considerably less importance in digital circuitry. Reduced values of output resistance in digital circuitry can be tolerated in exchange for higher current drive and consequent higher digital switching speed as long as the digital circuitry can distinguish its logic states, e.g., logical "0" and logical "1".

The shapes of the electrical signals passing through analog transistors are critical to circuit performance and normally have to be maintained as free of harmonic distortions and noise as reasonably possible. Harmonic distortions are caused primarily by non-linearity of transistor gain and transistor capacitances. Hence, linearity demands on analog transistors are very high. The parasitic capacitances at pn junctions have inherent voltage non-linearities that need to be alleviated in analog blocks. Conversely, signal linearity is normally of secondary importance in digital circuitry.

The small-signal analog speed performance of IGFETs used in analog amplifiers is determined at the small-signal frequency limit and involves the small-signal gain and the parasitic capacitances along the pn junctions for the source and drain. The large-signal analog speed performance of analog amplifier IGFETS is similarly determined at the large-signal frequency limit and involves the non-linearities of the IGFET characteristics.

The digital speed of logic gates is defined in terms of the large-signal switching time of the transistor/load combination, thereby involving the drive current and output capacitance. Hence, analog speed performance is determined differently than digital speed performance. Optimizations for analog and digital speeds can be different, leading to different transistor parameter requirements.

Digital circuitry blocks predominantly use the smallest IGFETs that can be fabricated. Because the resultant dimensional spreads are inherently large, parameter matching in digital circuitry is often relatively poor. In contrast, good parameter matching is usually needed in analog circuitry to achieve the requisite performance. This typically requires that analog transistors be fabricated at greater dimensions than digital IGFETs subject to making analog IGFETS as short as possible in order to have source-to-drain propagation delay as low as possible.

In view of the preceding considerations, it is desirable to have a semiconductor fabrication platform that provides IGFETs with good analog characteristics. The analog IGFETs should have high intrinsic gain, high output resistance, high small-signal switching speed with reduced parasitic capacitances, especially reduced parasitic capacitances along the source-body and drain-body junctions. It is also desirable that the fabrication platform be capable of providing high-performance digital IGFETs.

GENERAL DISCLOSURE OF THE INVENTION

The present invention furnishes a semiconductor fabrication platform that provides IGFETs with high-performance characteristics for analog and digital applications, including mixed-signal applications. The core of the present semiconductor fabrication platform is a semiconductor structure having a combination of empty-well regions and filled-well regions. An empty-well region is basically a semiconductor well in which there is a relatively small amount of semiconductor well dopant near the top of the well. Essentially the opposite of an empty-well region, a filled-well region is basically a semiconductor well in which there is a considerable amount of semiconductor well dopant near the top of the well.

Some desirable IGFET performance characteristics, e.g., threshold voltages of low magnitude, are more readily achieved with symmetric IGFETs when they utilize empty-well regions. The performance characteristics of asymmetric IGFETs are readily enhanced by using empty-well regions. On the other hand, other desirable IGFET performance characteristics, e.g., low-off-state current leakage and threshold voltages of nominal magnitude, are more readily achieved with symmetric IGFETs when they employ filled-well regions.

The asymmetric IGFETs are suitable for analog applications and digital situations where the current flow is unidirectional. The symmetric IGFETs are generally suitable for digital applications and certain analog situations. The combination of empty and filled wells enables the present semiconductor fabrication platform to furnish a wide variety of different high-performance IGFETs from which circuit designers can select IGFETs for various analog and digital applications, including mixed-signal applications.

More particularly, a semiconductor structure configured according to the invention contains first and second well regions of body material of a semiconductor body having an upper surface. The body material is doped with semiconductor dopant, referred to here as the well dopant, of a first conductivity type so as to be of the first conductivity type. The first well region is doped in such a manner as to be an empty well having a relatively small amount of the well dopant near the top of the well. The second well region is doped so as to be a filled well having a considerable amount of the well dopant near the top of the well. The doping characteristics of the first and second well regions, respectively referred to here as the empty and filled wells, are described further below.

First and second zones of a second conductivity type opposite to the first conductivity type are situated in the semiconductor body along the upper semiconductor surface. Each zone is typically a source/drain zone of an IGFET. The empty well region meets the first zone so as to form a pn junction with the first zone referred to hereafter, for convenience, as the empty-well-adjoining zone. The filled well region similarly meets the second zone so as to form a pn junction with the second zone referred to hereafter, for convenience, as the filled-well-adjoining zone. The empty and filled wells respectively extend below the empty-well-adjoining and filled-well-adjoining zones.

The well dopant is present in the empty-well-adjoining and filled-well-adjoining zones. The concentration of the well dopant locally reaches first and second subsurface maximum concentrations at respective first and second subsurface maximum concentration locations situated respectively in the empty-well and filled-well regions and respectively extending laterally below the empty-well-adjoining and filled-well-adjoining zones. The first subsurface maximum concentration location, referred to hereafter as the empty-well maximum concentration location, occurs no more than 10 times deeper below the upper semiconductor surface than the maximum depth of the pn junction for the empty-well-adjoining zone. The second subsurface maximum concentration location, referred to hereafter as the filled-well maximum concentration location, similarly occurs no more than 10 times deeper below the upper semiconductor surface than the maximum depth of the pn junction for the filled-well-adjoining zone.

The concentration of the well dopant decreases (i) by at least a factor of 10, preferably by a factor of at least 20, in moving upward from the empty-well subsurface maximum concentration location along a selected first vertical location through the empty-well-adjoining zone to the upper semiconductor surface and (ii) substantially monotonically, normally substantially inflectionlessly, by less than a factor of 10 in moving from the empty-well subsurface maximum concentration location along the first vertical location to the pn junction for the empty-well-adjoining zone. These two dopant-distribution requirements in combination with the requirement that the empty-well maximum concentration location occur no more than 10 times deeper below the upper semiconductor surface than the maximum depth of the pn junction for the empty-well-adjoining zone establish the first well region as an empty well.

The well dopant concentration reaches at least one additional subsurface maximum concentration in moving upward from the filled-well subsurface maximum concentration location along a selected second vertical location through the filled-well-adjoining zone to the upper semiconductor surface. The combination of this additional subsurface maximum dopant concentration requirement and the requirement that the filled-well maximum concentration location occur no more than 10 times deeper below the upper semiconductor surface than the maximum depth of the pn junction for the filled-well-adjoining zone establish the second well region as an empty well. Preferably, the well dopant concentration decreases by less than a factor of 10 in moving upward from the empty-well subsurface maximum concentration location along the second vertical location through the filled-well-adjoining zone to the upper semiconductor surface.

Fabrication of the present semiconductor structure in accordance with invention entails (i) introducing the well dopant into a pair of portions of the semiconductor body to respectively define the empty-well and filled-well well regions and (ii) introducing semiconductor dopant of the second conductivity type, i.e., the opposite conductivity type to that of the well regions, into a pair of portions of the semiconductor body to respectively define the empty-well-adjoining and filled-well-adjoining zones. The introduction of the well dopant normally involves separately introducing first and second semiconductor dopants of the first conductivity type respectively into the empty-well and filled-well regions.

The first dopant of the first conductivity type normally includes a first well semiconductor dopant of the first conductivity type. The second dopant of the first conductivity type then includes a second well semiconductor dopant of the first conductivity type and at least one additional well semiconductor dopant of the first conductivity type. The first well dopant into the empty-well region is preferably introduced through at least one opening in a first mask so that the first well dopant largely defines the empty-well subsurface maximum concentration. The second well dopant and each additional well dopant are then introduced into the filled-well region through at least one opening in a second mask so that the second well dopant largely defines the filled-well subsurface maximum concentration and each additional well dopant largely defines one additional subsurface maximum concentration for the filled well.

Each of the empty-well-adjoining and filled-well-adjoining zones is, as mentioned above, typically a source/drain (again "S/D") zone of an IGFET. The empty-well-adjoining zone is then an S/D zone of a first IGFET referred to here as an empty-well IGFET. The filled-well-adjoining zone is similarly an S/D zone of a second IGFET referred to here as a filled-well IGFET. Each IGFET has another S/D zone.

In addition to a pair of S/D zones, each IGFET has a channel zone of a region of the body material, a gate dielectric layer overlying the channel zone, and a gate electrode overlying the gate dielectric layer above the channel zone. The empty-well and filled-well IGFETs are of the same polarity, i.e., either n channel or p channel, because their respective empty and filled wells are of the same conductivity type. The present semiconductor structure may include multiple such empty-well IGFETs or/and multiple such filled-well IGFETs.

The use of empty and filled wells enables the IGFETs to achieve a wide variety of features for meeting particular circuit applications. For instance, it may be necessary for the IGFETs to operate across two or more different voltage ranges. In that case, the IGFETs normally satisfy at least two of the following gate dielectric layer requirements in accordance with invention:

a. The gate dielectric layer of one such empty-well IGFET is of materially greater thickness than the gate dielectric layer of one such filled-well IGFET;

b. The gate dielectric layers of one such empty-well IGFET and one such filled-well IGFET are of approximately the same thickness;

c. The gate dielectric layer of one such filled-well IGFET is of materially greater thickness than the gate dielectric layer of one such empty-well IGFET;

d. The gate dielectric layer of one such empty-well IGFET is of materially different thickness than the gate dielectric layer of another such empty-well IGFET; and e. The gate dielectric layer of one such filled-well IGFET is of materially different thickness than the gate dielectric layer of another such filled-well IGFET.

An IGFET of greater gate dielectric layer thickness than another IGFET normally operates across a greater voltage range than the other IGFET.

The IGFETs typically have threshold voltages of various magnitudes. In particular, there are normally multiple instances in which one empty-well IGFET has a threshold voltage of materially lesser magnitude than one filled-well IGFET. The gate dielectric layers of the IGFETs in these instances of different threshold voltages then selectively satisfy at least two of the following gate dielectric layer requirements in accordance with invention:

a. The gate dielectric layers of one such empty-well IGFET and one such filled-well IGFET are of approximately the same thickness;

b. The gate dielectric layer of one such empty-well IGFET is of materially greater thickness than the gate dielectric layer of one such filled-well IGFET; and c. The gate dielectric layer of one such filled-well IGFET is of materially greater thickness than the gate dielectric layer of that one such empty-well IGFET.

Subject to the difference in threshold voltages, an IGFET of greater gate dielectric layer thickness than another IGFET again normally operates across a greater voltage range than the other IGFET.

There are typically multiple instances in which each S/D zone of an IGFET comprises a main S/D portion and a more lightly doped lateral S/D extension laterally continuous with the main S/D portion and extending laterally under the gate electrode of that IGFET. The channel zone is terminated by the S/D extensions along the upper semiconductor surface. The S/D extensions normally selectively satisfy at least two of the following S/D extension requirements in accordance with invention:
  a. One of the S/D extensions of one such empty-well IGFET extends deeper below the body's upper surface than the other of the S/D extensions of that empty-well IGFET;
  b. Each S/D extension of one such empty-well IGFET extends materially deeper below the body's upper surface than each S/D extension of one such filled-well IGFET; and
  c. Each S/D extension of one such filled-well IGFET extends materially deeper below the body's upper surface than each S/D extension of another such filled-well IGFET.

Usage of lateral S/D extensions, especially for the S/D zone acting as the drain of an IGFET, generally reduces hot carrier injection into the IGFET's gate dielectric layer. This reduces undesired threshold-voltage drift with operational time.

Increasing the depth of an S/D extension generally causes hot carrier injection in the gate dielectric layer to be reduced further. Threshold-voltage drift is thereby reduced further. Taking note that other phenomena can detrimentally affect IGFET performance, the present semiconductor fabrication platform enables circuit designers to choose IGFETs with deeper S/D extensions where hot carrier injection into the gate dielectric layers is of major concern and to choose IGFETs with shallower S/D extensions where other phenomena are of more concern than further reduction of hot carrier injection into the gate dielectric layers.

Similarly, there are typically multiple instances in which a pocket portion of the body-material region of an IGFET extends along one of its S/D zones into its channel zone and is more heavily doped than laterally adjacent material of that body-material region. The pocket portions of the IGFETs in those instances normally selectively satisfy at least two of the following pocket portion requirements in accordance with invention:
  a. The pocket portion of one such empty-well IGFET causes its channel zone to be asymmetric with respect to its S/D zones;
  b. Another pocket portion of the body-material region of one such empty-well IGFET extends along its other S/D zone into its channel zone and is more heavily doped than laterally adjacent material of that body-material region; and
  c. Another pocket portion of the body-material region of one such filled-well IGFET extends along its other S/D zone into its channel zone and is more heavily doped than laterally adjacent material of that body-material region.

The presence of pocket portions, especially for the S/D zone acting as the source of an IGFET, helps to avoid bulk punch-through and consequent inability to control the IGFET through its gate electrode.

A pocket portion is, however, generally not helpful at the drain of an IGFET whose current flow is unidirectional and can undesirably reduce the IGFET's transconductance. The semiconductor fabrication platform of the invention enables circuit designers to choose IGFETs, typically symmetric IGFETs, with pocket portions for reducing the possibility of bulk punchthrough in situations where high transconductance is not required and to choose asymmetric IGFETs with only single pocket portions in situations, typically analog situations, where current flow is unidirectional and high transconductance is needed.

Similar to how the foregoing semiconductor structure configured according to the invention contains like-polarity IGFETs of both the empty-well and filled-well types, a semiconductor structure configured according to the invention contains complementary IGFETs of both the empty-well and filled-well types. In the complementary-IGFET (again "CIGFET") structure, a pair of opposite-polarity first and second IGFETs are provided along an upper surface of a semiconductor body. Each IGFET includes a channel zone of body material of the semiconductor body, first and second S/D zones situated in the semiconductor body along the upper semiconductor surface, a gate dielectric layer overlying the channel zone, and a gate electrode overlying the gate dielectric layer above the channel zone. The S/D zones of each IGFET are laterally separated by its channel zone. The body material of each IGFET extends laterally below both of its S/D zones.

The body material of the first IGFET is constituted with first body material doped with semiconductor dopant of the first conductivity type so as to be of the first conductivity type. The S/D zones of the first IGFET are thus of the second conductivity type. In a complementary manner, the body material of the second IGFET is constituted with second body material doped with semiconductor dopant of the second conductivity type so as to be of the second conductivity type. Consequently, the S/D zones of the second IGFET are of the first conductivity type.

The dopant of the first conductivity type is also present in the S/D zones of the first IGFET. The concentration of the dopant of the first conductivity type (a) locally reaches a subsurface maximum concentration at a first subsurface body-material location extending laterally below largely all of each of the channel and S/D zones of the first IGFET, (b) decreases by at least a factor of 10 in moving upward from the first subsurface body-material location along a selected first vertical location through a specified one of the S/D zones of the first IGFET to the upper semiconductor surface, and (c) decreases substantially monotonically and substantially inflectionlessly in moving from the first subsurface body-material location along the selected first vertical location to the pn junction for the specified S/D zone of the first IGFET. The first subsurface body-material location occurs no more than 10 times deeper below the upper semiconductor surface than the maximum depth of the pn junction for the specified S/D zone of the first IGFET. Due to these doping requirements, the first IGFET is an empty-well IGFET.

The dopant of the second conductivity type is similarly also present in the S/D zones of the second IGFET. The concentration of the dopant of the second conductivity type (a) locally reaches a subsurface maximum concentration at a second subsurface body-material location extending laterally below largely all of each of the channel and S/D zones of the second IGFET and (b) decreases by less than a factor of 10 in moving upward from the second subsurface body-material location along any vertical location through each S/D zone of the second IGFET to the upper semiconductor surface. The second subsurface body-material location occurs no more than 10 times deeper below the body's upper surface than the maximum depth of the pn junction for each S/D zone of the second IGFET. Since the concentration of the dopant of the second conductivity type decreases by less than a factor of 10 in moving upward from the second subsurface body-material location along any vertical location through each S/D zone of the second IGFET to the upper semiconductor surface, the second IGFET is a filled-well IGFET.

The semiconductor fabrication platform of the invention enables circuit designers to select various different characteristics for the complementary empty-well and filled-well IGFETs similar to how this is done with the like-polarity empty-well and filled-well IGFETs. For instance, the gate dielectric layer of the empty-well IGFET in the CIGFET structure can be chosen to be of approximately the same thickness, or of materially different thickness, than the gate dielectric layer of the filled-well IGFET. Each S/D zone of each IGFET may have a main S/D portion and a more lightly doped lateral S/D extension laterally continuous with the main S/D portion and extending laterally under the IGFET's gate electrode.

A pocket portion of the first body material more heavily doped than laterally adjacent material of the first body material may extend along one S/D zone of the empty-well IGFET into its channel zone. The pocket portion of the first body material typically causes the channel zone of the empty-well IGFET to be asymmetric with respect to its S/D zones. If the empty-well IGFET also has lateral S/D extensions, the S/D extension of its other S/D zone may extends deeper below the upper semiconductor surface than the S/D extension of the S/D zone having the pocket portion of the first body material.

A pocket portion of the second body material more heavily doped than laterally adjacent material of the second body material extends along one S/D zone of the filled-well IGFET into its channel zone. Another pocket portion of the second body material more heavily doped than laterally adjacent material of the second body material may similarly extend along the other S/D zone of the filled-well IGFET into its channel zone.

In short, the present semiconductor fabrication platform utilizes empty-well regions and filled-well regions to provide circuit designers with a wide variety of IGFETs from which to choose for specific circuit applications. High-performance asymmetric IGFETs and high-performance symmetric IGFETs with threshold voltages of low magnitude are achieved with empty-well regions. High-performance symmetric IGFETs with low-off-state current leakage or threshold voltages of nominal magnitude are achieved with filled-well regions. The invention therefore provides a large advance over the prior art.

BRIEF DESCRIPTION OF THE DRAWINGS

FIGS. 11.1-11.9 are respective front cross-sectional views of nine portions of a CIGFET semiconductor structure configured according to the invention.

FIGS. 18a-18c are respective graphs of individual, total, and net dopant concentrations as a function of depth along an imaginary vertical line through the main drain portion of the asymmetric n-channel IGFET of FIG. 12.

FIGS. 20a-20c are respective graphs of individual, total, and net dopant concentrations as a function of depth along an imaginary vertical line through the halo pocket portion of the asymmetric n-channel IGFET of FIG. 19a.

FIGS. 21a-21c are respective graphs of individual, total, and net dopant concentrations as a function of depth along an imaginary vertical line through the source extension of the asymmetric n-channel IGFET of FIG. 19a.

FIGS. 23a-23c are respective graphs of individual, total, and net dopant concentrations as a function of depth along a pair of imaginary vertical lines respectively through the main well regions of the extended-drain n-channel IGFET of FIG. 22a.

FIG. 27 is a graph of lineal drain current as a function of drain-to-source voltage for an implementation of the extended-drain n-channel IGFET of FIG. 22*a* at a selected well-to-well spacing and for an extension of the IGFET of FIG. 22*a* to zero well-to-well spacing.

FIGS. 28*a* and 28*b* are cross-sectional views of respective computer simulations of the extended-drain n-channel IGFET of FIG. 22*a* and a reference extended-drain n-channel IGFET.

FIGS. 33*a*-33*c*, 33*d*.1-33*y*.1, 33*d*.2-33*y*.2, 33*d*.3-33*y*.3, 33*d*.4-33*y*.4, and 33*d*.5-33*y*.5 are front cross-sectional views representing steps in manufacturing the five portions illustrated in FIGS. 11.1-11.5 of the CIGFET semiconductor structure of FIGS. 11.1-11.9 in accordance with the invention. The steps of FIGS. 33*a*-33*c* apply to the structural portions illustrated in all of FIGS. 11.1-11.5. FIGS. 33*d*.1-33*y*.1 present further steps leading to the structural portion of FIG. 11.1. FIGS. 33*d*.2-33*y*.2 present further steps leading to the structural portion of FIG. 11.2. FIGS. 33*d*.3-33*y*.3 present further steps leading to the structural portion of FIG. 11.3. FIGS. 33*d*.4-33*y*.4 present further steps leading to the structural portion of FIG. 11.4. FIGS. 33*d*.5-33*y*.5 present further steps leading to the structural portion of FIG. 11.5.

FIGS. 34.1-34.3 are front cross-sectional views of three portions of variations, configured according to the invention, of the portions of the CIGFET semiconductor structure respectively shown in FIGS. 11.1-11.3.

FIGS. 41*a*-41*f* are front cross-sectional views representing steps in manufacturing the CIGFET structure of FIG. 38 in accordance with the invention starting essentially from the stage of FIGS. 33*l*.1-33*l*.5.

FIGS. 46*a*-46*g* are front cross-sectional views representing steps in producing nitrided gate dielectric layers for the symmetric p-channel IGFETs of FIGS. 11.4 and 11.5 in accordance with the invention starting with the structure existent immediately after the stage of FIGS. 33*i*.4 and 33*i*.5.

Figure 1:
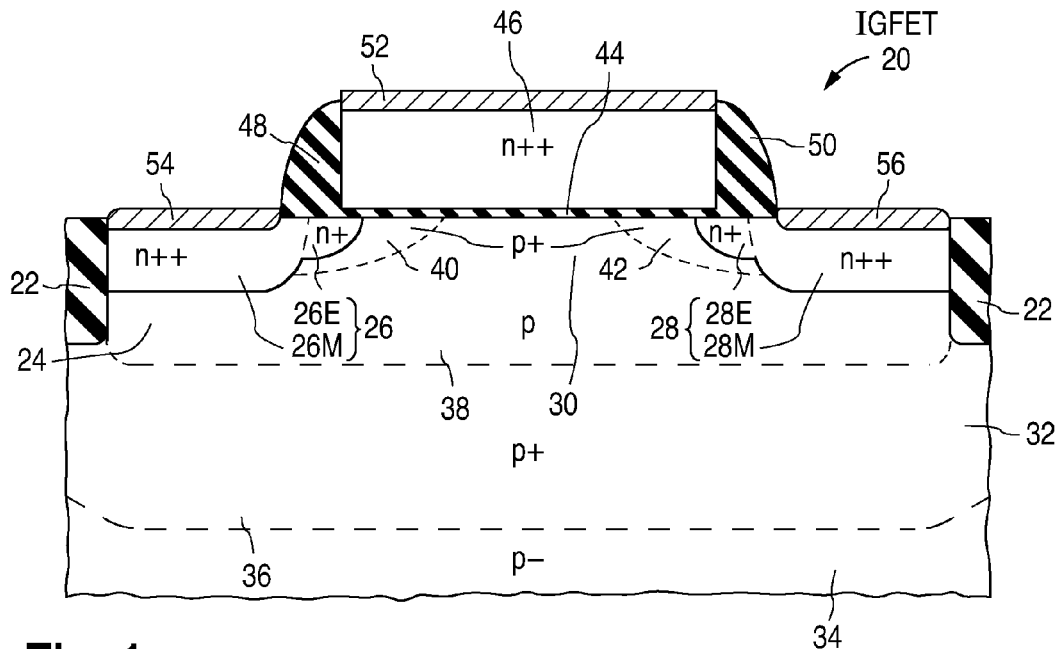
FIG. 1 is a front cross-sectional view of a prior art symmetric long n-channel IGFET that uses a filled well.

Like reference symbols are employed in the drawings and in the description of the preferred embodiment to represent the same, or very similar, item or items. The numerical portions of reference symbols having single prime ('), double prime ("), asterisk (*), and pound (#) signs in drawings containing dopant-distribution graphs respectively indicate like-numbered regions or locations in other drawings. In this regard, curves identified by the same reference symbols in different dopant-distribution graphs have the same meanings.

In the dopant-distribution graphs, "individual" dopant concentrations mean the individual concentrations of each separately introduced n-type dopant and each separately introduced p-type dopant while "total" dopant concentrations mean the total (or absolute) n-type dopant concentration and the total (or absolute) p-type dopant concentration. The "net" dopant concentration in the dopant-distribution graphs is the difference between the total n-type dopant concentration and the total p-type dopant concentration. The net dopant concentration is indicated as net "n-type" when the total n-type dopant concentration exceeds the total p-type dopant concentration, and as net "p-type" when the total p-type dopant concentration exceeds the total n-type dopant concentration.

The thicknesses of dielectric layers, especially gate dielectric layers, are much less than the dimensions of many other IGFET elements and regions. To clearly indicate dielectric layers, their thicknesses are generally exaggerated in the cross-sectional views of IGFETs.

In instances where the conductivity type of a semiconductor region is determined by semiconductor dopant introduced into the region at a single set of dopant-introduction conditions, i.e., in essentially a single doping operation, and in which the concentration of the dopant varies from one general doping level, e.g., moderate indicated by "p" or "n", to another general dopant level, e.g., light indicated by "p−" or "n−", across the region, the portions of the region at the two doping levels are generally indicated by a dotted line. Dot-and-dash lines in cross-sectional views of IGFETs represent locations for dopant distributions in the vertical dopant-distribution graphs. Maximum dopant concentrations in cross-sectional views of IGFETs are indicated by dash- and double-dot lines containing the abbreviation "MAX".

The gate electrodes of the symmetric IGFETs shown in FIGS. 11.3-11.9 are, for convenience, all illustrated as being of the same length even though, as indicated by the channel-length values given below, the IGFETs of FIGS. 11.4, 11.5, and 11.7-11.9 are typically of considerably greater channel length than the IGFETs of FIGS. 11.3 and 11.6.

The letter "P" at the end of a reference symbol in a drawing representing a step in a fabrication process indicates a precursor to a region which is shown in a drawing representing a later stage, including the end, of the fabrication process and which is identified in that later-stage drawing by the portion of the reference symbol preceding "P".

DESCRIPTION OF THE PREFERRED EMBODIMENTS

List of Contents

A. Reference Notation and Other Preliminary Information
B. Complementary-IGFET Structures Suitable for Mixed-signal Applications
C. Well Architecture and Doping Characteristics
D. Asymmetric High-voltage IGFETs
 D1. Structure of Asymmetric High-voltage N-channel IGFET
 D2. Source/Drain Extensions of Asymmetric High-voltage N-channel IGFET
 D3. Different Dopants in Source/Drain Extensions of Asymmetric High-voltage N-channel IGFET
 D4. Dopant Distributions in Asymmetric High-voltage N-channel IGFET
 D5. Structure of Asymmetric High-voltage P-channel IGFET
 D6. Source/Drain Extensions of Asymmetric High-voltage P-channel IGFET
 D7. Different Dopants in Source/Drain Extensions of Asymmetric High-voltage P-channel IGFET
 D8. Dopant Distributions in Asymmetric High-voltage P-channel IGFET
 D9. Common Properties of Asymmetric High-voltage IGFETs
 D10. Performance Advantages of Asymmetric High-voltage IGFETs
 D11. Asymmetric High-voltage IGFETs with Specially Tailored Halo Pocket Portions
E. Extended-drain IGFETs
 E1. Structure of Extended-drain N-channel IGFET
 E2. Dopant Distributions in Extended-drain N-channel IGFET
 E3. Operational Physics of Extended-drain N-channel IGFET
 E4. Structure of Extended-drain P-channel IGFET
 E5. Dopant Distributions in Extended-drain P-channel IGFET
 E6. Operational Physics of Extended-drain P-channel IGFET
 E7. Common Properties of Extended-drain IGFETs
 E8. Performance Advantages of Extended-drain IGFETs
 E9. Extended-drain IGFETs with Specially Tailored Halo Pocket Portions
F. Symmetric Low-voltage Low-leakage IGFETs
 F1. Structure of Symmetric Low-voltage Low-leakage N-channel IGFET
 F2. Dopant Distributions in Symmetric Low-voltage Low-leakage N-channel IGFET
 F3. Symmetric Low-voltage Low-leakage P-channel IGFET
G. Symmetric Low-voltage Low-threshold-voltage IGFETs
H. Symmetric High-voltage IGFETs of Nominal Threshold-voltage Magnitude
I. Symmetric Low-voltage IGFETs of Nominal Threshold-voltage Magnitude
J. Symmetric High-voltage Low-threshold-voltage IGFETs
K. Symmetric Native Low-voltage N-channel IGFETs
L. Symmetric Native High-voltage N-channel IGFETs
M. Information Generally Applicable to All of Present IGFETs
N. Fabrication of Complementary-IGFET Structure Suitable for Mixed-signal Applications
 N1. General Fabrication Information
 N2. Well Formation
 N3. Gate Formation
 N4. Formation of Source/Drain Extensions and Halo Pocket Portions
 N5. Formation of Gate Sidewall Spacers and Main Portions of Source/Drain Zones
 N6. Final Processing
 N7. Significantly Tilted Implantation of P-type Deep Source/Drain-extension Dopant
 N8. Implantation of Different Dopants in Source/Drain Extensions of Asymmetric IGFETs
 N9. Formation of Asymmetric IGFETs with Specially Tailored Halo Pocket Portions
O. Vertically Graded Source-body and Drain-body Junctions
P. Asymmetric IGFETs with Doubly Implanted Source Extensions
 P1. Structure of Asymmetric N-channel IGFET with Multiply Implanted Source Extension
 P2. Fabrication of Asymmetric N-channel IGFET with Multiply Implanted Source Extension
Q. Hypoabrupt Vertical Dopant Profiles below Source-body and Drain-body Junctions
R. Nitrided Gate Dielectric Layers
 R1. Vertical Nitrogen Concentration Profile in Nitrided Gate Dielectric Layer
 R2. Fabrication of Nitrided Gate Dielectric Layers
S. Variations A. Reference Notation and Other Preliminary Information The reference symbols employed below and in the drawings have the following meanings where the adjective "lineal" means per unit IGFET width:

$I_D$=drain current
$I_{Dw}$=lineal drain current
$K_S$=relative permittivity of semiconductor material
k=Boltzmann's constant
L=channel length along upper semiconductor surface
$L_{DR}$=drawn value of channel length as given by drawn value of gate length
$L_K$=spacing length constant for extended-drain IGFET
$L_{WW}$=well-to-well separation distance for extended-drain IGFET $L_{WW0}$=offset spacing length for extended-drain IGFET
$N_C$=average net dopant concentration in channel zone
$N_I$=individual dopant concentration
$N_N$=net dopant concentration
$N_{N2}$=nitrogen concentration
$N_{N2low}$=low value of nitrogen concentration in gate dielectric layer
$N_{N2max}$=maximum value of nitrogen concentration n gate dielectric layer
$N_{N2top}$=nitrogen concentration along upper gate dielectric surface
$N_T$=total, or absolute, dopant concentration
N'=dosage of ions received by ion-implanted material
$N'_{max}$=maximum dosage of ions received by ion-implanted material in approximate one-quadrant implantation
$N'_1$=minimum dosage of ions received by ion-implanted material in one-quadrant implantation
$n_i$=intrinsic carrier concentration
q=electronic charge
$R_{DE}$=range of semiconductor dopant ion implanted to define drain extension
$R_{SE}$=range of semiconductor dopant ion implanted to define source extension
$R_{SHj}$=range of jth semiconductor dopant ion implanted to define jth source halo local concentration maximum in source-side halo pocket portion
T=absolute temperature
$t_{dmax}$=maximum thickness of surface depletion region
$t_{Gd}$=gate dielectric thickness
$t_{GdH}$=high value of gate dielectric thickness
$t_{GdL}$=low value of gate dielectric thickness
$t_{Sd}$=average thickness of surface dielectric layer
$V_{BD}$=drain-to-source breakdown voltage
$V_{BDmax}$=maximum value of drain-to-source breakdown voltage
$V_{BDmin}$=actual minimum value of drain-to-source breakdown voltage
$V_{BD0}$=theoretical minimum value of drain-to-source breakdown voltage
$V_{DS}$=drain-to-source voltage
$V_{GS}$=gate-to-source voltage
$V_T$=threshold voltage
X=longitudinal distance
$x_{DEOL}$=amount by which gate electrode overlaps drain extension
$x_{SEOL}$=amount by which gate electrode overlaps source extension
y=depth or vertical distance
$y_D$=maximum depth of drain
$y_{DE}$=maximum depth of drain extension
$y_{DEPK}$=average depth at location, in lateral drain extension, of maximum (peak) concentration of semiconductor dopant of same conductivity type as lateral drain extension
$y_{DL}$=maximum depth of lower drain portion
$y_{DM}$=maximum depth of main drain portion
$y_{DNWPK}$=average depth at location of maximum (peak) concentration of deep n well semiconductor dopant
$y_{FI}$=thickness (or depth) of recessed field-insulation region
$y_{II}$=depth of situs of maximum impact ionization
$y_{NW}$=depth at bottom of n-type empty main well
$y_{NWPK}$=average depth at location of maximum (peak) concentration of n-type empty main well semiconductor dopant
$y_{PW}$=depth at bottom of p-type empty main well
$y_{PWPK}$=average depth at location of maximum (peak) concentration of p-type empty main well semiconductor dopant
$y_S$=maximum depth of source
$y_{SD}$=maximum depth of source/drain zone
$y_{SE}$=maximum depth of source extension
$y_{SEPK}$=average depth at location, in lateral source extension, of maximum (peak) concentration of semiconductor dopant of same conductivity type as lateral source extension
$y_{SEPKD}$=average depth at location, in lateral source extension, of maximum (peak) concentration of deep source/drain-extension semiconductor dopant
$y_{SEPKS}$=average depth at location, in lateral source extension, of maximum (peak) concentration of shallow source/drain-extension semiconductor dopant
$y_{SH}$=maximum depth of source-side halo pocket portion
$y_{SHj}$=depth of jth source halo local concentration maximum in source-side halo pocket portion
$y_{SL}$=maximum depth of lower source portion
$y_{SM}$=maximum depth of main source portion
y'=depth below upper gate dielectric surface
$y'_{N2low}$=value of average depth below upper gate dielectric surface at low value of nitrogen concentration in gate dielectric layer
$y'_{N2max}$=value of average depth below upper gate dielectric surface at maximum value of nitrogen concentration in gate dielectric layer
y"=height above lower gate dielectric surface
α=general tilt angle from vertical for ion implanting semiconductor dopant
$α_{DE}$=tilt angle from vertical for ion implanting drain extension
$α_{SE}$=tilt angle from vertical for ion implanting source extension
$α_{SH}$=tilt angle from vertical for ion implanting source-side halo pocket portion
$α_{SHj}$=jth value of tilt angle $α_{SH}$ or tilt angle from vertical for ion implanting jth numbered source-side halo pocket dopant
β=azimuthal angle relative to one principal lateral direction of semiconductor body
$β_0$=base value of azimuthal angle increased in three 90° increments
$ΔR_{SHj}$=straggle in range of jth semiconductor dopant ion implanted to define jth source halo local concentration maximum in source-side halo pocket portion
$Δy_{DE}$=average thickness of monosilicon removed along top of precursor drain extension prior to ion implantation of semiconductor dopant that defines drain extension
$Δy_{SE}$=average thickness of monosilicon removed along top of precursor source extension prior to ion implantation of semiconductor dopant that defines source extension
$Δy_{SH}$=average thickness of monosilicon removed along top of precursor source-side halo pocket portion prior to ion implantation of semiconductor dopant that defines source-side halo pocket portion
$∈_0$=permittivity of free space (vacuum)
$φ_F$=Fermi potential
$φ_T$=inversion potential As used below, the term "surface-adjoining" means adjoining (or extending to) the upper semiconductor surface, i.e., the upper surface of a semiconductor body consisting of monocrystalline, or largely monocrystalline, semiconductor material. All references to depths into doped monocrystalline semiconductor material mean depths below the upper semiconductor surface except as otherwise indicated. Similarly, all references to one item extending deeper into monocrystalline semiconductor material than another item mean deeper in relation to the upper semiconductor surface except as otherwise indicated. Each depth or average depth of a location in a doped monocrystalline semiconductor region of an IGFET is, except as otherwise indicated, measured from a plane extending generally through the bottom of the IGFET's gate dielectric layer.

The boundary between two contiguous (or continuous) semiconductor regions of the same conductivity type is somewhat imprecise. Dashed lines are generally used in the drawings to indicate such boundaries. For quantitative purposes, the boundary between a semiconductor substrate region at the background dopant concentration and an adjoining semiconductor region formed by a doping operation to be of the same conductivity type as the substrate region is considered to be the location where the total dopant concentration is twice the background dopant concentration. The boundary between two contiguous semiconductor regions formed by doping operations to be of the same conductivity type is similarly considered to be the location where the total concentrations of the dopants used to form the two regions are equal.

Except as otherwise indicated, each reference to a semiconductor dopant or impurity means a p-type semiconductor dopant (formed with acceptor atoms) or an n-type semiconductor dopant (formed with donor atoms). The "atomic species" of a semiconductor dopant means the element which forms the dopant. In some case, a semiconductor dopant may consist of two or more different atomic species.

In regard to ion implantation of semiconductor dopant, the "dopant-containing particle species" means the particle (atom or molecule) which contains the dopant to be implanted and which is directed by the ion implantation equipment toward the implantation site. For example, elemental boron or boron difluoride can serve as the dopant-containing particle species for ion implanting the p-type dopant boron. The "particle ionization charge state" means the charge state, i.e., singly ionized, doubly ionized, and so on, of the dopant-containing particle species during the ion implantation.

The channel length L of an IGFET is the minimum distance between the IGFET's source/drain zones along the upper semiconductor surface. The drawn channel length $L_{DR}$ of an IGFET here is the drawn value of the IGFET's gate length. Inasmuch as the IGFET's source/drain zones invariably extend below the IGFET's gate electrode, the IGFET's channel length L is less than the IGFET's drawn channel $L_{DR}$.

An IGFET is characterized by two orthogonal lateral (horizontal) directions, i.e., two directions extending perpendicular to each other in a plane extending generally parallel to the upper (or lower) semiconductor surface. These two lateral directions are referred to here as the longitudinal and transverse directions. The longitudinal direction is the direction of the length of the IGFET, i.e., the direction from either of its S/D zones to the other of its S/D zones. The transverse direction is the direction of the IGFET's width.

The semiconductor body containing the IGFETs has two principal orthogonal lateral (horizontal) directions, i.e., two directions extending perpendicular to each other in a plane extending generally parallel to the upper (or lower) semiconductor surface. The IGFETs in an implementation of any of the present CIGFET structures are normally laid out on the semiconductor body so that the longitudinal direction of each IGFET extends in one of the semiconductor body's principal lateral directions. For instance, the longitudinal directions of some of the IGFETs can extend in one of the semiconductor body's principal lateral directions while the longitudinal directions of the other IGFETs extend in the other of the semiconductor body's principal lateral directions.

An IGFET is described below as symmetric when it is configured in largely a mirror-image manner along both of its source/drain zones and into the intervening channel zone. For instance, an IGFET having a separate halo pocket portion along each source/drain zone is typically described here as symmetric provided that the source/drain zones are, except possibly for their lengths, largely mirror images of each other. However, due to factors such as partial shadowing during ion implantation into the location of one of the halo pockets, the dopant profiles in the halo pockets along the upper semiconductor surface may not largely be mirror images. In such cases, there is typically some asymmetry in the IGFET's actual structure even though the IGFET is described as a symmetric device.

An IGFET, whether symmetric or asymmetric, has two biased states (or conditions) referred to as the "biased-on" and "biased-off" states in which a driving potential (voltage) is present between the S/D zone acting as the source and the S/D zone acting as the drain. For simplicity in explaining the two biased states, the source-acting and drain-acting S/D zones are respectively referred to here as the source and drain. In the biased-on state, the IGFET is conductive with voltage $V_{GS}$ between the IGFET's gate electrode and source at such a value that charge carriers flow freely from the source through the channel to the drain under the influence of the driving voltage. The charge carriers are electrons when the IGFET is of n-channel type and holes when the IGFET is of p-channel type.

The IGFET is non-conductive in the biased-off with gate-to-source voltage $V_{GS}$ at such a value that charge carriers do not significantly flow from the source through the channel to the drain despite the presence of the driving potential between the source and the drain as long as the magnitude (absolute value) of the driving potential is not high enough to cause IGFET breakdown. The charge carriers again are electrons for an n-channel IGFET and holes for a p-channel IGFET. In the biased-off state, the source and drain are thus biased so that the charge carriers would flow freely from the source through the channel to the drain if gate-to-source voltage $V_{GS}$ were at such a value as to place the IGFET in the biased-on state.

More specifically, an n-channel IGFET is in the biased-on state when (a) its drain is at a suitable positive potential relative to its source and (b) its gate-to-source voltage $V_{GS}$ equals or exceeds its threshold voltage $V_T$. Electrons then flow from the source through the channel to the drain. Since electrons are negative charge carriers, positive current flow is from the drain to the source. An n-channel IGFET is in the biased-off state when its drain is at a positive driving potential relative to its source but its gate-to-source voltage $V_{GS}$ is less than its threshold voltage $V_T$ so that there is no significant electron flow from the source through the channel to the drain as long as the positive driving potential is not high enough to cause drain-to-source breakdown. Threshold voltage $V_T$ is generally positive for an enhancement-mode n-channel IGFET and negative for a depletion-mode n-channel IGFET.

In a complementary manner, a p-channel IGFET is in the biased-on state when (a) its drain is at a suitable negative potential relative to its source and (b) its gate-to-source voltage $V_{GS}$ is less than or equals its threshold voltage $V_T$. Holes flow from the source through the channel to the drain. Inasmuch as holes are positive charge carriers, positive current flow is from the source to the drain. A p-channel IGFET is in the biased-off state when its drain is at a negative potential relative to its source but its gate-to-source voltage $V_{GS}$ is greater than its threshold voltage $V_T$ so that there is no significant flow of holes from the source through the channel to the drain as long as the magnitude of the negative driving potential is not high enough to cause drain-to-source breakdown. Threshold voltage $V_T$ is generally negative for an enhancement-mode p-channel IGFET and positive for a depletion-mode p-channel IGFET.

Charge carriers in semiconductor material generally mean both electrons and holes. References to charge carriers traveling in the direction of the local electric field mean that holes travel generally in the direction of the local electric field vector and that electrons travel in the opposite direction to the local electric field vector.

The expressions "maximum concentration" and "concentration maximum", as used here in singular or plural form, are generally interchangeable, i.e., have the same meaning except as otherwise indicated.

The semiconductor dopant which determines the conductivity type of the body material of an IGFET is conveniently denominated as the body-material dopant. When the IGFET employs a well region, the body-material dopant includes the semiconductor well dopant or dopants. The vertical dopant profile below a S/D zone of an IGFET is referred to as "hypoabrupt" when the concentration of the body-material dopant reaches a subsurface maximum along an underlying body-material location no more than 10 times deeper below the upper semiconductor surface than that S/D zone and decreases by at least a factor of 10 in moving from the subsurface location of the maximum concentration of the body-material dopant upward to that S/D zone, i.e., to the pn junction for that S/D zone, along an imaginary vertical line extending from the subsurface location of the maximum concentration of the body-material dopant through that S/D zone. See any of U.S. Pat. No. 7,419,863 B1 and U.S. Patent Publications 20080311717 and 20080308878 (all Bulucea). The pn junction for an S/D zone having an underlying hypoabrupt vertical dopant profile is, for simplicity, sometimes termed a hypoabrupt junction.

In a complementary manner, the vertical dopant profile below a S/D zone of an IGFET is referred to as "non-hypoabrupt" when the concentration of the body-material dopant reaches a subsurface maximum along an underlying body-material location no more than 10 times deeper below the upper semiconductor surface than that S/D zone but decreases by less than a factor of 10 in moving from the subsurface location of the maximum concentration of the body-material dopant upward to the pn junction for that S/D zone along an imaginary vertical line extending from the subsurface location of the maximum concentration of the body-material dopant through that S/D zone. The pn junction for an S/D zone having an underlying non-hypoabrupt vertical dopant profile is, for simplicity, sometimes referred to as a non-hypoabrupt junction.

B. Complementary-IGFET Structures Suitable for Mixed-Signal Applications

FIGS. 11.1-11.9 (collectively "FIG. 11") illustrate nine portions of a complementary-IGFET (again "CIGFET") semiconductor structure configured according to the invention so as to be especially suitable for mixed-signal applications. The IGFETs shown in FIG. 11 are designed to operate in three different voltage regimes. Some of the IGFETs operate across a voltage range of several volts, e.g., a nominal operational range of 3.0 V. These IGFETs are often referred to here as "high-voltage" IGFETs. Others operate across a lower voltage range, e.g., a nominal operational range of 1.2 V, and are analogously often referred to here as "low-voltage" IGFETs. The remaining IGFETs operate across a greater voltage range than the high-voltage and low-voltage IGFETs, and are generally referred to here as "extended-voltage" IGFETs. The operational range for the extended-voltage IGFETs is normally at least 10 V, e.g., nominally 12 V.

The IGFETs in FIG. 11 use gate dielectric layers of two different average nominal thicknesses, a high value $t_{GdH}$ and a low value $t_{GdL}$. The gate dielectric thickness for each of the high-voltage and extended-voltage IGFETs is high value $t_{GdH}$. For 3.0-V operation, high gate dielectric thickness $t_{GdH}$ is 4-8 nm, preferably 5-7 nm, typically 6-6.5 nm, when the gate dielectric material is silicon oxide or largely silicon oxide. The gate dielectric thickness for each of the low-voltage IGFETs is low value tam. For 1.2-V operation, low gate dielectric thickness $t_{GdL}$ is 1-3 nm, preferably 1.5-2.5 nm, typically 2 nm, likewise when the gate dielectric material is silicon oxide or largely silicon oxide. All of the typical numerical values given below for the parameters of the IGFETs of FIG. 11 generally apply to an implementation of the present CIGFET semiconductor structure in which the gate dielectric layers have the preceding typical thickness values.

Asymmetric IGFETs appear in FIGS. 11.1 and 11.2 while symmetric IGFETs appear in FIGS. 11.3-11.9. More particularly, FIG. 11.1 depicts an asymmetric high-voltage n-channel IGFET 100 and a similarly configured asymmetric high-voltage p-channel IGFET 102. Asymmetric IGFETs 100 and 102 are designed for unidirectional-current applications. An asymmetric extended-drain n-channel IGFET 104 and a similarly configured asymmetric extended-drain p-channel IGFET 106 are pictured in FIG. 11.2. Extended-drain IGFETs 104 and 106 constitute extended-voltage devices especially suitable for applications, such as power devices, high-voltage switches, electrically erasable programmable read-only memory ("EEPROM") programming circuitry, and electrostatic discharge ("ESD") protection devices, which utilize voltages greater than several volts. Due to its asymmetry, each IGFET 100, 102, 104, or 106 is normally used in situations where its channel-zone current flow is always in the same direction.

Moving to the symmetric IGFETs, FIG. 11.3 depicts a symmetric low-voltage low-leakage n-channel IGFET 108 and a similarly configured symmetric low-voltage low-leakage p-channel IGFET 110. The term "low-leakage" here means that IGFETs 108 and 110 are designed to have very low current leakage. A symmetric low-voltage n-channel IGFET 112 of low threshold-voltage magnitude and a similarly configured symmetric low-voltage p-channel IGFET 114 of low threshold-voltage magnitude are pictured in FIG. 11.4. Inasmuch as $V_T$ serves here as the symbol for threshold voltage, IGFETs 112 and 114 are often referred to as low-$V_T$ devices.

FIG. 11.5 depicts a symmetric high-voltage n-channel IGFET 116 of nominal $V_T$ magnitude and a similarly configured symmetric high-voltage p-channel IGFET 118 of nominal $V_T$ magnitude. A symmetric low-voltage n-channel IGFET 120 of nominal $V_T$ magnitude and a similarly configured symmetric low-voltage p-channel IGFET 122 of nominal $V_T$ magnitude are pictured in FIG. 11.6. FIG. 11.7 depicts a symmetric high-voltage low-$V_T$ n-channel IGFET 124 and a similarly configured symmetric high-voltage low-$V_T$ p-channel IGFET 126.

As described further below, asymmetric IGFETs 100 and 102 and symmetric IGFETs. 108, 110, 112, 114, 116, 118, 120, 122, 124, and 126 all variously use p-type and n-type wells. Some of the regions of extended-drain IGFETs 104 and 106 are defined by the dopant introductions used to form the p-type and n-type wells. Consequently, extended-drain IGFETs 104 and 106 effectively use p-type and n-type wells.

FIG. 11.8 depicts a pair of symmetric native low-voltage n-channel IGFETs 128 and 130. A pair of respectively corresponding symmetric native high-voltage n-channel IGFETs 132 and 134 are pictured in FIG. 11.9. The term "native" here means that n-channel IGFETs 128, 130, 132, and 134 do not use any wells. In particular, native n-channel IGFETs 128, 130, 132, and 134 are created directly from lightly doped p-type monosilicon that forms a starting region for the CIGFET structure of FIG. 11. IGFETs 128 and 132 are nominal-$V_T$ devices. IGFETs 130 and 134 are low-$V_T$ devices.

Threshold voltage $V_T$ of each of symmetric IGFETs 112, 114, 124, and 130 can be positive or negative. Accordingly, IGFETs 112, 114, 124, and 130 can be enhancement-mode (normally on) or depletion-mode (normally off) devices. IGFET 112 is typically an enhancement-mode device. IGFETs 114, 124, and 130 are typically depletion-mode devices. In addition, symmetric IGFETs 126 and 134 are depletion-mode devices.

In order to reduce the number of long chains of reference symbols, the group of IGFETs 100, 102, 104, 106, 108, 110, 112, 114, 116, 118, 120, 122, 124, 126, 128, 130, 132, and 134 illustrated in FIG. 11 is often referred to collectively here as the "illustrated" IGFETs without a listing of their reference symbols. A subgroup of the illustrated IGFETs is similarly often further identified here by a term that characterizes the subgroup. For instance, symmetric IGFETs 108, 110, 112, 114, 116, 118, 120, 122, 124, 126, 128, 130, 132, and 134 are often referred to simply as the illustrated symmetric IGFETs. Components of the illustrated IGFETs are similarly often referred to here as the components of the illustrated IGFETs without a listing of the reference symbols for the components. The same procedure is employed with components of subgroups of the illustrated IGFETs.

With the foregoing identification convention in mind, the illustrated symmetric IGFETs are all suitable for digital circuitry applications. Any of the illustrated symmetric IGFETs can, as appropriate, be employed in analog circuitry applications. The different features provided by the illustrated symmetric IGFETs enable circuit designers to choose IGFETs that best accommodate the needs of particular circuits.

Asymmetric IGFETs 100 and 102 and the illustrated symmetric IGFETs are, for convenience, all depicted as long-channel devices. However, any of these IGFETs can be implemented in short-channel versions, especially low-leakage IGFETs 108, 110, 120, and 122. In that event, the halo pocket portions (discussed further below) of the short-channel versions of symmetric IGFET 108, 110, 120, or 122 can merge together as described in U.S. Pat. No. 6,548,842, cited above.

No particular channel-length value generally separates the short-channel and long-channel regimes of IGFET operation or generally distinguishes a short-channel IGFET from a long-channel IGFET. A short-channel IGFET, or an IGFET operating in the short-channel regime, is simply an IGFET whose characteristics are significantly affected by short-channel effects. A long-channel IGFET, or an IGFET operating in the long-channel regime, is the converse of a short-channel IGFET. While the channel length value of approximately 0.4 μm roughly constitutes the boundary between the short-channel and long-channel regimes for the background art in U.S. Pat. No. 6,548,842, the long-channel/short-channel boundary can occur at a higher or lower value of channel length depending on various factors such as gate dielectric thickness, minimum printable feature size, channel zone dopant concentration, and source/drain-body junction depth.

Asymmetric IGFETs 100 and 102 are depicted in FIG. 11 as using a common deep n well (discussed further below) formed in a starting region of lightly doped p-type monosilicon. Alternatively, each IGFET 100 or 102 can be provided in a version that lacks a deep n well. In a preferred implementation, n-channel IGFET 100 uses a deep n well while p-channel IGFET 102 lacks a deep n well. Although none of the illustrated symmetric IGFETs is shown as using a deep n well, each of the illustrated non-native symmetric IGFETs can alternatively be provided in a version using a deep n well. When used for one of the illustrated non-native n-channel IGFETs, the deep n well electrically isolates the p-type body region of the n-channel IGFET from the underlying p-monosilicon. This enables that n-channel IGFET to be electrically isolated from each other n-channel IGFET. Extending a deep n well used for a non-native n-channel IGFET, such as IGFET 100, below an adjacent p-channel IGFET, such as IGFET 102 in the example of FIG. 11, typically enables the IGFET packing density to be increased.

The illustrated non-native IGFETs can alternatively be created from a starting region of lightly doped n-type monosilicon. In that event, the deep n wells can be replaced with corresponding deep p wells that perform the complementary functions to the deep n wells. The illustrated native n-channel IGFETs require a p-type starting monosilicon region and thus will not be present in the resulting CIGFET structure that uses an n– starting monosilicon region. However, each of the illustrated native n-channel IGFETs can be replaced with a corresponding native p-channel IGFET formed in the n– starting monosilicon.

The CIGFET structure of FIG. 11 may include lower-voltage versions of asymmetric high-voltage IGFETs 100 and 102 achieved primarily by suitably reducing the gate dielectric thickness and/or adjusting the doping conditions. All of the preceding comments about changing from a p– starting monosilicon region to an n– starting monosilicon region and using, or not using, deep p and n wells apply to these variations of IGFETs 100, 102, 104, and 106.

Circuit elements other than the illustrated IGFETs and the above-described variations of the illustrated IGFETs may be provided in other parts (not shown) of the CIGFET structure of FIG. 11. For instance, bipolar transistors and diodes along with various types of resistors, capacitors, and/or inductors may be provided in the present CIGFET structure. The bipolar transistors may be configured as described in U.S. patent application Ser. No. 12/382,967, cited above.

The resistors may be monosilicon or polysilicon elements. Depending on the characteristics of the additional circuit elements, the CIGFET structure also contains suitable electrical isolation for the additional elements. Selected ones of the illustrated IGFETs and their above-described variations are typically present in any particular implementation of the CIGFET structure of FIG. 11. In short, the architecture of the CIGFET structure of FIG. 11 provides IGFETs and other circuit elements suitable for mixed-signal IC applications.

C. Well Architecture and Doping Characteristics

The monosilicon elements of the illustrated IGFETs constitute parts of a doped monosilicon semiconductor body having a lightly doped p-type substrate region 136. A patterned field region 138 of electrically insulating material, typically consisting primarily of silicon oxide, is recessed into the upper surface of the semiconductor body. Field-insulation region 138 is depicted as being of the shallow trench isolation type in FIG. 11 but can be configured in other ways.

The recession of field-insulation region 138 into the upper semiconductor surface defines a group of laterally separated active semiconductor islands. Twenty such active islands 140, 142, 144A, 144B, 146A, 146B, 148, 150, 152, 154, 156, 158, 160, 162, 164, 166, 168, 170, 172, and 174 appear in FIG. 11. Non-extended drain IGFETs 100, 102, 108, 110, 112, 114, 116, 118, 120, 122, 124, 126, 128, 130, 132, and 134 respectively use islands 140, 142, 148, 150, 152, 154, 156, 158, 160, 162, 164, 166, 168, 170, 172, and 174. N-channel extended-drain IGFET 104 uses islands 144A and 144B. P-channel extended-drain IGFET 106 similarly uses islands 146A and 146B. In some embodiments, two or more of the IGFETs shown in FIG. 11 and the IGFET variations described above utilize one of the active islands. This occurs, for instance, when two or more of the IGFETs share an element such as a source or drain.

The semiconductor body contains main well regions 180, 182, 184A, 184B, 186A, 186B, 188, 190, 192, 194, 196, 198, 200, 202, 204, and 206, deep moderately doped n-type well regions 210 and 212, and an isolating moderately doped p-type well region 216. Electrical contact to the illustrated main well regions, deep n well regions 210 and 212, and substrate region 136 is made via additional laterally separated active semiconductor islands (not shown) defined along the upper semiconductor surface by field insulation 138.

Deep n well regions 210 and 212 respectively form isolating pn junctions 220 and 222 with p– substrate region 136. In so doing, deep n wells 210 and 212 extend deeper into the semiconductor body than the other well regions shown in FIG. 11. For this reason, main well regions 180, 182, 184A, 184B, 186A, 186B, 188, 190, 192, 194, 196, 198, 200, 202, 204, 206, and 216 can be considered shallow wells.

Main well regions 180, 184A, 188, 192, 196, 200, and 204 are p-type wells respectively for n-channel non-native IGFETs 100, 104, 108, 112, 116, 120, and 124. Main well region 186B is a p-type well for p-channel non-native IGFET 106. Main well regions 182, 186A, 190, 194, 198, 202, and 206 are n-type wells respectively for non-native p-channel IGFETs 102, 106, 110, 114, 118, 122, and 126. Main well region 184B is an n-type well for non-native n-channel IGFET 104.

For convenience, FIG. 11 depicts all of the illustrated main well regions as extending to the same depth into the semiconductor body. However, the depth of the illustrated p-type main wells can be slightly less than, or somewhat greater than the depth of the illustrated n-type main wells. Also, certain of the illustrated p-type main wells extend deeper into the semiconductor body than others depending on whether each illustrated p-type main well merges into p– substrate region 136 or meets a deep n well. Similarly, certain of the illustrated n-type main wells extend deeper into the semiconductor body than others depending on whether each illustrated n-type main well meets p– substrate region 136 or merges into a deep n well.

In regard to the depth of a doped monosilicon region that merges into a lower monosilicon region of the same conductivity type, the depth of the upper monosilicon region is considered to occur at the location where the concentration of the semiconductor dopant which defines the upper region equals the concentration of the semiconductor dopant which defines the lower region. The depth of an n-type main well region, such as n-type main well 182 or 186A, that merges into a deeper n-type well region, such as deep n well 210 or 212, thus occurs at the location where the concentrations of the n-type semiconductor dopants which define the two n-type wells are the same. When p– substrate region 136 is created from p-type monosilicon of a substantially uniform background dopant concentration, the depth of a p-type well region, such as p-type main well 184A, which merges into substrate region 136 occurs at the location where the p-type well dopant concentration is twice the p-type background dopant concentration.

P-type main well region 180 constitutes the body material, or body-material region, for asymmetric high-voltage n-channel IGFET 100 and forms an isolating pn junction 224 with deep n well region 210. See FIG. 11.1. N-type main well region 182 merges into deep n well 210. The combination of n-type main well 182 and deep n well 210 forms the body material, or body-material region, for asymmetric high-voltage p-channel IGFET 102.

In an embodiment (not shown) where deep n well 210 underlies p-type main well region 180 of n-channel IGFET 100 but does not extend below p-channel IGFET 102, p-type main well 180 again forms the body material (region) for n-channel IGFET 100. However, n-type main well 182 then solely constitutes the body material (region) for p-channel IGFET 102 and forms a pn junction with substrate region 136. In an embodiment (also not shown) fully lacking deep n well 210, the combination of p-type main well 180 and p– substrate region 136 forms the body material for n-channel IGFET 100 while n-type main well 182 again constitutes the body material for p-channel IGFET 102 and forms a pn junction with substrate region 136.

P-type main well region 184A merges into p– substrate region 136 as shown in FIG. 11.2. The combination of p-type main well 184A and p– substrate region 136 forms the body material, or body-material region, for extended-drain n-channel IGFET 104. N-type main well region 184B of IGFET 104 forms, as discussed further below, a drain-body pn junction 226 with substrate region 136.

N-type main well region 186A merges into deep n well region 212. The combination of n-type main well 186A and deep n well 212 forms the body material, or body-material region, for extended-drain p-channel IGFET 106. P-type main well region 186B of IGFET 106 forms, as discussed further below, part of a drain-body pn junction 228 with deep n well 212.

P well region 216 is situated below field-insulation region 138 and between n-type main well region 184B of IGFET 104 and deep n well region 212 of IGFET 106. Because IGFETs 104 and 106 operate at very high voltages and are adjacent to each other in the example of FIG. 11.2, p well 216 electrically isolates IGFETs 104 and 106 from each other. P well 216 can be deleted in embodiments where extended-drain IGFETs 104 and 106 are not adjacent to each other.

The combination of p-type main well region 188 and p– substrate region 136 forms the body material, or body-material region, for symmetric low-voltage low-leakage n-channel IGFET 108. See FIG. 11.3. N-type main well region 190 constitutes the body material, or body-material region, for symmetric low-voltage low-leakage p-channel IGFET 110 and forms an isolating pn junction 230 with substrate region 136.

The body material (region) for symmetric low-voltage low-$V_T$ n-channel IGFET 112 is similarly formed by the combination of p-type main well region 192 and p– substrate region 136. See FIG. 11.4. N-type main well region 194 constitutes the body material (region) for symmetric low-voltage low-$V_T$ p-channel IGFET 114 and forms an isolating pn junction 232 with substrate region 136.

The combination of p-type main well region 196 and p– substrate region 136 forms the body material (region) for symmetric high-voltage nominal-$V_T$ n-channel IGFET 116. See FIG. 11.5. N-type main well region 198 constitutes the body material (region) for symmetric high-voltage nominal-$V_T$ p-channel IGFET 118 and forms an isolating pn junction 234 with substrate region 136.

The body material (region) for symmetric low-voltage nominal-$V_T$ n-channel IGFET 120 is formed by the combination of p-type main well region 200 and p– substrate region 136. See FIG. 11.6. N-type main well region 202 constitutes the body material (region) for symmetric low-voltage nominal-$V_T$ p-channel IGFET 122 and forms an isolating pn junction 236 with substrate region 136.

The combination of p-type main well region 204 and p− substrate region 136 forms the body material (region) for symmetric high-voltage low-$V_T$ n-channel IGFET 124. See FIG. 11.7. N-type main well region 206 constitutes the body material (region) for symmetric high-voltage low-$V_T$ p-channel IGFET 126 and forms an isolating pn junction 238 with substrate region 136.

P− substrate region 136 solely constitutes the body material (region) for each of native n-channel IGFETs 128, 130, 132, and 134. See FIGS. 11.8 and 11.9.

Main well regions 180, 182, 184A, 184B, 186A, 186B, 192, 194, 204, and 206 are all empty retrograde wells. More particularly, p-type main well 180, 192, or 204 of n-channel IGFET 100, 112, or 124 is doped with p-type semiconductor dopant which is also present in that IGFET's S/D zones. The concentration of the p-type dopant (a) locally reaches a subsurface concentration maximum at a subsurface maximum concentration location extending laterally below largely all of each of the channel and S/D zones of IGFET 100, 112, or 124 and (b) decreases by at least a factor of 10, preferably by at least a factor of 20, more preferably by at least a factor of 40, in moving upward from the subsurface maximum concentration location along a selected vertical location through a specified one of that IGFET's S/D zones to the upper semiconductor surface. The subsurface location of the maximum concentration of the p-type dopant in p-type main well 180, 192, or 204 of IGFET 100, 112, or 124 occurs no more than 10 times, preferably no more than 5 times, more preferably no more than 4 times, deeper than the maximum depth of that IGFET's specified S/D zone.

As discussed further below, a p-type halo pocket portion is present along the source of asymmetric IGFET 100. The specified S/D zone for IGFET 100 is typically its drain but can be its source or drain in an variation of IGFET 100 lacking a p-type halo pocket portion along the source. The specified S/D zone can be either of the S/D zones for symmetric IGFET 112 or 114.

Additionally, the concentration of the p-type dopant decreases substantially monotonically, typically by less than a factor of 10, in moving from the subsurface maximum concentration location in p-type empty main well 180, 192, or 204 of n-channel IGFET 100, 112, or 124 along the selected vertical location for IGFET 100, 112, or 124 to its specified S/D zone. Since the subsurface location of the maximum concentration of the p-type dopant in p-type main well 180, 192, or 204 of IGFET 100, 112, or 124 occurs no more than 10 times deeper than the maximum depth of that IGFET's specified S/D zone, the dopant profile below the specified S/D zone of IGFET 100, 112, or 124 is typically non-hypoabrupt. The decrease in the concentration of the p-type dopant is normally substantially inflectionless, i.e., does not undergo any inflection, in moving from the subsurface maximum concentration location for IGFET 100, 112, or 124 along the selected vertical location for IGFET 100, 112, or 124 to its specified S/D zone.

The aforementioned local concentration maximum of the p-type dopant in p-type empty main well region 180, 192, or 204 of n-channel IGFET 100, 112, or 124 arises from the introduction of p-type semiconductor dopant, referred to here as the p-type empty main well dopant, into the semiconductor body. For asymmetric IGFET 100 having a p-type halo pocket portion, the halo pocket is produced by additional p-type semiconductor dopant, referred to here as the p-type source halo (or channel-grading) dopant, introduced into the semiconductor body so as to reach an additional local concentration maximum at a considerably lesser depth than the concentration maximum produced by the p-type empty main well dopant. In order to clearly distinguish these two p-type concentration maxima in p-type empty main well 180, the p-type concentration maximum produced by the p-type empty main well dopant is generally referred to here as the "deep" p-type empty-well concentration maximum in well 180. The p-type concentration maximum resulting from the p-type source halo dopant is, in a corresponding manner, generally referred to here as the "shallow" p-type empty-well concentration maximum in well 180. The p-type source halo dopant may also be referred to here as the p-type source-side halo pocket dopant or simply as the p-type source-side pocket dopant.

The p-type halo pocket of asymmetric n-channel IGFET 100 may reach its drain in a short-channel version of IGFET 100. However, no significant amount of p-type source halo dopant is normally present fully laterally across the drain regardless of whether IGFET 100 is implemented as the illustrated long-channel device or as a short-channel device. There is always an imaginary vertical line which extends through the drain of IGFET 100 and which has no significant amount of the p-type source halo dopant. Accordingly, the presence of the p-type halo pocket portion along the source of IGFET 100 does not prevent it from meeting the criteria that the concentration of the p-type dopant, i.e., the total p-type dopant, in p-type empty main well region 180 decrease by at least a factor of 10 in moving upward from the subsurface location of the deep p-type empty-well concentration maximum along a selected vertical location through a specified one of that IGFET's S/D zones to the upper semiconductor surface and that the concentration decrease of the total p-type dopant along the selected vertical location in p-type empty main well 180 normally be substantially monotonic and substantially inflectionless in moving from the subsurface location of the deep p-type empty-well concentration maximum along the selected vertical location to that IGFET's specified S/D zone.

In addition to meeting the aforementioned p-type well concentration criteria, the concentration of the total p-type dopant in p-type empty main well region 180, 192, or 204 of n-channel IGFET 100, 112, or 124 preferably decreases substantially monotonically in moving from the pn junction for the IGFET's specified S/D zone along the selected vertical location to the upper semiconductor surface. Some pile-up of p-type semiconductor dopant may occasionally occur along the upper surface of the specified S/D zone of IGFET 100, 112, or 124. If so, the concentration of the total p-type dopant in p-type empty main well 180, 192, or 204 decreases substantially monotonically in moving from the pn junction for the specified S/D zone along the selected vertical location to a point no further from the upper semiconductor surface than 20% of the maximum depth of the pn junction for the specified S/D zone.

Similar to the dopant concentration characteristics of p-type empty main well regions 180, 192, and 204, n-type empty main well region 182, 194, or 206 of p-channel IGFET 102, 114, or 126 is doped with n-type semiconductor dopant which is also present in that IGFET's S/D zones. The concentration of the n-type dopant (a) locally reaches a subsurface concentration maximum at a subsurface maximum concentration location extending laterally below largely all of each of the channel and S/D zones of IGFET 102, 114, or 126 and (b) decreases by at least a factor of 10, preferably by at least a factor of 20, more preferably by at least a factor of 40, in moving upward from the subsurface maximum concentration location along a selected vertical location through a specified one of that IGFET's S/D zones to the upper semiconductor surface. The subsurface location of the maximum concentration of the n-type dopant in n-type main well 182, 194, or 206 of IGFET 102, 114, or 126 occurs no more than 10 times, preferably no more than 5 times, more preferably no more than 4 times, deeper than the maximum depth of that IGFET's specified S/D zone.

An n-type halo pocket portion is, as discussed below, present along the source of asymmetric IGFET 102. The specified S/D zone for IGFET 102 is typically its drain but can be its source or drain in an variation of IGFET 102 lacking an n-type halo pocket portion along the source. The specified S/D zone can be either S/D zone for symmetric IGFET 114 or 116.

Also, the concentration of the n-type dopant decreases substantially monotonically, typically by less than a factor of 10, in moving from the subsurface maximum concentration location in n-type empty main well 182, 194, or 206 of p-channel IGFET 102, 114, or 126 along the selected vertical location for IGFET 102, 114, or 126 to its specified S/D zone. Consequently, the dopant profile below the specified S/D zone of IGFET 102, 114, or 126 is typically non-hypoabrupt. The decrease in the concentration of the n-type dopant is normally substantially inflectionless in moving from the subsurface maximum concentration location for IGFET 102, 114, or 126 along the selected vertical location for IGFET 102, 114, or 126 to its specified S/D zone.

The aforementioned local concentration maximum of the n-type dopant in n-type empty main well region 182, 194, or 206 of n-channel IGFET 102, 114, or 126 arises from the introduction of n-type semiconductor dopant, referred to here as the n-type empty main well dopant, into the semiconductor body. For asymmetric IGFET 102 having an n-type halo pocket portion, the n-type halo pocket is produced by additional n-type semiconductor dopant, referred to here as n-type source halo (or channel-grading) dopant, introduced into the semiconductor body so as to reach an additional local concentration maximum at a considerably lesser depth than the concentration maximum produced by the n-type empty main well dopant. In order to clearly distinguish these two n-type concentration maxima in n-type empty main well 182, the n-type concentration maximum produced by the n-type empty main well dopant is generally referred to here as the "deep" n-type empty-well concentration maximum in well 182. The n-type concentration maximum resulting from the n-type source halo dopant is, correspondingly, generally referred to here as the "shallow" n-type empty-well concentration maximum in well 182. The n-type source halo dopant may also be referred to here as the n-type source-side halo pocket dopant or simply as the n-type source-side pocket dopant.

The n-type halo pocket of asymmetric p-channel IGFET 102 may reach its drain in a short-channel version of IGFET 102. However, no significant amount of n-type source halo dopant is normally present fully laterally across the drain regardless of whether IGFET 100 is implemented in long-channel or short-channel form. There is always an imaginary vertical line which extends through the drain of IGFET 102 and which has no significant amount of the n-type source halo dopant. Accordingly, the presence of the n-type halo pocket portion along the source of IGFET 102 does not prevent it from meeting the criteria that the concentration of the n-type dopant, i.e., the total n-type dopant, in n-type empty main well region 182 decrease by at least a factor of 10 in moving upward from the subsurface location of the deep n-type concentration maximum along a selected vertical location through a specified one of that IGFET's S/D zones to the upper semiconductor surface and that the concentration decrease of the total n-type dopant along the selected vertical location in n-type empty main well 180 normally be substantially monotonic and substantially inflectionless in moving from the subsurface location of the deep n-type concentration maximum along the selected vertical location to that IGFET's specified S/D zone.

Besides meeting the aforementioned n-type well concentration criteria, the concentration of the total n-type dopant in n-type empty main well region 182, 194, or 206 of n-channel IGFET 102, 114, or 126 preferably decreases substantially monotonically in moving from the pn junction for the IGFET's specified S/D zone along the selected vertical location to the upper semiconductor surface. Some pile-up of n-type semiconductor dopant may occasionally occur along the top of the specified S/D zone of IGFET 102, 114, or 126. In that case, the concentration of the total n-type dopant in n-type empty main well 182, 194, or 206 decreases substantially monotonically in moving from the pn junction for the specified S/D zone along the selected vertical location to a point no further from the upper semiconductor surface than 20% of the maximum depth of the pn junction for the specified S/D zone.

Because main well regions 180, 182, 192, 194, 204, and 206 are empty wells, there is less total semiconductor dopant in the channel zones of IGFETs 100, 102, 112, 114, 124, and 126 than in the channel zones of otherwise comparable IGFETs that use filled main well regions. As a result, scattering of charge carriers (electrons for n-channel IGFETs and holes for p-channel IGFETs) due to collisions with dopant atoms occurs less in the crystal lattices of the channel zones of IGFETs 100, 102, 112, 114, 124, and 126 than in the crystal lattices of the otherwise comparable IGFETs having filled main wells. The mobilities of the charge carriers in the channel zones of IGFETs 100, 102, 112, 114, 124, and 126 are therefore increased. This enables asymmetric IGFETs 100 and 102 to have increased switching speed.

As to empty main well regions 184A, 184B, 186A, and 186B of extended-drain IGFETs 104 and 106, the concentration of the p-type semiconductor dopant in p-type empty main well 184A of n-channel IGFET 104 or p-type empty main well 186B of p-channel IGFET 106 (*a*) locally reaches a subsurface concentration maximum at a subsurface maximum concentration location in well 184A or 186B and (b) decreases by at least a factor of 10, preferably by at least a factor of 20, more preferably by at least a factor of 40, in moving upward from the subsurface maximum concentration location along a selected vertical location through that well 184A or 186B to the upper semiconductor surface. As discussed further below, the selected vertical location through well 184A for n-channel IGFET 104 is situated to the side of its halo pocket. The selected vertical location through well 186B for p-channel IGFET 106 extends through active island 146A. The concentration decrease of the p-type dopant along the selected vertical location in p-type main well 184A or 186B is normally substantially monotonic. The subsurface location of the maximum concentration of the p-type dopant in p-type main well 184A or 186B of IGFET 104 or 106 occurs no more than 10 times, preferably no more than 5 times, more preferably no more than 4 times, deeper than the maximum depth of that IGFET's source.

The aforementioned local concentration maxima of the p-type dopant in p-type empty main well regions 184A and 186B arise from the introduction of the p-type empty main well dopant into the semiconductor body. The concentration of the p-type dopant in each p-type empty main well 184A or 186B normally reaches an additional local concentration maximum at a considerably lesser depth than the concentration maximum produced by the p-type empty main well dopant in that well 184A or 186B. In order to clearly distinguish the two p-type concentration maxima in each main well 184A or 186B, the p-type concentration maximum produced by the p-type empty main well dopant in well 184A or 186B is generally referred to here as the "deep" p-type empty-well concentration maximum in that well 184A or 186B. The p-type concentration maximum produced by the additional p-type dopant in each main well 184A or 186B is, in a corresponding manner, generally referred to here as the "shallow" p-type empty-well concentration maximum in that well 184A or 186B.

The shallow p-type empty-well concentration maximum in each p-type empty main well region 184A or 186B arises from additional p-type empty-well semiconductor dopant introduced into that p-type empty main well 184A or 186B and extends only partially laterally across that well 184A or 186B. There is always an imaginary vertical line which extends through p-type well 184A or 186B and which has no significant amount of the additional p-type empty-well dopant. Hence, the presence of the additional p-type empty-well dopant in well 184A or 186B does not prevent it from satisfying the p-type empty-well criteria that the concentration of the p-type dopant, i.e., the total p-type dopant, in well 184A or 186B decrease by at least a factor of 10 in moving upward from the subsurface location of the deep p-type empty-well concentration maximum along a selected vertical location through that well 184A or 186B to the upper semiconductor surface and that the concentration decrease of the total p-type dopant along the selected vertical location in well 184A or 186B normally be substantially monotonic.

In a complementary manner, the concentration of the n-type semiconductor dopant in n-type empty main well region 184B of n-channel IGFET 104 or p-type empty main well region 186A of p-channel IGFET 106 similarly (a) locally reaches a subsurface concentration maximum at a subsurface maximum concentration location in empty main well 184B or 186A and (b) decreases by at least a factor of 10, preferably by at least a factor of 20, more preferably by at least a factor of 40, in moving upward from the subsurface maximum concentration location along a selected vertical location through that well 184B or 186A to the upper semiconductor surface. As discussed further below, the selected vertical location through well 184B for n-channel IGFET 104 extends through active island 144A. The selected vertical location through well 186A for p-channel IGFET 106 is situated to the side of its halo pocket. The concentration decrease of the n-type dopant along the selected vertical location in p-type main well 184B or 186A is normally, substantially monotonic. The subsurface location of the maximum concentration of the n-type dopant in n-type main well 184B or 186A of IGFET 104 or 106 occurs no more than 10 times, preferably no more than 5 times, more preferably no more than 4 times, deeper than the maximum depth of that IGFET's source. Examples of the vertical locations along which the p-type dopant in p-type well 184A or 186B and the n-type dopant in n-type well 184B or 186A reach these local concentration maxima are presented below in connection with FIGS. 22*a*, 22*b*, 23*a*-23*c*, and 24*a*-24*c*.

The aforementioned local concentration maxima of the n-type dopant in n-type empty main well regions 184B and 186A arise from the introduction of the n-type empty main well dopant into the semiconductor body. The concentration of the n-type dopant in each n-type empty main well 184B or 186A normally reaches an additional local concentration maximum at a considerably lesser depth than the concentration maximum produced by the n-type empty main well dopant in that well 184B or 186A. So as to clearly distinguish the two n-type concentration maxima in each main well 184B or 186A, the n-type concentration maximum produced by the n-type empty main well dopant in each well 184B or 186A is generally referred to here as the "deep" n-type empty-well concentration maximum in that well 184B or 186A. The n-type concentration maximum produced by the additional n-type dopant in each main well 184B or 186A is, correspondingly, generally referred to here as the "shallow" n-type empty-well concentration maximum in that well 184B or 186A.

The shallow n-type empty-well concentration maximum in each n-type empty main well region 184B or 186A arises from additional n-type empty-well semiconductor dopant introduced into that n-type empty main well 184B or 186A and extends only partially laterally across that well 184B or 186A. There is always an imaginary vertical line which extends through n-type well 184B or 186A and which has no significant amount of the additional n-type empty-well dopant. Consequently, the presence of the additional n-type empty-well dopant in well 184B or 186A does not prevent it from satisfying the n-type empty-well criteria that the concentration of the n-type dopant, i.e., the total n-type dopant, in well 184B or 186A decrease by at least a factor of 10 in moving upward from the subsurface location of the deep n-type empty-well concentration maximum along a selected vertical location through that well 184B or 186A to the upper semiconductor surface and that the concentration decrease of the total n-type dopant along the selected vertical location in well 184B or 186A normally be substantially monotonic.

The dash-and-double-dot lines marked "MAX" in FIG. 11.2 indicate the subsurface locations of (a) the p-type deep local concentration maxima in p-type empty main well regions 184A and 186B and (b) the n-type deep local concentration maxima in n-type empty main well regions 184B and 186A. As indicated by these lines, the deep n-type concentration maximum in n-type empty main well 184B of extended-drain n-channel IGFET 104 occurs at approximately the same depth as the deep p-type concentration maximum in that IGFET's p-type empty main well 184A. Likewise, the deep p-type concentration maximum in p-type empty main well 186B of extended-drain p-channel IGFET 106 occurs at approximately the same depth as the deep n-type concentration maximum in n-type empty main well 186A of IGFET 106.

Empty main well regions 184B and 186B respectively serve, as discussed further below, partially or fully as the drains of extended-drain IGFETs 104 and 106. By configuring main wells 184B and 186B as empty retrograde wells, the maximum value of the electric field in each of IGFETs 104 and 106 occurs in the bulk of the monosilicon rather than along the upper semiconductor surface as commonly arises in conventional extended-drain IGFETs. In particular, the maximum value of the electric field in each IGFET 104 or 106 occurs along the pn junction between the drain and body material at, or close to, the subsurface location of the aforementioned local concentration maximum of the main well dopant in well 184B or 186B. As a consequence, impact ionization occurs more in the bulk of the monosilicon, specifically in the bulk of the drain, of IGFET 104 or 106 rather than in the monosilicon along the upper semiconductor surface as commonly arises in conventional extended-drain IGFETs.

By generally shifting impact ionization to the bulk of the monosilicon, fewer charge carriers reach the upper semiconductor surface with sufficient energy to be injected into the gate dielectric layers of extended-drain IGFETs 104 and 106 than into the gate dielectric layers of conventional extended-drain IGFETs in which substantial impact ionization occurs in the monosilicon along the upper semiconductor surface. IGFETs 104 and 106 substantially avoid having their threshold voltages change due to charge injection into their gate dielectric layers. Accordingly, IGFETs 104 and 106 are of considerably enhanced reliability.

Figure 22A:
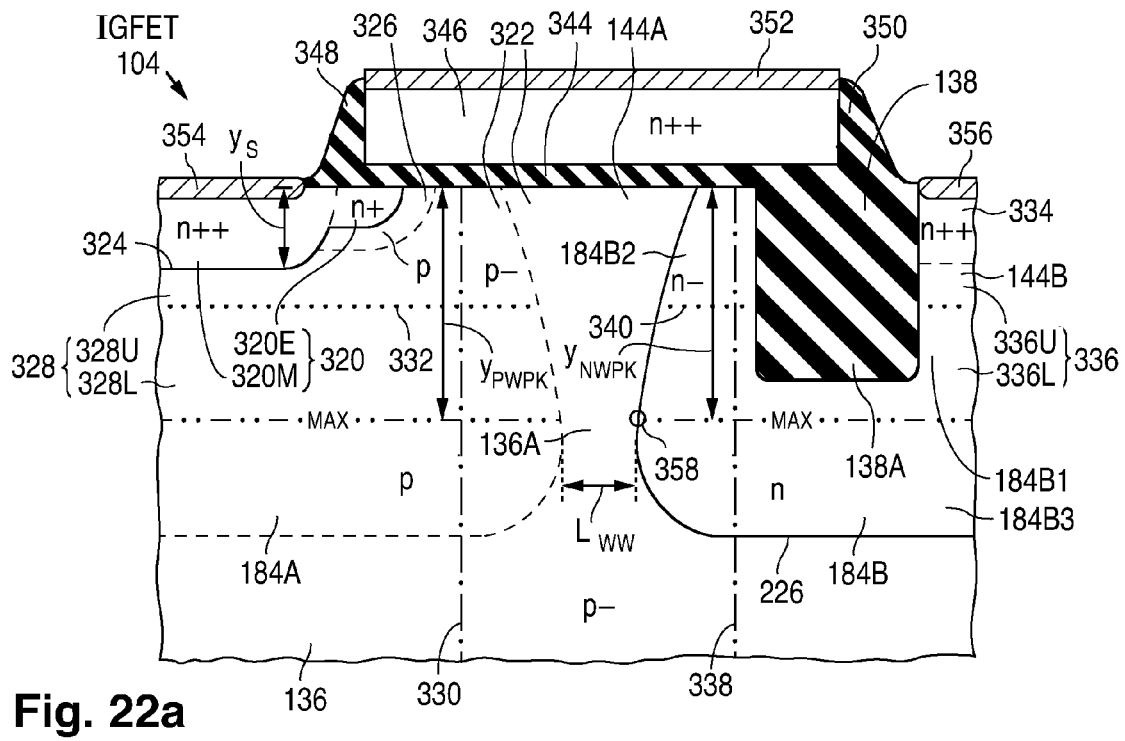
FIGS. 22a and 22b are respective expanded front cross-sectional views of the cores of the extended-drain n-channel and p-channel IGFETs of FIG. 11.2.
Figure 22B:
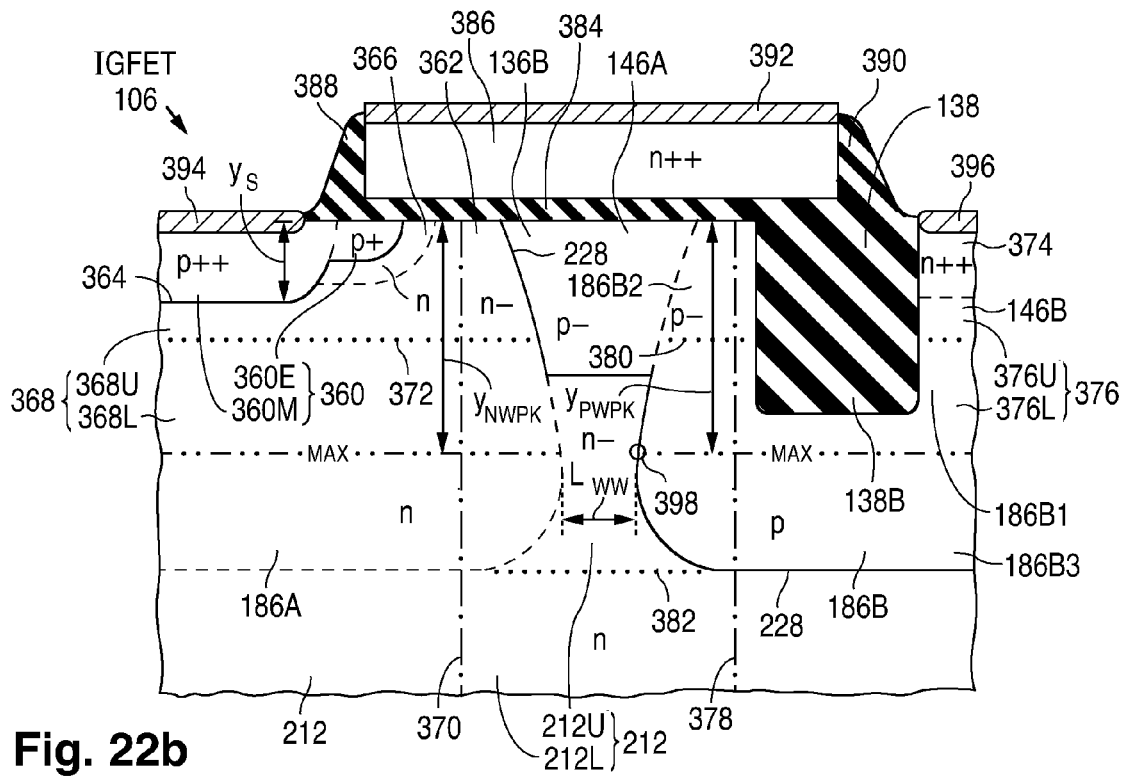

Additionally, empty main well regions 184A and 184B of n-channel IGFET 104 are preferably spaced apart from each other. The minimum spacing $L_{WW}$ between empty main wells 184A and 184B occurs approximately along an imaginary horizontal line extending from the location of the deep p-type concentration maximum in main well 184A to the location of the deep n-type concentration maximum in well 184B because the two concentration maxima occur at approximately the same depth. Empty main well regions 186A and 186B of p-channel IGFET 106 are likewise preferably spaced apart from each other. The minimum spacing $L_{WW}$ between empty main wells 186A and 186B similarly occurs approximately along an imaginary horizontal line extending from the location of the deep n-type concentration maximum in main well 186A to the location of the deep p-type concentration maximum in main well 186B since these two concentration maxima occur at approximately the same depth. The locations of minimum well-to-well spacings $L_{WW}$ for IGFETs are illustrated in FIGS. 22a and 22b discussed below.

The drain-to-source breakdown voltage $V_{BD}$ of extended-drain IGFET 104 or 106 depends on minimum well-to-well spacing $L_{WW}$. In particular, breakdown voltage $V_{BD}$ of IGFET 104 or 106 increases as well-to-well spacing $L_{WW}$ increases up to point at which breakdown voltage $V_{BD}$ reaches a saturation value. The increase in breakdown voltage $V_{BD}$ with spacing $L_{WW}$ is typically in the vicinity of 6 V/µm in a $V_{BD}/L_{WW}$ region of commercial interest as indicated below in connection with FIG. 27. The use of empty retrograde wells 184A and 184B in n-channel IGFET 104 or empty retrograde wells 186A and 186B in p-channel IGFET 106 thus provides a convenient way for controlling breakdown voltage $V_{BD}$ in the $V_{BD}/L_{WW}$ region of commercial interest.

Main well regions 188, 190, 196, 198, 200, and 202 are all filled wells. More specifically, p-type main well 188, 196, or 200 of symmetric n-channel IGFET 108, 116, or 120 contains p-type semiconductor dopant that (a) locally reaches a subsurface concentration maximum at a subsurface location extending laterally below largely all of each of that IGFET's channel and S/D zones and (b) decreases by less than a factor of 10 in moving upward from the subsurface location along any vertical location through each of that IGFET's S/D zones to the upper semiconductor surface. The subsurface location of the maximum concentration of the p-type dopant in p-type main well 188, 196, or 200 of IGFET 108, 116, or 120 occurs no more than 10 times, preferably no more than 5 times, more preferably no more than 4 times, deeper below the upper semiconductor surface than the maximum depth of each of that IGFET's S/D zones.

The foregoing local concentration maxima of the p-type dopant in p-type filled main well regions 188, 196, and 200 arise from the introduction of p-type semiconductor dopant, referred to here as the p-type filled main well dopant, into the semiconductor body. The concentration of the p-type dopant in each p-type filled main well 188, 196, or 200 reaches at least one additional local concentration maximum in that well 188, 196, or 200. Each additional p-type concentration in p-type well 188, 196, or 200 occurs at a considerably lesser depth than the concentration maximum resulting from the p-type filled main well dopant in that well 188, 196, or 200. In order to clearly distinguish the multiple p-type concentration maxima in each filled main well 188, 196, or 200, the p-type concentration maximum produced by the p-type filled main well dopant in well 188, 196, or 200 is generally referred to here as the "deep" p-type filled-well concentration maximum in that well 188, 196, or 200. Each additional p-type concentration maximum in each filled main well 188, 196, or 200 is, in a corresponding manner, generally referred to here as a "shallow" p-type filled-well concentration maximum in that well 188, 196, or 200.

Each p-type filled main well region 188, 196, or 200 normally has at least one shallow p-type filled-well concentration maximum that extends substantially fully laterally across that filled main well 188, 196, or 200. Accordingly, the p-type dopant profile along any imaginary vertical line through each p-type main well 188, 196, or 200 and through the deep p-type filled-well concentration maximum in that well 188, 196, or 200 has at least two local concentration maxima. Each shallow p-type filled-well concentration maximum in each p-type main well 188, 196, or 200 is produced by introduction of additional p-type filled-well semiconductor dopant into that well 188, 196, or 200. The additional p-type filled-well dopant "fills" each p-type main well 188, 196, or 200 substantially across its entire lateral extent so that each main well 188, 196, or 200 is a filled well.

P-type filled main well regions 188, 196, and 200 of symmetric n-channel IGFETs 108, 116, and 120 receive p-type semiconductor dopant, referred to here as the p-type anti-punchthrough ("APT") dopant, as additional p-type filled-well dopant. The maximum concentration of the p-type APT dopant normally occurs more than 0.1 µm below the upper semiconductor surface but not more than 0.4 µm below the upper semiconductor surface. In addition, the maximum concentration of the p-type APT dopant occurs below channel surface depletion regions that extend along the upper semiconductor surface into the channel zones of IGFETs 108, 116, and 120 during IGFET operation. By positioning the p-type APT dopant in this manner, the p-type APT dopant inhibits source-to-drain bulk punchthrough from occurring in IGFETs 108, 116, and 120, especially when their channel lengths are relatively short.

P-type semiconductor dopant, referred to here as the p-type threshold-adjust dopant, is also provided to p-type main filled well regions 188 and 196 of symmetric n-channel IGFETs 108 and 116 as additional p-type filled-well dopant. The maximum concentration of the p-type threshold-adjust dopant occurs at a lesser depth than the maximum concentration of the p-type APT dopant.

With threshold voltage $V_T$ of low-voltage n-channel IGFET 120 being at a nominal positive value, the p-type threshold-adjust dopant causes the positive threshold voltage of low-voltage IGFET 108 to exceed the nominal $V_T$ value of IGFET 120. The increased threshold voltage of low-voltage IGFET 108 enables it to have reduced current leakage in the biased-off state. IGFET 108 is thus particularly suitable for low-voltage applications that require low-off state current leakage but can accept increased threshold voltage.

Low-voltage IGFET 120 of nominal threshold voltage is a companion to low-voltage low-leakage IGFET 108 because both of them receive the p-type APT dopant for inhibiting source-to-drain bulk punchthrough. However, IGFET 120 does not receive the p-type threshold-adjust dopant. Hence, IGFET 120 is especially suitable for low-voltage applications that require moderately low threshold voltage but do not require extremely low off-state current leakage.

Symmetric low-voltage IGFETs 108 and 120 are also companions to symmetric low-voltage low-$V_T$ n-channel IGFET 112 which lacks both the p-type APT dopant and the p-type threshold-adjust dopant. With its low threshold voltage, IGFET 112 is particularly suitable for use in low-voltage situations where IGFETs are always on during circuitry operation. In order to avoid punchthrough and excessive current leakage, IGFET 112 is of appropriately greater channel length than IGFET 120 or 108.

The p-type threshold-adjust dopant sets threshold voltage $V_T$ of symmetric high-voltage IGFET 116 at a nominal value suitable for high-voltage applications. IGFET 116 is a companion to symmetric high-voltage low-$V_T$ n-channel IGFET 124 which lacks both the p-type APT dopant and the p-type threshold-adjust dopant. As with using IGFET 112 in low-voltage situations, the low threshold voltage of IGFET 124 makes it especially suitable for use in high-voltage situations where IGFETs are always on during circuitry operation. IGFET 124 is of appropriately greater channel length than IGFET 116 in order to avoid punchthrough and excessive current leakage.

Analogous to what is said above about p-type filled main well regions 188, 196, and 200 of IGFETs 108, 116, and 120, n-type filled main well region 190, 198, or 202 of symmetric p-channel IGFET 110, 118, or 122 contains n-type semiconductor dopant that (a) locally reaches a subsurface concentration maximum at a subsurface location extending laterally below largely all of each of that IGFET's channel and S/D zones and (b) decreases by less than a factor of 10 in moving upward from the subsurface location along any vertical location through each of that IGFET's S/D zones to the upper semiconductor surface. The subsurface location of the maximum concentration of the n-type dopant in n-type filled main well 190, 198, or 202 of IGFET 110, 118, or 122 occurs no more than 10 times, preferably no more than 5 times, more preferably no more than 4 times, deeper than the maximum depth of each of that IGFET's S/D zones.

The foregoing local concentration maxima of the n-type dopant in n-type filled main well regions 190, 198, and 202 arise from n-type semiconductor dopant, referred to as the n-type filled main well dopant, introduced into the semiconductor body. The concentration of the n-type dopant in each n-type filled main well 190, 198, and 202 reaches at least one additional local concentration maximum in that well 190, 198, and 202. Each additional n-type concentration in n-type well 190, 198, and 202 occurs at a considerably lesser depth than the concentration maximum resulting from the n-type filled main well dopant in that well 190, 198, and 202. So as to clearly distinguish the multiple n-type concentration maxima in each filled main well 190, 198, and 202, the n-type concentration maximum produced by the n-type filled main well dopant in well 190, 198, and 202 is generally referred to here as the "deep" n-type filled-well concentration maximum in that well 190, 198, and 202. Each additional n-type concentration maximum in each filled main well 190, 198, and 202 is, correspondingly, generally referred to here as a "shallow" n-type filled-well concentration maximum in that well 190, 198, and 202.

Each n-type filled main well region 190, 198, and 202 normally has at least one shallow n-type filled well concentration maximum that extends substantially fully laterally across that filled main well 190, 198, and 202. Hence, the n-type dopant profile along any imaginary vertical line through each n-type main well 190, 198, and 202 and through the deep n-type filled-well concentration maximum in that well 190, 198, and 202 has at least two local concentration maxima. Each shallow n-type filled-well concentration maximum in each n-type main well 190, 198, and 202 is produced by introducing additional n-type filled-well semiconductor dopant into that well 190, 198, and 202. The additional n-type filled-well dopant "fills" each n-type main well 190, 198, and 202 substantially across its entire lateral extent so that each main well 190, 198, and 202 is a filled well.

N-type filled main well regions 190, 198, and 202 of symmetric p-channel IGFETs 110, 118, and 122 receive n-type semiconductor dopant, referred to here as the n-type APT dopant, as additional n-type filled-well dopant. The maximum concentration of the n-type APT dopant normally occurs more than 0.1 μm below the upper semiconductor surface but not more than 0.4 μm below the upper semiconductor surface. Further, the maximum concentration of the n-type APT dopant occurs below channel surface depletion regions that extend along the upper semiconductor surface into the channel zones of IGFETs 110, 118, and 122 during IGFET operation. Positioning the n-type APT dopant in this way inhibits source-to-drain bulk punchthrough from occurring in IGFETs 110, 118, and 122, especially when they are of relatively short channel length.

N-type semiconductor dopant, referred to here as the n-type threshold-adjust dopant, is also furnished to n-type filled main well regions 190 and 198 of n-channel IGFETs 110 and 118 as additional n-type filled-well dopant. The maximum concentration of the n-type threshold adjust dopant occurs at a lesser depth than the maximum concentration of the n-type APT dopant.

With threshold voltage $V_T$ of low-voltage p-channel IGFET 122 being at a nominal negative value, the n-type threshold-adjust dopant causes the magnitude of the negative threshold voltage of low-voltage low-leakage IGFET 110 to exceed the magnitude of the nominal $V_T$ value of IGFET 122. The increased $V_T$ magnitude of IGFET 110 enables it to have reduced current leakage in the biased-off state. Hence, IGFET 110 is particularly suitable for low-voltage applications that necessitate low-off state current leakage but can accept threshold voltage of increased magnitude.

Low-voltage IGFET 122 of nominal threshold voltage is a companion to low-voltage IGFET 110 because both of them receive the n-type APT dopant for inhibiting source-to-drain bulk punchthrough. However, IGFET 122 does not receive the n-type threshold-adjust dopant. As a result, IGFET 122 is especially suitable for low-voltage applications that require moderately low $V_T$ magnitude but do not require extremely low off-state current leakage.

Symmetric low-voltage IGFETs 110 and 122 are also companions to symmetric low-voltage low-$V_T$ p-channel IGFET 114 which lacks both the n-type APT dopant and the n-type threshold-adjust dopant. Due to the low magnitude of its threshold voltage, IGFET 114 is particularly suitable for use in low-voltage situations in which IGFETs are always on during circuitry operation. To avoid punchthrough and excessive current leakage, IGFET 114 is of appropriately greater channel length than IGFET 122 or 110.

The n-type threshold-adjust dopant sets threshold voltage $V_T$ of symmetric high-voltage IGFET 118 at a nominal value suitable for high-voltage applications. IGFET 118 is a companion to symmetric high-voltage low-$V_T$ p-channel IGFET 126 which lacks both the n-type APT dopant and the n-type threshold-adjust dopant. Similar to what was said about IGFET 114 for low-voltage situations, the low magnitude of the threshold voltage of IGFET 126 makes it especially suitable for use in high-voltage situations where IGFETs are always on during circuitry operation. IGFET 126 is of appropriately greater channel length than IGFET 118 in order to avoid punchthrough and excessive current leakage.

Symmetric native low-voltage n-channel IGFETs 128 and 130 are suitable for low-voltage applications. In a complementary manner, symmetric native high-voltage n-channel IGFETs 132 and 134 are suitable for high-voltage applications. Native IGFETs 128, 130, 132, and 134 typically have excellent matching and noise characteristics.

The following table summarizes the typical application areas, primary voltage/current characteristics, identification numbers, polarities, symmetry types, and main well types, for the eighteen illustrated IGFETs where "Comp" means complementary, "Asy" means asymmetric, and "Sym" means symmetric:

| Typical Application Areas | Voltage/current Characteristics | IGFET(s) | Polarity | Symmetry | Main Well(s) |
|---|---|---|---|---|---|
| High-speed input/output stages | High-voltage unidirectional | 100 and 102 | Comp | Asy | Empty |
| Power, high-voltage switching, EEPROM programming, and ESD protection | Extended-voltage unidirectional | 104 and 106 | Comp | Asy | Empty |
| Low-voltage digital circuitry with low current leakage | Low-voltage high-$V_T$ bidirectional | 108 and 110 | Comp | Sym | Filled |
| Low-voltage high-speed digital circuitry in always-on situations | Low-voltage low-$V_T$ bidirectional | 112 and 114 | Comp | Sym | Empty |
| Transmission gates in input/output digital stages | High-voltage nominal-$V_T$ bidirectional | 116 and 118 | Comp | Sym | Filled |
| General low-voltage digital circuitry | Low-voltage nominal-$V_T$ bidirectional | 120 and 122 | Comp | Sym | Filled |
| Transmission gates in input/output digital stages in always-on situations | High-voltage low-$V_T$ bidirectional | 124 and 126 | Comp | Sym | Empty |
| General low-voltage class A circuitry | Low-voltage nominal-$V_T$ bidirectional | 128 | N-channel | Sym | None |
| High-speed low-voltage class A circuitry in always-on situations | Low-voltage low-$V_T$ bidirectional | 130 | N-channel | Sym | None |
| General high-voltage class A circuitry | High-voltage nominal-$V_T$ bidirectional | 132 | N-channel | Sym | None |
| High-speed high-voltage class A circuitry in always-on situations | High-voltage low-$V_T$ bidirectional | 134 | N-channel | Sym | None |

In addition providing two types of asymmetric complementary IGFET pairs, the present CIGFET structure provides symmetric complementary IGFET pairs in all four combinations of well type and low-voltage/high-voltage operational range. Symmetric complementary IGFETs 108 and 110 and symmetric complementary IGFETs 120 and 122 are low-voltage filled-well devices. Symmetric complementary IGFETs 112 and 114 are low-voltage empty-well devices. Symmetric complementary IGFETs 116 and 118 are high-voltage filled-well devices. Symmetric IGFETs 124 and 126 are high-voltage empty-well devices. The CIGFET structure of the present invention thus furnishes a designer of a mixed-signal IC with a broad group of IGFETs, including the above-described variations of asymmetric IGFETs 100 and 102 lacking deep n wells and the above-described variations of the non-native symmetric IGFETs having deep n wells, which enable the IC designer to choose an IGFET that well satisfies each circuitry need in the mixed-signal IC.

A full description of the process for manufacturing the CIGFET of the invention is presented in the fabrication process section below. Nonetheless, in completing the basic description of the well regions used in the present CIGFET structure, the p-type deep local concentration maxima of p-type empty main well regions 180, 184A, and 186B and the p-type concentration maxima of p-type empty main well regions 192 and 204 are normally substantially defined simultaneously by selectively ion implanting the p-type empty main well dopant, typically boron, into the semiconductor body. Consequently, the p-type deep local concentration maxima of p-type empty main wells 180, 184A, and 186B and the p-type concentration maxima of p-type empty main wells 192 and 204 occur at approximately the same average depth $y_{PWPK}$.

The p-type empty main well maximum dopant concentration at average depth $y_{PWPK}$ in p-type empty main well region 180, 184A, 186B, 192, or 204 is normally $4 \times 10^{17} - 1 \times 10^{18}$ atoms/cm$^3$, typically $7 \times 10^{17}$ atoms/cm$^3$. Average p-type empty main well maximum concentration depth $y_{PWPK}$ is normally 0.4-0.7 μm, typically 0.5-0.55 μm.

None of empty-well n-channel IGFETs 100, 112, and 124 uses a deep p well region. The p-type empty main well subsurface maximum concentration for n-channel IGFET 100, 112, or 124 is therefore substantially the only local subsurface concentration maximum of the total p-type dopant concentration in moving from the p-type empty main well subsurface maximum concentration location at average p-type empty main well maximum concentration depth $y_{PWPK}$ for IGFET 100, 112, or 124 vertically down to a depth y of at least 5 times, normally at least 10 times, preferably at least 20 times, depth $y_{PWPK}$ for IGFET 100, 112, or 124.

Each empty-well n-channel IGFET 100, 112, or 124 can alternatively be provided in a variation that uses a deep p well region defined with p-type semiconductor dopant, referred to here as the deep p well dopant, whose concentration locally reaches a p-type further subsurface maximum concentration at a further subsurface maximum concentration location extending laterally below largely all of that IGFET's channel zone and normally also below largely all of each of that IGFET's S/D zones but which does not materially affect the essential empty-well nature of that IGFET's p-type empty well region 180, 192, or 204. The local further subsurface maximum concentration location of the deep p well dopant occurs in empty main well 180, 192, or 204 at an average value of depth y greater than p-type average empty main well maximum concentration depth $y_{PWPK}$ in that empty main well 180, 192, or 204.

The average depth of the maximum p-type dopant concentration of the deep p well dopant is normally no greater than 10 times, preferably no greater than 5 times, average p-type empty main well maximum concentration depth $y_{PWPK}$. The deep p well dopant causes the total p-type concentration at any depth y less than $y_{PWPK}$ in empty main well 180, 192, or 204 to be raised no more than 25%, normally no more than 10%, preferably no more than 2%, more preferably no more than 1%, typically no more than 0.5%.

The n-type deep local concentration maxima of n-type empty main well regions 182, 184B, and 186A and the n-type concentration maxima of n-type empty main well regions 194 and 206 are normally defined substantially simultaneously by selectively ion implanting the n-type empty main well dopant, typically phosphorus, into the semiconductor body. Hence, the n-type deep local concentration maxima of n-type empty main wells 182, 184B, and 186A and the n-type concentration maxima of n-type empty main wells 194 and 206 occur at approximately the same average depth $y_{NWPK}$.

The n-type empty main well maximum dopant concentration at average depth $y_{NWPK}$ in n-type empty main well region 182, 184B, 186A, 194 or 206 is normally $3 \times 10^{17} - 1 \times 10^{18}$ atoms/cm$^3$, typically $6 \times 10^{17}$ atoms/cm$^3$. Average n-type empty main well maximum concentration depth $y_{NWPK}$ is normally 0.4-0.8 µm, typically 0.55-0.6 µm. Hence, average n-type empty main well maximum concentration depth $y_{NWPK}$ in n-type empty main well 182, 184B, 186A, 194 or 206 is typically slightly greater than average p-type empty main well maximum concentration depth $y_{PWPK}$ in p-type empty main well region 180, 184A, 186B, 192, and 204.

Neither of symmetric empty-well p-channel IGFETs 114 and 126 uses a deep n well region in the example of FIG. 11. Deep n well region 210 can, as mentioned above, be deleted in a variation of asymmetric empty-well IGFETs 100 and 102. For p-channel IGFETs 114 and 126 in the present example and for that variation of asymmetric IGFETs 100 and 102, the n-type empty main well subsurface maximum concentration for p-channel IGFET 102, 114, or 126 is substantially the only local subsurface concentration maximum of the total n-type dopant concentration in moving from the n-type empty main well subsurface maximum concentration location at average n-type empty main well maximum concentration depth $y_{NWPK}$ for IGFET 102, 114, or 126 vertically down to a depth y of at least 5 times, normally at least 10 times, preferably at least 20 times, depth $y_{NWPK}$ for IGFET 102, 114, or 126.

Deep n well regions 210 and 212 are normally defined substantially simultaneously by selectively ion implanting n-type semiconductor dopant, referred to here as the deep n well dopant, into the semiconductor body. As a result, deep n wells 210 and 212 reach n-type local concentration maxima at the same average depth $y_{DNWPK}$. The deep n well dopant is typically phosphorus.

The maximum concentration of the deep n well dopant in deep n well regions 210 and 212 occurs considerably deeper into the semiconductor body than the maximum concentration of the n-type empty main well dopant in n-type empty main well regions 182, 184B, 186A, 194, and 206. Average depth $y_{DNWPK}$ of the maximum concentration of the deep n well dopant in deep n wells 210 and 212 is normally no greater than 10 times, preferably no greater than 5 times, average depth $y_{NWPK}$ of the n-type deep local concentration maxima of n-type empty main wells 182, 184B, and 186A and the n-type concentration maxima of n-type empty main wells 194 and 206. More particularly, average deep n well maximum concentration depth $y_{DNWPK}$ is normally 1.5-5.0 times, preferably 2.0-4.0 times, typically 2.5-3.0 times, average n-type empty main well maximum concentration depth $y_{NWPK}$.

Additionally, average depth $y_{DNWPK}$ and the maximum concentration of the deep n well dopant in deep n well regions 210 and 212 are of such values that the presence of the deep n well dopant normally has no more than a minor effect on the total (absolute) n-type concentration in empty main well region 182 of asymmetric p-channel IGFET 102 at any depth y less than average n-type empty main well maximum concentration depth $y_{NWPK}$ and on the total (absolute) n-type concentration in empty main well region 186A of extended-drain p-channel IGFET 106 at any depth y less than $y_{NWPK}$. In particular, the deep n well dopant causes the total n-type concentration at any depth y less than $y_{NWPK}$ in empty main well 182 or 186A to be raised no more than 25%, normally no more than 10%.

More specifically, the presence of the deep n well dopant normally has no significant effect on the total (absolute) n-type concentration in empty main well region 182 of asymmetric p-channel IGFET 102 at any depth y less than average n-type empty main well maximum concentration depth $y_{NWPK}$ and on the total (absolute) n-type concentration in empty main well region 186A of extended-drain p-channel IGFET 106 at any depth y less than $y_{NWPK}$. The total n-type concentration at any depth y less than $y_{NWPK}$ in empty main well 182 or 186A is preferably raised no more than 2%, more preferably no more than 1%, typically no more than 0.5%, due to the deep n well dopant. The same applies to a variation of symmetric p-channel IGFET 114 or 126 provided with a deep n well region below empty main well region 194 or 206.

The deep n well maximum dopant concentration at average depth $y_{DNWPK}$ in deep well region 210 or 212 is normally $1 \times 10^{17} - 4 \times 10^{17}$ atoms/cm$^3$, typically $2 \times 10^{17}$ atoms/cm$^3$. Average deep n well maximum concentration depth $y_{DNWPK}$ is normally 1.0-2.0 µm, typically 1.5 µm.

The p-type deep local concentration maxima of p-type filled main well regions 188, 196, and 200 are normally defined substantially simultaneously by selectively ion implanting the p-type filled main well dopant, typically boron, into the semiconductor body. For structural simplicity, the concentration maximum of the p-type filled main well dopant is typically arranged to be at approximately the same average depth $y_{PWPK}$ as the concentration maximum of the p-type empty main well dopant. When the p-type empty and filled main well implantations are done with the same p-type dopant using the same dopant-containing particles species at the same ionization charge state, the p-type filled main well implantation is then performed at approximately the same implant energy as the p-type empty-well implantation. The two p-type main well implantations are also normally done at approximately the same implant dosage.

The n-type deep local concentration maxima of n-type filled main well regions 190, 198, and 202 are similarly normally defined substantially simultaneously by selectively ion implanting the n-type filled main well dopant, typically phosphorus, into the semiconductor body. The concentration maximum of the n-type filled main well dopant is, for structural simplicity, typically arranged to be at approximately the same average depth $y_{NWPK}$ as the concentration maximum of the n-type empty main well dopant. In the typical case where the n-type empty and filled main well implantations are done with the same n-type dopant using the same dopant-containing particles species at the same ionization charge state, the n-type filled main well implantation is thereby performed at approximately the same implant energy as the n-type empty-well implantation. The two n-type main well implantations are also normally done at approximately the same implant dosage.

The five well implantations, along with any further p-type or n-type well implantation, are performed after formation of field-insulation region 138 and can generally be done in any order.

Each source/drain zone of asymmetric IGFETs 100 and 102 and the illustrated symmetric IGFETs is typically provided with a vertically graded junction. That is, each source/drain zone of IGFETs 100 and 102 and the illustrated symmetric IGFETs typically includes a very heavily doped main portion and a more lightly doped, but still heavily doped, lower portion that underlies and is vertically continuous with the main portion. The same applies to the sources and the drain contact zones of extended-drain IGFETs 104 and 106. The heavily doped lower portions that provide the vertically graded junction features are, for simplicity in explanation, not described in the following sections on asymmetric high-voltage IGFETs, extended-drain IGFETs, symmetric IGFETs, information generally applicable to all the IGFETs, and fabrication of the present CIGFET structure. Nor are these heavily doped lower portions illustrated in the drawings accompanying those five sections. Instead, vertically graded junctions are dealt with separately below in connection with the vertically graded junction variations of IGFETs shown in FIGS. 34.1-34.3.

D. Asymmetric High-Voltage IGFETs

D1. Structure of Asymmetric High-Voltage N-Channel IGFET

Figure 12:
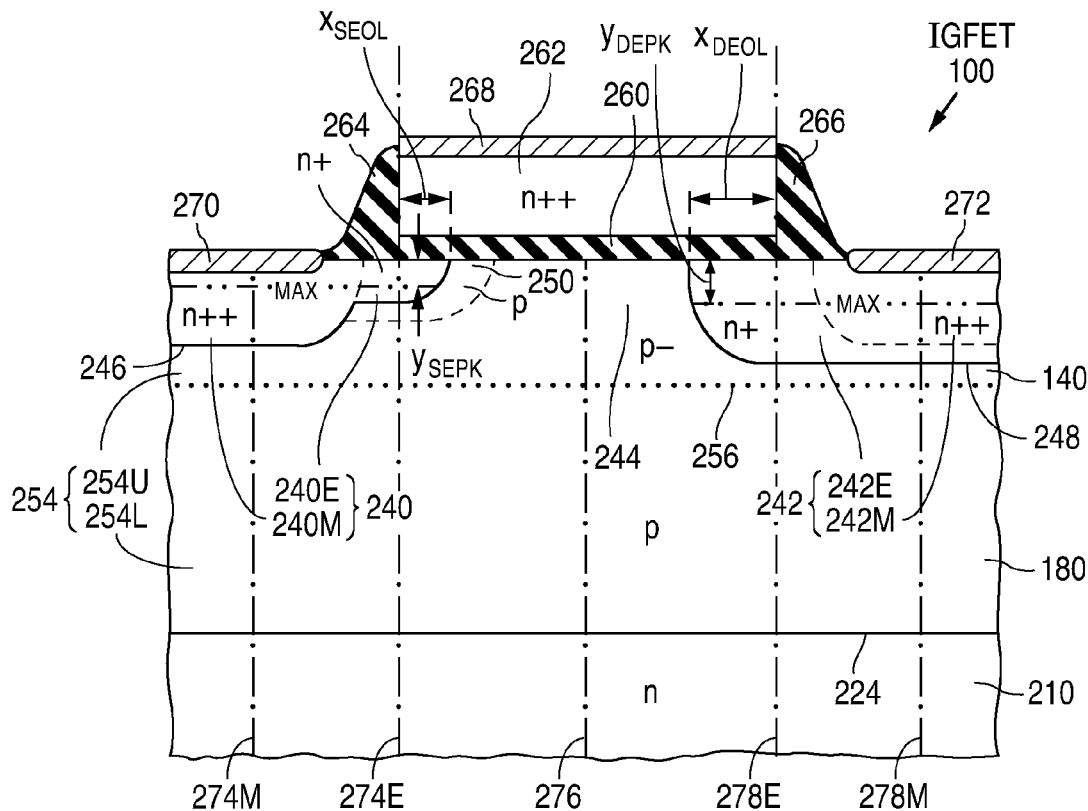
FIG. 12 is an expanded front cross-sectional view of the core of the asymmetric n-channel IGFET of FIG. 11.1.

The internal structure of asymmetric high-voltage empty-well complementary IGFETs 100 and 102 is now described. Beginning with n-channel IGFET 100, an expanded view of the core of IGFET 100 as depicted in FIG. 11.1 is shown in FIG. 12. IGFET 100 has a pair of n-type source/drain (again "S/D") zones 240 and 242 situated in active semiconductor island 140 along the upper semiconductor surface. S/D zones 240 and 242 are often respectively referred to below as source 240 and drain 242 because they normally, though not necessarily, respectively function as source and drain. Source 240 and drain 242 are separated by a channel zone 244 of p-type empty main well region 180 that constitutes the body material for IGFET 100. P-type empty-well body material 180 forms (a) a source-body pn junction 246 with n-type source 240 and (b) a drain-body pn junction 248 with n-type drain 242.

A moderately doped halo pocket portion 250 of p-type empty-well body material 180 extends along source 240 up to the upper semiconductor surface and terminates at a location between source 240 and drain 242. FIGS. 11.1 and 12 illustrate the situation in which source 240 extends deeper than p source-side halo pocket 250. Alternatively, halo pocket 250 can extend deeper than source 240. Halo pocket 250 then extends laterally under source 240. Halo pocket 250 is defined with the p-type source halo dopant.

The portion of p-type empty-well body material 180 outside source-side halo pocket portion 250 constitutes p-type empty-well main body-material portion 254. In moving from the location of the deep p-type empty-well concentration maximum in body material 180 toward the upper semiconductor surface along an imaginary vertical line outside halo pocket portion 250, the concentration of the p-type dopant in empty-well main body-material portion 254 drops gradually from a moderate doping, indicated by symbol "p", to a light doping, indicated by symbol "p−". Dotted line 256 in FIGS. 11.1 and 12 roughly represents the location below which the p-type dopant concentration in main body-material portion 254 is at the moderate p doping and above which the p-type dopant concentration in portion 254 is at the light p− doping. The moderately doped lower part of body-material portion 254 below line 256 is indicated as p lower body-material part 254L in FIG. 12. The lightly doped upper part of body-material portion 254 above line 256 outside p halo pocket 250 is indicated as p− upper body-material part 254U in FIG. 12.

Channel zone 244 (not specifically demarcated in FIG. 11.1 or 12) consists of all the p-type monosilicon between source 240 and drain 242. In particular, channel zone 244 is formed by a surface-adjoining segment of the p− upper part (254U) of main body-material portion 254 and (a) all of p halo pocket portion 250 if source 240 extends deeper than halo pocket 250 as illustrated in the example of FIGS. 11.1 and 12 or (b) a surface-adjoining segment of halo pocket 250 if it extends deeper than source 240. In any event, halo pocket 250 is more heavily doped p-type than the directly adjacent material of the p− upper part (254U) of body-material portion 254 in channel zone 244. The presence of halo pocket 250 along source 240 thereby causes channel zone 244 to be asymmetrically longitudinally graded.

A gate dielectric layer 260 at the $t_{GdH}$ high thickness value is situated on the upper semiconductor surface and extends over channel zone 244. A gate electrode 262 is situated on gate dielectric layer 260 above channel zone 244. Gate electrode 262 extends partially over source 240 and drain 242. Dielectric sidewall spacers 264 and 266 are situated respectively along the opposite transverse sidewalls of gate electrode 262. Metal silicide layers 268, 270, and 272 are respectively situated along the tops of gate electrode 262, main source portion 240M, and main drain portion 242M.

N-type source 240 consists of a very heavily doped main portion 240M and a more lightly doped lateral extension 240E. Although more lightly doped than n++ main source portion 240M, lateral source extension 240E is still heavily doped in sub-μm complementary IGFET applications such as the present one. N-type drain 242 similarly consists of a very heavily doped main portion 242M and a more lightly doped, but still heavily doped, lateral extension 242E. N++ main source portion 240M and n++ main drain portion 242M are normally defined by ion implantation of n-type semiconductor dopant referred to as the n-type main S/D dopant, typically arsenic. External electrical contacts to source 240 and drain 242 are respectively made via main source portion 240M and main drain portion 242M.

Lateral source extension 240E and lateral drain extension 242E terminate channel zone 244 along the upper semiconductor surface. Gate electrode 262 extends over part of each lateral extension 240E or 242E. Electrode 262 normally does not extend over any part of n++ main source portion 240M or n++ main drain portion 242M.

D2. Source/Drain Extensions of Asymmetric High-Voltage N-Channel IGFET

Drain extension 242E of asymmetric high-voltage IGFET 100 is more lightly doped than source extension 240E. However, the n-type doping of each lateral extension 240E or 242E falls into the range of heavy n-type doping indicated by the symbol "n+". Accordingly, lateral extensions 240E and 242E are both labeled "n+" in FIGS. 11.1 and 12. As explained further below, the heavy n-type doping in lateral source extension 240E is normally provided by n-type dopant of higher atomic weight than the n-type dopant used to provide the heavy n-type doping in lateral drain extension 242E.

N+ source extension 240E is normally defined by ion implantation of n-type semiconductor dopant referred to as the n-type shallow source-extension dopant because it is only used in defining comparatively shallow n-type source extensions. N+ drain extension 242 is normally defined by ion implantation of n-type semiconductor dopant referred to as the n-type drain-extension dopant and also as the n-type deep S/D-extension dopant because it is used in defining both comparatively deep n-type source extensions and comparatively deep n-type drain extensions.

N+ lateral extensions 240E and 242E serve multiple purposes. Inasmuch as main source portion 240M and main drain portion 242M are typically defined by ion implantation, extensions 240E and 242E serve as buffers that prevent gate dielectric layer 260 from being damaged during IGFET fabrication by keeping the very high implant dosage of main source portion 240M and main drain portion 242M away from gate dielectric 260. During IGFET operation, lateral extensions 240E and 242E cause the electric field in channel zone 244 to be lower than what would arise if n++ main source portion 240M and n++ main drain portion 242M extended under gate electrode 262. The presence of drain extension 242E inhibits hot carrier injection into gate dielectric 260, thereby preventing gate dielectric 260 from being charged. As a result, threshold voltage $V_T$ of IGFET 100 is highly stable, i.e., does not drift, with operational time.

IGFET 100 conducts current from n+ source extension 240E to n+ drain extension 242E via a channel of primary electrons formed in the depletion region along the upper surface of channel zone 244. In regard to hot carrier injection into gate dielectric layer 260, the electric field in drain 240 causes the primary electrons to accelerate and gain energy as they approach drain 240. Impact ionization occurs in drain 240 to create secondary charge carriers, both electrons and holes, which travel generally in the direction of the local electric field. Some of the secondary charge carriers, especially the secondary electrons, move toward gate dielectric layer 260. Because drain extension 242E is more lightly doped than main drain portion 242M, the primary electrons are subjected to reduced electric field as they enter drain 242. Consequently, fewer hot (energetic) secondary charge carriers are injected into gate dielectric layer 260. Hot carrier damage to gate dielectric 260 is reduced. Also, gate dielectric 260 undergoes reduced charging that would otherwise undesirably cause drift in threshold voltage $V_T$ of IGFET 100.

More particularly, consider a reference n-channel IGFET whose n-type S/D zones each consist of a very heavily doped main portion and a more lightly doped, but still heavily doped, lateral extension. Compared to the situation in which the source and drain extensions of the reference IGFET are at substantially the same heavy n-type doping as in source extension 240E of IGFET 100, the lower n-type doping in drain extension 242E causes the change in dopant concentration across the portion of drain junction 248 along drain extension 242E to be more gradual than the change in dopant concentration across the portion of the drain-to-body pn junction along the drain extension in the reference IGFET. The width of the depletion region along the portion of drain-body junction 248 along drain extension 242E is thereby increased. This causes the electric field in drain extension 242E to be further reduced. As a result, less impact ionization occurs in drain extension 242E than in the drain extension of the reference IGFET. Due to the reduced impact ionization in drain extension 242E, IGFET 100 incurs less damaging hot carrier injection into gate dielectric layer 260.

In addition to being more lightly doped than n+ source extension 240E, n+ drain extension 242E extends significantly deeper than n+ source extension 240E. For an IGFET having lateral S/D extensions which are more lightly doped than respective main S/D portions and which terminate the IGFET's channel zone along the upper semiconductor surface, let $y_{SE}$ and $y_{DE}$ be respectively represent the maximum depths of the S/D extensions. Depth $y_{DE}$ of drain extension 242E of IGFET 100 then significantly exceeds depth $y_{SE}$ of source extension 240E. Drain-extension depth $y_{DE}$ of IGFET 100 is normally at least 20% greater than, preferably at least 30% greater than, more preferably at least 50% greater than, even more preferably at least 100% greater than, its source-extension depth $y_{SE}$. Several factors lead to drain extension 242E extending significantly deeper than source extension 240E.

Source extension 240E and drain extension 242E each reach a maximum (or peak) n-type dopant concentration below the upper semiconductor surface. For an IGFET having lateral S/D extensions which are more lightly doped than respective main S/D portions of the IGFET's S/D zones, which terminate the IGFET's channel zone along the upper semiconductor surface, and which are defined by semiconductor dopant whose maximum (or peak) concentrations occur along respective locations extending generally laterally below the upper semiconductor surface, let $y_{SEPK}$ and $y_{DEPK}$ respectively represent the average depths at the locations of the maximum concentrations of the extension-defining dopants for the S/D extensions. Maximum dopant concentration depths $y_{SEPK}$ and $y_{DEPK}$ for source extension 240E and drain extension 242E of IGFET 100 are indicated in FIG. 12. Depth $y_{SEPK}$ for source extension 240E is normally 0.004-0.020 µm, typically 0.015 µm. Depth $y_{DEPK}$ for drain extension 242E is normally 0.010-0.030 µm, typically 0.020 µm.

One factor which contributes to drain extension 242E extending significantly deeper than source extension 240E is that, as indicated by the preceding $y_{SEPK}$ and $y_{DEPK}$ values for IGFET 100, the ion implantations for source extension 240E and drain extension 242E are performed so that depth $y_{DEPK}$ of the maximum n-type dopant concentration in drain extension 242E significantly exceeds depth $y_{SEPK}$ of the maximum n-type dopant concentration in source extension 240E. Maximum drain-extension dopant concentration depth $y_{DEPK}$ for IGFET 100 is normally at least 10% greater than, preferably at least 20% greater than, more preferably at least 30% greater than, its maximum source-extension dopant concentration depth $y_{SEPK}$.

Inasmuch as drain extension 242E is more lightly doped than source extension 240E, the maximum total n-type dopant concentration at depth $y_{DEPK}$ in drain extension 242E is significantly less than the maximum total n-type dopant concentration at depth $y_{SEPK}$ in source extension 240E. The maximum total n-type dopant concentration at depth $y_{DEPK}$ in drain extension 242E is normally no more than one half of, preferably no more than one fourth of, more preferably no more than one tenth of, even more preferably no more than one twentieth of, the maximum total n-type dopant concentration at depth $y_{SEPK}$ in source extension 240E. As a result, the maximum net n-type dopant concentration at depth $y_{DEPK}$ in drain extension 242E is significantly less than, normally no more than one half of, preferably no more than one fourth of, more preferably no more than one tenth of, even more preferably no more than one twentieth of, the maximum net n-type dopant concentration at depth $y_{SEPK}$ in source extension 240E. Alternatively stated, the maximum total or net n-type dopant concentration at depth $y_{SEPK}$ in source extension 240E is significantly greater than, normally at least two times, preferably at least four times, more preferably at least 10 times, even more preferably at least 20 times, the maximum total or net n-type dopant concentration at depth $y_{DEPK}$ in drain extension 242E.

Two other factors that contribute to drain extension 242E extending significantly deeper than source extension 240E involve p+ source-side halo pocket portion 250. The p-type dopant in halo pocket 250 impedes diffusion of the n-type shallow source-extension dopant in source extension 240E, thereby reducing source-extension depth $y_{SE}$. The p-type dopant in halo pocket 250 also causes the bottom of source extension 240E to occur at a higher location so as to further reduce source-extension depth $y_{SE}$.

The combination of drain extension 242E extending significantly deeper than, and being more lightly doped than, source extension 240E causes the n-type deep S/D-extension dopant in drain extension 242E to be spread out considerably more vertically than the n-type shallow source extension dopant in source extension 240E. Accordingly, the distribution of the total n-type dopant in drain extension 242E is spread out vertically considerably more than the distribution of the total n-type dopant in source extension 240E.

The current flowing from source to drain through an IGFET such as IGFET 100 or the reference IGFET normally spreads out downward upon entering the drain. Compared to the situation in which the n-type dopant concentrations in the source and drain extensions of the reference IGFET are doped substantially the same and extend to the same depth as source extension 240E, the increased depth of drain extension 242E enables the current flow through drain extension 242E to be more spread out vertically than in the drain extension of the reference IGFET. The current density in drain extension 242E is thus less than the current density in the drain extension of the reference IGFET.

The increased spreading of the total n-type dopant in drain extension 242E causes the electric field in drain extension 242E to be less than the electric field in the drain extension of the reference IGFET. Less impact ionization occurs in drain extension 242E than in the drain extension of the reference IGFET. In addition, impact ionization occurs further away from the upper semiconductor surface in drain extension 242E than in the drain extension of the reference IGFET. Fewer hot carriers reach gate dielectric 260 than the gate dielectric layer of the reference IGFET. As a result, the amount of hot carrier injection into gate dielectric layer 260 of IGFET 100 is reduced further.

Drain extension 242E extends significantly further laterally under gate electrode 262 than does source extension 240E. For an IGFET having lateral S/D extensions which are more lightly doped than respective main S/D portions and which terminate the IGFET's channel zone along the upper semiconductor surface, let $x_{SEOL}$ and $x_{DEOL}$ represent the amounts by which the IGFET's gate electrode respectively overlaps the source and drain extensions. Amount $x_{DEOL}$ by which gate electrode 262 of IGFET 100 overlaps drain extension 242E then significantly exceeds amount $x_{SEOL}$ by which gate electrode 262 overlaps source extension 240E. Gate-electrode overlaps $x_{SEOL}$ and $x_{DEOL}$ are indicated in FIG. 12 for IGFET 100. Gate-to-drain-extension overlap $x_{DEOL}$ of IGFET 100 is normally at least 20% greater, preferably at least 30%, more preferably at least 50% greater, than its gate-to-source-extension overlap $x_{SEOL}$.

The quality of the gate dielectric material near the drain-side edge of gate electrode 262 is, unfortunately, normally not as good as the quality of the remainder of the gate dielectric material. Compared to the situation in which the S/D extensions of the reference IGFET extend the same amount below the gate electrode as source extension 240E extends below gate electrode 262, the greater amount by which drain extension 242E extends below gate electrode 262 enables the current flow through drain extension 242E to be even more spread out vertically than in the drain extension of the reference IGFET. The current density in drain extension 242E is further reduced. This leads to even less impact ionization in drain extension 242E than in the drain extension of the reference IGFET. The amount of hot carrier injection into gate dielectric layer 260 is reduced even more. Due to the reduced doping, greater depth, and greater gate-electrode-to-source-extension overlap of drain extension 242E, IGFET 100 undergoes very little damaging hot carrier injection into gate dielectric 260, thereby enabling the threshold voltage of IGFET 100 to be very stable with operational time.

For an IGFET having main S/D portions respectively continuous with more lightly doped lateral source and drain extensions that terminate the IGFET's channel zone along the upper semiconductor surface, let $y_{SM}$ and $y_{DM}$ represent the respective maximum depths of the main source and drain portions. Depth $y_{DM}$ of main drain portion 242M of IGFET 100 is typically approximately the same as depth $y_{SM}$ of main source portion 240M. Each of depths $y_{SM}$ and $y_{DM}$ for IGFET 100 is normally 0.08-0.20 µm, typically 0.14 µm. Due to the presence of the p-type dopant that defines halo pocket portion 250, main source portion depth $y_{SM}$ of IGFET 100 can be slightly less than its main drain portion depth $y_{DM}$.

Main source portion 240M of IGFET 100 extends deeper than source extension 240E in the example of FIGS. 11.1 and 12. Main source portion depth $y_{SM}$ of IGFET 100 therefore exceeds its source-extension depth $y_{SE}$. In contrast, drain extension 242E extends deeper than main drain portion 242M in this example. Hence, drain-extension depth $y_{DE}$ of IGFET 100 exceeds its main drain portion depth $y_{DM}$. Also, drain extension 242E extends laterally under main drain portion 242M.

Let $y_S$ and $y_D$ respectively represent the maximum depths of the source and drain of an IGFET. Depths $y_S$ and $y_D$ are the respective maximum depths of the IGFET's source-body and drain-body pn junctions, i.e., source-body junction 246 and drain-body junction 248 for IGFET 100. Since main source portion depth $y_{SM}$ of IGFET 100 exceeds its source-extension depth $y_{SE}$ in the example of FIGS. 11.1 and 12, source depth $y_{SM}$ of IGFET 100 equals its main source portion depth $y_{SM}$. On the other hand, drain depth $y_D$ of IGFET 100 equals its drain-extension depth $y_{DE}$ in this example because drain extension depth $y_{DE}$ of IGFET 100 exceeds its main drain portion depth $y_{DM}$.

Source depth $y_S$ of IGFET 100 is normally 0.08-0.20 µm, typically 0.14 µm. Drain depth $y_D$ of IGFET 100 is normally 0.10-0.22 µm, typically 0.16 µm. Drain depth $y_D$ of IGFET 100 normally exceeds its source depth $y_S$ by 0.01-0.05 µm, typically by 0.02 µm. In addition, source-extension depth $y_{SE}$ of IGFET 100 is normally 0.02-0.10 µm, typically 0.04 µm. Drain-extension depth $y_{DE}$ of IGFET 100 is 0.10-0.22, typically 0.16 µm. Accordingly, drain-extension depth $y_{DE}$ of IGFET 100 is typically roughly four times its source-extension depth $y_{SE}$ and, in any event, is typically more than three times its source-extension depth $y_{SE}$.

D3. Different Dopants in Source/Drain Extensions of Asymmetric High-Voltage N-Channel IGFET The n-type shallow source-extension dopant in source extension 240E of asymmetric n-channel IGFET 100 and the n-type deep S/D-extension dopant in its drain extension 242E can be the same atomic species. For instance, both of these n-type dopants can be arsenic. Alternatively, both n-type dopants can be phosphorus.

The characteristics of IGFET 100, especially the ability to avoid hot carrier injection into gate dielectric layer 260, are enhanced when the n-type shallow source-extension dopant in source extension 240E is chosen to be of higher atomic weight than the n-type deep S/D-extension dopant in drain extension 242E. For this purpose, the n-type deep S/D-extension dopant is one Group 5a element while the n-type shallow source-extension dopant is another Group 5a element of higher atomic weight than the Group 5a element used as the n-type deep S/D-extension dopant. Preferably, the n-type deep S/D-extension dopant is the Group 5a element phosphorus while the n-type shallow source-extension dopant is the higher atomic-weight Group 5a element arsenic. The n-type shallow source-extension dopant can also be the even higher atomic-weight Group 5a element antimony. In that case, the n-type deep S/D-extension dopant is arsenic or phosphorus.

An ion-implanted semiconductor dopant is characterized by a range and a straggle. The range is the average distance traveled by atoms of the dopant in the ion-implanted material. The straggle is the standard deviation of the range. In other words, the straggle is the standard amount by which the actual distances traveled by the dopant atoms differ from the average distance traveled by the dopant atoms. Due to its higher atomic weight, the n-type shallow source-extension dopant has less straggle than the n-type deep S/D-extension dopant at the same ion implantation energy or at the same range in monosilicon.

Additionally, the higher atomic weight of the n-type shallow source-extension dopant causes it to have a lower diffusion coefficient than the n-type deep S/D-extension dopant. When subjected to the same thermal processing, the atoms of the n-type shallow source-extension dopant diffuse less in the monosilicon of IGFET 100 than the atoms of the n-type deep S/D-extension dopant. The lower straggle and lower diffusion coefficient of the source-extension dopant cause the source resistance to be reduced. Consequently, IGFET 100 conducts more current. Its transconductance is advantageously increased.

The lower straggle and lower diffusion of the n-type deep source-extension dopant also furnish source extension 240E with a sharper dopant-concentration profile. This improves the interaction between halo pocket portion 250 and source extension 240E. During fabrication of multiple units of IGFET 100 according to substantially the same fabrication parameters, there is less variability from unit to unit and better IGFET matching. On the other hand, the higher straggle and greater diffusion of the n-type deep S/D-extension dopant provide drain extension 242E with a softer (more diffuse) dopant-concentration profile. The peak electric field in drain extension 242E is reduced even further than described above. The high-voltage reliability of IGFET 100 is improved considerably.

D4. Dopant Distributions in Asymmetric High-Voltage N-Channel IGFET

The presence of halo pocket portion 250 along source 240 of asymmetric high-voltage n-channel IGFET 100 causes channel zone 244 to be asymmetrically longitudinally dopant graded as described above. The lower source-extension doping than drain-extension doping, the greater drain-extension depth than source-extension depth, and the greater gate-electrode-to-drain-extension overlap than gate-electrode-to-source-extension overlap provide IGFET 100 with further asymmetry. Body material 180 is, as described above, an empty well. A further understanding of the doping asymmetries of IGFET 100 and the empty-well doping characteristics of body material 180 is facilitated with the assistance of FIGS. 13a-13c (collectively "FIG. 13"), FIGS. 14a-14c (collectively "FIG. 14"), FIGS. 15a-15c (collectively "FIG. 15"), FIGS. 16a-16c (collectively "FIG. 16"), FIGS. 17a-17c (collectively "FIG. 17"), and FIGS. 18a-18c (collectively "FIG. 18").

FIG. 13 presents exemplary dopant concentrations along the upper semiconductor surface as a function of longitudinal distance x for IGFET 100. The curves presented in FIG. 13 illustrate an example of the asymmetric longitudinal dopant grading in channel zone 244 and the S/D-extension symmetry arising from drain extension 242E extending further under gate electrode 262 than source extension 240E.

FIGS. 14-18 present exemplary vertical dopant concentration information for IGFET 100. Exemplary dopant concentrations as a function of depth y along an imaginary vertical line 274M through main source portion 240M and empty-well main body-material portion 254 are presented in FIG. 14. FIG. 15 presents exemplary dopant concentrations as a function of depth y along an imaginary vertical line 274E through source extension 240E and the source side of gate electrode 262. Exemplary dopant concentrations as a function of depth y along an imaginary vertical line 276 through channel zone 244 and main body-material portion 254 are presented in FIG. 16. Vertical line 276 passes through a vertical location between halo pocket portion 250 and drain 242. FIG. 17 presents exemplary dopant concentrations as a function of depth y along an imaginary vertical line 278E through drain extension 242E and the drain side of gate electrode 262. Exemplary dopant concentrations as a function of depth y along an imaginary vertical line 278M through main drain portion 242M and body-material portion 254 are presented in FIG. 18.

The curves presented in FIGS. 14, 16, and 18 respectively for main source portion 240M, channel zone 244, and main drain portion 242M primarily illustrate an example of the empty-well doping characteristics of body material 180 formed by main body-material portion 254 and halo pocket portion 250. The curves presented in FIGS. 15 and 17 respectively for source extension 240E and drain extension 242E primarily illustrate an example of the S/D-extension asymmetry arising from drain extension 242E being more lightly doped, and extending deeper, than source extension 240E. Inasmuch as the bottom of body material 180 at pn junction 224 is considerably below the bottoms of source extension 240E and drain extension 242E, FIGS. 15 and 17 are at a lesser depth scale than FIGS. 14, 16, and 18.

Figure 13A:
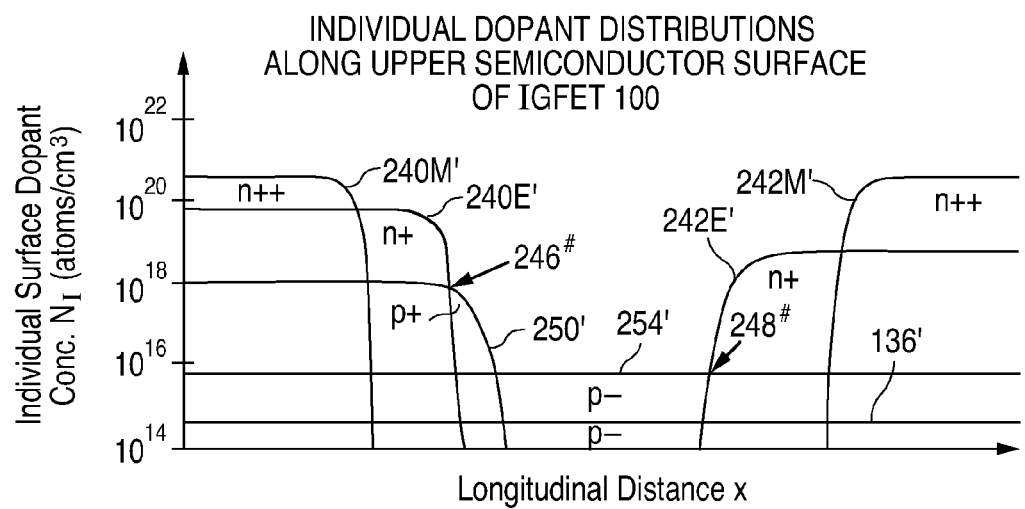
FIGS. 13a-13c are respective graphs of individual, total, and net dopant concentrations as a function of longitudinal distance along the upper semiconductor surface for the asymmetric n-channel IGFET of FIG. 12.

FIG. 13a specifically illustrates concentrations $N_I$, along the upper semiconductor surface, of the individual semiconductor dopants that largely define regions 136, 210, 240M, 240E, 242M, 242E, 250, and 254 and thus establish the asymmetrical longitudinal dopant grading of channel zone 244 and the asymmetrical nature of the overlaps of gate electrode 262 over source extension 240E and drain extension 242E. FIGS. 14a, 15a, 16a, 17a, and 18a specifically illustrate concentrations $N_I$, along imaginary vertical lines 274M, 274E, 276, 278E, and 278M, of the individual semiconductor dopants that vertically define regions 136, 210, 240M, 240E, 242M, 242E, 250, and 254 and thus respectively establish the vertical dopant profiles in (a) main source portion 240M and the underlying material of empty-well main body-material portion 254, (b) source extension 240E, (c) channel zone 244 and the underlying material of main body-material portion 254, i.e., outside halo pocket portion 250, (d) drain extension 242E, and (e) main drain portion 242M and the underlying material of body-material portion 254.

Curves 210', 240M', 240E', 242M', and 242E' in FIGS. 13a, 14a, 15a, 16a, 17a, and 18a represent concentrations $N_I$ (surface and vertical) of the n-type dopants used to respectively form deep n well 210, main source portion 240M, source extension 240E, main drain portion 242M, and drain extension 242E. Curves 136', 250', and 254' represent concentrations $N_I$ (surface and/or vertical) of the p-type dopants used to respectively form substrate region 136, halo pocket 250, and empty-well main body-material portion 254. Items 246#, 248# and 224# indicate where net dopant concentration $N_N$ goes to zero and thus respectively indicate the locations of source-body junction 246, drain-body junction 248, and isolating pn junction 224 between p-type empty main well region 180 and deep n well region 210.

Figure 13B:
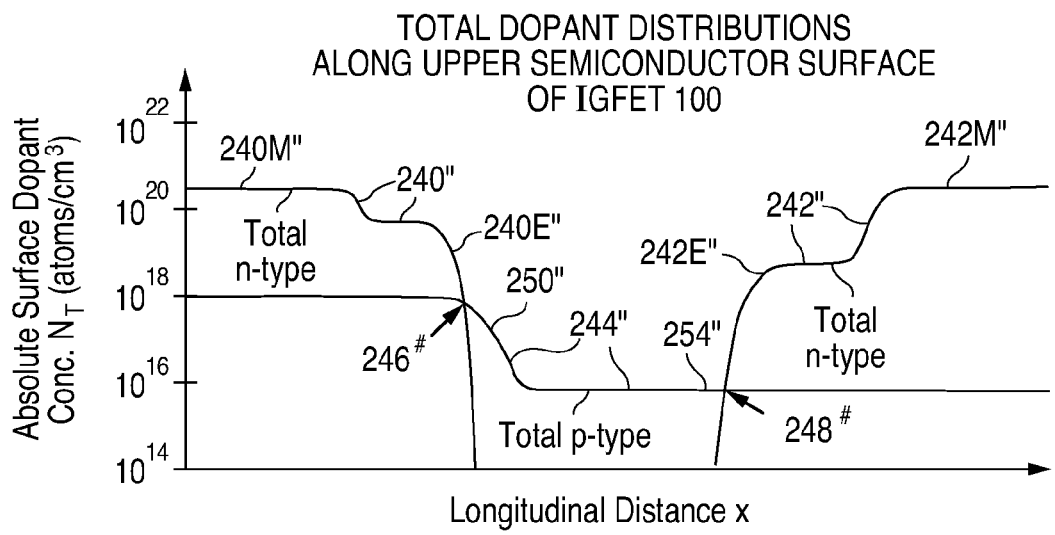

Concentrations $N_T$ of the total p-type and total n-type dopants in regions 240M, 240E, 242M, 242M, 250, and 254 along the upper semiconductor surface are shown in FIG. 13b. FIGS. 14b, 15b, 16b, 17b and 18b variously depict concentrations $N_T$ of the total p-type and total n-type dopants in regions 136, 210, 240M, 240E, 242M, 242E, 250, and 254 along vertical lines 274M, 274E, 276, 278E, and 278M. Curve segments 136", 250", and 254" respectively corresponding to regions 136, 250, and 254 represent total concentrations $N_T$ of the p-type dopants. Item 244" in FIG. 13b corresponds to channel zone 244 and represents the channel-zone portions of curve segments 250" and 254". Item 180" in FIGS. 14b, 15b, 16b, 17b, and 18b corresponds to empty-well body material 180.

Figure 14B:
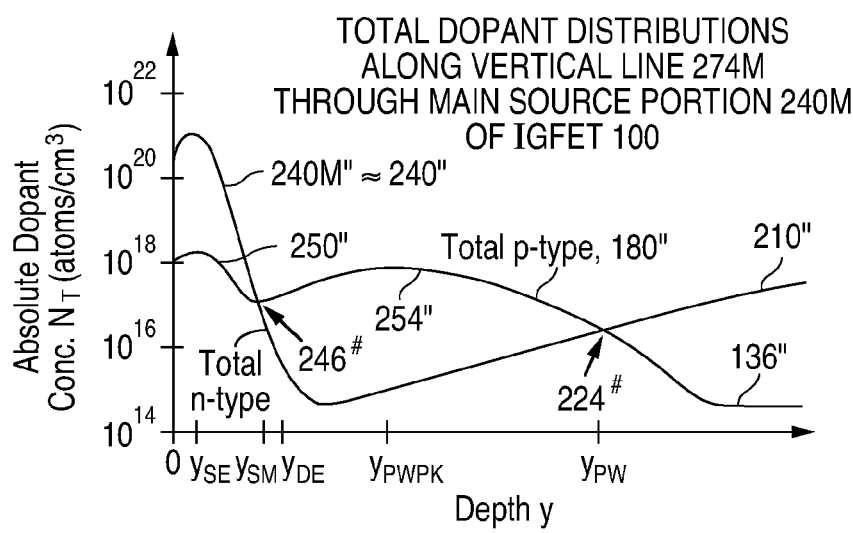
Figure 15A:
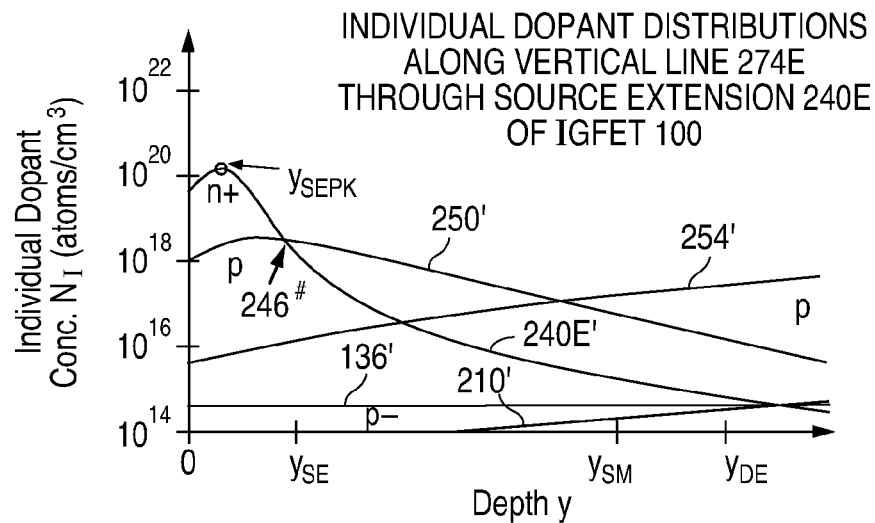
FIGS. 15a-15c are respective graphs of individual, total, and net dopant concentrations as a function of depth along an imaginary vertical line through the source extension of the asymmetric n-channel IGFET of FIG. 12.
Figure 15B:
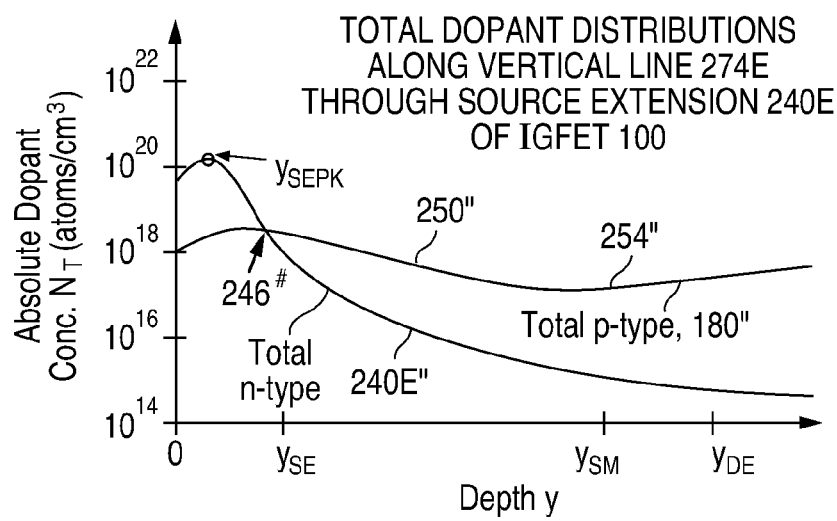
Figure 16A:
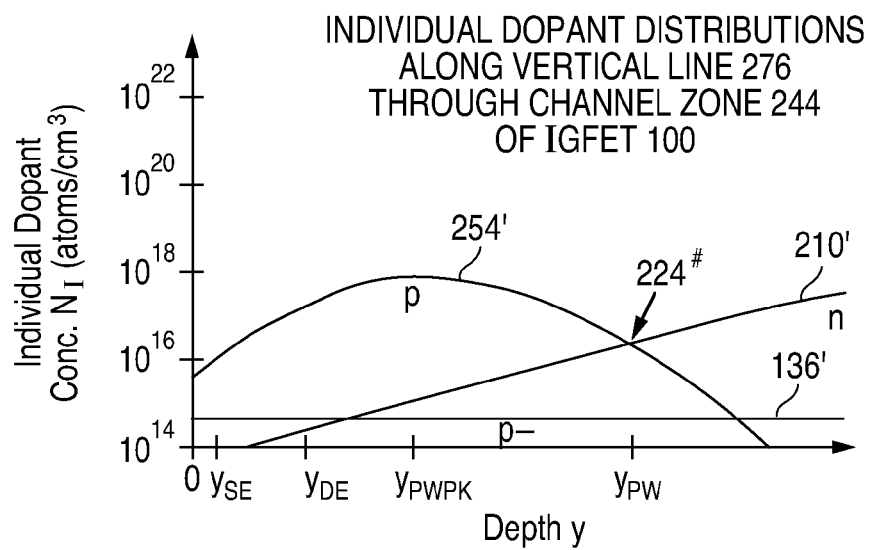
FIGS. 16a-16c are respective graphs of individual, total, and net dopant concentrations as a function of depth along an imaginary vertical line through the channel zone of the asymmetric n-channel IGFET of FIG. 12.
Figure 16B:
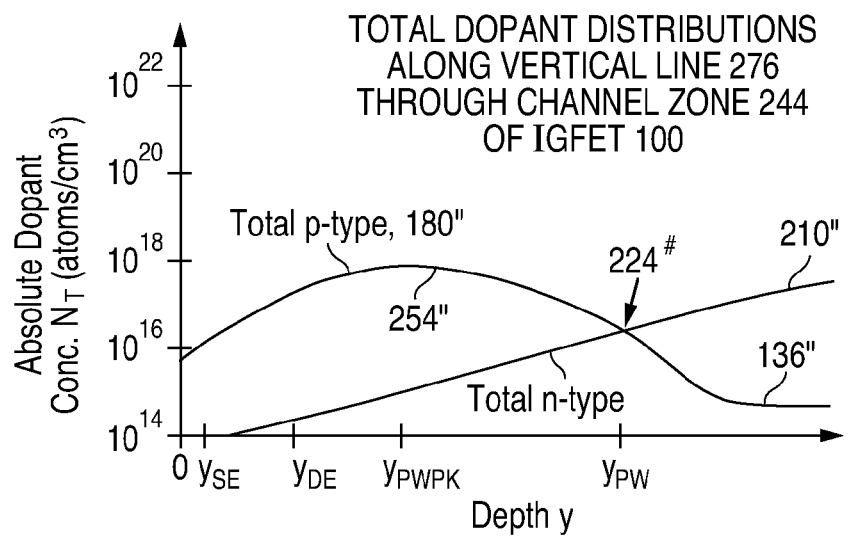
Figure 17A:
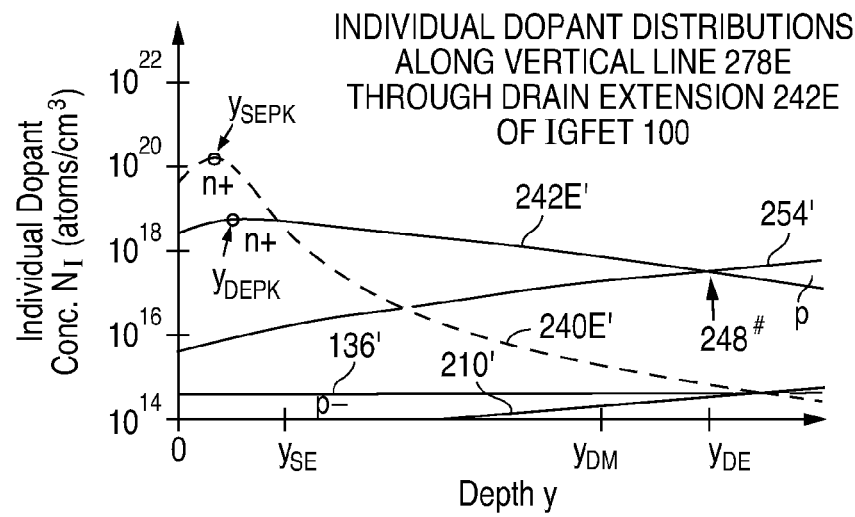
FIGS. 17a-17c are respective graphs of individual, total, and net dopant concentrations as a function of depth along an imaginary vertical line through the drain extension of the asymmetric n-channel IGFET of FIG. 12.
Figure 17B:
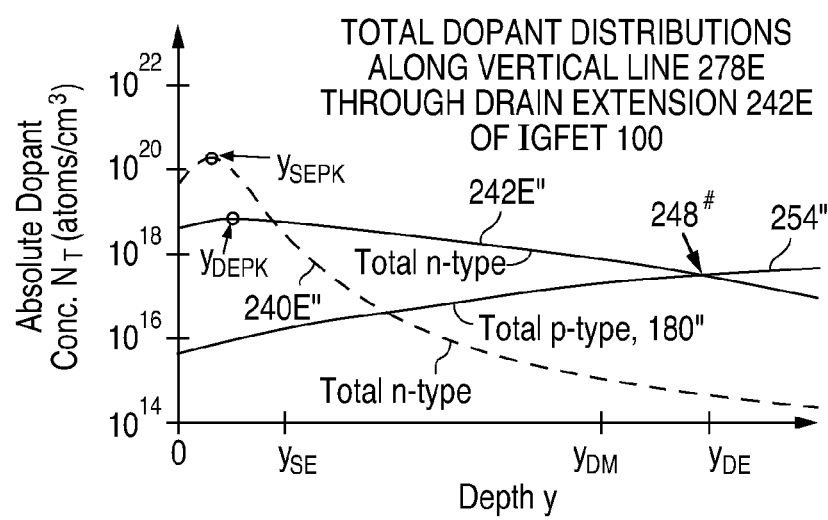

Curves 240M", 240E", 242M", and 242E" in FIGS. 14b, 15b, 16b, 17b and 18b respectively correspond to main source portion 240M, source extension 240E, main drain portion 242M, and drain extension 242E and represent total concentrations $N_T$ of the n-type dopants. Item 240" in FIGS. 13b and 14b corresponds to source 240 and represents the combination of curve segments 240M" and 240E". Item 242" in FIGS. 13b and 18b corresponds to drain 242 and represents the combination of curve segments 242M" and 242E". Items 246#, 248#, and 224# again respectively indicate the locations of junctions 246, 248, and 224. Curve 210" in FIG. 16b is identical to curve 210' in FIG. 16a. Curve 254" in FIG. 17b is nearly identical to curve 254' in FIG. 17a.

Figure 13C:
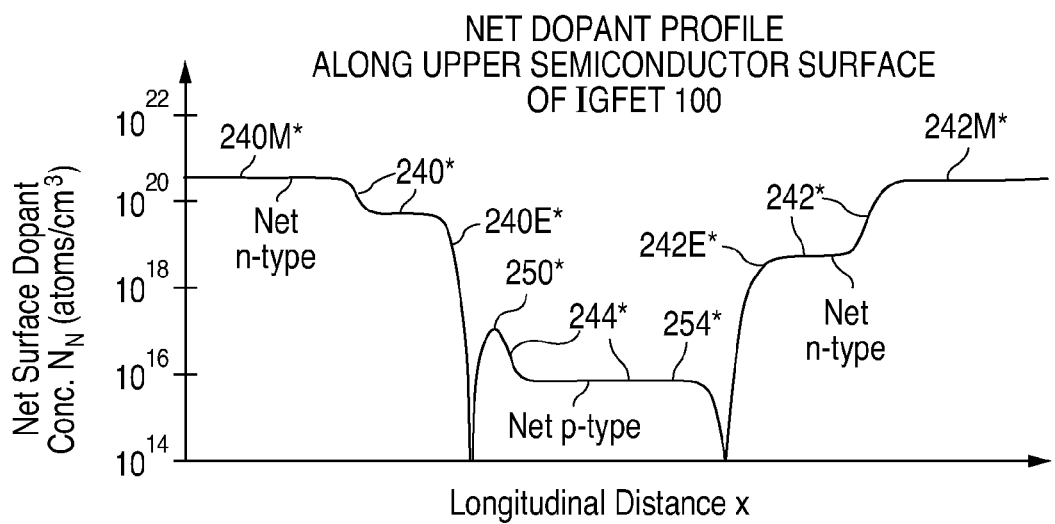

FIG. 13c illustrates net dopant concentration $N_N$ along the upper semiconductor surface. Net dopant concentration $N_N$ along vertical lines 274M, 274E, 276, 278E, and 278M is presented in FIGS. 14c, 15c, 16c, 17c and 18c. Curve segments 250* and 254* represent net concentrations $N_N$ of the p-type dopant in respective regions 250 and 254. Item 244* in FIG. 13c represents the combination of channel-zone curve segments 250* and 254* and thus presents concentration $N_N$ of the net p-type dopant in channel zone 244. Item 180* in FIGS. 14c, 15c, 16c, 17c, and 18c corresponds to empty-well body material 180.

Concentrations $N_N$ of the net n-type dopants in main source portion 240M, source extension 240E, main drain portion 242M, and drain extension 242E are respectively represented by curve segments 240M*, 240E*, 242M*, and 242E* in FIGS. 13c, 14c, 15c, 16c, 17c, and 18c. Item 240* in FIGS. 13c and 14c corresponds to source 240 and represents the combination of curve segments 240M* and 240E*. Item 242* in FIGS. 13c and 18c corresponds to drain 242 and represents the combination of curve segments 242M* and 242E*.

The dopant distributions along the upper semiconductor surface, as represented in FIG. 13, are now considered in further examining the doping asymmetries of IGFET 100 and the empty-well doping characteristics of body material 180. Concentration $N_I$ of the deep n well dopant which defines deep n well 210 is so low, below $1 \times 10^{14}$ atoms/cm³, along the upper semiconductor surface that deep n well 210 effectively does not reach the upper semiconductor surface. Accordingly, reference symbols 210', 210", and 210* representing concentrations $N_I$, $N_T$, and $N_N$ for deep n well 210 do not appear in FIG. 13. In addition, the deep n well dopant does not have any significant effect on the dopant characteristics of source 240, channel zone 244, or drain 242 whether along or below the upper semiconductor surface.

Concentration $N_I$ along the upper semiconductor surface for the n-type main S/D dopant used in defining main source portion 240M and main drain portion 242M is represented by curves 240M' and 242M' in FIG. 13a. The n-type shallow source-extension dopant with concentration $N_I$ along the upper semiconductor surface represented by curve 240E' in FIG. 13a is present in main source portion 240M. The n-type deep S/D-extension dopant with concentration $N_I$ along the upper semiconductor surface represented by curve 242E' in FIG. 13a is present in drain extension 242E. Comparison of curves 240M' and 242M' respectively to curves 240E' and 242E' shows that the maximum values of concentration $N_T$ of the total n-type dopant in source 240 and drain 242 along the upper semiconductor surface respectively occur in main source portion 240M and main drain portion 242M as respectively indicated by curve segments 240M" and 242M" in FIG. 13b.

The p-type background and empty main well dopants with concentrations $N_I$ along the upper semiconductor respectively represented by curves 136' and 254' in FIG. 13a are present in both source 240 and drain 242. In addition, the p-type source halo dopant with concentration $N_I$ along the upper semiconductor surface represented by curve 250' in FIG. 13a is present in source 240 but not in drain 242.

Comparison of FIG. 13b to FIG. 13a shows that upper-surface concentrations $N_T$ of the total n-type dopant in both source 240 and drain 242, represented by curves 240" and 242" in FIG. 13b, is much greater than the sum of upper-surface concentrations $N_I$ of the p-type background, source halo, and empty main well dopants except close to source-body junction 246 and drain-body junction 248. Subject to net dopant concentration $N_N$ going to zero at junctions 246 and 248, upper-surface concentrations $N_T$ of the total n-type dopant in source 240 and drain 242 are largely respectively reflected in upper-surface concentrations $N_N$ of the net n-type dopant in source 240 and drain 242 respectively represented by curve segments 240M* and 242M* in FIG. 13c. The maximum values of net dopant concentration $N_N$ in source 240 and drain 242 along the upper semiconductor surface thus respectively occur in main source portion 240M and main drain portion 242M.

As further indicated by curve portions 240M* and 242M*, the maximum values of net dopant concentration $N_N$ in n++ main source portion 240M and n++ main drain portion 242M are approximately the same, normally at least $1 \times 10^{20}$ atoms/cm³, typically $4 \times 10^{20}$ atoms/cm³, along the upper semiconductor surface. The maximum value of upper-surface concentration $N_N$ in main source portion 240M and main drain portion 242M surface can readily go down to at least as little as $1 \times 10^{19}$–$3 \times 10^{19}$ atoms/cm³. Main source portion 240M can be doped slightly more heavily than main drain portion 242M. The maximum value of net upper-surface dopant concentration $N_N$ in main source portion 240M then exceeds the maximum value of net upper-surface dopant concentration $N_N$ in main drain portion 242M.

In moving from main source portion 240M along the upper semiconductor surface to source extension 240E, concentration $N_T$ of the total n-type dopant in source 240 drops from the maximum value in main source portion 240M to a lower value in source extension 240E as shown by composite source curve 240" in FIG. 13b. Composite drain curve 242" similarly shows that concentration $N_T$ of the total n-type dopant in drain 242 drops from the maximum value in main drain portion 242M to a lower value in drain extension 242E in moving from main drain portion 242M along the upper semiconductor surface to drain extension 242E. The two lower $N_T$ values in source extension 240E and drain extension 242E differ as described below.

Source extension 240E and drain extension 242E are, as mentioned above, normally defined by respective ion implantations of the n-type shallow source-extension and deep S/D-extension dopants. With the ion implantations being performed so that (a) the maximum total n-type dopant concentration at depth $y_{SEPK}$ in source extension 240E is normally at least twice, preferably at least four times, more preferably at least 10 times, even more preferably at least 20 times, the maximum total n-type dopant concentration at depth $y_{DEPK}$ in drain extension 242E and (b) maximum dopant concentration depth $y_{DEPK}$ of drain extension 242E is normally at least 10% greater than, preferably at least 20% greater than, more preferably at least 30% greater than, maximum dopant concentration depth $y_{SEPK}$ of source extension 240E, the maximum value of concentration of the n-type shallow source-extension dopant, represented by curve 240E', along the upper surface of source extension 240E significantly exceeds the maximum value of concentration $N_I$ of the n-type deep S/D-extension dopant, represented by curve 242E', along the upper surface of drain extension 242E as shown in FIG. 13a. The maximum value of upper-surface concentration $N_I$ of the n-type shallow source-extension dopant in source extension 240E is normally at least twice, preferably at least three times, more preferably at least five times, typically ten times, the maximum value of upper-surface concentration $N_I$ of the n-type deep S/D-extension dopant in drain extension 242E.

Concentration $N_I$ of the p-type background dopant is so low compared to both concentration $N_I$ of the n-type shallow source-extension dopant and to concentration $N_I$ of the n-type deep S/D-extension dopant that the ratio of concentration $N_I$ of the n-type shallow source-extension dopant to concentration $N_I$ of the n-type deep S/D-extension dopant along the upper semiconductor surface is substantially reflected in total dopant concentration $N_T$ and net dopant concentration $N_N$ as respectively shown in FIGS. 13b and 13c. As a result, the maximum value of concentration $N_N$ of the net n-type dopant is significantly greater, normally at least twice as great, preferably at least three times as great, more preferably at least five times as great, typically ten times as great, along the upper surface of source extension 240E than along the upper surface of drain extension 242E. The maximum value of upper-surface concentration $N_N$ in source extension 240E is normally $1 \times 10^{19}$–$2 \times 10^{20}$ atoms/cm³, typically $4 \times 10^{19}$ atoms/cm³. The corresponding maximum value of upper-surface concentration $N_N$ in drain extension 242E is then normally $1 \times 10^{18}$–$2 \times 10^{19}$ atoms/cm³, typically $4 \times 10^{18}$ atoms/cm³.

Figure 16C:
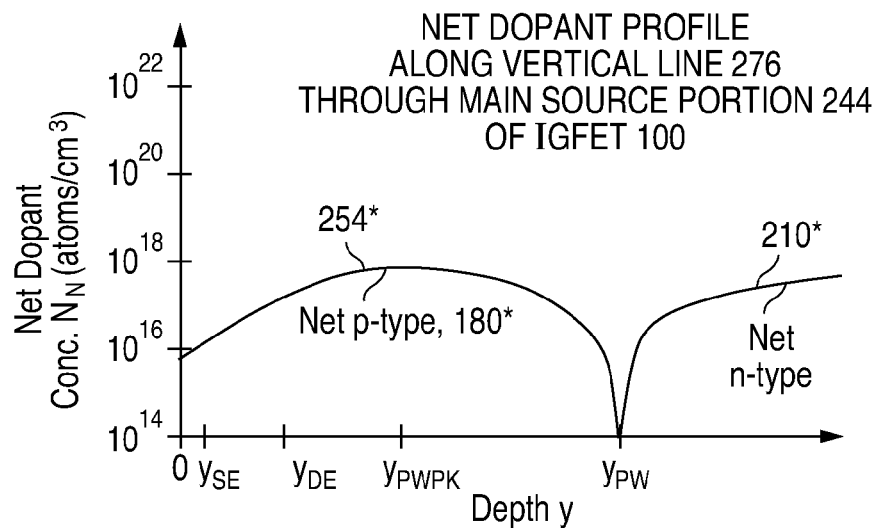

Turning to the vertical dopant distributions through source extension 240E and drain extension 242E respectively along vertical lines 274E and 278E, vertical line 274E through source extension 240E is sufficiently far away from main source portion 240M that the n-type main S/D dopant which defines main source portion 240M does not have any significant effect on total n-type dopant concentration $N_N$ along line 274E. Curve 240E' in FIG. 15a is thus largely identical to curve 240E" which, in FIG. 15b, represents concentration $N_T$ of the total n-type dopant in source extension 240E. As a result, the depth at which concentration $N_I$ of the n-type shallow source-extension dopant reaches its maximum value along line 274E largely equals depth $y_{SEPK}$ at the maximum value of total n-type dopant concentration $N_T$ in source extension 240E.

A small circle on curve 240E' in FIG. 15a indicates depth $y_{SEPK}$ of the maximum value of concentration $N_I$ of the n-type shallow source-extension dopant in source extension 240E. The maximum $N_I$ dopant concentration at depth $y_{SEPK}$ in source extension 240E is normally $1 \times 10^{19}$–$6 \times 10^{20}$ atoms/cm³, typically $1.2 \times 10^{20}$ atoms/cm³.

In a similar manner, vertical line 278E through drain extension 242E is sufficiently far away from main drain portion 242M that the n-type main S/D dopant which defines main drain portion 242M has no significant effect on total n-type dopant concentration $N_N$ along line 278E. Curve 242E' in FIG. 17a is therefore largely identical to curve 242E" which, in FIG. 17b, represents concentration $N_T$ of the total n-type dopant in drain extension 242E. Consequently, the depth at which concentration $N_I$ of the n-type deep S/D-extension dopant reaches its maximum value along line 274E is largely equal to depth $y_{DEPK}$ of the maximum value of total n-type dopant concentration $N_T$ in drain extension 242E.

A small circle on curve 242E' in FIG. 17a similarly indicates depth $y_{DEPK}$ of the maximum value of concentration $N_I$ of the n-type deep S/D-extension dopant in drain extension 242E. The maximum $N_I$ dopant concentration at depth $y_{DEPK}$ in drain extension 242E is $5 \times 10^{17}$–$6 \times 10^{19}$ atoms/cm³, typically $3.4 \times 10^{18}$ atoms/cm³.

Curve 240E' with the small circle to indicate depth $y_{SEPK}$ of the maximum value of concentration $N_I$ of the n-type shallow source-extension dopant is repeated in dashed-line form in FIG. 17a. As indicated there, depth $y_{DEPK}$ for drain extension 242E is significantly greater than depth YSEPK for source extension 240E. FIG. 17a presents an example in which depth $y_{DEPK}$ is over 30% greater than depth $y_{SEPK}$.

FIG. 17a also shows that the maximum value of concentration $N_I$ of the n-type shallow source-extension dopant at depth $y_{SEPK}$ in source extension 240E is significantly greater than the maximum value of concentration $N_I$ of the n-type deep S/D-extension dopant at depth $y_{DEPK}$ in drain extension 242E. In the example of FIGS. 15 and 17, the maximum concentration of the n-type shallow source-extension dopant at depth $y_{SEPK}$ is between 30 times and 40 times the maximum concentration of the n-type deep S/D-extension dopant at depth $y_{DEPK}$.

Small circles on curves 240E" and 242E" in FIGS. 15b and 17b respectively indicate depths $y_{SEPK}$ and $y_{DEPK}$. Curve 240E" with the small circle to indicate depth $y_{SEPK}$ is repeated in dashed-line form in FIG. 17b. Since curves 240E" and 242E' are respectively largely identical to curves 240E' and 242E' in the example of FIGS. 15 and 17, the maximum concentration of the total n-type dopant at depth $y_{SEPK}$ in source extension 240E in this example is between 30 times and 40 times the maximum concentration of the total n-type dopant at depth $y_{DEPK}$ in drain extension 242E.

Figure 15C:
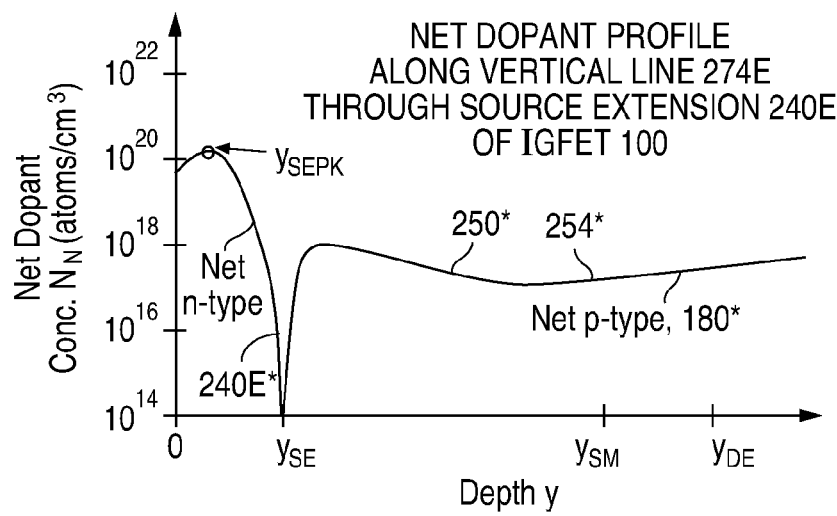
Figure 17C:
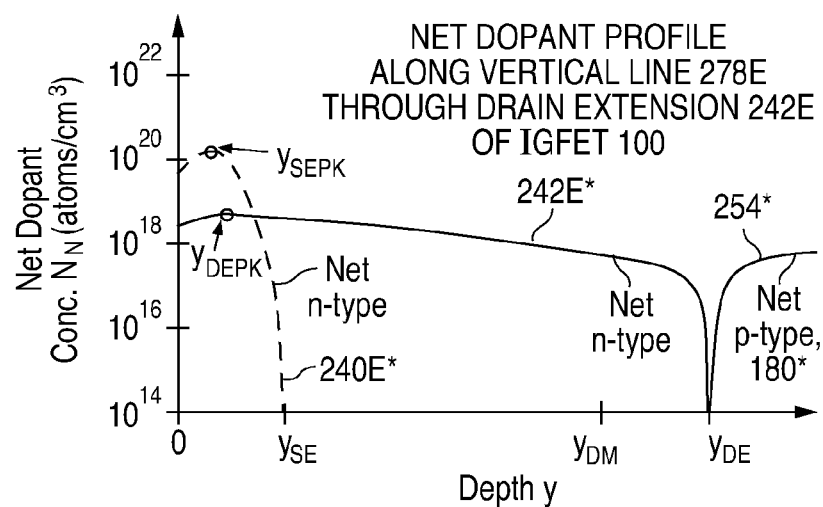

Curves 240E* and 242E* which, in FIGS. 15c and 17c, represent net concentration $N_N$ of the net n-type dopant respectively in source extension 240E and drain extension 242E have respective small circles to indicate depths $y_{SEPK}$ and $y_{DEPK}$. Curve 240E* with the small circle to indicate depth $y_{SEPK}$ is repeated in dashed-line form in FIG. 17c.

Turning back briefly to FIG. 17a, the distribution of the n-type deep S/D-extension dopant in drain extension 242E is spread out vertically considerably more than the distribution of the n-type shallow source-extension dopant in source extension 240E as shown by the shapes of curves 242E' and 240F. With curves 242E" and 240E" being respectively largely identical to curves 242E' and 240E' in the example of FIGS. 15 and 17, the distribution of the total n-type dopant along vertical line 278E through drain extension 242E is likewise spread out vertically considerably more than the distribution of the total n-type dopant along vertical line 274E through source extension 240E as shown by curves 242E" and 240E" in FIG. 17b. As indicated in FIG. 17c, this causes depth $y_{DE}$ of drain extension 242E to significantly exceed depth $y_{SE}$ of source extension 240E. Drain-extension depth $y_{DE}$ of IGFET 100 is more than twice its source-extension depth $y_{SE}$ in the example of FIGS. 15 and 17.

The n-type main S/D dopant which defines source 240 has a significant effect on concentration $N_T$ of the total n-type dopant in source extension 240E along an imaginary vertical line that passes through source extension 240E at a location suitably close to main source portion 240M and thus closer to source portion 240M than vertical line 274E. Consequently, the depth at which concentration $N_I$ of the shallow source-extension dopant reaches its maximum value along that other line through source extension 240E may differ somewhat from depth $y_{SEPK}$ of the maximum value of total n-type dopant concentration $N_T$ in source extension 240E. Similarly, the n-type main S/D dopant which defines drain 242 has a significant effect on concentration $N_N$ of the net n-type dopant in drain extension 242E along an imaginary vertical line that passes through drain extension 242E at a location suitably close to main drain portion 242M and therefore closer to drain portion 242M than vertical line 278E. The depth at which concentration $N_I$ of the n-type deep S/D-extension dopant reaches its maximum value along that other line through drain extension 242E may likewise differ somewhat from depth $y_{DEPK}$ of the maximum value of total n-type dopant concentration $N_T$ in drain extension 242E. Nevertheless, the total and net dopant-concentration characteristics along lines 274E and 278E are generally satisfied along such other imaginary vertical lines until they respectively get too close to main S/D portions 240M and 242M.

Moving to channel zone 244, the asymmetric grading in channel zone 244 arises, as indicated above, from the presence of halo pocket portion 250 along source 240. FIG. 13a indicates that the p-type dopant in source-side halo pocket 250 has three primary components, i.e., components provided in three separate doping operations, along the upper semiconductor surface. One of these three primary p-type dopant components is the p-type background dopant represented by curve 136' in FIG. 13a. The p-type background dopant is normally present at a low, largely uniform, concentration throughout all of the monosilicon material including regions 210, 240, 242, 250, and 254. The concentration of the p-type background dopant is normally $1 \times 10^{14}$ atoms/cm$^3$, typically $4 \times 10^{14}$ atoms/cm$^3$.

Another of the three primary components of the p-type dopant in halo pocket portion 250 along the upper semiconductor surface is the p-type empty main well dopant represented by curve 254' in FIG. 13a. The concentration of the p-type empty main well dopant is also quite low along the upper semiconductor surface, normally $4 \times 10^{16}$–$2 \times 10^{16}$ atoms/cm$^3$, typically $6 \times 10^{15}$ atoms/cm$^3$. The third of these primary p-type doping components is the p-type source halo dopant indicated by curve 250' in FIG. 13a. The p-type source halo dopant is provided at a high upper-surface concentration, normally $5 \times 10^{17}$–$3 \times 10^{18}$ atoms/cm$^3$, typically $1 \times 10^{18}$ atoms/cm$^3$, to define halo pocket portion 250. The specific value of the upper-surface concentration of the p-type source halo dopant is critically adjusted, typically within 5% accuracy, to set the threshold voltage of IGFET 100.

The p-type source halo dopant is also present in source 240 as indicated by curve 250' in FIG. 13a. Concentration $N_I$ of the p-type source halo dopant in source 240 is typically substantially constant along its entire upper surface. In moving from source 240 longitudinally along the upper semiconductor surface into channel zone 244, concentration $N_I$ of the p-type source halo dopant decreases from the substantially constant level in source 240 essentially to zero at a location between source 240 and drain 242.

With the total p-type dopant in channel zone 244 along the upper semiconductor surface being the sum of the p-type background, empty main well, and source halo dopants along the upper surface, the total p-type channel-zone dopant along the upper surface is represented by curve segment 244" in FIG. 13b. The variation in curve segment 244" shows that, in moving longitudinally across channel zone 244 from source 240 to drain 242, concentration $N_T$ of the total p-type dopant in zone 244 along the upper surface drops largely from the essentially constant value of the p-type source halo dopant in source 240 largely to the low upper-surface value of the p-type main well dopant at a location between source 240 and drain 242 and then remains at that low value for the rest of the distance to drain 242.

Concentration $N_I$ of the p-type source halo dopant may, in some embodiments, be at the essentially constant source level for part of the distance from source 240 to drain 242 and may then decrease in the preceding manner. In other embodiments, concentration $N_I$ of the p-type source halo dopant may be at the essentially constant source level along only part of the upper surface of source 240 and may then decrease in moving longitudinally along the upper semiconductor surface from a location within the upper surface of source 240 to source-body junction 246. If so, concentration $N_I$ of the p-type source dopant in channel zone 244 is decreases condition immediately after crossing source-body junction 246 in moving longitudinally across zone 244 toward drain 242.

Regardless of whether concentration $N_I$ of the p-type source halo dopant in channel zone 244 along the upper semiconductor surface is, or is not, at the essentially constant source level for part of the distance from source 240 to drain 242, concentration $N_T$ of the total p-type dopant in zone 244 along the upper surface is lower where zone 244 meets drain 242 than where zone 244 meets source 240. In particular, concentration $N_T$ of the total p-type dopant in channel zone 244 is normally at least a factor of 10 lower, preferably at least a factor of 20 lower, more preferably at least a factor of 50 lower, typically a factor of 100 or more lower, at drain-body junction 248 along the upper semiconductor surface than at source-body junction 246 along the upper surface.

FIG. 13c shows that, as represented by curve 244*, concentration $N_N$ of the net p-type dopant in channel zone 244 along the upper semiconductor surface varies in a similar manner to concentration $N_T$ of the total p-type dopant in zone 244 along the upper surface except that concentration $N_N$ of the net p-type dopant in zone 244 along the upper surface drops to zero at pn junctions 246 and 248. The source side of channel zone 244 thus has a high net amount of p-type dopant compared to the drain side. The high source-side amount of p-type dopant in channel zone 244 causes the thickness of the channel-side portion of the depletion region along source-body junction 246 to be reduced.

Also, the high p-type dopant concentration along the source side of channel zone 244 shields source 240 from the comparatively high electric field in drain 242. This occurs because the electric field lines from drain 242 terminate on ionized p-type dopant atoms in halo pocket portion 250 instead of terminating on ionized dopant atoms in the depletion region along source 240 and detrimentally lowering the potential barrier for electrons. The depletion region along source-body junction 246 is thereby inhibited from punching through to the depletion region along drain-body junction 248. By appropriately choosing the amount of the source-side p-type dopant in channel zone 244, punchthrough is avoided in IGFET 100.

Figure 14A:
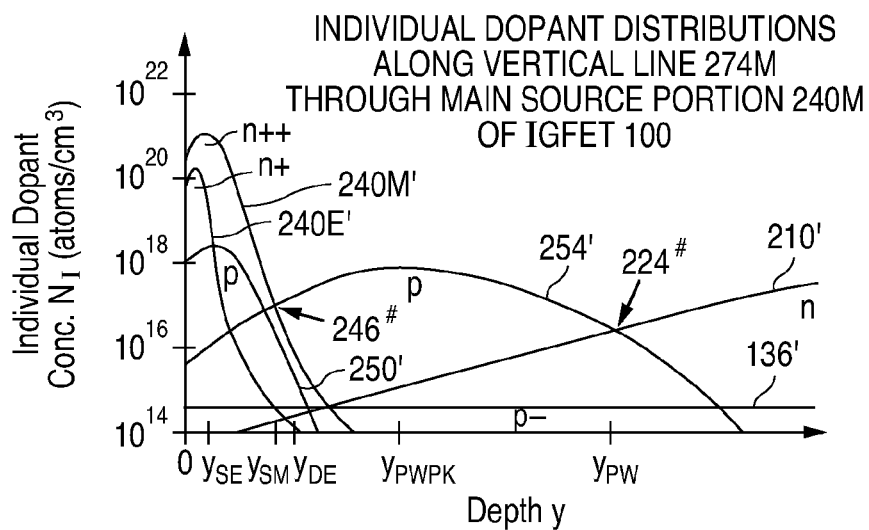
FIGS. 14a-14c are respective graphs of individual, total, and net dopant concentrations as a function of depth along an imaginary vertical line through the main source portion of the asymmetric n-channel IGFET of FIG. 12.

The characteristics of p-type empty main well region 180 formed with halo pocket portion 250 and empty-well main body-material portion 254 are examined with reference to FIGS. 14, 16, and 18. As with channel zone 244, the total p-type dopant in p-type main well region 180 consists of the p-type background, source halo, and empty main well dopants represented respectively by curves 136', 250', and 254' in FIGS. 14a, 16a, and 18a. Except near halo pocket portion 250, the total p-type dopant in main body material portion 254 consists only of the p-type background and empty main well dopants.

As indicated above, p-type empty main well region 180 has a deep local concentration maximum largely at average depth $y_{PWPK}$ due to ion implantation of the p-type empty main well dopant. This p-type local concentration maximum occurs along a subsurface location that extends fully laterally across well region 180 and thus fully laterally across main body-material portion 254. The location of the p-type concentration maximum largely at depth $y_{PWPK}$ is below channel zone 244, normally below all of each of source 240 and drain 242, and also normally below halo pocket portion 250.

Average depth $y_{PWPK}$ at the location of the maximum concentration of the p-type empty main well dopant exceeds maximum depths $y_S$ and $y_D$ of source-body junction 246 and drain-body junction 248 of IGFET 100. Consequently, one part of main body-material portion 254 is situated between source 240 and the location of the maximum concentration of the p-type empty main well dopant. Another part of body-material portion 254 is similarly situated between drain 242 and the location of the maximum concentration of the p-type empty main well dopant.

More particularly, main source portion depth $y_{SM}$, source-extension depth $y_{SE}$, drain-extension depth $y_{DE}$, and main drain portion depth $y_{DM}$ of IGFET 100 are each less than p-type empty main well maximum dopant concentration depth $y_{PWPK}$. Since drain extension 242E underlies all of main drain portion 242M, a part of p-type empty-well main body-material portion 254 is situated between the location of the maximum concentration of the p-type empty main well dopant at depth $y_{PWPK}$ and each of main source portion 240M, source extension 240E, and drain extension 242E. P-type empty main well maximum dopant concentration depth $y_{PWPK}$ is no more than 10 times, preferably no more than 5 times, more preferably no more than 4 times, greater than drain depth $y_D$, specifically drain-extension depth $y_{DE}$, for IGFET 100. In the example of FIG. 18a, depth $y_{PWPK}$ is in the vicinity of twice drain-extension depth $y_{DE}$.

Concentration $N_I$ of the p-type empty main well dopant, represented by curve 254' in FIG. 18a, decreases by at least a factor of 10, preferably by at least a factor of 20, more preferably by at least a factor of 40, in moving from the location of the maximum concentration of the p-type empty main well dopant at depth $y_{PWPK}$ upward along vertical line 278M through the overlying part of main body-material portion 254 and then through drain 242, specifically through the part of drain extension 242E underlying main drain portion 242M and then through main drain portion 242M, to the upper semiconductor surface. FIG. 18a presents an example in which concentration $N_I$ of the p-type empty main well dopant decreases by more than a factor of 80, in the vicinity of 100, in moving from the $y_{PWPK}$ location of the maximum concentration of the p-type empty main well dopant upward along line 278M through the overlying part of main body-material portion 254 and then through drain 242 to the upper semiconductor surface.

Taking note that item 248# represents drain-body junction 248, the decrease in concentration $N_I$ of the p-type empty main well dopant is substantially monotonic by less than a factor of 10 and substantially inflectionless in moving from the location of the maximum concentration of the p-type empty main well dopant at depth $y_{PWPK}$ upward along vertical line 278M to junction 248 at the bottom of drain 242, specifically the bottom of drain extension 242E. FIG. 18a illustrates an example in which concentration $N_I$ of the p-type empty main well dopant also decreases substantially monotonically in moving from drain-body junction 248 along line 278M to the upper semiconductor surface. If some pile-up of the p-type empty main well dopant occurs along the upper surface of drain 242, concentration $N_I$ of the p-type empty main well dopant decreases substantially monotonically in moving from drain-body junction 248 along line 278M to a point no further from the upper semiconductor surface than 20% of maximum depth $y_D$ of junction 248. As mentioned above, drain-body junction depth $y_D$ equals drain-extension depth $y_{DE}$ for IGFET 100.

Curve 180", which represents total p-type dopant concentration $N_T$ in p-type empty main well region 180, consists of segments 254" and 136" in FIG. 18b. Curve segment 254" in FIG. 18b represents the combination of the corresponding portions of curves 254' and 136' in FIG. 18a. Accordingly, curve segment 254" in FIG. 18b represents concentration $N_N$ of the sum of the p-type empty main well and background dopants in p-type body-material portion 254.

The p-type source halo dopant has little, if any, significant effect on the location of the p-type concentration maximum at depth $y_{PWPK}$. Concentration $N_I$ of the p-type background dopant is very small compared to concentration $N_I$ of the p-type empty main well dopant along vertical line 278M through main drain portion 242M for depth y no greater than $y_{PWPK}$ as indicated by curves 136' and 254' in FIG. 18a. The highest ratio of concentration $N_I$ of the p-type background dopant to concentration $N_I$ of the p-type empty main well dopant along line 278M for depth y no greater than $y_{PWPK}$ occurs at the upper semiconductor surface where the p-type background dopant-to-p-type empty main well dopant concentration ratio is typically in the vicinity of 0.1. The total p-type dopant from depth $y_{PWPK}$ along line 278M to the upper semiconductor surface thereby largely consists of the p-type empty main well dopant. This enables concentration $N_T$ of the total p-type dopant, represented by curve 180" in FIG. 18b, to have largely the same variation along line 278M as concentration $N_I$ of the p-type empty main well dopant for depth y no greater than $y_{PWPK}$.

Concentration $N_I$ of the deep n well dopant, represented by curve 210' in FIG. 18a, reaches a maximum value at depth $y_{DNWPK}$ beyond the y depth range shown in FIG. 18a and decreases from that maximum (peak) value in moving toward the upper semiconductor surface. Concentration $N_N$ of the net p-type dopant, represented by curve segment 180* in FIG. 18c, reaches a maximum value at a subsurface location between drain-body junction 248 and isolating junction 224. The presence of the deep n well dopant causes the location of the net p-type dopant concentration maximum along vertical line 278M through main drain portion 242M to occur at an average depth slightly greater than depth $y_{PWPK}$.

Concentration $N_I$ of the n-type main S/D dopant used to define main drain portion 242M reaches a maximum at a subsurface location in drain portion 242M as indicated by curve 242M' in FIG. 18a. Curve 242E' in FIG. 18a shows that the n-type deep S/D-extension dopant used to define drain extension 242E is also present in main drain portion 242M. Since drain extension 242E extends deeper than main drain portion 242M, concentration $N_I$ of the n-type deep S/D-extension dopant exceeds concentration $N_I$ of the n-type main S/D dopant in the portion of drain extension 242E underlying main drain portion 242E. Concentration $N_I$ of the n-type deep S/D-extension dopant along vertical line 278M through main drain portion 242M therefore provides a significant contribution to concentration $N_T$ of the total n-type dopant, represented by the combination of curve segments 242M'', 242E'', and 210'' in FIG. 18b, in the portion of drain extension 242E underlying main drain portion 242M. Subject to going to zero at drain-body junction 248, concentration $N_N$ of the net n-type dopant, represented by curve 242* in FIG. 18c, along line 278M reflects the variation in concentration $N_T$ of the total n-type dopant along line 278M.

Referring to FIG. 16, the p-type dopant distributions along vertical line 276 which passes through channel zone 244 to the side of source-side halo pocket portion 250 are largely the same as the p-type dopant distributions along vertical line 278M through drain 242. That is, the p-type dopant encountered along line 276 consists of the p-type empty main well and background dopants as indicated by curves 136' and 254' in FIG. 16a. Since concentration $N_I$ of the p-type empty main well dopant reaches a maximum at depth $y_{PWPK}$, concentration $N_T$ of the total p-type dopant along line 276 reaches a maximum at depth $y_{PWPK}$ as shown by curve 180'' in FIG. 16b.

Vertical line 276 passes through deep n well 210. However, line 276 does not pass through source 240 or drain 242. None of the n-type S/D dopants has any significant effect on the dopant distributions along line 276. Accordingly, concentration $N_I$ of the p-type empty main well dopant or concentration $N_T$ of the total p-type dopant decreases by at least a factor of 10, preferably by at least a factor of 20, more preferably by at least a factor of 40, in moving from depth $y_{PWPK}$ upward along vertical line 276 through channel zone 244 to the upper semiconductor surface. In the particular example of FIGS. 16 and 18, concentration $N_I$ of the p-type empty main well dopant or concentration $N_T$ of the total p-type dopant decreases by more than a factor of 80, in the vicinity of 100, in moving from depth $y_{PWPK}$ along line 276 through channel zone 244 to the upper semiconductor surface. The comments made above about concentration $N_I$ of the p-type empty main well dopant or concentration $N_T$ of the total p-type dopant normally decreasing substantially monotonically in moving from depth $y_{PWPK}$ along vertical line 278M to the upper semiconductor surface apply to moving from depth $y_{PWPK}$ along vertical line 276 to the upper semiconductor surface.

The p-type background, source halo, and empty main well dopants are, as mentioned above, present in source 240. See curves 136', 250', and 254' in FIG. 14a. As a result, the p-type dopant distributions along vertical line 274M through source 240 may include effects of the p-type source halo dopant as indicated by curve 250' in FIG. 14a and curve segment 250'' in FIG. 14b. Even though concentration $N_I$ of the p-type empty main well dopant decreases by at least a factor of 10 in moving from depth $y_{PWPK}$ upward along vertical line 274M through the overlying part of main body-material portion 254 and through source 240 to the upper semiconductor surface, concentration $N_T$ of the total p-type well dopant may not, and typically does not, behave in this manner in similarly moving from depth $y_{PWPK}$ upward along line 274M to the upper semiconductor surface.

As with concentration $N_I$ of the n-type main S/D dopant in main drain portion 242M, curve 240M' in FIG. 14a shows that concentration $N_I$ of the main S/D dopant in source 240 reaches a maximum at a subsurface location in main source portion 240M. The n-type shallow source-extension dopant used to define source extension 240E is, as shown by curve 240E' in FIG. 14a, also present in main source portion 240M. However, concentration $N_I$ of the n-type main S/D dopant is much greater than concentration $N_I$ of the n-type shallow source-extension dopant at any depth y along vertical line 274M through main source portion 240M. The combination of curve segments 240M'' and 210'' representing concentration $N_T$ of the total n-type dopant along vertical line 274M in FIG. 14b largely repeats curve 240M' in FIG. 14a. Subject to going to zero at source-body junction 246, concentration $N_N$ of the net n-type dopant, represented by curve 240* in FIG. 14c, along line 274M reflects the variation in concentration $N_T$ of the total n-type dopant along line 274M.

D5. Structure of Asymmetric High-Voltage P-Channel IGFET

Asymmetric high-voltage p-channel IGFET 102 is internally configured basically the same as asymmetric high-voltage n-channel IGFET 100, except that the body material of IGFET 102 consists of n-type empty main well region 182 and deep n well region 210 rather than just an empty main well region (180) as occurs with IGFET 100. The conductivity types in the regions of IGFET 102 are generally opposite to the conductivity types of the corresponding regions in IGFET 100.

More particularly, IGFET 102 has a pair of p-type S/D zones 280 and 282 situated in active semiconductor island 142 along the upper semiconductor surface as shown in FIG. 11.1. S/D zones 280 and 282 are often respectively referred to below as source 280 and drain 282 because they normally, though not necessarily, respectively function as source and drain. Source 280 and drain 282 are separated by a channel zone 284 of n-type empty-well body material 182, i.e., portion 182 of total body material 182 and 210. N-type empty-well body material 182 forms (a) a source-body pn junction 286 with p-type source 280 and (b) a drain-body pn junction 288 with p-type drain 282.

A moderately doped halo pocket portion 290 of n-type empty-well body material 182 extends along source 280 up to the upper semiconductor surface and terminates at a location between source 280 and drain 282. FIG. 11.1 illustrates the situation in which source 280 extends deeper than n source-side halo pocket 290. As an alternative, halo pocket 290 can extend deeper than source 280. Halo pocket 290 then extends laterally under source 290. Halo pocket 290 is defined with the n-type source halo dopant.

The portion of n-type empty-well body material 182 outside source-side halo pocket portion 290 constitutes n-type empty-well body-material portion 294. In moving from the location of the deep n-type empty-well concentration maximum in body material 182 toward the upper semiconductor surface along an imaginary vertical line (not shown) outside halo pocket portion 290, the concentration of the n-type dopant in empty-well main body-material portion 294 drops gradually from a moderate doping, indicated by symbol "n", to a light doping, indicated by symbol "n−". Dotted line 296 in FIG. 11.1 roughly represents the location below which the n-type dopant concentration in main body-material portion 294 is at the moderate n doping and above which the n-type dopant concentration in portion 296 is at the light n− doping.

Channel zone 284 (not specifically demarcated in FIG. 11.1) consists of all the n-type monosilicon between source 280 and drain 282. More particularly, channel zone 284 is formed by a surface-adjoining segment of the n− upper part of empty-well main body material 294 and (a) all of n halo pocket portion 290 if source 280 extends deeper than halo pocket 290 as illustrated in the example of FIG. 11.1 or (b) a surface-adjoining segment of halo pocket 290 if it extends deeper than source 280. In any event, halo pocket 290 is more heavily doped n-type than the directly adjacent material of the n− upper part 294 of main body material 182 in channel zone 284. The presence of halo pocket 290 along source 290 thereby causes channel zone 284 to be asymmetrically longitudinally graded.

A gate dielectric layer 300 at the $t_{GdH}$ high thickness value is situated on the upper semiconductor surface and extends over channel zone 284. A gate electrode 302 is situated on gate dielectric layer 290 above channel zone 284. Gate electrode 302 extends partially over source 280 and drain 282. Dielectric sidewall spacers 304 and 306 are situated respectively along the opposite transverse sidewalls of gate electrode 302. Metal silicide layers 308, 310, and 312 are respectively situated along the tops of gate electrode 302, main source portion 280M, and main drain portion 282M.

P-type source 280 consists of a very heavily doped main portion 280M and a more lightly doped lateral extension 280E. P-type drain 282 similarly consists of a very heavily doped main portion 282M and a more lightly doped lateral extension 282E. Although respectively more lightly doped than p++ main source portion 280M and p++ main drain portion 282M, lateral source extension 280E and lateral drain extension 282E are still heavily doped in the present sub-μm CIGFET application. Main source portion 280M and main drain portion 282M are normally defined by ion implantation of p-type semiconductor dopant referred to as the p-type main S/D dopant, typically boron. External electrical contacts to source 280 and drain 282 are respectively made via main source portion 280M and main drain portion 282M.

Lateral source extension 280E and lateral drain extension 282E terminate channel zone 284 along the upper semiconductor surface. Gate electrode 302 extends over part of each lateral extension 280E or 282E. Electrode 302 normally does not extend over any part of p++ main source portion 280M or p++ main drain portion 282M.

D6. Source/Drain Extensions of Asymmetric High-Voltage P-Channel IGFET

Drain extension 282E of asymmetric high-voltage p-channel IGFET 102 is more lightly doped than source extension 280E. However, the p-type doping of each lateral extension 280E or 282E falls into the range of heavy p-type doping indicated by the symbol "p+". Source extension 280E and drain extension 282E are therefore both labeled "p+" in FIG. 11.1.

P+ source extension 280E is normally defined by ion implantation of p-type semiconductor dopant referred to as the p-type shallow source-extension dopant because it is only used in defining comparatively shallow p-type source extensions. P+ drain extension 282E is normally defined by ion implantation of p-type semiconductor dopant referred to as the p-type deep drain-extension dopant and also as the p-type deep S/D-extension dopant because it is used in defining both comparatively deep p-type source extensions and comparatively deep p-type drain extensions. The p-type doping in source extension 280E and drain extension 282E is typically provided by boron.

P+ lateral extensions 280E and 282E serve substantially the same purposes in IGFET 102 as lateral extensions 240E and 242E in IGFET 100. In this regard, IGFET 102 conducts current from p+ source extension 280E to p+ drain extension 282E via a channel of primary holes induced in the depletion region along the upper surface of channel zone 284. The electric field in drain 280 causes the primary holes to accelerate and gain energy as they approach drain 280. Taking note that holes moving in one direction are basically electrons travelling away from dopant atoms in the opposite direction, the holes impact atoms in drain 280 to create secondary charge carriers, again both electrons and holes, which travel generally in the direction of the local electric field. Some of the secondary charge carriers, especially the secondary holes, move toward gate dielectric layer 300. Since drain extension 282E is more lightly doped than main drain portion 282M, the primary holes are subjected to reduced electric field as they enter drain 282. As a result, fewer hot (energetic) secondary charge carriers are injected into gate dielectric layer 300 so as to charge it. Undesirable drift of threshold voltage $V_T$ of IGFET 102 is substantially reduced.

The lighter p-type doping in drain extension 282E than in source extension 280E causes IGFET 102 to incur even less hot carrier injection into gate dielectric layer 300 for the same reasons that IGFET 100 incurs even less damaging hot carrier injection into gate dielectric layer 260 as a result of the lighter n-type doping in drain extension 242E than in source extension 240E. That is, the lighter drain-extension doping in IGFET 102 produces a more gradual change in dopant concentration across the portion of drain junction 288 along drain extension 282E. The width of the depletion region along the portion of drain junction 288 along drain extension 282E is thereby increased, causing the electric field in drain extension 282E to be reduced. Due to the resultant reduction in impact ionization in drain extension 282E, hot carrier injection into gate dielectric layer 300 is reduced.

Each of p+ source extension 280E and p+ drain extension 282E reaches a maximum (or peak) p-type dopant concentration below the upper semiconductor surface. With source extension 280E and drain extension 282E defined by ion implantation, source extension 280E is normally of such a nature that there is an imaginary vertical line (not shown) which extends through source extension 280E and which is sufficiently far away from main source portion 280M that the p-type dopant which defines main source portion 280M does not have any significant effect on the total p-type dopant concentration along that vertical line. As a result, the depth at which the concentration of the p-type shallow source-extension dopant reaches its maximum value along the vertical line largely equals depth $y_{SEPK}$ at the maximum value of the total p-type dopant concentration in source extension 280E. Depth $y_{SEPK}$ for source extension 280E is normally 0.003-0.015 μm, typically 0.006 μm. The maximum concentration of the p-type shallow source-extension dopant at depth $y_{SEPK}$ in source extension 280E is normally $6\times10^{18}$–$6\times10^{19}$ atoms/cm$^3$, typically between $1.5\times10^{19}$ atoms/cm$^3$ and $2\times10^{19}$ atoms/cm$^3$.

Drain extension 282E is likewise normally of such a nature that there is an imaginary vertical line (not shown) which extends through drain extension 282E and which is sufficiently far away from main drain portion 282M that the p-type dopant which defines main drain portion 282M has no significant effect on the total p-type dopant concentration along that vertical line. The depth at which the concentration of the p-type deep S/D-extension dopant reaches its maximum value along the vertical line through drain extension 282E normally largely equals depth $y_{DEPK}$ at the maximum value of the total p-type dopant concentration in drain extension 282E. As with depth $y_{SEPK}$ of the maximum concentration of the p-type shallow p-type source-extension dopant in source extension 280E, depth $y_{DEPK}$ for drain extension 282E is normally 0.003-0.015 μm, typically 0.006 μm.

The maximum concentration of the p-type deep S/D-extension dopant at depth $y_{DEPK}$ in drain extension 282E is normally $4 \times 10^{18}$–$4 \times 10^{19}$ atoms/cm$^3$, typically between $1 \times 10^{19}$ atoms/cm$^3$ and $1.5 \times 10^{19}$ atoms/cm$^3$. This is somewhat lower than the maximum concentration, normally $6 \times 10^{18}$–$6 \times 10^{19}$ atoms/cm$^3$, typically between $1 \times 10^{19}$ atoms/cm$^3$ and $2 \times 10^{19}$ atoms/cm$^3$, of the p-type shallow source-extension dopant at depth $y_{SEPK}$ in source extension 280E even though depth $y_{SEPK}$ of the p-type deep S/D-extension dopant in drain extension 282E is typically the same as depth $y_{SEPK}$ of the p-type shallow p-type source-extension dopant in source extension 280E. The maximum concentration difference is indicative of drain extension 282E being more lightly doped than source extension 280E.

P+ drain extension 282E extends significantly deeper than p+ source extension 280E even though maximum concentration depth $y_{DEPK}$ for drain extension 282E is normally largely equal to maximum concentration depth $y_{SEPK}$ for source extension 280E. In other words, depth $y_{DE}$ of drain extension 282E of IGFET 102 significantly exceeds depth $y_{SE}$ of source extension 280E. Drain-extension depth $y_{DE}$ of IGFET 102 is normally at least 20% greater than, preferably at least 30% greater than, more preferably at least 50% greater than, even more preferably at least 100% greater than, its source-extension depth $y_{SE}$.

Two primary factors lead to drain extension 282E extending significantly deeper than source extension 280E. Both factors involve n+ source-side halo pocket portion 290. Firstly, the n-type dopant in halo pocket portion 290 slows down diffusion of the p-type shallow source-extension dopant in source extension 280E so as to reduce source-extension depth $y_{SE}$. Secondly, the n-type dopant in halo pocket 290 causes the bottom of source extension 280E to occur at a higher location, thereby further reducing source-extension depth $y_{SE}$. Drain extension 282E can be arranged to extend further deeper than source extension 280E by performing the ion implantations so that depth $y_{DEPK}$ of the maximum p-type dopant concentration in drain extension 282E exceeds depth $y_{SEPK}$ of the maximum p-type dopant concentration in source extension 280E.

In typical implementations of asymmetric IGFETs 100 and 102, the p-type source halo dopant in p halo pocket portion 250 of n-channel IGFET 100 is the same atomic species, normally boron, as the p-type shallow source-extension dopant in p+ source extension 280E of p-channel IGFET 102. Analogously, the n-type source halo dopant in n halo pocket portion 290 of p-channel IGFET 102 is typically the same atomic species, normally arsenic, as the n-type shallow source-extension dopant in n+ source extension 240E of n-channel IGFET 100.

An arsenic atom is considerably larger than a boron atom. As a result, the n-type dopant in halo pocket portion 290 of p-channel IGFET 102 impedes diffusion of the p-type shallow source-extension dopant in source extension 280E considerably more than the p-type dopant in halo pocket portion 250 of n-channel IGFET 100 slows down diffusion of the n-type shallow source-extension dopant in source extension 240E. This enables IGFETs 100 and 102 to have comparable ratios of drain-extension depth $y_{DE}$ to source-extension depth $y_{SE}$ even though maximum concentration depth $y_{DEPK}$ for drain extension 282E of p-channel IGFET 102 is normally largely the same as maximum concentration depth $y_{SEPK}$ for source extension 280E whereas maximum concentration depth $y_{DEPK}$ for drain extension 242E of n-channel IGFET 100 is considerably greater than maximum concentration depth $y_{SEPK}$ for source extension 240E.

The distribution of the p-type deep S/D-extension dopant in drain extension 282E of p-channel IGFET 102 is spread out vertically significantly more than the distribution of the p-type shallow source-extension dopant in source extension 280E. As a result, the distribution of the total p-type dopant in drain extension 282E is spread out vertically significantly more than the distribution of the total p-type dopant in source extension 280E.

The greater depth of drain extension 282E than source extension 280E causes hot carrier injection into gate dielectric layer 300 of IGFET 102 to be further reduced for largely the same reasons that IGFET 100 incurs less hot electron injection into gate dielectric layer 260. In particular, the increased depth of drain extension 282E in IGFET 102 causes the current through drain extension 282E to be more spread out vertically, thereby reducing the current density in drain extension 282E. The increased spreading of the total p-type dopant in drain extension 282E causes the electric field in drain extension 282E to be reduced. The resultant reduction in impact ionization in drain extension 282E produces less hot carrier injection into gate dielectric 300.

Drain extension 282E extends significantly further below gate electrode 302 than does source extension 280E. Consequently, amount $x_{DEOL}$ by which gate electrode 302 of IGFET 102 overlaps drain extension 282E significantly exceeds amount $x_{SEOL}$ by which gate electrode 302 overlaps source extension 280E. Gate-to-drain-extension overlap $x_{DEOL}$ of IGFET 102 is normally at least 20% greater, preferably at least 30% greater, more preferably at least 50% greater, than its gate-to-source-extension overlap $x_{SEOL}$.

The greater overlap of gate electrode 302 over drain extension 282E than over source extension 280E causes hot carrier injection into gate dielectric layer 300 of IGFET 102 to be reduced even further for the same reasons that IGFET 100 incurs even less hot carrier injection into gate dielectric layer 260 as a result of the greater overlap of gate electrode 262 over drain extension 242E than over source extension 240E. That is, the greater amount by which drain extension 282E of IGFET 102 extends below gate electrode 302 enables the current flow through drain extension 282E to be even more spread out vertically. The current density in drain extension 282E is further reduced. The resultant further reduction in impact ionization in drain extension 282E causes even less hot carrier injection into gate dielectric layer 300. Due to the reduced doping, greater depth, and greater gate-electrode-to-source-extension overlap of drain extension 282E, IGFET 102 undergoes very little hot carrier injection into gate dielectric 300. As with IGFET 100, the threshold voltage of IGFET 102 is very stable with operational time.

Depth $y_{DM}$ of main drain portion 282M of IGFET 102 is typically approximately the same as depth $y_{SM}$ of main source portion 280M. Each of depths $y_{SM}$ and $y_{DM}$ for IGFET 102 is normally 0.05-0.15 μm, typically 0.10 μm. Due to the presence of the n-type dopant that defines halo pocket portion 290, main source portion depth $y_{SM}$ of IGFET 102 can be slightly less than its main drain portion depth $y_{DM}$.

Main source portion 280M of IGFET 102 extends deeper than source extension 280E in the example of FIG. 11.1. Main source portion depth $y_{SM}$ of IGFET 102 thus exceeds its source-extension depth $y_{SE}$. In contrast, drain extension 282E extends deeper than main drain portion 282M in this example. Consequently, drain-extension depth $y_{DE}$ of IGFET 102 exceeds its main drain portion depth $y_{DM}$. Also, drain extension 282E extends laterally under main drain portion 282M.

Inasmuch as main source portion depth $y_{SM}$ of IGFET 102 exceeds its source-extension depth $y_{SE}$ in the example of FIG. 11.1, source depth $y_S$ of IGFET 102 equals its main source portion depth $y_{SM}$. On the other hand, drain depth $y_D$ of IGFET 102 equals its drain-extension depth $y_{DE}$ in this example because drain-extension depth $y_{DE}$ of IGFET 102 exceeds its main drain portion depth $y_{DM}$. Source depth $y_S$ of IGFET 102 is normally 0.05-0.15 μm, typically 0.10 μm. Drain depth $y_D$ of IGFET 102 is normally 0.08-0.20 μm, typically 0.14 μm. Drain depth $y_D$ of IGFET 102 thereby normally exceeds its source depth $y_S$ by 0.01-0.10 μm, typically by 0.04 μm. Additionally, source-extension depth $y_{SE}$ of IGFET 102 is normally 0.02-0.10 μm, typically 0.06 μm. Drain-extension depth $y_{DE}$ of IGFET 102 is 0.08-0.20 μm, typically 0.14 μm. Accordingly, drain-extension depth $y_{DE}$ of IGFET 102 is typically more than twice its source-extension depth $y_{SE}$.

IGFET 102 employs deep n well region 210 in the implementation of FIG. 11.1. Inasmuch as average deep n well maximum concentration depth $y_{DNWPK}$ is normally 1.0-2.0 μm, typically 1.5 μm, average depth $y_{DNWPK}$ for IGFET 102 is normally 5-25 times, preferably 8-16 times, typically 10-12 times its drain depth $y_D$.

D7. Different Dopants in Source/Drain Extensions of Asymmetric High-Voltage P-Channel IGFET Similar to how semiconductor dopants of different atomic weights are utilized to define source extension 240E and drain extension 242E of asymmetric n-channel IGFET 100, the p-type shallow source-extension dopant used to define source extension 280E of asymmetric p-channel IGFET 102 can be of higher atomic weight than the p-type deep S/D-extension dopant used to define drain extension 282E of IGFET 102. The p-type deep S/D-extension dopant is then normally one Group 3a element while the p-type shallow source-extension dopant is another Group 3a element of higher atomic weight than the Group 3a element used as the p-type deep S/D-extension dopant. Preferably, the p-type deep S/D-extension dopant is the Group 3a element boron while candidates for the p-type shallow source-extension dopant are the higher atomic-weight Group 3a elements gallium and indium. The use of different dopants for S/D extensions 280E and 282E enables p-channel IGFET 102 to achieve similar benefits to those achieved by n-channel IGFET 100 due to the use of different dopants for S/D extensions 240E and 242E.

D8. Dopant Distributions in Asymmetric High-Voltage P-Channel IGFET

Subject to the conductivity types being reversed, p-channel IGFET 102 has a longitudinal dopant distribution along the upper semiconductor surface quite similar to the longitudinal dopant distributions along the upper semiconductor surface for n-channel IGFET 100. Concentration $N_I$ of the deep n well dopant which defines deep n well 210 is, as mentioned above, so low along the upper semiconductor surface that deep n well 210 effectively does not reach the upper semiconductor surface. As occurs with source 240, channel zone 244, and drain 242 of IGFET 100, the deep n well dopant does not have any significant effect on the dopant characteristics of source 280, channel zone 284, or drain 282 of IGFET 102 whether along or below the upper semiconductor surface.

The maximum values of the net dopant concentration in source 280 and drain 282 along the upper semiconductor surface respectively occur in p++ main source portion 280M and p++ main drain portion 282M. In particular, the maximum upper-surface values of the net dopant concentration in main S/D portions 280M and 282M are approximately the same, normally at least $1 \times 10^{20}$ atoms/cm$^3$, typically $5 \times 10^{20}$ atoms/cm$^3$. The maximum value of the net dopant concentration in main S/D portion 280M or 282M along the upper semiconductor surface can go down to at least as little as $1 \times 10^{19} - 3 \times 10^{19}$ atoms/cm$^3$.

The p-type background dopant concentration is negligibly low compared to the upper-surface concentrations of the p-type dopants which define source extension 280E and drain extension 282E. The maximum upper-surface value of the net dopant concentration in each of source extension 280E and drain extension 282E is normally $3 \times 10^{18} - 2 \times 10^{19}$ atoms/cm$^3$, typically $9 \times 10^{18}$ atoms/cm$^3$.

The asymmetric grading in channel zone 284 arises, as indicated above, from the presence of halo pocket portion 290 along source 280. The n-type dopant in source-side halo pocket 290 has three primary components, i.e., components provided in three separate doping operations, along the upper semiconductor surface. One of these three primary n-type dopant components is the deep n well dopant whose upper-surface concentration is, as indicated above, so low at the upper semiconductor surface that the deep n well dopant can be substantially ignored as a contributor to the n-type dopant concentration along the upper semiconductor surface.

Another of the three primary components of the n-type dopant in halo pocket portion 290 along the upper semiconductor surface is the n-type empty main well dopant whose upper-surface concentration is quite low, normally $6 \times 10^{15} - 6 \times 10^{16}$ atoms/cm$^3$, typically $1 \times 10^{16}$ atoms/cm$^3$. The third primary component of the n-type dopant in halo pocket portion 290 is the n-type source halo dopant whose upper-surface concentration is high, normally $4 \times 10^{17} - 4 \times 10^{18}$ atoms/cm$^3$, typically $1 \times 10^{18}$ atoms/cm$^3$. The n-type source halo dopant defines halo pocket 290. The specific value of the upper-surface concentration of the n-type source halo dopant is critically adjusted, typically within 5% accuracy, to set the threshold voltage of IGFET 102.

The n-type source halo dopant is also present in source 280. The concentration of the n-type source halo dopant in source 280 is typically substantially constant along its entire upper surface. In moving from source 280 longitudinally along the upper semiconductor surface into channel zone 284, the concentration of the n-type source halo dopant drops from the substantially constant level in source 280 essentially to zero at a location between source 280 and drain 282. Since the upper-surface concentration of the n-type empty main well dopant is small compared to the upper-surface concentration of the source halo dopant, the concentration of the total n-type dopant in channel zone 284 along the upper surface drops from the essentially constant value of the n-type source halo dopant in source 280 largely to the low upper-surface value of the n-type main well dopant at a location between source 280 and drain 282 and then remains at that low value for the rest of the distance to drain 282.

The concentration of the n-type source halo dopant may, in some embodiments, vary in either of the alternative ways described above for the p-type source halo dopant in IGFET 100. Regardless of whether the concentration of the n-type source halo dopant varies in either of those ways or in the typical way described above, the concentration of the total n-type dopant in channel zone 284 of IGFET 102 along the upper semiconductor surface is lower where zone 284 meets drain 282 than where zone 284 meets source 280. More specifically, the concentration of the total n-type dopant in channel zone 284 is normally at least a factor of 10 lower, preferably at least a factor of 20 lower, more preferably at least a factor of 50 lower, typically a factor of 100 or more lower, at drain-body junction 288 along the upper semiconductor surface than at source-body junction 286 along the upper surface.

The concentration of the net n-type dopant in channel zone 284 along the upper semiconductor surface varies in a similar manner to the concentration of the total n-type dopant in zone 284 along the upper surface except that the concentration of the net n-type dopant in zone 284 along the upper surface drops to zero at pn junctions 286 and 288. Hence, the source side of channel zone 284 has a high net amount of n-type dopant compared to the drain side. The high source-side amount of n-type dopant in channel zone 284 causes the thickness of the channel-side portion of the depletion region along source-body junction 286 to be reduced.

Similar to what occurs in IGFET 100, the high n-type dopant concentration along the source side of channel zone 284 in IGFET 102 causes the electric field lines from drain 282 to terminate on ionized n-type dopant atoms in halo pocket portion 290 instead of terminating on ionized dopant atoms in the depletion region along source 280 and detrimentally lowering the potential bather for holes. Source 280 is thereby shielded from the comparatively high electric field in drain 282. This inhibits the depletion region along source-body junction 286 from punching through to the depletion region along drain-body junction 288. Appropriately choosing the amount of the source-side n-type dopant in channel zone 284 enables IGFET 102 to avoid punchthrough.

Next consider the characteristics of n-type empty main well region 182 formed with halo pocket portion 290 and n-type empty-well main body-material portion 294. As with channel zone 284, the total n-type dopant in n-type main well region 182 consists of the n-type empty main well and source halo dopants and the deep n well dopant. Except near halo pocket portion 290, the total n-type dopant in main body material portion 294 consists only of the n-type empty main well and deep n well dopants. The n-type empty main well and deep n well dopants are also present in both source 280 and drain 282. The n-type source halo dopant is present in source 280 but not in drain 282.

N-type empty main well region 182 has, as mentioned above, a deep local concentration maximum which occurs at average depth $y_{NWPK}$ due to ion implantation of the n-type empty main well dopant. This n-type local concentration maximum occurs along a subsurface location extending fully laterally across well region 182 and thus fully laterally across main body-material portion 294. The location of the n-type concentration maximum at depth $y_{NWPK}$ is below channel zone 284, normally below all of each of source 280 and drain 282, and also normally below halo pocket portion 290.

Average depth $y_{NWPK}$ of the location of the maximum concentration of the n-type empty main well dopant exceeds maximum depths $y_S$ and $y_D$ of source-body junction 286 and drain-body junction 288 of IGFET 102. One part of main body-material portion 294 is therefore situated between source 280 and the location of the maximum concentration of the n-type empty main well dopant. Another part of body-material portion 294 is situated between drain 282 and the location of the maximum concentration of the n-type empty main well dopant.

More precisely, main source portion depth $y_{SM}$, source-extension depth $y_{SE}$, drain-extension depth $y_{DE}$, and main drain portion depth $y_{DM}$ of IGFET 102 are each less than n-type empty main well maximum dopant concentration depth $y_{NWPK}$. Because drain extension 282E underlies all of main drain portion 282M, a part of n-type empty-well main body-material portion 294 is situated between the location of the maximum concentration of the n-type empty main well dopant at depth $y_{NWPK}$ and each of main source portion 280M, source extension 280E, and drain extension 282E. Depth $y_{NWPK}$ is no more than 10 times, preferably no more than 5 times, more preferably no more than 4 times, greater than drain depth $y_D$, specifically drain-extension depth $y_{DE}$, for IGFET 102.

The concentration of the n-type empty main well dopant decreases by at least a factor of 10, preferably by at least a factor of 20, more preferably by at least a factor of 40, in moving from the location of the maximum concentration of the n-type empty main well dopant at depth $y_{NWPK}$ upward along a selected imaginary vertical line (not shown) through the overlying part of main body-material portion 294 and then through drain 282, specifically through the part of drain extension 282E underlying main drain portion 282M and then through main drain portion 282M, to the upper semiconductor surface.

The decrease in the concentration of the n-type empty main well dopant is substantially monotonic by less than a factor of 10 and substantially inflectionless in moving from the location of the maximum concentration of the p-type empty main well dopant at depth $y_{NWPK}$ upward along the selected vertical line to junction 288 at the bottom of drain 282, specifically the bottom of drain extension 282E. Again note that drain-body junction depth $y_D$ equals drain-extension depth $y_{DE}$ for IGFET 102. The concentration of the n-type empty main well dopant typically decreases substantially monotonically in moving from drain-body junction 288 along the vertical line to the upper semiconductor surface. If some pile-up of the n-type empty main well dopant occurs along the upper surface of drain 282, the concentration of the n-type empty main well dopant decreases substantially monotonically in moving from drain-body junction 288 along the vertical line to a point no further from the upper semiconductor surface than 20% of maximum depth $y_D$ of junction 288.

The n-type source halo dopant has little, if any, significant effect on the location of the n-type concentration maximum at depth $y_{NWPK}$. Referring briefly to FIG. 18a, the horizontal axis of FIG. 18a is labeled to indicate average p-type empty main well maximum concentration depth $y_{PWPK}$. As mentioned above, the concentration of the deep n well dopant, represented by curve 210' in FIG. 18a, reaches a maximum value at a depth beyond the y depth range shown in FIG. 18a and decreases from that maximum value in moving toward the upper semiconductor surface.

Examination of FIG. 18a in light of the fact that empty main well maximum concentration depths $y_{NWPK}$ and $y_{PWPK}$ are normally quite close to each other indicates that, at depth $y_{PWPK}$ and thus at depth $y_{NWPK}$, the concentration of the deep n well dopant is very small compared to the concentration of the n-type empty main well dopant. In moving from depth $y_{NWPK}$ along the selected vertical line through drain 282 toward the upper semiconductor surface, the concentration of the deep n well dopant decreases in a such manner that the concentration of the deep n well dopant continues to be very small compared to the concentration of the n-type empty main well dopant at any value of depth y. Accordingly, the concentration of the total n-type dopant decreases in substantially the same manner as the concentration of the n-type empty main well dopant in moving from depth $y_{NWPK}$ along that vertical line to the upper semiconductor surface.

The n-type empty main well and deep n well dopants are present in source 280. Additionally, the n-type source halo dopant is normally present across part, typically all, of the lateral extent of source 280. As a consequence, the n-type dopant distributions along a selected imaginary vertical line through source 280 may include effects of the n-type source halo dopant. Even though the concentration of the n-type empty main well dopant decreases by at least a factor of 10 in moving from depth $y_{NWPK}$ upward along that vertical line through the overlying part of main body-material portion 294 and through source 280 to the upper semiconductor surface, the concentration of the total n-type well dopant may not, and typically does not, behave in this manner in similarly moving from depth $y_{NWPK}$ upward along the vertical line to the upper semiconductor surface.

D9. Common Properties of Asymmetric High-Voltage IGFETs

Looking now at asymmetric IGFETs 100 and 102 together, let the conductivity type of p-type empty-well body material 180 of IGFET 100 or n-type empty body material 182 of IGFET 102 be referred to as the "first" conductivity type. The other conductivity type, i.e., the conductivity type of n-type source 240 and drain 242 of IGFET 100 or the conductivity type of p-type source 280 and drain 282 of IGFET 102, is then the "second" conductivity type. Accordingly, the first and second conductivity types respectively are p-type and n-type for IGFET 100. For IGFET 102, the first and second conductivity types respectively are n-type and p-type.

Concentration $N_T$ of the total p-type dopant in IGFET 100 decreases, as mentioned above, in largely the same way as concentration $N_I$ of the p-type empty main well dopant in moving from depth $y_{PWPK}$ along vertical line 278M through drain 242 of IGFET 100 to the upper semiconductor surface. As also mentioned above, the concentration of the total n-type dopant in IGFET 102 similarly decreases in largely the same way as the concentration of the n-type empty main well dopant in moving from depth $y_{NWPK}$ along a selected vertical line through drain 282 to the upper semiconductor surface. Since the first conductivity type is p-type for IGFET 100 and n-type for IGFET 102, IGFETs 100 and 102 have the general property that the concentration of the total dopant of the first conductivity type in IGFET 100 or 102 decreases by at least a factor of 10, preferably by at least a factor of 20, more preferably by at least a factor of 40, in moving from the subsurface location of the maximum concentration of the total dopant of the first conductivity type at depth $y_{PWPK}$ or $y_{NWPK}$ upward along the vertical line through the overlying main-body material and through drain 242 or 282 to the upper semiconductor surface.

Additionally, the concentration of the total dopant of the first conductivity type in IGFET 100 or 102 decreases substantially monotonically, typically by less than a factor of 10, and substantially inflectionlessly in moving from the location of the maximum concentration of the total dopant of the first conductivity type at depth $y_{PWPK}$ or $y_{NWPK}$ upward along the indicated vertical line to drain-body junction 248 or 288. In moving from drain-body junction 248 or 288 along the vertical line to the upper semiconductor surface, the concentration of the total dopant of the first conductivity type in IGFET 100 or 102 typically decreases substantially monotonically. If some pile-up of the total dopant of the first conductivity type occurs along the upper surface of drain 242 or 282, the concentration of the total dopant of the first conductivity type decreases substantially monotonically in moving from drain-body junction 248 or 288 along the vertical line to a point no further from the upper semiconductor surface than 20% of maximum depth $y_D$ of junction 248 or 288.

The preceding vertical dopant distributions features along a vertical line through drain 242 of IGFET 100 or drain 282 of IGFET 102 are not significantly impacted by the presence of the p-type background dopant in IGFET 100 or by the presence of the deep n well dopant in IGFET 102. In moving from depth $y_{PWPK}$ or $y_{NWPK}$ upward along a selected vertical line through drain 242 or 282, the total dopant of the first conductivity type can thus be well approximated as solely the empty main well dopant of empty-well body material 180 or 182. This approximation can generally be employed along selected imaginary vertical lines extending through the drains of symmetric IGFETs 112, 114, 124, and 126, dealt with further below, which respectively utilize empty main well regions 192, 194, 204, and 206.

Threshold voltage $V_T$ of n-channel IGFET 100 is 0.5 V to 0.75 V, typically 0.6 V to 0.65 V, at a drawn channel length $L_{DR}$ in the vicinity of 0.3 μm and a gate dielectric thickness of 6-6.5 nm. Threshold voltage $V_T$ of p-channel IGFET 102 is −0.5 V to −0.7 V, typically −0.6 V, likewise at a drawn channel length $L_{DR}$ in the vicinity of 0.3 μm and a gate dielectric thickness of 6-6.5 nm. IGFETs 100 and 102 are particularly suitable for unidirectional-current applications at a high operational voltage range, e.g., 3.0 V.

D10. Performance Advantages of Asymmetric High-Voltage IGFETs

For good IGFET performance, the source of an IGFET should be as shallow as reasonably possible in order to avoid roll-off of threshold voltage $V_T$ at short-channel length. The source should also be doped as heavily as possible in order to maximize the IGFET's effective transconductance in the presence of the source resistance. Asymmetric IGFETs 100 and 102 meet these objectives by using source extensions 240E and 280E and configuring them to be respectively shallower and more heavily doped than drain extensions 242E and 282E. This enables IGFETs 100 and 102 to have high transconductance and, consequently, high intrinsic gain.

Drain extensions 242E and 282E enable asymmetric high voltage IGFETs 100 and 102 to substantially avoid the injection of hot charge carriers at their drains 242 and 282 into their gate dielectric layers 260 and 300. The threshold voltages of IGFETs 100 and 102 do not drift significantly with operational time.

For achieving high-voltage capability and reducing hot carrier injection, the drain of an IGFET should be as deep and lightly doped as reasonably possible. These needs should be met without causing the IGFET's on-resistance to increase significantly and without causing short-channel threshold voltage roll-off. Asymmetric IGFETs 100 and 102 meet these further objectives by having drain extensions 242E and 282E extend respectively deeper than, and be more lightly doped than, source extensions 240E and 280E. The absence of a halo pocket portion along drain 242 or 282 further enhances the hot carrier reliability.

The parasitic capacitances of an IGFET play an important role in setting the speed performance of the circuit containing the IGFET, particularly in high-frequency switching operations. The use of retrograde empty well regions 180 and 182 in asymmetric IGFETs 100 and 102 reduces the doping below their sources 240 and 280 and their drains 242 and 282, thereby causing the parasitic capacitances along their source-body junctions 246 and 286 and their drain-body junctions 248 and 288 to be reduced. The reduced parasitic junction capacitances enable IGFETs 100 and 102 to switch faster.

The longitudinal dopant gradings that source-side halo pocket portions 250 and 290 respectively provide in channel zones 244 and 284 assists in alleviating $V_T$ roll-off at short channel length by moving the onset of $V_T$ roll-off to shorter channel length. Halo pockets 250 and 290 also provide additional body-material dopant respectively along sources 240 and 280. This reduces the depletion-region thicknesses along source-body junctions 246 and 248 and enables IGFETs 100 and 102 to avoid source-to-drain punchthrough.

The drive current of an IGFET is its drain current $I_D$ at saturation. At the same gate-voltage overdrive and drain voltage, asymmetric IGFETs 100 and 102 normally have higher drive current than symmetric counterparts.

As drain-to-source voltage $V_{DS}$ of n-channel IGFET 100 is increased during IGFET operation, the resultant increase in the drain electric field causes the drain depletion region to expand toward source 240. This expansion largely terminates when the drain depletion region gets close to source-side halo pocket portion 250. IGFET 100 goes into a saturation condition which is stronger than in a symmetric counterpart. The configuration of IGFET 100 advantageously thus enables it to have higher output resistance. Subject to reversal of the voltage polarities, p-channel IGFET 102 also has higher output resistance. IGFETs 100 and 102 have increased transconductance, both linear and saturation.

The combination of retrograde well-dopant dopant profiles and the longitudinal channel dopant gradings in IGFETs 100 and 102 provides them with good high-frequency small-signal performance, and excellent large-signal performance with reduced noise. In particular, IGFETs 100 and 102 have wide small-signal bandwidth, high small-signal switching speed, and high cut-off frequencies, including high peak values of the cut-off frequencies.

D11. Asymmetric High-Voltage IGFETs with Specially Tailored Halo Pocket Portions One of the benefits of providing an IGFET, such as IGFET 100 or 102, with a source-side halo pocket portion is that the increased doping in the halo pocket causes the source-to-drain ("S-D") leakage current to be reduced when the IGFET is in its biased-off state. The reduction in S-D leakage current is achieved at the expense of some reduction in the IGFET's drive current. In an IGFET having a source-side halo pocket portion defined by a single ion implantation so that the resultant roughly Gaussian vertical dopant profile in the pocket portion reaches a maximum concentration along a single subsurface location, significant off-state S-D current leakage can still occur at a location, especially along or near the upper semiconductor surface, where the net dopant concentration in the halo pocket is less than some minimum value.

The dosage used during the single ion implantation for defining the halo pocket in the IGFET could be increased so that the net dopant concentration in the halo pocket is above this minimum value along each location where significant off-state S-D current leakage would otherwise occur. Unfortunately, the overall increased doping in the halo pocket would undesirably cause the IGFET's drive current to decrease further. One solution to this problem is to arrange for the vertical dopant profile in the halo pocket to be relatively flat from the upper semiconductor surface down to the subsurface location beyond which there is normally no significant off-state S-D current leakage. The IGFET's drive current is then maximized while substantially avoiding off-state S-D current leakage.

Figure 19A:
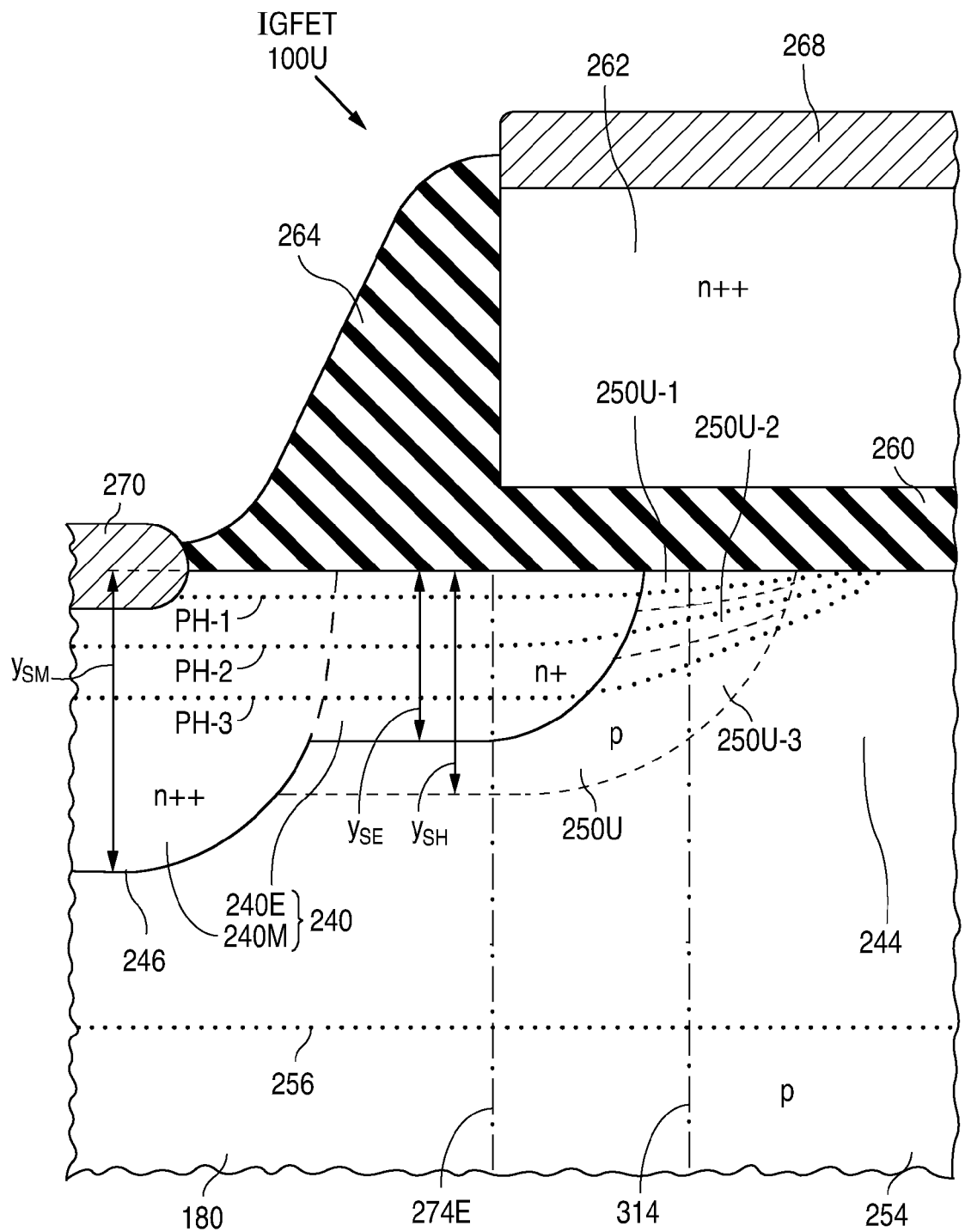
FIGS. 19a and 19b are respective expanded front cross-sectional views of parts of variations of the cores of the asymmetric n-channel and p-channel IGFETs of FIG. 11.1.
Figure 19B:
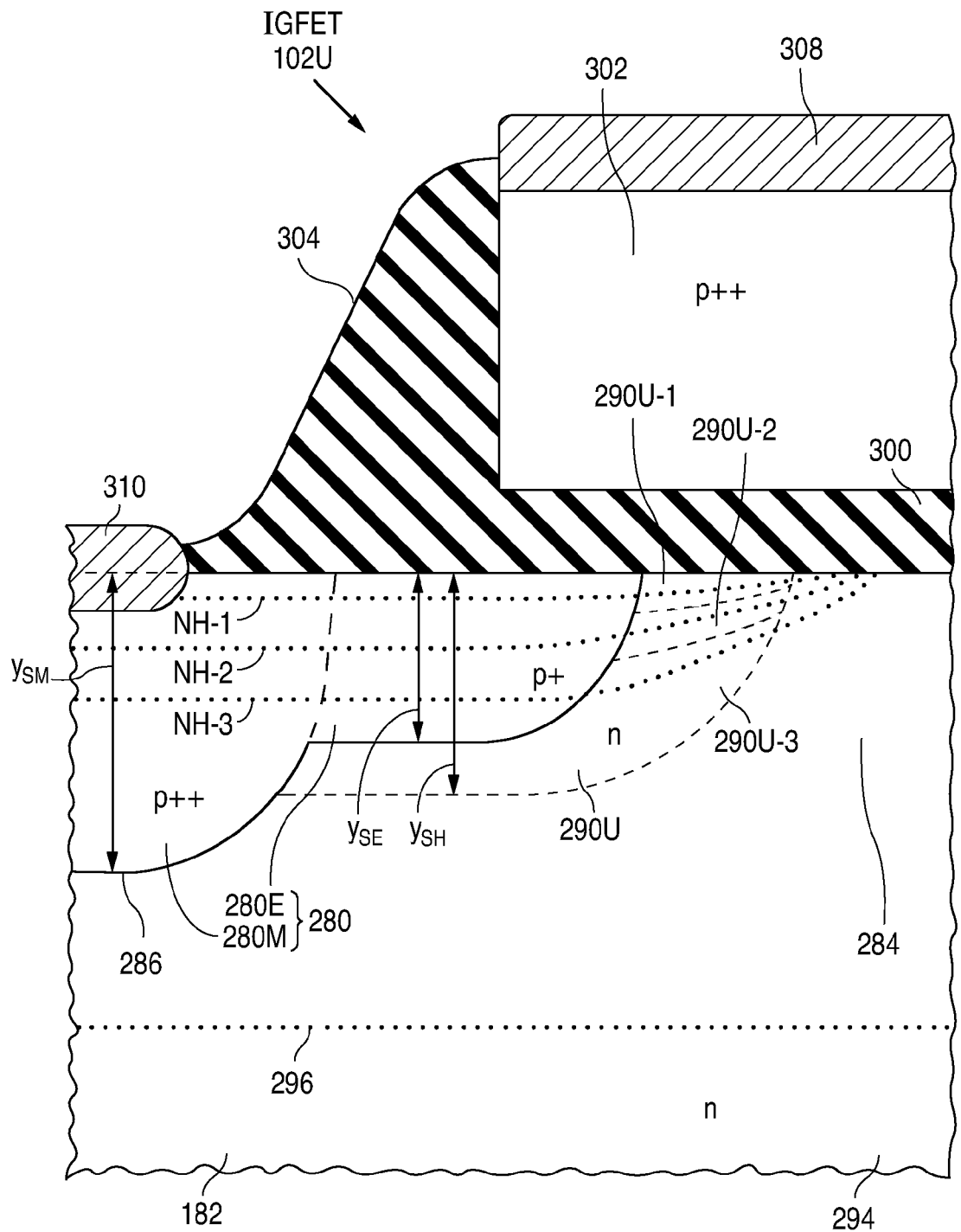

FIGS. 19a and 19b respectively illustrates parts of variations 100U and 102U of complementary asymmetric high-voltage IGFETs 100 and 102 in which source-side halo pocket portions 250 and 290 are respectively replaced with a moderately doped p-type source-side halo pocket portion 250U and a moderately doped n-type source-side halo pocket portion 290U. Source-side halo pocket portions 250U and 290U are specially tailored for enabling complementary asymmetric high-voltage IGFETs 100U and 102U to have reduced S-D current leakage when they are in their biased-off states while substantially maintaining their drive currents at the respective levels of IGFETs 100 and 102.

Aside from the special tailoring of the halo-pocket dopant distributions in halo pocket portions 250U and 290U and the slightly modified dopant distributions that arise in adjacent portions of IGFETs 100U and 102U due to the fabrication techniques used to create the special halo-pocket dopant distributions, IGFETs 100U and 102U are respectively configured substantially the same as IGFETs 100 and 102. Subject to having reduced off-state S/D current leakage, IGFETs 100U and 102U respectively also operate substantially the same, and have the same advantages, as IGFETs 100 and 102.

Turning specifically to n-channel IGFET 100U, the dopant distribution in its p halo pocket portion 250U is tailored so that the vertical dopant profile of the p-type source halo pocket dopant along substantially any imaginary vertical line extending perpendicular to the upper semiconductor surface through halo pocket 250U to the side of n-type source 240, specifically to the side of n+ source extension 240E, is relatively flat near the upper semiconductor surface. One such imaginary vertical line 314 is depicted in FIG. 19a.

The substantial flatness in the vertical dopant profile of the p-type source halo pocket dopant near the upper semiconductor surface of IGFET 100U is achieved by arranging for concentration $N_I$ of the p-type source halo pocket dopant to reach a plural number M of local concentration maxima at M different locations vertically spaced apart from one another along substantially any imaginary vertical line, such as vertical line 314, extending through halo pocket 250U to the side of n-type source 240. The M local maxima in concentration $N_I$ of the p-type source halo dopant respectively occur along M locations PH-1, PH-2, . . . and PH-M (collectively "locations PH") which progressively become deeper in going from shallowest halo-dopant maximum-concentration location PH-1 to deepest halo-dopant maximum-concentration location PH-M.

Halo pocket portion 250U of IGFET 102U can be viewed as consisting of M vertically contiguous halo pocket segments 250U-1, 250U-2, . . . and 250U-M. Letting j be an integer varying from 1 to M, each halo pocket segment 250U-j contains the p-type source halo dopant concentration maximum occurring along halo-dopant maximum-concentration location PH-j. Halo pocket segment 250U-1 containing shallowest halo-dopant maximum-concentration location PH-1 is the shallowest of halo pocket segments 250U-1-250U-M. Halo pocket segment 250U-M containing deepest maximum-concentration location PH-1 is the deepest of segments 250U-1-250U-M.

The p-type source halo dopant is typically the same atomic species in all of halo pocket segments 250U-1-250U-M. However, different species of the p-type source halo dopant can be variously present in halo pocket segments 250U-1-250U-M.

Each halo-dopant maximum-concentration location PH-j normally arises from only one atomic species of the p-type source halo dopant. In light of this, the atomic species of the p-type source halo dopant used to produce maximum-concentration location PH-j in halo pocket segment 250U-j is referred to here as the jth p-type source halo dopant. Consequently, there are M numbered p-type source halo dopants which are typically all the same atomic species but which can variously differ in atomic species. These M numbered p-type source halo dopants form the overall p-type source halo dopant generally referred to simply as the p-type source halo dopant.

Plural number M of the local maxima in concentration $N_I$ of the p-type source halo dopant is 3 in the example of FIG. 19a. Accordingly, segmented p halo pocket portion 250U in FIG. 19a is formed with three vertically contiguous halo pocket segments 250U-1-250U-3 that respectively contain the p-type source halo dopant concentration maxima occurring along halo-dopant maximum-concentration locations PH-1-PH-3. There are three numbered p-type source halo dopants, respectively denominated as the first, second, and third p-type source halo dopants, for respectively determining maximum-concentration locations PH-1-PH-3 of halo pocket segments 250U-1-250U-3 in FIG. 19a.

Halo-dopant maximum-concentration locations PH are indicated in dotted lines in FIG. 19a. As shown by these dotted lines, each halo-dopant maximum-concentration location PH-j extends into n-type source 240. Each halo-dopant maximum-concentration location PH-j normally extends substantially laterally fully across n++ main source portion 240M. In the example of FIG. 19a, each halo-dopant maximum-concentration PH-j extends through n+ source extension 240E. However, one or more of halo-dopant maximum-concentration locations PH can extend below source extension 240E and thus through the underlying material of p halo pocket portion 250U. The extension of each halo-dopant maximum-concentration location PH-j into source 240 arises from the way, described below, in which segmented halo pocket 250U is formed.

Each halo-dopant maximum-concentration location PH-j also extends into p-type empty-well main body-material portion 254, i.e., the portion of p-type main well body-material region 180 outside of segmented halo pocket portion 250U. This arises from the manner in which the boundary between two semiconductor regions, i.e., halo pocket 250U and body-material portion 254 here, formed by doping operations to be of the same conductivity type is defined above to occur, namely at the location where the (net) concentrations of the dopants used to form the two regions are equal.

The total p-type dopant in source-side halo pocket portion 250U of IGFET 100U consists of the p-type background, empty main well, and source halo dopants as described above for source-side halo pocket portion 250 of IGFET 100. The M local maxima in concentration $N_I$ of the p-type source halo dopant along locations PH cause concentration $N_T$ of the total p-type dopant in halo pocket 250U of IGFET 100U to reach M respectively corresponding local maxima along M respectively corresponding different locations in pocket 250U. As with locations PH, the locations of the M maxima in concentration $N_T$ of the total p-type dopant in halo pocket 250U are vertically spaced apart from one another along substantially any imaginary vertical line, e.g., vertical line 314, extending perpendicular to the upper semiconductor surface through pocket 250U to the side of source 240.

The locations of the M maxima in concentration $N_T$ of the total p-type dopant in halo pocket portion 250U may respectively variously differ from locations PH of the M maxima in concentration $N_I$ of the p-type halo dopant in pocket 250U. To the extent that these differences arise, they are normally very small. Accordingly, dotted lines PH in FIG. 19a also respectively represent the locations of the M concentration maxima in concentration $N_T$ of the total p-type dopant in pocket 250U. Locations PH of the M concentration maxima in concentration $N_T$ of the total p-type dopant in pocket 250U thus extend laterally into source 240 and into p-type empty-well main body-material portion 254.

Similar comments apply to concentration $N_N$ of the net p-type dopant in halo pocket portion 250U. Although some of the n-type shallow source-extension dopant is present in halo pocket 250U, the M local maxima in concentration $N_I$ of the p-type source halo dopant along locations PH cause concentration $N_N$ of the net p-type dopant in pocket 250U here to reach M respectively corresponding local maxima along M respectively corresponding different locations in pocket 250U. Likewise, the locations of the M maxima in concentration $N_N$ of the net p-type dopant in pocket 250U are vertically spaced apart from one another along substantially any imaginary vertical line, e.g., again vertical line 314, extending perpendicular to the upper semiconductor surface through pocket 250U to the side of source 240.

As with concentration $N_T$ of the total p-type dopant in halo pocket portion 250U, the locations of the M maxima in concentration $N_N$ of the net p-type dopant in halo pocket 250U may respectively variously differ slightly from locations PH of the M maxima in concentration $N_I$ of the p-type halo dopant in pocket 250U. The portions of dotted lines PH shown as being present in pocket 250U in FIG. 19a can then also respectively represent the locations of the M concentration maxima in concentration $N_T$ of the total p-type dopant in pocket 250U.

An understanding of the flattening of the vertical dopant profile in halo pocket portion 250U near the upper semiconductor surface is facilitated with the assistance of FIGS. 20a-20c (collectively "FIG. 20") and FIGS. 21a-21c (collectively "FIG. 21"). Exemplary dopant concentrations as a function of depth y along vertical line 314 through halo pocket 250U in the example of FIG. 19a are presented in FIG. 20. FIG. 21 presents exemplary dopant concentrations as a function of depth y along vertical line 274E through source extension 240E of IGFET 100U in the example of FIG. 19a. Item $y_{SH}$ is the maximum depth of halo pocket 250U as indicated in FIG. 19a.

Figure 20A:
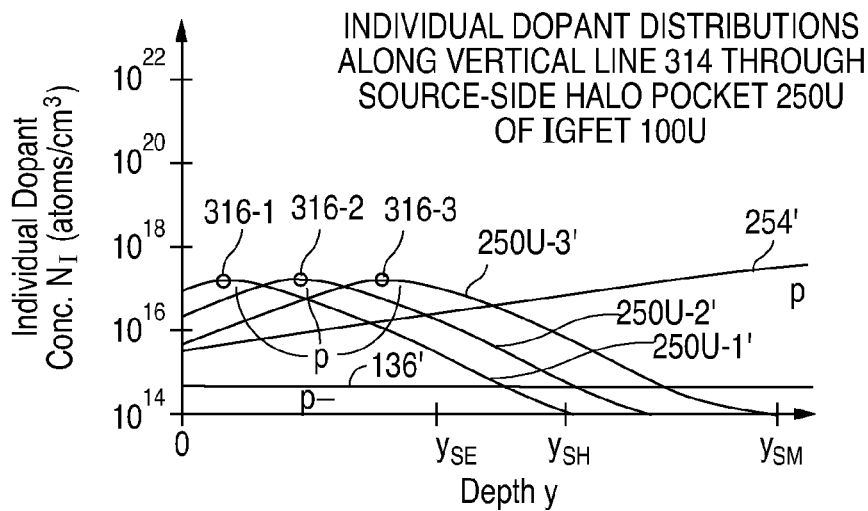

FIGS. 20a and 21a specifically illustrate concentrations $N_I$ (only vertical here) of the individual semiconductor dopants that largely define regions 136, 240E, 250U-1, 250U-2, 250U-3, and 254. Curves 250U-1', 250U-2', and 250U-3' represent concentrations $N_I$ of the first, second, and third p-type source halo dopants used to respectively determine maximum-concentration locations PH-1-PH-3 of halo pocket segments 250U-1-250U-3.

Figure 20B:
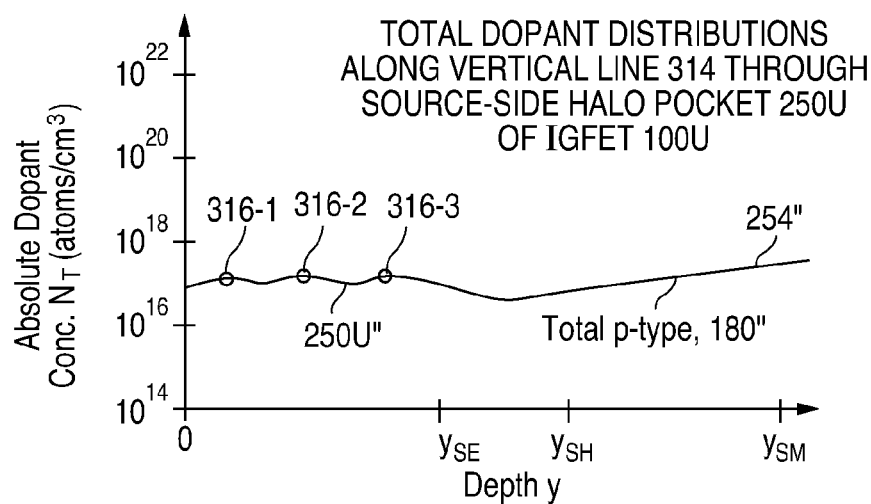

Concentrations $N_T$ (only vertical here) of the total p-type and total n-type dopants in regions 180, 240E, 250U, and 254 are depicted in FIGS. 20b and 21b. Curve portion 250U" represents concentration $N_T$ of the total p-type dopant in halo pocket portion 250U. With reference to FIGS. 21a and 21b, item 246# again indicates where net dopant concentration $N_N$ goes to zero and thus indicates the location of the portion of source-body junction 446 along source extension 240E.

Figure 20C:
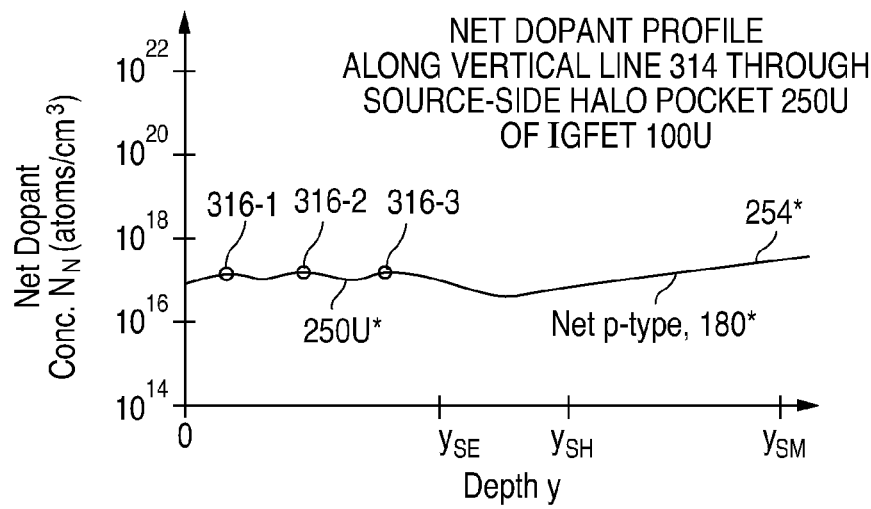

FIGS. 20c and 21c present net dopant concentrations $N_N$ (only vertical here) in p halo pocket portion 250U and n+ source extension 240E. Curve portion 250U* represents concentration $N_N$ of the net p-type dopant in halo pocket portion 250U.

Referring now specifically to FIG. 20a, curves 250U-1'-250U-3' vertically representing concentrations $N_I$ of the first, second, and third p-type source halo dopants along vertical line 314 are of roughly Gaussian shape to a first-order approximation. Curves 250U-1', 250U-2, and 250U-3' reach peaks respectively indicated by items 316-1, 316-2, and 316-3 (collectively "peaks 316"). Lowest-numbered peak 316-1 is the shallowest peak. Highest-numbered peak 316-3, or peak 316-M in general, is the deepest peak.

The vertical spacings (distances) between consecutive ones of peaks 316 in concentrations $N_I$ of the numbered p-type source halo dopants are relatively small. Also, the standard deviations for curves 250U-1'-250U-3' are relatively large compared to the peak-to-peak spacings. The depth of shallowest peak 316-1 is typically in the vicinity of one half of the average peak-to-peak spacing. The maximum values of concentrations $N_I$ of the first through third p-type source halo dopants at peaks 316 are normally close to one other, especially as vertical line 314 approaches source extension 240E. More particularly, concentrations $N_I$ at peaks 316 are normally within 40%, preferably within 20%, more preferably within 10%, of one another.

Each peak 316-j is one point of location PH-j of the jth local maximum in concentration $N_T$ of the total p-type dopant in halo pocket portion 250U along vertical line 314 as represented by curve portion 250U" in FIG. 20b. Because (a) the standard deviations for curves 250U-1'-250U-3' are relatively large compared to the spacings of consecutive ones of peaks 316, (b) the depth of shallowest peak 316-1 is typically in the vicinity of one half of the average peak-to-peak spacing, and (c) concentrations $N_I$ of the first through third p-type source halo dopants at peaks 316 are normally close to one another, the variation in concentration $N_T$ of the total p-type dopant in halo pocket 250U is normally relatively small in moving from the upper semiconductor surface along line 314 to location PH-M, i.e., location PH-3 in the example of FIG. 19a, of the deepest of the p-type local concentration maxima in halo pocket 250U. Consequently, the vertical profile in concentration $N_T$ of the total p-type dopant in halo pocket 250U is normally relatively flat in moving from the upper semiconductor surface to deepest maximum-concentration location PH-M in pocket 250U along an imaginary vertical line, such as line 314, extending through pocket 250U to the side of source extension 240E.

Concentration $N_T$ of the total p-type dopant in halo pocket portion 250U normally varies by a factor of no more than 2, preferably by a factor of no more than 1.5, more preferably by a factor of no more than 1.25, in moving from the upper semiconductor surface to location PH-M of the deepest of the local p-type concentration maxima in halo pocket 250U along an imaginary vertical line, such as vertical line 314, extending through pocket 250U to the side of source extension 240E. As shown by curve portion 250U" in FIG. 20b, the variation in concentration $N_T$ of the total p-type dopant in halo pocket 250U is so small along such an imaginary vertical line that halo-dopant maximum-concentration locations PH, as respectively represented by peaks 316, are often barely discernible on a logarithmic concentration graph such as that of FIG. 20b.

Vertical line 314 extends, as indicated in FIG. 19a, below halo pocket portion 250U and into the underlying material of empty-well body material 180. In addition, line 314 is chosen to be sufficiently far from n-type source 240, specifically n+ source extension 240E, that total n-type dopant concentration $N_T$ at any point along line 314 is essentially negligible compared to total p-type dopant concentration $N_T$ at that point. Referring to FIG. 20c, curve 180* representing net p-type dopant concentration $N_N$ in body material 180 along line 314 is thereby largely identical to curve 180" which, in FIG. 20b, represents total p-type dopant concentration $N_T$ in body material 180 along line 314. Consequently, portion 250U* of curve 180* in FIG. 20c is largely identical to portion 250U" of curve 180" in FIG. 20b.

In other words, the variation in concentration $N_N$ of the net p-type dopant in halo pocket portion 250U is also relatively small in moving from the upper semiconductor surface along vertical line 314 to location PH-M, again location PH-3 in the example of FIG. 19a, of the deepest of the local p-type concentration maxima in halo pocket 250U. Analogous to concentration $N_T$ of the total p-type dopant in halo pocket 250U, concentration $N_N$ of the net p-type dopant in halo pocket 250U normally varies by a factor of no more than 2, preferably by a factor of no more than 1.5, more preferably by a factor of no more than 1.25, in moving from the upper semiconductor surface to location PH-M of the deepest of the local p-type concentration maxima in pocket 250U along an imaginary vertical line, such as line 314, extending through pocket 250U to the side of source extension 240E. The vertical profile in concentration $N_N$ of the net p-type dopant in halo pocket 250U is thus relatively flat in moving from the upper semiconductor surface along such an imaginary vertical line to deepest maximum-concentration location PH-M in pocket 250U.

Concentrations $N_I$ of the numbered p-type source halo dopants vary considerably in moving longitudinally through halo pocket portion 250U while maintaining the general shape of the vertical profiles represented by curves 250U-1'-250U-3'. This can, as discussed further below, be seen by comparing FIG. 20a to FIG. 21a in which roughly Gaussian curves 250U-1'-250U-3' vertically representing concentrations $N_I$ of the first, second, and third p-type source halo dopants along vertical line 274E through source extension 240E and underlying material of halo pocket 250U reach peaks respectively indicated by items 318-1, 318-2, and 318-3 (collectively "peaks 318"). Lowest-numbered peak 318-1 is the shallowest peak. Highest-numbered peak 318-3, or peak 318-M in general, is the deepest peak.

Each peak 318-j is one point of location PH-j of the jth local maximum in concentration $N_T$ of the total p-type dopant in n+ source extension 240E or p halo pocket portion 250U along vertical line 274E as represented by curve portion 250U" in FIG. 21b. In the example of FIG. 21a, concentration $N_I$ of the jth p-type source halo dopant at each peak 318-j is less than concentration $N_I$ of the n-type shallow source-extension dopant, represented by curve 240E', at depth y of that peak 318-j. Since one or more of halo-dopant maximum-concentration locations PH can extend below source extension 240E, concentration $N_I$ of the jth p-type source halo dopant at one or more of peaks 318 can exceed concentration $N_I$ of the n-type shallow source-extension dopant at depth y of each of those one or more peaks 318.

In any event, curves 250U-1'-250U-3' in FIG. 21a bear largely the same relationship to one another as curves 250U-1'-250U-3' in FIG. 20a. The variation in concentration $N_T$ of the total p-type dopant is therefore normally relatively small in moving from the upper semiconductor surface along vertical line 274E to location PH-M, i.e., location PH-3 in FIG. 19a, of the deepest local p-type concentration maxima. As with concentration $N_T$ of the total p-type dopant along line 314 extending through halo pocket portion 250U, concentration $N_T$ of the total p-type dopant normally varies by a factor of no more than 2, preferably by a factor of no more than 1.5, more preferably by a factor of no more than 1.25, in moving from the upper semiconductor surface along line 274E to location PH-M of the deepest of the local p-type concentration maxima. The vertical profile in concentration $N_T$ of the total p-type dopant in is normally relatively flat from the upper semiconductor surface along line 274 to deepest maximum-concentration location PH-M.

Concentrations $N_N$ of the numbered p-type source halo dopants increase in moving laterally toward n+ source extension 240E due to the way in which halo pocket portion 250U is formed. This can be seen by comparing curves 250U-1'-250U'3' in FIG. 21a respectively to curves 250U-1'-250U-3' in FIG. 20a. Concentration $N_I$ of the jth p-type source halo dopant at each point 318-j of location PH-j intersecting line 274E in, or below, source extension 240 exceeds concentration $N_I$ of the jth p-type source halo dopant at corresponding point 316-j of location PH-j intersecting line 314 in halo pocket 250U. As seen by comparing curve portion 250U" in FIG. 21b to curve portion 250U" in FIG. 20b, concentration $N_T$ of the total p-type dopant at any point along the portion of line 274E extending through source extension 240E and the underlying material of halo pocket 250U thereby exceeds concentration $N_T$ of the total p-type dopant at the corresponding point along the portion of line 314 extending through pocket 250U.

In a variation of the special dopant distribution tailoring in halo pocket portion 250U, concentration $N_T$ of the total p-type dopant simply varies by a factor of no more than 2, preferably by a factor of no more than 1.5, more preferably by a factor of no more than 1.25, in moving from the upper semiconductor surface along vertical line 314 to a depth y of at least 50%, preferably at least 60%, of depth y of halo pocket 250U along line 314 without concentration $N_T$ of the total p-type dopant necessarily reaching multiple local maxima along the portion of line 314 in pocket 250U. The same applies to concentration $N_N$ of the net p-type dopant along vertical line 314 and to concentration $N_T$ of the total p-type dopant along line an imaginary vertical line, such as vertical line 274E, extending through source extension 240E and the underlying material of halo pocket 250U. Depth y of halo pocket 250U substantially equals its maximum depth $y_{SH}$ along line 274E but is less than maximum depth $y_{SH}$ along line 314.

Ideally, concentration $N_T$ of the total p-type dopant and concentration $N_N$ of the net p-type dopant are substantially constant from the upper semiconductor surface along vertical line 314 down to a depth y of at least 50%, preferably at least 60%, of depth y of halo pocket portion 250U along line 314. The same applies to concentration $N_T$ of the total p-type dopant along line an imaginary vertical line, such as vertical line 274E, extending through source extension 240E and the underlying material of halo pocket 250U.

Doping halo pocket portion 250U in either of the foregoing ways enables the vertical dopant profile in halo pocket 250U to be relatively flat near the upper semiconductor surface. As a result, less leakage current flows between source 240 and drain 242 when IGFET 100U is in its biased-off state without sacrificing drive current.

Moving to p-channel IGFET 102U, the dopant distribution in its n halo pocket portion 290U is similarly tailored so that the vertical dopant profile of the n-type source halo pocket dopant along substantially any imaginary vertical line extending perpendicular to the upper semiconductor surface through halo pocket 290U to the side of p-type source 280, specifically to the side of p+ source extension 280E, is relatively flat near the upper semiconductor surface. The substantial flatness in the vertical dopant profile of the n-type source halo pocket dopant near the upper semiconductor surface is achieved by arranging for concentration $N_I$ of the n-type source halo pocket dopant to reach a plural number M of local concentration maxima at M different locations vertically spaced apart from one another along such an imaginary vertical line. The M local maxima in concentration $N_I$ of the n-type source halo dopant for p-channel IGFET 102U respectively occur along M locations NH-1, NH-2, . . . and NH-M (collectively "locations NH") which progressively become deeper in going from shallowest halo-dopant maximum-concentration location NH-1 to deepest halo-dopant maximum-concentration location NH-M. Plural numbers M for IGFETs 100 and 102 can be the same or different.

Analogous to the segmentation of halo pocket portion 250U of n-channel IGFET 100, halo pocket portion 290U of p-channel IGFET 102U can be viewed as consisting of M vertically contiguous halo pocket segments 290U-1, 290U-2, . . . and 290U-M. Each halo pocket segment 290U-j contains the n-type source halo dopant concentration maximum occurring along halo-dopant maximum-concentration location NH-j. Halo pocket segment 290U-1 containing shallowest halo-dopant maximum-concentration location NH-1 is the shallowest of halo pocket segments 290U-1-290U-M. Halo pocket segment 290U-M containing deepest maximum-concentration location NH-1 is the deepest of segments 290U-1-290U-M.

The n-type source halo dopant is typically the same atomic species in all of halo pocket segments 290U-1-290U-M. Different species of the n-type source halo dopant can be variously present in halo pocket segments 290U-1-290U-M, especially since phosphorus and arsenic are generally readily available as atomic species for n-type semiconductor dopants.

Each halo-dopant maximum-concentration location NH-j normally arises from only one atomic species of the n-type source halo dopant. For this reason, the atomic species of the n-type source halo dopant used to produce maximum-concentration location NH-j in halo pocket segment 290U-j is referred to here as the jth n-type source halo dopant. Accordingly, there are M numbered n-type source halo dopants which are typically all the same atomic species but which can variously differ in atomic species. These M numbered n-type source halo dopants form the overall n-type source halo dopant generally referred to simply as the n-type source halo dopant.

As in the example of FIG. 19a, plural number M of local maxima in concentration $N_I$ of the n-type source halo dopant is 3 in the example of FIG. 19b. Segmented n halo pocket 290U in the example of FIG. 19b is thereby formed with three vertically contiguous halo pocket segments 290U-1-290U-3 respectively containing the n-type source halo dopant concentration maxima occurring along halo-dopant maximum-concentration locations NH-1-NH-3. There are three numbered n-type halo dopants respectively denominated as the first, second, and third n-type source halo dopants for respectively determining maximum-concentration locations NH-1-NH-3 of halo pocket segments 290U-1-290U-3 in FIG. 19b.

With the foregoing in mind, all the comments made about the dopant distributions in segments 250U-1-250U-M of p halo pocket portion 250U of n-channel IGFET 100U substantively apply respectively to segments 290U-1-290U-M of n halo pocket portion 290U of p-channel IGFET 102U with halo-dopant maximum-concentration locations NH of IGFET 102U respectively replacing halo-dopant maximum-concentration locations PH of IGFET 100U except as follows. Concentration $N_T$ of the total n-type dopant in halo pocket portion 290U normally varies by a factor of no more than 2.5, preferably by a factor of no more than 2, more preferably by a factor of no more than 1.5, in moving from the upper semiconductor surface to location NH-M of the deepest of the local p-type concentration maxima in halo pocket 290U along an imaginary vertical line extending through pocket 290U to the side of source extension 280E. The same applies to concentration $N_N$ of the net n-type dopant in halo pocket 290U along such an imaginary vertical line.

Similar to what occurs in n-channel IGFET 100U, the variation in concentration $N_T$ of the total n-type dopant in p-channel IGFET 102U is normally relatively small in moving from the upper semiconductor surface to location NH-M, i.e., location NH-3 in FIG. 19b, of the deepest local n-type concentration maxima along an imaginary vertical line extending through p+ drain extension 282E and through underlying material of n halo pocket portion 290U, e.g., an imaginary vertical line extending through the source side of gate electrode 302. As with concentration $N_T$ of the total n-type dopant along an imaginary vertical line extending through halo pocket 250U to the side of drain extension 282E, concentration $N_T$ of the total n-type dopant normally varies by a factor of no more than 2.5, preferably by a factor of no more than 2, more preferably by a factor of no more than 1.5, even more preferably by a factor of no more than 1.25, in moving from the upper semiconductor surface to location NH-M of the deepest of the local n-type concentration maxima along a vertical line extending through drain extension 282E and through the underlying material of halo pocket 290U. The vertical profile in concentration $N_T$ of the total n-type dopant in is normally relatively flat from the upper semiconductor surface along that vertical line to deepest maximum-concentration location NH-M.

As a variation similar to that described above for n-channel IGFET 100U, concentration $N_T$ of the total n-type dopant in IGFET 102U simply varies by a factor of no more than 2.5, preferably by a factor of no more than 2, more preferably by a factor of no more than 1.5, even more preferably by a factor of no more than 1.25, in moving from the upper semiconductor surface along an imaginary vertical line extending through halo pocket portion 290U to the side of source extension 280E to a depth y of at least 50%, preferably at least 60%, of depth y of halo pocket portion 290U without concentration $N_T$ of the total n-type dopant necessarily reaching multiple local maxima along the portion of that vertical line in halo pocket 290U. The same applies to concentration $N_N$ of the net n-type dopant along that vertical line and to concentration $N_T$ of the total n-type dopant along line an imaginary vertical line extending through source extension 280E and the underlying material of halo pocket 290U. Depth y of halo pocket 290U substantially equals its maximum depth $y_{SH}$ along an imaginary vertical line extending through source extension 280E and through the source side of gate electrode 302 but is less than maximum depth along an imaginary vertical line through pocket 290U to the side of source extension 280E.

Ideally, concentration $N_T$ of the total n-type dopant and concentration $N_N$ of the net n-type dopant are substantially constant from the upper semiconductor surface along an imaginary vertical line through halo pocket portion 290U to the side of source extension 280E down to a depth y of at least 50%, preferably at least 60%, of depth y of halo pocket portion 290U along that vertical line. The same applies to concentration $N_T$ of the total p-type dopant along line an imaginary vertical line extending through source extension 280E and the underlying material of halo pocket 290U.

Doping halo pocket portion 290U of p-channel IGFET 102U in the way arising from the preceding dopant distributions enables the vertical dopant profile in halo pocket 290U to be relatively flat near the upper semiconductor surface. A reduced amount of leakage current flows between source 280 and drain 282 of IGFET 102U when it is in its biased-off state. Importantly, the IGFET's drive current is maintained.

The principles of tailoring the vertical dopant profile in a source-side halo pocket portion are, of course, applicable to asymmetric IGFETs other than IGFETs 100U and 102U. Although one way of tailoring the dopant distribution in a source-side halo pocket of an asymmetric IGFET is to arrange for the vertical dopant profile in the halo pocket to be relatively flat from the upper semiconductor surface down to the subsurface location beyond which there is normally no significant off-state S-D current leakage, the vertical dopant distribution can be tailored in other location-dependent ways depending on the characteristics of the IGFET, particularly its source. For instance, the vertical dopant profile in the halo pocket can reach a plurality of local concentration maxima whose values are chosen so that the variation of the net dopant concentration in the halo pocket as a function of depth near the upper surface approximates a selected non-straight curve along an imaginary straight line through the halo pocket.

E. Extended-Drain IGFETs

E1. Structure of Extended-Drain N-Channel IGFET

The internal structure of asymmetric extended-drain extended-voltage complementary IGFETs 104 and 106 is described next. Expanded views of the cores of IGFETs 104 and 106 as depicted in FIG. 11.2 are respectively shown in FIGS. 22a and 22b.

Starting with n-channel IGFET 104, it has an n-type first S/D zone 320 situated in active semiconductor island 144A along the upper semiconductor surface as shown in FIGS. 11.2 and 22a. Empty main well 184B constitutes an n-type second S/D zone for IGFET 104. S/D zones 320 and 184B are often respectively referred to below as source 320 and drain 184B because they normally, though not necessarily, respectively function as source and drain.

Source 320 and drain 184B are separated by a channel zone 322 of p-type body material formed with p-type empty main well region 184A and p– substrate region 136. P-type empty-well body material 184A, i.e., portion 184A of total body material 184A and 136, forms a source-body pn junction 324 with n-type source 320. Pn junction 226 between n-type empty-well drain 184B and p-substrate region 136 is the drain-body junction for IGFET 104. Empty main well regions 184A and 184B are often respectively described below as empty-well body material 184A and empty-well drain 184B in order to clarify the functions of empty wells 184A and 184B.

N-type source 320 consists of a very heavily doped main portion 320M and a more lightly doped lateral extension 320E. External electrical contact to source 320 is made via n++ main source portion 320M. Although more lightly doped than main source portion 320M, lateral source extension 320E is still heavily doped in the present sub-μm CIGFET application. N+ source extension 320E terminates channel zone 322 along the upper semiconductor surface at the source side of IGFET 104.

N++ main source portion 320M extends deeper than source extension 320E. Accordingly, the maximum depth $y_S$ of source 320 is the maximum depth $y_{SM}$ of main source portion 320M. Maximum source depth $y_S$ for IGFET 104 is indicated in FIG. 22a. Main source portion 320M and source extension 320E are respectively defined with the n-type main S/D and shallow source-extension dopants.

A moderately doped halo pocket portion 326 of p-type empty-well body material 184A extends along source 320 up to the upper semiconductor surface and terminates at a location within body material 184A and thus between source 320 and drain 184B. FIGS. 11.2 and 22a illustrate the situation in which source 320, specifically main source portion 320M, extends deeper than p source-side halo pocket 326. Alternatively, halo pocket 326 can extend deeper than source 320. Halo pocket 326 then extends laterally under source 320. Halo pocket 326 is defined with the p-type source halo dopant.

The portion of p-type empty-well body material 184A outside source-side halo pocket portion 326 is indicated as item 328 in FIGS. 11.2 and 22a. In moving from the location of the deep p-type empty-well concentration maximum in body material 184A toward the upper semiconductor surface along an imaginary vertical line 330 through channel zone 322 outside halo pocket 326, the concentration of the p-type dopant in empty-well body-material portion 328 drops gradually from a moderate doping, indicated by symbol "p", to a light doping, indicated by symbol "p–". Dotted line 332 (only labeled in FIG. 22a) roughly represents the location below which the p-type dopant concentration in body-material portion 328 is at the moderate p doping and above which the p-type dopant concentration in portion 328 is at the light p– doping. The moderately doped part of body-material portion 328 below line 332 is indicated as p lower body-material part 328L in FIG. 22a. The lightly doped part of body-material portion 328 above line 332 is indicated as p– upper body-material part 328U in FIG. 22a.

The p-type dopant in p-type empty-well body-material portion 328 consists of the p-type empty main well dopant, the p-type background dopant of p− substrate region 136, and (near p halo pocket portion 326) the p-type source halo dopant. The concentration of the p-type background dopant is largely constant throughout the semiconductor body. Since the p-type empty main well dopant in p-type empty-well body material 184A reaches a deep subsurface concentration maximum along a subsurface location at average depth $y_{PWPK}$, the presence of the p-type empty main well dopant in body-material portion 328 causes the concentration of the total p-type dopant in portion 328 to reach a deep local subsurface concentration maximum substantially at the location of the deep subsurface concentration maximum in body material 184A. The deep subsurface concentration maximum in body-material portion 328, as indicated by the left-hand dash-and-double-dot line labeled "MAX" in FIG. 22a, extends laterally below the upper semiconductor surface and likewise occurs at average depth $y_{PWPK}$. The occurrence of the deep subsurface concentration maximum in body-material portion 328 causes it to bulge laterally outward. The maximum bulge in body-material portion 328, and thus in body material 184A, occurs along the location of the deep subsurface concentration maximum in portion 328 of body material 184A.

N-type empty-well drain 184B includes a very heavily doped external contact portion 334 situated in active semiconductor island 144B along the upper semiconductor surface. N++ external drain contact portion 334 is sometimes referred to here as the main drain portion because, similar to main source portion 320M, drain contact portion 334 is very heavily doped, is spaced apart from channel zone 332, and is used in making external electrical contact to IGFET 104. The portion of drain 184B outside n++ external drain contact portion/main drain portion 334 is indicated as item 336 in FIGS. 11.2 and 22a.

In moving from the location of the deep n-type empty-well concentration maximum in drain 184B toward the upper semiconductor surface along an imaginary vertical line 338 through island 144B, the concentration of the n-type dopant in drain 184B drops gradually from a moderate doping, indicated by symbol "n", to a light doping, indicated by symbol "n−". Dotted line 340 (only labeled in FIG. 22a) roughly represents the location below which the n-type dopant concentration in empty-well drain portion 336 is at the moderate n doping and above which the n-type dopant concentration in portion 336 is at the light n− doping. The moderately doped part of drain portion 336 below line 340 is indicated as n lower empty-well drain part 336L in FIG. 22a. The lightly doped part of drain portion 336 above line 340 is indicated as n− upper empty-well drain part 336U in FIG. 22a.

The n-type dopant in n-type empty-well drain portion 336 consists of the n-type empty main well dopant and (near n++ drain contact portion 334) the n-type main S/D dopant utilized, as described below, to form drain contact portion 334. Because the n-type empty main well dopant in n-type empty-well drain 184B reaches a deep subsurface concentration maximum at average depth $y_{NWPK}$, the presence of the n-type empty main well dopant in drain portion 336 causes the concentration of the total n-type dopant in portion 336 to reach a deep local subsurface concentration maximum substantially at the location of the deep subsurface concentration maximum in well 184B. The deep subsurface concentration maximum in drain portion 336, as indicated by the right-hand dash-and-double-dot line labeled "MAX" in FIG. 22a, extends laterally below the upper semiconductor surface and likewise occurs at average depth $y_{NWPK}$. The occurrence of the deep subsurface concentration maximum in empty-well drain portion 336 causes it to bulge laterally outward. The maximum bulge in drain portion 336, and therefore in empty-well drain 184B, occurs along the location of the deep subsurface concentration maximum in portion 336 of drain 184B.

A surface-adjoining portion 136A of p− substrate region 136 laterally separates empty-well body material 184A, specifically empty-well body-material portion 328, and empty-well drain 184B, specifically empty-well drain portion 336. Letting $L_{WW}$ represent the minimum separation distance between a pair of complementary (p-type and n-type) empty main wells of an extended drain IGFET such as IGFET 104, FIG. 22a indicates that minimum well-to-well separation distance $L_{WW}$ between empty-well body material 184A and empty-well drain 184B occurs generally along the locations of their maximum lateral bulges. This arises because average depths $y_{PWPK}$ and $y_{NWPK}$ of the deep subsurface concentration maxima in body material 184A and drain 184B are largely equal in the example of FIGS. 11.2 and 22a. A difference between depths $y_{PWPK}$ and $y_{NWPK}$ would typically cause the location of minimum well-to-well separation $L_{WW}$ for IGFET 104 to move somewhat away from the location indicated in FIG. 22a and to be somewhat slanted relative to the upper semiconductor surface rather than being fully lateral as indicated in FIG. 22a.

Well-separating portion 136A is lightly doped because it constitutes part of p− substrate region 136. The deep concentration maximum of the p-type dopant in p-type empty-well body material 184A occurs in its moderately doped lower part (328L). The deep concentration maximum of the n-type dopant in n-type empty-well drain 184B similarly occurs in its moderately doped lower part (336L). Hence, the moderately doped lower part (328L) of p-type body material 184A and the moderately doped lower part (336L) of n-type drain 184B are laterally separated by a more lightly doped portion of the semiconductor body.

Channel zone 322 (not specifically demarcated in FIG. 11.2 or 22a) consists of all the p-type monosilicon between source 320 and drain 184B. In particular, channel zone 322 is formed by a surface-adjoining segment of well-separating portion 136A, a surface-adjoining segment of the p− upper part (328U) of body-material portion 328, and (a) all of p halo pocket portion 326 if source 320 extends deeper than halo pocket 326 as illustrated in the example of FIGS. 11.2 and 22a or (b) a surface-adjoining segment of halo pocket 326 if it extends deeper than source 320. In any event, halo pocket 326 is more heavily doped p-type than the directly adjacent material of the p− upper part (328U) of body-material portion 328 in channel zone 322. The presence of halo pocket 326 along source 320 thereby causes channel zone 322 to be asymmetrically longitudinally graded. The presence of the surface-adjoining segment of well-separating portion 136A in channel zone 322 causes it to be further asymmetrically longitudinally graded.

Drain 184B extends below recessed field insulation 138 so as to electrically connect material of drain 184B in island 144A to material of drain 184B in island 144B. In particular, field insulation 138 laterally surrounds n++ drain contact portion 334 and an underlying more lightly doped portion 184B1 of empty-well drain 184B. A portion 138A of field insulation 138 thereby laterally separates drain contact portion 334 and more lightly doped underlying drain portion 184B1 from a portion 184B2 of drain 184B situated in island 144A. Drain portion 184B2 is continuous with p− well-separating portion 136A and extends up to the upper semiconductor surface. The remainder of drain 184B is identified as item 184B3 in FIG. 22a and consists of the n-type drain material extending from the bottoms of islands 144A and 144B down to the bottom of drain 184B. Since drain 184B extends below field insulation 138 and thus considerably deeper than source 320, the bottom of channel zone 322 slants considerably downward in moving from source 320 to drain 184B.

A gate dielectric layer 344 at the $t_{GdH}$ high thickness value is situated on the upper semiconductor surface and extends over channel zone 322. A gate electrode 346 is situated on gate dielectric layer 344 above channel zone 322. Gate electrode 346 extends partially over source 320 and drain 184B. More particularly, gate electrode 346 extends partially over source extension 320E but not over main source portion 320M. Gate electrode 346 extends over drain portion 184B2 and partway, typically approximately halfway, across field-insulation portion 138A toward drain contact portion 334. Dielectric sidewall spacers 348 and 350 are situated respectively along the opposite transverse sidewalls of gate electrode 346. Metal silicide layers 352, 354, and 356 are respectively situated along the tops of gate electrode 346, main source portion 320M, and drain contact portion 334.

Extended-drain IGFET 104 is in the biased-on state when (a) its gate-to-source voltage $V_{GS}$ equals or exceeds its positive threshold voltage $V_T$ and (b) its drain-to-source voltage $V_{DS}$ is at a sufficiently positive value as to cause electrons to flow from source 320 through channel 322 to drain 184B. When gate-to-source voltage $V_{GS}$ of IGFET 104 is less than its threshold voltage $V_T$ but drain-to-source voltage $V_{DS}$ is at a sufficiently positive value that electrons would flow from source 320 through channel 322 to drain 184B if gate-to-source voltage $V_{GS}$ equaled or exceeded its threshold voltage $V_T$ so as to make IGFET 104 conductive, IGFET 104 is in the biased-off state. There is no significant flow from source 320 through channel 322 to drain 184B as long as drain-to-source voltage $V_{DS}$ is not high enough to place IGFET 104 in a breakdown condition.

The doping characteristics of empty-well body material 184A and empty-well drain 184B cause the peak magnitude of the electric field in the monosilicon of extended-drain IGFET 104 to occur significantly below the upper semiconductor surface when IGFET 104 is in the biased-off state. During IGFET operation, IGFET 104 undergoes considerably less deterioration due to hot-carrier gate dielectric charging than a conventional extended-drain IGFET in which the peak magnitude of the electric field in the IGFET's monosilicon occurs along the upper semiconductor surface. The reliability of IGFET 104 is increased considerably.

E2. Dopant Distributions in Extended-Drain N-Channel IGFET

An understanding of how the doping characteristics of empty-well body material 184A and empty-well drain 184B enable the peak magnitude of the electric field in the monosilicon of extended-drain n-channel IGFET 104 to occur significantly below the upper semiconductor surface when IGFET 104 is in the biased-off state is facilitated with the assistance of FIGS. 23a-23c (collectively "FIG. 23"). FIG. 23 presents exemplary dopant concentrations as a function of depth y along vertical lines 330 and 338. Vertical line 330 passes through p-type body-material portion 328 of empty-well body material 184A up to the upper semiconductor surface and thus through body material 184A at a location outside source-side halo pocket portion 326. In passing through empty-well body-material portion 328, line 330 passes through the portion of channel zone 322 between halo pocket 326 and portion 136A of p− substrate 136 which constitutes part of the p-type body material of IGFET 104. Line 330 is sufficiently far from both halo pocket 326 and source 320 that neither the p-type source halo dopant of halo pocket 326 nor the n-type dopant of source 320 reaches line 330. Vertical line 338 passes through portion 184B2 of n-type empty-well drain 184B situated in island 144A. Line 338 also passes through underlying portion 184B3 of drain 184B.

Figure 23A:
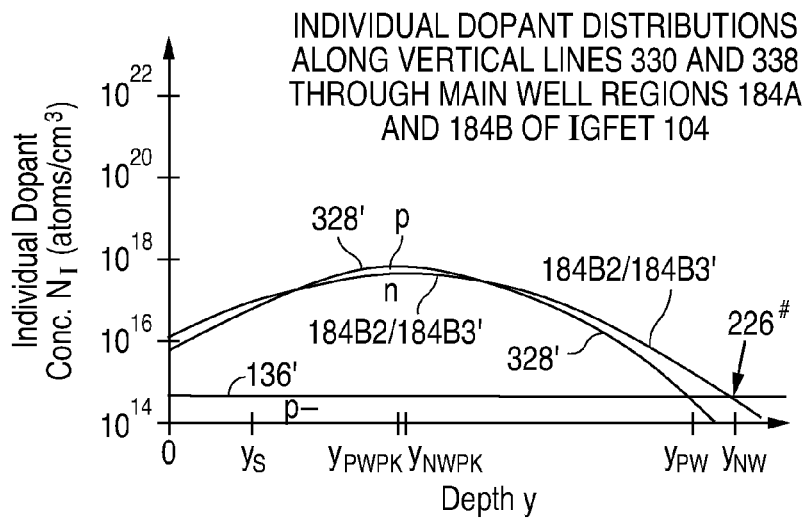

FIG. 23a specifically illustrates concentrations $N_I$, along vertical lines 330 and 338, of the individual semiconductor dopants that vertically define regions 136, 328, 184B2, and 184B3 and thus respectively establish the vertical dopant profiles in (a) p-type body-material portion 328 of empty-well body material 184A outside source-side halo pocket portion 326 and (b) portions 184B2 and 184B3 of n-type empty-well drain 184B. Curve 328' represents concentration $N_I$ (only vertical here) of the p-type empty main well dopant that defines p-type body-material portion 328 of empty-well body material 184A. Curve 184B2/184B3' represents concentration $N_I$ (also only vertical here) of the n-type empty main well dopant that defines portions 184B2 and 184B3 of n-type empty-well drain 184B. Item 226# indicates where net dopant concentration $N_N$ goes to zero and thus indicates the location of drain-body junction 226 between drain 184B and substrate region 136.

Figure 23B:
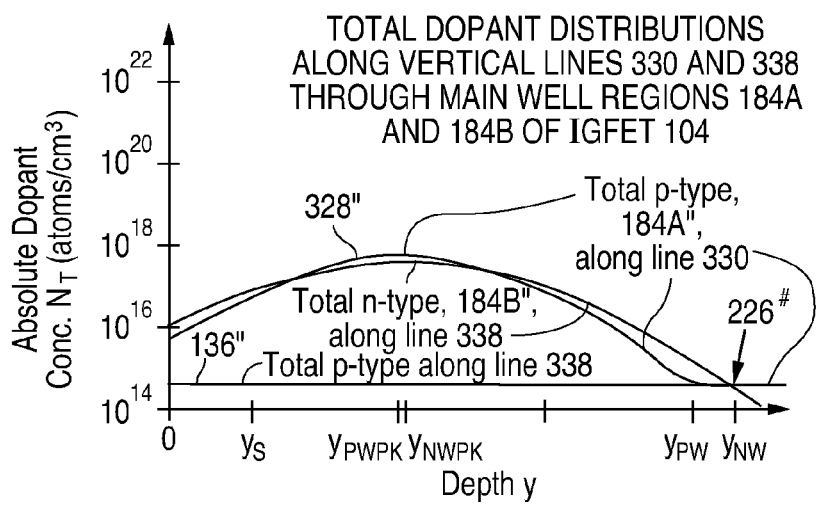

Concentrations $N_T$ of the total p-type and total n-type dopants in regions 136, 328, 184B2, and 184B3 along vertical lines 330 and 338 are depicted in FIG. 23b. Curve portion 328" corresponds to p-type body-material portion 328 of empty-well body material 184A. Curves 184A" and 184B" respectively correspond to empty-well body material 184A and empty-well drain 184B. Curve 184W" in FIG. 23b is identical to curve 184B2/184B3' in FIG. 23a.

Figure 23C:
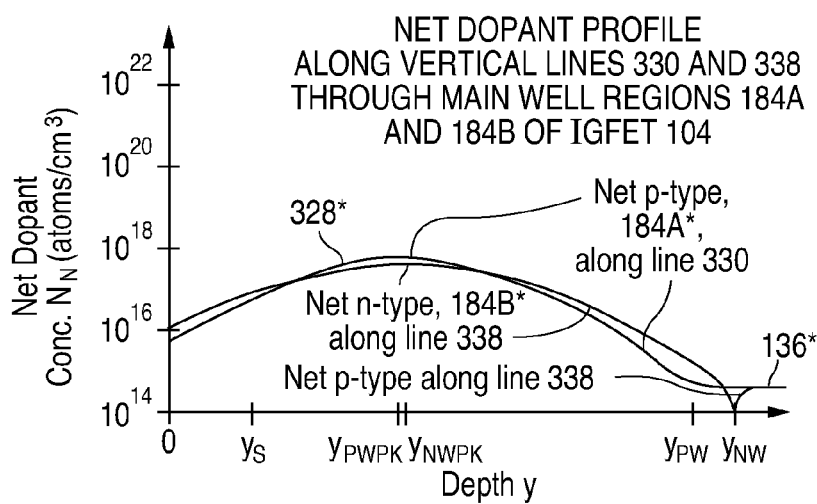

FIG. 23c presents net dopant concentration $N_N$ along vertical lines 330 and 338. Concentration $N_N$ of the net p-type dopant in body-material portion 328 of empty-well body material 184A is represented by curve segment 328*. Curves 184A* and 184B* respectively correspond to empty-well body material 184A and empty-well drain 184B. Curve 184A* in FIG. 23c is identical to curve 184A" in FIG. 23b.

Returning to FIG. 23a, curve 328' shows that concentration $N_I$ of the p-type empty well dopant in p-type empty-well body material 184A reaches a maximum concentration largely at average depth $y_{PWPK}$ along vertical line 330 through body-material portion 328 of body material 184A. Curve 184B2/184B3' similarly shows that concentration $N_I$ of the n-type empty main well dopant in portions 184B2 and 184B3 of n-type empty-well drain 184B reaches a maximum concentration largely at average depth $y_{NWPK}$ along vertical line 338 through portions 184B2 and 184B3 of drain 184B. The dopant concentration maxima largely at depths $y_{PWPK}$ and $y_{NWPK}$ in empty-well body material 184A and empty-well drain 184B arise, as mentioned above, from respective ion implantations of the p-type and n-type empty main well dopants. As also mentioned above, average empty main well maximum concentration depths $y_{PWPK}$ and $y_{NWPK}$ are normally very close to each other in value. P-type empty main well maximum concentration depth $y_{PWPK}$ here is typically slightly greater than n-type empty main well maximum concentration depth $y_{NWPK}$ as depicted in the example of FIG. 23a.

Both of empty main well maximum dopant concentration depths $y_{PWPK}$ and $y_{NWPK}$ of IGFET 104 are greater than maximum depth $y_S$ of source 320. Each of depths $y_{PWPK}$ and $y_{NWPK}$ is normally at least twice maximum source depth $y_S$ of IGFET 104 but normally no more than 10 times, preferably no more than 5 times, more preferably no more than 4 times, greater than source depth $y_S$ of IGFET 104. In the example of FIG. 23a, each depth $y_{PWPK}$ or $y_{NWPK}$ is 2-3 times source depth $y_S$.

Concentration $N_I$ of the p-type empty main well dopant, represented by curve 328' in FIG. 23a, decreases by at least a factor of 10, preferably by at least a factor of 20, more preferably by at least a factor of 40, in moving from the location of the maximum concentration of the p-type empty main well dopant at depth $y_{PWPK}$ upward along vertical line 330 through p-type empty-well body-material portion 328, including the portion of channel zone 322 between halo pocket portion 326 and portion 136A of p− substrate region 136, to the upper semiconductor surface. Similar to FIG. 18a, FIG. 23a presents an example in which concentration $N_I$ of the p-type empty main well dopant decreases by more than a factor of 80, in the vicinity of 100, in moving from the $y_{PWPK}$ location of the maximum concentration of the p-type empty main well dopant upward along line 330 through body-material portion 328 to the upper semiconductor surface.

The decrease in concentration $N_I$ of the p-type empty main well dopant is typically substantially monotonic in moving from the location of the maximum concentration of the p-type empty main well dopant at depth $y_{PWPK}$ upward along vertical line 330 to the upper semiconductor surface. If some pile-up of the p-type empty main well dopant occurs along the upper surface of the portion of channel zone 322 outside portion 136A of p− substrate region 136, concentration $N_I$ of the p-type empty main well dopant decreases substantially monotonically in moving from depth $y_{PWPK}$ along line 330 to a point no further from the upper semiconductor surface than 20% of maximum depth $y_S$ of source 320.

Curve 184A" which, in FIG. 23b, represents total p-type dopant concentration $N_T$ in p-type empty-well body material 184A consists of curve segment 328" and a segment of curve 136" in FIG. 23b. Curve segment 328" in FIG. 23b represents the sum of the corresponding portions of curves 328' and 136' in FIG. 23a. As a result, curve segment 328" in FIG. 23b represents concentration $N_N$ of the sum of the p-type empty main well and background dopants in p-type body-material portion 328.

A comparison of curves 328' and 136' in FIG. 23a shows that concentration $N_I$ of the p-type background dopant, represented by curve 136', is very small compared to concentration $N_I$ of the p-type empty main well dopant along vertical line 330 for depth y no greater than $y_{PWPK}$. As in IGFET 100, the highest ratio of concentration $N_I$ of the p-type background dopant to concentration $N_I$ of the p-type empty main well dopant in IGFET 104 along line 330 for depth y no greater than $y_{PWPK}$ occurs at the upper semiconductor surface where the p-type background dopant-to-p-type empty main well dopant concentration ratio is typically in the vicinity of 0.1. Accordingly, the total p-type dopant from depth $y_{PWPK}$ along line 330 to the upper semiconductor surface consists largely of the p-type empty main well dopant. Concentration $N_T$ of the total p-type dopant, represented by curve 184A" in FIG. 23b, thereby reaches a maximum largely at depth $y_{PWPK}$ along line 330 and has largely the same variation as concentration $N_I$ of the p-type empty main well dopant along line 330 for depth y no greater than $y_{PWPK}$.

Essentially no n-type dopant is present along vertical line 330 as indicated by the fact that curve 184A* which, in FIG. 23c, represents concentration $N_N$ of the net p-type dopant in body material 184A is identical to curve 184A" in FIG. 23b. Concentration $N_N$ of the net p-type dopant in empty-well body-material portion 328 of body material 184A repeats the variation in concentration $N_T$ of the total p-type dopant in portion 328 of body material 184A along vertical line 330. Accordingly, concentration $N_N$ of the net p-type dopant in portion 328 of body material 184A reaches a maximum at depth $y_{PWPK}$ along line 330.

Turning to n-type empty-well drain 184B for which concentration $N_I$ of the n-type empty main well dopant is represented by curve 184B2/184B3' in FIG. 23a, concentration $N_I$ of the n-type empty main well dopant similarly decreases by at least a factor of 10, preferably by at least a factor of 20, more preferably by at least a factor of 40, in moving from the location of the maximum concentration of the n-type empty main well dopant at depth $y_{NWPK}$ upward along vertical line 338 through portions 184B3 and 184B2 of empty-well drain 184B to the upper semiconductor surface. FIG. 23a presents an example in which concentration $N_I$ of the n-type empty main well dopant decreases by more than a factor of 80, in the vicinity of 100, in moving from the $y_{NWPK}$ location of the maximum concentration of the n-type empty main well dopant upward along line 338 through portions 184B3 and 184B2 of drain 184B to the upper semiconductor surface.

Concentration $N_I$ of the n-type empty main well dopant typically decreases substantially monotonically in moving from the location of the maximum concentration of the n-type empty main well dopant at depth $y_{NWPK}$ upward along vertical line 338 to the upper semiconductor surface. In the event that some pile-up of the n-type empty main well dopant occurs along the upper surface of portion 184B2 of empty-well drain 184B, concentration $N_I$ of the n-type empty main well dopant decreases substantially monotonically in moving from depth $y_{NWPK}$ along line 338 to a point no further from the upper semiconductor surface than 20% of maximum depth $y_S$ of source 320.

Curve 184B" in FIG. 23b represents total n-type dopant concentration $N_T$ in n-type empty-well drain 184B. Since curve 184B" is identical to curve 184B2/184B3' in FIG. 23a, concentration $N_T$ of the total n-type dopant reaches a maximum at depth $y_{NWPK}$ along vertical line 338 and varies the same along vertical line 338 through portions 184B2 and 184B3 of n-type empty-well drain 184B as concentration $N_I$ of the n-type empty-well dopant. Subject to net dopant concentration $N_N$ going to zero at source-body junction 226, curve 184B* in FIG. 23c shows that this variation carries over largely to net concentration $N_N$ along line 338 in portions 184B2 and 184B3 of empty-well drain 184B. Hence, concentration $N_N$ of the net n-type dopant in portions 184B2 and 184B3 of empty-well drain 184B also reaches a maximum at depth $y_{NWPK}$ along line 338.

E3. Operational Physics of Extended-Drain N-Channel IGFET

The foregoing empty-well characteristics enable extended-drain n-channel IGFET 104 to have the following device physics and operational characteristics. When IGFET 104 is in the biased-off state, the electric field in the IGFET's monosilicon reaches a peak value along drain-body junction 226 at a location determined by the proximity of empty well regions 184A and 184B to each other and by the maximum values of (a) concentration $N_T$ of the total p-type dopant in portion 328 of p-type empty-well body material 184A and (b) concentration $N_T$ the total n-type dopant in portions 184B2 and 184B3 of n-type empty-well drain 184B. Because depth $y_{PWPK}$ at the maximum value of concentration $N_T$ of the total p-type dopant in p-type empty-well body-material portion 328 normally approximately equals depth $y_{NWPK}$ at the maximum value of concentration $N_T$ of the total n-type dopant in portions 184B2 and 184B3 of n-type empty-well drain 184B and because empty wells 184A and 184B are closest to each other at depths $y_{PWPK}$ and $y_{NWPK}$, the peak value of the electric field in the monosilicon of IGFET 104 occurs approximately along drain-body junction 226 at depth $y_{NWPK}$. This location is indicated by circle 358 in FIG. 22a. Inasmuch as depth $y_{NWPK}$ is normally at least twice maximum depth $y_S$ of source 320, location 358 of the peak electric field in the monosilicon of IGFET 104 is normally at least twice maximum source depth $y_S$ of IGFET 104 when it is in the biased-off state.

When IGFET 104 is in the biased-on state, electrons flowing from source 320 to drain 184B initially travel in the monosilicon along the upper surface of the portion of channel zone 322 in empty-well body material 184A. Upon entering portion 136A of p-substrate region 136, the electrons move generally downward and spread out. Upon reaching drain 184B, the electron flow becomes distributed across the generally vertical portion of drain-body junction 226 in island 144A. The electron flow is also spread out laterally across portion 184B2 of drain 184B.

The velocities of the electrons, referred to as primary electrons, increase as they travel from source 320 to drain 184B, causing their energies to increase. Impact ionization occurs in drain 184B when highly energetic primary electrons strike atoms of the drain material to create secondary charge carriers, both electrons and holes, which travel generally in the direction of the local electric field. Some of the secondary charge carriers, especially the secondary holes, generated in the bulk region of high electric field travel upward toward the portion of dielectric layer 346 overlying portion 184B2 of drain 184B.

The amount of impact ionization generally increases as the electric field increases and as the current density of the primary electrons increases. The maximum amount of impact ionization occurs where the scalar product of the electric field vector and the primary electron current density vector is highest. By having the peak electric field occur along drain-body junction 226 at depth $y_{NWPK}$, impact ionization in drain 184B is forced significantly downward. The maximum amount of impact ionization in drain 184B normally occurs at a depth greater than maximum source depth $y_S$ of IGFET 104.

Compared to a conventional n-channel extended-drain IGFET of approximately the same size as IGFET 104, considerably fewer secondary charge carriers, especially secondary holes, generated by impact ionization in IGFET 104 reach the upper semiconductor surface with sufficient energy to enter gate dielectric layer 344. Hot carrier charging of gate dielectric 344 is considerably reduced. IGFET 104 thereby incurs much less threshold voltage drift caused by impact-ionization-generated charge carriers lodging in gate dielectric 344. The operating characteristics of IGFET 104 are very stable with operational time. The reliability and lifetime of IGFET 104 are considerably enhanced.

E4. Structure of Extended-Drain P-Channel IGFET

Extended-drain extended-voltage p-channel IGFET 106 is configured similarly to extended-drain extended-voltage n-channel IGFET 104. However, there are some notable differences due to the fact that deep n well 212 of p-channel IGFET does not reach the upper semiconductor surface.

Referring to FIGS. 11.2 and 22b, p-channel IGFET 106 has a p-type first S/D zone 360 situated in active semiconductor island 146A along the upper semiconductor surface. The combination of empty main well region 186B and a surface-adjoining portion 136B of p− substrate region 136 constitutes a p-type second S/D zone 186B/136B for IGFET 106. S/D zones 360 and 186B/136B are often respectively referred to below as source 360 and drain 186B/136B because they normally, though not necessarily, respectively function as source and drain.

Source 360 and drain 186B/136B are separated by a channel zone 362 of n-type body material formed with n-type empty main well region 186A and deep n well region 212. N-type empty-well body material 186A, i.e., portion 186A of total body material 186A and 212, forms a source-body pn junction 364 with p-type source 360. Deep n well 212 and n-type body material 186A form drain-body pn junction 228 with drain 186B/136B. One part of drain-body junction 228 is between deep n well 212 and p-type empty main well region 186B. Empty main well regions 186A and 186B are often respectively described below as empty-well body material 186A and empty-well drain material 186B in order to clarify the functions of empty wells 186A and 186B.

P-type source 360 consists of a very heavily doped main portion 360M and a more lightly doped, but still heavily doped, lateral extension 360E. External electrical contact to source 360 is made via p++ main source portion 360M. P+ source extension 360E terminates channel zone 362 along the upper semiconductor surface at the source side of IGFET 106.

Main source portion 360M extends deeper than source extension 360E. As a result, the maximum depth $y_S$ of source 360 is the maximum depth $y_{SM}$ of main source portion 360M. Maximum source depth $y_S$ for IGFET 106 is indicated in FIG. 22b. Main source portion 360M and source extension 360E are respectively defined with the p-type main S/D and shallow source-extension dopants.

A moderately doped halo pocket portion 366 of n-type empty-well body material 186A extends along source 360 up to the upper semiconductor surface and terminates at a location within body material 186A and thus between source 360 and drain 186B/136B. FIGS. 11.2 and 22b illustrate the situation in which source 360, specifically main source portion 360M, extends deeper than n source-side halo pocket 366. As an alternative, halo pocket 366 can extend deeper than source 360. In that case, halo pocket 366 extends laterally under source 360. Halo pocket 366 is defined with the n-type source halo dopant.

The portion of n-type empty-well body material 186A outside source-side halo pocket portion 366 is indicated as item 368 in FIGS. 11.2 and 22b. In moving from the location of the deep n-type empty-well concentration maximum in body material 186A toward the upper semiconductor surface along an imaginary vertical line 370 through channel zone 362 outside halo pocket 366, the concentration of the n-type dopant in body-material portion 368 drops gradually from a moderate doping, indicated by symbol "n", to a light doping, indicated by symbol "n−". Dotted line 372 (only labeled in FIG. 22b) roughly represents the location below which the n-type dopant concentration in body-material portion 368 is at the moderate n doping and above which the n-type dopant concentration in portion 368 is at the light n− doping. The moderately doped part of body-material portion 368 below line 372 is indicated as n lower body-material part 368L in FIG. 22b. The lightly doped part of body-material portion 368 above line 372 outside n halo pocket 366 is indicated as n-upper body-material part 368U in FIG. 22b.

The n-type dopant in n-type body-material portion 368 consists of the n-type empty main well dopant and (near n halo pocket portion 366) the n-type source halo dopant that forms halo pocket portion 366. Because the n-type empty main well dopant in n-type empty-well body material 186A reaches a deep subsurface concentration maximum along a subsurface location at average depth $y_{NWPK}$, the presence of the n-type empty main well dopant in body-material portion 368 causes the concentration of the total n-type dopant in portion 368 to reach a deep local subsurface concentration maximum substantially at the location of the deep subsurface concentration maximum in body material 186A. The deep subsurface concentration maximum in body-material portion 368, as indicated by the left-hand dash-and-double-dot line labeled "MAX" in FIG. 22b, extends laterally below the upper semiconductor surface and likewise occurs at average depth $y_{NWPK}$. The occurrence of the deep subsurface concentration maximum in body-material portion 368 causes it to bulge laterally outward. The maximum bulge in body-material portion 368, and thus in body material 186A, occurs along the location of the deep subsurface concentration maximum in portion 368 of body material 186A.

P-type drain 186B/136B, specifically empty-well drain material 186B, includes a very heavily doped external contact portion 374 situated in active semiconductor island 146B along the upper semiconductor surface. P++ external drain contact portion 374 is sometimes referred to here as the main drain portion because, similar to main source portion 360M, drain contact portion 374 is very heavily doped, is spaced apart from channel zone 372, and is used in making external electrical contact to IGFET 106. The portion of empty well 186B outside n++ external drain contact portion/main drain portion 374 is indicated as item 376 in FIGS. 11.2 and 22b.

In moving from the location of the deep p-type empty-well concentration maximum in empty well 186B toward the upper semiconductor surface along an imaginary vertical line 378 through island 146A, the concentration of the p-type dopant in drain 186B/136B drops gradually from a moderate doping, indicated by symbol "p", to a light doping, indicated by symbol "p–". Dotted line 380 (only labeled in FIG. 22b) roughly represents the location below which the p-type dopant concentration in empty-well drain portion 376 is at the moderate p doping and above which the p-type dopant concentration in portion 376 is at the light p– doping. The moderately doped part of drain portion 376 below line 380 is indicated as p lower empty-well drain part 376L in FIG. 22b. The lightly doped part of drain portion 376 above line 380 is indicated as p– upper empty-well drain part 376U in FIG. 22b.

The p-type dopant in p-type empty-well drain portion 376 consists of the p-type empty main well dopant, the largely constant p-type background dopant of p– substrate region 136, and (near p++ drain contact portion 374) the p-type main S/D dopant utilized, as described below, to form drain contact portion 374. Since the p-type empty main well dopant in p-type drain 186B/136B reaches a deep subsurface concentration maximum at average depth $y_{PWPK}$, the presence of the p-type empty main well dopant in drain portion 376 causes the concentration of the total p-type dopant in portion 376 to reach a deep local subsurface concentration maximum substantially at the location of the deep subsurface concentration maximum in well 186B. The deep subsurface concentration maximum in drain portion 376, as indicated by the right-hand dash-and-double-dot line labeled "MAX" in FIG. 22b, extends laterally below the upper semiconductor surface and likewise occurs at average depth $y_{PWPK}$. The occurrence of the deep subsurface concentration maximum in empty-well drain portion 376 causes it to bulge laterally outward. The maximum bulge in drain portion 376, and thus in empty well 186B, occurs along the location of the deep subsurface concentration maximum in portion 376 of well 186B.

The deep n well dopant used to form deep n well 212 reaches a maximum subsurface dopant concentration at average depth $y_{DNWPK}$ along a location extending laterally below main wells 186A and 186B and the doped monosilicon situated between wells 186A and 186B. Somewhat similar to how the dopant concentration in each well 186A or 186B changes in moving from the location of the maximum well dopant concentration toward the upper semiconductor surface, the concentration of the n-type dopant in deep n well 212 drops gradually from a moderate doping, indicated by symbol "n", to a light doping, indicated by symbol "n–", in moving from the location of the maximum dopant concentration maximum in well 212 toward the upper semiconductor surface along a selected imaginary vertical line extending through the monosilicon situated between main wells 186A and 186B. Dotted line 382 (only labeled in FIG. 22b) roughly represents the location below which the n-type dopant concentration in deep n well 212 is at the moderate n doping and above which the n-type dopant concentration in deep n well is at the light n– doping. The moderately doped part of deep n well 212 below line 382 is indicated as n lower well part 212L in FIG. 22b. The lightly doped part of deep n well 212 above line 382 is indicated as n– upper well part 212U in FIG. 22b.

Empty-well body material 186A, specifically empty-well body-material portion 368, and empty-well drain material 186B, specifically empty-well drain portion 376, are laterally separated by a well-separating portion of the semiconductor body. The well-separating portion for IGFET 106 consists of (a) the lightly doped upper part (212U) of deep n well 212 and (b) overlying drain portion 136B. FIG. 22b indicates that minimum well-to-well separation distance $L_{WW}$ between empty-well body material 186A and well 186B occurs generally along the locations of their maximum lateral bulges. This arises because average depths $y_{NWPK}$ and $y_{PWPK}$ of the deep subsurface concentration maxima in body material 186A and well 186B are largely equal in the example of FIGS. 11.2 and 22b. A difference between depths $y_{NWPK}$ and $y_{PWPK}$ would typically cause the location of minimum well-to-well separation $L_{WW}$ for IGFET 106 to move somewhat away from the location indicated in FIG. 22b and to be somewhat slanted relative to the upper semiconductor surface rather than being fully lateral as indicated in FIG. 22b.

Letting the well-separating portion for IGFET 106 be referred to as well-separating portion 212U/136B, drain portion 136B of well-separating portion 212U/136B is lightly doped p-type since portion 136B is part of p– substrate region 136. Part 212U of well-separating portion 212U/136B is lightly doped n-type since part 212U is the lightly doped upper part of deep n well 212. The deep concentration maximum of the n-type dopant in n-type empty-well body material 186A occurs in its moderately doped lower part (368L). The deep concentration of the p-type dopant in p-type empty well 186B similarly occurs in its moderately doped lower part (336L). Hence, the moderately doped lower part (368L) of n-type body material 186A and the moderately doped lower part (376L) of p-type well 186B are laterally separated by a more lightly doped portion of the semiconductor body.

Channel zone 362 (not specifically demarcated in FIG. 11.2 or 22b) consists of all the n-type monosilicon between source 360 and drain 186B/136B. In particular, channel zone 362 is formed by a surface-adjoining segment of the n– upper part (368U) of body-material portion 368, and (a) all of n halo pocket portion 366 if source 360 extends deeper than halo pocket 366 as illustrated in the example of FIGS. 11.2 and 22b or (b) a surface-adjoining segment of halo pocket 366 if it extends deeper than source 360. In any event, halo pocket 366 is more heavily doped n-type than the directly adjacent material of the n– upper part (368U) of body-material portion 368 in channel zone 362. The presence of halo pocket 366 along source 360 thereby causes channel zone 362 to be asymmetrically longitudinally graded.

Well region 186B of drain 186B/136B extends below recessed field insulation 138 so as to electrically connect material of drain 186B/136B in island 146A to material of drain 186B/136B in island 146B. In particular, field insulation 138 laterally surrounds p++ drain contact portion 374 and an underlying more lightly doped portion 186B1 of drain 186B/136B. A portion 138B of field insulation 138 thereby laterally separates drain contact portion 374 and more lightly doped underlying drain portion 186B1 from a portion 186B2 of well 186B situated in island 146A. Drain portion 186B2 is continuous with lightly doped well-separating portion 212U/136B and extends up to the upper semiconductor surface. The remainder of well 186B is identified as item 186B3 in FIG. 22*b* and consists of the n-type drain material extending from the bottoms of islands 146A and 146B down to the bottom of well 186B.

A gate dielectric layer 384 at the $t_{GdH}$ high thickness value is situated on the upper semiconductor surface and extends over channel zone 362. A gate electrode 386 is situated on gate dielectric layer 384 above channel zone 362. Gate electrode 386 extends partially over source 360 and drain 186B/136B. More particularly, gate electrode 386 extends partially over source extension 360E but not over main source portion 360M. Gate electrode 386 extends over drain portions 136B and 186B2 and partway, typically approximately halfway, across field-insulation portion 138B toward drain contact portion 374. Dielectric sidewall spacers 388 and 390 are situated respectively along the opposite transverse sidewalls of gate electrode 386. Metal silicide layers 392, 394, and 396 are respectively situated along the tops of gate electrode 386, main source portion 360M, and drain contact portion 374.

Extended-drain IGFET 106 is in the biased-on state when (a) its gate-to-source voltage $V_{GS}$ equals or is less than its negative threshold voltage $V_T$ and (b) its drain-to-source voltage $V_{DS}$ is at a sufficiently negative value as to cause holes to flow from source 360 through channel 362 to drain 186B/136B. When gate-to-source voltage $V_{GS}$ of IGFET 106 exceeds its threshold voltage $V_T$ but drain-to-source voltage $V_{DS}$ is at a sufficiently negative value that holes would flow from source 360 through channel 362 to drain 186B/136B if gate-to-source voltage $V_{GS}$ equaled or were less than its threshold voltage $V_T$ so as to make IGFET 106 conductive, IGFET 106 is in the biased-off state. There is no significant flow of holes from source 360 through channel 362 to drain 186B/136B as long as drain-to-source voltage $V_{DS}$ is not low enough, i.e., of a sufficiently high negative value, to place IGFET 106 in a breakdown condition.

The doping characteristics of empty-well body material 186A and empty well region 186B of drain 186B/136B are likewise of such a nature that the peak magnitude of the electric field in the monosilicon of IGFET 106 occurs significantly below the upper semiconductor surface when IGFET 106 is in the biased-off state. Consequently, IGFET 104 undergoes considerably less deterioration during IGFET operation due to hot-carrier gate dielectric charging than a conventional extended-drain IGFET whose electric field reaches a maximum in the monosilicon along the upper semiconductor surface. IGFET 106 has considerably enhanced reliability.

E5. Dopant Distributions in Extended-Drain P-Channel IGFET

The empty-well doping characteristics that cause the peak magnitude of the electric field in the monosilicon of extended-drain p-channel IGFET 106 to occur significantly below the upper semiconductor surface when IGFET 106 is in the biased-off state are quite similar to the empty-well doping characteristics of extended-drain n-channel IGFET 104.

An understanding of how the doping characteristics of empty-well body material 186A and empty-well region 186B of drain 186B/136B enable the peak magnitude of the electric field in the monosilicon of IGFET 106 to occur significantly below the upper semiconductor surface when IGFET 106 is in the biased-off state is facilitated with the assistance of FIGS. 24*a*-24*c* (collectively "FIG. 24"). Exemplary dopant concentrations as a function of depth y along vertical lines 370 and 378 are presented in FIG. 24. Vertical line 370 passes through n-type body-material portion 368 of empty-well body material 186A up to the upper semiconductor surface and thereby through body material 186A at a location outside source-side halo pocket portion 366. In passing through empty-well body-material portion 368, line 370 passes through the portion of channel zone 362 outside halo pocket 366. Line 370 is sufficiently far from both halo pocket 366 and source 360 that neither the n-type source halo dopant of halo pocket 366 nor the p-type dopant of source 360 reaches line 370. Vertical line 378 passes through portion 186B2 of empty-well region 186B of n-type drain 186B/136B situated in island 146B. Line 378 also passes through underlying portion 186B3 of region 186B of drain 186B/136B.

Figure 24A:
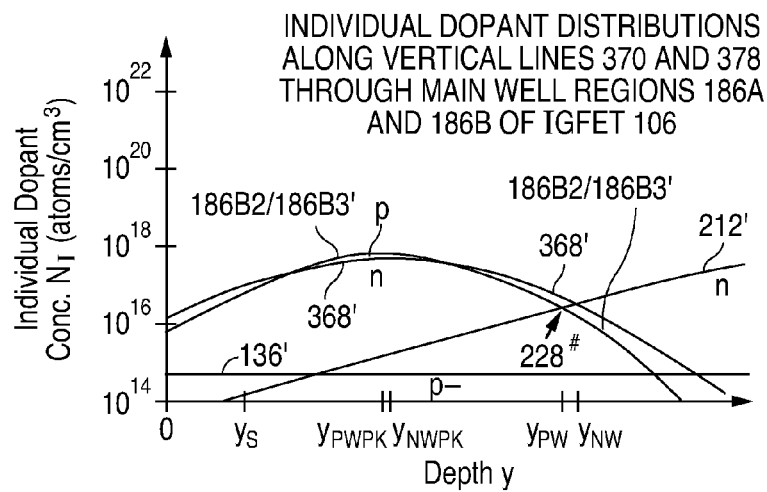
FIGS. 24a-24c are respective graphs of individual, total, and net dopant concentrations as a function of depth along a pair of imaginary vertical lines respectively through the main well regions of the extended-drain n-channel IGFET of FIG. 22b.

FIG. 24*a* specifically illustrates concentrations $N_I$, along vertical lines 370 and 378, of the individual semiconductor dopants that vertically define regions 136, 212, 368, 186B2, and 186B3 and thus respectively establish the vertical dopant profiles in (a) n-type body-material portion 368 of empty-well body material 186A outside source-side halo pocket portion 366 and (b) portions 186B2 and 186B3 of empty-well region 184B of p-type drain 186B/136B. Curve 368' represents concentration $N_I$ (only vertical here) of the n-type empty main well dopant that defines n-type body-material portion 368 of empty-well body material 186A. Curve 186B2/186B3' represents concentration $N_I$ (also only vertical here) of the p-type empty main well dopant that defines portions 186B2 and 186B3 of p-type empty well 186B. Curve 212' represents concentration $N_I$ (likewise only vertical here) of the deep n well dopant that defines deep n well region 212. Item 228[#] indicates where net dopant concentration $N_N$ goes to zero and thus indicate the location of drain-body junction 228 between drain 186B/136B and deep n well 212.

Figure 24B:
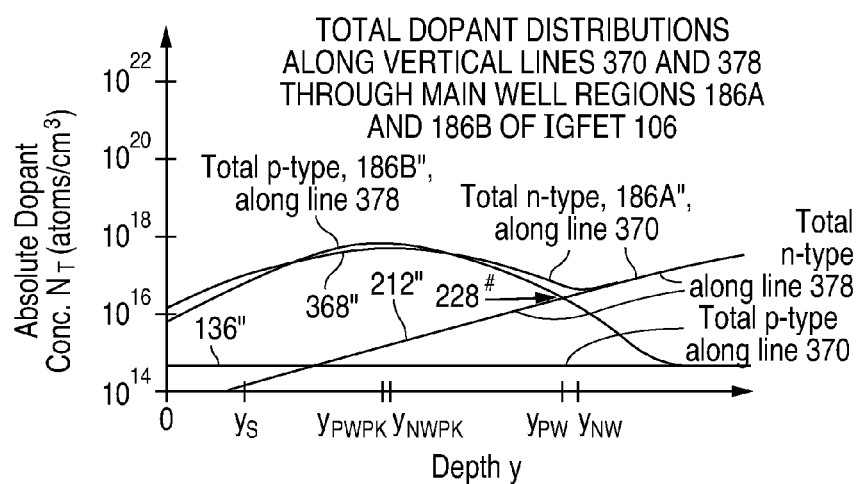

Concentrations $N_T$ of the total p-type and total n-type dopants in regions 136, 212, 368, 186B2, and 186B3 along vertical lines 370 and 378 are depicted in FIG. 24*b*. Curves 186A" and 186B" respectively correspond to empty-well body material 186A and empty-well drain material 186B. Curve segment 368" corresponds to n-type body-material portion 368 of empty-well body material 186A and constitutes part of curve 186A". Curve 212" corresponds to deep n well region 212 and is identical to curve 212' in FIG. 24*a*.

Figure 24C:
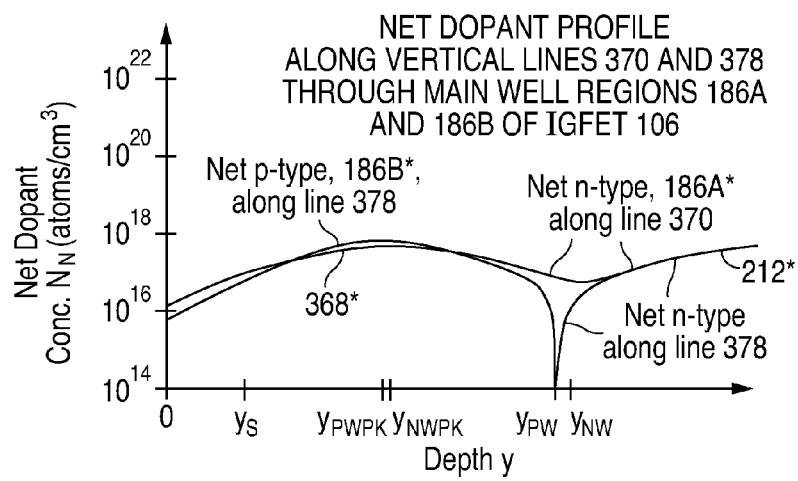

FIG. 24*c* presents net dopant concentration $N_N$ along vertical lines 370 and 378. Concentration $N_N$ of the net n-type dopant in body-material portion 368 of empty-well body material 186A is represented by curve segment 368*. Curves 186A* and 186B* respectively correspond to empty-well body material 186A and empty-well body material 186B. Curve 212* corresponds to deep n well region 212.

Referring to FIG. 24*a*, curve 368' shows that concentration $N_I$ of the n-type empty well dopant in n-type empty-well body material 186A reaches a maximum concentration largely at average depth $y_{NWPK}$ along vertical line 370 through body-material portion 368 of body material 186A. Curve 186B2/186B3' similarly shows that concentration $N_I$ of the p-type empty main well dopant in portions 186B2 and 186B3 of empty well 186B of n-type drain 186B/136B reaches a maximum concentration largely at average depth $y_{PWPK}$ along vertical line 378 through portions 186B2 and 186B3 of empty well 186B. The dopant concentration maxima largely at roughly equal depths $y_{NWPK}$ and $y_{PWPK}$ in empty-well body material 186A and empty well 186B arise, as mentioned above, from respective ion implantations of the n-type and p-type empty main well dopants.

Both of empty main well maximum dopant concentration depths $y_{NWPK}$ and $y_{PWPK}$ of IGFET 106 are greater than maximum depth $y_S$ of source 360. Each of depths $y_{NWPK}$ and $y_{PWPK}$ is normally at least twice maximum source depth $y_S$ of IGFET 106 but normally no more than 10 times, preferably no more than 5 times, more preferably no more than 4 times, greater than source depth $y_S$ of IGFET 106. Each depth $y_{PWPK}$ or $y_{NWPK}$ is typically 2-4 times source depth $y_S$.

Concentration $N_I$ of the n-type empty main well dopant, represented by curve 368' in FIG. 24a, decreases by at least a factor of 10, preferably by at least a factor of 20, more preferably by at least a factor of 40, in moving from the location of the maximum concentration of the n-type empty main well dopant at depth $y_{NWPK}$ upward along vertical line 370 through n-type empty-well body-material portion 368, including the portion of channel zone 362 outside halo pocket portion 366, to the upper semiconductor surface. Similar to FIG. 23a, FIG. 24a illustrates an example in which concentration $N_I$ of the n-type empty main well dopant decreases by more than a factor of 80, in the vicinity of 100, in moving from the $y_{NWPK}$ location of the maximum concentration of the n-type empty main well dopant upward along line 370 through body-material portion 368 to the upper semiconductor surface.

The decrease in concentration $N_I$ of the n-type empty main well dopant is typically substantially monotonic in moving from the location of the maximum concentration of the n-type empty main well dopant at depth $y_{NWPK}$ upward along line 370 to the upper semiconductor surface. If some pile-up of the n-type empty main well dopant occurs along the upper surface of channel zone 362, concentration $N_I$ of the n-type empty main well dopant decreases substantially monotonically in moving from depth $y_{NWPK}$ along line 370 to a point no further from the upper semiconductor surface than 20% of maximum depth $y_S$ of source 360.

The deep n well dopant, whose concentration $N_I$ is represented by curve 212' in FIG. 24a, is present in n-type body-material portion 368 of empty-well body material 186A. Comparison of curves 212' and 368' shows that concentration $N_I$ of the deep n well dopant is very small compared to concentration $N_I$ of the n-type empty main well dopant along vertical line 370 for depth y no greater than $y_{NWPK}$. Per examination of curve segment 368" in FIG. 23b, concentration $N_T$ of the total n-type dopant in body-material portion 368 thus reaches a maximum largely at depth $y_{NWPK}$ along line 370 and has largely the same variation as concentration $N_I$ of the n-type empty main well dopant along line 370 for depth y no greater than $y_{NWPK}$.

Concentration $N_N$ of the net n-type dopant in body-material portion 368 of body material 186A, represented by curve 186A\* (including segment 368\*) in FIG. 24c, has a subtractive factor due to the p-type background dopant. Since concentration $N_I$ of the p-type background dopant is substantially constant, concentration $N_N$ of the net p-type dopant in empty-well body-material portion 368 has the same variation as concentration $N_T$ of the total p-type dopant in body-material portion 368 along vertical line 370. This is evident from the fact that curve 186A\* in FIG. 24c varies largely the same as curve 186A" (including segment 368") which, in FIG. 24b, represents concentration $N_T$ of the total n-type dopant in body material 186A along line 370. Accordingly, concentration $N_N$ of the net n-type dopant in body-material portion 368 of body material 186A largely reaches a maximum at depth $y_{NWPK}$ along line 370.

Moving to p-type empty well region 186B of drain 186B/136B for which concentration $N_I$ of the p-type empty main well dopant is represented by curve 186B2/186B3' in FIG. 24a, concentration $N_I$ of the p-type empty main well dopant decreases by at least a factor of 10, preferably by at least a factor of 20, more preferably by at least a factor of 40, in moving from the location of the maximum concentration of the p-type empty main well dopant at depth $y_{PWPK}$ upward along vertical line 378 through portions 186B3 and 186B2 of drain 186B/136B to the upper semiconductor surface. As with concentration $N_I$ of the n-type empty main well dopant, FIG. 24a presents an example in which concentration $N_I$ of the p-type empty main well dopant decreases by more than a factor of 80, in the vicinity of 100, in moving from the $y_{PWPK}$ location of the maximum concentration of the p-type empty main well dopant upward along line 378 through drain portions 186B3 and 186B2 to the upper semiconductor surface.

The decrease in concentration $N_I$ of the p-type empty main well dopant is typically substantially monotonic in moving from the location of the maximum concentration of the p-type empty main well dopant at depth $y_{PWPK}$ upward along line 378 to the upper semiconductor surface. If some pile-up of the p-type empty main well dopant occurs along the upper surface of portion 186B2 of drain 186B/136B, concentration $N_I$ of the p-type empty main well dopant decreases substantially monotonically in moving from depth $y_{PWPK}$ along line 378 to a point no further from the upper semiconductor surface than 20% of maximum depth $y_S$ of source 360.

In regard to the presence of p-type background dopant in p-type drain 186B/136B, the highest ratio of concentration $N_I$ of the p-type background dopant to concentration $N_I$ of the p-type empty main well dopant along vertical line 378 for depth y no greater than $y_{PWPK}$ occurs at the upper semiconductor surface where the p-type background dopant-to-p-type empty main well dopant concentration ratio is typically in the vicinity of 0.1. The total p-type dopant from depth $y_{PWPK}$ along line 378 to the upper semiconductor surface consists largely of the p-type empty main well dopant. Accordingly, concentration $N_T$ of the total p-type dopant in portions 186B2 and 186B3 of empty well region 186B, represented by curve 186W' in FIG. 24b, largely reaches a maximum at depth $y_{PWPK}$ along line 378 and has largely the same variation as concentration $N_I$ of the p-type empty main well dopant along line 378 for depth y no greater than $y_{PWPK}$.

The deep n well dopant is also present in p-type drain 186B/136B. Subject to net dopant concentration $N_N$ going to zero at source-body junction 228, net concentration $N_N$ in portions 186B2 and 186B3 of empty-well region 186B, represented by curve 186B\* in FIG. 24c, varies largely the same as concentration $N_T$ of the total p-type dopant in portions 186B2 and 186B3 of empty well region 186B along vertical line 378 for depth y no greater than $y_{PWPK}$. Concentration $N_N$ of the net p-type dopant in portions 186B2 and 186B3 of drain 186B/136B thus also largely reaches a maximum at depth $y_{NWPK}$ along line 378.

E6. Operational Physics of Extended-Drain P-Channel IGFET

Extended-drain p-channel IGFET 106 has very similar device physics and operational characteristics to extended-drain n-channel IGFET 104 subject to the voltage and charge polarities being reversed. The device physics and operation of IGFETS 104 and 106 do not differ significantly due to the fact the portion 136B of p– substrate 136 forms part of p-type drain 186B/136B of IGFET 106 whereas similarly located portion 136A of substrate 136 forms part of the overall p-type body material for IGFET 104. The drain characteristics of IGFET 106 are determined more by the substantial p-type doping in portions 186B2 and 1863 of empty well region 186B of drain 186B/136B than by the lighter p-type doping in substrate portion 136B.

When IGFET 106 is in the biased-off state, the electric field in the IGFET's monosilicon reaches a peak value along drain-body junction 228 at a location determined by the proximity of empty well regions 186A and 186B to each other and by the maximum values of (a) the concentration of the total n-type dopant in portion 368 of n-type empty-well body material 186A and (b) the concentration of the total p-type dopant in portions 186B2 and 186B3 of p-type empty-well drain material 186B of drain 186B/136B. Because depth $y_{NWPK}$ at the maximum concentration of the total n-type dopant in n-type empty-well body-material portion 368 normally approximately equals depth $y_{NWPK}$ at the maximum concentration of the total p-type dopant in portions 186B2 and 186B3 of p-type drain 186B/136B and because empty wells 186A and 186B are closest to each other at depths $y_{NWPK}$ and $y_{PWPK}$, the peak value of the electric field in the monosilicon of IGFET 106 occurs approximately along drain-body junction 228 at depth $y_{NWPK}$. This location is indicated by circle 398 in FIG. 22b. Since depth $y_{PWPK}$ is normally at least twice maximum depth $y_S$ of source 360, location 398 of the peak electric field in the monosilicon of IGFET 106 is normally at least twice maximum source depth $y_S$ of IGFET 106 when it is in the biased-off state.

Holes moving in one direction essentially constitute electrons moving away from dopant atoms in the opposite direction. Upon placing IGFET 106 in the biased-on state, holes flowing from source 360 to drain 186B/136B initially travel in the monosilicon along the upper surface of the portion of channel zone 362 in empty-well body material 186A. As the holes enter p− substrate portion 136B of drain 186B/136B, they generally move downward and spread out. The holes move downward further and spread out more as they enter portion 186B2 of drain 186B/136B.

The velocities of the holes, referred to as primary holes, increase as they travel from source 360 to drain 186B/136B, causing their energies to increase. Impact ionization occurs in drain 186B/136B when highly energetic charge carriers strike atoms of the drain material to create secondary charge carriers, once again both electrons and holes, which travel generally in the direction of the local electric field. Some of the secondary charge carriers, especially the secondary electrons, generated in the bulk region of high electric field travel upward toward the portion of dielectric layer 386 overlying drain portion 186B2.

The amount of impact ionization generally increases with increasing electric field and with increasing primary hole current density. In particular, the maximum amount of impact ionization occurs generally where the scalar product of the electric field vector and the primary hole current density vector is highest. Because the peak electric field occurs along drain-body junction 228 at depth $y_{PWPK}$, impact ionization in drain 186B/136B is forced significantly downward. The highest amount of impact ionization in drain 186B/136B normally occurs at a depth greater than maximum source depth $y_S$ of IGFET 106.

In comparison to a conventional extended-drain p-channel IGFET of approximately the same size as IGFET 106, considerably fewer secondary charge carriers, especially secondary electrons, generated by impact ionization in IGFET 106 reach gate dielectric layer 384. As a result, gate dielectric 384 incurs considerable less hot carrier charging. Threshold voltage drift resulting from impact-ionization-generated electrons lodging in gate dielectric 386 is greatly reduced in IGFET 106. Its operating characteristics are very stable with operational time. The net result is that IGFET 106 has considerably enhanced reliability and lifetime.

E7. Common Properties of Extended-Drain IGFETs

Looking now at extended-drain IGFETs 104 and 106 together, let the conductivity type of p-type empty-well body material 184A of IGFET 104 or n-type empty-well body material 184B of IGFET 106 be referred to as the "first" conductivity type. The other conductivity type, i.e., the conductivity type of n-type source 320 and drain 184B of IGFET 104 or the conductivity type of p-type source 360 and drain 186B/136B for IGFET 104, is then the "second" conductivity type. The first and second conductivity types thus respectively are p-type and n-type for IGFET 104. For IGFET 106, the first and second conductivity types respectively are n-type and p-type.

Concentration $N_T$ of the total p-type dopant in empty-well body material 184A of IGFET 104 decreases, as mentioned above, in largely the same way as concentration $N_I$ of the p-type empty main well dopant in moving from depth $y_{PWPK}$ along vertical line 330 through body-material portion 328 of body material 184A to the upper semiconductor surface. As further mentioned above, concentration $N_T$ of the total n-type dopant in empty-well body material 186A of IGFET 106 similarly decreases in substantially the same way as concentration $N_I$ of the n-type empty main well dopant in moving from depth $y_{NWPK}$ along vertical line 370 through body-material portion 368 of body material 186A to the upper semiconductor surface. Since the first conductivity type is p-type for IGFET 104 and n-type for IGFET 106, IGFETS 104 and 106 have the common feature that the concentration of the total dopant of the first conductivity type in IGFET 104 or 106 decreases by at least a factor of 10, preferably by at least a factor of 20, more preferably by at least a factor of 40, in moving from the subsurface location of the maximum concentration of the total dopant of the first conductivity type at depth $y_{PWPK}$ or $y_{NWPK}$ upward along line 330 or 370 to the upper semiconductor surface.

The concentration decrease of the total dopant of the first conductivity type in IGFET 104 or 106 is substantially monotonic in moving from the location of the maximum concentration of the total dopant of the first conductivity type at depth $y_{PWPK}$ or $y_{NWPK}$ upward along vertical line 330 or 370 to the upper semiconductor surface. If some pile-up of the total dopant of the first conductivity type occurs along the upper surface of empty-well body material 328 or 368, the concentration of the total dopant of the first conductivity type decreases substantially monotonically in moving from depth $y_{PWPK}$ or $y_{NWPK}$ along line 330 or 370 to a point no further from the upper semiconductor surface than 20% of maximum depth $y_S$ of source-body junction 324 or 364.

Additionally, concentration $N_T$ of the total n-type dopant in empty-well drain 184B of IGFET 104 decreases, as mentioned above, in largely the same way as concentration $N_I$ of the n-type empty main well dopant in moving from depth $y_{NWPK}$ along vertical line 338 through portions 184B2 and 184B3 of drain 184B to the upper semiconductor surface. As also mentioned above, the concentration of the total p-type dopant in empty-well drain material 186B of IGFET 106 similarly decreases in largely the same way as the concentration of the p-type empty main well dopant in moving from depth $y_{PWPK}$ along vertical line 378 through portions 186B2 and 186B3 of drain 186B/136B to the upper semiconductor surface. Accordingly, IGFETs 104 and 106 have the further common feature that the concentration of the total dopant of the second conductivity type in IGFET 104 or 106 decreases by at least a factor of 10, preferably by at least a factor of 20, more preferably by at least a factor of 40, in moving from the subsurface location of the maximum concentration of the total dopant of the second conductivity type at depth $y_{NWPK}$ or $y_{PWPK}$ upward along line 338 or 378 to the upper semiconductor surface.

The concentration decrease of the total dopant of the second conductivity type in IGFET 104 or 106 is substantially monotonic in moving from the location of the maximum concentration of the total dopant of the first conductivity type at depth $y_{NWPK}$ or $y_{PWPK}$ upward along vertical line 338 or 378 to the upper semiconductor surface. If some of the total dopant of the first conductivity type piles up along the upper surface of drain portion 184B2 or 186B2, the concentration of the total dopant of the second conductivity type decreases substantially monotonically in moving from depth $y_{NWPK}$ or $y_{PWPK}$ along line 338 or 378 to a point no further from the upper semiconductor surface than 20% of maximum depth $y_S$ of source-body junction 324 or 364.

Threshold voltage $V_T$ of n-channel IGFET 104 is normally 0.5 V to 0.7 V, typically 0.6 V, at a drawn channel length $L_{DR}$ in the vicinity of 0.5 μm and a gate dielectric thickness of 6-6.5 nm. Threshold voltage $V_T$ of p-channel IGFET 106 is normally −0.45 V to −0.7 V, typically −0.55 V to −0.6 V, likewise at a drawn channel length $L_{DR}$ in the vicinity of 0.5 μm and a gate dielectric thickness of 6-6.5 nm. Extended-drain IGFETs 104 and 106 are particularly suitable for power, high-voltage switching, EEPROM programming, and ESD protection applications at an operational voltage range, e.g., 12 V, considerably higher than the typically 3.0-V high-voltage operational range of asymmetric IGFETs 100 and 102.

E8. Performance Advantages of Extended-Drain IGFETs

Figure 2:
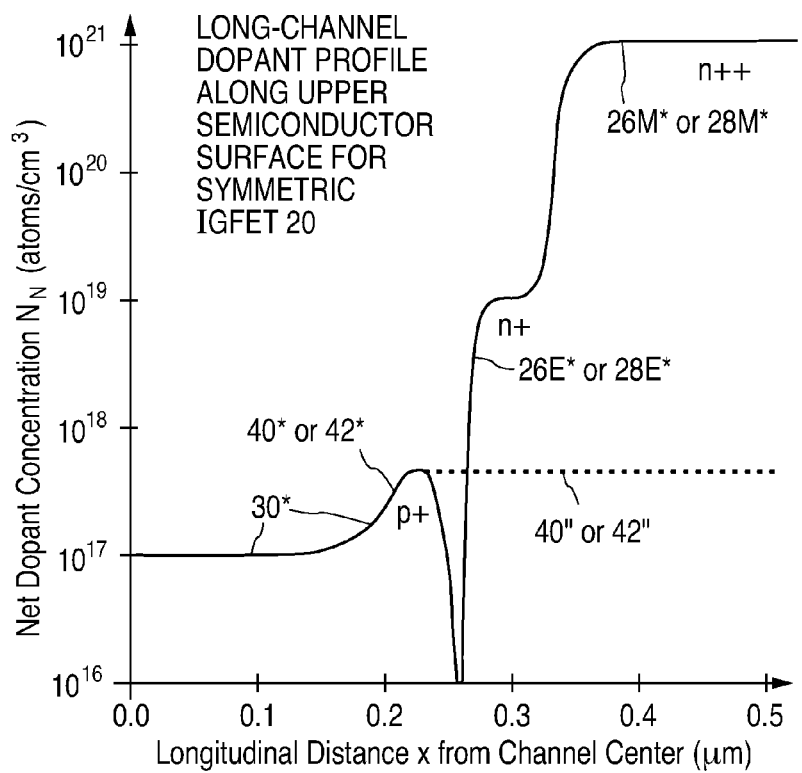
FIG. 2 is a graph of net dopant concentration along the upper semiconductor surface as a function of longitudinal distance from the channel center for the IGFET of FIG. 1.
Figure 3A:
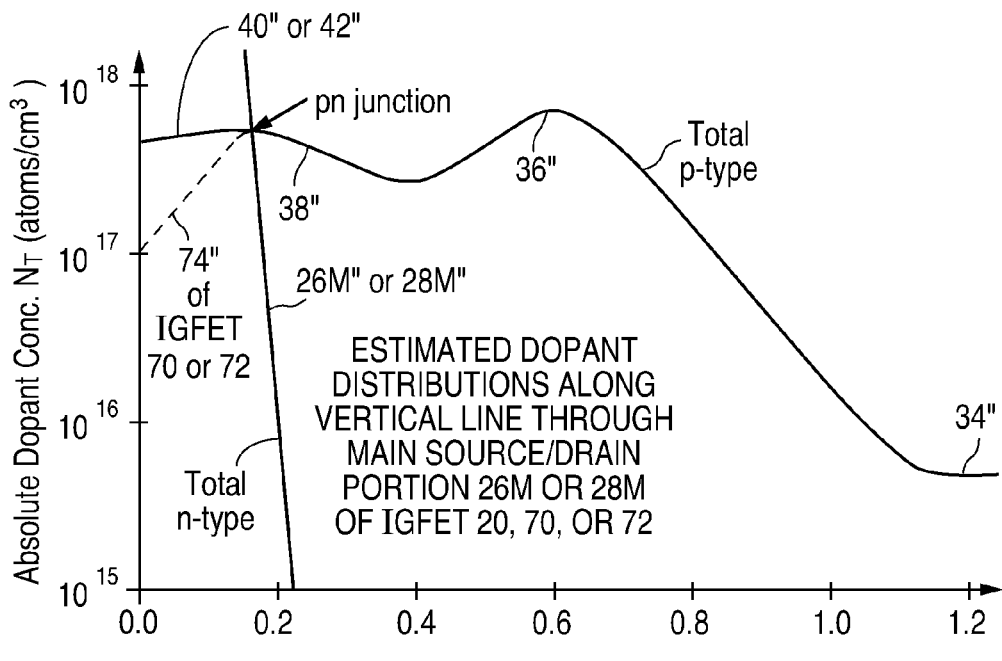
FIGS. 3a and 3b are graphs of total dopant concentration as a function of depth along imaginary vertical lines through the source/drain zones at two respective different well-doping conditions for the IGFETs of FIGS. 1, 7a, and 7b.
Figure 3B:
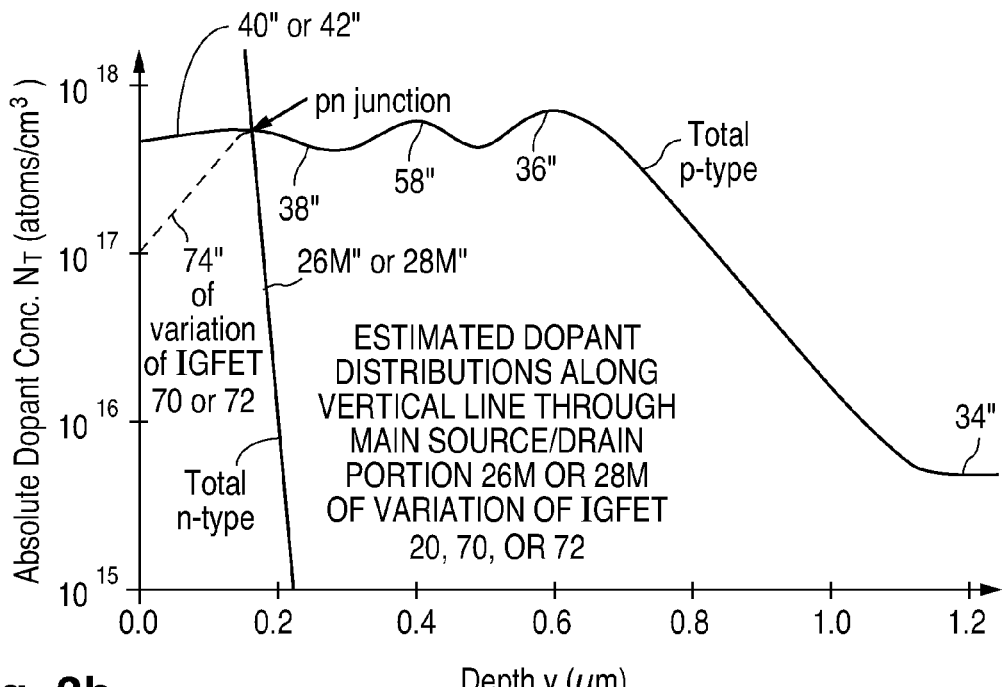
Figure 4:
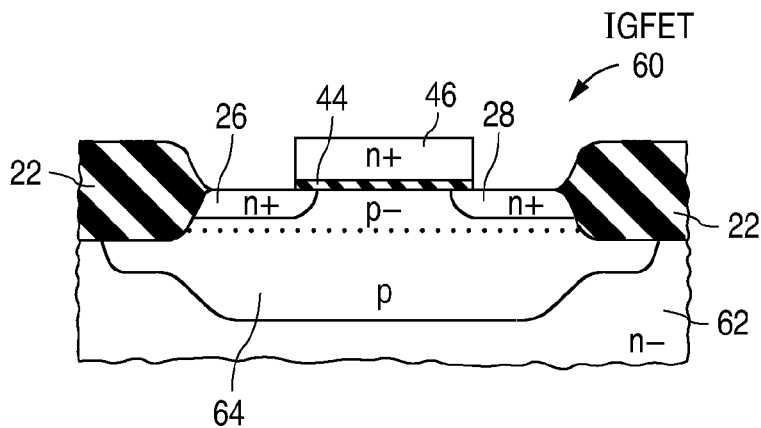
FIG. 4 is a front cross-sectional view of a prior art symmetric long n-channel IGFET that uses a retrograde empty well.
Figure 5:
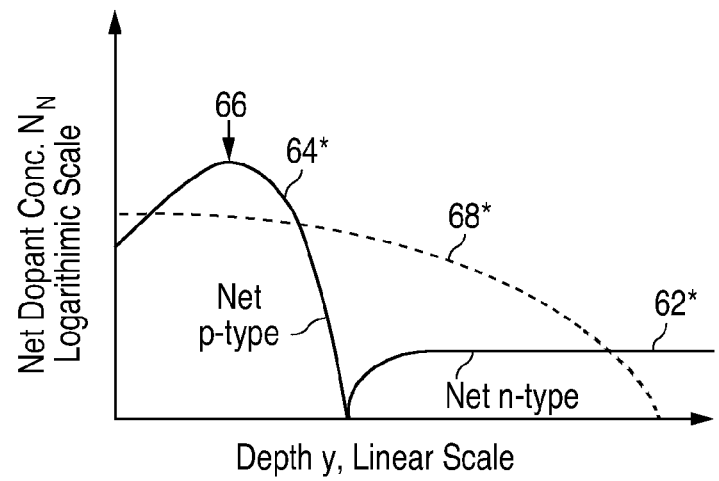
FIGS. 5 and 6 respectively are qualitative and quantitative graphs of total dopant concentration as a function of depth along an imaginary vertical line through the longitudinal center of the IGFET of FIG. 4.
Figure 6:
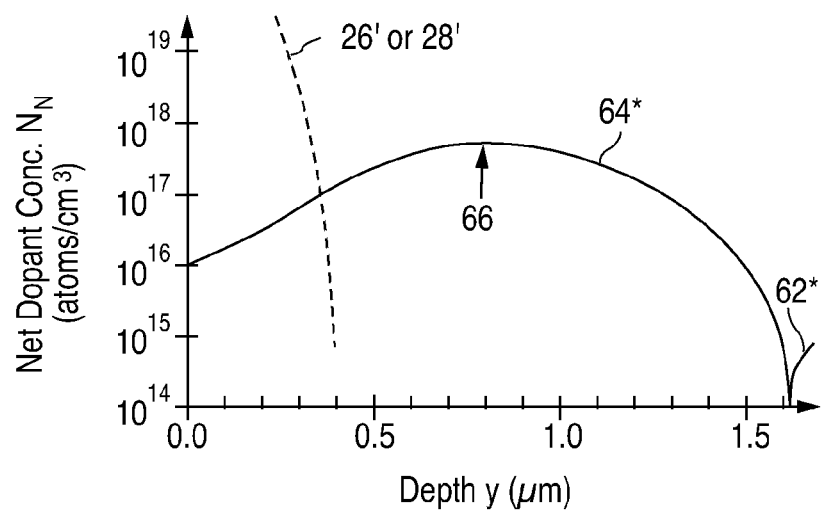
Figure 7A:
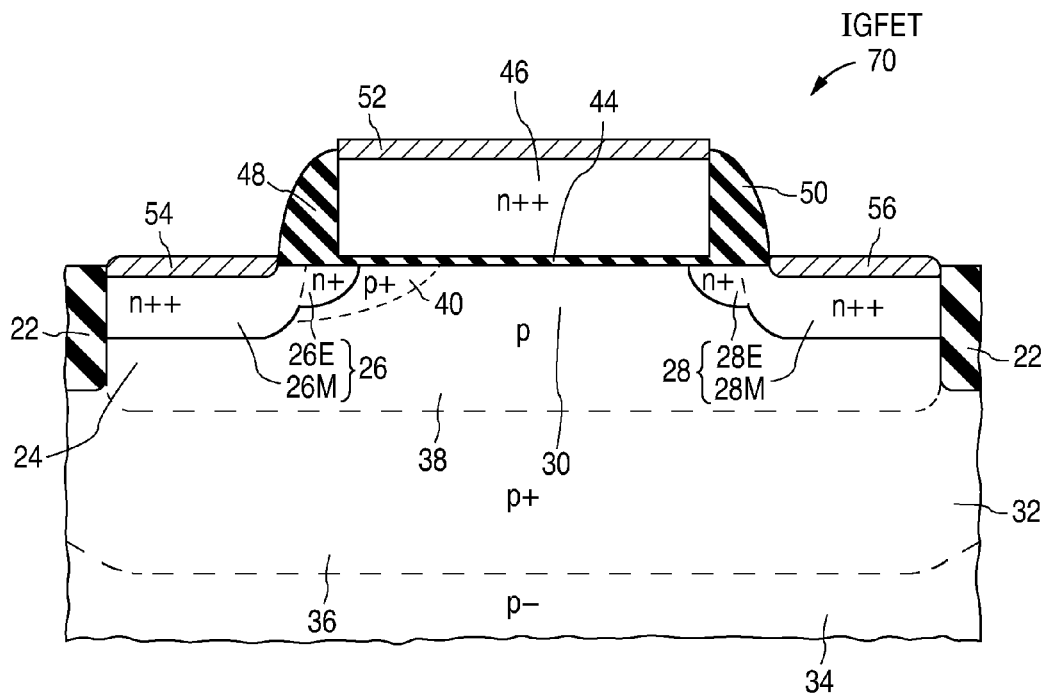
FIGS. 7a and 7b are front cross-sectional views of respective prior art asymmetric long and short n-channel IGFETs.
Figure 7B:
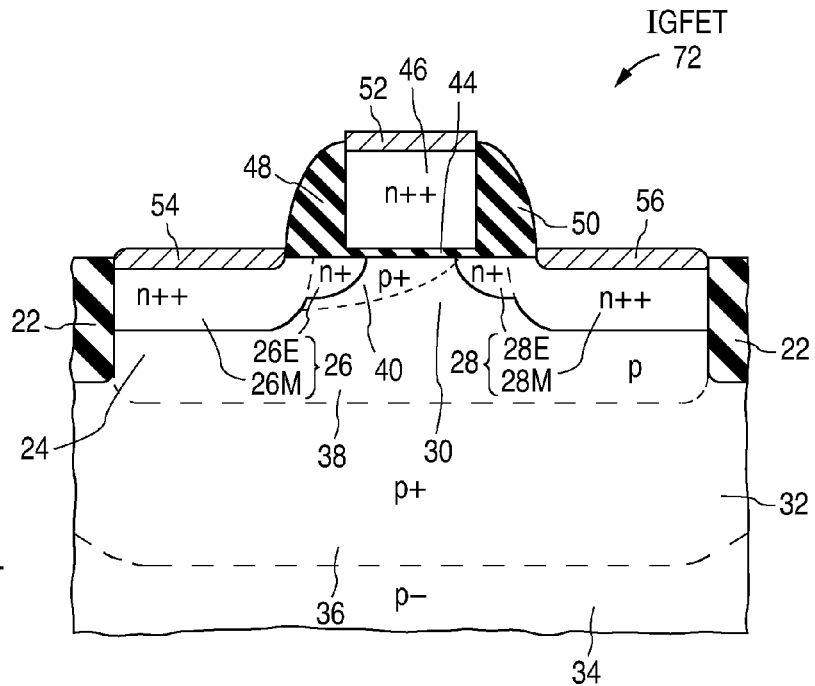
Figure 8A:
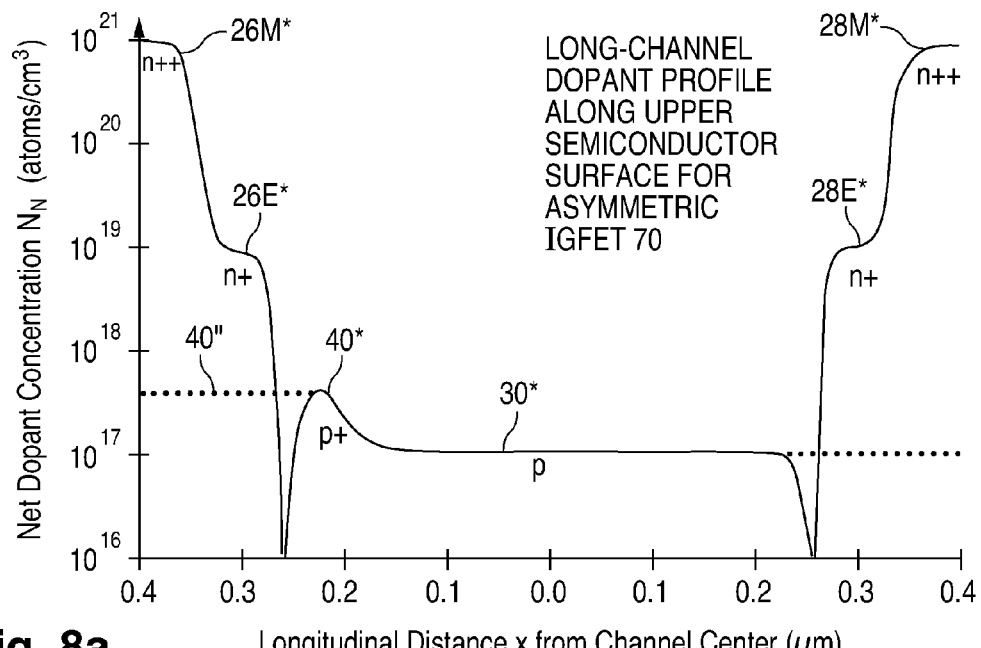
FIGS. 8a and 8b are graphs of net dopant concentration along the upper semiconductor surface as a function of longitudinal distance from the channel center for the respective IGFETs of FIGS. 7a and 7b.
Figure 8B:
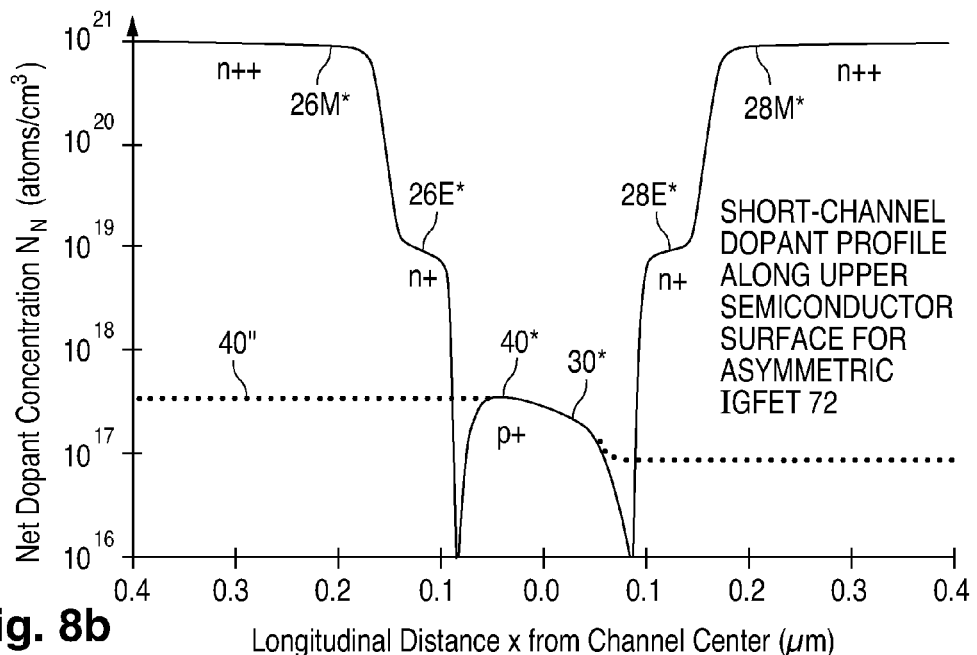
Figure 9:
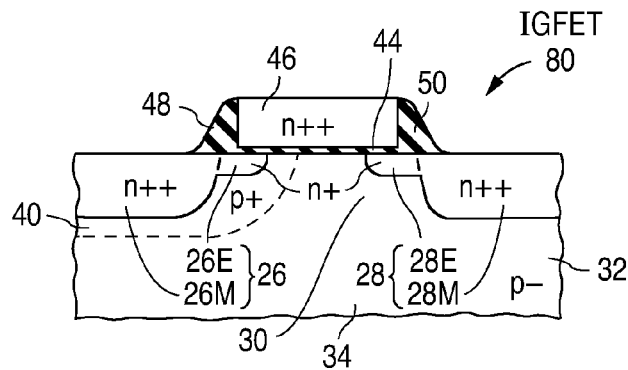
FIG. 9 is a front cross-sectional view of a prior art asymmetric long n-channel IGFET.
Figure 10A:
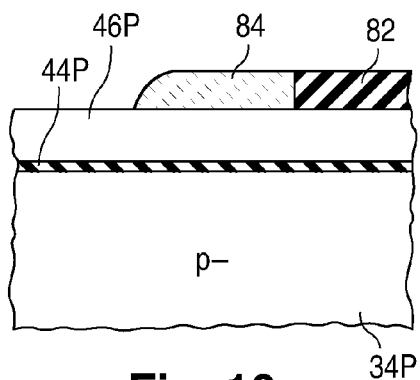
FIGS. 10a-10d are front cross-sectional views representing steps in manufacturing the IGFET of FIG. 9.
Figure 10C:
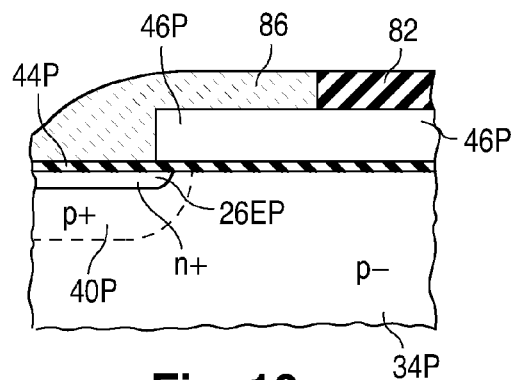
Figure 10B:
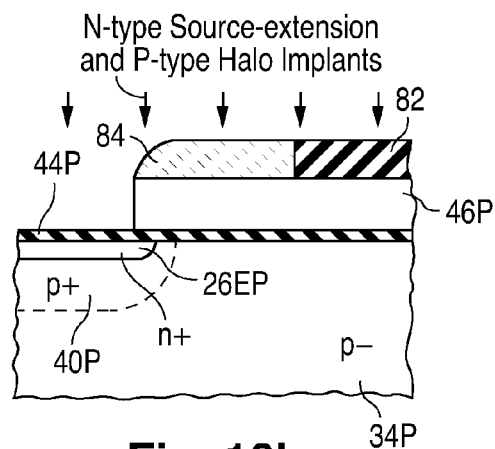
Figure 10D:
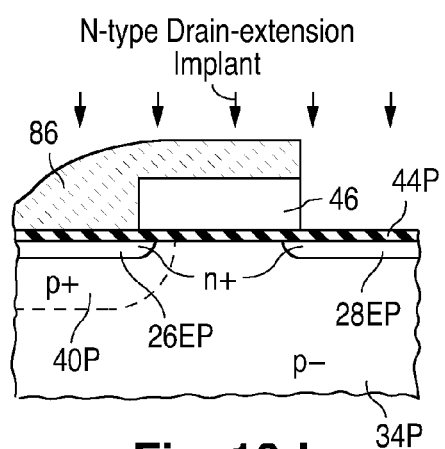
Figure 25A:
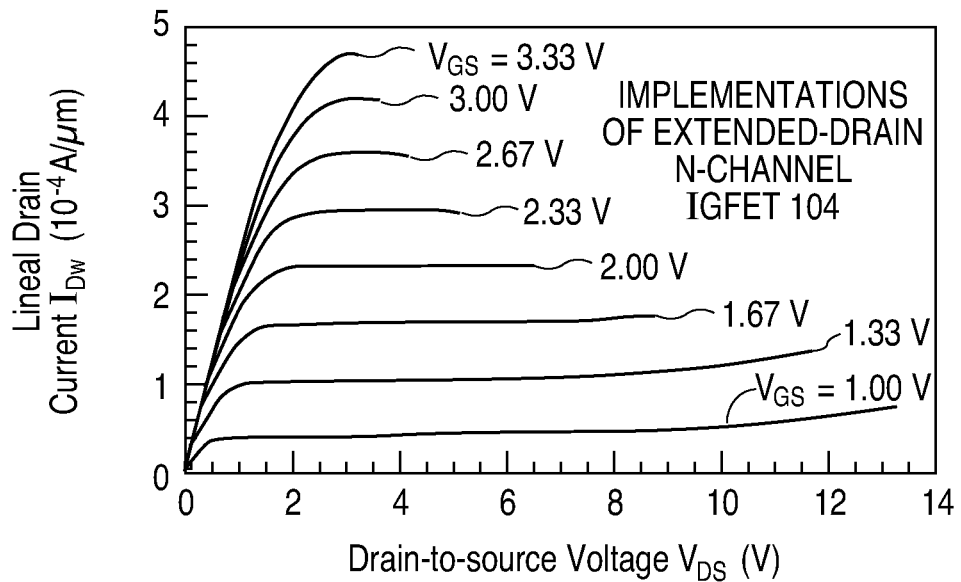
FIGS. 25a and 25b are graphs of breakdown voltage as a function of well-to-well spacing for respective fabricated implementations of the extended-drain n-channel and p-channel IGFETs of FIGS. 22*a* and 22*b*.
Figure 25B:
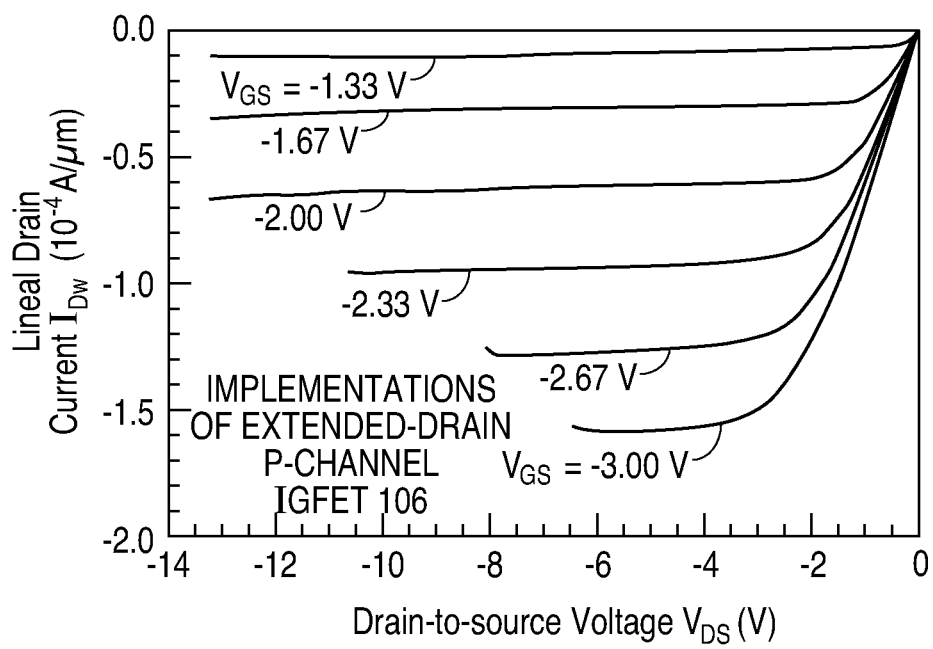

Extended-drain extended-voltage IGFETs 104 and 106 have very good current-voltage characteristics. FIG. 25a illustrates how lineal drain current $I_{Dw}$ typically varies as a function of drain-to-source voltage $V_{DS}$ for values of gate-to-source voltage $V_{GS}$ varying from 1.00 V to 3.33 V in increments of approximately 0.33 V for fabricated implementations of n-channel IGFET 104. A typical variation of lineal drain current $I_{Dw}$ as a function drain-to-source voltage $V_{DS}$ for values of gate-to-source voltage $V_{GS}$ varying from −1.33 V to −3.00 V in increments of approximately −0.33 V for fabricated implementations of p-channel IGFET 106 is similarly depicted in FIG. 2b. As FIGS. 25a and 25b show, the $I_{Dw}/V_{DS}$ current voltage characteristics of IGFETS 104 and 106 are well behaved up to a $V_{DS}$ magnitude of at least 14 V.

The magnitude of drain-to-source breakdown voltage $V_{BD}$ of each of IGFETs 104 and 106 is controlled by adjusting minimum spacing $L_{WW}$ between the IGFET's complementary empty main well regions, i.e., p-type empty main well region 184A and n-type empty main well region 184B of IGFET 104, and n-type empty main well region 186A and p-type empty main well region 186B of IGFET 106. Increasing minimum well-to-well spacing $L_{WW}$ causes the $V_{BD}$ magnitude to increase, and vice versa, up to a limiting $L_{WW}$ value beyond which breakdown voltage $V_{BD}$ is essentially constant.

Figure 26A:
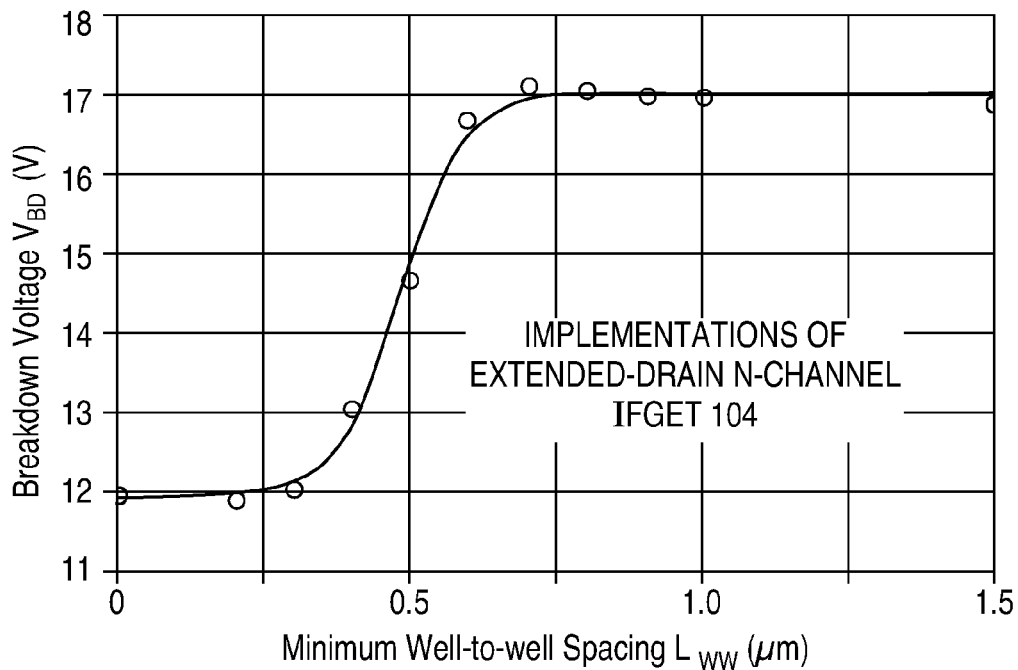
FIGS. 26*a* and 26*b* are graphs of lineal drain current as a function of drain-to-source voltage at multiple values of gate-to-source voltage for respective fabricated implementations of the extended-drain n-channel and p-channel IGFETs of FIGS. 22*a* and 22*b*.
Figure 26B:
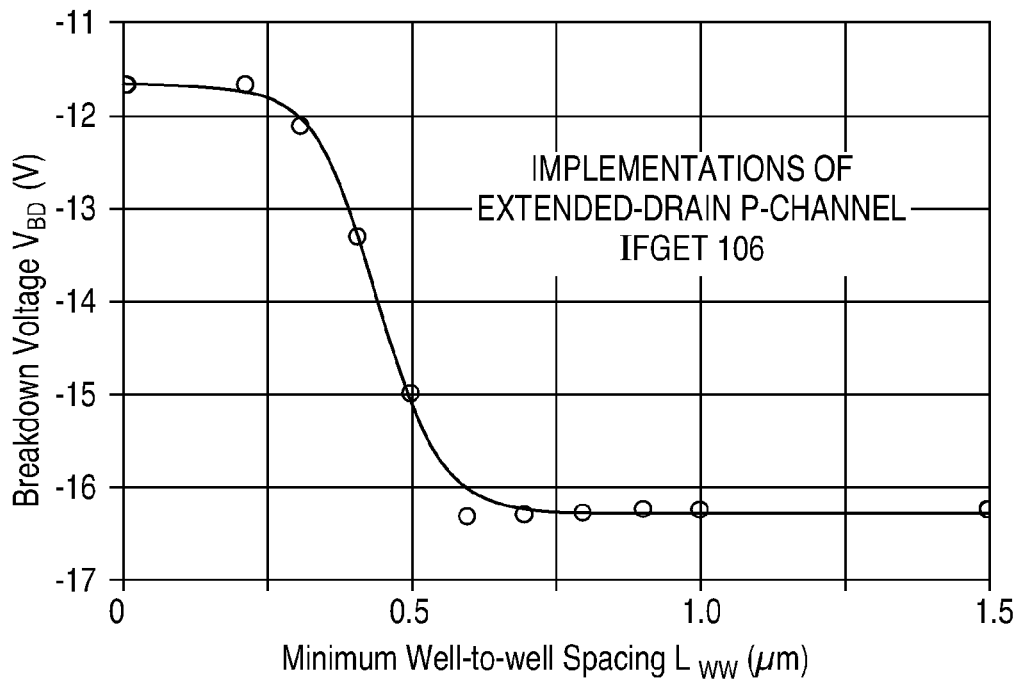

FIG. 26a illustrates how drain-to-source breakdown voltage $V_{BD}$ typically varies with minimum well-to-well spacing $L_{WW}$ for fabricated implementations of n-channel IGFET 104. FIG. 26b similarly illustrates how breakdown voltage $V_{BD}$ typically varies with well-to-well spacing $L_{WW}$ for fabricated implementations of p-channel IGFET 106. The small circles in FIGS. 26a and 26b represent experimental data points. The experimental $V_{BD}/L_{WW}$ experimental data in each of FIGS. 26a and 26b approximates a sigmoid curve. The curves in FIGS. 26a and 26b indicate best-fit sigmoid approximations to the experimental data.

The sigmoid approximation to the variation of breakdown voltage $V_{BD}$ with minimum well-to-well spacing is generally expressed as:

$$V_{BD} = V_{BD0} + \frac{V_{BDmax} - V_{BD0}}{1 + e^{\left(\frac{L_{WW} - L_{WW0}}{L_K}\right)}} \tag{1}$$

where $V_{BD0}$ is the mathematically minimum possible value of breakdown voltage $V_{BD}$ (if well-to-well spacing $L_{WW}$ could go to negative infinity), $V_{BDmax}$ is the maximum possible value of breakdown voltage $V_{BD}$ (for spacing $L_{WW}$ going to positive infinity), $L_{WW0}$ is an offset spacing length, and $L_K$ is a spacing length constant. Eq. 1 can be used as a design tool in choosing spacing $L_{WW}$ to achieve a desired value of breakdown voltage $V_{BD}$.

Parameters $V_{BD0}$, $V_{BDmax}$, $L_{WW0}$, and $L_K$ are of approximately the following values for the sigmoid curves of FIGS. 26a and 26b:

| Parameter | Implementations of n-channel IGFET 104 in FIG. 26a | Implementations of p-channel IGFET 106 in FIG. 26b |
|---|---|---|
| $V_{BD0}$ | 11.9 V | −16.3 V |
| $V_{BDmax}$ | 17.0 V | −11.7 V |
| $L_{WW0}$ | 0.48 μm | 0.44 μm |
| $L_K$ | 0.055 μm | 0.057 μm |

The actual minimum limit of well-to-well spacing $L_{WW}$ is zero. As a result, the actual minimum value $V_{BDmin}$ of breakdown voltage $V_{BD}$ is:

$$V_{BDmin} = V_{BD0} + \frac{V_{BDmax} - V_{BD0}}{1 + e^{\left(\frac{L_{WW0}}{L_K}\right)}} \tag{2}$$

In practice, the factor $L_{WW0}/L_K$ is normally considerably greater than 1 so that the exponential term $e^{L_{WW0}/L_K}$ is much greater than 1. Accordingly, actual minimum breakdown voltage $V_{BDmin}$ is normally very close to theoretical minimum breakdown voltage $V_{BD0}$.

The peak value of the electric field in the monosilicon of IGFET 104 or 106 goes to the upper semiconductor surface when well-to-well spacing $L_{WW}$ is increased sufficiently that breakdown voltage $V_{BD}$ saturates at its maximum value $V_{BDmax}$. Since reliability and lifetime are enhanced when the peak value of the electric field in the monosilicon of IGFET 104 or 106 is significantly below the upper semiconductor surface, well-to-well spacing $L_{WW}$ is chosen to be a value for which breakdown voltage $V_{BD}$ is somewhat below saturation at maximum value $V_{BDmax}$. In the implementations represented by the approximate sigmoid curves of FIGS. 26a and 26b, an $L_{WW}$ value in the vicinity of 0.5 μm enables the peak value of the electric field in the monosilicon of IGFET 104 or 106 to be significantly below the upper semiconductor surface while simultaneously providing a reasonably high value for breakdown voltage $V_{BD}$.

FIG. 27 illustrates lineal drain current $I_{Dw}$ as a function of drain-to-source voltage $V_{DS}$ sufficiently high to cause IGFET breakdown for a test of another implementation of n-channel IGFET 104. Well-to-well spacing $L_{WW}$ was 0.5 μm for this implementation. FIG. 27 also shows how lineal drain current $I_{Dw}$ varied with drain-to-source voltage $V_{DS}$ sufficiently high to cause IGFET breakdown for a corresponding test of an extension of IGFET 104 to zero well-to-well spacing $L_{WW}$. Gate-to-source voltage $V_{GS}$ was zero in the tests. Consequently, breakdown voltage $V_{BD}$ is the $V_{DS}$ value at the onset of S-D current $I_D$, i.e., the points marked by circles 400 and 402 in FIG. 27 where lineal drain current $I_{Dw}$ becomes positive. As circles 400 and 402 indicate, raising well-to-well spacing $L_{WW}$ from zero to 0.5 μm increased breakdown voltage $V_{BD}$ from just above 13 V to just above 16 V, an increase of approximately 3 V.

Importantly, the breakdown characteristics of n-channel IGFET 104 are stable with operational time in the controlled-current avalanche breakdown condition. Curves 404 and 406 in FIG. 27 respectively show how lineal drain current $I_{Dw}$, varied with drain-to-source voltage $V_{DS}$ for the extension and implementation of IGFET 104 at the beginning of a period of 20 minutes during which each IGFET was subjected to breakdown. Curves 408 and 410 respectively show how lineal current $I_{DW}$ varied with voltage $V_{DS}$ for the extension and implementation at the end of the 20-minute breakdown period. Curves 408 and 410 are respectively nearly identical to curves 404 and 406. This shows that placing IGFET 104 in a stressed breakdown condition for substantial operational time does not cause its breakdown characteristics to change significantly. The breakdown characteristics of p-channel IGFET 106 are also stable with operational time.

FIG. 28a illustrates a computer simulation 412 of extended-drain n-channel IGFET 104 in its biased-on state. The regions in simulation 412 are identified with the same reference symbols as the corresponding regions in IGFET 104. Regions of the same conductivity type are not visibly distinguishable in FIG. 28a. Since empty-well body material 184A and substrate region 136 are both of p-type conductivity, body material 184A is not visibly distinguishable from substrate region 136 in FIG. 28a. The position of reference symbol 184A in FIG. 28a generally indicates the location of p-type empty-well body material 184A.

Area 414 in FIG. 28a indicates the situs of maximum impact ionization in simulated inventive n-channel IGFET 412. Maximum impact ionization situs 414 occurs well below the upper semiconductor surface. Letting $y_{II}$ represent the depth of the situs of maximum impact ionization in an IGFET while it is conducting current, depth $y_{II}$ of maximum impact ionization situs 414 exceeds maximum depth $y_S$ of source 320. More specifically, maximum impact ionization situs depth $y_{II}$ for IGFET is over 1.5 times its maximum source depth $y_S$. In addition, depth $y_{II}$ of maximum impact ionization situs 414 is greater than the depth (or thickness) $y_{FI}$ of field insulation 138 as represented by field-insulation portion 138A in FIG. 28a.

A computer simulation 416 of a reference extended-drain n-channel IGFET in its biased-on state is presented in FIG. 28b. As in FIG. 28a, regions of the same conductivity type are not visibly distinguishable in FIG. 28b. In contrast to simulated inventive IGFET 412, the p-type body material of simulated reference extended-drain IGFET 416 is formed by a p-type filled main well region indicated generally by reference symbol 418 in FIG. 28b.

Reference extended-drain IGFET 416 further contains an n-type source 420, an n-type drain 422, a gate dielectric layer 424, a very heavily doped n-type polysilicon gate electrode 426, and a pair of dielectric gate sidewall spacers 428 and 430 configured as shown in FIG. 28b. N-type source 420 consists of a very heavily doped main portion 420M and a more lightly doped, but still heavily doped, lateral drain extension 420E. Field insulation 432 of the shallow trench isolation type penetrates into n-type drain 422 so as to laterally surround an external contact portion of drain 422. Gate electrode 426 extends over field insulation 432 partway to the external contact portion of drain 422. Aside from p-type body material 418 being constituted with a filled main well region rather than an empty main well region, reference extended-drain IGFET 416 is configured largely the same as simulated inventive IGFET 412.

Area 434 in FIG. 28b indicates the situs of maximum impact ionization in reference extended-drain IGFET 416. As shown in FIG. 28b, situs 434 of maximum impact ionization occurs along the upper semiconductor surface largely where the pn junction 436 between drain 422 and filled-well body material 418 meets the upper semiconductor surface. Secondary electrons produced by impact ionization in reference IGFET 416 can readily enter gate dielectric layer 424 and lodge there to cause the performance of reference IGFET 416 to deteriorate. Because maximum impact ionization situs 414 is well below the upper semiconductor surface of inventive IGFET 412, far fewer secondary electrons generated by impact ionization in inventive IGFET 412 reach its gate dielectric layer 344 and cause threshold voltage drift. The computer simulations of FIGS. 27 and 28 confirm that extended-drain IGFETs 104 and 106 have enhanced reliability and lifetime.

E9. Extended-Drain IGFETs with Specially Tailored Halo Pocket Portions

Complementary extended-drain extended-voltage IGFETs 104 and 106 are provided in respective variations 104U and 106U (not shown) in which source-side halo pocket portions 326 and 366 are respectively replaced with a moderately doped p-type source-side halo pocket portion 326U (not shown) and a moderately doped n-type source-side halo pocket portion 366U (not shown). Source-side pocket portions 326U and 366U are specially tailored for enabling complementary extended-drain extended-voltage IGFETs 104U and 106U to have reduced S-D current leakage when they are in their biased-off states.

Aside from the special tailoring of the halo-pocket dopant distributions in halo pockets 326U and 366U and the slightly modified dopant distributions that occur in adjacent portions of IGFETs 104U and 106U due to the fabrication techniques used to create the special halo-pocket dopant distributions, IGFETs 104U and 106U are respectively configured substantially the same as IGFETs 104 and 106. Subject to having reduced off-state S/D current leakage, IGFETs 104U and 106U respectively also operate substantially the same, and have the same advantages, as IGFETs 104 and 106.

P halo pocket portion 326U of extended-drain n-channel IGFET 104U is preferably formed with the same steps as p halo pocket portion 250U of asymmetric n-channel IGFET 100U. P halo pocket 326U of IGFET 104U then has the same characteristics, described above, as p halo pocket 250U of IGFET 100U. Accordingly, halo pocket 326U preferably has the same plural number M of local maxima in concentration $N_T$ of the total p-type dopant as halo pocket 250U when the p-type source halo dopant in pocket 250U is distributed in the first way described above. When the p-type source halo dopant in halo pocket 250U is distributed in the second way described above, the total p-type dopant in pocket 326U has the same preferably relatively flat vertical profile from the upper semiconductor surface to a depth y of at least 50%, preferably at least 60%, of depth y of pocket 326U along an imaginary vertical line extending through pocket 326U to the side of source extension 320E without necessarily reaching multiple local maxima along the portion of that vertical line in pocket 326U.

Similarly, n halo pocket portion 366U of extended-drain p-channel IGFET 106U is preferably formed with the same steps as n halo pocket portion 290U of asymmetric p-channel IGFET 102U. This causes halo pocket 366U of p-channel IGFET 106U to have the same characteristics, also described above, as n halo pocket 290U of p-channel IGFET 102U. Consequently, halo pocket 366U preferably has the same plural number M of local maxima in concentration $N_I$ of the n-type source halo dopant as halo pocket when the n-type source halo dopant in pocket 290U is distributed in the first way described above. When the n-type source halo dopant in halo pocket 290U is distributed in the second way described above, the total n-type dopant in pocket 366U has the same preferably relatively flat vertical profile from the upper semiconductor surface to a depth y of at least 50%, preferably at least 60%, of depth y of pocket 366U along an imaginary vertical line extending through pocket 366U to the side of source extension 360E without necessarily reaching multiple local maxima along the portion of that vertical line in pocket 366U.

F. Symmetric Low-Voltage Low-Leakage IGFETs

F1. Structure of Symmetric Low-Voltage Low-Leakage N-Channel IGFET

Figure 29:
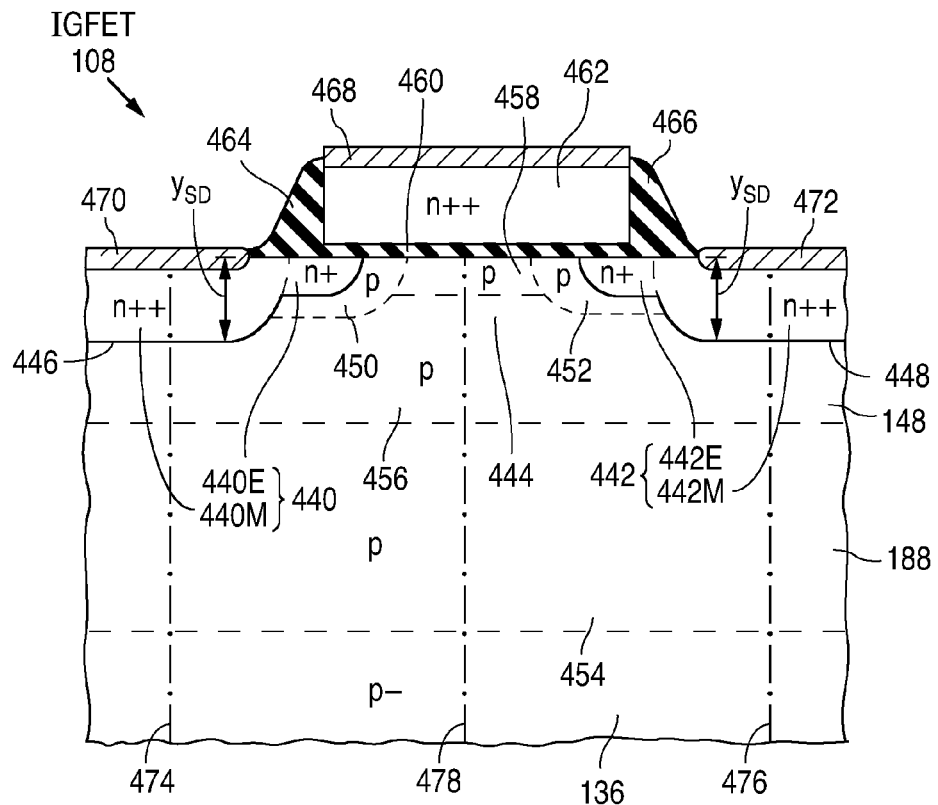
FIG. 29 is an expanded front cross-sectional view of the core of the symmetric low-leakage n-channel IGFET of FIG. 11.3.

Next, the internal structure of the illustrated symmetric IGFETs is described beginning with symmetric low-voltage low-leakage filled-well complementary IGFETs 108 and 110 of increased $V_T$ magnitudes (compared to the nominal $V_T$ magnitudes of respective IGFETs 120 and 122). An expanded view of the core of n-channel IGFET 108 as depicted in FIG. 11.3 is shown in FIG. 29. IGFET 108 has a pair of n-type S/D zones 440 and 442 situated in active semiconductor island 148 along the upper semiconductor surface. S/D zones 440 and 442 are separated by a channel zone 444 of p-type filled main well region 188 which, in combination with p– substrate region 136, constitutes the body material for IGFET 108. P-type body-material filled well 188 forms (a) a first pn junction 446 with n-type S/D zone 440 and (b) a second pn junction 448 with n-type S/D zone 442.

S/D zones 440 and 442 are largely identical. Each n-type S/D zone 440 or 442 consists of a very heavily doped main portion 440M or 442M and a more lightly doped, but still heavily doped, lateral extension 440E or 442E. External electrical contacts to source 440 and drain 442 are respectively made via main source portion 440M and main drain portion 442M. Since S/D zones 440 and 442 are largely identical, n++ main S/D portions 440M and 442M are largely identical. N+ S/D extensions 440E and 442E likewise are largely identical.

Main S/D portions 440M and 442M extend deeper than S/D extensions 440E and 442E. Accordingly, the maximum depth $y_{SD}$ of each S/D zone 440 or 442 is the maximum depth of main S/D portion 440M or 442M. Channel zone 444 is terminated along the upper semiconductor surface by S/D extensions 440E and 442E. Main S/D portions 440M and 442M are defined with the n-type main S/D dopant. S/D extensions 440E and 442E are normally defined by ion implantation of n-type semiconductor dopant referred to as the n-type shallow S/D-extension dopant.

A pair of moderately doped laterally separated halo pocket portions 450 and 452 of p-type body-material filled main well 188 respectively extend along S/D zones 440 and 442 up to the upper semiconductor surface and terminate at respective locations between S/D zones 440 and 442. P halo pockets 450 and 452 are largely identical. FIGS. 11.3 and 29 illustrate the situation in which S/D zones 440 and 442 extend deeper than halo pockets 450 and 452. Alternatively, halo pockets 450 and 452 can extend deeper than S/D zones 440 and 442. Halo pockets 450 and 452 then respectively extend laterally under S/D zones 440 and 442. Ion implantation of p-type semiconductor dopant referred to as the p-type S/D halo dopant, or as the p-type S/D-adjoining pocket dopant, is normally employed in defining halo pockets 450 and 452. The p-type S/D halo dopant reaches a maximum concentration in each halo pocket 450 or 452 at a location below the upper semiconductor surface.

The material of p-type body-material filled main well 188 outside halo pocket portions 450 and 452 consists of a moderately doped main body-material portion 454, a moderately doped intermediate body-material portion 456, and a moderately doped upper body-material portion 458. P main body-material portion 454 overlies p– substrate region 136. P intermediate body-material portion 456 overlies main body-material portion 454. Each of body-material portions 454 and 456 extends laterally below at least substantially all of channel zone 444 and normally laterally below substantially all of each of channel zone 444 and S/D zones 440 and 442. P upper body-material portion 458 overlies intermediate body-material portion 456, extends vertically to the upper semiconductor surface, and extends laterally between halo pocket portions 450 and 452.

P body-material portions 454, 456, and 458 are normally respectively defined by ion implantations of the p-type filled main well dopant, APT, and threshold-adjust dopants. Although body-material portions 454, 456, and 458 are all described here as moderately doped, the p-type filled main well, APT, and threshold-adjust dopants have concentrations that reach maximum values at different average depths. Body-material portions 454, 456, and 458 are often referred to here respectively as p filled-well main body-material portion 454, p APT body-material portion 456, and p threshold-adjust body-material portion 458.

The deep p-type filled-well local concentration maximum produced by the p-type filled main well dopant in filled main well 188 occurs deeper than each of the shallow p-type filled-well local concentration maxima produced by the p-type APT and threshold-adjust dopants in well 188. Also, the local concentration maximum resulting from each of the p-type filled main well, APT, and threshold-adjust dopants extends substantially fully laterally across well 188. Consequently, the p-type APT and threshold-adjust dopants fill the well region otherwise defined by the p-type filled main well dopant at the location of well 188.

The deep filled-well concentration maximum produced by the p-type filled main well dopant in p-type filled-well main body-material portion 454 occurs below channel zone 444 and S/D zones 440 and 442 at a location that extends laterally below at least substantially all of channel zone 444 and normally laterally below substantially all of each of channel zone 444 and S/D zones 440 and 442. The location of the filled-well concentration maximum provided by the p-type filled main well dopant in body-material portion 454 is, as indicated above, normally at approximately the same average depth $y_{PWPK}$ as the concentration maximum of the p-type empty main well dopant and thus normally at an average depth of 0.4-0.8 μm, typically 0.55-0.6 μm.

The shallow filled-well concentration maximum produced by the p-type APT dopant in p-type APT body-material portion 456 occurs at a location that extends laterally across at least substantially the full lateral extent of channel zone 444 and normally laterally across at least substantially the full composite lateral extent of channel zone 444 and S/D zones 440 and 442. The location of the filled-well concentration maximum provided by the p-type APT dopant is typically slightly below the bottoms of channel zone 444 and S/D zones 440 and 442 but can be slightly above, or substantially coincident with, the bottoms of channel zone 444 and S/D zones 440 and 442. As indicated above, the location of the maximum concentration of the p-type APT dopant normally occurs at an average depth of more than 0.1 μm but not more than 0.4 μm. The average depth of the maximum concentration of the p-type APT dopant in body-material portion 456 is typically 0.25 μm.

The shallow filled-well concentration maximum produced by the p-type threshold-adjust dopant in p-type threshold-adjust body-material portion 458 similarly occurs at a location that extends laterally across at least substantially the full lateral extent of channel zone 444 and normally laterally across at least substantially the full composite lateral extent of channel-zone 444 and S/D zones 440 and 442. Hence, the location of the filled-well concentration maximum provided by the p-type threshold dopant extends laterally beyond upper body-material portion into halo pocket portions 450 and 452 and S/D zones 440 and 442. The location of the maximum concentration of the p-type threshold-adjust dopant in body-material portion 458 is normally at an average depth of less than 0.1 μm, typically 0.08-0.09 μm. Also, the maximum concentration of the p-type threshold-adjust dopant in main filled well 188 is normally significantly less than the maximum concentrations of the p-type filled main well, APT, and S/D halo dopants in well 188.

Channel zone 444 (not specifically demarcated in FIG. 11.3 or 29) consists of all the p-type monosilicon between S/D zones 440 and 442. In particular, channel zone 444 is formed by threshold-adjust body-material portion 458, an underlying segment of APT body-material portion 456, and (a) all of p halo pocket portion 450 and 452 if S/D zones 440 and 442 extend deeper than halo pockets 450 and 452 as illustrated in the example of FIGS. 11.3 and 29 or (b) surface-adjoining segments of halo pockets 450 and 452 if they extend deeper than S/D zones 440 and 442. Since the maximum concentration of the p-type threshold-adjust dopant in main filled well 188 is normally significantly less than the maximum concentration of the p-type S/D halo dopant in well 188, halo pockets 450 and 452 are more heavily doped p-type than the directly adjacent material of well 188.

A gate dielectric layer 460 at the $t_{GdL}$ low thickness value is situated on the upper semiconductor surface and extends over channel zone 444. A gate electrode 462 is situated on gate dielectric layer 460 above channel zone 444. Gate electrode 462 extends partially over S/D zones 440 and 442. In particular, gate electrode 462 extends over part of each n+ S/D extension 440E or 442E but normally not over any part of either n++ main S/D portion 440M or 442M. Dielectric sidewall spacers 464 and 466 are situated respectively along the opposite transverse sidewalls of gate electrode 462. Metal silicide layers 468, 470, and 472 are respectively situated along the tops of gate electrode 462 and main S/D portions 440M and 442M.

F2. Dopant Distributions in Symmetric Low-Voltage Low-Leakage N-Channel IGFET

Figure 30A:
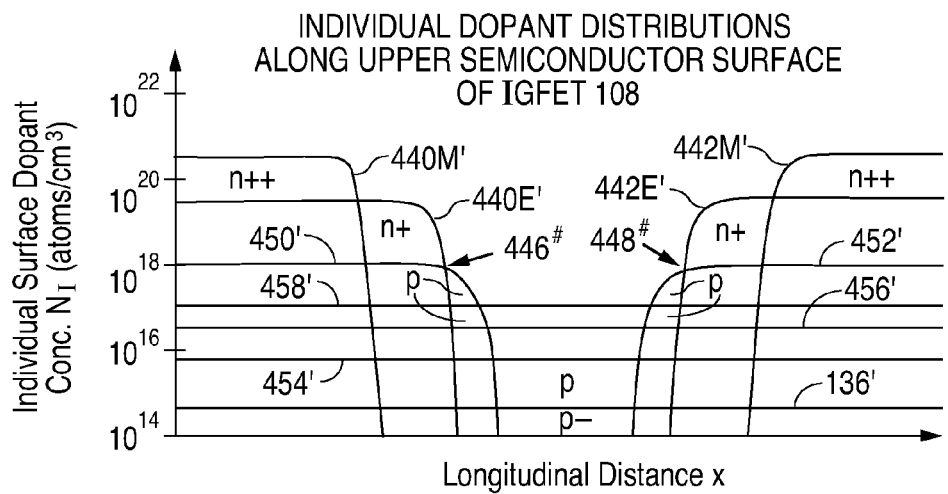
FIGS. 30*a*-30*c* are respective graphs of individual, total, and net dopant concentrations as a function of longitudinal distance along the upper semiconductor surface for the symmetric low-leakage n-channel IGFET of FIG. 29.
Figure 30B:
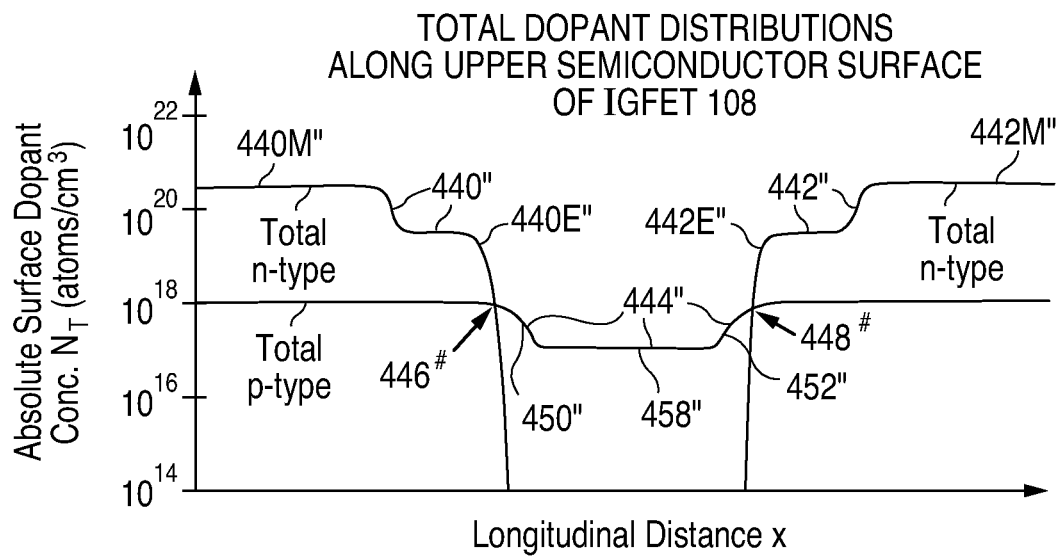
Figure 30C:
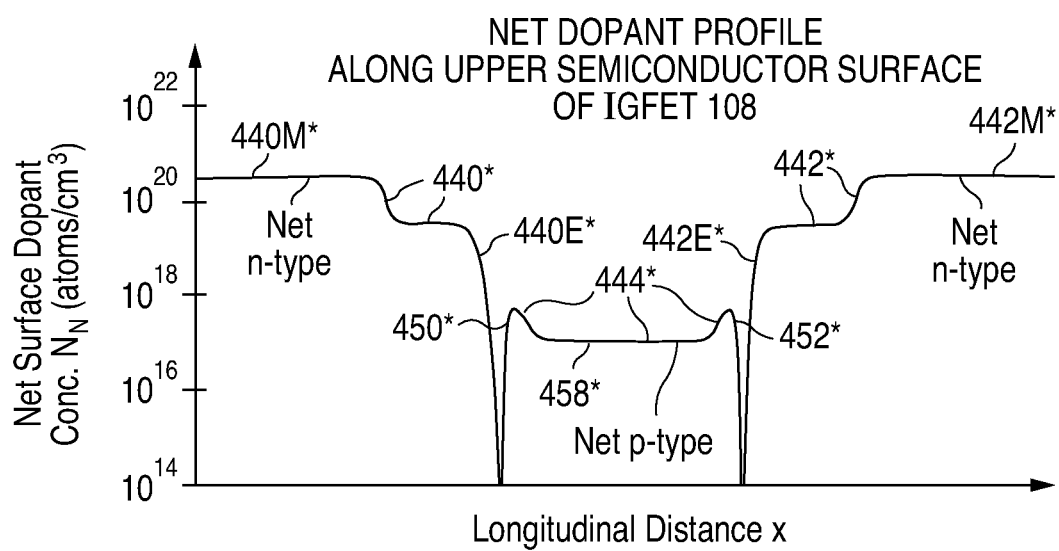
Figure 31A:
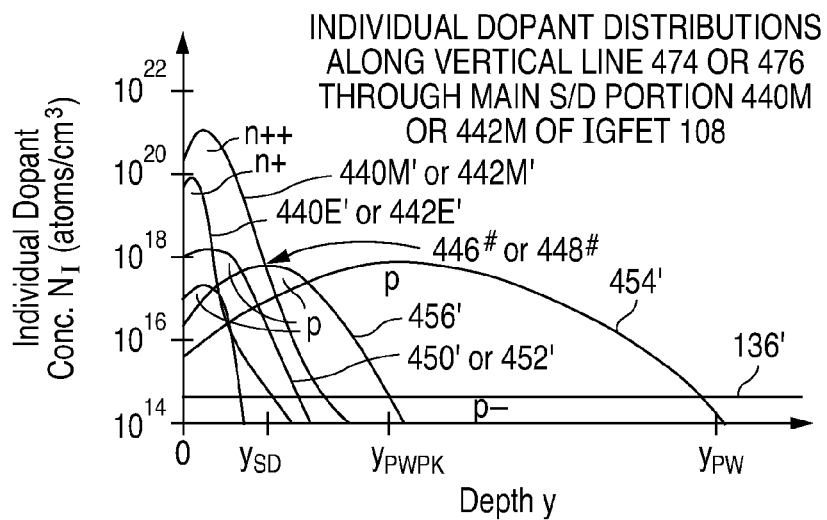
FIGS. 31*a*-31*c* are respective graphs of individual, total, and net dopant concentrations as a function of depth along an imaginary vertical line through the main portion of either source/drain zone of the symmetric low-leakage n-channel IGFET of FIG. 29.
Figure 31B:
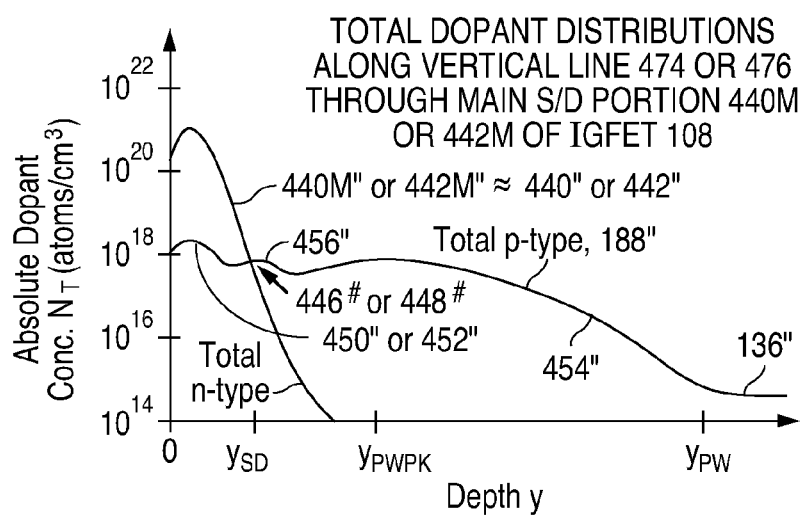
Figure 31C:
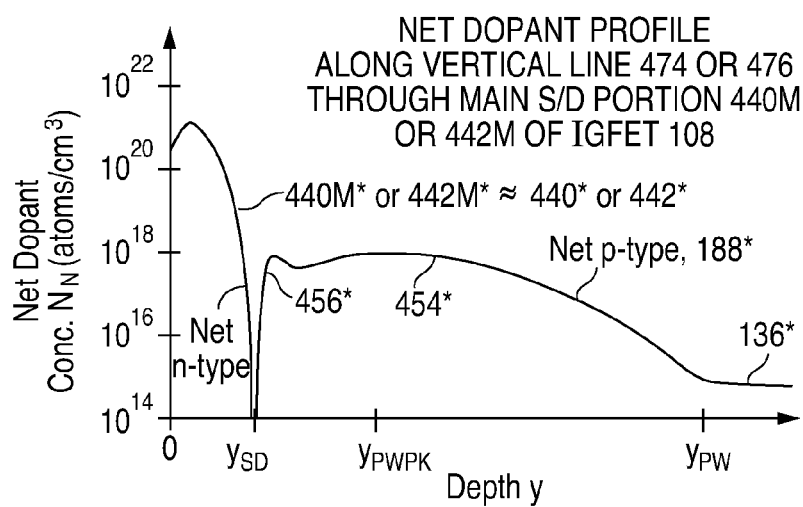
Figure 32A:
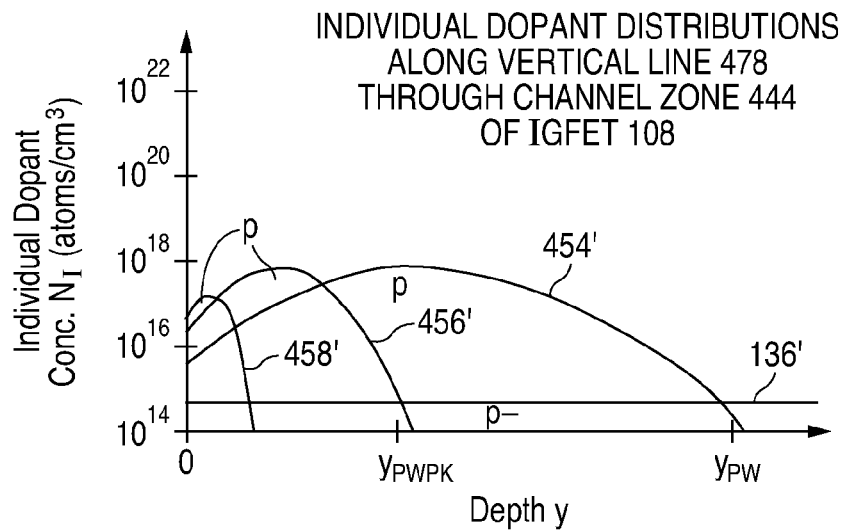
FIGS. 32*a*-32*c* are respective graphs of individual, total, and net dopant concentrations as a function of depth along an imaginary vertical line through the channel zone of the symmetric low-leakage n-channel IGFET of FIG. 29.
Figure 32B:
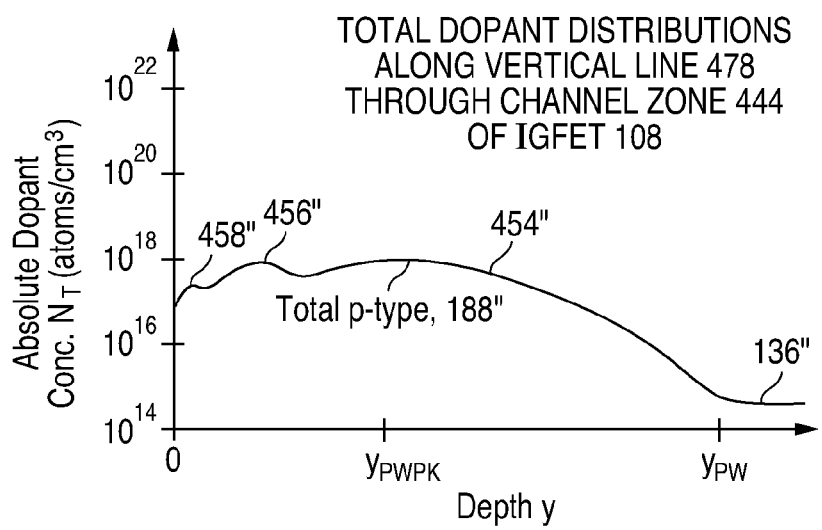
Figure 32C:
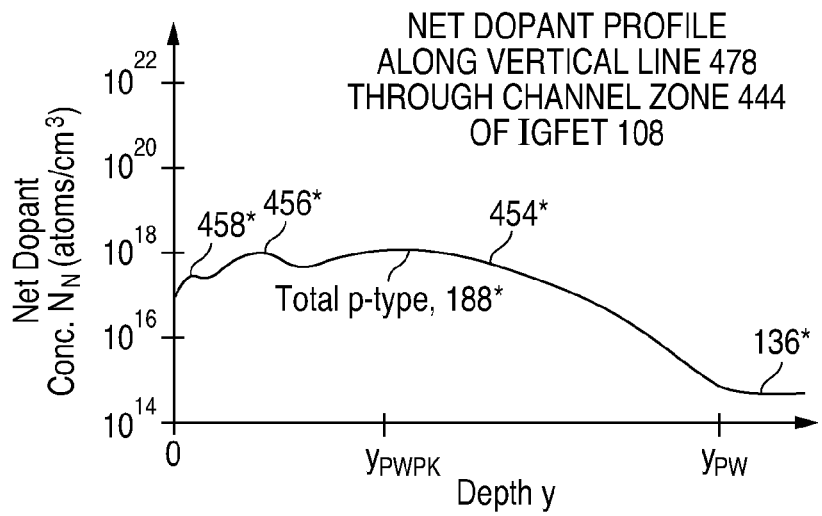

An understanding of the doping characteristics of IGFET 108 is facilitated with the assistance of FIGS. 30*a*-30*c* (collectively "FIG. 30"), FIGS. 31*a*-31*c* (collectively "FIG. 31"), and FIGS. 32*a*-32*c* (collectively "FIG. 32"). Exemplary dopant concentrations along the upper semiconductor surface as a function of longitudinal distance x for IGFET 108 are presented in FIG. 30. FIG. 31 presents exemplary vertical dopant concentrations as a function of depth y along imaginary vertical lines 474 and 476 through main S/D portions 440M and 442M at symmetrical locations from the longitudinal center of channel zone 444. Exemplary dopant concentrations as a function of depth y along an imaginary vertical line 478 through channel zone 444 and body-material portions 454, 456, and 458 are presented in FIG. 32. Line 478 passes through the channel zone's longitudinal center.

FIGS. 30*a*, 31*a*, and 32*a* specifically illustrate concentrations $N_I$ of the individual semiconductor dopants that largely define regions 136, 440M, 440E, 442M, 442E, 450, 452, 454, 456, and 458. Curves 440M', 442M', 440E', and 442E' in FIGS. 30*a*, 31*a*, and 32*a* represent concentrations $N_I$ (surface and vertical) of the n-type dopants used to respectively form main S/D portions 440M and 442M and S/D extensions 440E and 442E. Curves 136', 450', 452', 454', 456', and 458' represent concentrations $N_I$ (surface and/or vertical) of the p-type dopants used to respectively form substrate region 136, halo pocket portions 450 and 452, and filled-well body-material portions 454, 456, and 458. Curve 458' is labeled in FIG. 32*a* but, due to limited space, is not labeled in FIG. 31*a*. Items 446# and 448# indicate where net dopant concentration $N_N$ goes to zero and thus respectively indicate the locations of S/D-body junctions 446 and 448.

Concentrations $N_T$ of the total p-type and total n-type dopants in regions 440M, 440E, 442M, 442M, 450, 452, and 458 along the upper semiconductor surface are shown in FIG. 30*b*. FIGS. 31*b* and 32*b* variously depict concentrations $N_T$ of the total p-type and total n-type dopants in regions 440M, 442M, 454, 456, and 458 along imaginary vertical lines 474, 476, and 478. Curve segments 136", 450", 452", 454", 456", and 458" respectively corresponding to regions 136, 450, 452, 454, 456, and 458 represent total concentrations $N_T$ of the p-type dopants. Item 444" in FIG. 30*b* corresponds to channel zone 444 and represents the channel-zone portions of curve segments 450", 452" and 458". Item 188" in FIGS. 31*b* and 32*b* corresponds to filled well region 188. Curves 440M", 442M", 440E", and 442E" respectively corresponding to main S/D portions 440M and 440E and S/D extensions 440E and 442E represent total concentrations $N_T$ of the n-type dopants. Item 440" in FIG. 30*b* corresponds to S/D zone 440 and represents the combination of curve segments 440M" and 440E". Item 442" similarly corresponds to S/D zone 442 and represents the combination of curve segments 442M" and 442E".

FIG. 30*c* illustrates net dopant concentration $N_N$ along the upper semiconductor surface. Net dopant concentration $N_N$ along vertical lines 474, 476, and 478 is presented in FIGS. 30*c*, 31*c*, and 32*c*. Curve segments 450\*, 452\*, 454\*, 456\*, and 458\* represent net concentrations $N_N$ of the p-type dopant in respective regions 450, 452, 454, 456, and 458. Item 444\* in FIG. 30*c* represents the combination of channel-zone curve segments 450\*, 452\*, and 458\* and thus presents concentration $N_N$ of the net p-type dopant in channel zone 444. Item 188\* in FIGS. 31*c* and 32*c* corresponds to filled well region 188. Concentrations $N_N$ of the net n-type dopants in main S/D portions 440M and 442M and S/D extensions 440E and 442E are respectively represented by curve segments 440M\*, 442M\*, 440E\*, and 442E\*. Item 440\* in FIG. 30*c* corresponds to S/D zone 440 and represents the combination of curve segments 440M\* and 440E\*. Item 442\* similarly corresponds to S/D zone 442 and represents the combination of curve segments 442M\* and 442E\*.

Main S/D portions 440M and 442M are normally defined with the n-type main S/D dopant whose concentration $N_I$ along the upper semiconductor surface is represented here by curves 440M' and 442M' in FIG. 30*a*. The n-type shallow S/D-extension dopant with concentration $N_I$ along the upper semiconductor surface represented by curves 440F and 442E' in FIG. 30*a* is present in main S/D portions 440M and 442M. Comparison of curves 440M' and 442M' respectively to curves 440F and 442E' shows that the maximum values of concentration $N_T$ of the total n-type dopant in S/D zones 440 and 442 along the upper semiconductor surface respectively occur in main S/D portions 440M and 442M as respectively indicated by curve segments 440M" and 442M" in FIG. 30*b*.

The maximum values of net dopant concentration $N_N$ in S/D zones 440 and 442 along the upper semiconductor surface respectively occur in main S/D portions 440M and 442M as respectively indicated by curve portions 440M\* and 442M\* in FIG. 30*c*. In moving from main S/D portion 440M or 442M along the upper semiconductor surface to S/D extension 440E or 442E, concentration $N_T$ of the total n-type dopant in S/D zone 440 or 442 drops from the maximum value in main S/D portion 440M or 442M to a lower value in S/D extension 440E or 442E as shown by composite S/D curve 440" or 442" in FIG. 30*b*.

The p-type background, filled main well, APT, and threshold-adjust dopants with concentrations $N_I$ along the upper semiconductor surface respectively represented by curves 136', 454', 456', and 458' in FIG. 30a are present in S/D zones 440 and 442. In addition, the p-type S/D halo dopant with concentration $N_I$ along the upper semiconductor surface represented by curves 450' and 452' is present in S/D zones 440 and 442.

Comparison of FIG. 30b to FIG. 30a shows that upper-surface concentrations $N_T$ of the total n-type dopant in S/D zones 440 and 442, represented by curves 440" and 442" in FIG. 30b, is much greater than the sum of upper-surface concentrations $N_I$ of the p-type background, S/D halo, filled main well, APT, and threshold-adjust dopants except close to S/D-body junctions 446 and 448. Subject to net dopant concentration $N_N$ going to zero at junctions 446 and 448, upper-surface concentrations $N_T$ of the total n-type dopant in S/D zones 440 and 442 are respectively largely reflected in upper-surface concentrations $N_N$ of the net n-type dopant in S/D zones 440 and 442 respectively represented by curve segments 440M\* and 442M\* in FIG. 30c. The maximum value of net dopant concentration $N_N$ in S/D zone 440 or 442 along the upper semiconductor surface thus occurs in main S/D portion 440M or 442M. This maximum $N_N$ value is normally largely the same as the maximum value of net dopant concentration $N_N$ in main source portion 240M or main drain portion 242M of asymmetric IGFET 102 since main source portion 240M, main drain portion 242M, and main S/D portions 440M and 442M are all normally defined with the n-type main S/D dopant.

The p-type S/D halo dopant which defines halo pocket portions 450 and 452 is present in S/D zones 440 and 442 as shown by curves 450' and 452' that represent the p-type S/D halo dopant. Concentration $N_I$ of the p-type S/D halo dopant is at a substantially constant value across part or all of the upper surface of each S/D zone 440 or 442. In moving from each S/D zone 440 or 442 into channel zone 444 along the upper semiconductor surface, concentration $N_I$ of the p-type S/D halo dopant drops from this essentially constant value substantially to zero in channel zone 444 as shown in FIG. 30a. Since IGFET 108 is a symmetric device, concentration $N_I$ of the p-type S/D halo dopant is zero along the upper surface of channel zone 444 at a location which includes the upper-surface longitudinal center of IGFET 108. If channel zone 444 is sufficiently short that halo pockets 450 and 452 merge together, concentration $N_I$ of the p-type S/D halo dopant to a minimum value along the upper surface of channel zone 444 rather than substantially to zero. The points at which concentration $N_I$ of the p-type S/D halo dopant start dropping to zero or to this minimum value along the upper semiconductor surface may occur (a) within S/D zones 440 and 442, (b) largely at S/D-body junctions 446 and 448 as generally indicated in FIG. 30a, or (c) within channel zone 444.

Besides the p-type S/D halo dopant, channel zone 444 contains the p-type background, filled main well, APT, and threshold-adjust dopants. Concentration $N_I$ of the p-type threshold-adjust dopant represented by curve 458' in FIG. 30a is normally $1 \times 10^{17}$–$5 \times 10^{17}$ atoms/cm$^3$, typically $2 \times 10^{17}$–$3 \times 10^{17}$ atoms/cm$^3$ along the upper semiconductor surface. FIG. 30a shows that, along the upper semiconductor surface, concentration $N_I$ of the p-type threshold-adjust dopant is considerably greater than the combined concentrations $N_I$ of the p-type background, filled main well, and APT dopants respectively represented by curves 136', 454', and 456'. The constant value of upper-surface concentration $N_I$ of the p-type S/D halo dopant is considerably greater than upper-surface concentration $N_I$ of the p-type threshold-adjust dopant.

In moving from each S/D/body junction 446 or 448 along the upper semiconductor surface into channel zone 444, concentration $N_T$ of the total p-type dopant represented by curve 444" in FIG. 30b drops from a high value to a minimum value slightly greater than the upper-surface value of concentration $N_I$ of the p-type threshold-adjust dopant. Concentration $N_T$ of the total p-type dopant is at this minimum value for a non-zero portion of the longitudinal distance between S/D zones 440 and 442. This portion of the longitudinal distance between S/D zones 440 and 442 includes the longitudinal center of channel zone 444 and is largely centered between S/D-body junctions 446 and 448 along the upper semiconductor surface. As shown by curve 444\* in FIG. 30c, concentration $N_N$ of the net p-type dopant in channel zone 444 along the upper semiconductor largely repeats upper-surface concentration $N_T$ of the total p-type dopant in channel zone 444 subject to net concentration $N_N$ going to zero at S/D-body junctions 446 and 448.

If halo pocket portions 450 and 452 merge together, concentration $N_T$ of the total p-type dopant drops from a high value to a minimum value substantially at the longitudinal center of channel zone 444 in moving from each S/D/body junction 446 or 448 along the upper semiconductor surface into channel zone 444. In this case, the minimum value of upper-surface concentration $N_T$ of the total p-type dopant in channel zone 444 is suitably greater than the upper-surface value of concentration $N_I$ of the p-type threshold-adjust dopant depending on how much halo pockets 450 and 452 merge together.

The characteristics of p-type filled main well region 188 formed with halo pocket portions 450 and 452 and body-material portions 454, 456, and 458 are now examined with reference to FIGS. 31 and 32. As with channel zone 444, the total p-type dopant in p-type main well region 188 consists of the p-type background, S/D halo, filled main well, APT, and threshold-adjust dopants represented respectively by curve segments 136', 450' or 452', 454', 456', and 458' in FIGS. 31a and 32a. Except near halo pocket portions 450 and 452, the total p-type dopant in filled main well 188 consists only of the p-type background, empty main well, APT, and threshold-adjust dopants. With the p-type filled main well, APT, and threshold-adjust dopants being ion implanted into the monosilicon of IGFET 108, concentration $N_I$ of each of the p-type filled main well, APT, and threshold-adjust dopants reaches a local subsurface maximum in the monosilicon of IGFET 108. Concentration $N_I$ of the n-type S/D halo dopant reaches an additional local subsurface maximum in S/D zone 440 or 442 and halo pocket portion 450 or 452.

Concentration $N_I$ of the p-type filled main well dopant, as represented by curve 454' in FIGS. 31a and 31b, decreases by at least a factor of 10, normally by at least a factor of 20, commonly by at least a factor of 40, in moving from the location of the maximum concentration of the p-type filled main well dopant approximately at depth $y_{PWPK}$ upward along vertical line 474, 476, or 478 to the upper semiconductor surface. FIGS. 31a and 32a present an example in which concentration $N_I$ of the p-type filled main well dopant decreases by more than a factor of 80, in the vicinity of 100, in moving from the $y_{PWPK}$ location of the maximum concentration of the p-type filled main well dopant upward along line 474, 476, or 478 to the upper semiconductor surface. The upward movement along line 474 or 476 is through the overlying parts of body-material portions 454 and 456 and then through S/D zone 440 or 442, specifically through main S/D portion 440M or 442M. The upward movement along line 478 passing through channel zone 444 is solely through body-material portions 454, 456, and 458.

Curve 188" representing concentration $N_T$ of the total p-type dopant in p-type filled main well 188 consists, in FIG. 31b, of curve segments 454", 456", and 450" or 452" respectively representing concentrations $N_T$ of the total p-type dopants in body-material portions 454, 456, and 450 or 452. Upon comparing FIG. 31b to FIG. 31a, curve 188" in FIG. 31b shows that concentration $N_T$ of the total p-type dopant in main well 188 has three local subsurface maxima along vertical line 474 or 476 respectively corresponding to the local subsurface maxima in concentrations $N_I$ of the p-type filled main well, APT, and S/D halo dopants. With the subsurface concentration maximum of the p-type filled main well dopant occurring at approximately depth $y_{PWPK}$, the three local subsurface maxima in concentration $N_T$ of the total p-type dopant along line 474 or 476 flatten out curve 188" from depth $y_{PWPK}$ to the upper semiconductor surface.

Concentration $N_T$ of the total p-type dopant may increase somewhat or decrease somewhat in moving from depth $y_{PWPK}$ upward along vertical line 474 or 476 through the overlying parts of body-material portions 454 and 458 and through S/D zone 440 or 442 to the upper semiconductor surface. FIG. 31b presents an example in which concentration $N_T$ of the total p-type dopant along line 474 or 476 is slightly more at the upper surface of S/D zone 440 or 442 than at depth $y_{PWPK}$. If concentration $N_T$ of the p-type filled main well dopant decreases in moving from depth $y_{PWPK}$ upward along line 474 or 476 to the upper semiconductor surface, the $N_T$ concentration decrease from depth $y_{PWPK}$ along line 474 or 476 through the overlying parts of body-material portions 454 and 458 and through S/D zone 440 or 442 to the upper semiconductor surface is less than a factor of 10, preferably less than a factor of 5. The variation in the $N_T$ concentration along line 474 or 476 is usually sufficiently small that concentration $N_T$ of the total p-type dopant from depth $y_{PWPK}$ to the upper semiconductor surface along line 474 or 476 is in the regime of moderate p-type doping.

Referring to FIG. 31c, curve 188* representing concentration $N_N$ of the net p-type dopant in p-type filled main well 188 consists of curve segments 454* and 456* respectively representing concentrations $N_N$ of the net p-type dopants in body-material portions 454 and 456. In comparing FIG. 31c to FIG. 31b, curve 188* in FIG. 31c shows that concentration $N_T$ of the net p-type dopant in main well 188 has two local subsurface maxima along vertical line 474 or 476 respectively corresponding to the local subsurface maxima in concentrations $N_I$ of the p-type filled main well and APT dopants.

As to the n-type vertical dopant distributions in S/D zones 440 and 442, curve 440M' or 442M' in FIG. 31a for concentration $N_I$ of the n-type main S/D dopant in S/D zone 440 or 442 is largely identical to each of curves 240M' and 242M' in FIGS. 14a and 18a for IGFET 100. Similarly, curve 440E' or 442E' in FIG. 31a for concentration $N_I$ of the n-type shallow S/D-extension dopant in S/D zone 440 or 442 is largely identical to each of curves 240E' and 242E' in FIGS. 14a and 18a. Hence, curve 440M" or 442M" in FIG. 31b for concentration $N_T$ of the total n-type dopant in S/D zone 440 or 442 is largely identical to each of curves 240M" and 242M" in FIGS. 14b and 18b for IGFET 100. Subject to the presence of the p-type APT and threshold-adjust dopants, curve 440M* or 442M* in FIG. 31c for concentration $N_N$ of the net n-type dopant in S/D zone 440 or 442 is similar to each of curves 240M* and 242M* in FIGS. 14c and 18c for IGFET 108.

Curve 188" in FIG. 32b consists of curve segments 454", 456", and 458" respectively representing concentrations $N_T$ of the total p-type dopants in body-material portions 454, 456, and 458. Upon comparing FIG. 32b to FIG. 32a, curve 188" in FIG. 32b shows that concentration $N_T$ of the total p-type dopant in main well 188 has three local subsurface maxima along vertical line 478 respectively corresponding to the local subsurface maxima in concentrations $N_I$ of the p-type filled main well, APT, and threshold-adjust dopants. Similar to what occurs along vertical line 474 or 476 through S/D zone 440 or 442, the three local subsurface maxima in concentration $N_T$ of the total p-type dopant along line 478 through channel zone 444 flatten out curve 188" from depth $y_{PWPK}$ to the upper semiconductor surface.

Also similar to what occurs along vertical line 474 or 476 through S/D zone 440 or 442, concentration $N_T$ of the total p-type dopant may increase somewhat or decrease somewhat in moving from depth $y_{PWPK}$ upward along vertical line 478 through channel zone 444 to the upper semiconductor surface. FIG. 32b presents an example in which concentration $N_T$ of the total p-type dopant along line 474 or 476 is somewhat less at the upper surface of channel zone 444 than at depth $y_{PWPK}$. The variation in the $N_T$ concentration along line 478 is usually sufficiently small that concentration $N_T$ of the total p-type dopant from depth $y_{PWPK}$ to the upper semiconductor surface along line 478 is in the regime of moderate p-type doping. Main well region 188 is therefore a filled well.

The maximum concentration of the p-type APT dopant at the above-mentioned typical depth of 0.25 μm is normally $2 \times 10^{17} - 6 \times 10^{17}$ atoms/cm$^3$, typically $4 \times 10^{17}$ atoms/cm$^3$. The maximum concentration of the p-type threshold-adjust dopant is normally $2 \times 10^{17} - 1 \times 10^{18}$ atoms/cm$^3$, typically $3 \times 10^{17} - 3.5 \times 10^{17}$ atoms/cm$^3$, and occurs at a depth of no more than 0.2 μm, typically 0.1 μm. Due to these characteristics of the p-type threshold-adjust dopant, threshold voltage $V_T$ of symmetric low-voltage low-leakage IGFET 108 is normally 0.3 V to 0.55 V, typically 0.4 V to 0.45 V, at a drawn channel length $L_{DR}$ of 0.13 μm for a short-channel implementation and at a gate dielectric thickness of 2 nm.

The S-D current leakage in the biased-off state of IGFET 108 is very low due to optimization of the IGFET's dopant distribution and gate dielectric characteristics. Compared to a symmetric n-channel IGFET which utilizes an empty p-type well region, the increased amount of p-type semiconductor dopant near the upper surface of filled main well region 188 enables IGFET 108 to have very low off-state S-D current leakage in exchange for an increased value of threshold voltage $V_T$. IGFET 108 is particularly suitable for low-voltage core digital applications, e.g., a typical voltage range of 1.2 V, that require low S-D current leakage in the biased-off state and can accommodate slightly elevated $V_T$ magnitude.

F3. Symmetric Low-Voltage Low-Leakage P-Channel IGFET

Low-voltage low-leakage p-channel IGFET 110 is configured basically the same as low-voltage low-leakage n-channel IGFET 108 with the conductivity types reversed. Referring again to FIG. 11.3, p-channel IGFET 110 has a pair of largely identical p-type S/D zones 480 and 482 situated in active semiconductor island 150 along the upper semiconductor surface. S/D zones 480 and 482 are separated by a channel zone 484 of n-type filled main well region 190 which constitutes the body material for IGFET 110. N-type body-material filled well 190 forms (a) a first pn junction 486 with p-type S/D zone 480 and (b) a second pn junction 488 with p-type S/D zone 482.

Subject to the body material for p-channel IGFET 110 being formed with a filled main well rather than the combination of a filled main well and underlying material of the semiconductor body as occurs with n-channel IGFET 108, p-channel IGFET 110 is configured the same as n-channel IGFET 108 with the conductivity types reversed. Accordingly, p-channel IGFET 110 contains largely identical moderately doped n-type halo pocket portions 490 and 492, a moderately doped n-type main body-material portion 494, a moderately doped n-type intermediate body-material portion 496, a moderately doped n-type upper body-material portion 498, a gate dielectric layer 500 at the $t_{GdL}$ low thickness value, a gate electrode 502, dielectric sidewall spacers 504 and 506, and metal silicide layers 508, 510, and 512 configured respectively the same as regions 450, 452, 454, 456, 458, 460, 462, 464, 466, 468, 470, and 472 of n-channel IGFET 108. N halo pocket portions 490 and 492 are defined with n-type semiconductor dopant referred to as the n-type S/D halo dopant or as the n-type S/D-adjoining pocket dopant.

N main body-material portion 494 overlies p− substrate region 136 and forms pn junction 230 with it. Also, each p-type S/D zone 480 or 482 consists of a very heavily doped main portion 480M or 482M and a more lightly doped, but still heavily doped, lateral extension 480E or 482E. Main S/D portions 480M and 482M are defined with the p-type main S/D dopant. S/D extensions 480E and 482E are defined with p-type semiconductor dopant referred to as the p-type shallow S/D-extension dopant. All of the comments made about the doping of p-type filled main well 188 of n-channel IGFET 108 apply to n-type filled main well 190 of p-channel IGFET 110 with the conductivity types reversed and with regions 188, 440, 442, 444, 450, 452, 454, 456, and 458 of n-channel IGFET 108 respectively replaced with regions 190, 480, 482, 484, 490, 492, 494, 496, and 498 of p-channel IGFET 110.

Subject to minor perturbations due to the presence of the p-type background dopant, the lateral and vertical dopant distributions in p-channel IGFET 110 are essentially the same as the lateral and vertical dopant distributions in n-channel IGFET 108 with the conductivity types reversed. The dopant distributions in p-channel IGFET 110 are functionally the same as the dopant distributions in n-channel IGFET 108. P-channel IGFET 110 operates substantially the same as n-channel IGFET 108 with the voltage polarities reversed.

Threshold voltage $V_T$ of symmetric low-voltage low-leakage p-channel IGFET 110 is normally −0.3 V to −0.5 V, typically −0.4 V, at a drawn channel length $L_{DR}$ of 0.13 μm for a short-channel implementation and at a gate dielectric thickness of 2 nm. Similar to what arises with n-channel IGFET 108, the increased amount of n-type semiconductor dopant near the upper surface of filled main well region 190 enables p-channel IGFET 108 to have very low off-state S-D current leakage in exchange for an increased magnitude of threshold voltage $V_T$ compared to a symmetric p-channel IGFET which utilizes an empty n-type well region. As with n-channel IGFET 108, p-channel IGFET 110 is particularly suitable for low-voltage core digital applications, e.g., an operational range of 1.2 V, which require low S-D current leakage in the biased-off state and can accommodate slightly elevated $V_T$ magnitude.

G. Symmetric Low-Voltage Low-Threshold-Voltage IGFETs

Symmetric low-voltage low-$V_T$ empty-well complementary IGFETs 112 and 114 are described with reference only to FIG. 11.4. N-channel IGFET 112 has a pair of largely identical n-type S/D zones 520 and 522 situated in active semiconductor island 152 along the upper semiconductor surface. S/D zones 520 and 522 are separated by a channel zone 524 of p-type, empty main well region 192 which, in combination with p− substrate region 136, constitutes the body material for IGFET 112. P-type body-material empty well 192 forms (a) a first pn junction 526 with n-type S/D zone 520 and (b) a second pn junction 528 with n-type S/D zone 522.

Each n-type S/D zone 520 or 522 consists of a very heavily doped main portion 520M or 522M and a more lightly doped, but still heavily doped, lateral extension 520E or 522E. Largely identical n+ S/D extensions 520E and 522E, which terminate channel zone 524 along the upper semiconductor surface, extend deeper than largely identical n++ main S/D portions 520M and 522M. In fact, each S/D-body junction 526 or 528 is solely a pn junction between empty well 192 and S/D extension 520E or 522E.

S/D extensions 520E and 522E are, as described below, normally defined by ion implantation of the n-type deep S/D-extension dopant at the same time as drain extension 242 of asymmetric n-channel IGFET 100. The n-type shallow S/D-extension implantation used to define S/D extensions 440E and 442 of symmetric low-voltage low-leakage n-channel IGFET 108 is, as indicated below, performed more shallowly than the n-type deep S/D-extension implantation. As a result, S/D extensions 520E and 522E of symmetric empty-well IGFET 112, also a low-voltage n-channel device, extend deeper than S/D extensions 440E and 442E of symmetric filled-well IGFET 108.

The p-type dopant in p-type body-material empty main well 192 consists of the p-type empty main well dopant and the substantially constant p-type background dopant of p− substrate region 136. Since the p-type empty main well dopant in empty well 192 reaches a deep subsurface concentration maximum at average depth $y_{PWPK}$, the presence of the p-type empty main well dopant in well 192 causes the concentration of the total p-type dopant in well 192 to reach a deep local subsurface concentration maximum substantially at the location of the deep subsurface concentration maximum in well 192. In moving from the location of the deep p-type empty-well concentration maximum in empty well 192 toward the upper semiconductor surface along an imaginary vertical line through channel zone 524, the concentration of the p-type dopant in well 192 drops gradually from a moderate doping, indicated by symbol "p", to a light doping, indicated by symbol "p−". Dotted line 530 in FIG. 11.4 roughly represents the location below which the p-type dopant concentration in empty well 192 is at the moderate p doping and above which the p-type dopant concentration in well 192 is at the light p− doping.

IGFET 112 does not have halo pocket portions which are situated in p-type empty main well 192, which extend respectively along S/D zones 520 and 522, and which are more heavily doped p-type than adjacent material of well 192. Channel zone 524 (not specifically demarcated in FIG. 11.4), which consists of all the p-type monosilicon between S/D zones 520 and 522, is thus formed solely by a surface-adjoining segment of the p− upper part of well 192.

A gate dielectric layer 536 at the $t_{GdL}$ low thickness value is situated on the upper semiconductor surface and extends over channel zone 524. A gate electrode 538 is situated on gate dielectric layer 536 above channel zone 524. Gate electrode 538 extends over part of each n+ S/D extension 520E or 522E but normally not over any part of either n++ main S/D portion 520M or 522M. Dielectric sidewall spacers 540 and 542 are situated respectively along the opposite transverse sidewalls of gate electrode 538. Metal silicide layers 544, 546, and 548 are respectively situated along the tops of gate electrode 538 and main S/D portions 520M and 522M.

Empty well region 192 of IGFET 112 is normally defined by ion implantation of the p-type empty main well dopant at the same time as empty well region 180 of asymmetric n-channel IGFET 100. Main S/D portions 520M and 522M of IGFET 112 are normally defined by ion implantation of the n-type main S/D dopant at the same time as main source portions 240M and 242M of IGFET 100. Since S/D extensions 520E and 522E of IGFET 112 are normally defined by ion implantation of the n-type deep S/D-extension dopant at the same time as drain extension 242E of IGFET 100, the dopant distribution in each S/D zone 520 or 522 and the adjacent part of well 192 up to the longitudinal center of IGFET 112 is essentially the same as the dopant distribution in drain 242 of IGFET 100 and the adjacent part of well 180 up to a lateral distance approximately equal to the lateral distance from S/D zone 520 or 522 to the longitudinal center of IGFET 112.

More particularly, the dopant distribution along the upper surface of each S/D zone 520 or 522 and the adjacent part of the upper surface of channel zone 524 up to the longitudinal center of IGFET 112 is essentially the same as the dopant distribution shown in FIG. 13 for the upper surface of drain 242 of IGFET 100 and the upper surface of the adjacent part of well 180 up to a lateral distance approximately equal to the lateral distance from S/D zone 520 or 522 to the longitudinal center of IGFET 112. The vertical dopant distributions along suitable imaginary vertical lines through each S/D extension 520E or 522E and each main S/D portion 520M or 522M of IGFET 112 are essentially the same as the vertical dopant distributions shown in FIGS. 17 and 18 along vertical lines 278E and 278M through drain extension 242E and main drain portion 242M of IGFET 100.

The vertical dopant distribution along an imaginary vertical line through the longitudinal center of channel zone 524 of IGFET 112 is essentially the same as the vertical distribution shown in FIG. 16 along vertical line 276 through channel zone 244 of IGFET 100 even though the lateral distance from drain 240 of IGFET to line 276 may exceed the lateral distance lateral from S/D zone 520 or 522 to the longitudinal center of IGFET 112. Subject to the preceding limitations, the comments made about the upper-surface and vertical dopant distributions of IGFET 100, specifically along the upper surface of drain 242 into channel zone 244 along its upper surface and along vertical lines 276, 278E, and 278M, apply to the dopant distributions along the upper surfaces of S/D zones 520 and 522 and channel zone 524 and along the indicated vertical lines through each S/D extension 520E or 522E, each main S/D portion 520M or 522M, and channel zone 524 of IGFET 112.

Low-voltage low-$V_T$ p-channel IGFET 114 is configured basically the same as n-channel IGFET 112 with the conductivity types reversed. With reference again to FIG. 11.4, p-channel IGFET 114 has a pair of largely identical p-type S/D zones 550 and 552 situated in active semiconductor island 154 along the upper semiconductor surface. S/D zones 550 and 552 are separated by a channel zone 554 of p-type empty main well region 194 which constitutes the body material for IGFET 114. N-type body-material empty well 194 forms (a) a first pn junction 556 with p-type S/D zone 550 and (b) a second pn junction 558 with p-type S/D zone 552.

Each p-type S/D zone 550 or 552 consists of a very heavily doped main portion 550M or 552M and a more lightly doped, but still heavily doped, lateral extension 550E or 552E. Channel zone 554 is terminated along the upper semiconductor surface by S/D extensions 550E and 552E. Largely identical p+ S/D extensions 550E and 552E extend deeper than largely identical p++ main S/D portions 550M and 552M.

As described below, S/D extensions 550E and 552E are normally defined by ion implantation of the p-type deep S/D-extension dopant at the same time as drain extension 282 of asymmetric p-channel IGFET 102. The p-type shallow S/D-extension implantation used to define S/D extensions 480E and 482 of symmetric low-voltage low-leakage p-channel IGFET 110 is, as indicated below, performed more shallowly than the p-type deep S/D-extension implantation. Consequently, S/D extensions 550E and 552E of symmetric empty-well IGFET 114, also a low-voltage p-channel device, extend deeper than S/D extensions 480E and 482E of symmetric filled-well IGFET 110.

The n-type dopant in n-type body-material empty main well 194 consists solely of the n-type empty main well dopant. Hence, the n-type dopant in empty well 194 reaches a deep subsurface concentration maximum at average depth $y_{NWPK}$. In moving from the location of the n-type empty-well concentration maximum in empty well 194 toward the upper semiconductor surface along an imaginary vertical line through channel zone 554, the concentration of the n-type dopant in well 194 drops gradually from a moderate doping, indicated by symbol "n", to a light doping, indicated by symbol "n−". Dotted line 560 in FIG. 11.4 roughly represents the location below which the n-type dopant concentration in empty well 194 is at the moderate n doping and above which the n-type dopant concentration in well 194 is at the light n− doping.

Subject to the preceding comments, p-channel IGFET 114 further includes a gate dielectric layer 566 at the $t_{GdL}$ low thickness value, a gate electrode 568, dielectric sidewall spacers 570 and 572, and metal silicide layers 574, 576, and 578 configured respectively the same as regions 536, 538, 540, 542, 544, 546, and 548 of n-channel IGFET 112. Analogous to n-channel IGFET 112, p-channel IGFET 114 does not have halo pocket portions. Channel zone 554 (not specifically demarcated in FIG. 11.4), which consists of all the n-type monosilicon between S/D zones 550 and 552, is formed solely by a surface-adjoining segment of the n− upper part of well 194.

Subject to minor perturbations due to the presence of the p-type background dopant, the longitudinal and vertical dopant distributions in p-channel IGFET 114 are essentially the same as the longitudinal and vertical dopant distributions in n-channel IGFET 112 with the conductivity types reversed. The dopant distributions in IGFET 114 are functionally the same as the dopant distributions in IGFET 112. IGFET 114 functions substantially the same as IGFET 112 with the voltage polarities reversed.

Threshold voltage $V_T$ of each of symmetric low-voltage low-$V_T$ IGFETs 112 and 114 is normally −0.01 V to 0.19 V, typically 0.09 V, at a drawn channel length $L_{DR}$ of 0.3 μm and a gate dielectric thickness of 2 nm. Accordingly, n-channel IGFET 112 is typically an enhancement-mode device whereas p-channel IGFET 114 is typically a depletion-mode device.

Compared to a symmetric n-channel IGFET which utilizes a filled p-type well region, the reduced amount of p-type semiconductor dopant near the upper surface of empty main well region 192 enables n-channel IGFET 112 to have a very low value of threshold voltage $V_T$. Similarly, the reduced amount of n-type semiconductor dopant near the upper surface of empty main well region 194 enables p-channel IGFET 114 to have threshold voltage $V_T$ of very low magnitude compared to a symmetric p-channel IGFET which utilizes a filled n-type well region. IGFETs 112 and 114 are particularly suitable for low-voltage analog and digital applications, e.g., an operational range of 1.2 V, which require threshold voltages $V_T$ of reduced magnitude and can accommodate somewhat increased channel length L.

H. Symmetric High-Voltage IGFETs of Nominal Threshold-Voltage Magnitude

Symmetric high-voltage filled-well complementary IGFETs 116 and 118 of nominal $V_T$ magnitude are described with reference only to FIG. 11.5. N-channel IGFET 116 has a pair of largely identical n-type S/D zones 580 and 582 situated in active semiconductor island 156 along the upper semiconductor surface. S/D zones 580 and 582 are separated by a channel zone 584 of p-type filled main well region 196 which, in combination with p− substrate region 136, constitutes the body material for IGFET 116. P-type body-material filled well 196 forms (a) a first pn junction 586 with n-type S/D zone 580 and (b) a second pn junction 588 with n-type S/D zone 582.

Each n-type S/D zone 580 or 582 consists of a very heavily doped main portion 580M or 582M and a more lightly doped, but still heavily doped, lateral extension 580E or 582E. Largely identical n+ lateral S/D extensions 580E and 582E, which terminate channel zone 584 along the upper semiconductor surface, extend deeper than largely identical n++ main S/D portions 580M and 582M.

S/D extensions 580E and 582E are, as described below, normally defined by ion implantation of the n-type deep S/D-extension dopant at the same time as drain extension 242 of asymmetric n-channel IGFET 100 and therefore normally also at the same time as S/D extensions 520E and 522E of symmetric low-voltage low-$V_T$ n-channel IGFET 112. Inasmuch as the n-type shallow S/D-extension implantation used to define S/D extensions 440E and 442 of symmetric low-voltage low-leakage n-channel IGFET 108 is performed more shallowly than the n-type deep S/D-extension implantation, S/D extensions 580E and 582E of symmetric high-voltage filled-well IGFET 116 extend deeper than S/D extensions 440E and 442E of symmetric low-voltage filled-well IGFET 108.

IGFET 116 does not have halo pocket portions which are situated in p-type body-material empty main well 196, which extend respectively along S/D zones 580 and 582, and which are more heavily doped p-type than adjacent material of well 196. Subject to this difference, empty well 196 is configured substantially the same as empty well 188 of n-channel IGFET 108. Accordingly, p-type empty well 196 consists of a moderately doped main body-material portion 590, a moderately doped intermediate body-material portion 592, and a moderately doped upper body-material portion 594 configured respectively the same as body-material portions 554, 556, and 558 of empty well 188 of IGFET 108.

As with p body-material portions 454, 456, and 458 of IGFET 108, p body-material portions 590, 592, and 594 of IGFET 116 are respectively defined with the p-type filled main well, APT, and threshold-adjust dopants whose concentrations reach maximum values at different average depths. P body-material portions 590, 592, and 594 therefore have the same dopant concentration characteristics as p body-material portions 454, 456, and 458 of IGFET 108. Body-material portions 590, 592, and 594 are often referred to here respectively as p filled-well main body-material portion 590, p APT body-material portion 592, and p threshold-adjust body-material portion 594. Since IGFET 116 lack halo pocket portions, p threshold-adjust body-material portion 594 extends laterally between S/D zones 580 and 582, specifically between S/D extensions 580E and 582E. Channel zone 584 (not specifically demarcated in FIG. 11.5), which consists of all the p-type monosilicon between S/D zones 580 and 582, is formed solely by a surface-adjoining segment of the p− upper part of well 196.

A gate dielectric layer 596 at the $t_{GdH}$ high thickness value is situated on the upper semiconductor surface and extends over channel zone 584. A gate electrode 598 is situated on gate dielectric layer 596 above channel zone 584. Gate electrode 598 extends over part of each n+ S/D extension 580E or 582E but normally not over any part of either n++ main S/D portion 580M or 582M. Dielectric sidewall spacers 600 and 602 are situated respectively along the opposite transverse sidewalls of gate electrode 598. Metal silicide layers 604, 606, and 608 are respectively situated along the tops of gate electrode 598 and main S/D portions 580M and 582M.

Filled well region 196 of IGFET 116 is normally defined by ion implantations of the p-type filled main well, APT, and threshold-adjust dopants at the same respective times as filled well region 188 of symmetric n-channel IGFET 108. As a result, the p-type dopant distribution in the doped monosilicon of IGFET 116 is essentially the same as the p-type dopant distribution in the doped monosilicon of IGFET 108. All of the comments made about the p-type dopant distribution in the doped monosilicon of IGFET 108 apply to the doped monosilicon of IGFET 116.

Main S/D portions 580M and 582M of IGFET 116 are normally defined by ion implantation of the n-type main S/D dopant at the same time as main source portion 240M of asymmetric n-channel IGFET 100. With S/D extensions 580E and 582E of IGFET 116 normally defined by ion implantation of the n-type deep S/D-extension dopant at the same time as drain extension 242E of IGFET 100, the n-type dopant distribution in each S/D zone 580 or 582 and the adjacent part of well 196 up to the longitudinal center of IGFET 116 is essentially the same as the n-type dopant distribution in drain 242 of IGFET 100 and the adjacent part of well 180 up to a lateral distance approximately equal to the lateral distance from S/D zone 580 or 582 to the longitudinal center of IGFET 116.

In particular, the n-type dopant distribution along the upper surface of each S/D zone 580 or 582 and the adjacent part of the upper surface of channel zone 584 up to the longitudinal center of IGFET 116 is essentially the same as the n-type dopant distribution shown in FIG. 13 for the upper surface of drain 242 of IGFET 100 and the upper surface of the adjacent part of well 180 up to a lateral distance approximately equal to the lateral distance from S/D zone 580 or 582 to the longitudinal center of IGFET 116. The n-type vertical dopant distributions along suitable imaginary vertical lines through each S/D extension 580E or 582E and each main S/D portion 580M or 582M of IGFET 116 are essentially the same as the n-type vertical dopant distributions shown in FIGS. 17 and 18 along vertical lines 278E and 278M through drain extension 242E and main drain portion 242M of IGFET 100.

The n-type vertical dopant distribution along an imaginary vertical line through the longitudinal center of channel zone 584 of IGFET 116 is essentially the same as the vertical distribution shown in FIG. 16 along vertical line 276 through channel zone 244 of IGFET 100 even though the lateral distance from drain 240 of IGFET to line 276 may exceed the lateral distance lateral from S/D zone 580 or 582 to the longitudinal center of IGFET 116. Subject to the preceding limitations, the comments made about the n-type upper-surface and vertical dopant distributions of IGFET 100, specifically along the upper surface of drain 242 into channel zone 244 along its upper surface and along vertical lines 276, 278E, and 278M, apply to the n-type dopant distributions along the upper surfaces of S/D zones 580 and 582 and channel zone 584 of IGFET 116 and along the indicated vertical lines through each S/D extension 580E or 582E, each main S/D portion 580M or 582M, and channel zone 584.

High-voltage p-channel IGFET 118 is configured basically the same as n-channel IGFET 116 with the conductivity types reversed. Referring again to FIG. 11.5, p-channel IGFET 118 has a pair of largely identical p-type S/D zones 610 and 612 situated in active semiconductor island 158 along the upper semiconductor surface. S/D zones 610 and 612 are separated by a channel zone 614 of n-type filled main well region 198 which constitutes the body material for IGFET 118. N-type body-material filled well 198 forms (a) a first pn junction 616 with p-type S/D zone 610 and (b) a second pn junction 618 with p-type S/D zone 612.

Each p-type S/D zone 610 or 612 consists of a very heavily doped main portion 610M or 612M and a more lightly doped, but still heavily doped, lateral extension 610E or 612E. Channel zone 614 is terminated along the upper semiconductor surface by S/D extensions 610E and 612E. Largely identical p+ S/D extensions 610E and 612E extend deeper than largely identical p++ main S/D portions 610M and 612M.

As described below, S/D extensions 610E and 612E are normally defined by ion implantation of the p-type deep S/D-extension dopant at the same time as drain extension 282 of asymmetric p-channel IGFET 102 and thus normally also at the same time as S/D extensions 550E and 552E of symmetric low-voltage low-$V_T$ p-channel IGFET 114. Since the p-type shallow S/D-extension implantation used to define S/D extensions 480E and 482 of symmetric low-voltage low-leakage p-channel IGFET 110 is performed more shallowly than the p-type deep S/D-extension implantation, S/D extensions 610E and 612E of symmetric high-voltage IGFET 118 extend deeper than S/D extensions 480E and 482E of symmetric low-voltage IGFET 110.

Subject to the body material for p-channel IGFET 118 being formed with a filled main well rather than the combination of a filled main well and underlying material of the semiconductor body as occurs with n-channel IGFET 116, p-channel IGFET 118 is configured the same as n-channel IGFET 116 with the conductivity types reversed. Accordingly, p-channel IGFET 118 contains a moderately doped n-type main body-material portion 620, a moderately doped n-type intermediate body-material portion 622, and a moderately doped n-type upper body-material portion 624, a gate dielectric layer 626, a gate electrode 628 at the $t_{GdH}$ high thickness value, dielectric sidewall spacers 630 and 632, and metal silicide layers 634, 636, and 638 configured respectively the same as regions 590, 592, 594, 596, 598, 600, 602, 604, 606, and 608 of n-channel IGFET 116. N main body-material portion 620 overlies p– substrate region 136 and forms pn junction 234 with it.

All of the comments made about the doping of p-type filled main well 196 of n-channel IGFET 116 apply to n-type filled main well 198 of p-channel IGFET 118 with the conductivity types reversed and with regions 196, 580, 582, 584, 590, 592, and 594 of n-channel IGFET 116 respectively replaced with regions 198, 610, 612, 614, 620, 622, and 624 of p-channel IGFET 118.

Subject to minor perturbations due to the presence of the p-type background dopant, the longitudinal and vertical dopant distributions in p-channel IGFET 118 are essentially the same as the longitudinal and vertical dopant distributions in n-channel IGFET 114 with the conductivity types reversed. The dopant distributions in IGFET 118 are functionally the same as the dopant distributions in IGFET 116. IGFET 118 functions substantially the same as IGFET 114 with the voltage polarities reversed.

Threshold voltage $V_T$ of symmetric high-voltage nominal-$V_T$ n-channel IGFET 116 is normally 0.4 V to 0.65 V, typically 0.5 V to 0.55 V, at a drawn channel length $L_{DR}$ in the vicinity of 0.4 μm and a gate dielectric thickness of 6-6.5 nm. Threshold voltage $V_T$ of symmetric high-voltage nominal-$V_T$ p-channel IGFET 118 is normally –0.5 V to –0.75 V, typically –0.6 V to –0.65 V, at a drawn channel length $L_{DR}$ in the vicinity of 0.3 μm and a gate dielectric thickness of 6-6.5 nm.

Symmetric IGFETs 116 and 118 are particularly suitable for high-voltage digital applications, e.g., an operational range of 3.0 V.

I. Symmetric Low-Voltage IGFETs of Nominal Threshold-Voltage Magnitude

Symmetric low-voltage filled-well complementary IGFETs 120 and 122 of nominal $V_T$ magnitude are described with reference only to FIG. 11.6. IGFETs 120 and 122 are configured respectively similar to low-voltage low-leakage symmetric IGFETs 108 and 110 of increased $V_T$ magnitude except that IGFETs 120 and 122 lack surface-adjoining threshold-adjust body-material portions analogous to p threshold-adjust body-material portion 458 and n threshold-adjust body-material portion 498 which cause off-state current leakage to be reduced in IGFETs 108 and 110 and produce increases in the magnitudes of their threshold voltages. N-channel IGFET 120 is generally configured substantially the same as n-channel IGFET 20 as described in U.S. Pat. No. 6,588,682 cited above. P-channel IGFET 122 is similarly generally configured substantially the same as a p-channel IGFET described in U.S. Pat. No. 6,588,682.

With the preceding comments in mind, n-channel IGFET 120 has a pair of largely identical n-type S/D zones 640 and 642 situated in active semiconductor island 160 along the upper semiconductor surface. S/D zones 640 and 642 are separated by a channel zone 644 of p-type filled main well region 200 which, in combination with p– substrate region 136, constitutes the body material for IGFET 120. P-type body-material filled well 200 forms (a) a first pn junction 646 with n-type S/D zone 640 and (b) a second pn junction 648 with n-type S/D zone 642.

Each n-type S/D zone 640 or 642 consists of a very heavily doped main portion 640M or 642M and a more lightly doped, but still heavily doped, lateral extension 640E or 642E. Largely identical n++ main S/D portions 640M and 642M extend deeper than largely identical n+ source extensions 640E and 642E. Channel zone 644 is terminated along the upper semiconductor surface by S/D extensions 640E and 642E.

S/D extensions 640E and 642E are normally defined by ion implantation of the n-type shallow S/D-extension dopant at the same time as S/D extensions 440E and 442E of symmetric low-voltage low-leakage n-channel IGFET 108. The n-type shallow S/D-extension implantation is, as indicated below, performed more shallowly than the n-type deep S/D-extension implantation used to define both S/D extensions 520E and 522E of symmetric low-voltage low $V_T$ n-channel IGFET 112 and S/D extensions 580E and 582E of symmetric high voltage nominal-$V_T$ n-channel IGFET 116. Consequently, S/D extensions 520E and 522E of symmetric empty-well IGFET 112 and S/D extensions 580 and 582 of symmetric filled-well IGFET 116 extend deeper than S/D extensions 640E and 642E of symmetric filled-well IGFET 120.

A pair of largely identical moderately doped laterally separated halo pocket portions 650 and 652 of p-type body-material filled main well 200 respectively extend along S/D zones 640 and 642 up to the upper semiconductor surface and terminate at respective locations between S/D zones 640 and 642. FIG. 11.6 illustrates the situation in which S/D zones 640 and 642 extend deeper than halo pockets 650 and 652. Halo pockets 650 and 652 can alternatively extend deeper than S/D zones 640 and 642. Halo pockets 650 and 652 then respectively extend laterally under S/D zones 640 and 642. As with halo pocket portions 450 and 452 of IGFET 108, halo pockets 650 and 652 are defined with the p-type S/D halo dopant that reaches a maximum concentration below the upper semiconductor surface.

The material of p-type body-material filled main well 200 outside halo pocket portions 650 and 652 consists of a moderately doped main body-material portion 654 and a moderately doped further body-material portion 656. P body-material portions 654 and 656 are configured respectively the same as p body-material portions 454 and 456 of IGFET 108 except that p further body-material portion 656 extends to the upper semiconductor surface between halo pockets 650 and 652. P body-material portions 654 and 656 are respectively defined with the p-type filled main well dopant and the p-type APT dopant. Accordingly, body-material portions 654 and 656 are often referred to here respectively as p filled-well main body-material portion 654 and p APT body-material portion 656.

Channel zone 644 (not specifically demarcated in FIG. 11.6) consists of all the p-type monosilicon between S/D zones 640 and 642. More particularly, channel zone 644 is formed by a surface-adjoining underlying segment of APT body-material portion 656 and (a) all of p halo pocket portion 650 and 652 if S/D zones 640 and 642 extend deeper than halo pocket 650 and 652 as illustrated in the example of FIG. 11.6 or (b) surface-adjoining segments of halo pockets 650 and 652 if they extend deeper than S/D zones 640 and 642. Because the maximum concentration of the p-type threshold-adjust dopant in main filled well 200 is normally significantly less than the maximum concentration of the p-type S/D halo dopant in well 200, halo pockets 650 and 652 are more heavily doped p-type than the directly adjacent material of well 200.

IGFET 120 further includes a gate dielectric layer 660 of the $t_{GdL}$ low thickness, a gate electrode 662, dielectric sidewall spacers 664 and 666, and metal silicide layers 668, 670, and 672 configured respectively the same as regions 460, 462, 464, 466, 468, 470, and 472 of IGFET 108.

Filled well region 200 of IGFET 120 is normally defined by ion implantations of the p-type filled main well and APT dopants at the same respective times as filled well region 188 of symmetric low-leakage n-channel IGFET 108. Inasmuch as filled well 200 of IGFET 120 lacks a threshold-adjust body-material portion corresponding to threshold-adjust body-material portion 448 in filled well 200 of IGFET 108, the p-type dopant distribution in the doped monosilicon of IGFET 120 is essentially the same as the p-type dopant distribution in the doped monosilicon of IGFET 108 subject to absence of atoms of the p-type threshold-adjust dopant in the doped monosilicon of IGFET 120. All of the comments made about the p-type dopant distribution in the doped monosilicon of IGFET 108, except for the comments relating to threshold-adjust body-material portion 458, apply to the doped monosilicon of IGFET 120.

Main S/D portions 640M and 642M of IGFET 120 are normally defined by ion implantation of the n-type main S/D dopant at the same time as main S/D portions 440M and 442M of IGFET 108. Inasmuch as S/D extensions 640E and 642E of IGFET 112 are normally defined by ion implantation of the n-type shallow S/D-extension dopant at the same time as S/D extensions 440E and 442E of IGFET 108, the n-type dopant distribution in S/D zones 640 and 642 of IGFET 120 is essentially the same as the n-type dopant distribution in S/D zones 440 and 442 of IGFET 108.

More particularly, the n-type dopant distribution along the upper surface of S/D zones 640 and 642 of IGFET 120 is essentially the same as the n-type dopant distribution shown in FIG. 30 for the upper surface of S/D zones 440 and 442 of IGFET 108. The n-type vertical dopant distribution along a suitable imaginary vertical line through S/D zone 640 or 642 of IGFET 120 is essentially the same as the n-type vertical dopant distribution shown in FIG. 31 along vertical line 474 or 476 through S/D zone 440 or 442 of IGFET 108. The n-type vertical dopant distribution along an imaginary vertical line through the longitudinal center of channel zone 644 of IGFET 120 is essentially the same as the vertical distribution shown in FIG. 32 along vertical line 478 through channel zone 444 of IGFET. The comments made about the n-type upper-surface and vertical dopant distributions of IGFET 108 apply to the n-type upper-surface and vertical dopant distributions of IGFET 120.

Low-voltage p-channel IGFET 122 of nominal $V_T$ is configured basically the same as n-channel IGFET 120 with the conductivity types reversed. With reference again to FIG. 11.6, p-channel IGFET 122 has a pair of largely identical p-type S/D zones 680 and 682 situated in active semiconductor island 162 along the upper semiconductor surface. S/D zones 680 and 682 are separated by a channel zone 684 of n-type filled main well region 202 which constitutes the body material for IGFET 122. N-type body-material filled well 212 forms (a) a first pn junction 686 with p-type S/D zone 680 and (b) a second pn junction 688 with p-type S/D zone 682.

Subject to the body material for p-channel IGFET 122 being formed with a filled main well rather than the combination of a filled main well and underlying material of the semiconductor body as occurs with n-channel IGFET 120, p-channel IGFET 122 is configured the same as n-channel IGFET 120 with the conductivity types reversed. Hence, p-channel IGFET 122 contains largely identical moderately doped n-type halo pocket portions 690 and 692, a moderately doped n-type main body-material portion 694, a moderately doped n-type further body-material portion 696, a gate dielectric layer 700 at the $t_{GdL}$ low thickness value, a gate electrode 702, dielectric sidewall spacers 704 and 706, and metal silicide layers 708, 710, and 712 configured respectively the same as regions 650, 652, 654, 656, 660, 662, 664, 666, 668, 670, and 672 of n-channel IGFET 120.

N main body-material portion 694 overlies p− substrate region 136 and forms pn junction 236 with it. Also, each p-type S/D zone 680 or 682 consists of a very heavily doped main portion 680M or 682M and a more lightly doped, but still heavily doped, lateral extension 680E or 682E. All of the comments made about the doping of p-type filled main well 200 of n-channel IGFET 120 apply to n-type filled main well 212 of p-channel IGFET 122 with the conductivity types reversed and with regions 200, 640, 640M, 640E, 642, 642M, 642E, 644, 650, 652, 654, and 656 of n-channel IGFET 120 respectively replaced with regions 202, 680, 680M, 680E, 682, 682M, 682E, 684, 690, 692, 694, and 696 of p-channel IGFET 122.

Subject to minor perturbations due to the presence of the p-type background dopant, the longitudinal and vertical dopant distributions in p-channel IGFET 122 are essentially the same as the longitudinal and vertical dopant distributions in n-channel IGFET 120 with the conductivity types reversed. The dopant distributions in IGFET 122 are functionally the same as the dopant distributions in IGFET 120. IGFET 122 functions substantially the same as IGFET 120 with the voltage polarities reversed.

Threshold voltage $V_T$ of symmetric low-voltage nominal-$V_T$ n-channel IGFET 120 is normally 0.25 V to 0.45 V, typically 0.35 V. Threshold voltage $V_T$ of symmetric low-voltage nominal-$V_T$ p-channel IGFET 122 is normally −0.2 V to −0.4 V, typically −0.3 V. These $V_T$ ranges and typical values are for short-channel implementations of IGFETs 120 and 122 at a drawn channel length $L_{DR}$ of 0.13 μm and a gate dielectric thickness o 2 nm. Symmetric IGFETs 120 and 122 are particularly suitable for low-voltage digital applications, e.g., an operational range of 1.2 V.

J. Symmetric High-Voltage Low-Threshold-Voltage IGFETs

Symmetric high-voltage low-$V_T$ empty-well complementary IGFETs 124 and 126 are described with reference only to FIG. 11.7. As explained further below, IGFETs 124 and 126 are configured respectively substantially the same as low-voltage low-$V_T$ IGFETs 112 and 114 except that IGFETs 124 and 126 are of longer channel length and greater gate dielectric thickness so as to be suitable for high-voltage operation.

N-channel IGFET 124 has a pair of largely identical n-type S/D zones 720 and 722 situated in active semiconductor island 164 along the upper, semiconductor surface. S/D zones 720 and 722 are separated by a channel zone 724 of p-type empty main well region 204 which, in combination with p− substrate region 136, constitutes the body material for IGFET 124. P-type body-material empty well 204 forms (a) a first pn junction 726 with n-type S/D zone 720 and (b) a second pn junction 728 with n-type S/D zone 722.

Each n-type S/D zone 720 or 722 consists of a very heavily doped main portion 720M or 722M and a more lightly doped, but still heavily doped, lateral extension 720E or 722E. Largely identical n+ lateral S/D extensions 720E and 722E extend deeper than largely identical n++ main S/D portions 720M and 722M. Channel zone 724 is terminated along the upper semiconductor surface by S/D extensions 720E and 722E.

S/D extensions 720E and 722E are normally defined by ion implantation of the n-type deep S/D-extension dopant at the same time as drain extension 242E of asymmetric n-channel IGFET 100 and thus normally also at the same time as S/D extensions 520E and 522E of symmetric low-voltage low-$V_T$ n-channel IGFET 112 and S/D extensions 580 and 582 of symmetric high-voltage nominal-$V_T$ n-channel IGFET 116. As indicated below, the n-type shallow S/D-extension implantation used to define S/D extensions 440E and 442E of symmetric low-voltage low-leakage n-channel IGFET 108 and also normally S/D extensions 640E and 642E of symmetric low-voltage nominal-$V_T$ n-channel IGFET 120 is performed more shallowly than the n-type deep S/D-extension implantation. Consequently, S/D extensions 720E and 722E of symmetric empty-well IGFET 124 extend deeper than both S/D extensions 440E and 442E of symmetric filled-well IGFET 108 and S/D extensions 640E and 642E of symmetric filled-well IGFET 120.

The p-type dopant in p-type body-material empty main well 204 consists of the p-type empty main well dopant and the substantially constant p-type background dopant of p− substrate region 136. Because the p-type empty main well dopant in empty well 204 reaches a deep subsurface concentration maximum at average depth $y_{PWPK}$, the presence of the p-type empty main well dopant in well 204 causes the concentration of the total p-type dopant in well 204 to reach a deep local subsurface concentration maximum substantially at the location of the deep subsurface concentration maximum in well 204. In moving from the location of the deep p-type empty-well concentration maximum in empty well 204 toward the upper semiconductor surface along an imaginary vertical line through channel zone 724, the concentration of the p-type dopant in well 204 drops gradually from a moderate doping, indicated by symbol "p", to a light doping, indicated by symbol "p−". Dotted line 730 in FIG. 11.7 roughly represents the location below which the p-type dopant concentration in empty well 204 is at the moderate p doping and above which the p-type dopant concentration in well 204 is at the light p− doping.

As with IGFET 112, IGFET 124 does not have halo pocket portions. Channel zone 724 (not specifically demarcated in FIG. 11.7), which consists of all the p-type monosilicon between S/D zones 720 and 722, is thereby formed solely by a surface-adjoining segment of the p− upper part of well 204. IGFET 124 further includes a gate dielectric layer 736 at the $t_{GdH}$ high thickness value, a gate electrode 738, dielectric sidewall spacers 740 and 742, and metal silicide layers 744, 746, and 748 configured respectively the same as regions 536, 538, 540, 542, 544, 546, and 548 of n-channel IGFET 112.

Empty well region 204 of IGFET 124 is normally defined by ion implantation of the p-type empty main well dopant at the same time as empty well region 192 of symmetric low-voltage low-$V_T$ n-channel IGFET 112 and thus normally at the same time as empty well region 180 of asymmetric n-channel IGFET 100. Main S/D portions 720M and 722M of IGFET 124 are normally defined by ion implantation of the n-type main S/D dopant at the same time as main S/D portions 520M and 522M of IGFET 112 and thus normally at the same time as main drain portion 242M (and main source portion 240M) of IGFET 100. Because S/D extensions 720E and 722E of IGFET 124 are normally defined by ion implantation of the n-type deep S/D-extension dopant at the same time as S/D extensions 520E and 522E of IGFET 112 and thus normally at the same time as drain extension 242E of IGFET 100, the dopant distribution in each S/D zone 720 or 722 and the adjacent part of well 204 up to the longitudinal center of IGFET 124 is essentially the same as the dopant distribution in drain 242 of IGFET 100 and the adjacent part of well 180 up to a lateral distance approximately equal to the lateral distance from S/D zone 720 or 722 to the longitudinal center of IGFET 124.

In particular, the dopant distribution along the upper surface of each S/D zone 720 or 722 and the adjacent part of the upper surface of channel zone 724 up to the longitudinal center of IGFET 124 is essentially the same as the dopant distribution shown in FIG. 13 for the upper surface of drain 242 of IGFET 100 and the upper surface of the adjacent part of well 180 up to a lateral distance approximately equal to the lateral distance from S/D zone 720 or 722 to the longitudinal center of IGFET 124. The vertical dopant distributions along suitable imaginary vertical lines through each S/D extension 720E or 722E and each main S/D portion 720M or 722M of IGFET 124 are essentially the same as the vertical dopant distributions shown in FIGS. 17 and 18 along vertical lines 278E and 278M through drain extension 242E and main drain portion 242M of IGFET 100.

The vertical dopant distribution along an imaginary vertical line through the longitudinal center of channel zone 724 of IGFET 124 is essentially the same as the vertical distribution shown in FIG. 16 along vertical line 276 through channel zone 244 of IGFET 100 even though the lateral distance from drain 240 of IGFET to line 276 may exceed the lateral distance lateral from S/D zone 720 or 722 to the longitudinal center of IGFET 124. Subject to the preceding limitations, the comments made about the upper-surface and vertical dopant distributions of IGFET 100, specifically along the upper surface of drain 242 into channel zone 244 along its upper surface and along vertical lines 276, 278E, and 278M, apply to the dopant distributions along the upper surfaces of S/D zones 720 and 722 and channel zone 724 and along the indicated vertical lines through each S/D extension 720E or 722E, each main S/D portion 720M or 722M, and channel zone 724 of IGFET 124.

High-voltage low-$V_T$ p-channel IGFET 126 is configured basically the same as n-channel IGFET 124 with the conductivity types reversed. Referring again to FIG. 11.7, p-channel IGFET 126 has a pair of largely identical p-type S/D zones 750 and 752 situated in active semiconductor island 166 along the upper semiconductor surface. S/D zones 750 and 752 are separated by a channel zone 754 of p-type empty main well region 206 which constitutes the body material for IGFET 126. N-type body-material empty well 206 forms (a) a first pn junction 756 with p-type S/D zone 750 and (b) a second pn junction 758 with p-type S/D zone 752.

Each n-type S/D zone 750 or 752 consists of a very heavily doped main portion 750M or 752M and a more lightly doped, but still heavily doped, lateral extension 750E or 752E. Largely identical n+ S/D extensions 750E and 752E extend deeper than largely identical n++ main S/D portions 750M and 752M. Channel zone 754 is terminated along the upper semiconductor surface by S/D extensions 750E and 752E.

S/D extensions 750E and 752E are normally defined by ion implantation of the p-type deep S/D-extension dopant at the same time as drain extension 282E of asymmetric p-channel IGFET 102 and thus normally also at the same time as S/D extensions 550E and 552E of symmetric low-voltage low-$V_T$ p-channel IGFET 114 and S/D extensions 610 and 612 of symmetric high-voltage nominal-$V_T$ p-channel IGFET 118. The p-type shallow S/D-extension implantation used to define S/D extensions 480E and 482E of symmetric low-voltage low-leakage p-channel IGFET 110 and also normally S/D extensions 680E and 682E of symmetric low-voltage nominal-$V_T$ p-channel IGFET 122 is, as indicated below, performed more shallowly than the p-type deep S/D-extension implantation. Accordingly, S/D extensions 750E and 752E of symmetric empty-well IGFET 126 extend deeper than both S/D extensions 480E and 482E of symmetric filled-well IGFET 110 and S/D extensions 680E and 682E of symmetric filled-well IGFET 122.

The n-type dopant in n-type body-material empty main well 206 consists solely of the p-type empty main well dopant. Accordingly, the n-type dopant in empty well 206 reaches a deep subsurface concentration maximum at average depth $y_{NWPK}$. In moving from the location of the n-type empty-well concentration maximum in empty well 206 toward the upper semiconductor surface along an imaginary vertical line through channel zone 754, the concentration of the n-type dopant in well 206 drops gradually from a moderate doping, indicated by symbol "n", to a light doping, indicated by symbol "n–". Dotted line 760 in FIG. 11.7 roughly represents the location below which the n-type dopant concentration in empty well 206 is at the moderate n doping and above which the n-type dopant concentration in well 206 is at the light n– doping.

Subject to the preceding comments, p-channel IGFET 126 is configured the same as n-channel IGFET 124 with the conductivity types reversed. Hence, p-channel IGFET 126 further includes a gate dielectric layer 766 at the $t_{GdH}$ high thickness value, a gate electrode 768, dielectric sidewall spacers 770 and 772, and metal silicide layers 774, 776, and 778 configured respectively the same as regions 736, 738, 740, 742, 744, 746, and 748 of n-channel IGFET 124. As with n-channel IGFET 124, p-channel IGFET 126 does not have halo pocket portions. Channel zone 754 (not specifically demarcated in FIG. 11.7), which consists of all the n-type monosilicon between S/D zones 750 and 752, is formed solely by a surface-adjoining segment of the n– upper part of well 206.

Subject to minor perturbations due to the presence of the p-type background dopant, the longitudinal and vertical dopant distributions in p-channel IGFET 126 are essentially the same as the longitudinal and vertical dopant distributions in n-channel IGFET 124 with the conductivity types reversed. The dopant distributions in IGFET 126 are functionally the same as the dopant distributions in IGFET 114. IGFET 126 functions substantially the same as IGFET 124 with the voltage polarities reversed.

Threshold voltage $V_T$ of symmetric high-voltage low-$V_T$ n-channel IGFET 124 is normally –0.1 V to 0.5 V, typically –0.025 V, at a drawn channel length $L_{DR}$ in the vicinity of 0.5 µm and a gate dielectric thickness of 6-6.5 nm. Threshold voltage $V_T$ of symmetric high-voltage low-$V_T$ p-channel IGFET 126 is normally 0.05 V to 0.25 V, typically 0.15 V, likewise at a drawn channel length $L_{DR}$ in the vicinity of 0.5 µm and a gate dielectric thickness of 6-6.5 nm.

The implementation of symmetric high-voltage IGFETs 124 and 126 with respective empty well regions 204 and 206 enables IGFETs 124 and 126 to achieve threshold voltage $V_T$ of very low magnitude in basically the same way as the implementation of symmetric low-voltage IGFETs 112 and 114 with respective empty well regions 192 and 194 enables IGFETs 112 and 114 to have threshold voltages $V_T$ of very low magnitude. That is, the reduced amount of p-type semiconductor dopant near the upper surface of empty main well region 204 causes the value of threshold voltage $V_T$ of n-channel IGFET 112 to be reduced. Similarly, the reduced amount of n-type semiconductor dopant near the upper surface of empty main well region 206 causes the magnitude of threshold voltage $V_T$ of p-channel IGFET 126 to be reduced. Symmetric IGFETs 124 and 126 are particularly suitable for high-voltage analog and digital applications, e.g., an operational range of 1.2 V, which require threshold voltages $V_T$ of lower magnitude than high-voltage IGFETs 116 and 118 and which can accommodate increased channel length L.

K. Symmetric Native Low-Voltage N-Channel IGFETs

Symmetric native low-voltage IGFETs 128 and 130, both n channel, are described with reference only to FIG. 11.8. IGFET 128 of nominal $V_T$ magnitude has a pair of largely identical n-type S/D zones 780 and 782 situated in active semiconductor island 168 along the upper semiconductor surface. S/D zones 780 and 782 are separated by a channel zone 784 of p-type body material formed primarily with p– substrate region 136. The p-type body material for IGFET 128 forms (a) a first pn junction 786 with n-type S/D zone 780 and (b) a second pn junction 788 with n-type S/D zone 782.

Each n-type S/D zone 780 or 782 consists of a very heavily doped main portion 780M or 782M and a more lightly doped, but still heavily doped, lateral extension 780E or 782E. Largely identical n++ main S/D portions 780M and 782M extend deeper than largely identical n+ source extensions 780E and 782E. Channel zone 784 is terminated along the upper semiconductor surface by S/D extensions 780E and 782E.

In addition to p– substrate region 136, the body material for IGFET 128 includes a pair of largely identical moderately doped laterally separated halo pocket portions 790 and 792 that respectively extend along S/D zones 780 and 782 up to the upper semiconductor surface and terminate at respective locations between S/D zones 780 and 782. FIG. 11.8 illustrates the situation in which S/D zones 780 and 782 extend deeper than halo pockets 790 and 792. Alternatively, halo pockets 790 and 792 can extend deeper than S/D zones 780 and 782. Halo pockets 790 and 792 then respectively extend laterally under S/D zones 780 and 782.

Channel zone 784 (not specifically demarcated in FIG. 11.8) consists of all the p-type monosilicon between S/D zones 780 and 782. In particular, channel zone 784 is formed by a surface-adjoining segment of p– substrate region 136 and (a) all of p halo pocket portions 790 and 792 if S/D zones 780 and 782 extend deeper than halo pockets 790 and 792 as illustrated in the example of FIG. 11.8 or (b) surface-adjoining segments of halo pockets 790 and 792 if they extend deeper than S/D zones 780 and 782. Since substrate region 136 is lightly doped, halo pockets 790 and 792 are more heavily doped p-type than the directly adjacent material of the body material for IGFET 128.

A gate dielectric layer 796 at the $t_{GdL}$ low thickness value is situated on the upper semiconductor surface and extends over channel zone 784. A gate electrode 798 is situated on gate dielectric layer 796 above channel zone 784. Gate electrode 798 extends over part of each n+ S/D extension 780E or 782E but normally not over any part of either n++ main S/D portion 780M or 782M. Dielectric sidewall spacers 800 and 802 are situated respectively along the opposite transverse sidewalls of gate electrode 798. Metal silicide layers 804, 806, and 808 are respectively situated along the tops of gate electrode 798 and main S/D portions 780M and 782M.

The n-type dopant distribution in the doped monosilicon of IGFET 128 is described below in connection with the largely identical n-type dopant distribution in the doped monosilicon of symmetric native n-channel IGFET 132.

With continued reference to FIG. 11.8, symmetric native low-voltage n-channel IGFET 130 of low $V_T$ magnitude has a pair of largely identical n-type S/D zones 810 and 812 situated in active semiconductor island 170 along the upper semiconductor surface. S/D zones 810 and 812 are separated by a channel zone 814 of p− substrate region 136 which constitutes the p-type body material for IGFET 130. P− body-material substrate region 136 forms (a) a first pn junction 816 with n-type S/D zone 810 and (b) a second pn junction 818 with n-type S/D zone 812.

Each n-type S/D zone 810 or 812 consists of a very heavily doped main portion 810M or 812M and a more lightly doped, but still heavily doped, lateral extension 810E or 812E. Largely identical n+ S/D extensions 810E and 812E extend deeper than largely identical n++ main S/D portions 810M and 812M. Channel zone 814 is terminated along the upper semiconductor surface by S/D extensions 810E and 812E.

IGFET 130 does not have halo pocket portions which are situated in the IGFET's p-type body material, which extend respectively along S/D zones 810 and 812, and which are more heavily doped p-type than adjacent material of the IGFET's p-type body material. Channel zone 814 (not specifically demarcated in FIG. 11.8), which consists of all the p-type monosilicon between S/D zones 810 and 812, is thus formed solely by a surface-adjoining segment of p− substrate region 136.

A gate dielectric layer 826 at the $t_{GdL}$ low thickness value is situated on the upper semiconductor surface and extends over channel zone 814. A gate electrode 828 is situated on gate dielectric layer 826 above channel zone 814. Gate electrode 828 extends over part of each n+ S/D extension 810E or 812E but normally not over any part of either n++ main S/D portion 810M or 812M. Dielectric sidewall spacers 830 and 832 are situated respectively along the opposite transverse sidewalls of gate electrode 828. Metal silicide layers 834, 836, and 838 are respectively situated along the tops of gate electrode 828 and main S/D portions 810M and 812M.

The n-type dopant distribution in the doped monosilicon of IGFET 130 is described below in connection with the largely identical n-type dopant distribution in the doped monosilicon of symmetric native n-channel IGFET 134.

Threshold voltage $V_T$ of symmetric native low-voltage nominal-$V_T$ n-channel IGFET 128 is normally 0.2 V to 0.45 V, typically 0.3 V to 0.35 V, at a drawn channel length $L_{DR}$ of 0.3 μm and a gate dielectric thickness of 2 nm. Threshold voltage $V_T$ of symmetric native low-voltage low-$V_T$ n-channel IGFET 130 is normally −0.15 V to 0.1 V, typically −0.03 V at a drawn channel length $L_{DR}$ of 1 μm and a gate dielectric thickness of 2 nm. Symmetric native IGFETs 128 and 130 are particularly suitable for low-voltage analog and digital applications, e.g., an operational range of 1.2 V.

L. Symmetric Native High-Voltage N-Channel IGFETs

Symmetric native high-voltage IGFETs 132 and 134, both n channel, are described with reference only to FIG. 11.9. IGFET 132 of nominal $V_T$ magnitude has a pair of largely identical n-type S/D zones 840 and 842 situated in active semiconductor island 172 along the upper semiconductor surface. S/D zones 840 and 842 are separated by a channel zone 844 of p-type body material formed primarily with p− substrate region 136. The p-type body material for IGFET 132 forms (a) a first pn junction 846 with n-type S/D zone 840 and (b) a second pn junction 848 with n-type S/D zone 842. Each n-type S/D zone 840 or 842 consists of a very heavily doped main portion 840M or 842M and a more lightly doped, but still heavily doped, lateral extension 840E or 842E.

IGFET 132 further includes a pair of largely identical moderately doped laterally separated halo pocket portions 850 and 852, a gate dielectric layer 856 at the $t_{GdH}$ high thickness value, a gate electrode 858, dielectric sidewall spacers 860 and 862, and metal silicide layers 864, 866, and 868. As can be seen by comparing FIGS. 11.8 and 11.9, the only structural difference between native n-channel IGFETs 132 and 128 is that IGFET 132 is of greater gate dielectric thickness than IGFET 128 so that IGFET 132 can operate across a greater voltage range than IGFET 128. Accordingly, regions 840, 842, 844, 850, 852, 856, 858, 860, 862, 864, 866, and 868 of IGFET 132 are configured respectively the same as regions 780, 782, 784, 790, 792, 796, 798, 800, 802, 804, 806, and 808 of IGFET 128.

Main S/D portions 780M and 782M of IGFET 128 and main S/D portions 840M and 842M of IGFET 132 are normally defined by ion implantation of the n-type main S/D dopant at the same time as main S/D portions 440M and 442M of n-channel IGFET 108. S/D extensions 780E and 782E of IGFET 128 and S/D extensions 840E and 842E of IGFET 132 are normally defined by ion implantation of the n-type shallow S/D-extension dopant at the same time as S/D extensions 440E and 442E of IGFET 108. Accordingly, the n-type dopant distribution in S/D zones 780 and 782 of IGFET 128 and in S/D zones 840 and 842 of IGFET 132 is essentially the same as the n-type dopant distribution in S/D zones 440 and 442 of IGFET 108. The comments made about the n-type upper-surface and vertical dopant distributions of IGFET 108 apply to the n-type upper-surface and vertical dopant distributions of IGFETs 128 and 132.

With continued reference to FIG. 11.9, symmetric native high-voltage n-channel IGFET 134 of low $V_T$ magnitude has a pair of largely identical n-type S/D zones 870 and 872 situated in active semiconductor island 174 along the upper semiconductor surface. S/D zones 870 and 872 are separated by a channel zone 874 of p− substrate region 136 which constitutes the p-type body material for IGFET 134. P− body-material substrate region 136 forms (a) a first pn junction 876 with n-type S/D zone 870 and (b) a second pn junction 878 with n-type S/D zone 872. Each n-type S/D zone 870 or 872 consists of a very heavily doped main portion 870M or 872M and a more lightly doped, but still heavily doped, lateral extension 870E or 872E.

IGFET 134 further includes a gate dielectric layer 886 at the $t_{GdH}$ high thickness value, a gate electrode 888, dielectric sidewall spacers 890 and 892, and metal silicide layers 894, 896, and 898. A comparison of FIGS. 11.8 and 11.9 shows that the only structural difference between native n-channel IGFETs 134 and 130 is that IGFET 134 is of greater gate dielectric thickness than IGFET 130 so that IGFET 134 can operate across a greater voltage range than IGFET 130. Hence, regions 870, 872, 874, 886, 888, 890, 892, 894, 896, and 898 of IGFET 134 are configured respectively the same as regions 810, 812, 814, 826, 828, 830, 832, 834, 836, and 838 of IGFET 130.

Main S/D portions 810M and 812M of IGFET 130 and main S/D portions 870M and 872M of IGFET 134 are normally defined by ion implantation of the n-type main S/D dopant at the same time as main S/D portions 520M and 522M of IGFET 112 and thus normally at the same time as main drain portion 242M (and main source portion 240M) of IGFET 100. S/D extensions 810E and 812E of IGFET 130 and S/D extensions 870E and 872E of IGFET 134 are normally defined by ion implantation of the n-type deep S/D-extension dopant at the same time as S/D extensions 520E and 522E of IGFET 112 and thus normally at the same time as drain extension 242E of IGFET 100. Consequently, the n-type dopant distribution in each S/D zone 810 or 812 of IGFET 130 and in each S/D zone 870 or 872 of IGFET 134 is essentially the same as the dopant distribution in drain 242 of IGFET 100. The comments made about the n-type upper-surface and vertical dopant distributions of IGFET 100 apply to the n-type upper-surface and vertical dopant distributions of IGFETs 130 and 134.

Threshold voltage $V_T$ of symmetric native high-voltage nominal-$V_T$ n-channel IGFET 132 is normally 0.5 V to 0.7 V, typically 0.6 V, at a drawn channel length $L_{DR}$ in the vicinity of 0.3 μm and a gate dielectric thickness of 6-6.5 nm. Threshold voltage $V_T$ of symmetric native high-voltage low-$V_T$ n-channel IGFET 134 is normally −0.3 V to −0.05 V, typically −0.2 V to 0.15 V, at a drawn channel length $L_{DR}$ in the vicinity of 1.0 μm and a gate dielectric thickness of 6-6.5 nm. Symmetric native IGFETs 132 and 134 are particularly suitable for high-voltage analog and digital applications, e.g., an operational range of 3.0 V.

M. Information Generally Applicable to All of Present IGFETs

The gate electrodes of the illustrated n-channel IGFETs preferably all consist of polysilicon doped very heavily n-type in the example of FIG. 11. Alternatively, the gate electrodes of the illustrated n-channel IGFETs can be formed with other electrically conductive material such as refractory metal, metal silicide, or polysilicon doped sufficiently p-type as to be electrically conductive. In the example of FIG. 11, the gate electrodes of the illustrated p-channel IGFETs preferably all consist of polysilicon doped very heavily p-type. The gate electrodes of the illustrated p-channel IGFETs can alternatively be formed with other electrically conductive material such as refractory metal, metal silicide, or polysilicon doped sufficiently n-type as to be electrically conductive. Each such refractory metal or metal silicide is chosen to have an appropriate work function for achieving suitable values of threshold voltage $V_T$.

The combination of each gate electrode 262, 302, 346, 386, 462, 502, 538, 568, 598, 628, 662, 702, 738, 768, 798, 828, 858, or 888 and overlying metal silicide layer 268, 308, 352, 392, 468, 508, 544, 574, 604, 634, 668, 708, 744, 774, 804, 834, 864, or 894 can be viewed as a composite gate electrode. The metal silicide layers typically consist of cobalt silicide. Nickel silicide or platinum silicide can alternatively be used for the metal silicide layers.

Each of gate sidewall spacers 264, 266, 304, 306, 348, 350, 388, 390, 464, 466, 504, 506, 540, 542, 570, 572, 600, 602, 630, 632, 664, 666, 704, 706, 740, 742, 770, 772, 800, 802, 830, 832, 860, 862, 890, and 892 of the illustrated IGFETs is, for convenience, shown in FIG. 11 as cross-sectionally shaped generally like a right triangle with a curved hypotenuse as viewed in the direction of the IGFET's width. Such a spacer shape is referred to here as a curved triangular shape. The gate sidewall spacers may have other shapes such as "L" shapes. The shapes of the gate sidewall spacers may be modified significantly during IGFET fabrication.

To improve the IGFET characteristics, the gate sidewall spacers are preferably processed as described in U.S. patent application Ser. No. 12/382,977, cited above. In particular, the gate sidewall spacers are initially created to be of curved triangular shape. Prior to formation of the metal silicide layers, the gate sidewall spacers are modified to be of L shape in order to facilitate the formation of the metal silicide layers. The gate sidewall spacers are then L-shaped in the semiconductor structure of FIG. 11.

A depletion region (not shown) extends along the upper surface of the channel zone of each illustrated IGFET during IGFET operation. Each surface depletion region has a maximum thickness $t_{dmax}$ given as:

$$t_{dmax} = \sqrt{\frac{2K_S\varepsilon_0\phi_T}{qN_C}} \quad (3)$$

where $K_S$ is the relative permittivity of the semiconductor material (silicon here), $\varepsilon_0$ is the permittivity of free space (vacuum), $\phi_T$ is the inversion potential, q is the electronic charge, and $N_C$ is the average net dopant concentration in the IGFET's channel zone. Inversion potential $\phi_T$ is twice the Fermi potential $\phi_F$ determined from:

$$\phi_F = \left(\frac{kT}{q}\right)\ln\left(\frac{N_C}{n_i}\right) \quad (4)$$

where k is Boltzmann's constant, T is the absolute temperature, and $n_i$ is the intrinsic carrier concentration.

Using Eqs. 3 and 4, maximum thickness $t_{dmax}$ of the surface depletion region of each illustrated high-voltage IGFET is normally less than 0.05 μm, typically in the vicinity of 0.03 μm. Similarly, maximum thickness $t_{dmax}$ of the surface depletion region of each extended-drain IGFET 104 or 106 is normally less than 0.06 μm, typically in the vicinity of 0.04 μm. Maximum thickness $t_{dmax}$ of the surface depletion region of each illustrated low-voltage IGFET is normally less than 0.04 μm, typically in the vicinity of 0.02 μm.

N. Fabrication of Complementary-IGFET Structure Suitable for Mixed-Signal Applications N1. General Fabrication Information FIGS. 33a-33c, 33d.1-33y.1, 33d.2-33y.2, 33d.3-33y.3, 33d.4-33y.4, and 33d.5-33y.5 (collectively "FIG. 33") illustrate a semiconductor process in accordance with the invention for manufacturing a CIGFET semiconductor structure containing all of the illustrated IGFETs, i.e., asymmetric complementary IGFETs 100 and 102, extended-drain complementary IGFETs 104 and 106, symmetric non-native n-channel IGFETs 108, 112, 116, 120, and 124, respectively corresponding symmetric non-native p-channel IGFETs 110, 114, 118, 122, and 126, and symmetric native n-channel IGFETs 128, 130, 132, and 134. In order to facilitate pictorial illustration of the present fabrication process, manufacturing steps for long-channel versions of the illustrated IGFETs are depicted in FIG. 33.

Figure 33A:
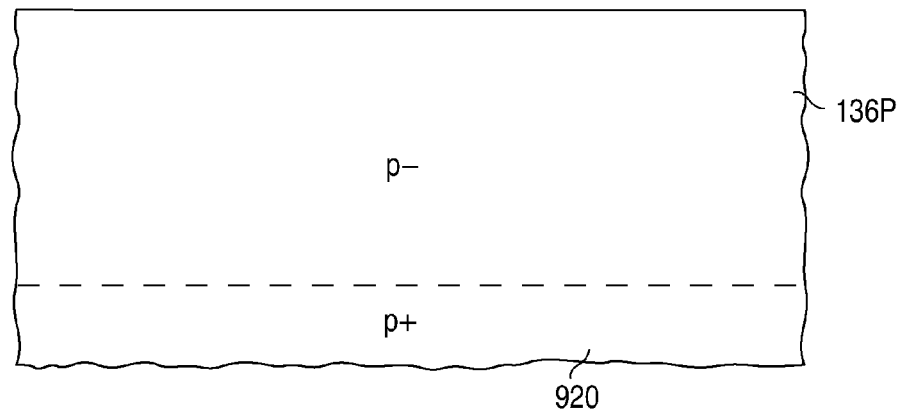
Figure 33B:
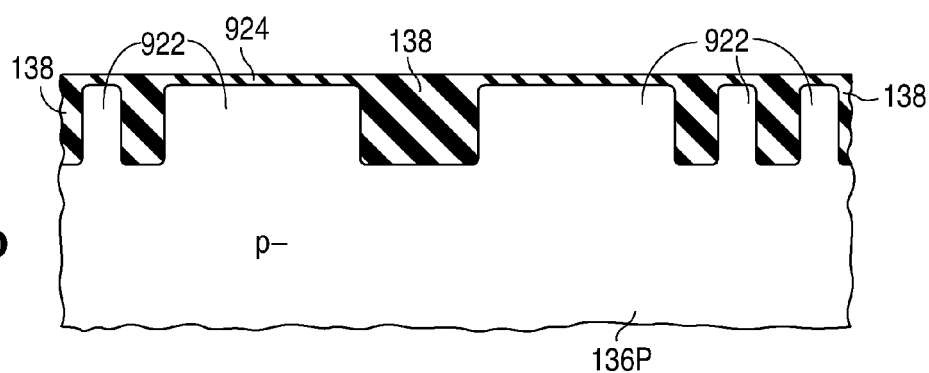
Figure 33C:
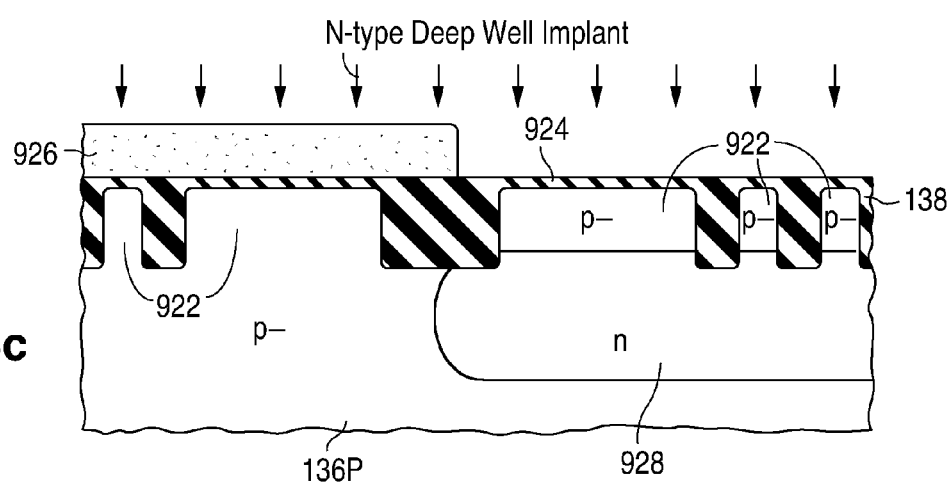

The steps involved in the fabrication of the illustrated IGFETs up through the formation of deep n wells, including deep n wells 210 and 212, are generally shown in FIGS. 33a-33c. FIGS. 33d.1-33y.1 illustrate later steps specifically leading to complementary IGFETs 100 and 102 as depicted in FIG. 11.1. FIGS. 33d.2-33y.2 illustrate later steps specifically leading to complementary IGFETs 104 and 106 as shown in FIG. 11.2. FIGS. 33d.3-33y.3 illustrate later steps specifically leading to complementary IGFETs 108 and 110 as depicted in FIG. 11.3. FIGS. 33d.4-33y.4 illustrate later steps specifically leading to complementary IGFETs 112 and 114 as depicted in FIG. 11.4. FIGS. 33d.5-33y.5 illustrate later steps specifically leading to complementary IGFETs 116 and 118 as depicted in FIG. 11.5.

FIG. 33 does not illustrate leading later steps specifically leading to any of complementary IGFETs 120 and 122, complementary IGFETs 124 and 126, or native n-channel IGFETs 128, 130, 132, and 134 as variously shown in FIGS. 11.6-11.9. However, a description of the later steps specifically leading to IGFETs 120, 122, 124, 126, 128, 130, 132, and 134 is incorporated into the description given below for manufacturing the CIGFET structure of FIG. 11.

The semiconductor fabrication process of FIG. 33 is, more specifically, a semiconductor fabrication platform that provides a capability for manufacturing many types of semiconductor devices in addition to the illustrated IGFETs. For instance, a short-channel version of each illustrated symmetric long-channel IGFET may be manufactured simultaneously according to the fabrication steps employed in manufacturing the illustrated symmetric long-channel IGFET. The short-channel versions of IGFETs 108, 110, 112, 114, 116, and 118 are of lesser channel length than long-channel IGFETs 108, 110, 112, 114, 116, and 118 but are otherwise of generally the same intermediate IGFET appearances as shown in FIG. 33. The simultaneous fabrication of the illustrated symmetric long-channel IGFETs and their short-channel versions is implemented with masking plates (reticles) having patterns for both the long-channel and short-channel IGFETs.

Resistors, capacitors, and inductors can be readily provided with the semiconductor fabrication platform of FIG. 33. The resistors can be both of the monosilicon type and the polysilicon type. Bipolar transistors, both npn and pnp, can be provided along with diodes without increasing the number of steps needed to fabricate the illustrated IGFETs. In addition, bipolar transistors can be provided by using the few additional steps described in U.S. patent application Ser. No. 12/382,966, cited above.

The semiconductor fabrication platform of FIG. 33 includes a capacity for selectively providing deep n wells of which deep n wells 210 and 212 are examples. The presence or absence of a deep n well at a particular location in the present CIGFET structure depends on whether a masking plate used in defining the deep n wells does, or does not, have a pattern for a deep n well at that location.

Taking note that asymmetric IGFETs 100 and 102 utilize deep n well 210, a version of each asymmetric IGFET 100 or 102 lacking a deep n well can be simultaneously created according to the fabrication steps employed to create IGFET 100 or 102 having deep n well 210 by configuring the deep n well masking plate to avoid defining a deep n well at the location for the version of IGFET 100 or 102 lacking the deep n well. In a complementary manner, the fabrication steps used to create each illustrated non-native symmetric IGFET lacking a deep n well can be simultaneously employed to provide it in a version having a deep n well by configuring the deep n well masking plate to define a deep n well at the location for that version of the illustrated symmetric IGFET. This also applies to the short-channel versions of the illustrated symmetric IGFETs.

The fabrication of any one of the illustrated IGFETs including any of their variations described above can be deleted from any particular implementation of the semiconductor fabrication platform of FIG. 33. In that event, any step used in fabricating such a deleted IGFET can be deleted from that implementation of the present semiconductor fabrication platform to the extent that the step is not used in fabricating any other IGFET being manufactured in the platform implementation.

Ions of a semiconductor dopant implanted into the semiconductor body impinge on the upper semiconductor surface generally parallel to an impingement axis. For generally non-perpendicular ion impingement on the upper semiconductor surface, the impingement axis is at a tilt angle $\alpha$ to the vertical, i.e., to an imaginary vertical line extending generally perpendicular to the upper (or lower) semiconductor surface, more specifically to an imaginary vertical line extending perpendicular to a plane extending generally parallel to the upper (or lower) semiconductor surface. Inasmuch as the gate dielectric layers of the IGFETs extend laterally generally parallel to the upper semiconductor surface, tilt angle $\alpha$ can alternatively be described as being measured from an imaginary vertical line extending generally perpendicular to the gate dielectric layer of an IGFET.

The range of an ion-implanted semiconductor dopant is generally defined as the distance that an ion of the dopant-containing species travels through the implanted material in moving from the point on the implantation surface at which the ion enters the implanted material to the location of the maximum concentration of the dopant in the implanted material. When a semiconductor dopant is ion implanted at a non-zero value of tilt angle $\alpha$, the implantation range exceeds the depth from the implantation surface to the location of the maximum concentration of the dopant in the implanted material. The range of an ion-implanted semiconductor dopant is alternatively defined as the average distance that ions of the dopant-containing species travel through the implanted material before stopping. The two definitions for the implantation range typically yield largely the same numerical result.

Aside from the halo pocket ion implantation steps and some of the S/D-extension ion implantation steps, all of the ion implantation steps in the semiconductor fabrication platform of FIG. 33 are performed roughly perpendicular to the upper (or lower) semiconductor surface. More particularly, some of the roughly perpendicular ion implantation steps are performed virtually perpendicular to the upper semiconductor surface, i.e., at substantially a zero value of tilt angle $\alpha$. The value of tilt angle $\alpha$ is substantially zero in each ion implantation described below for which no value, or range of values is given for tilt angle $\alpha$.

The remainder of the roughly perpendicular ion implantation steps are performed with tilt angle $\alpha$ set at a small value, typically 7°. This small deviation from perpendicularity is used to avoid undesirable ion channeling effects. For simplicity, the small deviation from perpendicularity is generally not indicated in FIG. 33.

Angled ion implantation refers to implanting ions of a semiconductor dopant at a significant non-zero value of tilt angle $\alpha$. For angled ion implantation, tilt angle $\alpha$ is normally at least 15°. Depending on whether an IGFET has one halo pocket portion or a pair of halo pocket portions, angled ion implantation is generally employed to provide an IGFET with semiconductor dopant for each such halo pocket portion. Angled ion implantation is also sometimes employed to provide certain of the IGFETs with S/D extensions. Tilt angle $\alpha$ is normally constant during each particular angled ion implantation but can sometimes be varied during an angled implantation.

As viewed perpendicular to a plane extending generally parallel to the upper (or lower) semiconductor surface, the image of the tilt angle's impingement axis on that plane is at an azimuthal angle $\beta$ to the longitudinal direction of each IGFET and thus at azimuthal angle $\beta$ to one of the semiconductor body's principal lateral directions. Each ion implantation at a non-zero value of tilt angle $\alpha$ is normally performed at one or more non-zero values of azimuthal angle $\beta$. This applies to both the angled ion implantations and the tilted implantations performed at a small value, again typically 7°, of tilt angle $\alpha$ to avoid ion channeling.

Most of the ion implantations at a non-zero value of tilt angle $\alpha$ are normally performed at one or more pairs of different values of azimuthal angle $\beta$. Each pair of values of azimuthal angle $\beta$ normally differs by approximately 180°. Approximately the same dosage of the ion-implanted semiconductor dopant is normally provided at each of the two values of each of the pairs of azimuthal-angle values.

Only one pair of azimuthal-angle values differing by approximately 180° is needed if the longitudinal directions of all the IGFETs in a group of IGFETs receiving semiconductor dopant during a tilted ion implantation extend in the same principal lateral direction of the semiconductor body. In that case, one half of the total implant dosage can be supplied at one of the azimuthal-angle values, and the other half of the total implant dosage is supplied at the other azimuthal-angle value. One choice for the two azimuthal-angle values is 0° and 180° relative to the semiconductor body's principal lateral direction extending parallel to the longitudinal directions of the IGFETs.

Four different values of azimuthal angle $\beta$, i.e., two pairs of different azimuthal-angle values, can be employed for a tilted ion implantation simultaneously performed on a group of IGFETs whose longitudinal directions variously extend in both of the semiconductor body's principal lateral directions. Each consecutive pair of values of azimuthal angle $\beta$ then normally differs by approximately 90°. In other words, the four values of azimuthal angle $\beta$ are $\beta_0$, $\beta_0+90°$, $\beta_0+180°$, and $\beta_0+270°$ where $\beta_0$ is a base azimuthal-angle value ranging from 0° to just under 90°. For instance, if base value $\beta_0$ is 45°, the four values of azimuthal angle $\beta$ are 45°, 135°, 225°, and 315°. Ion implanting at four azimuthal-angle values with 90° angular increments is referred to as a four-quadrant implant. Approximately one fourth of the total implant dosage is supplied at each of the four azimuthal-angle values.

Tilted ion implantation, including angled ion implantation for which tilt angle $\alpha$ is normally at least 15°, can be done in various other ways. If an angled ion implantation is simultaneously performed on a group of asymmetric IGFETs laid out to have the same orientation so as to provide each asymmetric IGFET in the group only with a source extension or only with a source-side halo pocket portion, the angled implantation can be done at as little as a single value, e.g., 0°, of azimuthal angle $\beta$. Tilted ion implantation can also be done as the semiconductor body is rotated relative to the source of the semiconductor dopant so that azimuthal angle $\beta$ varies with time. For instance, azimuthal angle $\beta$ can vary with time at a variable or constant rate. The implant dosage is then typically provided to the semiconductor body at variable or a constant rate.

While tilted ion implantation can be done in different ways in different tilted implantation steps, each tilted implantation simultaneously performed on a group of IGFETs subsequent to defining the shapes of their gate electrodes is preferably done at four azimuthal-angle values of $\beta_0$, $\beta_0+90°$, $\beta_0+180°$, and $\beta_0+270°$ with approximately one fourth of the total implant dosage supplied at each azimuthal-angle value. The tilted implantation characteristics of IGFETs oriented one way on the semiconductor body are respectively substantially the same as the tilted ion implantation characteristics of like-configured IGFETs that may be oriented another way in another way on the semiconductor body. This makes it easier for an IC designer to design an IC manufactured according to an implementation of the semiconductor fabrication platform of FIG. 33.

In each ion implantation performed after the gate-electrode shapes are defined and used to introduce a semiconductor dopant through one or more openings in a photoresist mask into one or more selected parts of the semiconductor body, the combination of the photoresist mask, the gate electrodes (or their precursors), and any material situated along the sides of the gate electrodes serves as a dopant-blocking shield to ions of the dopant impinging on the semiconductor body. Material situated along the sides of the gate electrodes may include dielectric sidewall spacers situated along at least the transverse sides of the gate electrodes.

When the ion implantation is an angled implantation performed at four 90° incremental values of azimuthal angle $\beta$ with material of the so-implanted regions, e.g., the halo pocket portions and some of the S/D extensions, extending significantly under the gate electrodes, the dopant-blocking shield may cause the implanted material below each gate electrode to receive ions impinging at no more than two of four incremental $\beta$ values. If base azimuthal-angle value $\beta_0$ is zero so that the four azimuthal-angle values are 0°, 90°, 180°, and 270°, the material below the gate electrode largely receives ions impinging at only a corresponding one of the four 0°, 90°, 180°, and 270° values. This dosage N' of impinging ions is referred to as a one quadrant dose $N'_1$.

If base azimuthal-angle value $\beta_0$ is greater than zero, the material below the gate electrode largely receives some ions impinging at one corresponding one of the four $\beta_0$, $\beta_0+90°$, $\beta_0+180°$, and $\beta_0+270°$ values and other ions impinging at a corresponding adjacent one of the four $\beta_0$, $\beta_0+90°$, $\beta_0+180°$, and $\beta_0+270°$ values. The total dosage N' of ions received by the material below the gate electrode is approximately:

$$N'=N'_1(\sin \beta_0 + \cos \beta_0) \qquad (5)$$

The maximum dose $N'_{max}$ of ions received by the material below the gate electrode occurs when base azimuthal-angle value $\beta_0$ is 45°. Using Eq. 5, maximum dose $N'_{max}$ is $\sqrt{2}N'_1$. Inasmuch as $\sqrt{2}$ is approximately 1.4, maximum dose $N'_{max}$ is only about 40% higher than one quadrant dose $N'_1$. For simplicity, dosage N' of ions received by material below the gate electrode is, except as otherwise indicated, approximated herein as a one quadrant dose $N'_1$ even though actual dosage N' varies from $N'_1$ to approximately $1.4N'_1$ depending on base azimuthal-angle value $\beta_0$.

The dopant-containing particle species of the n-type semiconductor dopant utilized in each of the n-type ion implantations in the fabrication process of FIG. 33 consists of the specified n-type dopant in elemental form except as otherwise indicated. In other words, each n-type ion implantation is performed with ions of the specified n-type dopant element rather than with ions of a chemical compound containing the dopant element. The dopant-containing particle species of the p-type semiconductor dopant employed in each of the p-type ion implantations variously consists of the p-type dopant, normally boron, in elemental or chemical compound form. Hence, each p-type ion implantation is normally performed with boron ions or with ions of a boron-containing chemical compound such as boron difluoride. The ionization charge state during each ion implantation is single ionization of the positive type except as otherwise indicated.

The n-type and p-type dopants diffuse both laterally and vertically during elevated-temperature operations, i.e., temperature significantly greater than room temperature. Lateral and vertical diffusion of the dopants used to define the source/drain zones and the halo pocket portions is generally indicated in FIG. 33. Upward vertical diffusion of the dopants that define the empty main well regions is shown in FIG. 33 because upward diffusion of those dopants is important to achieving the benefits of using empty main well regions in the present CIGFET structure. For simplicity in illustration, downward and lateral diffusion of the empty main well dopants is not indicated in FIG. 33. Nor does FIG. 33 generally indicate diffusion of any of the other well dopants.

Each anneal or other operation described below as being performed at elevated temperature includes a ramp-up segment and a ramp-down segment. During the ramp-up segment, the temperature of the then-existent semiconductor structure is increased from a low value to the indicated elevated temperature. The temperature of the semiconductor structure is decreased from the indicated elevated temperature to a low value, during the ramp-down segment. The time period given below for each anneal or other high-temperature operation is the time at which the semiconductor structure is at the indicated elevated temperature. No time period at the indicated elevated temperature is given for a spike anneal because the ramp-down segment begins immediately after the ramp-up segment ends and the temperature of the semiconductor structure reaches the indicated elevated temperature.

In some of the fabrication steps in FIG. 33, openings extend through a photoresist mask above the active semiconductor regions for two IGFETs. When the two IGFETs are formed laterally adjacent to each other in the exemplary cross sections of FIG. 33, the two photoresist openings are illustrated as a single opening in FIG. 33 even though they may be described below as separate openings.

The letter "P" at the end of a reference symbol appearing in the drawings of FIG. 33 indicates a precursor to a region which is shown in FIG. 11 and which is identified there by the portion of the reference symbol preceding "P". The letter "P" is dropped from the reference symbol in the drawings of FIG. 33 when the precursor has evolved sufficiently to largely constitute the corresponding region in FIG. 11.

The cross-sectional views of FIGS. 33$d$.1-33$y$.1, 33$d$.2-33$y$.2, 33$d$.3-33$y$.3, 33$d$.4-33$y$.4, and 33$d$.5-33$y$.5 include many situations in which part of the semiconductor structure is substantially the same in two consecutive cross-sectional views due to the presence of an item, such as a photoresist mask in the later view, that substantially prevents any change from occurring in that part of the semiconductor structure in going from the earlier view to the later view. In order to simplify the illustration of FIG. 33, the later view in each of these situations is often provided with considerably reduced labeling.

N2. Well Formation

The starting point for the fabrication process of FIG. 33 is a monosilicon semiconductor body typically consisting of a heavily doped p-type substrate 920 and an overlying lightly doped p-type epitaxial layer 136P. See FIG. 33$a$. P+ substrate 920 is a semiconductor wafer formed with <100> monosilicon doped with boron to a concentration of $4 \times 10^{18} - 5 \times 10^{18}$ atoms/cm$^3$ for achieving a typical resistivity of approximately 0.015 ohm-cm. For simplicity, substrate 920 is not shown in the remainder of FIG. 33. Alternatively, the starting point can simply be a p-type substrate lightly doped substantially the same as p− epitaxial layer 136P.

Epitaxial layer 136P consists of epitaxially grown <100> monosilicon lightly doped p-type with boron to a concentration of approximately $4 \times 10^{14}$ atoms/cm$^3$ for achieving a typical resistivity of 30 ohm-cm. The thickness of epitaxial layer 136P is typically 5.5 μm. When the starting point for the fabrication process of FIG. 33 is a lightly doped p-type substrate, item 136P is the p− substrate.

Field-insulation region 138 is provided along the upper surface of p− epitaxial layer (or p-substrate) 136P as shown in FIG. 33$b$ so as to define a group of laterally separated active monosilicon semiconductor islands 922 that include the active semiconductor islands for all of the illustrated IGFETs. The active islands for the illustrated IGFETs are not individually indicated in FIG. 33$b$. Additional ones (also not separately indicated in FIG. 33$b$) of active islands 922 are used to provide electrical contact to main well regions 180, 182, 184A, 186A, 188, 190, 192, 194, 196, 198, 200, 202, 204, and 206, deep n well regions 210 and 212, and substrate region 136.

Field insulation 138 is preferably created according to a trench-oxide technique but can be created according to a local-oxidation technique. Depth $y_n$ of field insulation is normally 0.35-0.55 μm, typically 0.45 μm. In providing field insulation 138, a thin screen insulating layer 924 of silicon oxide is thermally grown along the upper surface of epitaxial layer 136P.

A photoresist mask 926 having openings above the locations for deep n wells 210 and 212 and any other deep n wells is formed on screen oxide layer 924 as shown in FIG. 33$c$. The deep n well dopant is ion implanted at a moderate dosage through the openings in photoresist 926, through the uncovered sections of screen oxide 924, and into vertically corresponding portions of the underlying monosilicon to define a group of laterally separated deep n-type well regions 928, one of which is shown in FIG. 33$c$. Photoresist 926 is removed. Deep n well regions 928, which are situated below the upper semiconductor surface and extend upward into selected ones of active islands 922, respectively constitute precursors to deep n well regions 210 and 212 and any other deep n wells.

The dosage of the deep n well dopant is normally $1 \times 10^{13} - 1 \times 10^{14}$ ions/cm$^2$, typically $1.5 \times 10^{13}$ ions/cm$^2$. The deep n well dopant normally consists of phosphorus or arsenic. For the typical case in which phosphorus constitutes the deep n well dopant, the implantation energy is normally 1,000-3,000 keV, typically 1,500 keV.

An initial rapid thermal anneal ("RTA") is performed on the resultant semiconductor structure to repair lattice damage and place the atoms of the implanted deep n well dopant in energetically more stable states. The initial RTA is performed in a non-reactive environment at 900-1050° C., typically 950-1000° C., for 5-20 s, typically 10 s. The deep n well dopant diffuses vertically and laterally during the initial RTA. This dopant diffusion is not indicated in FIG. 33.

In the remainder of the process of FIG. 33, the CIGFET structure at each processing stage is illustrated with five FIGS. "33$z$.1", "33$z$.2", "33$z$.3", "33$z$.4", and "33$z$.5" where "$z$" is a letter varying from "d" to "y". Each FIG. 33$z$.1 illustrates additional processing done to create asymmetric high-voltage IGFETs 100 and 102. Each FIG. 33$z$.2 illustrates additional processing done to create asymmetric extended-drain IGFETs 104 and 106. Each FIG. 33$z$.3 illustrates additional processing done to create symmetric low-voltage low-leakage IGFETs 108 and 110. Each FIG. 33$z$.4 illustrates additional processing done to create symmetric low-voltage low-$V_T$ IGFETs 112 and 114. Each FIG. 33$z$.5 illustrates additional processing done to create symmetric high-voltage nominal-$V_T$ IGFETs 116 and 118. Each group of five FIGS. 33z.1-33z.5 is, for convenience, collectively referred to below as "FIG. 33z" where "z" varies from "d" to "y". For instance, FIGS. 33d.1-33d.5 are collectively referred to as "FIG. 33d".

A photoresist mask 930 having openings above island 142 for asymmetric p-channel IGFET 102, above island 154 for symmetric p-channel IGFET 114, and above the locations for n-type empty main well regions 184B and 186A of extended-drain IGFETs 104 and 106 is formed on screen oxide layer 924 as depicted in FIG. 33d. The edge of photoresist mask 930 that defines the side of empty main well 184B closest to p-type empty main well region 184A of IGFET 104 is critically controlled to control separation distance $L_{WW}$ between empty wells 184A and 184B. The edge of photoresist 930 that defines the side of empty main well 186A closest to p-type empty main well region 186B of IGFET 106 is critically controlled to control separation distance $L_{WW}$ between empty wells 186A and 186B. Critical photoresist 930 also has an opening (not shown) above island 166 for symmetric p-channel IGFET 126.

The n-type empty main well dopant is ion implanted at a moderate dosage through the openings in photoresist 930, through the uncovered sections of screen oxide 924, and into vertically corresponding portions of the underlying monosilicon to define (a) n precursors 182P and 194P to respective empty main well regions 182 and 194 of IGFETs 102 and 114, (b) n precursors 184BP and 186AP to respective empty main well regions 184B and 186A of IGFETs 104 and 106, and (c) an n precursor (not shown) to empty main well region 206 of IGFET 126. Photoresist 930 is removed. N precursor empty main wells 182P and 186AP respectively extend into, but only partway through, precursors 210P and 212P to deep n well regions 210 and 212.

The dosage of the n-type empty main well dopant is normally $1\times10^{13}$–$5\times10^{13}$ ions/cm$^2$, typically $2.5\times10^{13}$–$3\times10^{13}$ ions/cm$^2$. The n-type empty main well dopant normally consists of phosphorus or arsenic. For the typical case in which phosphorus constitutes the n-type empty main well dopant, the implantation energy is normally 350-500 keV, typically 425-450 keV.

The concentration of the n-type empty main well dopant in n precursor empty main well regions 182P, 184BP, 186AP, and 194P and the n precursor to empty main well region 206 reaches respective local maxima along largely the same respective locations as in n-type final empty main well regions 182, 184B, 186A, 194P, and 206. The n-type empty main well dopant concentration in each of precursor empty main wells 182P, 184BP, 186AP, and 194P and the precursor to empty main well 206 varies vertically in roughly a Gaussian manner.

In moving from the location of the n-type empty main well dopant concentration maximum in each of precursor empty main wells 182P, 184BP, 186AP, and 194P and the precursor to empty main well 206 toward the upper semiconductor surface, the n-type empty main well dopant concentration drops gradually from a moderate doping, indicated by symbol "n", to a light doping, indicated by symbol "n–". Dotted lines 296P, 340P, 372P, and 560P in FIG. 33d basically constitute respective precursors to dotted lines 296, 340, 372, and 560 in FIG. 11. Each precursor dotted line 296P, 340P, 372P, or 560P thus roughly represents the location below which the n-type empty main well dopant concentration in corresponding precursor empty main well 182P, 184BP, 186AP, or 194P is at the moderate n doping and above which the n-type empty main well dopant concentration in precursor well 182P, 184BP, 186AP, or 194P is at the light n– doping.

N precursor empty main well regions 182P, 184BP, 186AP, and 194P and the n precursor to empty main well region 206 do not reach the upper semiconductor surface at this point in the fabrication process. Four isolated surface-adjoining portions 136P1, 136P2, 136P3, and 136P4 of p-epitaxial layer 136P are thus respectively present in islands 142, 144B, 146A, and 154 respectively above n precursor empty main wells 182P, 184BP, 186AP, and 194P. Isolated p– epitaxial-layer portion 136P3 also extends laterally over precursor deep n well region 212P. Another isolated surface-adjoining portion (not shown) of p– epitaxial layer 136P is similarly present in island 166 above the n precursor to empty main well region 206. Isolated p– epitaxial-layer portions 136P1-136P4 and the isolated p– portion of epitaxial layer 136P in island 166 are all separated from the underlying remainder of epitaxial layer 136P by the combination of field insulation 138 and n-type monosilicon.

The four regions of p– monosilicon formed by segments of (a) isolated epitaxial-layer portion 136P1 in island 142, (b) the part of isolated epitaxial-layer portion 136P3 overlying n precursor empty main well 186AP in island 146A, (c) isolated epitaxial-layer portion 136P4 in island 154, and (d) the isolated p– portion of epitaxial layer 136P in island 166 become n– monosilicon of respective empty main wells 182, 186A, 194, and 206 in the final CIGFET structure. In addition, the two regions of p– monosilicon formed by isolated epitaxial portion 136P2 in island 144B and the (non-isolated) part of epitaxial layer 136P situated in island 144A above n precursor empty main well 184BP become n– monosilicon of empty main well 184 in the final CIGFET structure. These six regions of p– monosilicon thus need to be converted to n– monosilicon. As described below, the six p– monosilicon regions are normally converted to n– monosilicon by upward diffusion of part of the n-type empty main well dopant from n precursor empty main well regions 182P, 184BP, 186AP, and 194P and the n precursor to empty main well region 206 during subsequent fabrication steps, primarily steps performed at elevated temperature.

A separate n-type doping operation can also be performed to convert the preceding six p– monosilicon regions to n– monosilicon if, for example, there is uncertainty that each of the six p– monosilicon regions would be converted fully to n– monosilicon via upward diffusion of part of the n-type empty main well dopant during subsequent elevated-temperature fabrication steps. Before removing photoresist 930, an n-type semiconductor dopant, referred to as the n-type compensating dopant, can be ion implanted at a low dosage through the uncovered sections of screen oxide 924 and into the underlying monosilicon to convert the six p– monosilicon regions to n– monosilicon.

If it is desired that any of the six p– monosilicon regions not receive the n-type compensating dopant or if any other monosilicon region that receives the n-type empty main well dopant is not to receive the n-type compensating dopant, an additional photoresist mask (not shown) having openings above selected ones of (a) islands 142, 154, and 166 and (b) the locations for n-type empty main well regions 184B and 186A can be formed on screen oxide layer 924. The n-type compensating dopant is then ion implanted at a low dosage through the openings in the additional photoresist mask and into the semiconductor body after which the additional photoresist is removed. In either case, the dosage of the n-type compensating dopant should generally be as low as reasonable feasible so as to maintain the empty-well nature of final main well regions 182, 184B, 186A, and 194.

A photoresist mask 932 having openings above island 140 for asymmetric n-channel IGFET 100, above island 152 for symmetric n-channel IGFET 112, above the locations for p-type empty main well regions 184A and 186B of extended-drain IGFETs 104 and 106, and above the location for isolating p well region 216 is formed on screen oxide layer 924. See FIG. 33e. The edge of photoresist mask 932 that defines the side of empty main well 184A closest to n-type empty main well region 184B of IGFET 104 is critically controlled to control separation distance $L_{WW}$ between empty wells 184A and 184B. The edge of photoresist 932 that defines the side of empty main well 186B closest to n-type empty main well region 186A of IGFET 106 is critically controlled to control separation distance $L_{WW}$ between empty wells 186A and 186B. Critical photoresist 932 also has an opening (not shown) above island 164 for symmetric n-channel IGFET 124.

The p-type empty main well dopant is ion implanted at a moderate dosage through the openings in photoresist 932, through the uncovered sections of screen oxide 924, and into vertically corresponding portions of the underlying monosilicon to define (a) p precursors 180P and 192P to respective empty main well regions 180 and 192 of IGFETs 100 and 112, (b) p precursors 184AP and 186BP to respective empty wells 184A and 186B of IGFETs 104 and 106, (c) p precursor 216P to isolating p well 216 and (d) a p precursor (not shown) to empty main well region 204 of IGFET 124. Photoresist 932 is removed. P precursor empty main well regions 180P and 186BP respectively extend into, but only partway through, precursor deep n well regions 210P and 212P.

The dosage of the p-type empty main well dopant is normally $1 \times 10^{13}$–$5 \times 10^{13}$ ions/cm$^2$, typically $2.5 \times 10^{13}$–$3 \times 10^{13}$ ions/cm$^2$. The p-type empty main well dopant normally consists of boron in elemental form or in the form of boron difluoride. For the typical case in which elemental boron constitutes the p-type empty main well dopant, the implantation energy is normally 100-225 keV, typically 150-175 keV.

The concentration of the p-type empty main well dopant in p precursor empty main well regions 180P, 184AP, 186BP, and 192P and the p precursor to empty main well region 204 reaches respective local maxima along largely the same respective locations as in p-type final empty main well regions 180, 184A, 186B, 192P, and 204. The n-type empty main well dopant concentration in each of precursor empty main wells 180P, 184AP, 186BP, and 192P and the precursor to empty main well 204 varies vertically in roughly a Gaussian manner.

In moving from the location of the p-type empty main well dopant concentration maximum in each of precursor empty main wells 180P, 184AP, 186BP, and 192P and the precursor to empty main well 204 toward the upper semiconductor surface, the p-type empty main well dopant concentration drops gradually from a moderate doping, indicated by symbol "p", to a light doping, indicated by symbol "p–". Dotted lines 256P, 332P, 380P, and 530P in FIG. 33e basically constitute respective precursors to dotted lines 256, 332, 380, and 530 in FIG. 11. Each precursor dotted line 256P, 332P, 380P, or 530P therefore roughly represents the location below which the p-type empty main well dopant concentration in corresponding precursor empty main well 180P, 184AP, 186BP, or 192P is at the moderate n doping and above which the p-type empty main well dopant concentration in precursor well 180P, 184AP, 186BP, or 192P is at the light p– doping.

P precursor empty main well regions 180P, 184AP, 186BP, and 192P and the p precursor to empty main well region 204 do not reach the upper semiconductor surface at this point in the fabrication process. Three additional surface-adjoining portions 136P5, 136P6, and 136P7 of p-epitaxial layer 136P are therefore respectively present in islands 140, 146B, and 152 respectively above p precursor empty main wells 180P, 186BP, and 192P. Another surface-adjoining portion (not shown) of p– epitaxial layer 136P is similarly present in island 164 above the p precursor to empty main well region 204.

A photoresist mask 934 having openings above islands 150 and 158 for symmetric p-channel IGFETs 110 and 118 is formed on screen oxide layer 924 as depicted in FIG. 33f. Photoresist mask 934 also has an opening (not shown) above island 162 for symmetric p-channel IGFET 122. The n-type filled main well dopant is ion implanted at a moderate dosage through the openings in photoresist 934, through the uncovered sections of screen oxide 924, and into vertically corresponding portions of the underlying monosilicon to define (a) n precursors 494P and 620P to respective filled-well main body-material portions 494 and 620 of IGFETs 110 and 118 and (b) an n precursor (not shown) to filled-well main body-material portion 694 of IGFET 122. The n-type filled main well implantation is normally done at the same conditions and with the same n-type dopant as the n-type empty main well implantation.

With photoresist mask 934 still in place, the n-type APT dopant is ion implanted at a moderate dosage through the openings in photoresist 934, through the uncovered sections of screen oxide 924, and into vertically corresponding portions of the underlying monosilicon to define (a) n precursors 496P and 622P to respective intermediate body-material portions 496 and 622 of IGFETs 110 and 118 and (b) an n precursor (not shown) to further body-material portion 696 of IGFET 122. Photoresist 934 is now removed. N precursor intermediate body-material portions 496P and 622P respectively overlie n precursor filled-well main body-material portions 494P and 620P. The n precursor to further body-material portion 696 overlies the n precursor to filled-well main body-material portion 694.

Each of n precursor body-material portions 494P and 496P normally extends laterally below the intended location for substantially all of each of channel zone 484 and S/D zones 480 and 482 of IGFET 110. Each of n precursor body-material portions 620P and 622P similarly normally extends laterally below the intended location for substantially all of each of channel zone 614 and S/D zones 610 and 612 of IGFET 118. The n precursor to body-material portion 696 normally extends laterally below the intended location for substantially all of each of channel zone 684 and S/D zones 680 and 682 of IGFET 122. The n precursors to body-material portions 694 and 696 form an n precursor (not shown) to filled well region 202 of IGFET 122.

The dosage of the n-type APT dopant is normally $1 \times 10^{12}$–$6 \times 10^{12}$ ions/cm$^2$, typically $3 \times 10^{12}$ ions/cm$^2$. The n-type APT dopant normally consists of phosphorus or arsenic. For the typical case in which phosphorus constitutes the n-type APT dopant, the implantation energy is 75-150 keV, typically 100-125 keV. The n-type APT implantation can be performed with photoresist 934 prior to the n-type filled main well implantation.

A photoresist mask 936 having openings above islands 148 and 156 for symmetric n-channel IGFETs 108 and 116 is formed on screen oxide layer 924. See FIG. 33g. Photoresist mask 936 also has an opening (not shown) above island 160 for symmetric n-channel IGFET 120. The p-type filled main well dopant is ion implanted at a moderate dosage through the openings in photoresist 936, through the uncovered sections of screen oxide 924, and into vertically corresponding portions of the underlying monosilicon to define (a) p precursors 454P and 590P to respective filled-well main body-material portions 454 and 590 of IGFETs 108 and 116 and (b) a p precursor (not shown) to filled-well main body-material portion 654 of IGFET 120. The p-type filled main well implantation is normally done at the same conditions and with the same p-type dopant as the p-type empty main well implantation.

With photoresist mask 936 still in place, the p-type APT dopant is ion implanted at a moderate dosage through the openings in photoresist 936, through the uncovered sections of screen oxide 924, and into vertically corresponding portions of the underlying monosilicon to define (a) p precursors 456P and 592P to respective intermediate body-material portions 456 and 592 of IGFETs 108 and 116 and (b) a p precursor (not shown) to further body-material portion 656 of IGFET 120. Photoresist 936 is now removed. P precursor intermediate body-material portions 456P and 592P respectively overlie p precursor filled-well main body-material portions 454P and 590P. The p precursor to further body-material portion 656 overlies the p precursor to filled-well main body-material portion 654.

Each of p precursor body-material portions 454P and 456P normally extends laterally below the intended location for substantially all of each of channel zone 444 and S/D zones 440 and 442 of IGFET 108. Each of p precursor body-material portions 590P and 592P similarly normally extends laterally below the intended location for substantially all of each of channel zone 584 and S/D zones 580 and 582 of IGFET 116. The p precursor to body-material portion 656 normally extends laterally below the intended location for substantially all of each of channel zone 644 and S/D zones 640 and 642 of IGFET 120. In addition, the p precursors to body-material portions 654 and 656 form a p precursor (not shown) to filled well region 200 of IGFET 120.

The dosage of the p-type APT dopant is normally $4 \times 10^{12}$–$1.2 \times 10^{13}$ ions/cm$^2$, typically $7 \times 10^{12}$ ions/cm$^2$. The p-type APT dopant normally consists of boron in elemental form or in the form of boron difluoride. For the typical case in which elemental boron constitutes the p-type APT dopant, the implantation energy is 50-125 keV, typically 75-100 keV. The p-type APT implantation can be performed with photoresist 936 prior to the p-type filled main well implantation.

None of the remaining semiconductor dopants introduced into the semiconductor body significantly go into precursor deep n wells 210P and 212P (or into any other precursor deep n well). Since the initial RTA caused the atoms of the deep n well dopant to go into energetically more stable states, precursor deep n wells 210P and 212P are respectively substantially final deep n wells 210 and 212 and are so indicated in the remaining drawings of FIG. 33.

A photoresist mask 938 having openings above islands 150 and 158 for symmetric p-channel IGFETs 110 and 118 is formed on screen oxide layer 924 as depicted in FIG. 33h. The n-type threshold-adjust dopant is ion implanted at a light-to-moderate dosage through the openings in photoresist 938, through the uncovered sections of screen oxide 924, and into vertically corresponding portions of the underlying monosilicon to define n precursors 498P and 624P to respective upper body-material portions 498 and 624 of IGFETs 110 and 118. Photoresist 938 is removed. N precursor upper body-material portions 498P and 624P respectively overlie n precursor intermediate body-material portions 496P and 622P. N precursor body-material portions 494P, 496P, and 498P form an n precursor 190P to filled well region 190 of IGFET 110. N precursor body-material portions 620P, 622P, and 624P form an n precursor 198P to filled well region 198 of IGFET 118.

The dosage of the n-type threshold-adjust dopant is normally $1 \times 10^{12}$–$6 \times 10^{12}$ ions/cm$^2$, typically $3 \times 10^{12}$ ions/cm$^2$. The n-type threshold-adjust dopant normally consists of arsenic or phosphorus. For the typical case in which arsenic constitutes the n-type threshold-adjust dopant, the implantation energy is normally 60-100 keV, typically 80 keV.

A photoresist mask 940 having openings above islands 148 and 156 for symmetric n-channel IGFETs 108 and 116 is formed on screen oxide layer 924. See FIG. 33i. The p-type threshold-adjust dopant is ion implanted at a light-to-moderate dosage through the openings in photoresist 940, through the uncovered sections of screen oxide 924, and into vertically corresponding portions of the underlying monosilicon to define p precursors 458P and 594P to respective upper body-material portions 458 and 594 of IGFETs 108 and 116. Photoresist 940 is removed. P precursor upper body-material portions 458P and 594P respectively overlie p precursor intermediate body-material portions 456P and 592P. P precursor body-material portions 454P, 456P, and 458P form a p precursor 188P to filled well region 188 of IGFET 108. P precursor body-material portions 590P, 592P, and 594P form a p precursor 196P to filled well region 196 of IGFET 116.

The dosage of the p-type threshold-adjust dopant is normally $2 \times 10^{12}$–$8 \times 10^{12}$ ions/cm$^2$, typically $4 \times 10^{12}$ ions/cm$^2$. The p-type threshold-adjust dopant normally consists of boron in elemental form or in the form of boron difluoride. For the typical case in which elemental boron constitutes the p-type threshold-adjust dopant, the implantation energy is normally 15-35 keV, typically 25 keV.

Tilt angle α is normally approximately 7° for the n-type APT, p-type APT, and p-type threshold-adjust implantations. Tilt angle α is approximately 0° for the remainder of the preceding implantations. Each of the preceding implantations is performed at only one value of azimuthal angle β, i.e., each of them is a single-quadrant implantation. Azimuthal angle β is 30°-35° for the n-type APT, p-type APT, and p-type threshold-adjust implantations and approximately 0° for the remainder of the preceding implantations.

N3. Gate Formation

The upper semiconductor surface is exposed by removing screen oxide layer 924 and cleaned, typically by a wet chemical process. A sacrificial layer (not shown) of silicon oxide is thermally grown along the upper semiconductor surface to prepare the upper semiconductor surface for gate dielectric formation. The thickness of the sacrificial oxide layer is typically at least 10 nm. The sacrificial oxide layer is subsequently removed. The cleaning operation and the formation and removal of the sacrificial oxide layer remove defects and/or contamination along the upper semiconductor surface to produce a high-quality upper semiconductor surface.

A comparatively thick gate-dielectric-containing dielectric layer 942 is provided along the upper semiconductor surface as depicted in FIG. 33j. Portions of thick dielectric layer 942 are at the lateral locations for, and later constitute portions of, the gate dielectric layers at the high gate dielectric thickness $t_{GdH}$, i.e., gate dielectric layers 260 and 300 of asymmetric IGFETs 100 and 102, gate dielectric layers 344 and 384 of extended-drain IGFETs 104 and 106, and the gate dielectric layers of the illustrated high-voltage symmetric IGFETs. To allow for subsequent increase in the thickness of the sections of dielectric layer 942 at the lateral locations for the $t_{GdH}$ high-thickness gate dielectric layers, the thickness of layer 942 is slightly less, typically 0.2 nm less, than the intended $t_{GdH}$ thickness.

Thick dielectric layer 942 is normally thermally grown. The thermal growth is performed in a wet oxidizing environment at 900-1100° C., typically 1000° C., for 30-90 s, typically 45-60 s. Layer 942 normally consists of substantially pure silicon oxide for which the wet oxidizing environment is formed with oxygen and hydrogen.

The high-temperature conditions of the thermal growth of thick dielectric layer 942 serves as an anneal which repairs lattice damage caused by the implanted p-type and n-type main well dopants and places atoms of the implanted p-type and n-type main well dopants in energetically more stable states. As a result, precursor well region 216P substantially becomes isolating p well region 216. Precursor filled-well main body-material portions 454P and 590P and the precursor to filled-well main body-material portion 654 substantially respectively become p filled-well main body-material portions 454, 590, and 654 of IGFETs 108, 116, and 120. Precursor filled-well main body-material portions 494P and 620P and the precursor to filled-well main body-material portion 694 substantially respectively become n filled-well main body-material portions 494, 620, and 694 of IGFETs 110, 118, and 122.

The high temperature of the thermal growth of thick dielectric layer 942 also causes the p-type and n-type well, APT, and threshold-adjust dopants, especially the main well dopants, to diffuse vertically and laterally. FIG. 33j only indicates the upward diffusion of the empty main well dopants. As a result of the upward diffusion of the empty main well dopants, precursor empty main well regions 180P, 182P, 184AP, 184BP, 186AP, 186BP, 192P, and 194P expand upward toward the upper semiconductor surface. The same occurs with the precursors to empty main well regions 204 and 206.

Precursor empty main wells 180P, 182P, 184AP, 184BP, 186AP, 186BP, 192P, and 194P and the precursors to empty main wells 204 and 206 may reach the upper semiconductor surface during the thick-dielectric-layer thermal growth if it is sufficiently strong. However, precursor empty wells 180P, 182P, 184AP, 184BP, 186AP, 186BP, 192P, and 194P and the precursors to empty wells 204 and 206 typically expand upward only partway to the upper semiconductor surface during the thick-dielectric-layer thermal growth. This situation is illustrated in FIG. 33j. Due to the upward expansion of precursor empty wells 180P, 182P, 184AP, 184BP, 186AP, 186BP, 192P, and 194P and the precursors to empty wells 204 and 206, isolated p− epitaxial-layer portions 136P1-136P7 and the isolated p− portions of epitaxial layer 136P in islands 164 and 166 shrink in size vertically.

A photoresist mask (not shown) having openings above the monosilicon islands for the illustrated low-voltage IGFETs is formed on thick dielectric layer 942. The uncovered material of dielectric layer 942 is removed to expose the monosilicon islands for the illustrated low-voltage IGFETs. Referring to FIG. 33k, item 942R is the remainder of thick gate-dielectric-containing dielectric layer 942.

A thin layer (not shown) of silicon is also removed along the upper surface of each of the islands for the illustrated low-voltage IGFETs in order to compensate for non-ideal silicon-oxide-to-silicon selectivity of the etching process. This ensures complete removal of the gate dielectric material at the removal locations. Additional defects and/or contamination, e.g., contamination caused by the photoresist, present along the upper surfaces of the islands for the illustrated low-voltage IGFETs, are removed in the course of removing the thin silicon layers. The photoresist is subsequently removed.

A comparatively thin gate-dielectric-containing dielectric layer 944 is provided along the upper semiconductor surface above the islands for the illustrated low-voltage IGFETs and thus at the respective lateral locations for their gate dielectric layers. Again see FIG. 33k. Portions of thin dielectric layer 944 later respectively constitute the gate dielectric layers for the illustrated low-voltage IGFETs.

Thin dielectric layer 944 is normally created by a combination of thermal growth and plasma nitridization. The thermal growth of thin dielectric layer 944 is initiated in a wet oxidizing environment at 800-1000° C., typically 900° C., for 10-20 s, typically 15 s. Layer 944 then consists of substantially pure silicon oxide for which the wet oxidizing environment is formed with oxygen and hydrogen.

Nitrogen is normally incorporated into thin dielectric layer 944 by a plasma nitridization operation performed subsequent to the wet-oxidizing thermal oxide growth primarily for preventing boron in p++ gate electrodes 502, 568, and 702 of symmetric low-voltage p-channel IGFETs 110, 114, and 122 from diffusing into their channel zones 484, 554, and 684. Layer 944 is thereby converted into a combination of silicon, oxygen, and nitrogen. The plasma nitridization operation, described further below, is normally performed so that nitrogen constitutes 6-12%, preferably 9-11%, typically 10%, of layer 944 by mass.

An intermediate RTA is performed on the semiconductor structure in a selected ambient gas at 800-1000° C., typically 900° C., for 10-20 s, typically 15 s. The ambient gas is normally oxygen. Due to the oxygen, the thickness of thin dielectric layer 944 increases slightly by thermal growth during the intermediate RTA. The thickness of dielectric layer 944 now substantially equals low gate dielectric thickness $t_{GdL}$, i.e., 1-3 nm, preferably 1.5-2.5 nm, typically 2 nm for 1.2-V operation of the illustrated low-voltage IGFETs.

The thickness of thick gate-dielectric-containing dielectric remainder 942R increases slightly by thermal growth during the thermal growth of thin dielectric layer 944. Due to reduced oxygen penetration to the upper surfaces of islands 140, 142, 144A, 144B, 146A, 146B, 156, 158, 164, 166, 172, and 174 covered with thick dielectric remainder 942R, the increase in the thickness of dielectric remainder 942R is considerably less than the thickness of thin dielectric layer 944. This relatively small increase in the thickness of thick dielectric remainder 942R is not shown in FIG. 33.

Thick dielectric remainder 942R receives nitrogen during the plasma nitridization operation. Because thick dielectric remainder 942R is thicker than thin dielectric layer 944, thick dielectric remainder 942R has a lower percentage by mass of nitrogen than thin dielectric layer 944. At the end of the thermal growth of thin dielectric layer 942 and the subsequent plasma nitridization, the thickness of thick dielectric remainder 942R substantially equals the $t_{GdH}$ high-thickness gate dielectric thickness value, i.e., normally 4-8 nm, preferably 5-7 nm, typically 6-6.5 nm for 3.0-V operation of the illustrated high-voltage IGFETs, including asymmetric IGFETs 100 and 102. The percentage by mass of nitrogen in thick dielectric layer 942R approximately equals the percentage by mass of nitrogen in thin dielectric layer 944 multiplied by the ratio of low dielectric thickness value $t_{GdL}$ to high dielectric thickness value $t_{GdH}$.

The high temperature of the thermal growth of thin dielectric layer 944 acts as an anneal which causes the implanted p-type and n-type well, APT, and threshold-adjust dopants to diffuse further vertically and laterally. With the thermal growth of thin dielectric layer 944 performed at a lower temperature, and for a considerably shorter time period, than the thermal growth of thick dielectric layer 942, the well, APT, and threshold-adjust dopants diffuse considerably less during the thin-dielectric-layer thermal growth than during the thick-dielectric-layer thermal growth. Only the upward diffusion of the empty main well dopants during the thin-dielectric-layer thermal growth is indicated in FIG. 33k.

Precursors 262P, 302P, 346P, 386P, 462P, 502P, 538P, 568P, 598P and 628P to respective gate electrodes 262, 302, 346, 386, 462, 502, 538, 568, 598 and 628 of IGFETs 100, 102, 104, 106, 108, 110, 112, 114, 116, and 118 are now formed on the partially completed CIGFET structure of FIG. 33*k*. See FIG. 33*l*. Precursors (not shown) to gate electrodes 662, 702, 738, 768, 798, 828, 858, and 888 of IGFETs 120, 122, 124, 126, 128, 130, 132, and 134 are simultaneously formed on the partially completed structure.

More particularly, precursor gate electrodes 262P, 302P, 598P, and 628P for high-voltage IGFETs 100, 102, 116, and 118 and the precursors to gate electrodes 738, 768, 858, and 888 of high-voltage IGFETs 124, 126, 132, and 134 are formed on thick gate-dielectric-containing dielectric remainder 942R respectively above selected segments of islands 140, 142, 156, 158, 164, 166, 172, and 174. Precursor gate electrode 346P for extended-drain n-channel IGFET 104 is formed on thick dielectric remainder 942R and part of field-insulation portion 138A so as to overlie a selected segment of island 144A without extending over island 144B. Precursor gate electrode 386P for extended-drain p-channel IGFET 106 is similarly formed on thick dielectric remainder 942R and part of field-insulation portion 138B so as to overlie a selected segment of island 146A without extending over island 146B. Precursor gate electrodes 462P, 502P, 538P, and 568P for low-voltage IGFETs 108, 110, 112, and 114 and the precursors to gate electrodes 662, 702, 798, and 828 of low-voltage IGFETs 120, 122, 128, and 130 are formed on thin gate-dielectric-containing dielectric layer 944 respectively above selected segments of islands 148, 150, 152, 154, 160, 162, 168, and 170.

Precursor gate electrodes 262P, 302P, 346P, 386P, 462P, 502P, 538P, 568P, 598P and 628P and the precursors to gate electrodes 662, 702, 738, 768, 798, 828, 858, and 888 are created by depositing a layer of largely undoped (intrinsic) polysilicon on dielectric remainder 942R and dielectric layer 944 and then patterning the polysilicon layer using a suitable critical photoresist mask (not shown). Portions (not shown) of the gate-electrode polysilicon layer can be used for polysilicon resistors. Each such resistor portion of the polysilicon layer typically overlies field insulation 138. The thickness of the polysilicon layer is 160-200 nm, typically 180 nm.

The polysilicon layer is patterned so that precursor polysilicon gate electrodes 262P, 302P, 462P, 502P, 538P, 568P, 598P and 628P and the precursors to gate electrodes 662, 702, 738, 768, 798, 828, 858, and 888 respectively overlie the intended locations for channel zones 244, 284, 444, 484, 524, 554, 584, 614, 644, 684, 724, 754, 784, 814, 844, and 874 of the illustrated non-extended-drain IGFETs. In addition, precursor polysilicon gate electrode 346P for extended-drain n-channel IGFET 104 overlies the intended location for channel zone 322, including the intended location for the channel-zone segment of portion 136A of p− substrate region 136 (see FIG. 22*a*), and extends over the intended location for portion 184B2 of empty main well region 184B partway across field-insulation portion 138A toward the intended location for portion 184B1 of empty main well 184B. Precursor polysilicon gate electrode 386P for extended-drain n-channel IGFET 106 overlies the intended locations for channel zone 362 and portion 136B of p− substrate region 136 (see FIG. 22*b*) and extends over the intended location for portion 186B2 of empty main well region 186B partway across field-insulation portion 138B toward portion 186B1 of empty main well 186B.

The portions of thick dielectric remainder 942R underlying precursor gate electrodes 262P, 302P, 598P, 628P of high-voltage IGFETs 100, 102, 116, and 118 and the precursors to gate electrodes 738, 768, 858, and 888 of high-voltage IGFETs 124, 126, 132, and 134 respectively constitute their gate dielectric layers 260, 300, 596, 626, 736, 766, 856, and 886. The portions of dielectric remainder 942R underlying precursor gate electrodes 346P and 386P of extended-drain IGFETs 104 and 106 respectively constitute their gate dielectric layers 344 and 384. The portions of thin dielectric layer 944 underlying precursor gate electrodes 462P, 502P, 538P, and 568P of low-voltage IGFETs 108, 110, 112, and 114 and the precursors to gate electrodes 662, 702, 798, and 828 of low-voltage IGFETs 120, 122, 128, and 130 respectively constitute gate dielectric layers 460, 500, 536, 566, 660, 700, 796, and 826. The gate dielectric material formed with the gate dielectric layers of the illustrated IGFETs generally respectively separates the precursor gate electrodes of the illustrated IGFETs from the doped monosilicon intended to be their respective channel zones.

All portions of thick dielectric remainder 942R and thin dielectric layer 944 not covered by precursor gate electrodes, including the precursor gate electrodes for the illustrated IGFETs, are removed in the course of removing the photoresist used in patterning the polysilicon layer. Segments of the islands for the illustrated IGFETs situated to the sides of their precursor gate electrodes are thereby exposed.

A thin sealing dielectric layer 946 is thermally grown along the exposed surfaces of the precursor gate electrodes for the illustrated IGFETs. Again see FIG. 33*l*. A thin surface dielectric layer 948 simultaneously forms along the exposed segments of the islands for the illustrated IGFETs. The thermal growth of dielectric layers 946 and 948 is performed at 900-1050° C., typically 950-1000° C., for 5-25 s, typically 10 s. Sealing dielectric layer 946 has a thickness of 1-3 nm, typically 2 nm.

The high temperature of the thermal growth of dielectric layers 946 and 948 acts as a further anneal which causes additional vertical and lateral diffusion of the implanted p-type and n-type well, APT, and threshold-adjust dopants. With the thermal growth of dielectric layers 946 and 948 done for a considerably shorter time period than the thermal growth of thick dielectric layer 942, the well, APT, and threshold-adjust dopants diffuse considerably less during the thermal growth of dielectric layers 946 and 948 than during the thick-dielectric-layer thermal growth. None of the additional dopant diffusion caused by the thermal growth of dielectric layers 946 and 948 is indicated in FIG. 33*l*.

FIG. 33*l* illustrates an example in which the top of each of precursor empty main well regions 180P, 182P, 184AP, 184BP, 186AP, 186BP, 192P and 194P is below the upper semiconductor surface at the end of the thermal growth of dielectric layers 946 and 948. The tops of the precursors to empty main well regions 204 and 206 are likewise below the upper semiconductor surface at this point in the fabrication process in the illustrated example. However, precursor empty main wells 180P, 182P, 184AP, 184BP, 186AP, 186BP, 192P and 194P and the precursors to empty main wells 204 and 206 may reach the upper semiconductor by the end of the thermal growth of dielectric layers 946 and 948.

N4. Formation of Source/Drain Extensions and Halo Pocket Portions

A photoresist mask 950 having an opening above island 148 for symmetric n-channel IGFET 108 is formed on dielectric layers 946 and 948 as shown in FIG. 33*m*. Photoresist mask 950 also has openings (not shown) above islands 160, 168, and 172 for symmetric n-channel IGFETs 120, 128, and 132. The n-type shallow S/D-extension dopant is ion implanted at a high dosage through the openings in photoresist 950, through the uncovered sections of surface dielectric 948, and into vertically corresponding portions of the underlying monosilicon to define (a) a pair of laterally separated largely identical n+ precursors 440EP and 442EP to respective S/D extensions 440E and 442E of IGFET 108, (b) a pair of laterally separated largely identical n+ precursors (not shown) to respective S/D extensions 640E and 642E of IGFET 120, (c) a pair of laterally separated largely identical n+ precursors (not shown) to respective S/D extensions 780E and 782E of IGFET 128, and (d) a pair of laterally separated largely identical n+ precursors (not shown) to respective S/D extensions 840E and 842E of IGFET 132.

The n-type shallow S/D-extension implantation is a four-quadrant implant with tilt angle $\alpha$ equal to approximately 7° and with base azimuthal-angle value $\beta_0$ equal to 20°-25°. The dosage of the n-type shallow S/D-extension dopant is normally $1\times10^{14}$–$1\times10^{15}$ ions/cm$^2$, typically $5\times10^{14}$ ions/cm$^2$. Approximately one fourth of the n-type shallow S/D-extension implant dosage is implanted at each azimuthal-angle value. The n-type shallow S/D-extension dopant normally consists of arsenic or phosphorus. For the typical case in which arsenic constitutes the n-type shallow S/D-extension dopant, the implantation energy is normally 6-15 keV, typically 10 keV.

With photoresist mask 950 still in place, the p-type S/D halo dopant is ion implanted in a significantly angled manner at a moderate dosage through the openings in photoresist 950, through the uncovered sections of surface dielectric layer 948, and into vertically corresponding portions of the underlying monosilicon to define (a) a pair of laterally separated largely identical p precursors 450P and 452P to respective halo pocket portions 450 and 452 of IGFET 108, (b) a pair of laterally separated largely identical p precursors (not shown) to respective halo pocket portions 650 and 652 of IGFET 120, (c) a pair of laterally separated largely identical p precursors (not shown) to respective halo pocket portions 790 and 792 of IGFET 128, and (d) a pair of laterally separated largely identical p precursors (not shown) to respective halo pocket portions 850 and 852 of IGFET 132. See FIG. 33n. Photoresist 950 is removed.

P precursor halo pocket portions 450P and 452P and the p precursors to halo pocket portions 650, 652, 790, 792, 850, and 852 respectively extend deeper than n+ precursor S/D extensions 440EP and 442EP and the n+ precursors to S/D extensions 640E, 642E, 780E, 782E, 840E, and 842E. Due to the angled implantation of the p-type S/D halo dopant, p precursor halo pockets 450P and 452P of IGFET 108 extend laterally partway under its precursor gate electrode 462P respectively beyond its n+ precursor S/D extensions 440EP and 442EP. The p precursors halo pockets of IGFET 120 similarly extend laterally partway under its precursor gate electrode respectively beyond its n+ precursor S/D extensions. The same relationship applies to the p precursors halo pockets, precursor gate electrode, and n+ precursor S/D extensions of each of IGFETs 128 and 132.

Tilt angle $\alpha$ for the angled p-type S/D halo implantation is at least 15°, normally 20-45°, typically 30°. The dosage of the p-type S/D halo dopant is normally $1\times10^{13}$–$5\times10^{13}$ ions/cm$^2$, typically $2.5\times10^{13}$ ions/cm$^2$. The angled p-type S/D halo implantation is a four-quadrant implant with base azimuthal-angle value $\beta_0$ equal to approximately 30°. Approximately one fourth of the p-type S/D halo implant dosage is implanted at each azimuthal-angle value. The p-type S/D halo dopant normally consists of boron in elemental form or in the form of boron difluoride. For the typical case in which elemental boron constitutes the p-type S/D halo dopant, the implantation energy is 50-100 keV, typically 75 keV. The p-type S/D halo implantation can be performed with photoresist 950 prior to the n-type shallow S/D-extension implantation.

A photoresist mask 952 having openings above the location for drain extension 242E of asymmetric n-channel IGFET 100 and above islands 152 and 156 for symmetric n-channel IGFETs 112 and 116 is formed on dielectric layers 946 and 948 as shown in FIG. 33o. Photoresist mask 952 is critically aligned to precursor gate electrode 262P of IGFET 100. Critical photoresist 952 also has openings (not shown) above islands 164, 170, and 174 for symmetric n-channel IGFETs 124, 130, and 134.

The n-type deep S/D-extension dopant is ion implanted in a significantly angled manner at a high dosage through the openings in photoresist 952, through the uncovered sections of surface dielectric 948, and into vertically corresponding portions of the underlying monosilicon to define (a) an n+ precursor 242EP to drain extension 242E of IGFET 100, (b) a pair of laterally separated largely identical n+ precursors 520EP and 522EP to respective S/D extensions 520E and 522E of IGFET 112, (c) a pair of laterally separated largely identical n+ precursors 580EP and 582EP to respective S/D extensions 580E and 582E of IGFET 116, (d) a pair of laterally separated largely identical n+ precursors (not shown) to respective S/D extensions 720E and 722E of IGFET 124, (e) a pair of laterally separated largely identical n+ precursors (not shown) to respective S/D extensions 810E and 812E of IGFET 130, and (f) a pair of laterally separated largely identical n+ precursors (not shown) to respective S/D extensions 870E and 872E of IGFET 134. Photoresist 952 is removed.

Tilt angle $\alpha$ for the angled n-type deep S/D-extension implantation is at least 15°, normally 20-45°, typically 30°. As a result, precursor drain extension 242EP of asymmetric IGFET 100 extends significantly laterally under its precursor gate electrode 262P. Precursor S/D extensions 520EP and 522EP of IGFET 112 similarly extend significantly laterally under its precursor gate electrode 538P. Precursors S/D extensions 580EP and 582EP of IGFET 116 extend significantly laterally under its precursor gate electrode 598P. The same arises with the precursors to S/D extensions 720E and 722E of IGFET 124, the precursors to S/D extensions 810E and 812E of IGFET 130, and the precursors S/D extensions 870E and 872E of IGFET 134 relative to their respective precursor gate electrodes.

The n-type deep S/D-extension implantation is a four-quadrant implant with base azimuthal-angle value $\beta_0$ equal to 20°-25°. The dosage of the n-type deep S/D-extension dopant is normally $2\times10^{13}$–$1\times10^{14}$ ions/cm$^2$, typically $5\times10^{13}$–$6\times10^{13}$ ions/cm$^2$. Approximately one fourth of the n-type deep S/D-extension implant dosage is implanted at each azimuthal-angle value. The n-type deep S/D-extension dopant normally consists of phosphorus or arsenic. For the typical case in which phosphorus constitutes the n-type deep S/D-extension dopant, the implantation energy is normally 15-45 keV, typically 30 keV.

A photoresist mask 954 having openings above the location for source extension 240E of asymmetric n-channel IGFET 100 and above the location for source extension 320E of extended-drain n-channel IGFET 104 is formed on dielectric layers 946 and 948. See FIG. 33p. Photoresist mask 954 is critically aligned to precursor gate electrodes 262P and 346P of IGFETs 100 and 104. The n-type shallow source-extension dopant is ion implanted at a high dosage through the openings in critical photoresist 954, through the uncovered sections of surface dielectric 948, and into vertically corresponding portions of the underlying monosilicon to define (a) an n+ precursor 240EP to source extension 240E of IGFET 100 and (b) an n+ precursor 320EP to source extension 320E of IGFET 104. Tilt angle α is approximately 7° for the n-type shallow source-extension implantation.

The n-type shallow source-extension dopant is normally arsenic which is of greater atomic weight than phosphorus normally used as the n-type deep S/D-extension dopant. Taking note that precursor source extension 240EP and precursor drain extension 242EP of asymmetric IGFET 100 are respectively defined with the n-type shallow source-extension implant and the angled n-type deep S/D-extension implant, the implantation parameters (including the tilt and azimuthal parameters of the n-type deep S/D-extension implant) of the steps used to perform these two n-type implants are chosen such that the maximum concentration of the n-type deep S/D-extension dopant in precursor drain extension 242EP is less than, normally no more than one half of, preferably no more than one fourth of, more preferably no more than one tenth of, even more preferably no more than one twentieth of, the maximum concentration of the n-type shallow source-extension dopant in precursor source extension 240EP. Alternatively stated, the maximum concentration of the n-type shallow source-extension dopant in precursor source extension 240EP is significantly greater than, normally at least two times, preferably at least four times, more preferably at least 10 times, even more preferably at least 20 times, the maximum concentration of the n-type deep S/D-extension dopant in precursor drain extension 242EP.

The maximum concentration of the n-type shallow source-extension dopant in precursor source extension 240EP of asymmetric IGFET 100 occurs normally along largely the same location as in final source extension 240E and thus normally along largely the same location as the maximum concentration of the total n-type dopant in source extension 240E. The maximum concentration of the n-type deep S/D-extension dopant in precursor drain extension 242EP of IGFET 100 similarly occurs normally along largely the same location as in final drain extension 242E and thus normally along largely the same location as the maximum concentration of the total n-type dopant in final drain extension 242E.

The energy and other implantation parameters of the n-type shallow source-extension implant and the n-type deep S/D-extension implant, including the tilt and azimuthal parameters of the angled n-type deep S/D-extension implant, are controlled so that the location of the maximum concentration of the n-type deep S/D-extension dopant in precursor drain extension 242EP occurs significantly deeper than the location of the maximum concentration of the n-type shallow source-extension dopant in precursor source extension 240EP. In particular, the location of the maximum concentration of the n-type deep S/D-extension dopant in precursor drain extension 242EP normally occurs at least 10% deeper, preferably at least 20% deeper, more preferably at least 30% deeper, than the location of the maximum concentration of the n-type shallow source-extension dopant in precursor source extension 240EP.

The range needed for the n-type deep S/D-extension implantation is considerably greater than the range needed for the n-type shallow source-extension implantation because (a) the maximum concentration of the n-type deep S/D-extension dopant in precursor drain extension 242EP is deeper than the maximum concentration of the n-type shallow source-extension dopant in precursor source extension 240EP and (b) the n-type deep S/D-extension implantation is performed at a higher value of tilt angle α than the n-type shallow source-extension implantation. As a result, precursor drain extension 242EP extends deeper, normally at least 20% deeper, preferably at least 30% deeper, more preferably at least 50% deeper, even more preferably at least 100% deeper, than precursor source extension 240EP.

For precursor S/D extensions, such as precursor source extension 240EP and precursor drain extension 242EP, defined by ion implantation through a surface dielectric layer such as surface dielectric 948, let $t_{Sd}$ represent the average thickness of the surface dielectric layer. The average depth of a location in a doped monosilicon region of an IGFET is, as mentioned above, measured from a plane extending generally through the bottom of the IGFET's gate dielectric layer. A thin layer of the monosilicon along the upper surface of the region intended to be precursor source extension 240EP may be removed subsequent to the formation of gate dielectric layer 260 but prior to ion implantation of the n-type shallow source-extension dopant that defines precursor source extension 240EP. Let $\Delta y_{SE}$ represent the average thickness of any monosilicon so removed along the top of a precursor source extension such as precursor source extension 240EP. The range $R_{SE}$ of the semiconductor dopant ion implanted to define the precursor source extension is then given approximately by:

$$R_{SE} = (y_{SEPK} - \Delta y_{SE} + t_{Sd})\sec \alpha_{SE} \quad (6)$$

where $\alpha_{SE}$ is the value of tilt angle α used in ion implanting the semiconductor dopant that defines the precursor source extension. Since tilt angle value $\alpha_{SE}$ (approximately 7°) is quite small, the factor sec $\alpha_{SE}$ in Eq. 6 is very close to 1 for calculating range $R_{SE}$ for the n-type shallow source-extension implant.

A thin layer of the monosilicon along the upper surface of the region intended to be precursor drain extension 242EP may similarly be removed subsequent to the formation of gate dielectric layer 260 but prior to ion implantation of the n-type deep S/D-extension dopant that defines precursor drain extension 242EP. Let $\Delta y_{DE}$ represent the average thickness of any monosilicon so removed along the top of a precursor drain extension such as precursor drain extension 242EP. Accordingly, the range $R_{DE}$ of the semiconductor dopant ion implanted to define the precursor drain extension is given approximately by:

$$R_{DE} = (y_{DEPK} - \Delta y_{DE} + t_{Sd})\sec \alpha_{DE} \quad (7)$$

where $\alpha_{DE}$ is the value of tilt angle α used in ion implanting the semiconductor dopant that defines the precursor drain extension. Because tilt angle value α is at least 15°, normally 20°-45°, typically 30°, for precursor drain extension 242EP, the sec $\alpha_{DE}$ factor in Eq. 7 is significantly greater than 1 for calculating range $R_{DE}$ for the n-type deep S/D-extension implant.

Values for implantation ranges $R_{SE}$ and $R_{DE}$ are determined from Eqs. 6 and 7 by using $y_{SEPK}$ and $y_{DEPK}$ values which meet the above-described percentage differences between average depths $y_{SEPK}$ and $y_{DEPK}$ at the locations of the maximum total n-type dopant concentrations in respective S/D extensions 240E and 242E. The $R_{SE}$ and $R_{DE}$ range values are then respectively used to determine suitable implantation energies for the n-type shallow source-extension dopant and the n-type deep S/D-extension dopant.

With the n-type shallow source-extension implantation being performed nearly perpendicular to a plane extending generally parallel to the upper semiconductor surface (typically at approximately 7° for tilt angle α), precursor source extension 240EP of asymmetric IGFET 100 normally does not extend significantly laterally under precursor gate electrode 262P. Inasmuch as the angled implantation of the n-type deep S/D-extension dopant used to form precursor drain extension 242EP causes it to extend significantly laterally under precursor gate electrode 262P, precursor drain extension 242P extends significantly further laterally under precursor gate electrode 262P than does precursor source extension 240EP. The amount by which precursor gate electrode 262P overlaps precursor drain extension 242EP therefore significantly exceeds the amount by which precursor gate electrode 262P overlaps precursor source extension 240EP. The overlap of precursor gate electrode 262P on precursor drain extension 242EP is normally at least 10% greater, preferably at least 15% greater, more preferably at least 20% greater, than the overlap of precursor gate electrode 262P on precursor source extension 240EP.

The n-type shallow source-extension implantation is a four-quadrant implant with base azimuthal-angle value $\beta_0$ equal to 20°-25°. Subject to meeting the above conditions for the differences between precursor source extension 240EP and precursor drain extension 242EP of IGFET 100, the dosage of the n-type shallow source-extension dopant is normally $1\times10^{14}$–$1\times10^{15}$ ions/cm$^2$, typically $5\times10^{14}$ ions/cm$^2$. Approximately one fourth of the n-type shallow source-extension implant dosage is implanted at each azimuthal-angle value. For the typical case in which arsenic constitutes the n-type shallow source-extension dopant, the implantation energy is normally 3-15 keV, typically 10 keV.

With critical photoresist mask 954 still in place, the p-type source halo dopant is ion implanted in a significantly angled manner at a moderate dosage through the openings in photoresist 954, through the uncovered sections of surface dielectric layer 948, and into vertically corresponding portions of the underlying monosilicon to define (a) a p precursor 250P to halo pocket portion 250 of asymmetric IGFET 100 and (b) a p precursor 326P to halo pocket portion 326 of extended-drain IGFET 104. See FIG. 33q. Photoresist 954 is removed.

P precursor halo pocket portions 250P and 326P respectively extend deeper than n+ precursor source extensions 240EP and 320EP of IGFETs 100 and 104. Due to the angled implantation of the p-type source halo dopant, p precursor halo pocket 250P of IGFET 100 extends laterally partway under its precursor gate electrode 262P and beyond its n+ precursor source extension 240EP. P precursor halo pocket 326P of IGFET 104 similarly extends laterally partway under its precursor gate electrode 346P and beyond its n+ precursor source extension 320EP.

Tilt angle $\alpha$ for the angled p-type source halo implantation is at least 15°, normally 20°-45°, typically 30°. The angled p-type source halo implantation is a four-quadrant implant with base azimuthal-angle value $\beta_0$ equal to approximately 45°. The dosage of the p-type source halo dopant is normally $1\times10^{13}$–$5\times10^{13}$ ions/cm$^2$, typically $2.5\times10^{13}$ ions/cm$^2$. Approximately one fourth of the p-type source halo implant dosage is implanted at each azimuthal-angle value. The p-type source halo dopant normally consists of boron in the form of boron difluoride or in elemental form. For the typical case in which boron in the form of boron difluoride constitutes the p-type source halo dopant, the implantation energy is 50-100 keV, typically 75 keV. The p-type source halo implantation can be performed with photoresist 954 prior to the n-type shallow source-extension implantation.

A photoresist mask 956 having an opening above island 150 for symmetric p-channel IGFET 110 is formed on dielectric layers 946 and 948 as shown in FIG. 33r. Photoresist mask 956 also has an opening (not shown) above island 162 for symmetric p-channel IGFETs 122. The p-type shallow S/D-extension dopant is ion implanted at a high dosage through the openings in photoresist 956, through the uncovered sections of surface dielectric 948, and into vertically corresponding portions of the underlying monosilicon to define (a) a pair of laterally separated largely identical p+ precursors 480EP and 482EP to respective S/D extensions 480E and 482E of IGFET 110 and (b) a pair of laterally separated largely identical n+ precursors (not shown) to respective S/D extensions 680E and 682E of IGFET 122.

The p-type shallow S/D-extension implantation is a four-quadrant implant with tilt angle $\alpha$ equal to approximately 7° and with base azimuthal-angle value $\beta_0$ equal to 20°-25°. The dosage of the p-type shallow S/D-extension dopant is normally $5\times10^{13}$–$5\times10^{14}$ ions/cm$^2$, typically $1\times10^{14}$–$2\times10^{14}$ ions/cm$^2$. Approximately one fourth of the p-type shallow S/D-extension implant dosage is implanted at each azimuthal-angle value. The p-type shallow S/D-extension dopant normally consists of boron in the form of boron difluoride or in elemental form. For the typical case in which boron in the form of boron difluoride constitutes the p-type shallow S/D-extension dopant, the implantation energy is normally 2-10 keV, typically 5 keV.

With photoresist mask 956 still in place, the n-type S/D halo dopant is ion implanted in a significantly angled manner at a moderate dosage through the openings in photoresist 956, through the uncovered sections of surface dielectric layer 948, and into vertically corresponding portions of the underlying monosilicon to define (a) a pair of laterally separated largely identical n precursors 490P and 492P to respective halo pocket portions 490 and 492 of IGFET 110 and (b) a pair of laterally separated largely identical n precursors (not shown) to respective halo pocket portions 690 and 692 of IGFET 122. See FIG. 33s. Photoresist 956 is removed.

N precursor halo pocket portions 490P and 492P and the n precursors to halo pocket portions 690 and 692 respectively extend deeper than p+ precursor S/D extensions 480EP and 482EP and the p+ precursors to S/D extensions 680E and 682E. Due to the angled implantation of the n-type S/D halo dopant, n precursor halo pockets 490P and 492P of IGFET 110 extend laterally partway under its precursor gate electrode 502P respectively beyond its p+ precursor S/D extensions 480EP and 482EP. The p precursors halo pockets of IGFET 122 similarly extend laterally partway under its precursor gate electrode respectively beyond its p+ precursor S/D extensions.

Tilt angle $\alpha$ for the angled n-type S/D halo implantation is at least 15°, normally 20°-45°, typically 30°. The angled n-type S/D halo implantation is a four-quadrant implant with base azimuthal-angle value $\beta_0$ equal to approximately 45°. The dosage of the n-type S/D halo dopant is normally $1\times10^{13}$–$5\times10^{13}$ ions/cm$^2$, typically $2.5\times10^{13}$ ions/cm$^2$. Approximately one fourth of the n-type S/D halo implant dosage is implanted at each azimuthal-angle value. The n-type S/D halo dopant normally consists of arsenic or phosphorus. For the typical case in which arsenic constitutes the n-type S/D halo dopant, the implantation energy is 100-200 keV, typically 150 keV. The n-type S/D halo implant can be performed with photoresist 956 prior to the p-type shallow S/D-extension implant.

A photoresist mask 958 having openings above the location for drain extension 282E of asymmetric p-channel IGFET 102 and above islands 154 and 158 of symmetric p-channel IGFETs 114 and 118 is formed on dielectric layers 946 and 948 as shown in FIG. 33t. Photoresist mask 958 is critically aligned to precursor gate electrode 302P of IGFET 102. Critical photoresist 958 also has an opening (not shown) above island 166 for symmetric p-channel IGFET 126.

The p-type deep S/D-extension dopant is ion implanted in a slightly tilted manner at a high dosage through the openings in photoresist 958, through the uncovered sections of surface dielectric 948, and into vertically corresponding portions of the underlying monosilicon to define (a) a p+ precursor 282EP to drain extension 282E of IGFET 102, (b) a pair of laterally separated largely identical p+ precursors 550EP and 552EP to respective S/D extensions 550E and 552E of IGFET 114, (c) a pair of laterally separated largely identical p+ precursors 610EP and 612EP to respective S/D extensions 610E and 612E of IGFET 118, and (d) a pair of laterally separated largely identical n+ precursors (not shown) to respective S/D extensions 750E and 752E of IGFET 126.

Tilt angle α for the p-type deep S/D-extension implantation is approximately 7°. Due to implantation of the p-type deep S/D-extension dopant at a small value of tilt angle α, precursor drain extension 282EP of asymmetric IGFET 102 now extends slightly laterally under its precursor gate electrode 302P. Precursor S/D extensions 550EP and 552EP of IGFET 114 similarly extend slightly laterally under its precursor gate electrode 568P. Precursors S/D extensions 610EP and 612EP of IGFET 118 extend slightly laterally under its precursor gate electrode 598P. Photoresist 958 is removed.

As described further below, the p-type S/D-extension implantation can alternatively be performed in a significantly tilted manner, including at a tilt sufficient to constitute angled implantation. In light of this, the arrows representing the p-type S/D-extension implant in FIG. 33t are illustrated as slanted to the vertical but not slanted as much as arrows representing an ion implant performed in significantly tilted manner such as the n-type deep S/D-extension implant of FIG. 33o.

The p-type deep S/D-extension implantation is a four-quadrant implant with base azimuthal-angle value $\beta_0$ equal to approximately 20°-25°. The dosage of the p-type deep S/D-extension dopant is normally $2\times10^{13}$–$2\times10^{14}$ ions/cm$^2$, typically $8\times10^{13}$ ions/cm$^2$. Approximately one fourth of the p-type deep S/D-extension implant dosage is implanted at each azimuthal-angle value. The p-type deep S/D-extension dopant normally consists of boron in the form of boron difluoride or in elemental form. For the typical case in which boron in the form of boron difluoride constitutes the p-type deep S/D-extension dopant, the implantation energy is normally 5-20 keV, typically 10 keV.

A photoresist mask 960 having openings above the location for source extension 280E of asymmetric p-channel IGFET 102 and above the location for source extension 360E of extended-drain p-channel IGFET 106 is formed on dielectric layers 946 and 948. See FIG. 33u. Photoresist mask 960 is critically aligned to precursor gate electrodes 302P and 386P of IGFETs 102 and 106. The p-type shallow source-extension dopant is ion implanted at a high dosage through the openings in critical photoresist 960, through the uncovered sections of surface dielectric 948, and into vertically corresponding portions of the underlying monosilicon to define (a) a p+ precursor 280EP to source extension 280E of IGFET 102 and (b) a p+ precursor 360EP to source extension 360E of IGFET 106.

The p-type shallow source-extension implantation is normally performed with the same p-type dopant, boron, as the slightly tilted p-type deep S/D-extension implantation. These two p-type implantations are also normally performed with the same p-type dopant-containing particle species, either boron difluoride or elemental boron, at the same particle ionization charge state.

The p-type shallow source-extension implantation is a four-quadrant implant with tilt angle α equal to approximately 7° and with base azimuthal-angle value $\beta_0$ equal to 20°-25°. Because the p-type shallow extension implant is thus performed nearly perpendicular to a plane extending generally parallel to the upper semiconductor surface, precursor source extension 280EP of asymmetric p-channel IGFET 102 only extends extend slightly laterally under precursor gate electrode 302P.

The dosage of the p-type shallow source-extension dopant is normally $2\times10^{13}$–$2\times10^{14}$ ions/cm$^2$, typically $8\times10^{13}$ ions/cm$^2$. Approximately one fourth of the p-type shallow source-extension implant dosage is implanted at each azimuthal-angle value. For the typical case in which boron in the form of boron difluoride constitutes the p-type shallow source-extension dopant, the implantation energy is normally 5-20 keV, typically 10 keV.

The p-type deep S/D-extension implantation is also a four-quadrant implant with tilt angle α equal to approximately 7° and with base azimuthal-angle value $\beta_0$ equal to 20°-25°. Examination of the foregoing implantation dosage and energy information indicates that the p-type shallow source-extension implantation and the p-type deep S/D-extension implantation employ the same typical values of implantation dosage and energy. Since these two p-type implantations are normally performed with the same atomic species of p-type semiconductor dopant and with the same p-type dopant-containing particle species at the same particle ionization charge state, the two p-type implantations are typically performed at the same conditions. Consequently, depth $y_{DEPK}$ of the maximum concentration of the p-type deep S/D-extension dopant in precursor drain extension 282EP of asymmetric p-channel IGFET 102 is typically the same as depth $y_{SEPK}$ of the maximum concentration of the p-type shallow source-extension dopant in precursor source extension 280EP.

The p-type implanted deep S/D-extension dopant and the p-type implanted shallow source-extension dopant undergo thermal diffusion during later steps performed at elevated temperature. Thermal diffusion of an ion-implanted semiconductor dopant causes it to spread out but normally does not significantly vertically affect the location of its maximum concentration. The maximum concentration of the p-type shallow source-extension dopant in precursor source extension 280EP of p-channel IGFET 102 thus normally vertically occurs along largely the same location as in final source extension 280E and thus normally vertically occurs along largely the same location as the maximum concentration of the total p-type dopant in source extension 280E. The maximum concentration of the p-type deep S/D-extension dopant in precursor drain extension 282EP of IGFET 102 similarly normally vertically occurs along largely the same location as in final drain extension 282E and thus normally vertically along largely the same location as the maximum concentration of the total p-type dopant in final drain extension 282E. For these reasons, depth $y_{DEPK}$ of the maximum concentration of the p-type deep S/D-extension dopant in final drain extension 282E of IGFET 102 is typically the same as depth $y_{SEPK}$ of the maximum concentration of the p-type shallow source-extension dopant in final source extension 280E.

With critical photoresist mask 960 still in place, the n-type source halo dopant is ion implanted in a significantly angled manner at a moderate dosage through the openings in photoresist 960, through the uncovered sections of surface dielectric layer 948, and into vertically corresponding portions of the underlying monosilicon to define (a) an n precursor 290P to halo pocket portion 290 of asymmetric IGFET 102 and (b) an n precursor 366P to halo pocket portion 366 of extended-drain IGFET 106. See FIG. 33v. Photoresist 960 is removed.

N precursor halo pocket portions 290P and 366P respectively extend deeper than p+ precursor source extensions 280EP and 360EP of IGFETs 102 and 106. Due to the angled implantation of the n-type source halo dopant, n precursor halo pocket 290P of IGFET 102 extends laterally partway under its precursor gate electrode 302P and beyond its p+ precursor source extension 280EP. P precursor halo pocket 366P of IGFET 106 similarly extends laterally partway under its precursor gate electrode 386P and beyond its p+ precursor source extension 360EP.

Tilt angle $\alpha_{SH}$ for the angled n-type source halo implantation is at least 15°, normally 20°-45°, typically 30°. The angled n-type source halo implantation is a four-quadrant implant with base azimuthal-angle value $\beta_0$ equal to approximately 45°. The dosage of the n-type source halo dopant is normally $2 \times 10^{13}$–$8 \times 10^{14}$ ions/cm$^2$, typically approximately $4 \times 10^{13}$ ions/cm$^2$. Approximately one fourth of the n-type source halo implant dosage is implanted at each azimuthal-angle value. The n-type source halo dopant normally consists of arsenic or phosphorus. For the typical case in which arsenic constitutes the n-type source halo dopant, the implantation energy is 75-150 keV, typically 125 keV. The n-type source halo implant can be performed with photoresist 960 prior to the p-type shallow source-extension implant.

Photoresist masks 950, 952, 954, 956, 958, and 960 used for defining lateral S/D extensions and halo pocket portions can be employed in any order. If none of the lateral S/D extensions or halo pocket portions defined by a particular one of photoresist masks 950, 952, 954, 956, 958, and 960 is present in any IGFET made according to an implementation of the semiconductor fabrication platform of FIG. 33, that mask and the associated implantation operation(s) can be deleted from the platform implementation.

An additional RTA is performed on the resultant semiconductor structure to repair lattice damage caused by the implanted p-type and n-type S/D-extension and halo pocket dopants and to place the atoms of the S/D-extension and halo pocket dopants in energetically more stable states. The additional RTA is performed in a non-reactive environment at 900-1050° C., typically 950-1000° C., for 10-50 s, typically 25 s.

The additional RTA causes the S/D-extension and halo pocket dopants to diffuse vertically and laterally. The well, APT, and threshold-adjust dopants, especially the empty main well dopants, diffuse further vertically and laterally during the additional RTA. The remainder of FIG. 33 only indicates the upward diffusion of the empty main well dopants. If precursor empty main well regions 180P, 182P, 184AP, 184BP, 186AP, 186BP, 192P and 194P and the precursors to empty main well regions 204 and 206 did not reach the upper semiconductor surface by the end of the thermal growth of dielectric layers 946 and 948, precursor empty main well regions 180P, 182P, 184AP, 184BP, 186AP, 186BP, 192P and 194P and the precursors to empty main well regions 204 and 206 normally reach the upper semiconductor surface by the end of the additional RTA. This situation is indicated in the remainder of FIG. 33.

Isolated p– epitaxial-layer portions 136P1-136P7 and the other isolated portions of p-epitaxial layer 136 shrink to zero and do not appear in the remainder of FIG. 33. P– epitaxial layer 136P substantially becomes p– substrate region 136. For extended-drain n-channel IGFET 104, surface-adjoining portion 136A of p– substrate region 136 laterally separates p precursor empty main well region 184AP and n precursor empty main well region 184BP. For extended-drain p-channel IGFET 106, surface-adjoining portion 136B of p– substrate region 136 is situated between n precursor empty main well region 186AP, p precursor empty main well region 186BP, and deep n well 212.

N5. Formation of Gate Sidewall Spacers and Main Portions of Source/Drain Zones

Gate sidewall spacers 264, 266, 304, 306, 348, 350, 388, 390, 464, 466, 504, 506, 540, 542, 570, 572, 600, 602, 630, and 632 are formed along the transverse sidewalls of precursor polysilicon gate electrodes 262P, 302P, 346P, 386P, 462P, 502P, 538P, 568P, 598P, and 628P as shown in FIG. 33w. Gate sidewall spacers 664, 666, 704, 706, 740, 742, 770, 772, 800, 802, 830, 832, 860, 862, 890, and 892 are simultaneously formed along the transverse sidewalls of the precursors to polysilicon gate electrodes 662, 702, 738, 768, 798, 828, 858, and 888.

The gate sidewall spacers of the illustrated IGFETs are preferably formed to be of curved triangular shape according to the procedure described in U.S. patent application Ser. No. 12/382,977, cited above. In brief, a dielectric liner layer (not shown) of tetraethyl orthosilicate is deposited on dielectric layers 946 and 948. Further dielectric material is deposited on the liner layer. The portions of the further dielectric material not intended to constitute the gate sidewall spacers are then removed, primarily by anisotropic etching conducted generally perpendicular to the upper semiconductor surface. Sealing dielectric layer 962 in FIG. 33w indicates the resulting combination of sealing layer 946 and the overlying material of the liner layer. Surface dielectric layer 964 indicates the resulting combination of surface layer 948 and the overlying material of the liner layer.

Sidewall spacers (not shown) are simultaneously provided along any portion of the gate-electrode polysilicon layer designated to be a polysilicon resistor.

A photoresist mask 970 having openings above islands 140, 144A, 144B, 148, 152, and 156 for n-channel IGFETs 100, 104, 108, 112, and 116 is formed on dielectric layers 962 and 964 and the gate sidewall spacers. See FIG. 33x. Photoresist mask 970 also has openings (not shown) above islands 160, 164, 168, 170, 172, and 174 for n-channel IGFETs 120, 124, 128, 130, 132, and 134.

The n-type main S/D dopant is ion implanted at a very high dosage through the openings in photoresist 970, through the uncovered sections of surface dielectric layer 964, and into vertically corresponding portions of the underlying monosilicon to define (a) n++ main source portion 240M and n++ main drain portion 242M of asymmetric n-channel IGFET 100, (b) n++ main source portion 320M and n++ drain contact portion 334 of extended-drain n-channel IGFET 104, and (c) n++ main S/D portions 440M, 442M, 520M, 522M, 580M, 582M, 640M, 642M, 720M, 722M, 780M, 782M, 810M, 812M, 840M, 842M, 870M, and 872M of the symmetric n-channel IGFETs. The n-type main S/D dopant also enters the precursor gate electrodes for the illustrated n-channel IGFETs, thereby converting those precursor electrodes respectively into n++ gate electrodes 262, 346, 462, 538, 598, 662, 738, 798, 828, 858, and 888. Photoresist 970 is removed.

The dosage of the n-type main S/D dopant is normally $2 \times 10^{15}$–$2 \times 10^{16}$ ions/cm$^2$, typically $7 \times 10^{15}$ ions/cm$^2$. The n-type main S/D dopant normally consists of arsenic or phosphorus. For the typical case in which arsenic constitutes the n-type main S/D dopant, the implantation energy is normally 50-100 keV, typically 60-70 keV.

An initial spike anneal is normally performed on the resultant semiconductor structure at this point to repair lattice damage caused by the implanted n-type main S/D dopant and to place the atoms of the n-type main S/D dopant in energetically more stable states. The spike anneal is done by raising the temperature of the semiconductor structure to 1000-1200° C., typically 1100° C. Significant diffusion of the implanted p-type and n-type dopants normally occurs during the initial spike anneal because the spike-anneal temperature is quite high. The spike anneal also causes the n-type main S/D dopant in the gate electrodes for the illustrated n-channel IGFETs to spread out.

With the initial spike anneal completed, the portions of precursor regions 240EP, 242EP, and 250P outside n++ main S/D portions 240M and 242M of asymmetric n-channel IGFET 100 now respectively substantially constitute its n+ source extension 240E, its n+ drain extension 242E, and its p source-side halo pocket portion 250. The portion of p precursor empty main well region 180P, now p-type empty-well body material 180, outside source 240, drain 242, and halo pocket portion 250 substantially constitutes p-type empty-well main body-material portion 254 of IGFET 100. Precursor dotted line 256P is now substantially dotted line 256 which demarcates generally where the p-type doping in main body-material portion 254 drops from moderate to light in moving upward.

The portions of precursor regions 320EP and 326P outside n++ main source portion 320M of extended-drain n-channel IGFET 104 respectively substantially constitute its n+ source extension 320E and its p source-side halo pocket portion 326. The portion of p precursor empty main well region 184AP, now p-type empty-well body material 184A, outside halo pocket portion 326 substantially constitutes p body-material portion 328 of IGFET 104. The portion of n precursor empty main well region 184BP, now drain 184B, outside n++ external drain contact portion 334 substantially constitutes n empty-well drain portion 336 of IGFET 104. Precursor dotted lines 332P and 340P are now substantially respective dotted lines 332 and 340 which respectively demarcate generally where the net dopings in body-material portion 328 and drain portion 336 drop from moderate to light in moving upward.

The portions of precursor regions 440EP, 442EP, 450P, and 452P outside n++ main S/D portions 440M and 442M of symmetric n-channel IGFET 108 respectively substantially constitute its n+ S/D extensions 440E and 442E and its halo pocket portions 450 and 452. The portions of p precursor body-material portions 456P and 458P outside S/D zones 440 and 442 and halo pockets 450 and 452 substantially constitute p body-material portions 456 and 458 of IGFET 108. The portion of p precursor filled main well region 188P outside S/D zones 440 and 442 substantially constitutes p-type filled main well region 188 formed with p body-material portions 454, 456, and 458.

The portions of precursor regions 520EP and 522EP outside n++ main S/D portions 520M and 522M of symmetric n-channel IGFET 112 respectively substantially constitute its n+ S/D extensions 520E and 522E. The portion of p precursor empty main well region 192P outside S/D zones 520 and 522 substantially constitutes p-type body-material empty main well 192 of IGFET 112. Precursor dotted line 530P is now substantially dotted line 530 which demarcates the location where the p-type doping in body-material empty main well 192 drops from moderate to light in moving upward.

The portions of precursor regions 580EP and 582EP outside n++ main S/D portions 580M and 582M of symmetric n-channel IGFET 116 respectively substantially constitute its n+ S/D extensions 580E and 582E. The portions of p precursor body-material portions 592P and 594P outside S/D zones 580 and 582 respectively substantially constitute p body-material portions 592 and 594 of IGFET 116. The portion of p precursor filled main well region 196P outside S/D zones 580 and 582 substantially constitutes p-type filled main well region 196 formed with p body-material portions 590, 592, and 594.

The portions of the precursors to regions 640E, 642E, 650, and 652 outside n++ main S/D portions 640M and 642M of symmetric n-channel IGFET 120 respectively substantially constitute its n+ S/D extensions 640E and 642E and its p halo pocket portions 650 and 652. The portion of the p precursor to further body-material portion 656P outside S/D zones 640 and 642 and halo pockets 650 and 652 substantially constitutes p further body-material portion 656 of IGFET 126. The portion of the p precursor to filled main well region 200 outside S/D zones 640 and 642 substantially constitutes p-type filled main well region 200 formed with p body-material portions 654 and 656.

The portions of the precursors to regions 720E and 722E outside n++ main S/D portions 720M and 722M of symmetric n-channel IGFET 124 respectively substantially constitute its n+ S/D extensions 720E and 722E. The portion of the p precursor to empty main well region 204 outside S/D zones 720 and 722 substantially constitutes p-type body-material empty main well 204 of IGFET 124.

Turning to symmetric native n-channel IGFETs 128, 130, 132, and 134, the portions of the precursors to regions 780E, 782E, 790, and 792 outside n++ main S/D portions 780M and 782M of IGFET 128 respectively substantially constitute its n+S/D extensions 780E and 782E and its p halo pocket portions 790 and 792. The portions of the precursors to regions 810E and 812E outside n++ main S/D portions 810M and 812M of IGFET 130 respectively substantially constitute its n+ S/D extensions 810E and 812E. The portions of the precursors to regions 840E, 842E, 850, and 852 outside n++ main S/D portions 840M and 842M of IGFET 132 respectively substantially constitute its n+ S/D extensions 840E and 842E and its p halo pocket portions 850 and 852. The portions of the precursors to regions 870E and 872E outside n++ main S/D portions 870M and 872M of IGFET 134 respectively substantially constitute its n+ S/D extensions 870E and 872E.

The n-type shallow S/D-extension implantation for precursor S/D extensions 440EP and 442EP of n-channel IGFET 108, the precursors to S/D extensions 640E and 642E of n-channel IGFET 120, the precursors to S/D extensions 780E and 782E of n-channel IGFET 128, and the precursors to S/D extensions 840E and 842E of n-channel IGFET 132 was performed at a considerably greater dosage than the n-type deep S/D-extension implantation for precursor drain extension 242EP of n-channel IGFET 100, precursor S/D extensions 520EP and 522EP of n-channel IGFET 112, precursors S/D extensions 580EP and 582EP of n-channel IGFET 116, the precursors to S/D extensions 720E and 722E of n-channel IGFET 124, the precursors to S/D extensions 810E and 812E of n-channel IGFET 130, and the precursors to S/D extensions 870E and 872E of n-channel IGFET 134. In particular, the dosage of $1 \times 10^{14}$–$1 \times 10^{15}$ ions/cm$^2$, typically $5 \times 10^{14}$ ions/cm$^2$, for the n-type shallow S/D-extension implantation is normally in the vicinity of 10 times the dosage of $2 \times 10^{13}$–$1 \times 10^{14}$ ions/cm$^2$, typically $5 \times 10^{13}$–$6 \times 10^{13}$ ions/cm$^2$, for the n-type deep S/D-extension implantation. As a result, drain extension 242E of IGFET 100, S/D extensions 520E and 522E of IGFET 112, S/D extensions 580E and 582E of IGFET 116, S/D extensions 720E and 722E of IGFET 124, S/D extensions 810E and 812E of IGFET 130, and S/D extensions 870E and 872E of IGFET 134 are all more lightly doped than S/D extensions 440E and 442E of IGFET 108, S/D extensions 640E and 642E of IGFET 120, S/D extensions 780E and 782E of IGFET 128, and S/D extensions 840E and 842E of IGFET 132.

The n-type shallow source-extension implantation for precursor source extension 240EP of n-channel IGFET 100 and precursor source extension 320EP of n-channel IGFET 104 was performed at a considerably greater dosage than the n-type deep S/D-extension implantation for precursor drain extension 242EP of IGFET 100, precursor S/D extensions 520EP and 522EP of n-channel IGFET 112, precursors 580EP and 582EP to respective S/D extensions 580E and 582E of IGFET 116, the precursors to S/D extensions 720E and 722E of n-channel IGFET 124, the precursors to S/D extensions 810E and 812E of n-channel IGFET 130, and the precursors to S/D extensions 870E and 872E of n-channel IGFET 134. As with the n-type shallow S/D-extension implantation, the dosage of $1\times10^{14}$–$1\times10^{15}$ ions/cm$^2$, typically $5\times10^{14}$ ions/cm$^2$, for the n-type shallow source-extension implantation is normally in the vicinity of 10 times the dosage of $2\times10^{13}$–$1\times10^{14}$ ions/cm$^2$, typically $5\times10^{13}$–$6\times10^{13}$ ions/cm$^2$, for the n-type deep S/D-extension implantation. Consequently, source extension 240E of IGFET 100 and source extension 320E of IGFET 104 are also more lightly doped than S/D extensions 440E and 442E of IGFET 108, S/D extensions 640E and 642E of IGFET 120, S/D extensions 780E and 782E of IGFET 128, and S/D extensions 840E and 842E of IGFET 132.

As described further below, the source-body and drain-body junctions of the illustrated n-channel IGFETs can be vertically graded to reduce the junction capacitances by implanting n-type semiconductor dopant, referred to here as the n-type junction-grading dopant, through the openings in photoresist mask 970 while it is in place. Either the n-type main or junction-grading S/D implantation can be performed first. In either case, the initial spike anneal also repairs lattice damage caused by the implanted n-type junction-grading S/D dopant and places the atoms of the n-type junction-grading S/D dopant in energetically more stable states.

A photoresist mask 972 having openings above islands 142, 146A, 146B, 150, 154, and 158 for p-channel IGFETs 102, 106, 110, 114, and 118 is formed on dielectric layers 962 and 964 and the gate sidewall spacers as indicated in FIG. 33y. Photoresist mask 972 also has openings (not shown) above islands 162 and 166 for p-channel IGFETs 122 and 126.

The p-type main S/D dopant is ion implanted at a very high dosage through the openings in photoresist 972, through the uncovered sections of surface dielectric layer 964, and into vertically corresponding portions of the underlying monosilicon to define (a) p++ main source portion 280M and p++ main drain portion 282M of asymmetric p-channel IGFET 102, (b) p++ main source portion 360M and p++ drain contact portion 374 of extended-drain p-channel IGFET 106, and (c) p++ main S/D portions 480M, 482M, 550M, 552M, 610M, 612M, 680M, 682M, 750M, and 752M of the illustrated symmetric p-channel IGFETs. The p-type main S/D dopant also enters the precursor gate electrodes for the p-channel IGFETs, thereby converting those precursor electrodes respectively into p++ gate electrodes 302, 386, 502, 568, 628, 702, and 768. Photoresist 972 is removed.

The dosage of the p-type main S/D dopant is normally $2\times10^{15}$–$2\times10^{16}$ ions/cm$^2$, typically approximately $7\times10^{15}$ ions/cm$^2$. The p-type main S/D dopant normally consists of boron in elemental form or in the form of boron difluoride. For the typical case in which the p-type main S/D dopant is boron, the implantation energy is normally 2-10 keV, typically 5 keV.

Any portion of the gate-electrode polysilicon layer designated to be a polysilicon resistor is typically doped with n-type or p-type semiconductor dopant during one or more of the above-mentioned doping steps performed subsequent to deposition of the gate-electrode polysilicon layer. For instance, a polysilicon resistor portion can be doped with the n-type main S/D dopant or the p-type main S/D dopant.

A further spike anneal is now performed on the resultant semiconductor structure to repair lattice damage caused by the implanted p-type main S/D dopant and to place the atoms of the p-type main S/D dopant in energetically more stable states. The further spike anneal is done by raising the temperature of the semiconductor structure to 900-1200° C., typically 1100° C. Significant diffusion of the implanted p-type and n-type dopants normally occurs during the further spike anneal because the further spike-anneal temperature is quite high. The further spike anneal also causes the p-type main S/D dopant in the gate electrodes of the illustrated p-channel IGFETs to spread out.

The atoms of the element (arsenic or phosphorus) used as the n-type main S/D dopant are larger than the atoms of boron, the element used as the p-type main S/D dopant. Consequently, the n-type main S/D implant is likely to cause more lattice damage than the boron p-type main S/D implant. To the extent that the initial spike anneal performed directly after the n-type main S/D implantation does not repair all the lattice damage caused by the n-type main S/D implant, the further spike anneal repairs the reminder of the lattice damage caused by the n-type main S/D implant. Additionally, boron diffuses faster, and thus farther for a given amount of elevated-temperature diffusion impetus, than either element used as the n-type main S/D dopant. By performing the p-type main S/D implant and associated spike anneal after performing the n-type main S/D implant and associated spike anneal, undesired diffusion of the p-type main S/D dopant is avoided without incurring significant undesired diffusion of the n-type main S/D dopant.

Upon completion of the further spike anneal, the portions of precursor regions 280EP, 282EP, and 290P outside p++ main S/D portions 280M and 282M of asymmetric p-channel IGFET 102 respectively constitute its p+ source extension 280E, its p+ drain extension 282E, and its n source-side halo pocket portion 290. The portion of n precursor empty main well region 182P, now n-type empty-well body material 182, outside source 280, drain 282, and halo pocket portion 290 constitutes n-type empty-well main body-material portion 294 of IGFET 102. Precursor dotted line 296P is now dotted line 296 which demarcates the where the p-type doping in main body-material portion 294 drops from moderate to light in moving upward.

The portions of precursor regions 360EP and 366P outside p++ main source portion 360M of extended-drain p-channel IGFET 106 respectively constitute its p+ source extension 360E and its n source-side halo pocket portion 366. The portion of n precursor empty main well region 186AP, now n-type empty-well body material 186A, outside halo pocket portion 366 constitutes n body-material portion 368 of IGFET 106. The portion of p precursor empty main well region 186BP, now empty well region 186B, outside p++ external drain contact portion 374 constitutes n empty-well drain portion 376 of IGFET 106. Precursor dotted lines 372P and 380P are now respective dotted lines 372 and 380 which respectively demarcate where the net dopings in body-material portion 368 and drain portion 376 drop from moderate to light in moving upward.

The portions of precursor regions 480EP, 482EP, 490E, and 492E outside p++ main S/D portions 480M and 482M of symmetric p-channel IGFET 110 respectively constitute its n+ S/D extensions 480E and 482E and its halo pocket portions 490 and 492. The portions of n precursor body-material portions 496P and 498P outside S/D zones 480 and 482 and halo pockets 490 and 492 constitute p body-material portions 496 and 498 of IGFET 110. The portion of n precursor filled main well region 190P outside S/D zones 480 and 482 constitutes n-type filled main well region 190 formed with n body-material portions 494, 496, and 498.

The portions of precursor regions 550EP and 552EP outside p++ main S/D portions 550M and 552M of symmetric p-channel IGFET 114 respectively constitute its n+ S/D extensions 550E and 552E. The portion of n precursor empty main well region 194P outside S/D zones 550 and 552 constitutes n-type body-material empty main well 194 of IGFET 114. Precursor dotted line 560P is now dotted line 560 which demarcates the location where the n-type doping in body-material empty main well 194 drops from moderate to light in moving upward.

The portions of precursor regions 610EP and 612EP outside p++ main S/D portions 610M and 612M of symmetric p-channel IGFET 118 respectively constitute its p+ S/D extensions 610E and 612E. The portions of n precursor body-material portions 622P and 624P outside S/D zones 610 and 612 respectively constitute n body-material portions 622 and 624 of IGFET 118. The portion of p precursor filled main well region 198P outside S/D zones 610 and 612 constitutes n-type filled main well region 198 formed with p body-material portions 620, 622, and 624.

The portions of the precursors to regions 680E, 682E, 690, and 692 outside p++ main S/D portions 680M and 682M of symmetric p-channel IGFET 122 respectively constitute its p+ S/D extensions 680E and 682E and its n halo pocket portions 690 and 692. The portion of the n precursor to further body-material portion 696 outside S/D zones 680 and 682 and halo pockets 690 and 692 constitutes n further body-material portion 696 of IGFET 122. The portion of the n precursor to filled main well region 202 outside S/D zones 680 and 682 constitutes n-type filled main well region 202 formed with n body-material portions 694 and 696.

The portions of the precursors to regions 750E and 752E outside p++ main S/D portions 750M and 752M of symmetric p-channel IGFET 126 respectively substantially constitute its p+ S/D extensions 750E and 752E. The portion of the n precursor to empty main well region 206 outside S/D zones 750 and 752 constitutes n-type body-material empty main well 206 of IGFET 126.

The p-type shallow S/D-extension implantation for precursor S/D extensions 480EP and 482EP of p-channel IGFET 110 and precursor S/D extensions 680EP and 682EP of p-channel IGFET 122 was performed at a greater dosage than the p-type deep S/D-extension implantation for precursor drain extension 282EP of p-channel IGFET 102, precursor S/D extensions 550EP and 552EP of p-channel IGFET 114, precursor S/D extensions 610EP and 612EP of p-channel IGFET 118, and precursor S/D extensions 750EP and 752EP of p-channel IGFET 126. More specifically, the dosage of $5\times10^{13}$–$5\times10^{14}$ ions/cm$^2$, typically $1\times10^{14-2\times10^{14}}$ ions/cm$^2$, for the p-type shallow S/D-extension implantation is normally in the vicinity of twice the dosage of $2\times10^{13}$–$2\times10^{14}$ ions/cm$^2$, typically $8\times10^{13}$ ions/cm$^2$, for the p-type deep S/D-extension implantation. Drain extension 282E of IGFET 102, S/D extensions 550E and 552E of IGFET 114, S/D extensions 610E and 612E of IGFET 118, and S/D extensions 750E and 752E of IGFET 126 are therefore all more lightly doped than S/D extensions 480E and 482E of IGFET 110 and S/D extensions 680E and 682E of IGFET 122.

The p-type shallow source-extension implantation for precursor source extension 280EP of p-channel IGFET 102 and precursor source extension 360EP of p-channel IGFET 106 was performed at approximately the same dosage as the p-type deep S/D-extension implantation for precursor drain extension 282EP of IGFET 102, precursor S/D extensions 550EP and 552EP of p-channel IGFET 114, precursor S/D extensions 610EP and 612EP of p-channel IGFET 118, and precursor S/D extensions 750EP and 752EP of p-channel IGFET 126. In particular, the dosage of $2\times10^{13}$–$2\times10^{14}$ ions/cm$^2$, typically $8\times10^{13}$ ions/cm$^2$, for the p-type shallow S/D-extension implantation is the same as the dosage of $2\times10^{13}$–$2\times10^{14}$ ions/cm$^2$, typically $8\times10^{13}$ ions/cm$^2$, for the p-type deep S/D-extension implantation. However, source-side halo pockets portions 250 and 326 of IGFETs 102 and 106 slow down diffusion of the p-type shallow source-extension dopant whereas IGFETs 114, 118, and 126 and the drain side of IGFET 102 lack halo pocket portions for slowing down diffusion of the p-type shallow source-extension dopant. Since boron is both the p-type shallow source-extension dopant and the p-type deep S/D-extension dopant, the net result is that drain extension 282E of IGFET 102, S/D extensions 550E and 552E of IGFET 114, S/D extensions 610E and 612E of IGFET 118, and S/D extensions 750E and 752E of IGFET 126 are all more lightly doped than source extension 280E of IGFET 102 and source extension 360E of IGFET 106.

As described below, the source-body and drain-body junctions of the illustrated p-channel IGFETs can be vertically graded to reduce the junction capacitances by implanting p-type semiconductor dopant, referred to here as the p-type junction-grading dopant, through the openings in photoresist mask 972 while it is in place. Either the p-type main or junction-grading S/D implantation can be performed first. In either case, the further spike anneal also repairs lattice damage caused by the implanted p-type junction-grading S/D dopant and places the atoms of the p-type junction-grading S/D dopant in energetically more stable states.

N6. Final Processing

The exposed parts of dielectric layers 962 and 964 are removed. A capping layer (not shown) of dielectric material, typically silicon oxide, is formed on top of the structure. A final anneal, typically an RTA, is performed on the semiconductor structure to obtain the desired final dopant distributions and repair any residual lattice damage.

Using (as necessary) a suitable photoresist mask (not shown), the capping material is removed from selected areas of the structure. In particular, the capping material is removed from the areas above the islands for the illustrated IGFETs to expose their gate electrodes and to expose main source portions 240M and 280M of asymmetric IGFETs 100 and 102, main drain portions 242M and 282M of IGFETs 100 and 102, main source portions 320M and 360M of extended-drain IGFETs 104 and 106, drain contact portions 334 and 374 of IGFETs 104 and 106, and the main S/D portions of all the illustrated symmetric IGFETs. The capping material is typically retained over most of any portion of the gate-electrode polysilicon layer designated to be a polysilicon resistor so as to prevent metal silicide from being formed along the so-capped part of the polysilicon portion during the next operation. In the course of removing the capping material, the gate sidewall spacers are preferably converted to L shapes as described in U.S. patent application Ser. No. 12/382,977, cited above.

The metal silicide layers of the illustrated IGFETs are respectively formed along the upper surfaces of the underlying polysilicon and monosilicon regions. This typically entails depositing a thin layer of suitable metal, typically cobalt, on the upper surface of the structure and performing a low-temperature step to react the metal with underlying silicon. The unreacted metal is removed. A second low-temperature step is performed to complete the reaction of the metal with the underlying silicon and thereby form the metal silicide layers of the illustrated IGFETs.

The metal silicide formation completes the basic fabrication of asymmetric IGFETs 100 and 102, extended-drain IGFETs 104 and 106, and the illustrated symmetric IGFETs. The resultant CIGFET structure appears as shown in FIG. 11. The CIGFET structure is subsequently provided with further electrically conductive material (nor shown), typically metal, which contacts the metal silicide layers to complete the electrical contacts for the illustrated IGFETs.

N7. Significantly Tilted Implantation of P-Type Deep Source/Drain-Extension Dopant The p-type deep S/D-extension ion implantation at the stage of FIG. 33t can, as mentioned above, alternatively be performed in a significantly tilted manner for adjusting the shape of precursor drain extension 282EP of asymmetric p-channel IGFET 102. Drain extension 282EP then normally extends significantly laterally under precursor gate electrode 302P. The shapes of precursor S/D extensions 550EP and 552EP of symmetric p-channel IGFET 114, precursor S/D extensions 610EP and 612EP of symmetric p-channel IGFET 118, and the precursors to S/D extensions 750E and 752E of symmetric p-channel IGFET 126 are then adjusted in the same way.

The tilt in this alternative can be sufficiently great that the p-type deep S/D-extension implantation is an angled implantation. Tilt angle α for the angled p-type S/D-extension implantation is then at least 15°, normally 20°-45°. The p-type deep S/D-extension implantation can also be performed at significantly different implantation dosage and/or energy than the p-type shallow source-extension implantation.

Taking note that precursor source extension 280EP and precursor drain extension 282EP of asymmetric IGFET 102 are respectively defined with the p-type shallow source-extension implant and the p-type deep S/D-extension implant, the implantation parameters (including the tilt and azimuthal parameters of the p-type deep S/D implant) of the steps used to perform these two p-type implants can alternatively be chosen such that the maximum concentration of the p-type deep S/D-extension dopant in precursor drain extension 282EP is less than, normally no more than one half of, preferably no more than one fourth of, more preferably no more than one tenth of, even more preferably no more than one twentieth of, the maximum concentration of the p-type shallow source-extension dopant in precursor source extension 280EP. In other words, the maximum concentration of the p-type shallow source-extension dopant in precursor source extension 280EP is significantly greater than, normally at least two times, preferably at least four times, more preferably at least 10 times, even more preferably at least 20 times, the maximum concentration of the p-type deep S/D-extension dopant in precursor drain extension 282E.

The energy and other implantation parameters of the p-type shallow source-extension implant and the p-type deep S/D-extension implant, including the tilt and azimuthal parameters of the p-type deep S/D-extension implantation, can be controlled in this alternative so that the location of the maximum concentration of the p-type deep S/D-extension dopant in precursor drain extension 282EP occurs significantly deeper than the location of the maximum concentration of the p-type shallow source-extension dopant in precursor source extension 280EP. More specifically, the location of the maximum concentration of the p-type deep S/D-extension dopant in precursor drain extension 282EP normally occurs at least 10% deeper, preferably at least 20% deeper, more preferably at least 30% deeper, even more preferably at least 50% deeper, than the location of the maximum concentration of the p-type shallow source-extension dopant in precursor source extension 280EP. Precursor drain extension 282EP then extends deeper, normally at least 20% deeper, preferably at least 30% deeper, more preferably at least 50% deeper, even more preferably at least 100% deeper, than precursor source extension 280EP.

Values for implantation ranges $R_{SE}$ and $R_{DE}$ that respectively arise during the p-type shallow source-extension implant and the p-type deep S/D-extension implant are determined from Eqs. 6 and 7 by using $y_{SEPK}$ and $y_{DEPK}$ values which meet the above-described percentage differences between average depths $y_{SEPK}$ and $y_{DEPK}$ at the locations of the maximum total n-type dopant concentrations in respective S/D extensions 280E and 282E. The $R_{SE}$ and $R_{DE}$ range values are then respectively used to determine suitable implantation energies for the p-type shallow source-extension dopant and the p-type deep S/D-extension dopant. If thin layers of the monosilicon along the upper surfaces of precursor S/D extensions 280EP and 282EP are later removed in respectively converting them into final S/D extensions 280E and 282E, parameters $\Delta y_{SE}$ and $\Delta y_{DE}$ in Eqs. 6 and 7 accommodate the respective thicknesses of the thin monosilicon layers.

Value $\alpha_{SE}$ of tilt angle α for the p-type shallow source-extension implantation is still approximately equals 7°. Inasmuch as the p-type shallow source-extension implant is thereby performed nearly perpendicular to a plane extending generally parallel to the upper semiconductor surface, precursor source extension 280EP of asymmetric IGFET 102 normally does not extend significantly laterally under precursor gate electrode 302P. Because the angled implantation of the p-type deep S/D-extension dopant used to form precursor drain extension 282EP causes it to extend significantly laterally under precursor gate electrode 302P, precursor drain extension 282P extends significantly further laterally under precursor gate electrode 302P than does precursor source extension 280EP. The amount by which precursor gate electrode 302P overlaps precursor drain extension 282EP thus significantly exceeds the amount by which precursor gate electrode 302P overlaps precursor source extension 280EP. The overlap of precursor gate electrode 302P on precursor drain extension 282EP is normally at least 10% greater, preferably at least 15% greater, more preferably at least 20% greater, than the overlap of precursor gate electrode 302P on precursor source extension 280EP.

N8. Implantation of Different Dopants in Source/Drain Extensions of Asymmetric IGFETs The parameters of the angled n-type deep S/D-extension implantation and the n-type shallow source-extension implantation used respectively at the stages of FIGS. 33o and 33p to define precursor drain extension 242EP and precursor source extension 240EP of asymmetric n-channel IGFET 100 are, as mentioned above, chosen such that:

a. The maximum concentration of the n-type S/D-extension dopant in precursor drain extension 242EP is less than, normally no more than one half of, preferably no more than one fourth of, more preferably no more than one tenth of, even more preferably no more than one twentieth of, the maximum concentration of the n-type shallow source-extension dopant in precursor source extension 240EP;

b. The location of the maximum concentration of the n-type deep S/D-extension dopant in precursor drain extension 242EP normally occurs at least 10% deeper, preferably at least 20% deeper, more preferably at least 30% deeper, than the location of the maximum concentration of the n-type shallow source-extension dopant in precursor source extension 240EP;

c. Precursor drain extension 242EP extends deeper, normally at least 20% deeper, preferably at least 30% deeper, more preferably at least 50% deeper, even more preferably at least 100% deeper, than precursor source extension 240EP; and e. The overlap of precursor gate electrode 262P on precursor drain extension 242EP is greater, normally at least 10% greater, preferably at least 15% greater, more preferably at least 20% greater, than the overlap of precursor gate electrode 262P on precursor source extension 240EP.

The preceding specifications for IGFET 100 can be achieved when the n-type shallow source-extension implantation is performed with the same n-type dopant, the same dopant-containing particle species, and the same particle ionization charge state as the n-type deep S/D-extension implantation. Nevertheless, achievement of these specifications is facilitated by arranging for the n-type shallow source-extension dopant to be of higher atomic weight than the n-type deep S/D-extension dopant. As also indicated above, the n-type deep S/D-extension dopant is normally one Group 5a element, preferably phosphorus, while the n-type shallow S/D-extension dopant is another Group 5a element, preferably arsenic, of higher atomic weight than the n-type deep S/D-extension dopant. The Group 5a element antimony, which is of greater atomic weight that arsenic and phosphorus, is another candidate for the n-type shallow source-extension dopant. The corresponding candidate for the n-type deep S/D-extension dopant is then arsenic or phosphorus.

The final dopant distributions for IGFET 102 are achieved when the p-type shallow source-extension implantation is performed with the same p-type dopant, namely boron, as the p-type deep S/D-extension implantation. While boron is the strongly dominant p-type dopant in current silicon-based semiconductor processes, other p-type dopants have been investigated for silicon-based semiconductor process. Achievement of the final dopant distributions for IGFET 102 can be facilitated by arranging for the p-type shallow source-extension dopant to be of higher atomic weight than the p-type deep S/D-extension dopant. As also indicated above, the p-type deep S/D-extension dopant can then be one Group 3a element, preferably boron, while the p-type shallow S/D-extension dopant is another Group 3a element, e.g., gallium or indium, of higher atomic weight than the Group 3a element used as the p-type deep S/D-extension dopant.

The parameters of the p-type shallow source-extension implantation used at the stage of FIG. 33*u* to define precursor source extension 280EP of asymmetric p-channel IGFET 102 and the parameters of the angled p-type deep S/D-extension implantation used at the earlier stage of FIG. 33*u* to define precursor drain extension 282EP in the above-described variation of the fabrication process of FIG. 33 are, as mentioned above, similarly variously chosen such that:

a. The maximum concentration of the p-type S/D-extension dopant in precursor drain extension 282EP is less than, normally no more than one half of, preferably no more than one fourth of, more preferably no more than one tenth of, even more preferably no more than one twentieth of, the maximum concentration of the p-type shallow source-extension dopant in precursor source extension 280EP;

b. The location of the maximum concentration of the p-type deep S/D-extension dopant in precursor drain extension 282EP normally occurs at least 10% deeper, preferably at least 20% deeper, more preferably at least 30% deeper, even more preferably at least 50% deeper, than the location of the maximum concentration of the p-type shallow source-extension dopant in precursor source extension 280EP;

c. Drain extension 282E extends deeper, normally at least 20% deeper, preferably at least 30% deeper, more preferably at least 50% deeper, even more preferably at least 100% deeper, than precursor source extension 280EP; and d. The overlap of precursor gate electrode 302P on precursor drain extension 282EP is greater, normally at least 10% greater, preferably at least 15% greater, more preferably at least 20% greater, than the overlap of precursor gate electrode 302P on precursor source extension 280EP.

Achievement of the preceding specifications can be facilitated by arranging for the p-type shallow source-extension dopant to be of higher atomic weight than the p-type deep S/D-extension dopant. Once again, the p-type deep S/D-extension dopant can be one Group 3a element while the p-type shallow S/D-extension dopant is another Group 3a element.

N9. Formation of Asymmetric IGFETs with Specially Tailored Halo Pocket Portions

Asymmetric n-channel IGFET 100U and extended-drain n-channel IGFET 104U with the dopant distributions in respective p halo pocket portions 250U and 326U specially tailored to reduce off-state source-to-drain current are fabricated according to the process of FIG. 33 in the same way as asymmetric n-channel IGFET 100 and extended-drain n-channel IGFET 104 except that the n-type shallow source-extension implant at the stage of FIG. 33*p* and the p-type source halo pocket ion implant at the stage of FIG. 33*q* are performed in the following manner for providing IGFET 100U with the M halo-dopant maximum-concentration locations PH and for providing IGFET 104U with the respectively corresponding M halo-dopant maximum-concentration locations depending on whether IGFETs 100U and 104U respectively replace IGFETs 100 and 104 or whether IGFETs 100 and 104 are also fabricated.

If IGFETs 100U and 104U replace IGFETs 100 and 104, the n-type shallow source-extension implant at the stage of FIG. 33*p* is performed as described above using critical photoresist mask 954. With photoresist 954 still in place, the p-type source halo dopant is ion implanted in a significantly angled manner through the openings in photoresist 954, through the uncovered sections of surface dielectric layer 948, and into vertically corresponding portions of the underlying monosilicon at a plural number M of different dopant-introduction conditions to define (a) a p precursor to halo pocket portion 250U of asymmetric IGFET 100U and (b) a p precursor to halo pocket portion 326U of extended-drain IGFET 104U. Photoresist 954 is subsequently removed.

If all of IGFETs 100, 100U, 104, and 104U are to be fabricated (or if any combination of one or both of IGFETs 100 and 104 and one or both of IGFETs 100U or 104U is to be fabricated), n shallow precursor source extensions 240EP and 320EP of IGFETs 100 and 104 are defined using photoresist mask 954 in the manner described above in connection with FIG. 33*p*. P precursor halo pocket portions 250P and 326P of IGFETs 100 and 104 are subsequently defined using photoresist 954 as described in connection with FIG. 33*q*.

An additional photoresist mask (not shown) having openings above the location for source extension 240E of asymmetric IGFET 100U and above the location for source extension 320E of extended-drain IGFET 104U is formed on dielectric layers 946 and 948. The additional photoresist mask is critically aligned to precursor gate electrodes 262P and 346P of IGFETs 100U and 104U. A repetition of the n-type shallow source-extension implantation is performed to ion implant the n-type shallow source-extension dopant at a high dosage through the openings in the additional photoresist, through the uncovered sections of surface dielectric 948, and into vertically corresponding portions of the underlying monosilicon to define (a) n+ precursor source extension 240EP of IGFET 100U and (b) n+ precursor source extension 320EP of IGFET 104P.

With the additional photoresist mask still in place, the p-type source halo dopant is ion implanted in a significantly angled manner through the openings in the additional photoresist, through the uncovered sections of surface dielectric layer 948, and into vertically corresponding portions of the underlying monosilicon at a plural number M of different dopant-introduction conditions to define (a) a p precursor to halo pocket portion 250U of asymmetric IGFET 100U and (b) a p precursor to halo pocket portion 326U of extended-drain IGFET 104U. The additional photoresist is removed. The steps involving the additional photoresist can be performed before or after the steps involving photoresist 954.

The M halo-dopant maximum-concentration locations PH of IGFET 100U and the respectively corresponding M halo-dopant maximum-concentration locations of IGFET 104U are respectively defined by the M dopant-introduction conditions in both of the foregoing ways for performing the p-type source halo implantation. At the end of the p-type source halo implantation, each halo-dopant maximum-concentration location PHj of IGFET 100U extends laterally under its gate electrode 262. Each corresponding halo-dopant maximum-concentration location of IGFET 104U similarly extends laterally under its gate electrode 346.

The implanted p-type source halo dopant diffuses further laterally and vertically into the semiconductor body during subsequent CIGFET processing at elevated temperature to convert the precursors of halo pocket portions 250U and 326U respectively into p halo pockets 250U and 326U. As a result, halo-dopant maximum-concentration locations PH of IGFET 100U are extended further laterally under gate electrode 262. The corresponding halo-dopant maximum-concentration locations of IGFET 104U are likewise extended further laterally under gate electrode 346.

Each of the M dopant-introduction conditions in both of the preceding ways for performing the p-type source halo implantation for IGFETs 100U and 104U is a different combination of the implantation energy, implantation tilt angle $\alpha_{SH}$, the implantation dosage, the atomic species of the p-type source halo dopant, the dopant-containing particle species of the p-type source halo dopant, and the particle ionization charge state of the dopant-containing particle species of the p-type source halo dopant. In correlating the M dopant-introduction conditions to the M numbered p-type source halo dopants described above in connection with FIGS. 19a, 20, and 21, each of the M dopant-introduction conditions is performed with a corresponding one of the M numbered p-type source halo dopants. Tilt angle $\alpha_{SH}$ is normally at least 15° at each dopant-introduction condition.

The p-type source halo implantation at the M dopant-introduction conditions is typically performed as M timewise-separate ion implantations. However, the p-type source halo implantation at the M dopant-introduction conditions can be performed as a single timewise-continuous operation by appropriately changing the implantation conditions during the operation. The p-type source halo implantation at the M dopant-introduction conditions can also be performed as a combination of timewise-separate operations, at least one of which is performed timewise continuously at two or more of the M dopant-introduction conditions.

The atomic species of the p-type source halo dopant is preferably the Group 3a element boron at each of the dopant-introduction conditions. That is, the atomic species of each of the M numbered p-type source halo dopants is preferably boron. However, other p-type Group 3a atomic species such as gallium and indium can variously be used as the M numbered p-type source halo dopants.

The dopant-containing particle species of the p-type source halo dopant can vary from dopant-introduction condition to dopant-introduction condition even though the atomic species of all the M numbered p-type source halo dopants is boron. More particularly, elemental boron and boron-containing compounds such as boron difluoride can variously be the dopant-containing particle species at the M dopant-introduction conditions.

The specific parameters of an implementation of the M dopant-introduction conditions are typically determined in basically the following way. The general characteristics of a desired distribution of the p-type source halo dopant in p halo pocket portions 250U and 326U are first established at one or more selected vertical locations through IGFETs 100U and 104U. As noted above, the p-type source halo dopant is also present in n-type sources 240 and 320 of IGFETs 100U and 104U. Such a selected vertical location through IGFET 100U or 104U may thus pass through its n-type source 240 or 320, e.g., along vertical line 274E through source extension 240E of IGFET 100U in FIG. 19a. Inasmuch as halo pockets 250U and 326U are formed with the same steps and therefore have similar p-type source halo dopant distributions, the general halo-pocket dopant-distribution characteristics are normally established for only one of IGFETs 100U and 104U.

The general halo-pocket dopant-distribution characteristics typically include numerical values for (a) the number M of different dopant-introduction conditions, (b) the depths of the corresponding M local maxima in total concentration $N_T$ of the p-type source halo dopant, and (c) total concentrations $N_T$ of the p-type source halo dopant at those M local concentration maxima. The depths of the M local maxima in total concentration $N_T$ of the p-type source halo dopant are employed in determining values of the implantation energy for the M respective dopant-introduction conditions.

For instance, the depth and concentration values can be (a) at dopant-concentration peaks 316 in FIG. 20a and thus along vertical line 314 extending through halo pocket portion 250U to the side of source extension 240E or (b) at dopant-concentration peaks 318 in FIG. 21a and therefore along vertical line 274E extending through source extension 240 and through the underlying material of halo pocket 250U. The dopant-concentration values at peaks 318 along line 274E through source extension 240E are somewhat less than the respective initial p-type source halo dopant-concentration values at peaks 318 due to post-implantation thermal diffusion of the p-type source halo dopant. However, the post-implantation thermal diffusion does not significantly alter the depths of peaks 318 because line 274E also extends through the source side of gate electrode 262.

On the other hand, both the depths and dopant concentration values of peaks 316 along vertical line 314 through halo pocket portion 250U to the side of source extension 240E change during the post-implantation thermal diffusion as a result of the movement of halo-dopant maximum-concentration locations PH further below gate electrode 262. Depth/concentration data at peaks 316 along line 314 can be correlated to depth/concentration data at peaks 318 along line 274E through source extension 240E and the source side of gate electrode 262 for use in determining values of the implantation energy for the M dopant-introduction conditions. However, this correlation is time consuming. Accordingly, the depths of the corresponding M local maxima in total concentration $N_T$ of the p-type source halo dopant and total concentrations $N_T$ of the p-type source halo dopant at those M local concentration maxima are typically the as-implanted values along line 274E through the source side of gate electrode 262. Using these as-implanted values is typically easier and does not significantly affect the final determination of the effectiveness of the implementation of the M dopant-introduction conditions.

Selections consistent with the general halo-pocket dopant-distribution characteristics established for the implementation of the M dopant-introduction conditions are made for implantation tilt angle $\alpha_{SH}$, the implantation dosage, the atomic species of the p-type source halo dopant, the dopant-containing particle species of the p-type source halo dopant, and the particle ionization charge state of the dopant-containing particle species of the p-type source halo dopant. Using this information, appropriate implantation energies are determined for the M dopant-introduction conditions.

More particularly, a thin layer of the monosilicon along the upper surface of the region intended to be the precursor to each halo pocket portion 250U or 326U may be removed subsequent to the formation of gate dielectric layer 260 or 344 but prior to ion implantation of the p-type source halo dopant. Again noting that each average depth of a location in a doped monosilicon region of an IGFET is measured from a plane extending generally through the bottom of the IGFET's gate dielectric layer, let $\Delta y_{SH}$ represent the average thickness of any monosilicon so removed along the top of a precursor halo pocket portion such as the precursor to halo pocket 250U or 326U.

For a precursor halo pocket portion, such as the precursor to halo pocket portion 250U or 326U, defined by ion implantation through a surface dielectric layer such as surface dielectric 948, let $t_{Sd}$ again represent the average thickness of the surface dielectric. The range $R_{SHj}$ of the jth source halo dopant ion implanted to define the jth local concentration maximum in the precursor source halo pocket at an average depth $y_{SHj}$ is then given approximately by:

$$R_{SHj}=(y_{SHj}-\Delta y_{SH}+t_{Sd})\sec \alpha_{SHj} \qquad (8)$$

where $\alpha_{SHj}$ is the jth value of tilt angle $\alpha_{SHj}$. Alternatively described, $\alpha_{SHj}$ is the tilt angle used in ion implanting the jth numbered source halo dopant that defines the jth source halo dopant local concentration maxima in the precursor source halo pocket. Since tilt angle value $\alpha_{SH}$ is at least 15° for precursor halo pocket 250U or 326U, the sec $\alpha_{SHj}$ factor in Eq. 8 is significantly greater than 1. A value for implantation range $R_{SHj}$ is determined from Eq. 8 at each value of depth $y_{SHj}$ of the jth p-type source halo local concentration maxima. The $R_{SHj}$ range values are then respectively used to determine suitable implantation energies for the M numbered p-type source halo dopants.

The values of the maximum source halo dopant concentrations at peaks 318 along line 274E through source extension 240E and the source side of gate electrode 262 are one-quadrant values because the dopant-blocking shield formed by photoresist mask 954, precursor gate electrodes 262P and 346P of IGFETs 100U and 104U, and sealing dielectric layer 946 blocks approximately three fourths of the impinging ions of the p-type source halo dopant from entering the regions intended for the precursors to halo pocket portions 250U and 326U. For ion implanting the p-type source halo dopant at four 90° incremental values of the azimuthal angle, the source halo dopant dosage corresponding to the individual concentration of the jth peak 318 in FIG. 21a is multiplied by four to get the total dosage for the jth p-type numbered source halo dopant.

The straggle $\Delta R_{SHj}$ is the standard deviation in range $R_{SHj}$. Straggle $\Delta R_{SHj}$ increases with increasing range $R_{SHj}$ which, in accordance with Eq. 8, increases with increasing average depth $y_{SHj}$ of the jth p-type source halo dopant ion implanted to define the jth local concentration maximum in halo region 250U. To accommodate the resultant increase in straggle $\Delta R_{SHj}$ increases with increasing average depth $y_{SHj}$, the implantation dosages for the M dopant-introduction conditions are normally chosen so as to increase progressively in going from the dopant-introduction condition for lowest average depth $y_{SH1}$ at shallowest halo-dopant maximum-concentration location PH-1 to the dopant-introduction condition for highest average depth $y_{SHM}$ at the deepest halo-dopant maximum-concentration location PH-M.

In one implementation of the M dopant-introduction conditions for the p-type source halo implantation, the implantation energy is varied while implantation tilt angle $\alpha_{SE}$, the atomic species of the p-type source halo dopant, the dopant-containing particle species of the p-type source halo dopant, and the particle ionization charge state of the dopant-containing particle species of the p-type source halo dopant are maintained constant. The atomic species in this implementation is boron in the dopant-containing particle species of elemental boron. Taking note that the particle ionization charge state of the dopant-containing particle species of an ion-implanted semiconductor dopant means its ionization level, the ion-implanted boron is largely singly ionized in this implementation so that the boron particle charge state is single ionization. The implantation dosages for the M dopant-introduction conditions were chosen so as to increase progressively in going from the implantation for lowest average depth $y_{SH1}$ at shallowest halo-dopant maximum-concentration location PH-1 to the implantation for highest average depth $y_{SHM}$ at the deepest halo-dopant maximum-concentration location PH-M.

Two examples of the preceding implementation were simulated. In one of the examples, the number M of dopant-introduction conditions was 3. The three implantation energies respectively were 2, 6, and 20 keV. Depths $y_{SHj}$ of the three as-implanted local concentration maxima in the boron source halo dopant at the three implantation energies respectively were 0.010, 0.028, and 0.056 µm. Concentration $N_I$ the boron source halo dopant at each of the three as-implanted local concentration maxima was approximately $8\times10^{17}$ atoms/cm$^3$.

The number M of dopant-introduction conditions in the other example of the preceding implementation was 4. The four implantation energies respectively were 0.5, 2, 6, and 20 keV. Depths $y_{SHj}$ of the four as-implanted local concentration maxima in the boron source halo dopant at the three implantation energies respectively were 0.003, 0.010, 0.028, and 0.056 µm. Concentration $N_I$ the boron source halo dopant at each of the three as-implanted local concentration maxima was approximately $9\times10^{17}$ atoms/cm$^3$. In comparison to the first example, the implantation at the lowest energy significantly flattened concentration $N_T$ of the total p-type dopant very close to the upper semiconductor surface.

As an alternative to performing the p-type source halo implantation at M different dopant-introductions, the p-type source halo implantation can be performed by continuously varying one or more of the implantation energy, implantation tilt angle $\alpha_{SH}$, the implantation dosage, the atomic species of the p-type source halo dopant, the dopant-containing particle species of the p-type source halo dopant, and the particle ionization charge state of the dopant-containing particle species of the p-type source halo dopant. Appropriately selecting the continuous variation of these six ion implantation parameters results in the second halo-pocket vertical profile described above in which concentration $N_T$ of the total p-type dopant varies by a factor of no more than 2, preferably by a factor of no more than 1.5, more preferably by a factor of no more than 1.25, in moving from the upper semiconductor surface to a depth y of at least 50%, preferably at least 60%, of depth y of halo pocket 250U or 326U of IGFET 100U or 104U along an imaginary vertical line extending through pocket 250U or 326U to the side of source extension 240E or 280E, such as vertical line 314 for IGFET 100U, without necessarily reaching multiple local maxima along the portion of that vertical line in pocket 250U or 326U.

Moving to asymmetric p-channel IGFET 102U and extended-drain p-channel IGFET 106U, IGFETs 102U and 104U with the dopant distributions in respective n halo pocket portions 290U and 366U specially tailored to reduce off-state S/D current leakage are manufactured according to the process of FIG. 33 in the same way as p-channel IGFET 102 and p-channel IGFET 106 except that the n-type shallow source-extension implant at the stage of FIG. 33*u* and the n-type source halo pocket ion implantation at the stage of FIG. 33*v* are performed in the following way for providing IGFET 102U with the M halo-dopant maximum-concentration locations NH and for providing IGFET 106U with the respectively corresponding M halo-dopant maximum-concentration locations depending on whether IGFETs 102U and 106U respectively replace IGFETs 102 and 106 or whether IGFETs 102 and 106 are also manufactured.

If IGFETs 102U and 106U replace IGFETs 102 and 106, the p-type shallow source-extension implant at the stage of FIG. 33*u* is performed as described above using critical photoresist mask 960. With photoresist 960 still in place, the n-type source halo dopant is ion implanted in a significantly angled manner through the openings in photoresist 960, through the uncovered sections of surface dielectric layer 948, and into vertically corresponding portions of the underlying monosilicon at a plural number M of different dopant-introduction conditions to define (a) an n precursor to halo pocket portion 290U of asymmetric IGFET 102U and (b) an n precursor to halo pocket portion 366U of extended-drain IGFET 106U. Photoresist 960 is subsequently removed.

If all of IGFETs 102, 102U, 106, and 106U are to be manufactured (or if any combination of one or both of IGFETs 102 and 106 and one or both of IGFETs 102U or 102U is to be manufactured), p shallow precursor source extensions 280EP and 360EP of IGFETs 102 and 106 are defined using photoresist mask 960 in the manner described above in connection with FIG. 33*u*. N precursor halo pocket portions 290P and 366P of IGFETs 102 and 106 are subsequently defined using photoresist 960 as described in connection with FIG. 33*v*.

A further photoresist mask (not shown) having openings above the location for source extension 280E of asymmetric IGFET 102U and above the location for source extension 320E of extended-drain IGFET 106U is formed on dielectric layers 946 and 948. The further photoresist mask is critically aligned to precursor gate electrodes 302P and 386P of IGFETs 102U and 106U. A repetition of the p-type shallow source-extension implantation is performed to ion implant the p-type shallow source-extension dopant at a high dosage through the openings in the further photoresist, through the uncovered sections of surface dielectric 948, and into vertically corresponding portions of the underlying monosilicon to define (a) p+ precursor source extension 280EP of IGFET 102U and (b) p+ precursor source extension 360EP of IGFET 106P.

With the further photoresist mask still in place, the n-type source halo dopant is ion implanted in a significantly angled manner through the openings in the further photoresist, through the uncovered sections of surface dielectric layer 948, and into vertically corresponding portions of the underlying monosilicon at a plural number M of different dopant-introduction conditions to define (a) an n precursor to halo pocket portion 290U of asymmetric IGFET 102U and (b) an n precursor to halo pocket portion 366U of extended-drain IGFET 106U. The further photoresist is removed. The steps involving the further photoresist can be performed before or after the steps involving photoresist 960.

The M halo-dopant maximum-concentration locations NH of IGFET 102U and the respectively corresponding M halo-dopant maximum-concentration locations of IGFET 106U are respectively defined by the M dopant-introduction conditions in both of the preceding ways for performing the n-type source halo implantation. At the end of the n-type source halo implantation, each halo-dopant maximum-concentration location NHj of IGFET 102U extends laterally under its gate electrode 302. Each corresponding halo-dopant maximum-concentration location of IGFET 106U similarly extends laterally under its gate electrode 386.

The implanted n-type source halo dopant diffuses further laterally and vertically into the semiconductor body during subsequent CIGFET thermal processing to convert the n precursors to halo pocket portions 290U and 366U respectively into n halo pockets 290U and 366U. As a result, halo-dopant maximum-concentration locations NH of IGFET 102U are extended further laterally under gate electrode 302. The corresponding halo-dopant maximum-concentration locations of IGFET 106U are likewise extended further laterally under gate electrode 386.

Except as described below, the M dopant-introduction conditions in both of the preceding ways for performing the n-type source halo implantation for IGFETs 102U and 106U are the same as the M dopant-introduction conditions for performing the p-type source halo implantation for IGFETs 100U and 104U with the conductivity type reversed.

The atomic species of the n-type source halo dopant is preferably the Group 5a element arsenic at each of the dopant-introduction conditions. In other words, the atomic species of each of the M numbered p-type source halo dopants is preferably arsenic. Other p-type Group 3a atomic species such as phosphorus and antimony can variously be used as the M numbered n-type source halo dopants.

The dopant-containing particle species of the n-type source halo dopant is normally the same from dopant-introduction condition to dopant-introduction condition when the atomic species of all the M numbered p-type source halo dopants is arsenic. In particular, elemental arsenic is normally the dopant-containing particle species at the M dopant-introduction conditions. If phosphorus or antimony is used as any of the M numbered n-type source halo dopants, elemental phosphorus or elemental antimony is the corresponding dopant-containing particle species.

The specific parameters of an implementation of the M dopant-introduction conditions for the n-type source halo dopant are determined in the same way as the M dopant-introduction conditions for the p-type source halo dopant.

In one implementation of the M dopant introduction conditions for the n-type source halo implantation, the implantation energy is varied while implantation tilt angle $\alpha_{SE}$, the atomic species of the n-type source halo dopant, the dopant-containing particle species of the n-type source halo dopant, and the particle ionization charge state of the dopant-containing particle species of the n-type source halo dopant are maintained constant. The atomic species in this implementation is arsenic in the dopant-containing particle species of elemental arsenic. The ion-implanted arsenic is largely singly ionized in this implementation so that the arsenic particle ionization charge state is single ionization. The implantation dosages for the M dopant-introduction conditions were chosen so as to increase progressively in going from the implantation for lowest average depth $y_{SH1}$ at shallowest halo-dopant maximum-concentration location NH-1 to the implantation for highest average depth $y_{SHM}$ at the deepest halo-dopant maximum-concentration location NH-M.

Two examples of the foregoing implementation of the M dopant-introduction conditions for the n-type source halo implantation were simulated. In one of the examples, the number M of dopant-introduction conditions was 3. The three implantation energies respectively were 7, 34, and 125 keV. Depths $y_{SHj}$ of the three as-implanted local concentration maxima in the arsenic source halo dopant at the three implantation energies respectively were 0.010, 0.022, and 0.062 µm. Concentration $N_I$ the boron source halo dopant at each of the three as-implanted local concentration maxima was approximately $1.4 \times 10^{18}$ atoms/cm$^3$.

The number M of dopant-introduction conditions in the second example of the preceding implementation was 4. The four implantation energies respectively were 0.5, 10, 40, and 125 keV. Depths $y_{SHj}$ of the four as-implanted local concentration maxima in the boron source halo dopant at the three implantation energies respectively were 0.002, 0.009, 0.025, and 0.062 µM. Concentration $N_I$ the boron source halo dopant at each of the three as-implanted local concentration maxima was approximately $1.4 \times 10^{18}$ atoms/cm$^3$. Compared to the first example, the implantation at the lowest energy significantly flattened concentration $N_T$ of the total n-type dopant very close to the upper semiconductor surface.

Similar to what is said above about the p-type source halo implantation, the n-type source halo implantation can alternatively be performed by continuously varying one or more of the implantation energy, implantation tilt angle $\alpha_{SH}$, the implantation dosage, the atomic species of the n-type source halo dopant, the dopant-containing particle species of the n-type source halo dopant, and the particle ionization charge state of the dopant-containing particle species of the n-type source halo dopant. Appropriately selecting the continuous variation of these six ion implantation parameters results in the second halo-pocket vertical profile described above in which concentration $N_T$ of the total n-type dopant varies by a factor of no more than 2.5, preferably by a factor of no more than no more than 2, more preferably by a factor of no more than 1.5, even more preferably by a factor of no more than 1.25, in moving from the upper semiconductor surface to a depth y of at least 50%, preferably at least 60%, of depth y of halo pocket 290U or 366U of IGFET 102U or 106U along an imaginary vertical line extending through pocket 290U or 366U to the side of source extension 280E or 320E without necessarily reaching multiple local maxima along the portion of that vertical line in pocket 290U or 366U.

With current ion implantation equipment, it is difficult to change the atomic species of a semiconductor dopant being ion implanted, the dopant-containing particle species, and the particle ionization charge state of the dopant-containing particle species without interrupting the ion implantation operation. To obtain a rapid throughput, both this alternative and the corresponding alternative for the p-type source halo implantation are therefore normally implemented by continuously varying one or more of the implantation energy, implantation tilt angle $\alpha_{SH}$, and the implantation dosage without interrupting, or otherwise significantly stopping, the implantation. The implantation dosage is normally increased as the implantation energy is increased, and vice versa. Nonetheless, one or more of the implantation energy, implantation tilt angle $\alpha_{SH}$, and the implantation dosage can be continuously varied even though the implantation operation is temporarily interrupted to change one or more of (a) the atomic species of the semiconductor dopant being ion implanted, (b) the dopant-containing particle species, and (c) the particle ionization charge state of the dopant-containing particle species.

In addition, each source halo implantation can consist of a selected arrangement of one or more fixed-condition dopant introduction operations and one or more continuously varying dopant-introduction operations. Each fixed-condition dopant-introduction operation is performed at a selected combination of implantation energy, implantation tilt angle $\alpha_{SH}$, implantation dosage, atomic species of the source halo dopant, dopant-containing particle species of the source halo dopant, and particle ionization charge state of the dopant-containing particle species of the source halo dopant. These six ion-implantation parameters are substantially fixed during each fixed-condition dopant-introduction operation and are normally different from the combination of these parameters for any other fixed-condition dopant-introduction operation.

Each continuously varying dopant-introduction operation is performed by continuously varying one or more of the implantation energy, implantation tilt angle $\alpha_{SH}$, the implantation dosage, the atomic species of the n-type source halo dopant, the dopant-containing particle species of the n-type source halo dopant, and the particle ionization charge state of the dopant-containing particle species of the n-type source halo dopant. To obtain a rapid throughput, each continuously varying dopant-introduction operation is performed by continuously varying one or more of the implantation energy, implantation tilt angle $\alpha_{SH}$, and the implantation dosage without interrupting, or otherwise significantly stopping, the operation. The implantation dosage is again normally increased as the implantation energy is increased, and vice versa.

O. Vertically Graded Source-Body and Drain-Body Junctions

Vertical grading of a source-body or drain-body pn junction of an IGFET generally refers to reducing the net dopant concentration gradient in crossing the junction along a vertical line that passes through the most heavily doped material of the source or drain. As indicated above, the source-body and drain-body junctions of the IGFETs in the CIGFET structure of FIG. 11 can be vertically graded in this way. The reduced junction vertical dopant concentration gradient reduces the parasitic capacitance along the drain-body junctions, thereby enabling the illustrated IGFETs to switch faster.

FIGS. 34.1-34.3 (collectively "FIG. 34") illustrate three portions of a CIGFET semiconductor structure, configured according to the invention, in which variations 100V, 102V, 104V, 106V, 108V, and 110V of respective asymmetric complementary IGFETs 100 and 102, extended-drain complementary IGFETs 104 and 106, and symmetric low-leakage complementary IGFETs 108 and 110 are provided with vertically graded source-body and drain-body junctions. As explained further below, only source-body junction 324 or 364 of extended-drain IGFET 104V or 106V is vertically graded. Both source-body junction 246 or 286 and drain-body junction 248 or 288 of asymmetric IGFET 100V or 102V are vertically graded. Both of S/D-body junctions 446 and 448 or 486 and 488 and of symmetric IGFET 108V or 110V are vertically graded.

Aside from the junction grading, IGFETs 100V, 102V, 104V, 106V, 108V, and 110V in FIG. 34 are respectively substantially identical to IGFETs 100, 102, 104, 106, 108, and 110 in FIG. 11. Each IGFET 100V, 102V, 104V, 106V, 108V, or 110y therefore includes all the components of corresponding IGFET 100, 102, 104, 106, 108, or 110 subject to modification of the S/D zones to include the vertical junction grading.

Asymmetric IGFETs 100V and 102V appear in FIG. 34.1 corresponding to FIG. 11.1. The vertical junction grading for n-channel IGFET 100V is achieved with a heavily doped n-type lower source portion 240L and a heavily doped n-type lower drain portion 242L which respectively underlie, and are respectively vertically continuous with, main source portion 240M and main drain portion 242M. Although heavily doped, n+ lower source portion 240L and n+ lower drain portion 242L are respectively more lightly doped than n++ main source portion 240M and n++ main drain portion 242M. The lighter n-type doping of n+ lower source portion 240L compared to n++ main source portion 240M causes the vertical dopant concentration gradient across the portion of source-body junction 246 extending along lower source portion 240L to be reduced.

As in the example of FIGS. 11.1 and 12, n+ drain extension 242E extends under n++ main drain portion 242M in the example of FIG. 34.1. N+ lower drain portion 242L preferably extends under drain extension 242E. That is, lower drain portion 242L preferably extends deeper than drain extension 242E as illustrated in the example of FIG. 34.1. The lighter n-type doping of n+ lower drain portion 242L compared to n++ main drain portion 242M then causes the vertical dopant concentration gradient across the portion of drain-body junction 248 extending along lower drain portion 242L to be reduced. While still extending deeper than main drain portion 242M, lower drain portion 242L can alternatively extend shallower than drain extension 242E. In that case, drain extension 242E assists lower drain portion 242L in reducing the vertical dopant concentration gradient across the underlying portion of drain-body junction 248.

For an IGFET whose source contains a main portion and an underlying more lightly doped lower portion so as to achieve a vertically graded source-body pn junction and whose drain contains a main portion and an underlying more lightly doped lower portion so as to achieve a vertically graded drain-body pn junction, let $y_{SL}$ and $y_{DL}$ respectively represent the maximum depths of the lower source portion and the lower drain portion. Source depth $y_S$ of IGFET 100V then equals its lower source portion depth $y_{SL}$. In the preferred example of FIG. 34.1 where lower source portion 242L extends deeper than drain extension 242E, drain depth $y_D$ of IGFET 100V equals its lower drain portion depth $y_{DL}$.

Taking note that source depth $y_S$ of IGFET 100 is normally 0.08-0.20 µm, typically 0.14 µm, source depth $y_S$ of IGFET 100V is normally 0.15-0.25 µm, typically 0.20 µm. Lower source portion 240L thus causes source depth $y_S$ to be increased considerably. Similarly taking note that drain depth $y_D$ of IGFET 100 is normally 0.10-0.22 µm, typically 0.16 µm, drain depth $y_D$ of IGFET 100V is also normally 0.15-0.25 µm, typically 0.20 µm. Consequently, lower drain portion 242L causes source depth $y_D$ to be increased considerably although somewhat less than the increase in source depth $y_S$. In the preferred example of FIG. 34.1, source depth $y_S$ and drain depth $y_D$ are nearly the same for IGFET 102V.

Lower source portion 240L and lower drain portion 242L of IGFET 100V are both defined with the n-type junction-grading S/D dopant. An understanding of how the n-type junction-grading dopant reduces the vertical dopant concentration gradients across source-body junction 246 and drain-body junction 248 of asymmetric IGFET 100 is facilitated with the assistance of FIGS. 35a, 35b, and 35c (collectively "FIG. 35") and FIGS. 36a, 36b, and 36c (collectively "FIG. 36"). Exemplary dopant concentrations as a function of depth y along vertical line 274M through source portions 240M and 240L and through empty-well main body-material portion 254 are presented in FIG. 35. FIG. 36 presents exemplary dopant concentrations as a function of depth y along vertical line 278M (only partially shown in FIG. 34.1) through drain portions 242M and 242L and through body-material portion 254.

Figure 35A:
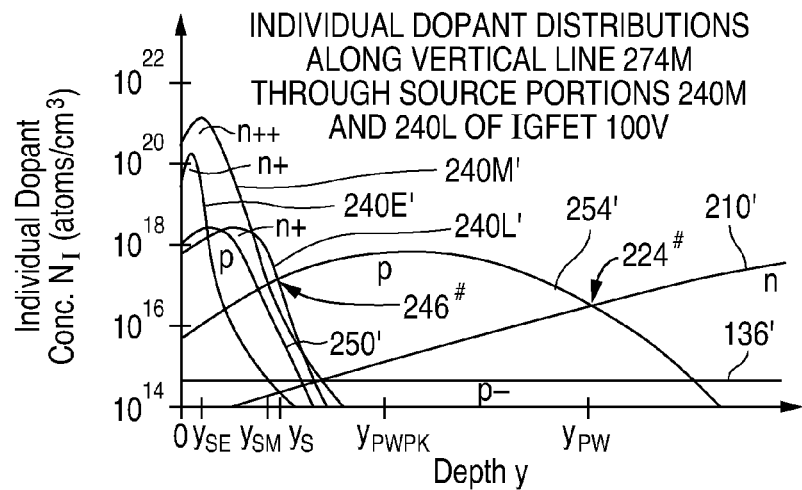
FIGS. 35*a*-35*c* are respective graphs of individual, total, and net dopant concentrations as a function of depth along an imaginary vertical line through the main and lower source portions of the asymmetric n-channel IGFET of FIG. 34.1.
Figure 36A:
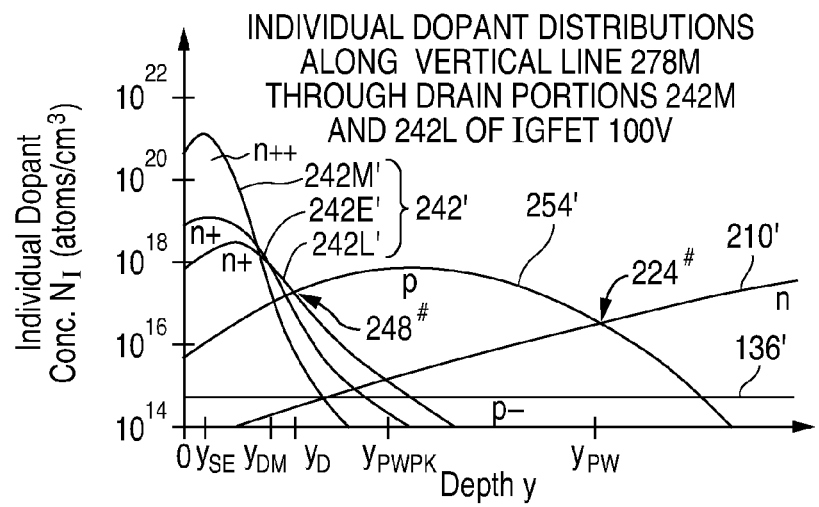
FIGS. 36*a*-36*c* are respective graphs of individual, total, and net dopant concentrations as a function of depth along an imaginary vertical line through the main and lower drain portions of the asymmetric n-channel IGFET of FIG. 34.1.
Figure 36B:
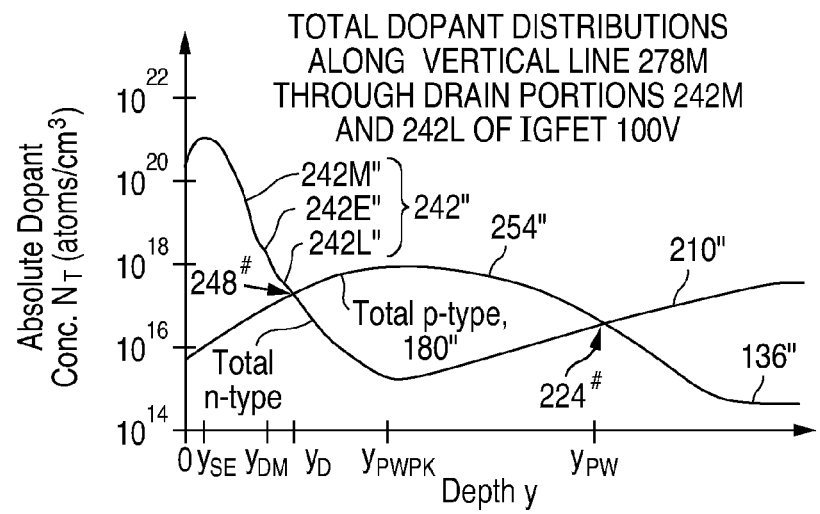
Figure 36C:
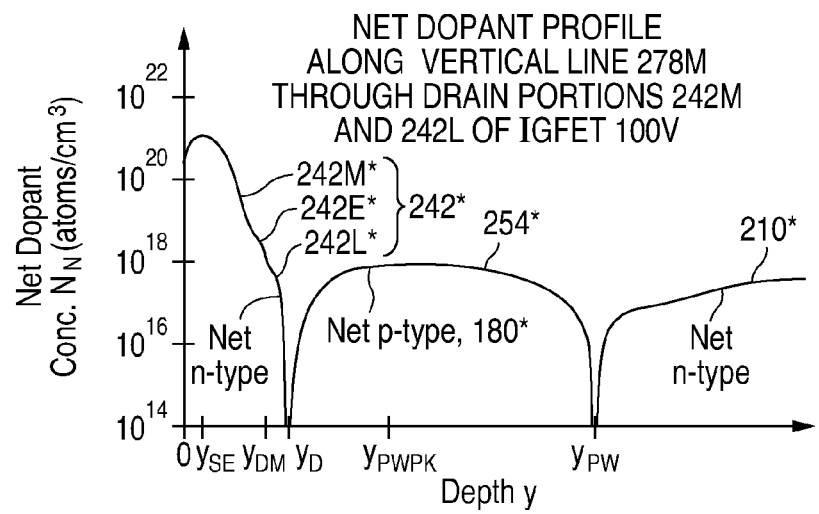

FIGS. 35a and 36a, which are respectively analogous to FIGS. 14a and 18a for IGFET 100, specifically illustrate concentrations $N_I$, along vertical lines 274M and 278M, of the individual semiconductor dopants that vertically define regions 136, 210, 240M, 240E, 240L, 242M, 242E, 242L, 250, and 254 of graded junction IGFET 100V and thus respectively establish the vertical dopant profiles in (a) source portions 240M and 240L and the underlying material of empty-well body-material portion 254 and (b) drain portions 242M and 242L and the underlying material of body-material portion 254. Curves 240L' and 242L' in FIGS. 35a and 36a represent concentrations $N_I$ (only vertical here) of the n-type junction-grading S/D dopant that defines respective lower source portion 240L and lower drain portion 242L. The other curves in FIGS. 35a and 36a have the same meanings as in FIGS. 14a and 18a.

Figure 35B:
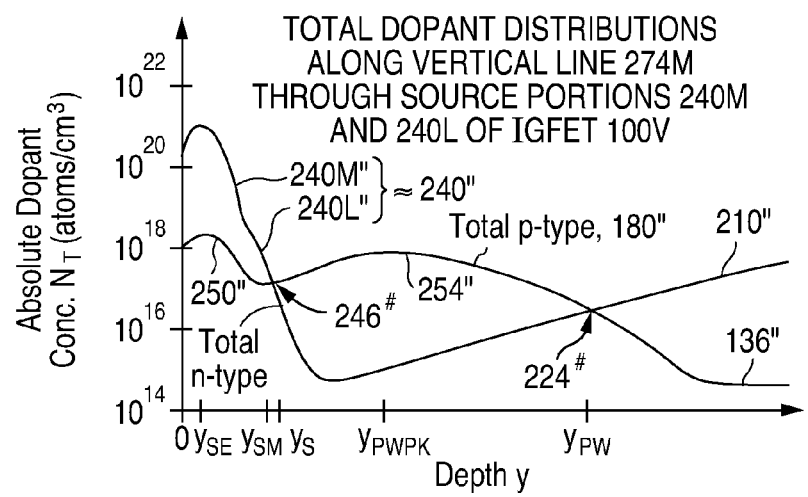

Analogous respectively to FIGS. 14b and 18b for IGFET 100, FIGS. 35b and 36b variously depict concentrations $N_T$ of the total p-type and total n-type dopants in regions 136, 210, 240M, 240L, 242M, 242L, 250, and 254 along vertical lines 274M and 278M of IGFET 100V. Curves 240L" and 242L" in FIGS. 35b and 36b respectively correspond to lower source portion 240L and lower drain portion 242L. The other curves and curve segments in FIGS. 35b and 36b have the same meanings as in FIGS. 14b and 18b. Item 240" in FIG. 35b thus corresponds to source 240 and represents the combination of curve segments 240M", 240L", and 240E". Item 242" in FIG. 36b similarly corresponds to drain 242 and represents the combination of curve segments 242M", 242L", and 242E".

Figure 35C:
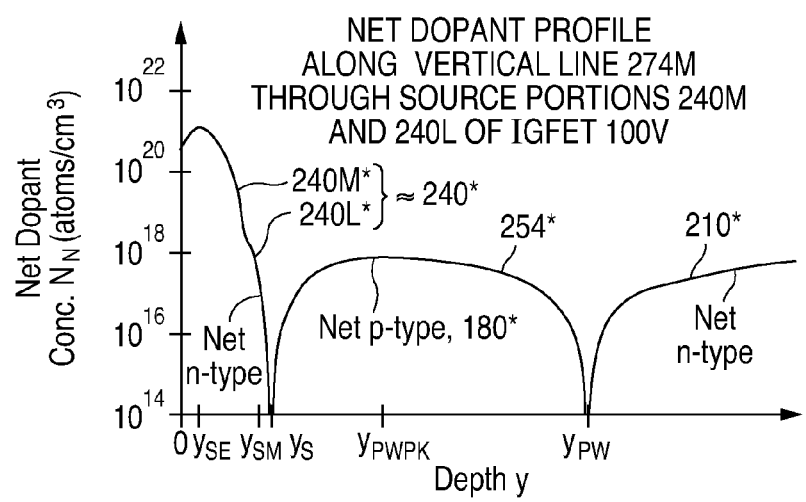

FIGS. 35c and 36c, which are respectively analogous to FIGS. 14a and 18a for IGFET 100, present net dopant concentration $N_N$ along vertical lines 274M and 278M for IGFET 100V. Concentrations $N_N$ of the net n-type dopants in lower source portion 240L and lower drain portion 242L are respectively represented by curve segments 240L* and 242L* in FIGS. 35c and 36c. The other curves and curve segments in FIGS. 35c and 36c have the same meanings as in FIGS. 14c and 18c. Item 240* in FIG. 35c corresponds to source 240 and represents the combination of curve segments 240M*, 240L*, and 240E*. Item 242* in FIG. 36c corresponds to drain 242 and represents the combination of curve segments 242M*, 242L*, and 242E*.

As shown by curves 240L' and 240M' in FIG. 35a, the n-type junction-grading S/D dopant reaches a maximum concentration in source 240 along a subsurface location below the location of the maximum concentration of the n-type main S/D dopant in source 240. Curves 240L' and 240M' also show that the maximum concentration of the n-type junction-grading S/D dopant in source 240 is less than the maximum concentration of the n-type main S/D dopant in source 240. Referring to curves 242M' and 242L' in FIG. 36a, they show that the n-type junction-grading S/D dopant reaches a maximum concentration in drain 242 along a subsurface location below the location of the maximum concentration of the n-type main S/D dopant in drain 242. In addition, curves 242L' and 242M' show that the maximum concentration of the n-type junction-grading S/D dopant in drain 242 is less than the maximum concentration of the n-type main S/D dopant in drain 242.

With reference to FIGS. 35b and 36b, the distribution of the n-type junction-grading dopant in source 240 and drain 242 is controlled so that the shapes of curves 240" and 242" representing concentration $N_T$ of the total n-type dopant in source 240 and drain 242 are determined by the n-type junction-grading S/D dopant in the vicinity of source-body junction 246 and drain-body junction 248. This can be clearly seen by comparing curves 240" and 242" in FIGS. 35a and 36a respectively to curves 240" and 242" in FIGS. 14a and 18a. Since the n-type junction-grading S/D dopant has a lower maximum dopant concentration than the n-type main S/D dopant in both source 240 and drain 242, the n-type junction-grading S/D dopant has a lower vertical concentration gradient than the n-type main S/D dopant at any particular dopant concentration. Consequently, the n-type junction-grading S/D dopant causes the n-type vertical dopant gradient in source 240 and drain 242 to be reduced in the vicinity of junctions 246 and 248. The reduced junction vertical dopant gradient is reflected in curves 240* and 242* in FIGS. 35c and 36c.

The vertical junction, grading for p-channel IGFET 102V is achieved with heavily doped p-type lower source portion 280L and heavily doped p-type lower drain portion 282L which respectively underlie, and are respectively vertically continuous with, main source portion 280M and main drain portion 282M. Again see FIG. 34.1. Although heavily doped, p+ lower source portion 280L and lower drain portion 282L are respectively more lightly doped than p++ main source portion 280M and p++ main drain 282M. Due to the lighter p-type doping of lower source portion 280L, the vertical dopant concentration gradient across the portion of source-body junction 286 extending along lower source portion 280L is reduced.

The lighter p-type doping of lower drain portion 282L similarly causes the vertical dopant concentration gradient across the portion of drain-body junction 288 extending along lower drain portion 282L to be reduced. Similar to what was said above about n-channel IGFET 100V, lower drain portion 282L of p-channel IGFET 102V can alternatively extend shallower than drain extension 282E while still extending deeper than main drain portion 282M. Drain extension 282E assists lower drain portion 282L in reducing the vertical dopant concentration gradient across the underlying portion of drain-body junction 288.

Source depth $y_S$ of IGFET 102V equals its lower source portion depth $y_{SL}$. In the preferred example of FIG. 34.1 where lower drain portion 282L extends deeper than drain extension 282E, drain depth $y_D$ of IGFET 102V equals its lower drain portion depth $y_{DL}$. Taking note that source depth $y_S$ of IGFET 102 is normally 0.05-0.15 µm, typically 0.10 µm, source depth $y_S$ of IGFET 102V is normally 0.08-0.20 µm, typically 0.12 µm. Lower source portion 280L thus causes source depth $y_S$ to be increased significantly. Similarly taking note that drain depth $y_D$ of IGFET 100 is normally 0.08-0.20 µm, typically 0.14 µm, drain depth $y_D$ of IGFET 100V is normally 0.10-0.25 µm, typically 0.17 µm. Consequently, lower drain portion 242L causes source depth $y_D$ to be increased considerably. In the preferred example of FIG. 34.1, drain depth $y_D$ for IGFET 102V is considerably greater than its source depth $y_S$.

Lower source portion 280L and lower drain portion 282L of IGFET 102V are defined with the p-type junction-grading S/D dopant. The dopant distribution of the p-type grading junction S/D dopant relative to the dopant distribution of the p-type main S/D dopant is controlled in the same way that the dopant distribution of the n-type grading junction S/D dopant is controlled relative to the dopant distribution of the n-type main S/D dopant. In each of source 280 and drain 282, the p-type junction-grading S/D dopant thus reaches a maximum concentration along a subsurface location below the location of the maximum concentration of the p-type main S/D dopant. Also, the p-type junction-grading S/D dopant in each of source 280 and drain 282 has a lower maximum concentration than the p-type main S/D dopant. In particular, the distribution of the p-type junction-grading dopant in source 280 and drain 282 is controlled so that the concentration of the total p-type dopant in source 280 and drain 282 are determined by the p-type junction-grading S/D dopant in the vicinity of source-body junction 286 and drain-body junction 288. The p-type junction-grading S/D dopant thereby causes the p-type vertical dopant gradient in source 280 and drain 282 to be reduced in the vicinity of junctions 286 and 288.

Extended-drain IGFETs 104V and 106V appear in FIG. 34.2 corresponding to FIG. 11.2. The vertical source junction grading for n-channel IGFET 104V is achieved with a heavily doped n-type lower source portion 320L which underlies, and is vertically continuous with, main source portion 320M. Although heavily doped, n+ lower source portion 320L is more lightly doped than n++ main source portion 320M. Due to the lighter n-type doping of lower source portion 320L compared to main source portion 320M, the vertical dopant concentration gradient across the portion of source-body junction 324 extending along lower source portion 320L is reduced. As a side effect of providing n+ lower source portion 320L, IGFET 104V contains a heavily doped n-type intermediate portion 910 situated immediately below n++ drain contact portion/main drain portion 334 in island 144B. N+ intermediate portion 910 forms part of drain 184B but does not have any significant effect on the operation of IGFET 104.

Lower source portion 320L and intermediate drain portion 910 are defined with the n-type junction-grading S/D dopant. The foregoing explanation about how the n-type junction-grading dopant causes the n-type vertical dopant concentration gradient in S/D zones 240 and 242 of IGFET 100V to be reduced in the vicinity of junctions 246 and 248 applies to reducing the n-type vertical dopant concentration gradient in source 320 of IGFET 104V in the vicinity of source-body junction 324. Hence, the distribution of the n-type junction-grading dopant in source 320 of IGFET 104V is controlled so that the concentration of the total n-type dopant in source 320 is determined by the n-type junction-grading S/D dopant in the vicinity of source-body junction 324. Consequently, the n-type junction-grading S/D dopant causes the n-type vertical dopant gradient in source 320 to be reduced in the vicinity of source-body junction 324.

The vertical source junction grading for p-channel IGFET 106V is similarly achieved with a heavily doped p-type lower source portion 360L which underlies, and is vertically continuous with, main source portion 360M. Again see FIG. 34.2. P+ lower source portion 360L is more lightly doped than p++ main source portion 360M. As a result, the vertical dopant concentration gradient across the portion of source-body junction 364 extending along lower source portion 360L is reduced. As a side effect, IGFET 106V contains a heavily doped p-type intermediate drain portion 912 situated immediately below p++ drain contact portion/main drain portion 374 in island 146B. N+ intermediate drain portion 912 does not have any significant effect on the operation of IGFET 106V.

Lower source portion 360L and intermediate drain portion 912 are defined with the p-type junction-grading S/D dopant. The preceding explanation about how the n-type junction-grading dopant causes the n-type vertical dopant concentration gradient in source zone 320 of IGFET 104V to be reduced in the vicinity of source-body junction 324 applies to reducing the n-type vertical dopant concentration gradient in source 360 of IGFET 106 in the vicinity of source-body junction 364. That is, the distribution of the p-type junction-grading dopant in source 360 of IGFET 106V is controlled so that the concentration of the total p-type dopant in source 360 is determined by the p-type junction-grading S/D dopant in the vicinity of source-body junction 364. The p-type junction-grading S/D dopant thereby causes the p-type vertical dopant gradient in source 360 to be reduced in the vicinity of source-body junction 364.

Symmetric low-leakage IGFETs 108V and 110V appear in FIG. 34.3 corresponding to FIG. 11.3. The vertical junction grading for n-channel IGFET 108V is achieved with largely identical heavily doped n-type lower S/D portions 440L and 442L which respectively underlie, and are respectively vertically continuous with, main S/D portions 440M and 442M. Although heavily doped, n+ lower S/D portions 440L and 442L are more lightly doped than n++ main S/D portions 440M and 442M. The lighter doping of lower S/D portions 440L and 442L compared to main S/D portions 440M and 442M respectively causes the vertical dopant concentration gradients across the portions of S/D-body junctions 446 and 448 extending respectively along lower S/D portions 440L and 442L to be reduced.

Figure 37A:
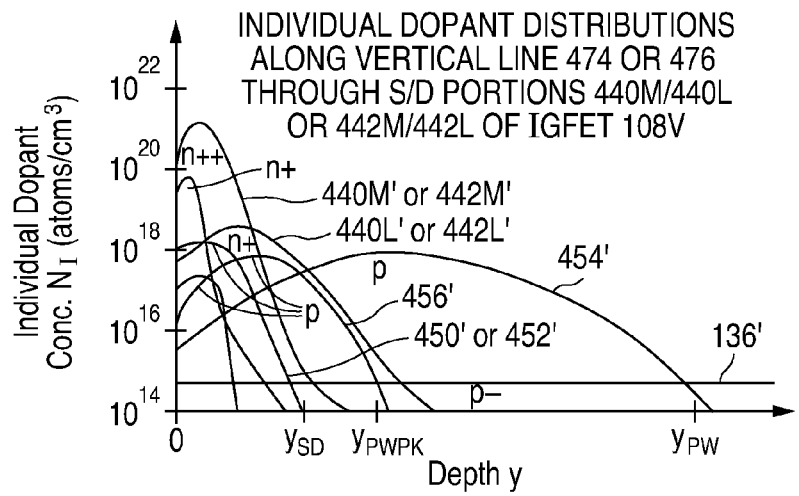
FIGS. 37*a*-37*c* are respective graphs of individual, total, and net dopant concentrations as a function of depth along an imaginary vertical line through the main and lower portions of either source/drain zone of the symmetric low-leakage n-channel IGFET of FIG. 34.3.
Figure 37B:
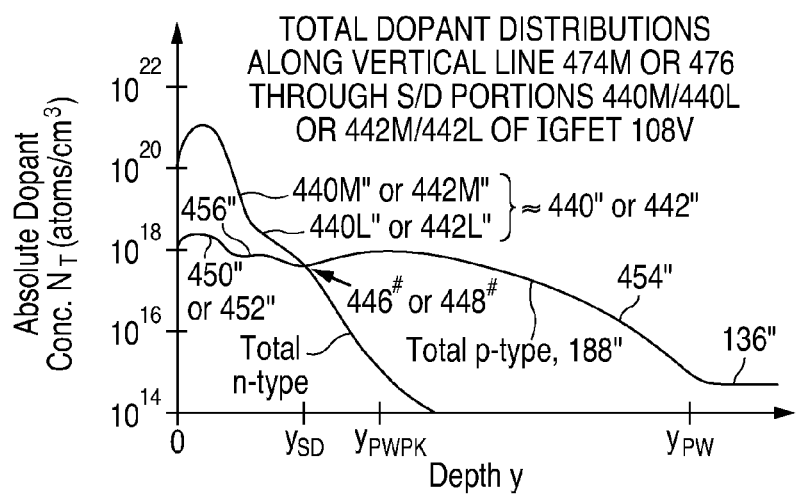
Figure 37C:
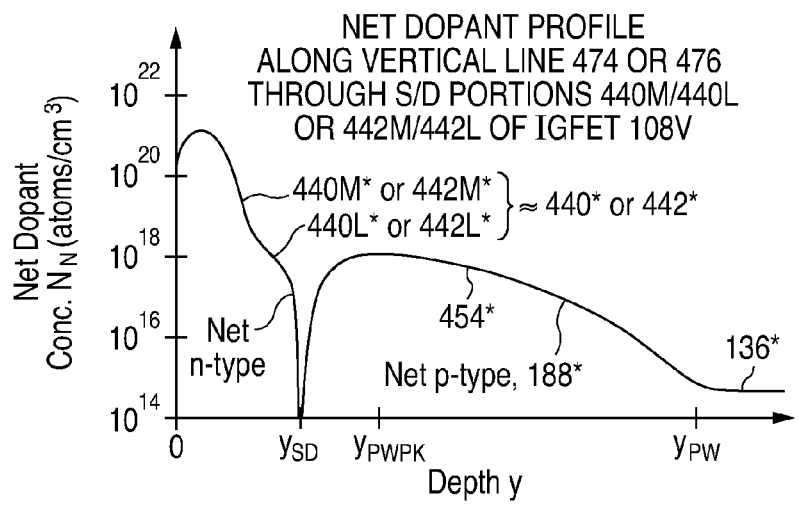

Lower S/D portions 440L and 442L are defined with the n-type junction-grading S/D dopant. An understanding of how the n-type junction-grading S/D dopant reduces the vertical dopant concentration gradients across S/D-body junctions 446 and 448 of symmetric IGFET 108 is facilitated with the assistance of FIGS. 37a, 37b, and 37c (collectively "FIG. 37"). FIG. 37 presents exemplary dopant concentrations as a function of depth y along vertical line 474 or 476 through S/D portions 440M and 440L or 442M and 442L and through underlying filled-well main body-material portion 456 and 454.

FIG. 37a, which is analogous to FIG. 31a for IGFET 108, specifically illustrates concentrations $N_I$, along vertical line 474 or 476, of the individual semiconductor dopants that vertically define regions 136, 440M, 440E, 440L, 442M, 442E, 442L, 460, 452, 454, 456, and 458 of graded junction IGFET 108V and thus respectively establish the vertical dopant profiles in S/D portions 440M and 440L or 442M and 442L and the underlying material of filled-well body-material portions 454 and 456. Curve 440L' or 442L' represents concentration $N_I$ (only vertical here) of the n-type junction grading S/D dopant that defines lower S/D portion 440L or 442L. The other curves in FIG. 37a have the same meanings as in FIG. 31a.

Analogous to FIG. 31b for IGFET 108, FIG. 37b variously depicts concentrations $N_T$ of the total p-type and total n-type dopants in regions 136, 440M, 440L, 442M, 442L, 454, and 456 along vertical line 474 or 476 of IGFET 108V. Curve 440L" or 442L" in FIG. 37b corresponds to lower S/D portion 440L or 442L. The other curves and curve segments in FIG. 37b have the same meanings as in FIG. 31b. Item 440" or 460" in FIG. 37b thus corresponds to S/D zone 440 or 442 and represents the combination of curve segments 440M", 440L", and 440E" or curve segments 442M", 442L", and 442E".

FIG. 37c, which is analogous to FIG. 31a for IGFET 108, presents net dopant concentration $N_N$ along vertical line 474 or 476 for IGFET 108V. Concentration $N_N$ of the net n-type dopant in lower S/D portion 440L or 442L is represented by curve segments 440L* or 442L* in FIG. 37c. The other curves and curve segments in FIG. 37c have the same meanings as in FIG. 31c. Item 440* or 442* in FIG. 37c corresponds to S/D zone 440 and represents the combination of curve segments 440M*, 440L*, and 440E* or curve segments 442M*, 442L*, and 442E*.

Curves 440L' and 440M' or 442L' and 442M' in FIG. 37a show that the n-type junction-grading S/D dopant reaches a maximum concentration in each S/D zone 440 or 442 along a subsurface location below the location of the maximum concentration of the n-type main S/D dopant in that S/D zone 440 or 442. In addition, curves 440L' and 440M' or 442L' and 442M' show that the maximum concentration of the n-type junction-grading S/D dopant in each S/D zone 440 or 442 is less than the maximum concentration of the n-type main S/D dopant in that S/D zone 440 or 442.

Referring to FIG. 37b, the distribution of the n-type junction-grading dopant in S/D zone 440 or 442 is controlled so that the shape of curve 440" or 442" representing concentration $N_T$ of the total n-type dopant in that S/D zone 440 or 442 is determined by the n-type junction-grading S/D dopant in the vicinity of S/D-body junction 446 or 448. Compare curve 440" or 442" in FIG. 37a to curve 440" or 442" in FIG. 31a. Inasmuch as the n-type junction-grading S/D dopant has a lower maximum dopant concentration than the n-type main S/D dopant in each S/D zone 440 or 442, the n-type junction-grading S/D dopant has a lower vertical concentration gradient than the n-type main S/D dopant at any particular dopant concentration. Accordingly, the n-type junction-grading S/D dopant causes the n-type vertical dopant gradient in each S/D zone 440 or 442 to be reduced in the vicinity of S/D-body junctions 446 or 448. The reduced junction vertical dopant gradient is reflected in curve 440* or 442* in FIG. 37c.

The vertical junction grading for p-channel IGFET 110V is achieved with largely identical heavily doped p-type lower S/D portions 480L and 482L which respectively underlie, and are respectively vertically continuous with, main S/D portions 480M and 482M. Again see FIG. 34.3. Although heavily doped, p+ lower S/D portions 480L and 482L are respectively more lightly doped than p++ main S/D portions 480M and 482M. The lighter p-type doping of lower S/D portion 480L or 482L causes the vertical dopant concentration gradient across the portion of S/D-body junction 446 or 448 extending along lower S/D portion 480L or 482L to be reduced.

Lower S/D portions 480L and 482L of IGFET 110V are defined with the p-type junction-grading S/D dopant. The dopant distribution of the p-type grading-junction S/D dopant relative to the dopant distribution of the p-type main S/D dopant is controlled in the same way that the dopant distribution of the n-type grading junction S/D dopant is controlled relative to the dopant distribution of the n-type main S/D dopant. In each S/D zone 480 or 482, the p-type junction-grading S/D dopant thereby reaches a maximum concentration along a subsurface location below the location of the maximum concentration of the p-type main S/D dopant. The p-type junction-grading S/D dopant in each S/D zone 480 or 482 also has a lower maximum concentration than the p-type main S/D dopant. More specifically, the distribution of the p-type junction-grading dopant in each S/D zone 480 or 482 is controlled so that the concentration of the total p-type dopant in that S/D zone 480 or 482 is determined by the p-type junction-grading S/D dopant in the vicinity of S/D-body junction 486 or 488. The p-type junction-grading S/D dopant thus causes the p-type vertical dopant gradient in each S/d zone 480 or 482 to be reduced in the vicinity of junction 486 or 488.

Nothing dealing with the vertical junction grading in symmetric low-leakage IGFETs 108 and 110 depends on their usage of filled main well regions 188 and 190. Accordingly, each of the other illustrated symmetric n-channel IGFETs, regardless of whether it uses a p-type filled main well, a p-type empty well, or no p-type well, can be provided with a pair of heavily doped n-type lower S/D portions that achieve vertical junction grading. Each of the other illustrated symmetric p-channel IGFETs, regardless of whether it uses an n-type filled main well, an n-type empty main well, or no n-type well, can similarly be provided with a pair of heavily doped p-type lower S/D portions that achieve vertical junction grading.

As mentioned above, the n-type junction-grading implantation for the n-channel IGFETs is performed in conjunction with the n-type main S/D implantation while photoresist mask 970 is in place prior to the initial spike anneal. The n-type junction-grading S/D dopant is ion implanted at a high dosage through the openings in photoresist 970, through the uncovered sections of surface dielectric layer 964 and into vertically corresponding portions of the underlying monosilicon to define (a) n+ lower source portion 240L and n+ lower drain portion, 242L of asymmetric IGFET 100, (b) n+ lower source portion 320L and n+ intermediate drain portion 910 of extended-drain IGFET 104, (c) n+ lower S/D portions 440L and 442L of symmetric n-channel IGFET 108, and (d) a pair of largely identical n+ lower S/D portions (not shown) for each other illustrated symmetric n-channel IGFET.

The n-type main and junction-grading S/D dopants both pass through substantially the same material along the upper semiconductor surface, namely surface dielectric layer 964. To achieve the n-type main and junction-grading dopant distributions described above, the implantation energies for the n-type main and junction-grading S/D implants are chosen so that the n-type grading S/D implant is of greater implantation range than the n-type main S/D implant. This enables the n-type junction-grading S/D dopant to be implanted to a greater average depth than the n-type main S/D dopant. In addition, the n-type junction-grading S/D dopant is implanted at a suitably lower dosage than the n-type main S/D dopant.

When the n-type main S/D dopant is implanted at the dosage given above, the lower dosage of the n-type junction-grading S/D dopant is normally $1\times10^{13}$–$1\times10^{14}$ ions/cm$^2$, typically $3\times10^{13}$–$4\times10^{13}$ ions/cm$^2$. The n-type junction-grading S/D dopant, normally consisting of phosphorus or arsenic, is usually of lower atomic weight than the n-type main S/D dopant. For the typical case in which arsenic constitutes the n-type main S/D dopant while lower-atomic-weight phosphorus constitutes the n-type junction-grading S/D dopant, the implantation energy of the n-type junction-grading S/D dopant is normally 20-100 keV, typically 100 keV. Alternatively, the n-type junction-grading dopant can consist of the same element, and thus be of the same atomic weight, as the n-type main S/D dopant. In that case, the n-type junction-grading dopant is implanted at a suitably higher implantation energy than the n-type main S/D dopant.

As also mentioned above, the p-type junction-grading implantation for the p-channel IGFETs is similarly performed prior to the further spike anneal in conjunction with the p-type main S/D implantation while photoresist mask 972 is in place. The p-type junction-grading S/D dopant is ion implanted at a high dosage through the openings in photoresist 972, through the uncovered sections of surface dielectric layer 964 and into vertically corresponding portions of the underlying monosilicon to define (a) p+ lower source portion 280L and p+ lower drain portion 282L of asymmetric IGFET 102, (b) p+ lower source portion 360L and p+ intermediate drain portion 912 of extended-drain IGFET 106, (c) p+ lower S/D portions 480L and 482L of symmetric p-channel IGFET 108, and (d) a pair of largely identical p+ lower S/D portions (not shown) for each other illustrated symmetric p-channel IGFET.

As with the n-type main and junction-grading S/D dopants, the p-type main and junction-grading S/D dopants both pass through substantially the same material along the upper semiconductor surface, again namely surface dielectric layer 964. In order to achieve the requisite p-type main and junction-grading dopant distributions, the implantation energies for the p-type main and junction-grading S/D implants are chosen so that the p-type grading S/D implant has a greater implantation range than the p-type main S/D implant. As a result, the p-type junction-grading S/D dopant is implanted to a greater average depth than the p-type main S/D dopant. The p-type junction-grading S/D dopant is also implanted at a suitably lower dosage than the p-type main S/D dopant.

For implanting the p-type main S/D dopant at the dosage given above, the lower dosage of the p-type junction-grading S/D dopant is normally $1\times10^{13}$–$1\times10^{14}$ ions/cm$^2$, typically $4\times10^{13}$ ions/cm$^2$. As with the p-type main S/D dopant, the p-type junction-grading S/D dopant normally consists of boron in elemental form. The implantation energy is normally 10-30 keV, typically 15-20 keV.

P. Asymmetric IGFETs with Multiply Implanted Source Extensions

Figure 38:
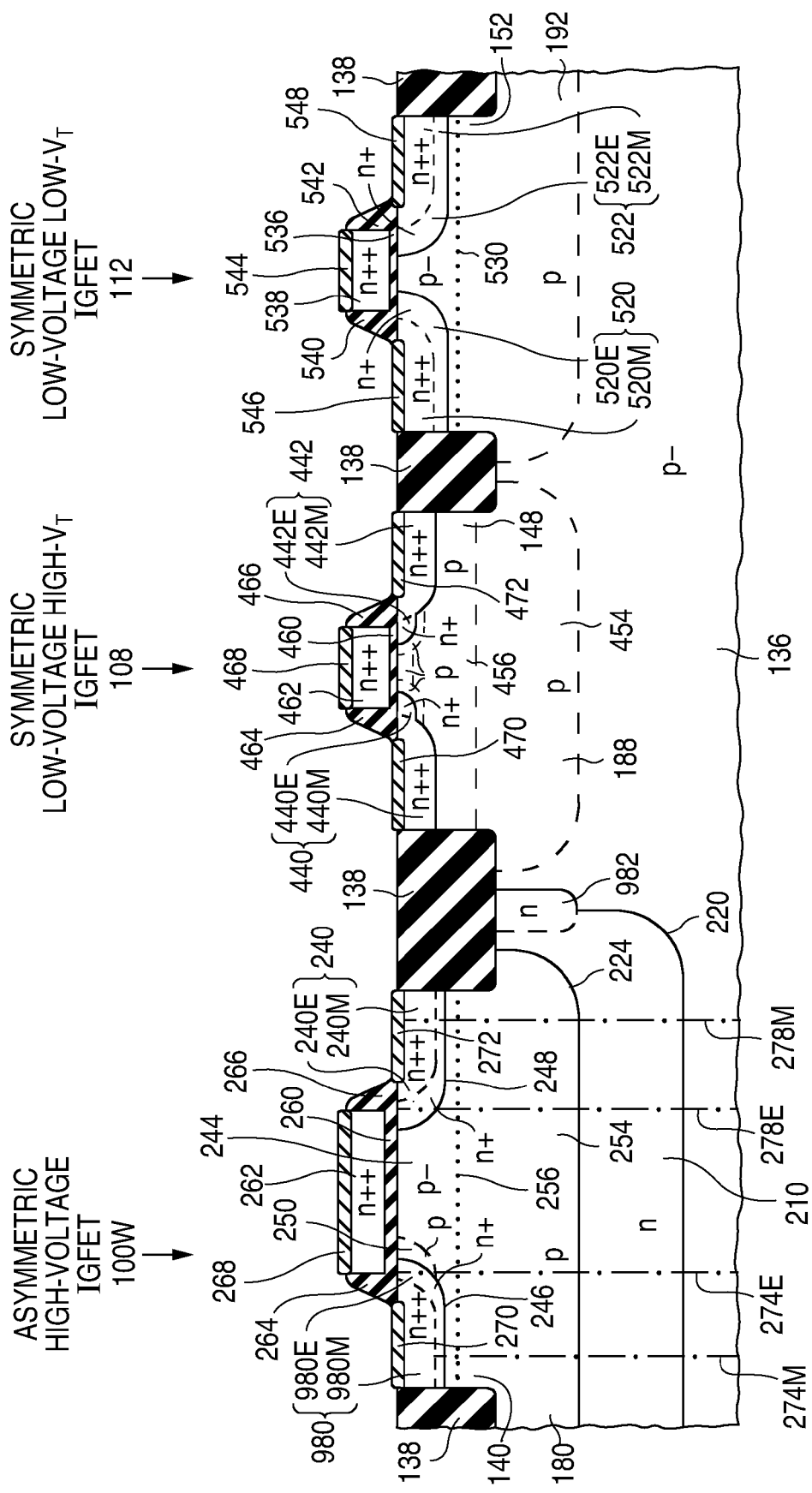
FIG. 38 is a front cross-sectional view of an n-channel portion of another CIGFET semiconductor structure configured according to the invention.

P1. Structure of Asymmetric N-Channel IGFET with Multiply Implanted Source Extension FIG. 38 illustrates an n-channel portion of a variation of the CIGFET semiconductor structure of FIG. 11 configured according to the invention. The n-channel semiconductor structure of FIG. 38 contains symmetric low-voltage low-leakage high-$V_T$ n-channel IGFET 108, symmetric low-voltage low-$V_T$ n-channel IGFET 112, and a variation 100W of asymmetric high-voltage n-channel IGFET 100. Except as described below, asymmetric high-voltage n-channel IGFET 100W is configured substantially the same as IGFET 100 in FIG. 11.1.

In place of n-type source 240, asymmetric IGFET 100W has an n-type source 980 consisting of a very heavily doped main portion 980M and a more lightly doped lateral extension 980E. Although more lightly doped than n++ main source portion 980M, lateral source extension 980E is still heavily doped. External electrical contact to source 980 is made via main source portion 980M. N+ lateral source extension 980E and n+ lateral drain extension 242E terminate channel zone 244 along the upper semiconductor surface. Gate electrode 262 extends over part of lateral source extension 980E but normally not over any part of n++ main source portion 980M.

Drain extension 242E is more lightly doped than source extension 980E similar to how drain extension 242E of asymmetric IGFET 100 is more lightly doped than its source extension 240E. However, different from IGFET 100, source extension 980E is defined by ion implanting n-type semiconductor dopant in at least two separate implantation operations. The source-extension implantations are normally performed under such conditions that the concentration of the total n-type semiconductor dopant defining source extension 980E locally reaches at least two respectively corresponding subsurface concentration maxima in source 980. This enables the vertical dopant profile in source extension 980E to be configured in a desired manner.

Each of the subsurface concentration maxima that define source extension 980E in IGFET 100W normally occurs at a different subsurface location in source 980. More particularly, each of these subsurface maximum-concentration locations is normally at least partially present in source extension 980E. Each of these maximum-concentrations normally extends fully laterally across source extension 980E. In particular, one such maximum-concentration location at an average depth y less than depth $y_{SM}$ of main source portion 980M normally extends from halo pocket portion 250 to source portion 980M. Another such maximum-concentration location at an average depth y greater than depth $y_{SM}$ of main source portion 980M extends from halo pocket portion 250 under source portion 980M to field-insulation region 138. Due to the way in which the n-type semiconductor dopant is normally ion implanted in defining source extension 980E, one or more of the maximum-concentration locations for source extension 980E normally extends into main source portion 980M.

Main source portion 980M and main drain portion 242M of IGFET 100W are defined by ion implantation of the n-type main S/D dopant in the same way as main source portion 240M and main drain portion 242M of IGFET 100. The concentration of the n-type dopant that defines main source portion 980M of IGFET 100W thus locally reaches another subsurface concentration maximum in source 980, specifically main source portion 980M. Hence, the concentration of the dopant that defines source 980 locally reaches a total of at least three subsurface concentration maxima in source 980, one in main source portion 980M and at least two others in source extension 980E. In other words, main source portion 980M is defined by the dopant distribution attendant to one subsurface maximum in the concentration of the total n-type dopant in source 980, specifically main source portion 980M, while source extension 980E is defined by the dopant distribution attendant to at least two other subsurface maxima in the concentration of the total n-type dopant in source 980, specifically source extension 980E.

One of the ion implantation operations used in defining source extension 980E is normally utilized in defining drain extension 242E. The main S/D ion implantation operation employed in defining main source portion 980M and main drain portion 242M of IGFET 100W is normally performed so that drain extension 242E of IGFET 100W extends deeper than its main drain portion 242M in the same way that drain extension 242E of IGFET 100 extends deeper than its main drain portion 242M. Source extension 980E of IGFET 100W thereby normally extends deeper than main source portion 980M.

At least one of the ion implantation operations used in defining source extension 980E is not utilized in defining drain extension 242E. IGFET 100W is therefore asymmetric with respect to its lateral extensions 980E and 242E. In addition, p halo pocket portion 250 extends along source extension 980E into channel zone 244. This causes channel zone 244 to be asymmetric with respect to source 980 and drain 242 so as to provide IGFET 100W with further asymmetry.

Source 980 of IGFET 100W is of similar configuration to source 240 of asymmetric graded junction high-voltage n-channel IGFET 100V. The concentrations of the individual n-type semiconductor dopants that define source 240 of IGFET 100V locally reaches three subsurface concentration maxima in its source 240 as indicated in FIG. 35a. These three subsurface concentration maxima respectively define main source portion 240M, source extension 240E, and lower source portion 240L which provides the vertical source-body junction grading. The individual dopant distributions along vertical line 274M through source 980 is typically similar to the individual dopant distributions along line 274M through source 240 of IGFET 100V as depicted in FIG. 35a. Likewise, the total dopant distributions and net dopant profile along line 274M through source 980 are respectively typically similar to the total dopant distributions and net dopant profile along line 274M through source 240 of IGFET 100V as respectively depicted in FIGS. 35b and 35c.

The combination of source extension 240E and lower source portion 240L of graded-junction IGFET 100V is similar to source extension 980E of IGFET 100W. One significant difference is that each of the subsurface locations of the maximum concentrations of the n-type semiconductor dopant which defines source extension 980E of IGFET 100W normally extends laterally further toward drain 242 than the subsurface location of the maximum concentration of the n-type semiconductor dopant which defines lower source portion 240L of IGFET 100V. This arises, as discussed below, from the dopant-blocking procedure used in performing the n-type ion implantations which define source extension 980E of IGFET 100W. Another difference is that the dopant concentration at the location of the deepest subsurface concentration maxima in source extension 980 may be greater than the dopant concentration at the location of the subsurface concentration maximum which defines lower source portion 240L in IGFET 100V.

The n-channel structure of FIG. 38 includes an isolating moderately doped n-type well region 982 situated below field-insulation region 138 and between deep n well region 210 of IGFET 100W and n-type main well region 188 of IGFET 108. N well 982 assists in electrically isolating IGFETs 100W and 108 from each other. N well 982 can be deleted in embodiments where n-channel IGFET 100W is not adjacent to another n-channel IGFET.

The larger semiconductor structure containing the n-channel structure of FIG. 38 may generally include any of the other IGFETs described above. Additionally, the larger semiconductor structure may include a variation of asymmetric high-voltage p-channel IGFET 102 whose p-type source is configured the same as n-type source 980 with the conductivity types reversed.

Figure 39A:
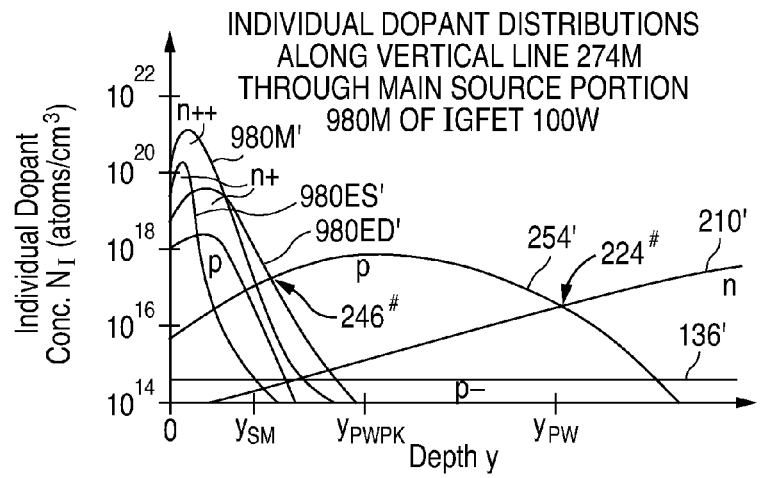
FIGS. 39*a*-39*c* are respective graphs of individual, total, and net dopant concentrations as a function of depth along an imaginary vertical line through the main source portion of the asymmetric n-channel IGFET of FIG. 38.
Figure 39B:
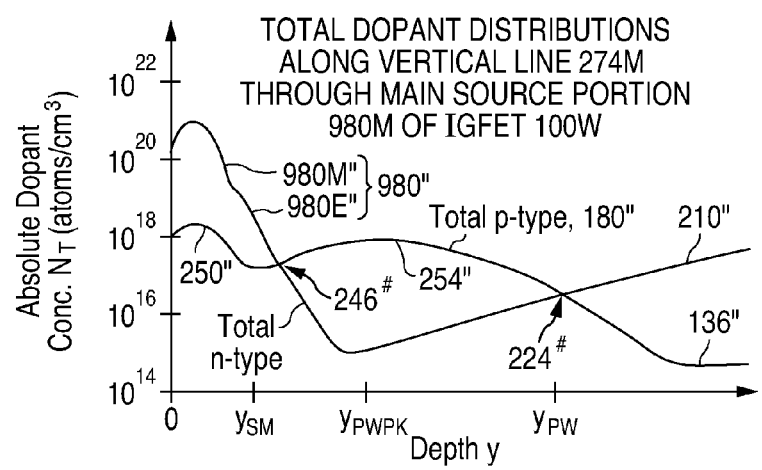
Figure 39C:
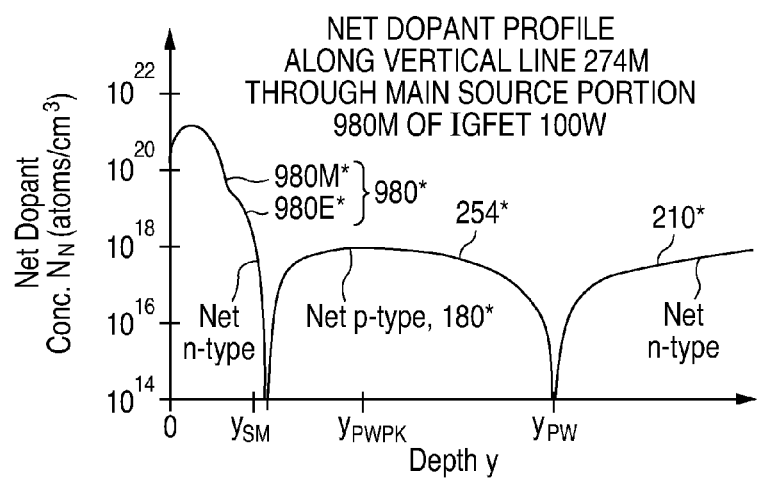
Figure 40A:
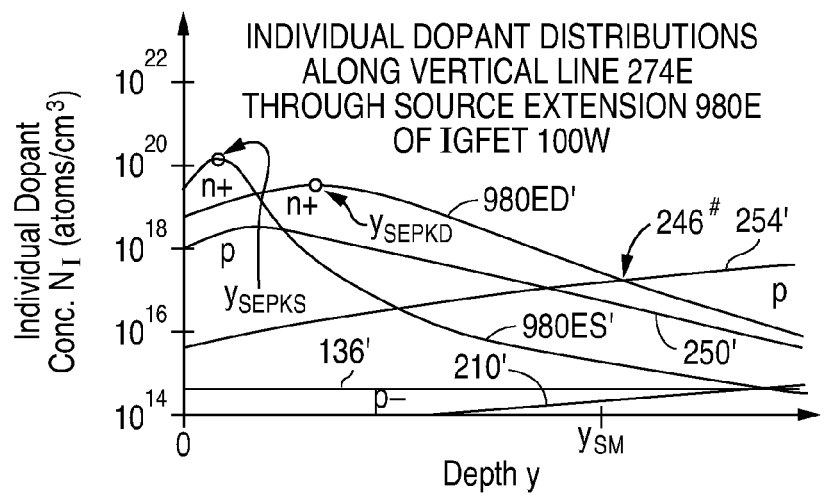
FIGS. 40*a*-40*c* are respective graphs of individual, total, and net dopant concentrations as a function of depth along an imaginary vertical line through the source extension of the asymmetric n-channel IGFET of FIG. 38.
Figure 40B:
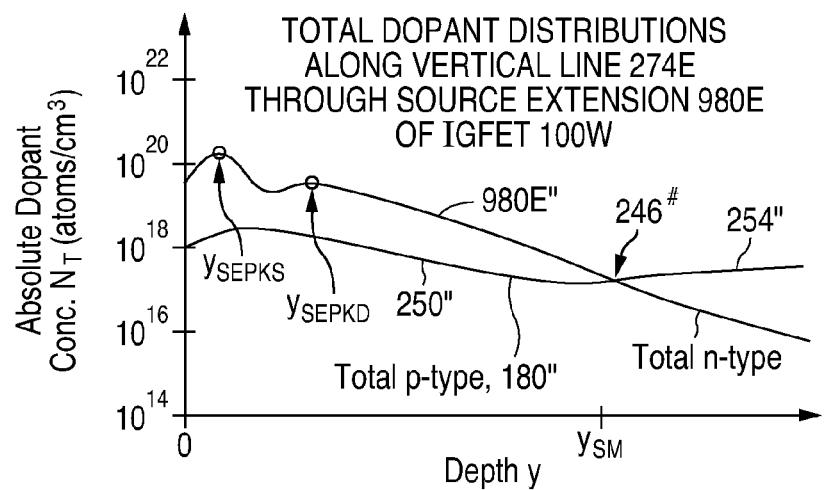
Figure 40C:
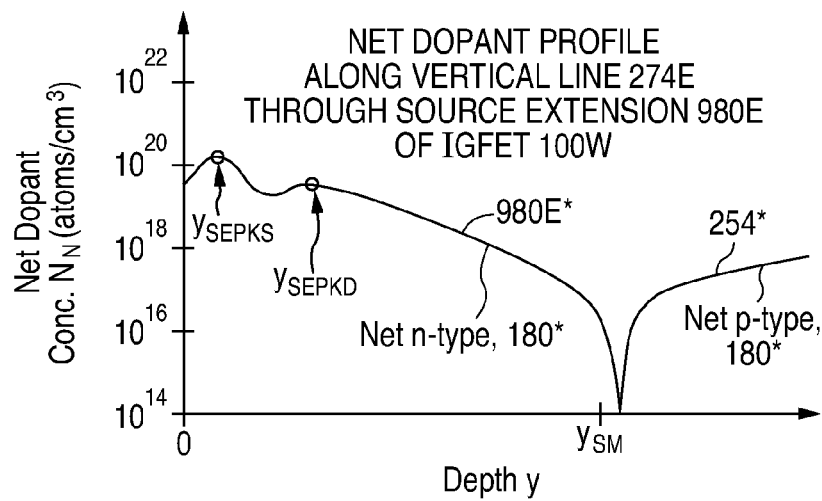

A further understanding of the doping characteristics in source 980 of asymmetric IGFET 100W is facilitated with the assistance of FIGS. 39a, 39b, and 39c (collectively "FIG. 39") and FIGS. 40a, 40b, and 40c (collectively "FIG. 40"). FIGS. 39 and 40 represent a typical example in which source extension 980E is defined by two separate semiconductor-dopant ion implantation operations performed with the n-type shallow S/D-extension dopant and the n-type deep S/D-extension dopant. Exemplary dopant concentrations as a function of depth y along vertical line 274M through main source portion 980M are presented in FIG. 39. FIG. 40 presents exemplary dopant concentrations as a function of depth y along vertical line 274E through source extension 980E.

FIGS. 39a and 40a, which are respectively analogous to FIGS. 14a and 15a for IGFET 100, specifically illustrate concentrations $N_I$, along vertical lines 274M and 274E, of the individual semiconductor dopants that vertically define regions 136, 210, 980M, 980E, 250, and 254 of IGFET 100W and thus respectively establish the vertical dopant profile in main source portion 980M, source extension 980E, and the underlying material of empty-well body-material portion 254. Curves 980ES' and 980ED' in FIGS. 39a and 40a respectively represent concentrations $N_I$ (only vertical here) of the n-type shallow and deep S/D-extension dopants. Analogous to curve 240M' in FIG. 14a, curve 980M' in FIG. 39a represents concentration $N_I$ (again only vertical here) of the n-type main S/D dopant used to form main source portion 980M. The other curves in FIGS. 39a and 40a have the same meanings as in FIGS. 14a and 18a.

Analogous respectively to FIGS. 14b and 15b for IGFET 100, FIGS. 39b and 40b variously depict concentrations $N_T$ of the total p-type and total n-type dopants in regions 136, 210, 980M, 980E, 250, and 254 along vertical lines 274M and 274E of IGFET 100W. Curves 980M" and 980E" in FIGS. 39b and 40b respectively correspond to main source portion 980M and source extension 980E. Item 980" in FIG. 39b corresponds to source 980 and represents the combination of curve segments 980M" and 980E". The other curves and curve segments in FIGS. 39b and 40b have the same meanings as in FIGS. 14b and 15b.

Figure 14C:
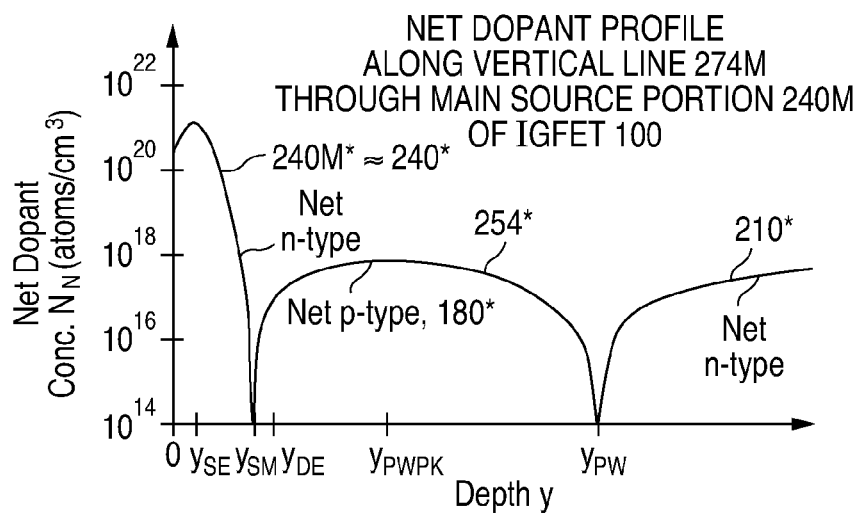

FIGS. 39c and 40c, which are respectively analogous to FIGS. 14c and 15c for IGFET 100, present net dopant concentration $N_N$ along vertical lines 274M and 274E for IGFET 100W. Concentrations $N_N$ of the net n-type dopants in main source portion 980M and source extension 980E are respectively represented by curve segments 980M* and 980E* in FIGS. 39c and 40c. Item 980* in FIG. 39c corresponds to source 980 and represents the combination of curve segments 980M* and 980E*. The other curves in FIGS. 39c and 40c have the same meanings as in FIGS. 14c and 15c.

The ion implantations of the n-type shallow and deep S/D-extension dopants normally cause them to reach their respective maximum concentrations along subsurface locations at respective different average depths $y_{SEPKS}$ and $y_{SEPKD}$. A small circle on curve 980ES' in FIG. 40a indicates depth $y_{SEPKS}$ of the maximum value of concentration $N_I$ of the n-type shallow S/D-extension dopant in source extension 980E. A small circle on curve 980ED' in FIG. 40a similarly indicates depth $y_{SEPKD}$ of the maximum value of concentration $N_I$ of the n-type deep S/D-extension dopant in source extension 980E.

Concentration $N_I$ of the deep n well dopant in source extension 980E is negligible compared to concentration $N_I$ of either n-type S/D-extension dopant in extension 980E at any depth y less than or equal to maximum depth $y_{SE}$ of extension 980E. Concentration $N_T$ of the total n-type dopant in source extension 980E, as represented by curve 980E" in FIG. 40b, is thus virtually equal to the sum of concentrations $N_I$ of the n-type shallow and deep S/D-extension dopants. Since concentrations $N_I$ of the n-type shallow and deep S/D-extension dopants respectively reach maximum concentrations at average depths $y_{SEPKS}$ and $y_{SEPKD}$, concentration $N_T$ of the total n-type dopant in source extension 980E substantially reaches a pair of local concentration maxima at depths $y_{SEPKS}$ and $y_{SEPKD}$. Subject to net concentration $N_N$ going to zero at source-body junction 246, this double-maxima situation is substantially reflected in FIG. 40c by curve 980E* which represents net concentration $N_N$ in source extension 980E.

Curves 980ES' and 980ED' appear in FIG. 39a and reach respective maximum subsurface concentrations. Although depths $y_{SEPKS}$ and $y_{SEPKD}$ are not specifically indicated in FIG. 39a, the presence of curves 980ES' and 980ED' in FIG. 39a shows that the subsurface locations of the concentrations $N_I$ of the n-type shallow and deep S/D-extension dopants extend into main source portion 980M. Curve 980M' in FIG. 39a represents concentration $N_I$ of the n-type main S/D dopant. As FIG. 39a shows, curve 980M' reaches a maximum concentration at a subsurface location. Consequently, the n-type shallow S/D-extension dopant, n-type deep S/D-extension dopant, and n-type main S/D dopant are all present in main source portion 980M and reach respective maximum concentrations in main source portion 980M.

In the example of IGFET 100W represented by FIGS. 39 and 40, concentration $N_I$ of the n-type shallow S/D-extension dopant in main source portion 980M is negligible compared to concentration $N_I$ of the main S/D dopant in source portion 980M at any depth y. However, concentration $N_I$ of the n-type deep S/D-extension dopant in main source portion 980M exceeds concentration $N_I$ of the main S/D dopant in source portion 980M for depth y sufficiently great. As shown in FIG. 39b, the variation of curve 980" representing concentration $N_T$ of the total n-type dopant in main source portion 980M only reflects the maximum concentration of the deeper of the two n-type S/D-extension dopants. Subject to net concentration $N_N$ going to zero at source-body junction 246, this variation is substantially reflected in FIG. 39c by curve 980* representing net concentration $N_N$ in main source portion 980M.

Concentration $N_I$ of each n-type S/D-extension dopant in main source portion 980M may be negligible compared to concentration $N_I$ of the main S/D dopant in source portion 980M at any depth y in other examples of IGFET 100W. In that case, concentration $N_T$ of the total n-type dopant in main source portion 980M substantially equals concentration $N_I$ of the n-type main S/D dopant at any depth y.

The dopant distributions in drain extension 242E of IGFET 100W may be somewhat different from the dopant distributions in drain extension 242E of IGFET 100 due to compromises made to optimize the performance of IGFET 100W and the other n-channel IGFETs, including n-channel IGFETs 108 and 112. Aside from this, the individual dopant distributions, total dopant distributions, and net dopant profile along line 278M through main drain portion 242M of IGFET 100W are respectively typically similar to the individual dopant distributions, total dopant distributions, and net dopant profile along line 278M through main drain portion 242M of IGFET 100 as respectively depicted in FIGS. 18a, 18b, and 18c. The individual dopant distributions, total dopant distributions, and net dopant profile along line 278E through drain extension 242E of IGFET 100W are likewise respectively typically similar to the individual dopant distributions, total dopant distributions, and net dopant profile along line 278E through drain extension 242E of IGFET 100 as respectively depicted in FIGS. 17a, 17b, and 17c.

Taking note of the above-mentioned differences between IGFETs 100V and 100W, either of asymmetric n-channel IGFETs 100U and 100V can be provided in a variation in which source 240 is replaced with an n-type source configured the same as source 980 to include a very heavily doped n-type main portion and a more lightly doped, but still heavily doped, n-type source extension defined by ion implanting n-type semiconductor dopant in at least two separate implantation operations so that the concentration of the total n-type semiconductor dopant defining the source extension normally locally reaches at least two respectively corresponding subsurface concentration maxima in the source in generally the same manner as in source 980, namely (a) each of the subsurface concentration maxima defining the source extension normally occurs at a different subsurface location in the source and (b) each of these subsurface maximum-concentration locations is normally at least partially present in the source extension and normally extends fully laterally across the source extension.

Figure 41A:
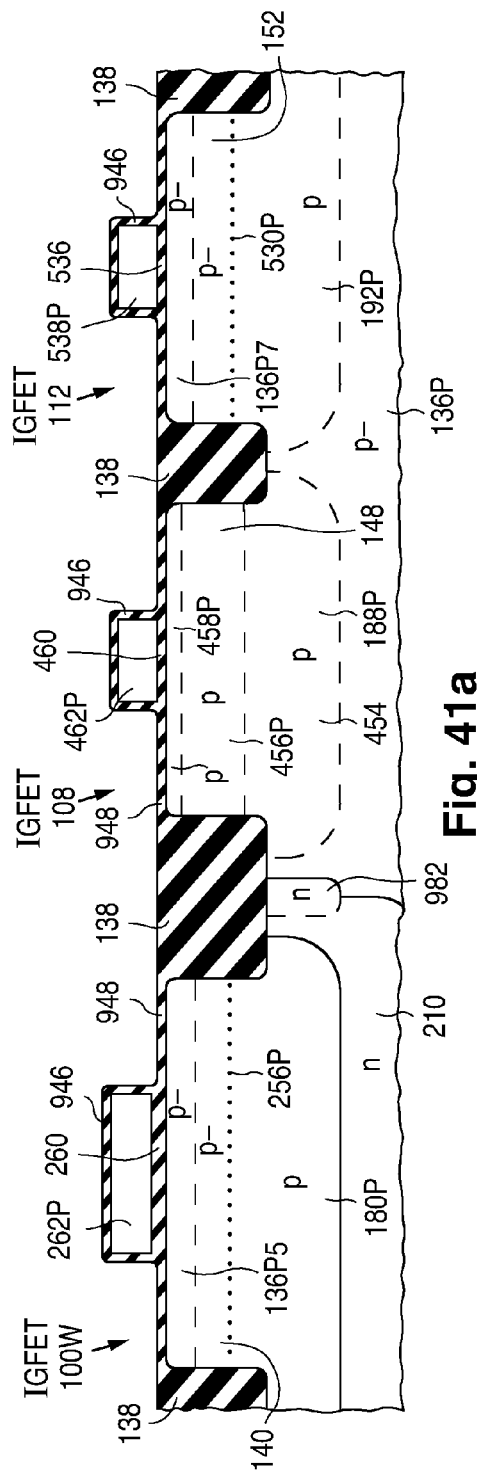

P2. Fabrication of Asymmetric N-Channel IGFET with Multiply Implanted Source Extension FIGS. 41a-41f (collectively "FIG. 41") illustrate part of a semiconductor process in accordance with the invention for manufacturing the n-channel semiconductor structure of FIG. 38 starting at the stage of FIG. 33l at which the precursor gate electrodes 262P, 462P, and 538P have been respectively defined for n-channel IGFETs 100W, 108, and 112. FIG. 41a depicts the structure at this point. The fabrication of IGFET 100W up through the stage of FIG. 41a is the same as the fabrication of IGFET 100 up to through the stage of FIG. 33l.

Figure 41B:
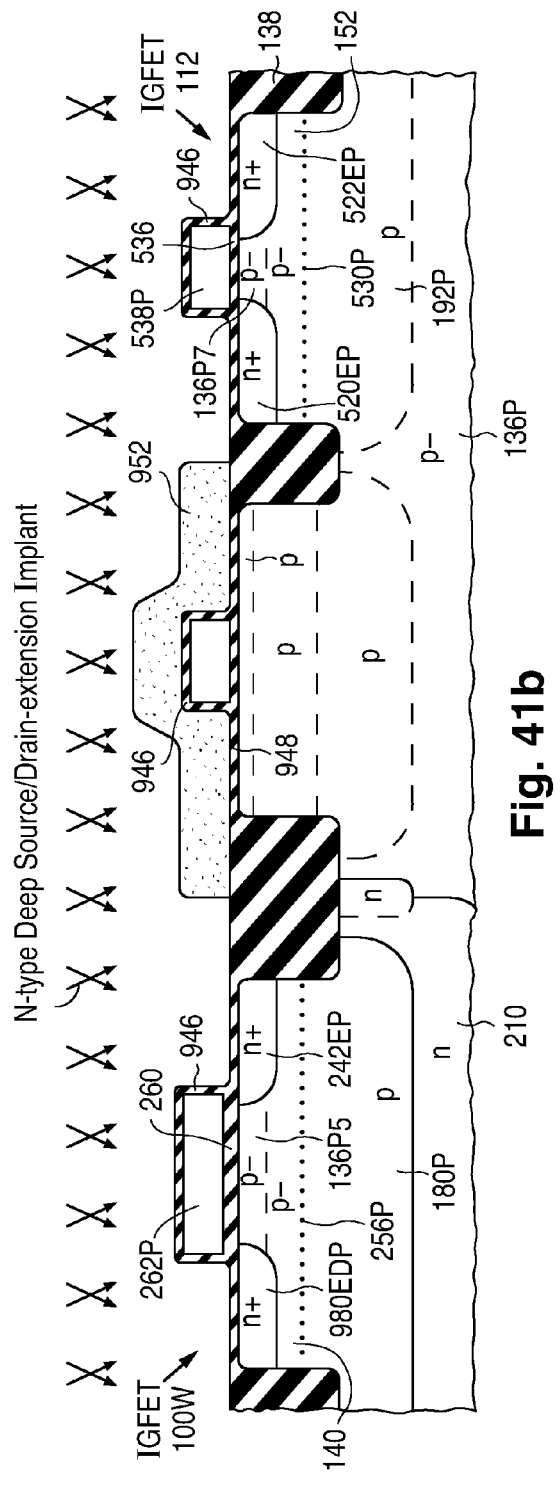

Photoresist mask 952 used in the fabrication process of FIG. 33 is formed on dielectric layers 946 and 948 as shown in FIG. 41*b*. Photoresist 952 now has openings above islands 140 and 152 for IGFETs 100W and 112. The n-type deep S/D-extension dopant is ion implanted at a high dosage through the openings in photoresist 952, through the uncovered sections of surface dielectric 948, and into vertically corresponding portions of the underlying monosilicon to define (a) an n+ deep partial precursor 980EDP to source extension 980E of IGFET 100W, (b) n+ precursor 242EP to drain extension 242E of IGFET 100W, and (c) n+ precursors 520EP and 522EP to respective S/D extensions 520E and 522E of IGFET 112.

The n-type deep S/D-extension implantation can be performed in a slightly tilted manner with tilt angle α approximately equal to 7° or in a manner sufficiently tilted as to constitute angled implantation for which tilt angle α is at least 15°, normally 20-45°. In the angled-implantation case, deep partial precursor source extension and 980EDP and precursor drain extension 242EP of IGFET 100W extend significantly laterally under its precursor gate electrode 262P. Precursor S/D extensions 520EP and 522EP of IGFET 112 then similarly extend significantly laterally under its precursor gate electrode 538P. The n-type deep. S/D-extension implantation is otherwise typically performed as described above in connection with the process of FIG. 33 subject to modifying the implant dosage, implant energy, and, in the case of angled implantation, tilt angle α in order to optimize the characteristics of IGFETs 100W and 112. The n-type deep S/D-extension dopant is typically arsenic but can be phosphorus.

Photoresist mask 952 substantially blocks the n-type deep S/D-extension dopant from entering the monosilicon intended for IGFET 108. Hence, the n-type deep S/D-extension dopant is substantially prevented from entering the monosilicon portions intended for S/D extensions 440E and 442E of IGFET 108. Photoresist 952 is removed.

Photoresist mask 950 also used in the fabrication process of FIG. 33 is formed on dielectric layers 946 and 948 as shown in FIG. 41*c*. Photoresist 950 now has openings above the location for source extension 240E of IGFET 100 and above island 148 for IGFET 108. The n-type shallow S/D-extension dopant is ion implanted at a high dosage through the openings in photoresist 950, through the uncovered sections of surface dielectric 948, and into vertically corresponding portions of the underlying monosilicon to define (a) an n+ shallow partial precursor 980ESP to source extension 980E of IGFET 100W and (b) n+ precursors 440EP and 442EP to respective S/D extensions 440E and 442E of IGFET 108.

The n-type shallow S/D-extension implantation is typically performed as described above in connection with the process of FIG. 33 subject to modifying the implant dosage and implant energy in order to optimize the characteristics of IGFETs 100W and 108. Tilt angle α is again normally equal to approximately 7° during the n-type shallow S/D-extension implantation. The n-type shallow S/D-extension dopant is typically arsenic but can be phosphorus.

Photoresist mask 950 substantially blocks the n-type shallow S/D-extension dopant from entering (a) precursor drain extension 242EP of IGFET 100W and (b) the monosilicon intended for IGFET 112. The n-type shallow S/D-extension dopant is thereby substantially prevented from entering (a) the monosilicon portion intended for drain extension 242E of IGFET 100W and (b) the monosilicon portions intended for S/D extensions 520E and 522E of IGFET 112.

The n-type shallow S/D-extension implantation is selectively performed at different implantation conditions than the n-type deep S/D-extension implantation. The conditions for the two n-type S/D-extension implantations are normally chosen so that average depths $y_{SEPKS}$ and $y_{SEPKD}$ of the two implantations are different. In particular, depth $y_{SEPKD}$ exceeds depth $y_{SEPKS}$. The n-type shallow S/D-extension implantation is normally performed at a different, typically greater, dosage than the n-type deep S/D-extension implantation. The characteristics, e.g., the vertical dopant distributions, of the following three sets of precursor S/D extensions are therefore all selectively mutually different: (a) precursor source extension 980EP which receives both n-type S/D-extension dopants, (b) precursor drain extension 242EP and precursor S/D extensions 520EP and 522EP which receive only the n-type deep S/D-extension dopant, and (c) precursor S/D extensions 440EP and 442EP which receive only the n-type shallow S/D-extension dopant. Accordingly, the characteristics of (a) final source extension 980E of IGFET 100W, (b) final drain extension 242E of IGFET 100W and final S/D extensions 520E and 522E of IGFET 112, and (c) final S/D extensions 440E and 442E of IGFET 108 all selectively mutually different.

With photoresist mask 950 still in place, the p-type S/D halo dopant is ion implanted at a moderate dosage through the openings in photoresist 950, through the uncovered sections of surface dielectric layer 948, and into vertically corresponding portions of the underlying monosilicon to define (a) p precursor 250P to source-side halo pocket portion 250 of IGFET 100W and (b) p precursors 450P and 452P to respective halo pocket portions 450 and 452 of IGFET 108. See FIG. 41*d*. The p-type S/D halo implantation is typically performed in a significantly angled manner as described above in connection with the process of FIG. 33. Photoresist 950 is removed.

Figure 41E:
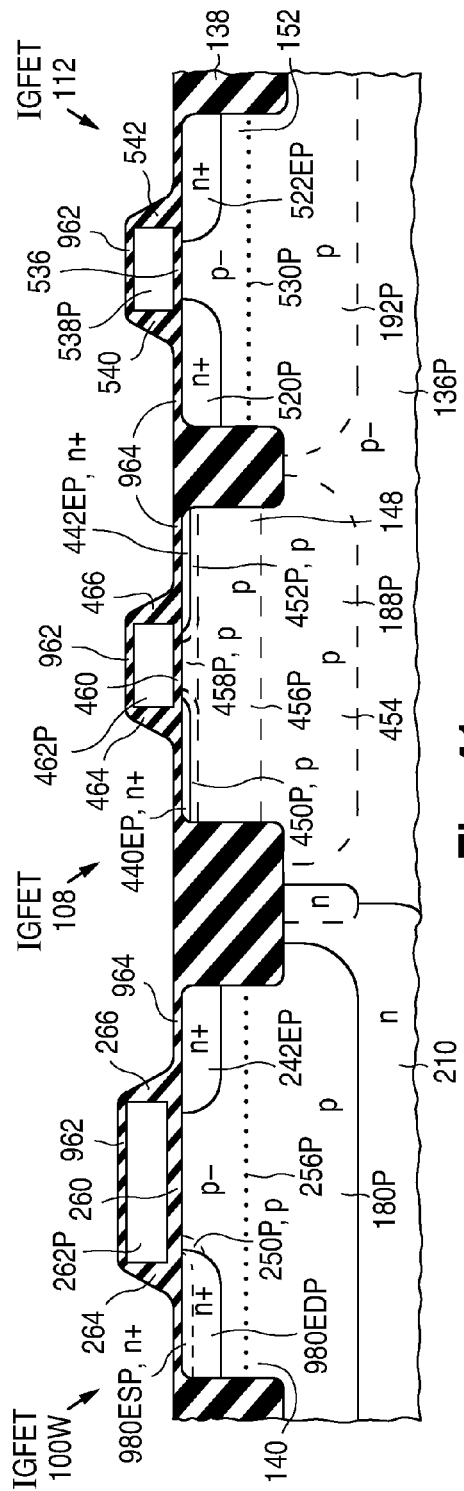

The operations performed with photoresist mask 950 can be performed before the n-type deep S/D-extension implantation performed with photoresist mask 952. In either case, the remainder of the IGFET fabrication is performed as described above in connection with the process of FIG. 33. FIG. 41*e* shows how the structure appears at the stage of FIG. 33*w* when dielectric gate sidewall spacers 264, 266, 464, 466, 540, and 542 are formed. At this point, precursor empty main well regions 180P and 192P have normally reached the upper semiconductor surface. Isolated p-epitaxial-layer portions 136P5 and 136P7 which previously appeared in FIG. 41 have shrunk to zero and do not appear in the remainder of FIG. 41.

Figure 41F:
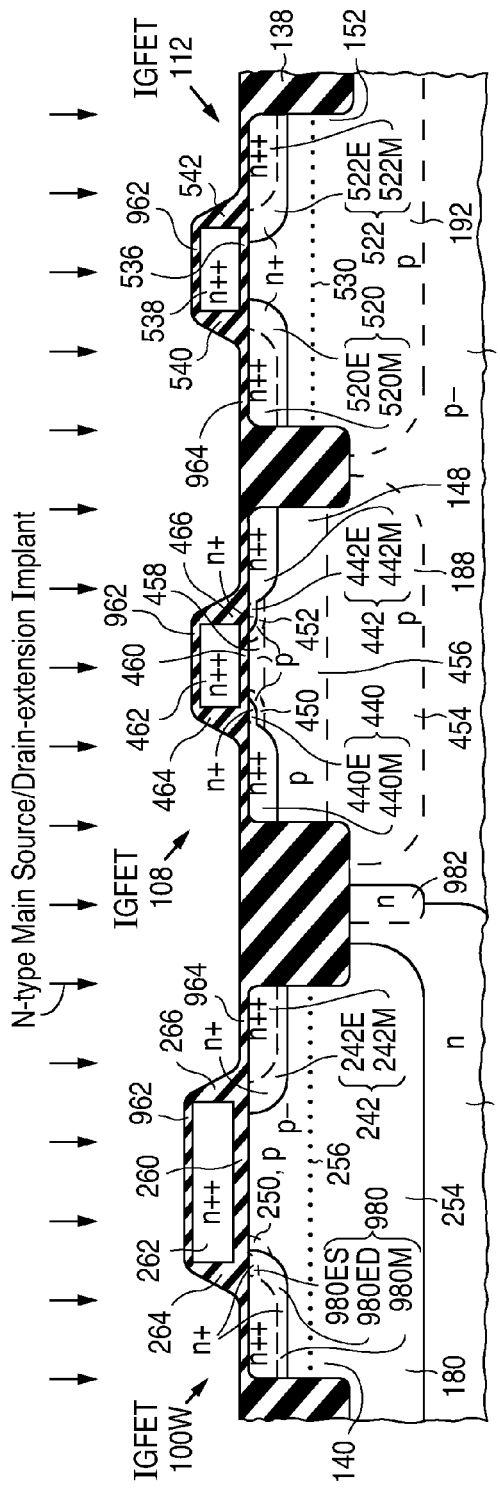

FIG. 41*f* illustrates the n-type main S/D implantation performed at the stage of FIG. 33*x* in the process of FIG. 33. Photoresist mask 970 having opening above islands 140, 148 and 152 for IGFETs 100W, 108, and 112 is formed on dielectric layers 962 and 964. Although photoresist 970 does not appear in FIG. 41*f* because only IGFETs 100W, 108, and 112 appear in FIG. 41*f*, the n-type main S/D dopant is ion implanted at a very high dosage through the openings in photoresist 970, through the uncovered sections of surface dielectric layer 964, and into vertically corresponding portions of the underlying monosilicon to define (a) n++ main source portion 980M and n++ main drain portion 242M of IGFET 100W, (b) n++ main S/D portions 440M and 442M of IGFET 108, and (c) n++ main S/D portions 520M and 522M of IGFET 112.

As in the stage of FIG. 33*x*, the n-type main S/D dopant also enters precursor gate electrodes 262P, 462P, and 538P for IGFETs 100W, 108, and 112, thereby converting precursor electrodes 262P, 462P, and 538P respectively into n++ gate electrodes 262, 462, and 538. The n-type main S/D implantation is performed in the manner, and at the conditions, described above, in connection with the process of FIG. 33. Photoresist 970 is removed.

After the initial spike anneal performed directly after the n-type main S/D implantation, the portions of precursor regions 980EPS and 980EPD outside main S/D portion 980M of IGFET 100W substantially constitute n+ source extension 980E. The portion of precursor halo pocket portion 250P outside main source portion 980M substantially constitutes p source-side halo pocket portion 250 of IGFET 100W. The final n-channel semiconductor structure appears as shown in FIG. 38.

The characteristics of the following three sets of precursor S/D extensions were, as mentioned above, all selectively mutually different: (a) precursor source extension 980EP which receives both of the n-type S/D-extension dopants, (b) precursor drain extension 242EP and precursor S/D extensions 520EP and 522EP which receive only the n-type deep S/D-extension dopant, and (c) precursor S/D extensions 440EP and 442EP which receive only the n-type shallow S/D-extension dopant. Accordingly, the characteristics of the following three sets of final S/D extensions are all selectively mutually different: (a) source extension 980E of IGFET 100W, (b) drain extension 242E of IGFET 100W and S/D extensions 520E and 522E of IGFET 112, and (c) final S/D extensions 440E and 442E of IGFET 108. The fabrication procedure of FIG. 41 therefore efficiently enables n-type S/D extensions of three different characteristics to be defined with only two n-type S/D-extension doping operations. In addition, one IGFET, namely IGFET 100W, has S/D extensions, i.e., source extension 980E and drain extension 242E, of two different characteristics so that the IGFET is an asymmetric device due to the different S/D-extension characteristics.

In one implementation of a semiconductor fabrication process which utilizes the fabrication procedure of FIG. 41, the n-type shallow source-extension implantation of FIG. 33p is essentially merged into the n-type shallow S/D-extension implantation of FIG. 33m, and the associated p-type source halo implantation of FIG. 33q is essentially merged into the p-type S/D halo implantation of FIG. 33n. Asymmetric n-channel IGFET 100W thereby replaces asymmetric n-channel IGFET 100. The net result of this process implementation is largely to substitute the three S/D-extension and halo-pocket ion implantation steps of FIGS. 41b-41d for the five S/D-extension and halo-pocket ion implantation steps of FIGS. 33m-33q. In exchange for somewhat less flexibility in tailoring the characteristics of IGFET 100W compared to IGFET 100, this process implementation employs one fewer photoresist masking step and two fewer ion implantation operations than the fabrication process of FIG. 33.

Another implementation of a semiconductor fabrication process utilizing the fabrication procedure of FIG. 41 retains the n-type shallow source-extension implantation of FIG. 33p and the associated p-type source halo implantation of FIG. 33q. Both of asymmetric n-channel IGFETs 100 and 100W are thereby available in this other process implementation.

If a semiconductor fabrication process is to provide a variation of asymmetric high-voltage p-channel IGFET 102 whose p-type source 280 is configured in the same manner as n-type source 980 with the conductivity types reversed, this process modification can be implemented by replacing the five S/D-extension and halo-pocket ion implantation steps of FIGS. 33r-33v in the process of FIG. 33 with three S/D-extension and halo-pocket ion implantation steps analogous to those of FIGS. 41b-41d with the conductivity types reversed. The p-type shallow source-extension implantation of FIG. 33u is essentially merged into the p-type shallow S/D-extension implantation of FIG. 33r, and the associated n-type source halo implantation of FIG. 33v is essentially merged into the n-type S/D halo implantation of FIG. 33s. The variation of IGFET 102 then replaces IGFET 102. The resultant process implementation utilizes two fewer photoresist masking steps and four fewer ion implantation operations than the fabrication process of FIG. 33 in exchange for somewhat reduced flexibility in the asymmetric IGFET tailoring.

A further implementation of a semiconductor fabrication process utilizing the fabrication procedure of FIG. 41 and the p-channel version of the fabrication procedure of FIG. 41 retains the n-type shallow source-extension implantation of FIG. 33p and the associated p-type source halo implantation of FIG. 33q. Asymmetric n-channel IGFETs 100 and 100W, asymmetric p-channel IGFET 102, and the corresponding variation of IGFET 102 are available in this further process implementation.

In other variations of asymmetric n-channel IGFET 100, source extension 240E can be replaced with an n-type source extension defined by ion implanting n-type semiconductor dopant in three or more separate implantation operations, e.g., implantation operations equivalent to the three stages of FIGS. 33m, 33o, and 33p in which n-type semiconductor dopant for n-type S/D extensions is ion implanted in the process of FIG. 33. Similar comments apply to asymmetric p-channel IGFET 102. Its source extension 280E can thus be replaced with a p-type source extension defined by ion implanting p-type semiconductor dopant in three or more separate implantation operations, e.g., implantation operations equivalent to the three stages of FIGS. 33r, 33t, and 33u in which p-type semiconductor dopant for p-type S/D extensions is ion implanted. The depths of the maximum concentrations of the three or more n-type or p-type dopants which define the source extension in such variations of IGFET 100 or 102 normally all differ.

Q. Hypoabrupt Vertical Dopant Profiles Below Source-Body and Drain-Body Junctions Consider an IGFET consisting of a channel zone, a pair of S/D zones, a gate dielectric layer overlying the channel zone, and a gate electrode overlying the gate dielectric layer above the channel zone. The IGFET, which may be symmetric or asymmetric, is created from a semiconductor body having body material of a first conductivity type. The channel zone is part of the body material and thus is of the first conductivity type. The S/D zones are situated in the semiconductor body along its upper surface and are laterally separated by the channel zone. Each S/D zone is of a second conductivity type opposite to the first conductivity type so as to form a pn junction with the body material.

A well portion of the body material extends below the IGFET's S/D zones. The well portion is defined by semiconductor well dopant of the first conductivity type and is more heavily doped than overlying and underlying portions of the body material such that concentration $N_I$ of the well dopant reaches a subsurface maximum along a location no more than 10 times deeper, preferably no more than 5 times deeper, below the upper semiconductor surface than a specified one of the S/D zones. The vertical dopant profile below the specified S/D zone is, as indicated above, "hypoabrupt" when concentration $N_T$ of the total dopant of the first conductivity type in the portion of the body material below the S/D zone decreases by at least a factor of 10 in moving from the subsurface location of the maximum concentration of the well dopant upward to the specified S/D zone along an imaginary vertical line extending from the subsurface location of the maximum concentration of the well dopant through the specified S/D zone.

Concentration $N_T$ of the total dopant of the first conductivity type in the portion of the body material below the specified S/D zone preferably decreases by at least a factor of 20, more preferably by at least a factor of 40, even more preferably by at least a factor of 80, in moving from the location of the maximum concentration of the well dopant along the vertical line up to the specified S/D zone. Additionally, concentration $N_T$ of the total dopant of the first conductivity type in the portion of the body material below the specified S/D zone normally decreases progressively in moving from the location of the maximum concentration of the well dopant along the vertical line up to the specified S/D zone.

Alternatively stated, the concentration of all dopant of the first conductivity type in the body material increases at least 10 times, preferably at least 20 times, more preferably at least 40 times, even more preferably at least 80 times, in moving from the specified S/D zone along the vertical line downward to a body-material location no more than 10 times deeper, preferably no more than 5 times deeper, below the upper semiconductor surface than that S/D zone. This subsurface body-material location normally lies below largely all of each of the channel and S/D zones. By providing the body material with this hypoabrupt dopant distribution, the parasitic capacitance along the pn junction between the body material and the specified S/D zone is comparatively low.

IGFETs having a hypoabrupt vertical dopant profile below one or both of their S/D zones are described in U.S. Pat. No. 7,419,863 B1 and in U.S. patent application Ser. Nos. 11/981,355 and 11/981,481, both filed 31 Oct. 2007. The contents of U.S. Pat. No. 7,419,863 and U.S. patent application Ser. Nos. 11/981,355 and 11/981,481 are incorporated by reference herein.

Asymmetric high-voltage n-channel IGFET 100 can be provided in a variation 100X configured the same as IGFET 100 except that p-type empty main well region 180 is replaced with a p-type empty main well region 180X arranged so that the vertical dopant profile in the portion of p-type empty main well 180X below one or both of n-type source 240 and n-type drain 242 is hypoabrupt. P-type empty main well 180X, which may primarily simply be deeper than p-type empty main well 180 of IGFET 100, constitutes the p-type body material for asymmetric high-voltage n-channel IGFET 100X. Subject to the vertical dopant profile directly below source 240 or drain 242 being hypoabrupt, IGFET 100X appears substantially the same as IGFET 100 in FIGS. 11.1 and 12. Accordingly, IGFET 100X is not separately shown in the drawings.

Figure 42A:
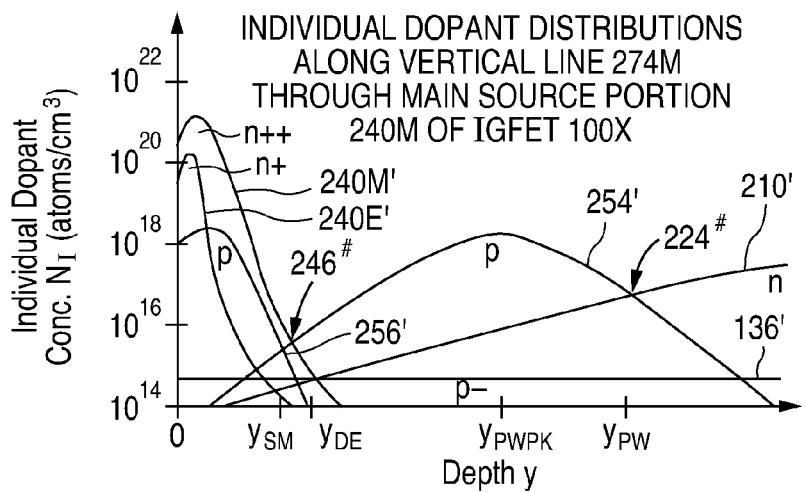
FIGS. 42*a*-42*c* are respective graphs of individual, total, and net dopant concentrations as a function of depth along an imaginary vertical line through the main source portion of a variation of the asymmetric n-channel IGFET of FIG. 12.
Figure 42B:
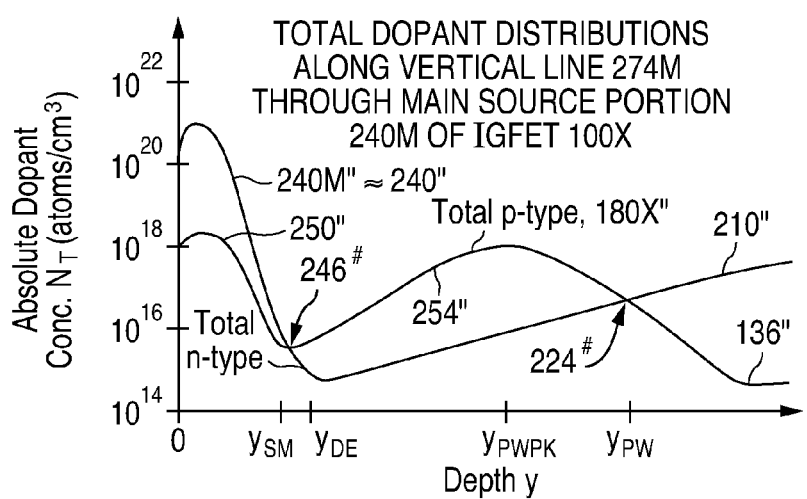
Figure 42C:
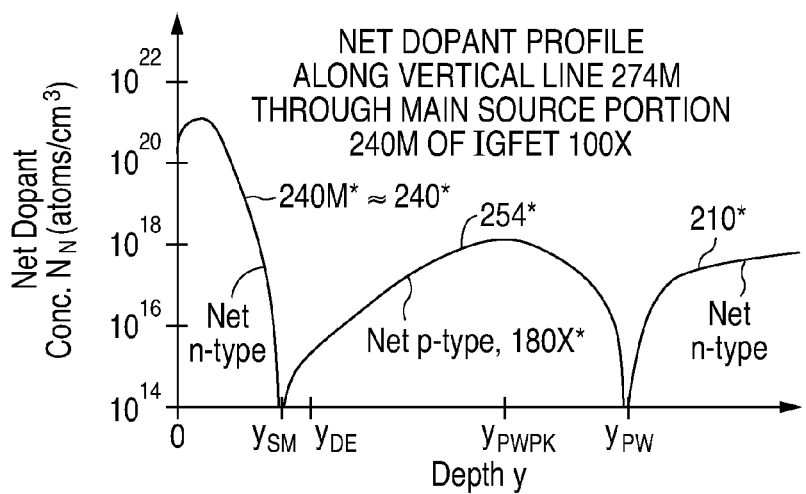
Figure 43A:
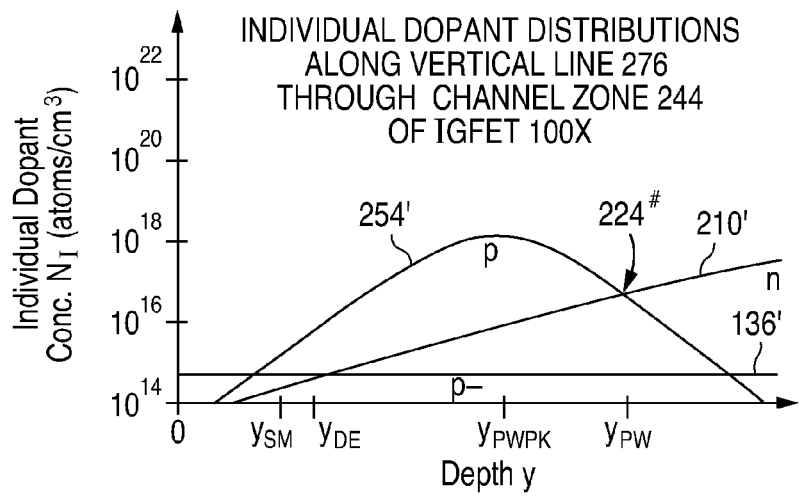
FIGS. 43*a*-43*c* are respective graphs of individual, total, and net dopant concentrations as a function of depth along an imaginary vertical line through the channel zone of the preceding variation of the asymmetric n-channel IGFET of FIG. 12.
Figure 43B:
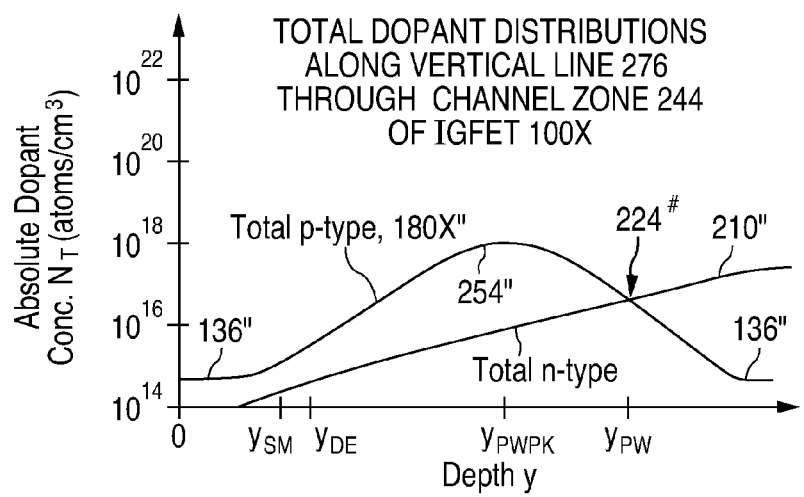
Figure 43C:
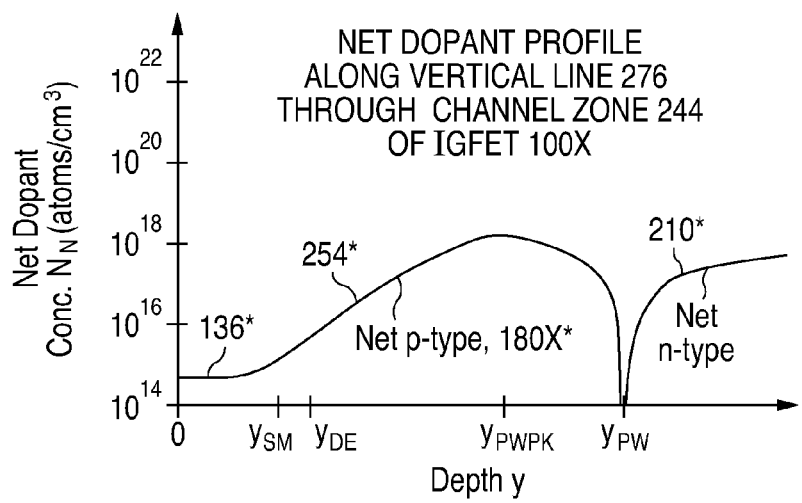
Figure 44A:
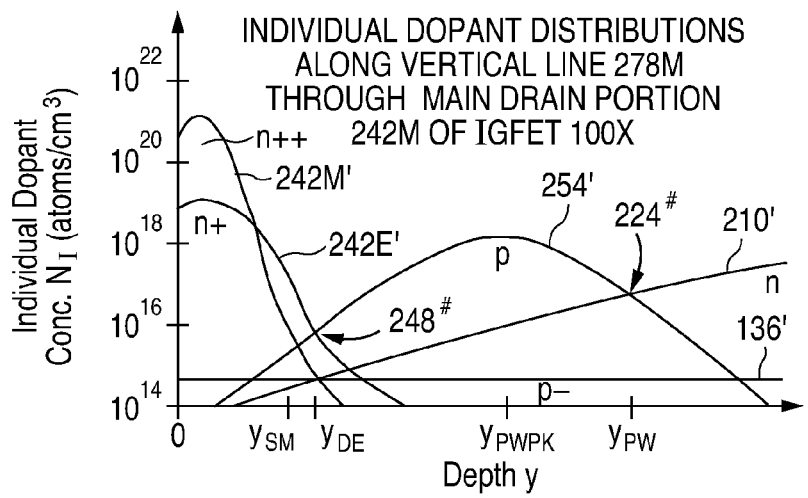
FIGS. 44*a*-44*c* are respective graphs of individual, total, and net dopant concentrations as a function of depth along an imaginary vertical line through the main drain portion of the preceding variation of the asymmetric n-channel IGFET of FIG. 12.
Figure 44B:
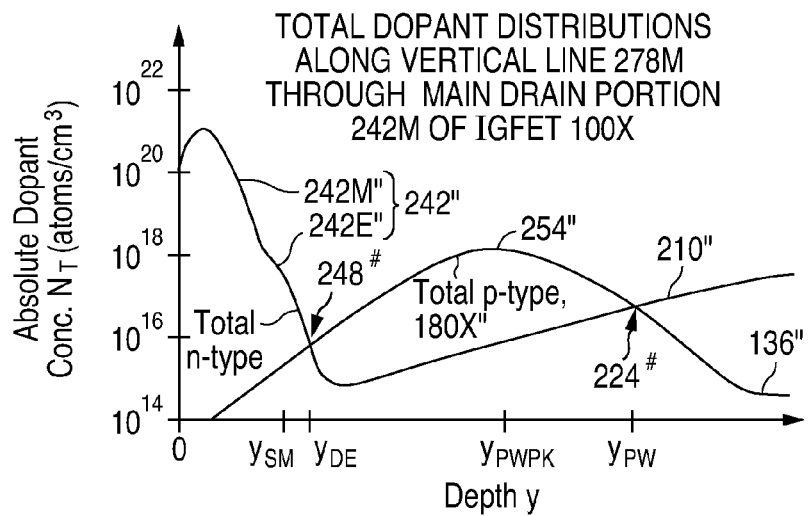
Figure 44C:
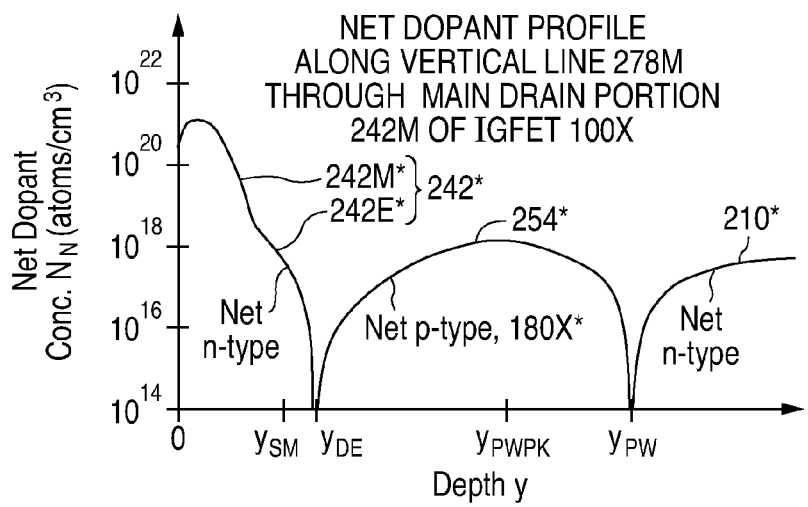

A further understanding of the hypoabrupt vertical dopant profile directly below source 240 or drain 242 of IGFET 100X is facilitated with the assistance of FIGS. 42a-42c (collectively "FIG. 42"), FIGS. 43a-43c (collectively "FIG. 43"), and FIGS. 44a-44c (collectively "FIG. 44"). FIGS. 42-44 present exemplary vertical dopant concentration information for IGFET 100X. Exemplary dopant concentrations as a function of depth y along imaginary vertical line 274M through main source portion 240M and empty-well main body-material portion 254 are presented in FIG. 38. FIG. 43 presents exemplary dopant concentrations as a function of depth y along imaginary vertical line 276 through channel zone 244 and main body-material portion 254. Exemplary dopant concentrations as a function of depth y along imaginary vertical line 278M through main drain portion 242M and body-material portion 254 are presented in FIG. 44.

FIGS. 42a, 43a, and 44a specifically illustrate concentrations $N_I$ along imaginary vertical lines 274M, 276, and 278M, of the individual semiconductor dopants that vertically define regions 136, 210, 240M, 242M, 250, and 254 and thus respectively establish the vertical dopant profiles in (a) main source portion 240M and the underlying material of empty-well body-material portion 254, (b) channel zone 244 and the underlying material of main body-material portion 254, i.e., outside halo pocket portion 250, and (c) main drain portion 242M and the underlying material of body-material portion 254. Curves 136', 210', 240M', 240E', 242M', 242E', 250', and 254' in FIGS. 42a, 43a, and 42a have the same meanings as in respectively corresponding FIGS. 14a, 16a, and 18a for IGFET 102.

Concentrations $N_T$ of the total p-type and total n-type dopants in regions 136, 210, 240M, 242M, 250, and 254 along vertical lines 274M, 276, and 278M are depicted in FIGS. 42b, 43b, and 44b. Curve segments 136", 210", 240", 240M", 242", 242M", 242E", 250", and 254" in FIGS. 42b, 43b, and 44b have the same meanings as in respectively corresponding FIGS. 14b, 16b, and 18b for IGFET 102. Item 180X" corresponds to empty-well body material 180X.

Net dopant concentration $N_N$ along vertical lines 274M, 276, and 278M is presented in FIGS. 42c, 43c and 44c. Curves and curve segments 210*, 240*, 240M*, 242*, 242M*, 242E*, 250* and 254* in FIGS. 42b, 43c, and 44c have the same meanings as in respectively corresponding FIGS. 14c, 16c, and 18c for IGFET 102. Item 180X* corresponds to empty-well body material 180X.

Depth $y_{SM}$ of main source portion 240M of IGFET 100X is considerably less than 5 times depth $y_{PWPK}$ of the maximum concentration of the total p-type dopant in p empty-well body material 180X in the example of FIG. 38. Inasmuch as source depth $y_S$ of IGFET 100X equals its main source portion depth $y_{SM}$, source depth $y_S$ of IGFET 100X is considerably less than 5 times depth $y_{PWPK}$ of the maximum concentration of the total p-type dopant in body material 180X.

Depth $y_{DE}$ of drain extension 242E of IGFET 100X is considerably less than 5 times depth $y_{PWPK}$ of the maximum concentration of the total p-type dopant in p empty-well body material 180X in the example of FIG. 44. With lateral extension 242E extending below main drain portion 242M, drain depth $y_D$ of IGFET 100X equals its drain-extension depth $y_{DE}$. Accordingly, drain depth $y_D$ of IGFET 100X is considerably less than 5 times depth $y_{PWPK}$ of the maximum concentration of the total p-type dopant in body material 180X.

Referring to FIG. 42b, curve 180" shows that concentration $N_T$ of the total p-type dopant in the portion of p-type empty-well body material 180X below main portion 240M of source 240 decreases hypoabruptly in moving from depth $y_{PWPK}$ of the maximum concentration of the total p-type dopant in body material 180 along vertical line 274M up to main source portion 240M. Curve 180" in FIG. 44b similarly shows that concentration $N_T$ of the total p-type dopant in the portion of empty-well body material 180X below drain 242, specifically below drain extension 242E, decreases hypoabruptly in moving from depth $y_{PWPK}$ of the maximum concentration of the total p-type dopant in body material 180 along vertical line 278M up to drain extension 242E. These $N_T$ concentration decreases are in the vicinity of 100 in the example of FIGS. 42b and 44b. In addition, concentration $N_T$ of the total p-type dopant in body material 180 decreases progressively in moving from depth $y_{PWPK}$ of the maximum concentration of the total p-type dopant in body material 180 along vertical line 274M or 278M up to source 240 or drain 242.

Asymmetric high-voltage p-channel IGFET 102 can similarly be provided in a variation 102X, not shown, configured the same as IGFET 102 except that n-type empty main well region 182 is replaced with an n-type empty main well region 182X arranged so that the vertical dopant profile in the portion of n-type empty main well 182X below one or both of p-type source 280 and p-type drain 282 is hypoabrupt. The n-type body material for asymmetric high-voltage p-channel IGFET 102X is constituted by n-type empty main well 182X. IGFET 102X appears substantially the same as IGFET 102 in FIG. 11.1 subject to the vertical dopant profile directly below source 280 or drain 282 being hypoabrupt. All of the comments made about IGFET 100X apply to IGFET 102X with the conductivity types for respectively corresponding regions reversed.

The hypoabrupt vertical dopant profile below source 240 or 280 of IGFET 100X or 102X reduces the parasitic capacitance along source-body junction 246 or 286 considerably. The parasitic capacitance along drain-body junction 248 or 288 of IGFET 100X or 102X is likewise reduced considerably due to the hypoabrupt vertical below drain 242 or 282. As a result, IGFETs 100X and 102X have increased considerably switching speed.

The presence of source-side halo pocket portion 250 or 290 may cause the vertical dopant profile below source 240 or 280 of IGFET 100X or 102X to be less hypoabrupt than the vertical dopant profile below drain 242 or 282, especially in a variation of IGFET 100X or 102X where halo pocket 250 or 290 extends under source 240 or 280. In such a variation, halo pocket portion 250 or 290 can even be doped so heavily p-type or n-type that the vertical dopant profile below source 240 or drain 280 ceases to be hypoabrupt. The vertical dopant profile below drain 242 or 282, however, continues to be hypoabrupt. The parasitic capacitance along drain-body junction 248 or 288 is still reduced considerably so that this variation of IGFET 100X or 102X has considerably increased switching speed.

Symmetric low voltage low-leakage IGFETs 112 and 114 and symmetric high-voltage low-leakage IGFETs 124 and 126 can also be provided in respective variations 112X, 114X, 124X, and 126X, not shown, configured respectively the same as IGFETs 112, 114, 124, and 126 except that empty main well regions 192, 194, 204, and 206 are respectively replaced with moderately doped empty main well regions 192X, 194X, 204X, and 206X of the same respective conductivity types arranged so that the vertical dopant profiles in the portions of empty main well regions 192X, 194X, 204X, and 206X variously below S/D zones 520, 522, 550, 552, 720, 722, 750, and 752 are hypoabrupt. The combination of p-type empty main well 192X and p− substrate region 136 constitutes the p-type body material for n-channel IGFET 112. The p-type body material for n-channel IGFET 124 is similarly formed by the combination of p-type empty main well 204X and p− substrate region 136. N-type empty main well regions 194X and 206X respectively constitute the n-type body materials for p-channel IGFETs 114X and 126X.

Symmetric IGFETs 112X, 114X, 124X, and 126X appear respectively substantially the same as symmetric IGFETs 112, 114, 124, and 126 in FIGS. 11.4 and 11.7 subject to the vertical dopant profiles directly below S/D zones 520, 522, 550, 552, 720, 722, 750, and 752 being hypoabrupt. Lateral extension 520E, 522E, 550E, 552E, 720E, 722E, 750E, or 752E of each S/D zone 520, 522, 550, 552, 720, 722, 750, or 752 extends below main S/D portion 520M, 522M, 550M, 552M, 720M, 722M, 750M, or 752M. Since lateral extension 242E of drain 242 of IGFET 100X extends below its main drain portion 242M, the comments about the hypoabrupt nature of the vertical dopant profile below drain 242 of IGFET 100X apply to IGFETs 112X, 114X, 124X, and 126X with the conductivity types for respectively corresponding regions reversed for p-channel IGFETs 114X and 126X.

The hypoabrupt vertical dopant profiles below S/D zones 520, 522, 550, 552, 720, 722, 750, and 752 of IGFETs 112X, 114X, 124X, and 126X cause the parasitic capacitances along their various S/D-body junctions 526, 528, 556, 558, 726, 728, 756, and 758 to be reduced considerably. IGFETs 112X, 114X, 124X, and 126X thereby have considerably increased switching speed.

N-channel IGFETs 100X, 112X, and 124X are manufactured according to the fabrication process of FIG. 33 in the same way as n-channel IGFETs 100, 112, and 124 except that the conditions for ion implanting the p-type empty main well dopant at the stage of FIG. 33e are adjusted to form p-type empty main well regions 180X, 192X, and 204X instead of p-type empty main well regions 180, 192, and 204. P-type empty main well regions 184A and 186B for extended-drain IGFETs 104 and 106 are formed with the same steps as p-type empty main wells 100, 112, and 124. If the characteristics of p-type empty main wells 180X, 192X, and 204X are unsuitable for IGFETs 104 and 106 or/and if one or more of IGFETs 100, 112, and 124 are also to be formed, a separate photoresist mask having the same configuration for IGFETs 100X, 112X and 124X that photoresist mask 932 has for IGFETs 100, 112, and 124 is formed on screen oxide layer 924 at a selected point during the ion implantation of the well dopants. A further p-type semiconductor dopant is ion implanted through the separate photoresist mask to define p-type empty main wells 180X, 192X, and 204X. The separate photoresist mask is removed.

P-channel IGFETs 102X, 114X, and 126X are similarly fabricated according to the process of FIG. 33 in the same way as p-channel IGFETs 102, 114, and 126 except that the conditions for ion implanting the n-type empty main well dopant at the stage of FIG. 33d are adjusted to form n-type empty main well regions 182X, 194X, and 206X instead of n-type empty main well regions 182, 194, and 206. N-type empty main well regions 184B and 186A are formed with the same steps as n-type empty main wells 102, 114, and 126. If the characteristics of n-type empty main wells 182X, 194X, and 206X are unsuitable for IGFETs 104 and 106 or/and if one or more of IGFETs 102, 114, and 126 are also to be formed, a separate photoresist mask having the same configuration for IGFETs 102X, 114X, and 126X that photoresist mask 930 has for IGFETs 102, 114, and 126 is formed on screen oxide layer 924 at a selected point during the ion implantation of the well dopants. A further n-type semiconductor dopant is ion implanted through the separate photoresist mask to define n-type empty main wells 182X, 194X, and 206X after which the separate photoresist mask is removed.

R. Nitrided Gate Dielectric Layers

R1. Vertical Nitrogen Concentration Profile in Nitrided Gate Dielectric Layer

The fabrication of p-channel IGFETs 102, 106, 110, 114, 118, 122, and 126 normally includes doping their respective gate electrodes 302, 386, 502, 568, 628, 702, and 768 very heavily p-type with boron at the same time that boron is ion implanted at a very high dosage into the semiconductor body as the p-type main S/D dopant for defining their respective main S/D portions 280M and 282M, 360M (and 374), 480M and 482M, 550M and 552M, 610M and 612M, 680M and 682M, and 750M and 752M. Boron diffuses very fast. In the absence of some boron-diffusion-inhibiting mechanism, boron in gate electrodes 302, 386, 502, 568, 628, 702, and 768 could diffuse through respective underlying gate dielectric layers 300, 384, 500, 566, 626, 700, and 766 into the semiconductor body during elevated-temperature fabrication steps subsequent to the p-type main S/D implantation.

Boron penetration into the semiconductor body could cause various types of IGFET damage. Threshold voltage $V_T$ could drift with IGFET operational time. Low-frequency noise that occurs in an IGFET is commonly referred to as "1/f" noise because the low-frequency noise is usually roughly proportional to the inverse of the IGFET's switching frequency. Such boron penetration could produce traps along the upper semiconductor surface at the gate-dielectric/monosilicon interface. These interface traps could cause excessive 1/f noise.

Gate dielectric layers 500, 566, and 700 of p-channel IGFETs 110, 114, and 122 are of low thickness value $t_{GdL}$. As a result, gate electrodes 502, 568, and 702 of IGFETs 110, 114, and 122 are closer to the underlying semiconductor body than are gate electrodes 302, 386, 628, and 768 of p-channel IGFETs 102, 106, 118, and 122 whose gate dielectric layers 300, 384, 626, and 766 are of high thickness value $t_{GdH}$. The concern about boron in gate electrodes 302, 386, 502, 568, 628, 702, and 768 diffusing through respective underlying gate dielectric layers 300, 384, 500, 566, 626, 700, and 766 into the semiconductor body so as to cause IGFET damage is especially critical for IGFETs 110, 114, and 122.

Nitrogen inhibits boron diffusion through silicon oxide. For this purpose, nitrogen is incorporated into the gate dielectric layers of the illustrated IGFETs, particularly gate dielectric layers 300, 384, 500, 566, 626, 700, and 766 of p-channel IGFETs 102, 106, 110, 114, 118, 122, and 126, to inhibit boron in the gate electrodes of the illustrated IGFETs from diffusing through their gate electrodes and into the semiconductor body to cause IGFET damage.

The presence of nitrogen in the semiconductor body can be damaging depending on the amount and distribution of nitrogen in the semiconductor body. The incorporation of nitrogen into the gate dielectric layers of the illustrated IGFETs, especially low-thickness gate dielectric layers 500, 566, and 700 of p-channel IGFETs 110, 114, and 122, is therefore controlled in accordance with the invention so as to have a vertical concentration profile which is likely to result in very little nitrogen-caused IGFET damage. Nitrogen constitutes 6-12%, preferably 9-11%, typically 10%, of each of low-thickness gate dielectric layers 500, 566, and 700 by mass.

High-thickness gate dielectric layers 300, 384, 626, and 766 of p-channel IGFETs 102, 106, 118, and 126 contain a lower percentage by mass of nitrogen than low-thickness gate dielectric layers 500, 566, and 700. The percentage by mass of nitrogen in high-thickness gate dielectric layers 300, 384, 626, and 766 approximately equals the percentage by mass of nitrogen in low-thickness gate dielectric layers 500, 566, and 700 multiplied by the below-unity ratio $t_{GdL}/t_{GdH}$ of low dielectric thickness value $t_{GdL}$ to high dielectric thickness value $t_{GdH}$. For the typical situation in which low dielectric thickness $t_{GdL}$ is 2 nm while high dielectric thickness $t_{GdH}$ is 6-6.5 nm, low-to-high gate dielectric thickness ratio $t_{GdL}/t_{GdH}$ is 0.30-0.33. Nitrogen then typically constitutes roughly 2-4%, typically roughly 3%, of each of high-thickness gate dielectric layers 300, 384, 626, and 766 by mass.

Figure 45:
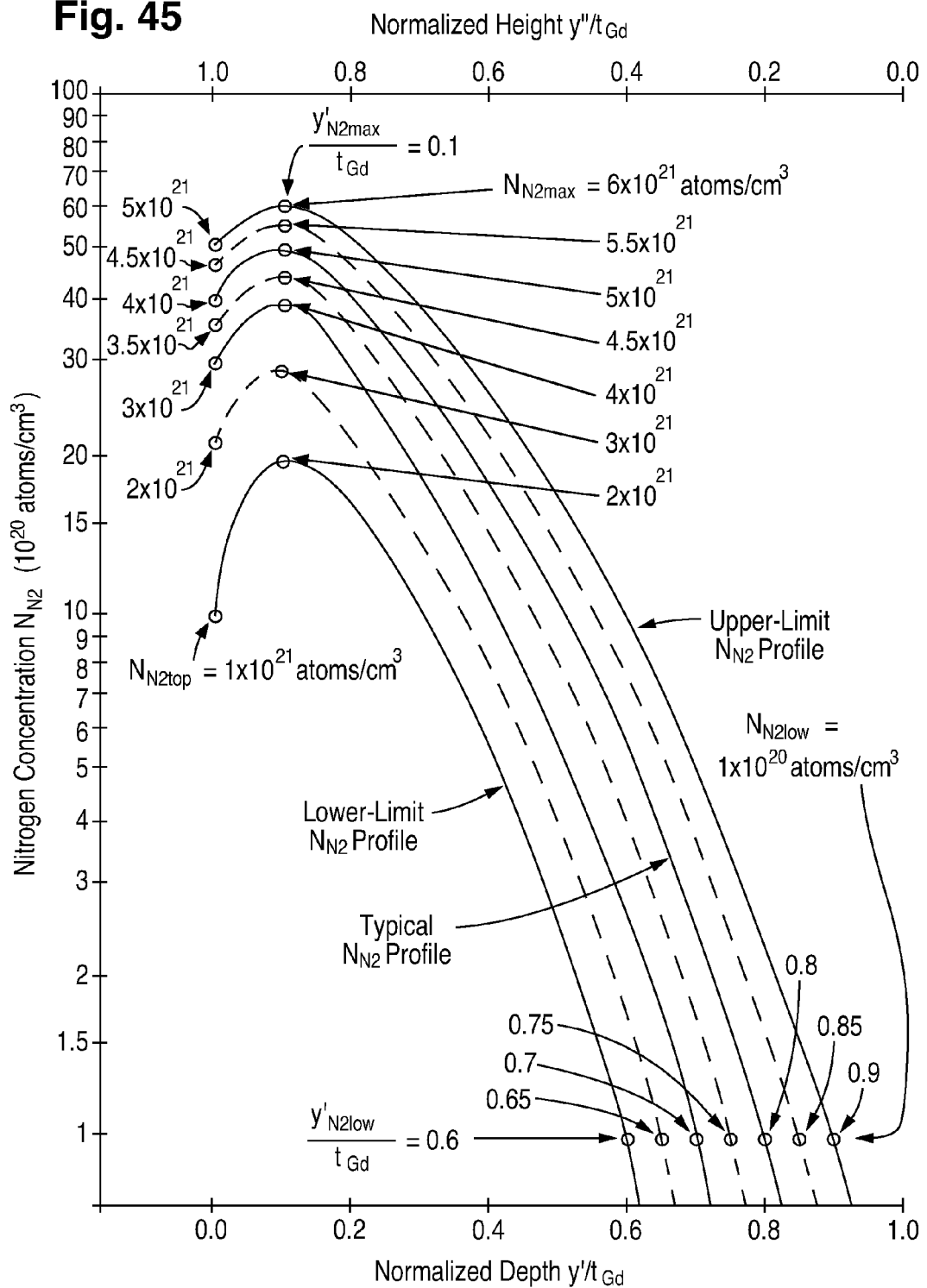
FIG. 45 is a graph, in accordance with the invention, of nitrogen concentration in the gate dielectric layer of a p-channel IGFET, such as that of FIG. 11.3, 11.4, or 11.6, as a function of normalized depth from the upper surface of the gate dielectric layer.

FIG. 45 illustrates how the nitrogen concentration $N_{N2}$ varies with normalized gate dielectric depth according to the invention's teachings. The normalized gate dielectric depth is (i) the actual depth y' into the gate dielectric layer, such as gate dielectric layer 500, 566, or 700, measured from its upper surface divided by (ii) average gate dielectric thickness $t_{GdL}$ e.g., low-thickness value $t_{GdL}$ for gate dielectric layer 500, 566, or 700. Normalized gate dielectric depth $y'/t_{Gd}$ therefore varies from 0 at the upper gate dielectric surface to 1 at the lower surface of the gate dielectric layer. The lower gate dielectric surface is the same as part of the upper semiconductor surface because the gate dielectric layer adjoins the monosilicon of the semiconductor body.

Normalized gate dielectric height is also shown along the top of FIG. 45. The normalized gate dielectric depth is (i) the actual height y" measured from the lower gate dielectric surface divided (ii) by average gate dielectric thickness $t_{Gd}$. The sum of actual depth y' and actual height y" equals average gate dielectric thickness $t_{Gd}$. Normalized gate dielectric height $y''/t_{Gd}$ is thus the complement of normalized gate dielectric depth $y'/t_{Gd}$. That is, normalized gate dielectric height $y''/t_{Gd}$ equals $1-y'/t_{Gd}$. Any parameter described with respect to normalized gate dielectric depth $y'/t_{Gd}$ can be described in an equivalent manner with respect to normalized gate dielectric height $y''/t_{Gd}$. For instance, a parameter having a particular value at a $y'/t_{Gd}$ normalized gate dielectric depth value of 0.7 has the same value at the $y''/t_{Gd}$ normalized gate dielectric height value of 0.3.

The vertical nitrogen concentration profile in a gate dielectric layer, e.g., low-thickness gate dielectric layer 500, 566, or 700 of p-channel IGFET 110, 114, or 122, is characterized by several parameters, each of which falls into a specified maximum parameter range and one or more preferred smaller sub-ranges. FIG. 45 presents seven vertical profile curves representing the variation of nitrogen concentration $N_{N2}$ in the gate dielectric layer as a function of normalized gate dielectric depth $y'/t_{Gd}$ or normalized gate dielectric height $y''/t_{Gd}$.

With the foregoing in mind, nitrogen concentration $N_{N2}$ reaches a maximum value $N_{N2max}$ of $2 \times 10^{21} - 6 \times 10^{21}$ atoms/cm$^3$ along a maximum-nitrogen-concentration location in the gate dielectric layer when gate dielectric depth y' is at an average maximum-nitrogen-concentration depth value $y'_{N2max}$ below the upper gate dielectric surface. The value $y'_{N2max}/t_{Gd}$ of normalized depth $y'/t_{Gd}$ at the maximum-nitrogen-concentration location in the gate dielectric layer is normally no more than 0.2, preferably 0.05-0.15, typically 0.1 as depicted in the example of FIG. 45. Taking note of the fact that low average gate dielectric thickness value $t_{GdL}$ is normally 1-3 nm, preferably 1.5-2.5 nm, typically 2 nm, this means that maximum-nitrogen-concentration depth value $y'_{N2max}$ is normally no more than 0.4 nm, preferably 0.1-0.3 nm, typically 0.2 nm, at the typical value of 2 nm for gate dielectric thickness $t_{GdL}$ of low-thickness gate dielectric layers 500, 566, and 700 of p-channel IGFETs 110, 114, and 122.

The $N_{N2}$ vertical profile curve at the lowest value, $2 \times 10^{21}$ atoms/cm$^3$, of maximum nitrogen concentration $N_{N2max}$ is labeled "Lower-limit $N_{N2}$ Profile" in FIG. 45 to indicate the lowest nitrogen concentration vertical profile. The $N_{N2}$ vertical profile curve at the highest value, $6 \times 10^{21}$ atoms/cm$^3$, of maximum nitrogen concentration $N_{N2max}$ is similarly labeled "Upper-limit $N_{N2}$ Profile" in FIG. 45 to indicate the highest nitrogen concentration vertical profile. Subject to being in the range of $2 \times 10^{21} - 6 \times 10^{21}$ atoms/cm$^3$, maximum nitrogen concentration $N_{N2max}$ is preferably at least $3 \times 10^{21}$ atoms/cm$^3$, more preferably at least $4 \times 10^{21}$ atoms/cm$^3$, even more preferably at least $4.5 \times 10^{21}$ atoms/cm$^3$. Also, maximum nitrogen concentration $N_{N2max}$ is preferably no more than $5.5 \times 10^{21}$ atoms/cm$^3$, typically $5 \times 10^{21}$ atoms/cm$^3$ as indicated by the $N_{N2}$ vertical profile curve labeled "Typical $N_{N2}$ Profile" in FIG. 45.

The percentage of nitrogen by mass in the gate dielectric layer increases with increasing maximum nitrogen concentration $N_{N2max}$. The lower-limit, typical, and upper-limit nitrogen concentration profiles in FIG. 45 therefore respectively correspond roughly to the 6% lowest mass percentage, 10% typical mass percentage, and 12%, highest mass percentage of nitrogen in the gate dielectric layer.

Nitrogen concentration $N_{N2}$ decreases from maximum nitrogen concentration $N_{N2max}$ to a very small value as normalized depth $y'/t_{Gd}$ increases from normalized maximum-nitrogen-concentration depth value $y'_{N2max}/t_{Gd}$ to 1 at the lower gate dielectric surface. More particularly, concentration $N_{N2}$ in the gate dielectric layer is preferably substantially zero at a distance of approximately one monolayer of atoms from the lower gate dielectric surface and is therefore substantially zero along the lower gate dielectric surface.

Additionally, nitrogen concentration $N_{N2}$ reaches a low value $N_{N2low}$ of $1\times10^{20}$ atoms/cm$^3$ when depth y' is at an intermediate value $y'_{N2low}$ between maximum-nitrogen-concentration depth $y'_{N2max}$ and the lower gate dielectric surface. Accordingly, concentration $N_{N2}$ is at low value $N_{N2low}$ when normalized depth $y'/t_{Gd}$ is at a normalized intermediate value $y'_{N2low}/t_{Gd}$ between normalized maximum-nitrogen-concentration depth $y'_{N2max}/t_{Gd}$ and 1. Normalized intermediate depth value $y'_{N2low}/t_{Gd}$ at the $N_{N2low}$ low nitrogen concentration value of $1\times10^{20}$ atoms/cm$^3$ normally ranges from a high of 0.9 to a low of 0.6. Subject to being in this range, normalized intermediate-nitrogen-concentration depth $y'_{N2low}/t_{Gd}$ is preferably at least 0.65, more preferably at least 0.7, even more preferably at least 0.75. Normalized intermediate depth $y'_{N2low}/t_{Gd}$ is preferably no more than 0.85, typically 0.8 as indicated by the typical nitrogen concentration vertical profile in FIG. 45.

Normalized intermediate-nitrogen-concentration depth value $y'_{N2low}/t_{Gd}$ increases as maximum nitrogen concentration $N_{N2max}$ increases. In the example of FIG. 45, the $y'_{N2low}/t_{Gd}$ normalized intermediate-nitrogen-concentration depth values of 0.6, 0.65, 0.7, 0.75, 0.8, 0.85, and 0.9 respectively occur on the nitrogen concentration vertical profile curves at maximum nitrogen concentration values $N_{N2max}$ of $2\times10^{21}$, $3\times10^{21}$, $4\times10^{21}$, $4.5\times10^{21}$, $5\times10^{21}$, and $6\times10^{21}$ atoms/cm$^3$. Nitrogen concentration $N_{N2}$ normally decreases largely monotonically in moving from maximum nitrogen-concentration value $N_{N2max}$ at normalized maximum-nitrogen-concentration depth $y'_{N2max}/t_{Gd}$ to low nitrogen-concentration value $N_{N2low}$ at normalized intermediate-nitrogen-concentration depth $y'_{N2low}/t_{Gd}$.

Nitrogen concentration $N_{N2}$ is at a somewhat lower value $N_{N2top}$ at the upper gate dielectric surface than at depth $y'_{N2max}$ of maximum nitrogen concentration $N_{N2max}$. Taking note that maximum nitrogen value $N_{N2max}$ ranges from $2\times10^{21}$ atoms/cm$^3$ to $6\times10^{21}$ atoms/cm$^3$, upper-surface nitrogen-concentration value ranges from $1\times10^{21}$ atoms/cm$^3$ to $5\times10^{21}$ atoms/cm$^3$. Subject to being in this range, upper-surface nitrogen concentration $N_{N2top}$ is preferably at least $2\times10^{21}$ atoms/cm$^3$, more preferably at least $3\times10^{21}$ atoms/cm$^3$, even more preferably at least $3.5\times10^{21}$ atoms/cm$^3$. Upper-surface nitrogen concentration $N_{N2top}$ is preferably no more than $4.5\times10^{21}$ atoms/cm$^3$, typically $4\times10^{21}$ atoms/cm$^3$ as indicated by typical $N_{N2}$ profile in FIG. 45. In the example of the nitrogen concentration vertical profile curves shown in FIG. 45, the $N_{N2top}$ upper-surface nitrogen concentration values of $1\times10^{21}$, $2\times10^{21}$, $3\times10^{21}$, $3.5\times10^{21}$, $4\times10^{21}$, $4.5\times10^{21}$, and $5\times10^{21}$ atoms/cm$^3$ respectively occur on the nitrogen concentration vertical profile curves at maximum nitrogen concentration values $N_{N2max}$ of $2\times10^{21}$, $3\times10^{21}$, $4\times10^{21}$, $4.5\times10^{21}$, $5\times10^{21}$, $5.5\times10^{21}$, and $6\times10^{21}$ atoms/cm$^3$.

Several factors affect the selection of a particular nitrogen concentration profile in accordance with the nitrogen concentration profile characteristics depicted in FIG. 45. The upper-limit nitrogen concentration profile in FIG. 45 is generally most effective in preventing boron in the gate electrode from passing through the gate dielectric layer and into the underlying monosilicon, particularly the IGFET's channel zone, and preventing IGFET damage. Because, the upper-limit profile corresponds to the highest mass percentage of nitrogen in the gate dielectric layer, the risk of nitrogen-induced threshold-voltage drift with operational time in a p-channel IGFET due to negative bias temperature instability is increased. Also, the upper-limit profile places more nitrogen closer to the upper semiconductor surface where the channel zone meets the gate dielectric layer. This increases the risk of reduced charge mobility due to increased trap density at the gate-dielectric/channel-zone interface.

The lower-limit nitrogen concentration profile in FIG. 45 reduces the risks of nitrogen-induced threshold-voltage drift and reduced charge mobility in the channel zone. However, the accompanying lowest mass percentage of nitrogen in the gate dielectric layer reduces the effectiveness of preventing boron in the gate electrode from passing through the gate dielectric layer and into the channel zone. One good compromise is to select a vertical nitrogen concentration profile having characteristics close to the typical nitrogen concentration profile in FIG. 45, e.g., characteristics in the preferred range extending from the nitrogen concentration profile just below the typical nitrogen concentration profile to the nitrogen concentration profile just above the typical nitrogen concentration profile. Other considerations may lead to selection of a vertical nitrogen concentration profile whose characteristics are farther away from the typical nitrogen concentration profile but still within the range of characteristics defined by the upper-limit and lower-limit nitrogen concentration profiles in FIG. 45.

By arranging for the concentration of nitrogen in the gate dielectric layer, especially low-thickness gate dielectric layer 500, 566, or 700 of each p-channel IGFET 110, 114, or 122, to have the preceding vertical characteristics, especially vertical characteristics close to those of the typical nitrogen concentration profile in FIG. 45, threshold $V_T$ of IGFET is highly stable with IGFET operational time. Threshold-voltage drift is substantially avoided. IGFETs 110, 114, and 122 incur very little low-frequency 1/f noise. The reliability and performance of IGFETs 110, 114, and 122 are considerably enhanced.

As described below, the introduction of nitrogen into gate dielectric layers 300, 384, 500, 566, 626, 700, and 766 of p-channel IGFETs 102, 106, 110, 114, 118, 122, and 126 during the very high dosage p-type main S/D implantation occurs along the upper surfaces of dielectric layers 300, 384, 500, 566, 626, 700, and 766. Each high-thickness gate dielectric layer 300, 384, 626, or 766 therefore includes an upper portion having roughly the same vertical nitrogen concentration profile as low-thickness gate dielectric layer 500, 566, or 700. For instance, depths $y'_{N2max}$ of maximum nitrogen concentration $N_{N2max}$ in high-thickness gate dielectric layers 300, 384, 626, and 766 of IGFETs 102, 106, 118, and 126 is normally approximately the same as depths $y'_{N2max}$ of maximum nitrogen concentration $N_{N2max}$ in low-thickness gate dielectric layers 500, 566, and 700 of IGFETs 110, 114, and 122.

The upper portion of each high-thickness gate dielectric layer 300, 384, 626, or 766 having approximately the same vertical nitrogen concentration profile as low-thickness gate dielectric layer 500, 566, or 700 extends from the upper surface of gate dielectric layer 300, 384, 626, or 766 to a depth y' approximately equal to low gate dielectric thickness $t_{GdL}$ into layer 300, 384, 626, or 766. Inasmuch as gate dielectric thickness $t_{Gd}$ is high value $t_{GdH}$ for high-thickness gate dielectric layers 300, 384, 626, and 766 whereas gate dielectric thickness $t_{Gd}$ is low value $t_{GdL}$ for low-thickness gate dielectric layers 500, 566, and 700, a nitrogen concentration characteristic occurs in high-thickness gate dielectric layer 300, 384, 626, or 766 at a normalized $y'/t_{Gd}$ depth value approximately equal to the normalized $y'/t_{Gd}$ depth value of that nitrogen concentration characteristic in low-thickness gate dielectric layer 500, 566, or 700 multiplied by the low-to-high gate dielectric thickness ratio $t_{GdL}/t_{GdH}$.

One example of the preceding depth normalization item is that normalized depth $y'_{N2max}/t_{Gd}$ of maximum nitrogen concentration $N_{N2max}$ in high-thickness gate dielectric layer 300, 384, 626, or 766 approximately equals normalized depth $y'_{N2max}/t_{Gd}$ of that maximum nitrogen concentration $N_{N2max}$ in low-thickness gate dielectric layer 500, 566, or 700 multiplied by the low-to-high gate dielectric thickness ratio $t_{GdL}/t_{GdH}$. As another example, normalized depth $y'_{N2low}/t_{Gd}$ at low nitrogen concentration $N_{N2low}$ of $1\times10^{20}$ atoms/cm$^3$ in high-thickness gate dielectric layer 300, 384, 626, or 766 for a particular value of maximum nitrogen concentration $N_{N2max}$ approximately equals normalized depth $y'_{N2low}/t_{Gd}$ of low nitrogen concentration $N_{N2low}$ in low-thickness gate dielectric layer 500, 566, or 700 multiplied by the low-to-high gate dielectric thickness ratio $t_{GdL}/t_{GdH}$. Due to the increased gate dielectric thickness and the foregoing vertical nitrogen concentration profile in high-thickness gate dielectric layers 300, 384, 626, and 766, IGFETs 102, 106, 118, and 126 incur very little threshold-voltage drift and 1/f noise. Their reliability and performance are likewise considerably enhanced.

R2. Fabrication of Nitrided Gate Dielectric Layers

FIGS. 46a-46g (collectively "FIG. 46") illustrate steps in providing the illustrated IGFETs with nitrided gate dielectric layers in accordance with the invention so that low-thickness gate dielectric layers 500, 566, and 700 of p-channel IGFETs 110, 114, and 122 achieve vertical nitrogen concentration profiles having the characteristics presented in FIG. 45. For simplicity, FIG. 46 only illustrates the nitridization for low-thickness gate dielectric layer 566 of symmetric low-voltage p-channel IGFET 114 and for high-thickness gate dielectric layer 626 of symmetric high-voltage p-channel IGFET 118. The nitridization for low-thickness gate dielectric layers 500 and 700 of symmetric low-voltage p-channel IGFETs 110 and 122 is achieved in the same way, and has the substantially the same vertical characteristics, as the nitridization for low-thickness gate dielectric layer 566 of IGFET 114. The nitridization for high-thickness gate dielectric layers 300, 384, and 766 of p-channel IGFETs 102, 106, and 126 is similarly achieved in the same way, and has the substantially the same vertical characteristics, as the nitridization for high-thickness gate dielectric layer 626 of IGFET 118.

The nitridization procedure of FIG. 46 begins with the structure existent immediately after the stage of FIGS. 33i.4 and 33i.5. FIG. 46a illustrates how the portion of the overall CIGFET structure intended for p-channel IGFETs 114 and 118 appears at this point. Screen oxide layer 924 covers islands 154 and 158 for IGFETs 114 and 118. An isolating moderately doped p well region 990 is situated below field-insulation region 138 and between precursor n-type main well regions 194P and 198P of IGFETs 114 and 118 in order to electrically isolate IGFETs 114 and 118 from each other. P well region 990 can be deleted in embodiments where IGFETs 114 and 118 are not adjacent to each other.

Screen oxide layer 924 is removed. Referring to FIG. 46b, thick gate-dielectric-containing dielectric layer 942 is thermally grown along the upper semiconductor surface in the manner described above in connection with FIG. 33j. A portion of thick dielectric layer 942 is at the lateral location for, and later constitutes a portion of, high-thickness gate dielectric layer 626 of p-channel IGFET 118. Thick dielectric layer 942 consists substantially solely of silicon oxide. The thickness of layer 942 is slightly less than the intended $t_{GdH}$ thickness, normally 4-8 nm, preferably 5-7 nm, typically 6-6.5 nm.

The above-mentioned photoresist mask (not shown) having openings above the monosilicon islands for the illustrated low-voltage IGFETs is formed on thick dielectric layer 942. The uncovered material of dielectric layer 942 is removed to expose the islands for the illustrated low-voltage IGFETs, including island 154 for p-channel IGFET 114. With reference to FIG. 46c, item 942R is again the remainder of thick gate-dielectric-containing dielectric layer 942. After removing a thin layer (not shown) of silicon along the upper surface of each of the monosilicon islands for the illustrated low-voltage IGFETs, the photoresist is removed.

The wet-oxidizing thermal growth operation is performed on the semiconductor structure in a thermal-growth chamber to thermally grow thin gate-dielectric-containing dielectric layer 944 along the upper semiconductor surface above the monosilicon islands for the illustrated low-voltage IGFETs, including island 154 for p-channel IGFET 114, as described above in connection with FIG. 33k. See FIG. 46c. A portion of thin dielectric layer 944 later constitutes low-thickness gate dielectric layer 566 for IGFET 114. Layer 944 consists substantially solely of silicon oxide at this point. Items 992 and 994 in FIG. 46c respectively indicate the lower and upper surfaces of thin dielectric layer 944. Items 996 and 998 respectively indicate the lower and upper surfaces of thick dielectric remainder 942R.

The above-mentioned plasma nitridization operation is performed on the semiconductor structure to introduce nitrogen into thin dielectric layer 944 and thick dielectric remainder 942R. See FIG. 46d. The plasma nitridization is conducted in such a way that low-thickness gate dielectric layer 566 of p-channel IGFET 114 achieves a vertical nitrogen concentration profile having the characteristics represented in FIG. 45 when the fabrication of IGFET is complete. In particular, the plasma nitridization is typically performed so that the nitrogen concentration in gate dielectric layer 566 at the end of IGFET fabrication is close to the typical vertical nitrogen concentration profile shown in FIG. 45.

The nitridization plasma normally consists largely of inert gas and nitrogen. The inert gas is preferably helium. In that case, the helium normally constitutes over 80% of the plasma by volume.

The plasma nitridization is conducted in a plasma-generation chamber at an effective plasma power of 200-400 watts, typically 300 watts, for 60-90 s, typically 75 s, at a pressure of 5-20 mtorr, typically 10 mtorr. The plasma pulsing frequency is 5-15 kHz, typically 10 kHz, at a pulsing duty cycle of 5-25%, typically 10%. The resulting nitrogen ions normally impinge largely perpendicularly on upper surface 994 of thin dielectric layer 944 and on upper surface 998 of thick dielectric remainder 942R. The nitrogen ion dosage is $1\times10^{15}$–$5\times10^{15}$ ions/cm$^2$, preferably $2.5\times10^{15}$–$3.5\times10^{15}$ ions/cm$^2$, typically $2\times10^{15}$ ions/cm$^2$.

The partially completed CIGFET structure is removed from the plasma-generation chamber and is transferred to a thermal-growth chamber for the above-mentioned intermediate RTA in oxygen. During the transfer operation, some of the nitrogen outgases from upper surface 994 of thin dielectric layer 944 and from upper surface 998 of thick dielectric remainder 942R as indicated in FIG. 46e. The outgassed nitrogen, referred to as unassociated nitrogen, consists largely of nitrogen atoms which have not formed significant bonds with the silicon or/and oxygen of thin dielectric layer 944 and thick dielectric remainder 942R. Prior to outgassing, the unassociated outgassed nitrogen atoms are largely situated along, or close to, upper gate dielectric surfaces 994 and 998.

As mentioned above, the intermediate RTA causes the thickness of thin dielectric layer 944 to increase somewhat. The thickness of thin dielectric layer 944 is substantially the $t_{GdL}$ low gate dielectric value of 1-3 nm, preferably 1.5-2.5 nm, typically 2 nm, at the end of the intermediate RTA. Due primarily to (i) the slight thickness increase of thin dielectric layer 944 during the intermediate RTA and (ii) the nitrogen outgassing from upper surface 994 of dielectric layer 944 during the transfer operation, the nitrogen in layer 944 reaches a maximum concentration along a maximum-nitrogen-concentration location somewhat below upper gate dielectric surface 994. Normalized depth y'/$t_{Gd}$ at the maximum-nitrogen-concentration location in thin dielectric layer 944 is normally no more than 0.2, preferably 0.05-0.15, typically 0.1, with gate dielectric thickness $t_{Gd}$ being equal to $t_{GdL}$.

As likewise mentioned above, the thermal-growth steps used in forming thin dielectric layer 944 also cause the thickness of thick dielectric remainder 942R to increase slightly. The thickness of dielectric remainder 942R is substantially the $t_{GdH}$ high gate dielectric value of 4-8 nm, preferably 5-7 nm, typically 6-6.5 nm, at the end of the intermediate RTA. The nitrogen in thick dielectric remainder 942R reaches a maximum concentration along a maximum-nitrogen-concentration location somewhat below upper surface 998 of dielectric remainder 942R due primarily to (i) the slight thickness increase of dielectric remainder 942R during the intermediate RTA and (ii) the nitrogen outgassing from upper gate dielectric surface 998 during the transfer operation.

Depths y'$_{N2max}$ of maximum nitrogen concentration $N_{N2max}$ in thick dielectric remainder 942R and thin dielectric layer 944 are normally approximately the same. Since gate dielectric thickness $t_{Gd}$ is high value $t_{GdH}$ for thick dielectric remainder 942R whereas gate dielectric thickness $t_{Gd}$ is low value $t_{GdL}$ for thin dielectric layer 944, the greater thickness of thick dielectric remainder 942R causes normalized depth y'$_{N2max}$/$t_{Gd}$ of maximum nitrogen concentration $N_{N2max}$ in thick dielectric remainder 942R to be less than normalized depth y'$_{N2max}$/$t_{Gd}$ of maximum nitrogen concentration $N_{N2max}$ in thin dielectric layer 944. In particular, normalized maximum-nitrogen-concentration depth y'$_{N2max}$/$t_{Gd}$ of thick dielectric remainder 942R approximately equals normalized maximum-nitrogen-concentration depth y'$_{N2max}$/$t_{Gd}$ of thin dielectric layer 944 multiplied by the low-to-high gate dielectric thickness ratio $t_{GdL}$/$t_{GdH}$.

Subject to the nitrogen outgassing between the plasma nitridization operation and the intermediate RTA, the shapes of the vertical nitrogen concentration profiles in thin dielectric layer 944 and thick dielectric remainder 942R are largely determined by the conditions of the intermediate RTA, including the ambient gas, preferably oxygen, used during the intermediate RTA, and by the following plasma nitridization parameters: effective power, pressure, dosing time, pulsing frequency, duty cycle, dosage, and gas constituency. Variously increasing the effective plasma power, dosing time, pulsing frequency, and dosage causes the nitrogen mass concentration in thin dielectric layer 944 and thick dielectric remainder 942R to increase. Decreasing the plasma pressure causes the nitrogen mass concentration in dielectric layer 944 and dielectric remainder 942R to increase. The preceding plasma nitridization and intermediate RTA conditions are selected to achieve a desired vertical nitrogen concentration profile in thin dielectric layer 944, normally one close to the typical nitrogen concentration profile shown in FIG. 45.

The remainder of the IGFET processing is conducted in the manner described above in connection with FIG. 33. FIG. 46*f* illustrates how the structure of FIG. 46 appears at the stage of FIG. 33*l* at which precursor gate electrodes 568P and 628P are respectively defined for p-channel IGFETs 114 and 118. The portions of thin dielectric layer 944 and thick dielectric layer 942R not covered by the precursor gate electrodes, including precursor gate electrodes 568P and 628P, have been removed. Gate dielectric layer 566 of IGFET 114 is formed by the portion of thin dielectric layer 944 underlying precursor gate electrode 568P. Gate dielectric layer 626 of IGFET 118 is similarly formed by the portion of thick dielectric remainder 942R underlying precursor gate electrode 628P.

Item 992R in FIG. 46*f* constitutes the portion of lower surface 992 of thin dielectric layer 944 underlying precursor gate electrode 568P. Item 994R constitutes the portion of upper surface 994 of dielectric layer 944 underlying gate electrode 568P. Accordingly, items 992R and 994R respectively are the lower and upper surfaces of gate dielectric layer 566 of p-channel IGFET 114. Item 996R constitutes the portion of lower surface 996 of thick dielectric remainder 942R underlying precursor gate electrode 628P. Item 998R constitutes the portion of upper surface 998 of dielectric remainder 942R underlying gate electrode 628P. Items 996R and 998R thus respectively are the lower and upper surfaces of gate dielectric layer 626 of p-channel IGFET 118.

FIG. 46*g* illustrates how the structure of FIG. 46 appears at the stage of FIG. 33*y* when the p-type main S/D ion implantation is performed with boron at a very high dosage. Photoresist mask 972 having opening above islands 154 and 158 for p-channel IGFETs 114 and 118 is formed on dielectric layers 962 and 964. Although photoresist 972 does not appear in FIG. 46*g* because only IGFETs 104 and 118 appear in FIG. 46*g*, the p-type main S/D dopant is ion implanted at a very high dosage through the openings in photoresist 972, through the uncovered sections of surface dielectric layer 964, and into vertically corresponding portions of the underlying monosilicon to define (a) p++ main S/D portions 550M and 552M of IGFET 114 and (b) p++ main S/D portions 610M and 612M of IGFET 118.

As in the stage of FIG. 33*y*, the boron of the p-type main S/D dopant also enters precursor gate electrodes 568P and 628P for IGFETs 114 and 118, thereby converting precursor electrodes 568P and 628P respectively into p++ gate electrodes 568 and 628. The p-type main S/D implantation is performed in the manner, and at the conditions, described above, in connection with the process of FIG. 33 after which photoresist 970 is removed.

Importantly, the nitrogen in gate dielectric layer 566 of IGFET 114 substantially prevents the boron implanted into gate electrode 568 from passing through gate dielectric 566 into the underlying monosilicon, particularly into n-type channel zone 554. The combination of the nitrogen in gate dielectric layer 626 of IGFET 118 and the increased thickness of gate dielectric 626 substantially prevents the boron implanted into gate electrode 628 from passing through gate dielectric layer 626 into the underlying monosilicon, particularly into n-type channel zone 614. Additionally, the introduction of nitrogen into gate dielectric layers 566 and 626 is performed prior to the ion implantation of boron into gate electrodes 568 and 628. Boron therefore cannot pass through gate dielectric layers 566 and 626 before the boron-stopping nitrogen is introduced into them.

Upon completion of the above-mentioned further spike anneal and the later processing steps including the metal silicide formation, the nitrogen in low-thickness gate dielectric layer 566 of p-channel IGFET 114 has a vertical concentration profile having the characteristics presented in FIG. 45, typically characteristics close to the typical vertical nitrogen concentration profile shown in FIG. 45. The same applies to the nitrogen in low-thickness gate dielectric layers 500 and 700 of p-channel IGFETs 110 and 122. The monosilicon underlying gate dielectric layers 500, 566, and 700, particularly the monosilicon of channel zones 484, 554, and 684, of respective IGFETs 110, 114, and 122 is largely nitrogen free.

The nitrogen in an upper portion of high-thickness gate dielectric layer 626 of p-channel IGFET 118 has a vertical concentration profile having characteristics close to the vertical nitrogen concentration profile shown in low-thickness gate dielectric layer 500, 566, or 700 of IGFET 110, 114, or 122. The underlying lower portion of gate dielectric layer 626 contains very little nitrogen. In particular, the nitrogen concentration along lower gate dielectric surface 996R is substantially zero. The same applies to the nitrogen in high-thickness gate dielectric layers 300, 384, and 766 of p-channel IGFETs 102, 106, and 126. The monosilicon underlying gate dielectric layers 300, 384, 626 and 766, particularly the monosilicon of channel zones 284, 362, 624, and 754, of respective IGFETs 102, 106, 118, and 126 is likewise largely nitrogen free.

S. Variations

While the invention has been described with reference to particular embodiments, this description is solely for the purpose of illustration and is not to be construed as limiting the scope of the invention claimed below. For instance, silicon in the semiconductor body or/and in gate electrodes can be replaced with other semiconductor materials. Replacement candidates include germanium, a silicon-germanium alloy, and Group 3a-Group 5a alloys such as gallium arsenide. The composite gate electrodes formed with the doped polysilicon gate electrodes and the respectively overlying metal silicide layers can be replaced with gate electrodes consisting substantially fully of refractory metal or substantially fully of metal silicide, e.g., cobalt silicide, nickel silicide, or platinum silicide with dopant provided in the silicide gate electrodes to control their work functions.

Polysilicon is a type of non-monosilicon. The gate electrodes have been described above as preferably consisting of doped polysilicon. Alternatively, the gate electrodes can consist of another type of doped non-monosilicon such as doped amorphous silicon or doped multicrystalline silicon. Even when the gate electrodes consist of doped polysilicon, the precursors to the gate electrodes can be deposited as amorphous silicon or another type of non-monosilicon other than polysilicon. The elevated temperatures during the elevated-temperature steps following the deposition of the precursor gate electrodes cause the silicon in the gate electrodes to be converted to polysilicon.

The gate dielectric layers of the illustrated IGFETs can alternatively be formed with materials, such as hafnium oxide, of high dielectric constant. In that event, the typical $t_{GdL}$ low and tam high values of gate dielectric thickness are normally respectively somewhat higher than the typical $t_{GdL}$ and $t_{GdH}$ values given above.

In an alternative where the n-type deep S/D-extension dopant is the same n-type dopant as the n-type shallow source-extension dopant, an anneal may be optionally performed between (i) the stage of FIG. 33o for the n-type deep S/D-extension implantation and (ii) the stage of FIG. 33p for the n-type shallow source-extension implantation in order to cause the n-type deep S/D-extension dopant to diffuse without causing the n-type shallow source-extension dopant to diffuse because its implantation has not yet been performed. This facilitates enabling asymmetric n-channel IGFET 100 to achieve the dopant distributions of FIG. 17.

Each asymmetric high-voltage IGFET 100 or 102 can be provided in a variation having any two or more of (a) specially tailored pocket portion 250U or 290U of asymmetric high-voltage IGFET 100U or 102U, (b) the vertical junction grading of asymmetric high-voltage IGFET 100V or 102V, (c) the below-drain hypoabrupt vertical dopant profile of asymmetric high-voltage IGFET 100X or 102X, and (d) the below-source hypoabrupt vertical dopant profile of IGFET 100X or 102X. Taking note of the above-mentioned differences between asymmetric n-channel IGFETs 100V and 100W, asymmetric n-channel IGFET 100 can also be provided in a variation having one or more of the preceding four features and an n-type source configured the same as source 980 to include a very heavily doped n-type main portion and a more lightly doped, but still heavily doped, n-type source extension defined by ion implanting n-type semiconductor dopant in at least two separate implantation operations so as to have the above-described multiple concentration-maxima characteristics of source extension 980E. The same applies to asymmetric p-channel IGFET 102 subject to reversing the conductivity types.

Each extended-drain IGFET 104U or 106U can be provided in a variation having the source junction vertical grading of extended-drain IGFET 104V or 106V. Each symmetric IGFET 112, 114, 124, or 126 can be provided in a variation having the vertical junction grading of symmetric IGFET 112, 114, 124, or 126 and the below-S/D-zone hypoabrupt vertical dopant profile of IGFET 100X or 102X. More generally, each illustrated IGFET identified by a reference symbol beginning with three numbers can be provided in a variation having the characteristics of two or more other IGFETs identified by reference symbols beginning with the same three numbers to the extent to that the characteristics are compatible.

In a variation of extended-drain n-channel IGFET 104, p halo pocket portion 326 extends from n-type source 320 fully across the location where p-type main well region 184A reaches the upper semiconductor surface. As a result, p-type main well 184A may cease to meet the p-type empty-well requirement that the concentration of the p-type semiconductor dopant in main well 184A decrease by at least a factor of 10 in moving upward from the subsurface location of the deep p-type concentration maximum in well 184A along a selected vertical location, such as vertical line 330, through well 184A to the upper semiconductor surface. P-type main well 184A then becomes a filled p-type well region in which the concentration of the p-type dopant in well 184A decreases by less than a factor of 10 in moving from the subsurface location of the deep p-type concentration maximum in well 184A along any vertical location through well 184A to the upper semiconductor surface.

N halo pocket portion 366 in a variation of extended-drain p-channel IGFET 106 similarly extends from p-type source 360 fully across the location where n-type main well region 186A reaches the upper semiconductor surface. N-type main well 186A may then cease to meet the n-type empty-well requirement that the concentration of the n-type semiconductor dopant in main well 186A decrease by at least a factor of 10 in moving upward from the subsurface location of the deep n-type concentration maximum in well 186A along a selected vertical location, such as vertical line 370, through well 186A to the upper semiconductor surface. If so, n-type main well 186A becomes a filled n-type well region for which the concentration of the n-type dopant in well 186A decreases by less than a factor of 10 in moving from the subsurface location of the deep n-type concentration maximum in well 186A along any vertical location through well 186A to the upper semiconductor surface.

In another variation of extended-drain IGFET 104 or 106, minimum well-to-well spacing $L_{WW}$ is chosen to be sufficiently great that breakdown voltage $V_{BD}$ just saturates at its maximum value $V_{BDmax}$. Although the peak value of the electric field in the monosilicon of IGFET 104 or 106 thereby occurs at, very close to, the upper semiconductor surface, the empty-well nature of drain 184B of IGFET 104 or drain portion 186B of IGFET 106 still causes the peak value of the electric field in the monosilicon of IGFET 104 or 106 to be reduced. This variation of extended-drain IGFET 104 or 106 has the maximum achievable value $V_{BDmax}$ of breakdown voltage along with increased reliability and lifetime close to the increased reliability and lifetime of IGFET 104 or 106.

An n-channel IGFET may have a p-type boron-doped polysilicon gate electrode instead of an n-type gate electrode as occurs with n-channel IGFET 108, 112, or 120 having low-thickness gate dielectric layer 460, 536, or 560. In that case, the gate dielectric layer of the n-channel IGFET can be provided with nitrogen having the above-described nitrogen-concentration vertical profile characteristics for preventing boron in the p-type boron-doped polysilicon gate electrode from passing through the gate dielectric layer and into the channel zone of the n-channel IGFET. Various modifications may thus be made by those skilled in the art without departing from the true scope of the invention as defined in the appended claims.

What is claimed is:

1. A structure comprising:
    a plurality of like-polarity field-effect transistors ("FETs") including at least one first FET and at least one second FET, the FETs being provided along an upper surface of a semiconductor body having body material doped with semiconductor dopant of a first conductivity type so as to be of the first conductivity type, each FET comprising:
    a channel zone of a region of the body material;
    first and second source/drain ("S/D") zones situated in the semiconductor body along its upper surface, laterally separated by the channel zone, and being of a second conductivity type opposite to the first conductivity type so as to form respective pn junctions with the body-material region such that:
        (a) each pn junction reaches a maximum depth below the body's upper surface,
        (b) the body-material region extends laterally under both S/D zones, and
        (c) the dopant of the first conductivity type is present in both S/D zones and has a concentration which locally reaches a main subsurface maximum concentration at a main subsurface maximum concentration location extending laterally below largely all of each of the channel and S/D zones, and
        (d) the main subsurface maximum concentration location occurs no more than 10 times deeper below the body's upper surface than the maximum depth of the pn junction for each S/D zone;
    a gate dielectric layer overlying the channel zone; and
    a gate electrode overlying the gate dielectric layer above the channel zone;
    wherein the concentration of the dopant of the first conductivity type:
        (i) decreases by at least a factor of 10 in moving upward from the main subsurface maximum concentration location for each first FET along a selected vertical location for that first FET through a specified one of the S/D zones of that first FET to the body's upper surface,
        (ii) decreases substantially monotonically in moving from the main subsurface maximum concentration location for that first FET along the selected vertical location for that first FET to the pn junction for the specified S/D zone of that first FET, and
        (iii) reaches at least one additional subsurface maximum concentration between the body's upper surface and the main subsurface maximum concentration location for each second FET such that each additional subsurface maximum concentration for that second FET occurs at an additional subsurface maximum concentration location extending laterally below largely all material of the gate electrode of that second FET overlying its channel zone and at least part of each of its S/D zones; and
    wherein the gate dielectric layers selectively satisfy at least two of the following gate dielectric layer requirements:
        a. the gate dielectric layer of one such first FET is of materially greater thickness than the gate dielectric layer of one such second FET;
        b. the gate dielectric layers of one such first FET and one such second FET are of approximately the same thickness;
        c. the gate dielectric layer of one such second FET is of materially greater thickness than the gate dielectric layer of one such first FET;
        d. the gate dielectric layer of one such first FET is of materially different thickness than the gate dielectric layer of another such first FET; and
        e. the gate dielectric layer of one such second FET is of materially different thickness than the gate dielectric layer of another such second FET.

2. A structure as in claim 1, wherein the gate dielectric layers selectively satisfy at least three of the gate dielectric layer requirements.

3. A structure as in claim 1, wherein the gate dielectric layers selectively satisfy at least four of the gate dielectric layer requirements.

4. A structure as in claim 1, wherein the gate dielectric layers satisfy all of the gate dielectric layer requirements.

5. A structure as in claim 1 wherein the concentration of the dopant of the first conductivity type decreases by less than a factor of 10 in moving from the main subsurface maximum concentration location for each first FET along the selected vertical location for that first FET to the pn junction for the specified S/D zone of that first FET.

6. A structure as in claim 1, wherein the gate dielectric layer of a specified one of the FETs has lower and upper gate dielectric surfaces, is of an average gate dielectric thickness, and comprises semiconductor material, oxygen, and nitrogen at a gate dielectric nitrogen concentration:
    (i) which reaches a maximum concentration of $2 \times 10^{21}$-$6 \times 10^{21}$ atoms/cm$^3$ along a maximum-nitrogen-concentration location in the gate dielectric layer when the normalized depth below the upper gate dielectric surface is at a normalized maximum-nitrogen-concentration depth value of no more than 0.2, and
    (ii) which drops to $1 \times 10^{20}$ atoms/cm$^3$ when the normalized depth is at a higher value of up to 0.9, the normalized depth being the actual depth below the upper gate dielectric surface divided by the average gate dielectric thickness.

7. A structure as in claim 1, wherein the specified FET is a p-channel FET.

8. A structure comprising:
    a plurality of like-polarity field-effect transistors ("FETs") including first FETs and second FETs, the FETs being provided along an upper surface of a semiconductor body having body material doped with semiconductor dopant of a first conductivity type so as to be of the first conductivity type, each FET comprising:
    a channel zone of a region of the body material;

first and second source/drain ("S/D") zones situated in the semiconductor body along its upper surface, laterally separated by the channel zone, and being of a second conductivity type opposite to the first conductivity type so as to form respective pn junctions with the body-material region such that:
  (a) each pn junction reaches a maximum depth below the body's upper surface,
  (b) the body-material region extends laterally under both S/D zones,
  (c) the dopant of the first conductivity type is present in both S/D zones and has a concentration which locally reaches a main subsurface maximum concentration at a main subsurface maximum concentration location extending laterally below largely all of each of the channel and S/D zones, and
  (d) the main subsurface maximum concentration location occurs no more than 10 times deeper below the body's upper surface than the maximum depth of the pn junction for each S/D zone;
a gate dielectric layer overlying the channel zone; and
a gate electrode overlying the gate dielectric layer above the channel zone;
wherein the concentration of the dopant of the first conductivity type:
  (i) decreases by at least a factor of 10 in moving upward from the main subsurface maximum concentration location for each first FET along a selected vertical location for that first FET through a specified one of the S/D zones of that first FET to the body's upper surface,
  (ii) decreases substantially monotonically in moving from the main subsurface maximum concentration location for that first FET along the selected vertical location for that first FET to the pn junction for the specified S/D zone of that first FET, and
  (iii) reaches at least one additional subsurface maximum concentration between the body's upper surface and the main subsurface maximum concentration location for each second FET such that each additional subsurface maximum concentration for that second FET occurs at an additional subsurface maximum concentration location extending laterally below largely all material of the gate electrode of that second FET overlying its channel zone and at least part of each of its S/D zones; and
wherein there are multiple instances in which one first FET has a threshold voltage of materially lesser magnitude than one second FET and wherein the gate dielectric layers of the FETs in those instances selectively satisfy at least two of the following gate dielectric layer requirements:
  a. the gate dielectric layers of one such first FET and one such second FET are of approximately the same thickness;
  b. the gate dielectric layer of one such first FET is of materially greater thickness than the gate dielectric layer of one such second FET; and
  c. the gate dielectric layer of one such second FET is of materially greater thickness than the gate dielectric layer of that one such first FET.

9. A structure as in claim 8, wherein the gate dielectric layers of the FETs in those instances satisfy all of the gate dielectric layer requirements.

10. A structure as in claim 8, wherein the concentration of the dopant of the first conductivity type decreases by less than a factor of 10 in moving from the main subsurface maximum concentration location for each first FET along the selected vertical location for that first FET to the pn junction for the specified S/D zone of that first FET.

11. A structure as in claim 8, wherein the gate dielectric layer of one such FET has lower and upper gate dielectric surfaces, is of an average gate dielectric thickness, and comprises semiconductor material, oxygen, and nitrogen at a gate dielectric nitrogen concentration:
  (i) which reaches a maximum concentration of $2 \times 10^{21}$-$6 \times 10^{21}$ atoms/cm$^3$ along a maximum-nitrogen-concentration location in the gate dielectric layer when the normalized depth below the upper gate dielectric surface is at a normalized maximum-nitrogen-concentration depth value of no more than 0.2 and
  (ii) which drops to $1 \times 10^{20}$ atoms/cm$^3$ when the normalized depth is at a higher value of up to 0.9, the normalized depth being the actual depth below the upper gate dielectric surface divided by the average gate dielectric thickness.

12. A structure comprising:
a plurality of like-polarity field-effect transistors ("FETs") including at least one first FET and at least one second FET, the FETs being provided along an upper surface of a semiconductor body having body material doped with semiconductor dopant of a first conductivity type so as to be of the first conductivity type, each FET comprising:
a channel zone of a region of the body material;
first and second source/drain ("S/D") zones situated in the semiconductor body along its upper surface, laterally separated by the channel zone, and being of a second conductivity type opposite to the first conductivity type so as to form respective pn junctions with the body-material region such that:
  (a) each pn junction reaches a maximum depth below the body's upper surface,
  (b) the body-material region extends laterally under both S/D zones,
  (c) the dopant of the first conductivity type is present in both S/D zones and has a concentration which locally reaches a main subsurface maximum concentration at a main subsurface maximum concentration location extending laterally below largely all of each of the channel and S/D zones, and
  (d) the main subsurface maximum concentration location occurs no more than 10 times deeper below the body's upper surface than the maximum depth of the pn junction for each S/D zone;
a gate dielectric layer overlying the channel zone; and
a gate electrode overlying the gate dielectric layer above the channel zone;
wherein the concentration of the dopant of the first conductivity type:
  (i) decreases by at least a factor of 10 in moving upward from the main subsurface maximum concentration location for each first FET along a selected vertical location for that first FET through a specified one of the S/D zones of that first FET to the body's upper surface,
  (ii) decreases substantially monotonically in moving from the main subsurface maximum concentration location for that first FET along the selected vertical location for that first FET to the pn junction for the specified S/D zone of that first FET, and
  (iii) reaches at least one additional subsurface maximum concentration between the body's upper surface and the main subsurface maximum concentration location for each second FET such that each additional subsurface maximum concentration for that second FET occurs at an additional subsurface maximum concentration location extending laterally below largely all material of the gate electrode of that second FET overlying its channel zone and at least part of each of its S/D zones; and wherein the FETs selectively satisfy at least one of the following combinational requirements:
a. one such first FET has a threshold voltage of materially lesser magnitude that one such second FET, and the gate dielectric layer of that first FET is of materially greater thickness than the gate dielectric layer of that second FET;
b. one such first FET has a threshold voltage of materially lesser magnitude that one such second FET, and the gate dielectric layer of that first FET is of materially lesser thickness than the gate dielectric layer of that second FET;
c. one such first FET has a threshold voltage of materially lesser magnitude that one such second FET, and the gate dielectric layers of those two first and second FETs are of materially greater thickness than the gate dielectric layer of another such FET;
d. one such first FET has a threshold voltage of materially lesser magnitude that one such second FET, and the gate dielectric layers of those two first and second FETs are of materially lesser thickness than the gate dielectric layer of another such FET;
e. one such first FET has a threshold voltage of materially lesser magnitude that each of two such second FETs whose respective threshold voltages differ materially in magnitude, and the gate dielectric layer of that first FET is of materially greater thickness than the gate dielectric layer of each of those second FETs; and
f. one such first FET has a threshold voltage of materially lesser magnitude that each of two such second FETs whose respective threshold voltages differ materially in magnitude, and the gate dielectric layer of each those three FETs is of materially lesser thickness than the gate dielectric layer of another such FET.

13. A structure as in claim 12, wherein the FETs selectively satisfy at least two of the combinational requirements.

14. A structure as in claim 12, wherein the FETs selectively satisfy at least three of the combinational requirements.

15. A structure as in claim 12, wherein the FETs selectively satisfy at least four of the combinational requirements.

16. A structure as in claim 12, wherein the FETs selectively satisfy at least five of the combinational requirements.

17. A structure as in claim 12, wherein the FETs satisfy all of the combinational requirements a through f.

18. A structure as in claim 12, wherein the concentration of the dopant of the first conductivity type decreases by less than a factor of 10 in moving from the main subsurface maximum concentration location for each first FET along the selected vertical location for that first FET to the pn junction for the specified S/D zone of that first FET.

* * * * *